(12) United States Patent
Kimura et al.

(10) Patent No.: US 11,776,586 B2
(45) Date of Patent: Oct. 3, 2023

(54) SEMICONDUCTOR DEVICE AND ELECTRONIC DEVICE

(71) Applicant: SEMICONDUCTOR ENERGY LABORATORY CO., LTD., Atsugi (JP)

(72) Inventors: Hajime Kimura, Kanagawa (JP); Yoshiyuki Kurokawa, Kanagawa (JP)

(73) Assignee: Semiconductor Energy Laboratory Co., Ltd., Atsugi (JP)

(*) Notice: Subject to any disclaimer, the term of this patent is extended or adjusted under 35 U.S.C. 154(b) by 234 days.

(21) Appl. No.: 17/427,697

(22) PCT Filed: Feb. 3, 2020

(86) PCT No.: PCT/IB2020/050821
§ 371 (c)(1),
(2) Date: Aug. 2, 2021

(87) PCT Pub. No.: WO2020/165685
PCT Pub. Date: Aug. 20, 2020

(65) Prior Publication Data
US 2022/0165311 A1    May 26, 2022

(30) Foreign Application Priority Data
Feb. 15, 2019    (JP) .................. 2019-025723

(51) Int. Cl.
G11C 5/14       (2006.01)
G11C 11/405    (2006.01)
G11C 11/412    (2006.01)

(52) U.S. Cl.
CPC .......... *G11C 5/147* (2013.01); *G11C 11/405* (2013.01); *G11C 11/412* (2013.01)

(58) Field of Classification Search
CPC ...... G11C 5/147; G11C 11/405; G11C 11/412; G11C 7/1006; G11C 11/419; G11C 11/54;
(Continued)

(56) References Cited

U.S. PATENT DOCUMENTS

| 7,786,959 B2 | 8/2010 | Numao |
| 2005/0275647 A1 | 12/2005 | Numao |

(Continued)

FOREIGN PATENT DOCUMENTS

| DE | 69124853 | 6/1997 |
| EP | 0466331 A | 1/1992 |

(Continued)

OTHER PUBLICATIONS

English translation of JP-2019003464-A (Year: 2019).*

(Continued)

*Primary Examiner* — Ajay Ojha
(74) *Attorney, Agent, or Firm* — Fish & Richardson P.C.

(57) ABSTRACT

A semiconductor device capable of product-sum operation with low power consumption is provided. The semiconductor device includes first and second circuits; the first circuit includes a first holding portion and a first transistor, and the second circuit includes a second holding portion and a second transistor. The first and second circuits are each electrically connected to first and second input wirings and first and second wirings. The first holding portion has a function of holding a first current flowing through the first transistor, and the second holding portion has a function of holding a second current flowing through the second transistor. The first and second currents are determined in accordance with first data. When a potential corresponding to second data is input to the first and second input wirings, the first circuit outputs a current to one of the first wiring and the second wiring and the second circuit outputs a current to (Continued)

the other of the first wiring and the second wiring. The amount of current output from the first or second circuit to the first wiring or the second wiring is determined in accordance with the first data and the second data.

10 Claims, 72 Drawing Sheets

(58) Field of Classification Search
CPC .......... G06N 3/048; G06N 3/065; G06N 3/08; G06N 3/063; G06N 3/04
See application file for complete search history.

(56) References Cited

U.S. PATENT DOCUMENTS

| | | | |
|---|---|---|---|
| 2020/0160158 A1 | 5/2020 | Okamoto et al. | |
| 2020/0201603 A1 | 6/2020 | Kozuma et al. | |
| 2021/0257015 A1 | 8/2021 | Yamazaki et al. | |
| 2021/0318856 A1* | 10/2021 | Ikeda | H10B 12/00 |

FOREIGN PATENT DOCUMENTS

| | | |
|---|---|---|
| JP | 04-067259 A | 3/1992 |
| JP | 2006-030946 A | 2/2006 |
| JP | 2019-003464 A | 1/2019 |
| JP | 2019003464 A * | 1/2019 |
| WO | WO-2020/079523 | 4/2020 |
| WO | WO-2020/095140 | 5/2020 |

OTHER PUBLICATIONS

International Search Report (Application No. PCT/IB2020/050821) dated Apr. 7, 2020.
Written Opinion (Application No. PCT/IB2020/050821) dated Apr. 7, 2020.
Kang.M et al., "A Multi-Functional In-Memory Inference Processor Using a Standard 6T SRAM Array", IEEE Journal of Solid-State Circuits, Jan. 4, 2018, vol. 53, No. 2, pp. 642-655.
Kang.M et al., "A 19.4-nJ/Decision, 364-K Decisions/s, In-Memory Random Forest Multi-Class Inference Accelerator", IEEE Journal of Solid-State Circuits, May 2, 2018, vol. 53, No. 7, pp. 2126-2135.
Moradi.S et al., "An Event-Based Neural Network Architecture With an Asynchronous Programmable Synaptic Memory", IEEE Transactions on Biomedical Circuits and Systems, Jun. 4, 2013, vol. 8, No. 1, pp. 98-107.
Zhang.J et al., "In-Memory Computation of a Machine-Learning Classifier in a Standard 6T SRAM Array", IEEE Journal of Solid-State Circuits, Mar. 10, 2017, vol. 52, No. 4, pp. 915-924.
Akyel.K et al., "DRC2: Dynamically Reconfigurable Computing Circuit based on memory architecture", IEEE International Conference on Rebooting Computing, Oct. 17, 2016, pp. 1-8pages.
Agrawal.A et al., "X-SRAM: Enabling In-Memory Boolean Computations in CMOS Static Random Access Memories", IEEE Transactions on Circuits and Systems, Jul. 2, 2018, pp. 1-14.

* cited by examiner

100

CC1(CC2,CC3)

CC1(CC2,CC3)

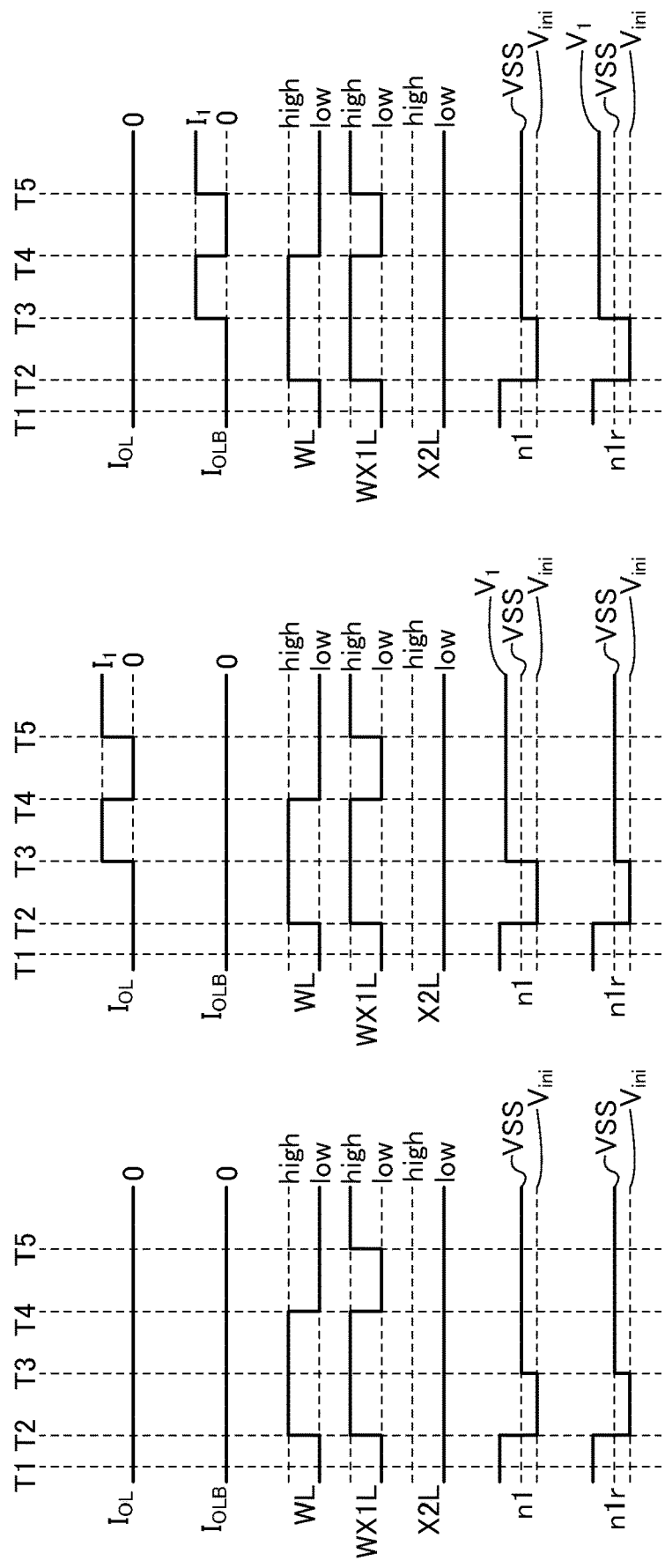

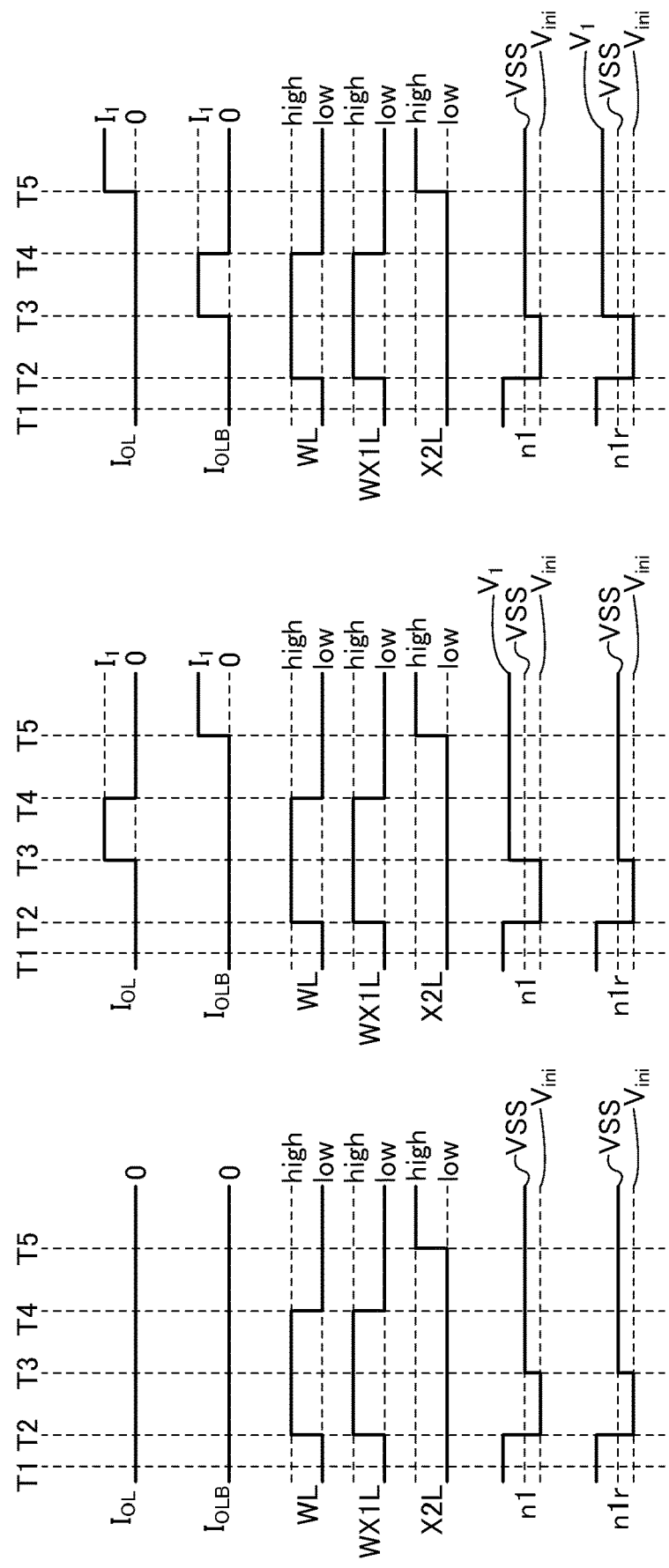

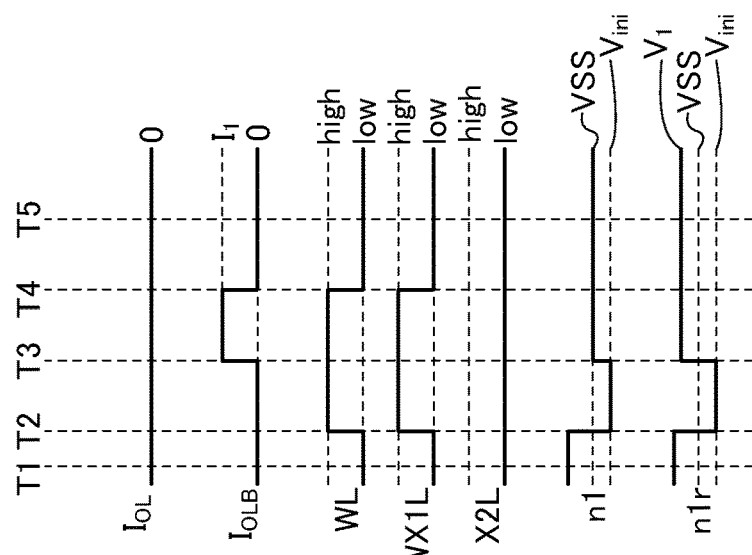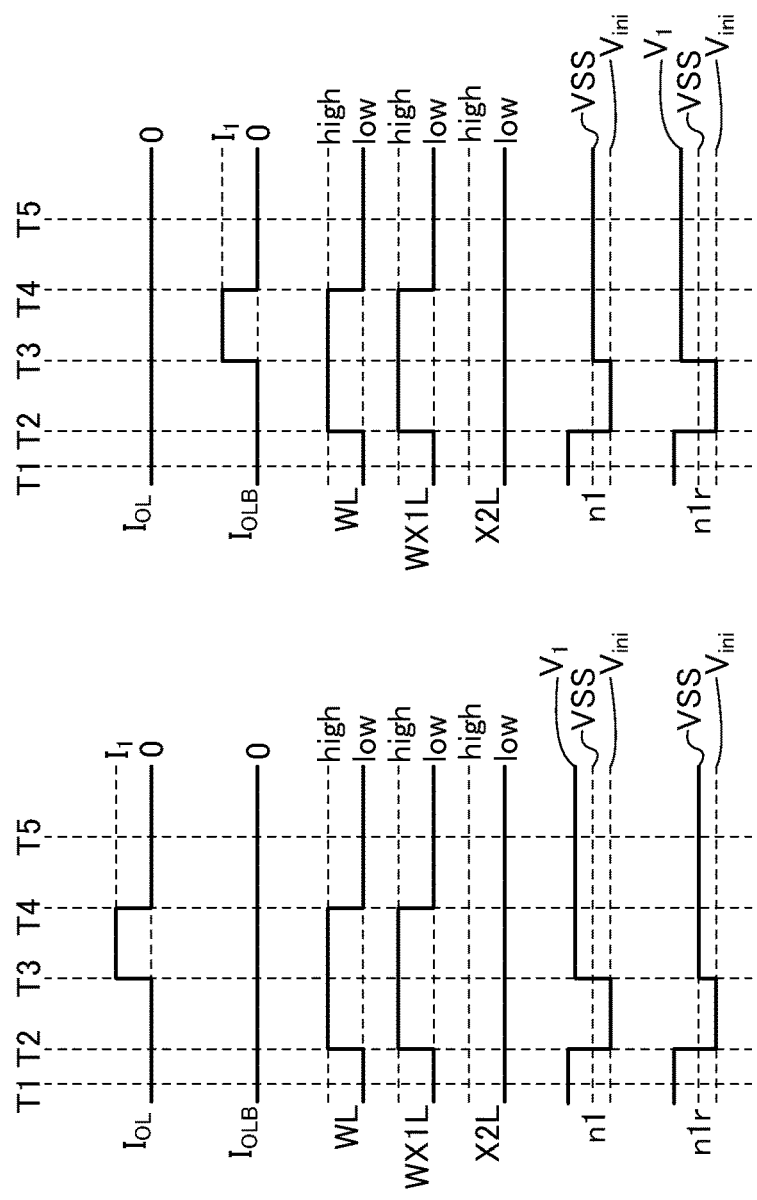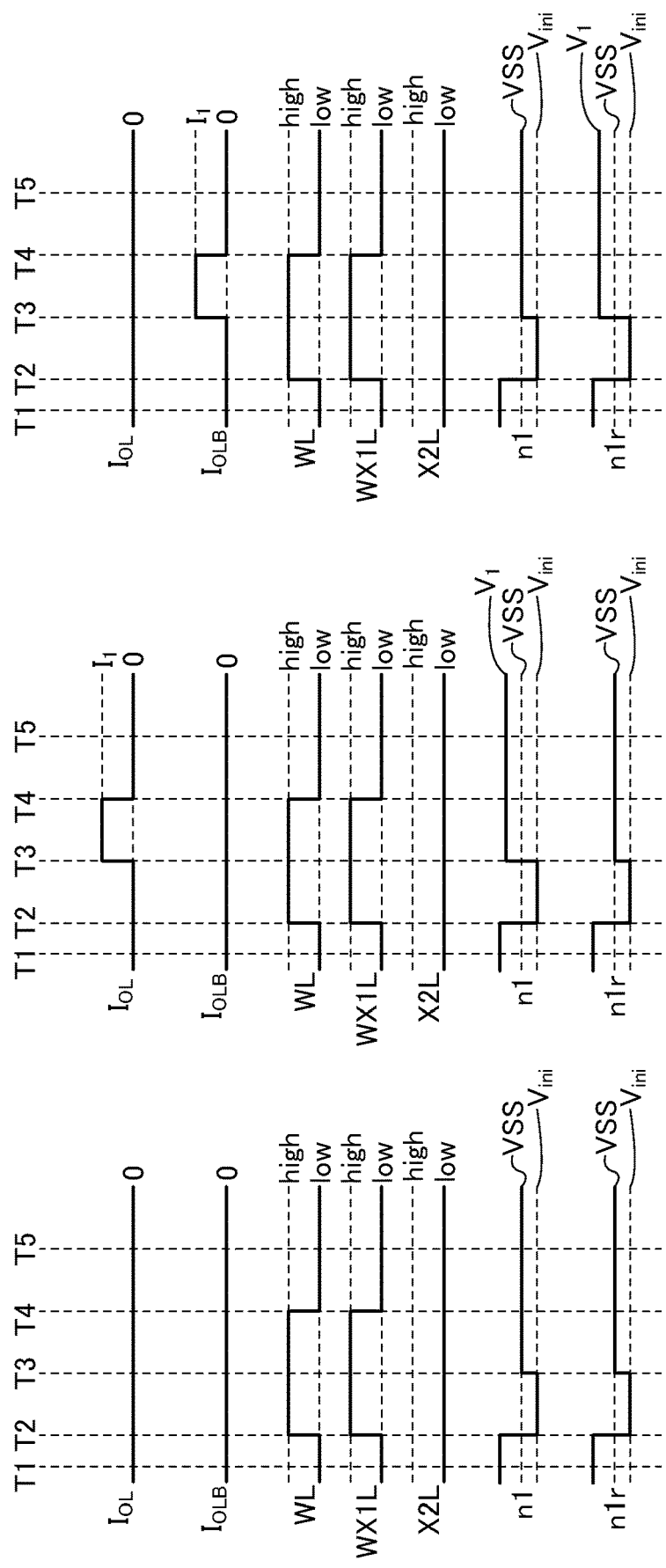

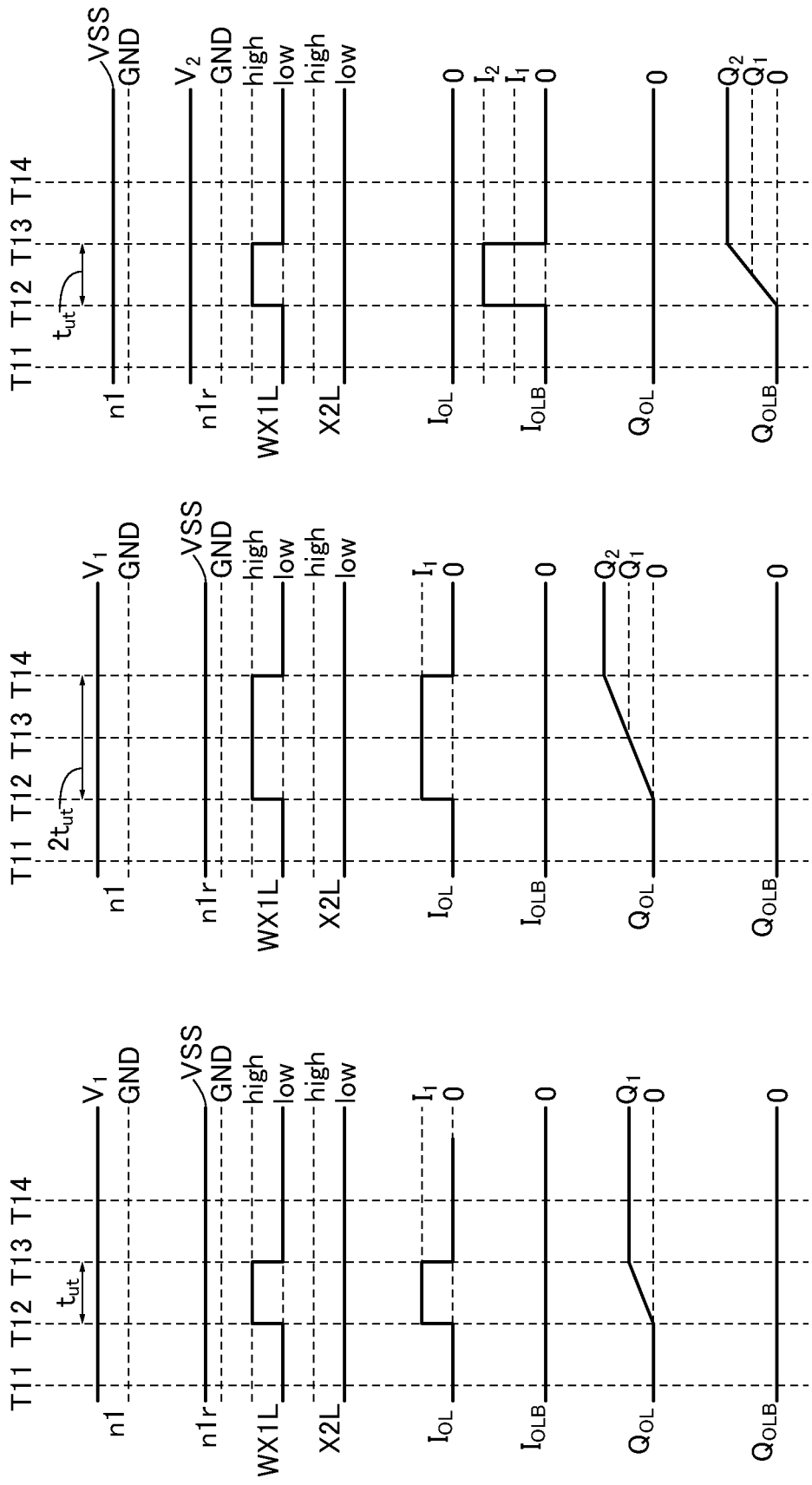

SEMICONDUCTOR DEVICE AND ELECTRONIC DEVICE

CROSS REFERENCE TO RELATED APPLICATIONS

This application is a U.S. National Phase Application under 35 U.S.C. § 371 of International Application PCT/IB2020/050821, filed on Feb. 3, 2020, which is incorporated by reference and claims the benefit of a foreign priority application filed in Japan on Feb. 15, 2019, as Application No. 2019-025723.

TECHNICAL FIELD

One embodiment of the present invention relates to a semiconductor device and an electronic device.

Note that one embodiment of the present invention is not limited to the above technical field. The technical field of the invention disclosed in this specification and the like relates to an object, a method, or a manufacturing method. Alternatively, one embodiment of the present invention relates to a process, a machine, manufacture, or a composition of matter. Therefore, specific examples of the technical field of one embodiment of the present invention disclosed in this specification include a semiconductor device, a display device, a liquid crystal display device, a light-emitting device, a power storage device, an imaging device, a memory device, a signal processing device, a processor, an electronic device, a system, a driving method thereof, a manufacturing method thereof, and a testing method thereof.

BACKGROUND ART

Integrated circuits that imitate the mechanism of the human brain are currently under active development. The integrated circuits incorporate electronic circuits as the brain mechanism and include circuits corresponding to "neurons" and "synapses" of the human brain. Such integrated circuits may therefore be called "neuromorphic", "brain-morphic", or "brain-inspired" circuits. The integrated circuits have a non-von Neumann architecture and are expected to be able to perform parallel processing with extremely low power consumption as compared with a von Neumann architecture, in which power consumption increases with increasing processing speed.

An information processing model that imitates a biological neural network including "neurons" and "synapses" is referred to as an artificial neural network (ANN). For example, Non-Patent Document 1 and Non-Patent Document 2 each disclose an arithmetic device including an artificial neural network constructed using SRAM (Static Random Access Memory).

REFERENCE

Non-Patent Document

[Non-Patent Document 1] M. Kang et al., "IEEE Journal Of Solid-State Circuits", 2018, Volume 53, No. 2, pp. 642-655.

[Non-Patent Document 2] J. Zhang et al., "IEEE Journal Of Solid-State Circuits", 2017, Volume 52, No. 4, pp. 915-924.

SUMMARY OF THE INVENTION

Problems to be Solved by the Invention

An artificial neural network performs calculations in which the connection strength (sometimes referred to as weight coefficient) of a synapse that connects two neurons is multiplied by a signal transmitted between the two neurons. In particular, in a hierarchical artificial neural network, the connection strength of synapses between a plurality of first neurons in a first layer and one of second neurons in a second layer and signals input from the plurality of first neurons in the first layer to the one of the second neurons in the second layer need to be multiplied and summed; for example, the number of the connection strengths and the number of parameters indicating the signals are determined in accordance with the scale of the artificial neural network. That is, in the artificial neural network, as the number of layers, the number of neurons, and the like increase, the number of circuits corresponding to the "neurons" and "synapses" also increases, which sometimes makes the amount of arithmetic operation enormous.

As the number of circuits included in a chip increases, the power consumption increases and the amount of heat generated when a device is driven also increases. In particular, a larger amount of heat generation is more likely to affect the characteristics of circuit elements included in a chip; thus, a circuit constituting the chip preferably includes circuit elements that are less affected by temperature. In addition, variations in characteristics of a transistor, a current source, or the like included in a chip lead to variations in arithmetic operation results.

An object of one embodiment of the present invention is to provide a semiconductor device and the like including a hierarchical artificial neural network. Another object of one embodiment of the present invention is to provide a semiconductor device and the like with low power consumption. Another object of one embodiment of the present invention is to provide a semiconductor device and the like that are less affected by environmental temperature. Another object of one embodiment of the present invention is to provide a semiconductor device and the like that are less affected by variations in characteristics of a transistor. Another object of one embodiment of the present invention is to provide a semiconductor device and the like that are less affected by variations in characteristics of a current source. Another object of one embodiment of the present invention is to provide a novel semiconductor device and the like.

Note that the objects of one embodiment of the present invention are not limited to the objects listed above. The objects listed above do not preclude the existence of other objects. Note that the other objects are objects that are not described in this section and will be described below. The objects that are not described in this section will be derived from the descriptions of the specification, the drawings, and the like and can be extracted from these descriptions by those skilled in the art. Note that one embodiment of the present invention is to solve at least one of the objects listed above and the other objects. Note that one embodiment of the present invention is to solve at least one of the objects listed above and the other objects. Note that one embodiment of the present invention does not necessarily solve all the objects listed above and the other objects.

Means for Solving the Problems (1)

One embodiment of the present invention is a semiconductor device including a first circuit and a second circuit. The first circuit includes a first holding portion and a first driving transistor. The second circuit includes a second holding portion and a second driving transistor. The first circuit is electrically connected to a first input wiring, a second input wiring, a first wiring, and a second wiring. The second circuit is electrically connected to the first input wiring, the second input wiring, the first wiring, and the second wiring. The first holding portion has a function of holding a first potential corresponding to a first current from the first wiring flowing between a source and a drain of the first driving transistor. The second holding portion has a function of holding a second potential corresponding to a second current from the second wiring flowing between a source and a drain of the second driving transistor. The first driving transistor has a function of making the first current corresponding to the held first potential flow between the source and the drain of the first driving transistor. The second driving transistor has a function of making the second current corresponding to the held second potential flow between the source and the drain of the second driving transistor. The first circuit has a function of outputting the first current to the first wiring when a first-level potential is input to the first input wiring and a second-level potential is input to the second input wiring, a function of outputting the first current to the second wiring when the second-level potential is input to the first input wiring and the first-level potential is input to the second input wiring, and a function of outputting the first current to neither the first wiring nor the second wiring when the second-level potential is input to the first input wiring and the second-level potential is input to the second input wiring. The second circuit has a function of outputting the second current to the second wiring when the first-level potential is input to the first input wiring and the second-level potential is input to the second input wiring, a function of outputting the second current to the first wiring when the second-level potential is input to the first input wiring and the first-level potential is input to the second input wiring, and a function of outputting the second current to neither the first wiring nor the second wiring when the second-level potential is input to the first input wiring and the second-level potential is input to the second input wiring. The first current and the second current each have a current amount corresponding to first data. The first-level potential and the second-level potential that are input to the first input wiring, the second input wiring, a third input wiring, and a fourth input wiring are determined in accordance with second data.

(2)

Another embodiment of the present invention is a semiconductor device including a first circuit and a second circuit. The first circuit includes a first holding portion and a first driving transistor. The second circuit includes a second holding portion and a second driving transistor. The first circuit is electrically connected to a first input wiring, a second input wiring, a first wiring, and a second wiring. The second circuit is electrically connected to the first input wiring, the second input wiring, the first wiring, and the second wiring. The first holding portion has a function of holding a first potential corresponding to a first current from the first wiring flowing between a source and a drain of the first driving transistor. The second holding portion has a function of holding a second potential corresponding to a second current from the second wiring flowing between a source and a drain of the second driving transistor. The first driving transistor has a function of making the first current corresponding to the held first potential flow between the source and the drain of the first driving transistor. The second driving transistor has a function of making the second current corresponding to the held second potential flow between the source and the drain of the second driving transistor. The first circuit has a function of outputting the first current to the first wiring when a first-level potential is input to the first input wiring and a second-level potential is input to the second input wiring in a first period, a function of outputting the first current to the second wiring when the second-level potential is input to the first input wiring and the first-level potential is input to the second input wiring in the first period, and a function of outputting the first current to neither the first wiring nor the second wiring when the second-level potential is input to the first input wiring and the second-level potential is input to the second input wiring in the first period. The second circuit has a function of outputting the second current to the second wiring when the first-level potential is input to the first input wiring and the second-level potential is input to the second input wiring in the first period, a function of outputting the second current to the first wiring when the second-level potential is input to the first input wiring and the first-level potential is input to the second input wiring in the first period, and a function of outputting the second current to neither the first wiring nor the second wiring when the second-level potential is input to the first input wiring and the second-level potential is input to the second input wiring in the first period. The first current and the second current each have a current amount corresponding to first data. The first-level potential and the second-level potential that are input to the first input wiring and the second input wiring and a length of the first period are determined in accordance with second data.

(3)

Another embodiment of the present invention is the semiconductor device having the above structure (2). The first period includes a second period and a third period. The first input wiring has a function of supplying the first-level potential or the second-level potential to both the first circuit and the second circuit in the second period. The second input wiring has a function of outputting the first-level potential or the second-level potential to both the first circuit and the second circuit in the second period. The first input wiring has a function of supplying the first-level potential or the second-level potential to both the first circuit and the second circuit in the third period. The second input wiring has a function of outputting the first-level potential or the second-level potential to both the first circuit and the second circuit in the third period. A length of the third period is twice a length of the second period.

(4)

Another embodiment of the present invention is the semiconductor device having any one of the above structures (1) to (3). The first circuit includes a first transistor, a second transistor, a third transistor, and a first capacitor. The second circuit includes a fourth transistor, a fifth transistor, a sixth transistor, and a second capacitor. The first holding portion includes the first transistor and the first capacitor. The second holding portion includes the fourth transistor and the second capacitor. A first terminal of the first transistor is electrically connected to a first terminal of the first capacitor and a gate of the first driving transistor. A second terminal of the first transistor is electrically connected to the first wiring. A first terminal of the first driving transistor is electrically connected to a first terminal of the second transistor and a first terminal of the third transistor. A second terminal of the second transistor is electrically connected to the first wiring. A gate of the second transistor is electrically connected to the first input wiring. A second terminal of the third transistor is electrically connected to the second wiring. A gate of the third transistor is electrically connected to the second input wiring. A first terminal of the fourth transistor is electrically connected to a first terminal of the second capacitor and a gate of the second driving transistor. A second terminal of the fourth transistor is electrically connected to the second wiring. A first terminal of the second driving transistor is electrically connected to a first terminal of the fifth transistor and a first terminal of the sixth transistor. A second terminal of the fifth transistor is electrically connected to the second wiring. A gate of the fifth transistor is electrically connected to the first input wiring. A second terminal of the sixth transistor is electrically connected to the first wiring. A gate of the sixth transistor is electrically connected to the second input wiring.

(5)

Another embodiment of the present invention is the semiconductor device having the above structure (4). The first circuit includes a seventh transistor. The second circuit includes an eighth transistor. A first terminal of the seventh transistor is electrically connected to the first terminal of the first driving transistor, the first terminal of the second transistor, and the first terminal of the third transistor. A second terminal of the seventh transistor is electrically connected to one of the first terminal and the second terminal of the first transistor. A first terminal of the eighth transistor is electrically connected to the first terminal of the second driving transistor, the first terminal of the fifth transistor, and the first terminal of the sixth transistor. A second terminal of the eighth transistor is electrically connected to one of the first terminal and the second terminal of the fourth transistor. A gate of the first transistor is electrically connected to a gate of the fourth transistor, a gate of the seventh transistor, and a gate of the eighth transistor.

(6)

Another embodiment of the present invention is the semiconductor device having any one of the above structures (1) to (3). The first circuit includes a first transistor, a second transistor, a third transistor, and a first capacitor. The second circuit includes a fourth transistor, a fifth transistor, a sixth transistor, and a second capacitor. The first holding portion includes the first transistor and the first capacitor. The second holding portion includes the fourth transistor and the second capacitor. A first terminal of the first transistor is electrically connected to a first terminal of the first capacitor and a gate of the first driving transistor. A first terminal of the first driving transistor is electrically connected to a second terminal of the first transistor, a first terminal of the second transistor, and a first terminal of the third transistor. A second terminal of the second transistor is electrically connected to the first wiring. A gate of the second transistor is electrically connected to the first input wiring. A second terminal of the third transistor is electrically connected to the second wiring. A gate of the third transistor is electrically connected to the second input wiring. A first terminal of the fourth transistor is electrically connected to a first terminal of the second capacitor and a gate of the second driving transistor. A first terminal of the second driving transistor is electrically connected to a second terminal of the fourth transistor, a first terminal of the fifth transistor, and a first terminal of the sixth transistor. A second terminal of the fifth transistor is electrically connected to the second wiring. A gate of the fifth transistor is electrically connected to the first input wiring. A second terminal of the sixth transistor is electrically connected to the first wiring. A gate of the sixth transistor is electrically connected to the second input wiring.

(7)

Another embodiment of the present invention is the semiconductor device having any one of the above structures (1) to (3). The first circuit includes a third holding portion and a third driving transistor. The second circuit includes a fourth holding portion and a fourth driving transistor. The first circuit is electrically connected to a third wiring. The second circuit is electrically connected to the third wiring. The third holding portion has a function of holding a third potential corresponding to a third current from the first wiring flowing between a source and a drain of the third driving transistor. The fourth holding portion has a function of holding a fourth potential corresponding to a fourth current from the second wiring flowing between a source and a drain of the fourth driving transistor. The third driving transistor has a function of making the third current corresponding to the held third potential flow between the source and the drain of the third driving transistor. The fourth driving transistor has a function of making the fourth current corresponding to the held fourth potential flow between the source and the drain of the fourth driving transistor. The semiconductor device has a function of switching the first current flowing to one of the first wiring and the second wiring to the third current and switching the second current flowing to the other of the first wiring and the second wiring to the fourth current, in accordance with a signal input to the third wiring.

(8)

Another embodiment of the present invention is the semiconductor device having any one of the above structures (1) to (7), further including a third circuit, a fourth circuit, and a fifth circuit. The third circuit has a function of supplying the first current corresponding to the first data to the first circuit through the first wiring and a function of supplying the second current corresponding to the first data to the second circuit through the second wiring. The fourth circuit has a function of inputting the first-level potential or the second-level potential to the first input wiring in accordance with the second data and a function of inputting the first-level potential or the second-level potential to the second input wiring in accordance with the second data. The fifth circuit has a function of comparing currents flowing from the first wiring and the second wiring and outputting a potential corresponding to a product of the first data and the second data from an output terminal of the fifth circuit.

(9)

Another embodiment of the present invention is a semiconductor device including a first circuit and a second circuit. The first circuit includes a first holding portion, a first driving transistor, and a third driving transistor. The second circuit includes a second holding portion, a second driving transistor, and a fourth driving transistor. The first circuit is electrically connected to a first input wiring, a second input wiring, a third input wiring, a fourth input wiring, a first wiring, and a second wiring. The second circuit is electrically connected to the first input wiring, the second input wiring, the third input wiring, the fourth input wiring, the first wiring, and the second wiring. The first holding portion has a function of holding a first potential corresponding to a first current from the first wiring flowing between a source and a drain of the first driving transistor. The second holding portion has a function of holding a second potential corresponding to a second current from the second wiring flowing between a source and a drain of the second driving transistor. The first driving transistor has a function of making the first current corresponding to the held first potential flow between the source and the drain of the first driving transistor. The second driving transistor has a function of making the second current corresponding to the held second potential flow between the source and the drain of the second driving transistor. The third driving transistor has a function of making the third current corresponding to the held first potential flow between a source and a drain of the third driving transistor. The fourth driving transistor has a function of making the fourth current corresponding to the held second potential flow between a source and a drain of the fourth driving transistor. The first circuit has a function of outputting the first current to the first wiring when a first-level potential is input to the first input wiring and a second-level potential is input to the second input wiring, a function of outputting the first current to the second wiring when the second-level potential is input to the first input wiring and the first-level potential is input to the second input wiring, a function of outputting the first current to neither the first wiring nor the second wiring when the second-level potential is input to the first input wiring and the second-level potential is input to the second input wiring, a function of outputting the third current to the first wiring when the first-level potential is input to the third input wiring and the second-level potential is input to the fourth input wiring, a function of outputting the third current to the second wiring when the second-level potential is input to the third input wiring and the first-level potential is input to the fourth input wiring, and a function of outputting the third current to neither the first wiring nor the second wiring when the second-level potential is input to the third input wiring and the second-level potential is input to the fourth input wiring. The second circuit has a function of outputting the second current to the second wiring when the first-level potential is input to the first input wiring and the second-level potential is input to the second input wiring, a function of outputting the second current to the first wiring when the second-level potential is input to the first input wiring and the first-level potential is input to the second input wiring, a function of outputting the second current to neither the first wiring nor the second wiring when the second-level potential is input to the first input wiring and the second-level potential is input to the second input wiring, a function of outputting the fourth current to the second wiring when the first-level potential is input to the third input wiring and the second-level potential is input to the fourth input wiring, a function of outputting the fourth current to the first wiring when the second-level potential is input to the third input wiring and the first-level potential is input to the fourth input wiring, and a function of outputting the fourth current to neither the first wiring nor the second wiring when the second-level potential is input to the third input wiring and the second-level potential is input to the fourth input wiring. The first current, the second current, the third current, and the fourth current each have a current amount corresponding to first data. The first-level potential and the second-level potential that are input to the first input wiring, the second input wiring, the third input wiring, and the fourth input wiring are determined in accordance with second data.

(10)
Another embodiment of the present invention is a semiconductor device including a first circuit and a second circuit. The first circuit includes a first holding portion, a first driving transistor, and a third driving transistor. The second circuit includes a second holding portion, a second driving transistor, and a fourth driving transistor. The first circuit is electrically connected to a first input wiring, a second input wiring, a third input wiring, a fourth input wiring, a first wiring, and a second wiring. The second circuit is electrically connected to the first input wiring, the second input wiring, the third input wiring, the fourth input wiring, the first wiring, and the second wiring. The first holding portion has a function of holding a first potential corresponding to a first current from the first wiring flowing between a source and a drain of the first driving transistor. The second holding portion has a function of holding a second potential corresponding to a second current from the second wiring flowing between a source and a drain of the second driving transistor. The first driving transistor has a function of making the first current corresponding to the held first potential flow between the source and the drain of the first driving transistor. The second driving transistor has a function of making the second current corresponding to the held second potential flow between the source and the drain of the second driving transistor. The third driving transistor has a function of making the third current corresponding to the held first potential flow between the source and the drain of the third driving transistor. The fourth driving transistor has a function of making the fourth current corresponding to the held second potential flow between the source and the drain of the fourth driving transistor. The first circuit has a function of outputting the first current to the first wiring when a first-level potential is input to the first input wiring and a second-level potential is input to the second input wiring in a first period, a function of outputting the first current to the second wiring when the second-level potential is input to the first input wiring and the first-level potential is input to the second input wiring in the first period, a function of outputting the first current to neither the first wiring nor the second wiring when the second-level potential is input to the first input wiring and the second-level potential is input to the second input wiring in the first period, a function of outputting the third current to the first wiring when the first-level potential is input to the third input wiring and the second-level potential is input to the fourth input wiring in the first period, a function of outputting the third current to the second wiring when the second-level potential is input to the third input wiring and the first-level potential is input to the fourth input wiring in the first period, and a function of outputting the third current to neither the first wiring nor the second wiring when the second-level potential is input to the third input wiring and the second-level potential is input to the fourth input wiring in the first period. The second circuit has a function of outputting the second current to the second wiring when the first-level potential is input to the first input wiring and the second-level potential is input to the second input wiring in the first period, a function of outputting the second current to the first wiring when the second-level potential is input to the first input wiring and the first-level potential is input to the second input wiring in the first period, a function of outputting the second current to neither the first wiring nor the second wiring when the second-level potential is input to the first input wiring and the second-level potential is input to the second input wiring in the first period, a function of outputting the fourth current to the second wiring when the first-level potential is input to the third input wiring and the second-level potential is input to the fourth input wiring in the first period, a function of outputting the fourth current to the first wiring when the second-level potential is input to the third input wiring and the first-level potential is input to the fourth input wiring in the first period, and a function of outputting the fourth current to neither the first wiring nor the second wiring when the second-level potential is input to the third input wiring and the second-level potential is input to the fourth input wiring in the first period. The first current, the second current, the third current, and the fourth current each have a current amount corresponding to first data. The first-level potential and the second-level potential that are input to the first input wiring, the second input wiring, the third input wiring, and the fourth input wiring and a length of the first period are determined in accordance with second data.

(11)

Another embodiment of the present invention is the semiconductor device having the above structure (10). The first period includes a second period and a third period. The first input wiring has a function of supplying the first-level potential or the second-level potential to both the first circuit and the second circuit in the second period. The second input wiring has a function of supplying the first-level potential or the second-level potential to both the first circuit and the second circuit in the second period. The third input wiring has a function of supplying the first-level potential or the second-level potential to both the first circuit and the second circuit in the second period. The fourth input wiring has a function of supplying the first-level potential or the second-level potential to both the first circuit and the second circuit in the second period. The first input wiring has a function of supplying the first-level potential or the second-level potential to both the first circuit and the second circuit in the third period. The second input wiring has a function of supplying the first-level potential or the second-level potential to both the first circuit and the second circuit in the third period. The third input wiring has a function of supplying the first-level potential or the second-level potential to both the first circuit and the second circuit in the third period. The fourth input wiring has a function of supplying the first-level potential or the second-level potential to both the first circuit and the second circuit in the third period. A length of the third period is twice a length of the second period.

(12)

Another embodiment of the present invention is the semiconductor device having any one of the above structures (9) to (11), further including a third circuit, a fourth circuit, and a fifth circuit. The third circuit has a function of supplying the first current corresponding to the first data to the first circuit through the first wiring and a function of supplying the second current corresponding to the first data to the second circuit through the second wiring. The fourth circuit has a function of inputting the first-level potential or the second-level potential to the first input wiring in accordance with the second data, a function of inputting the first-level potential or the second-level potential to the second input wiring in accordance with the second data, a function of inputting the first-level potential or the second-level potential to the third input wiring in accordance with the second data, and a function of inputting the first-level potential or the second-level potential to the fourth input wiring in accordance with the second data. The fifth circuit has a function of comparing currents flowing from the first wiring and the second wiring and outputting a potential corresponding to a product of the first data and the second data from an output terminal of the fifth circuit.

(13)

Another embodiment of the present invention is a semiconductor device including a first circuit and a second circuit. The first circuit includes a first holding portion and a first driving transistor. The second circuit includes a second holding portion and a second driving transistor. The first circuit is electrically connected to a first input wiring and a first wiring. The second circuit is electrically connected to the first input wiring and a second wiring. The first holding portion has a function of holding a first potential corresponding to a first current from the first wiring flowing between a source and a drain of the first driving transistor. The second holding portion has a function of holding a second potential corresponding to a second current from the second wiring flowing between a source and a drain of the second driving transistor. The first driving transistor has a function of making the first current corresponding to the held first potential flow between the source and the drain of the first driving transistor. The second driving transistor has a function of making the second current corresponding to the held second potential flow between the source and the drain of the second driving transistor. The first circuit has a function of outputting the first current to the first wiring when a first-level potential is input to the first input wiring and a function of not outputting the first current to the first wiring when a second-level potential is input to the first input wiring. The second circuit has a function of outputting the second current to the second wiring when the first-level potential is input to the first input wiring and a function of not outputting the second current to the second wiring when the second-level potential is input to the first input wiring. The first current and the second current each have a current amount corresponding to first data. The first-level potential and the second-level potential that are input to the first input wiring and the second input wiring are determined in accordance with second data.

(14)

Another embodiment of the present invention is a semiconductor device including a first circuit and a second circuit. The first circuit includes a first holding portion and a first driving transistor. The second circuit includes a second holding portion and a second driving transistor. The first circuit is electrically connected to a first input wiring and a first wiring. The second circuit is electrically connected to the first input wiring and a second wiring. The first holding portion has a function of holding a first potential corresponding to a first current from the first wiring flowing between a source and a drain of the first driving transistor. The second holding portion has a function of holding a second potential corresponding to a second current from the second wiring flowing between a source and a drain of the second driving transistor. The first driving transistor has a function of making the first current corresponding to the held first potential flow between the source and the drain of the first driving transistor. The second driving transistor has a function of making the second current corresponding to the held second potential flow between the source and the drain of the second driving transistor. The first circuit has a function of outputting the first current to the first wiring when a first-level potential is input to the first input wiring in a first period and a function of not outputting the first current to the first wiring when a second-level potential is input to the first input wiring in the first period. The second circuit has a function of outputting the second current to the second wiring when the first-level potential is input to the first input wiring in the first period and a function of not outputting the second current to the second wiring when the second-level potential is input to the first input wiring in the first period. The first current and the second current each have a current amount corresponding to first data. The first-level potential and the second-level potential that are input to the first input wiring and the second input wiring are determined in accordance with second data.

(15)

Another embodiment of the present invention is the semiconductor device having the above structure (14). The first period includes a second period and a third period. The first input wiring has a function of supplying the first-level potential or the second-level potential to both the first circuit and the second circuit in the second period. The first input wiring has a function of supplying the first-level potential or the second-level potential to both the first circuit and the second circuit in the third period. A length of the third period is twice a length of the second period.

(16)

Another embodiment of the present invention is the semiconductor device having any one of the structures (13) to (15). The first circuit includes a first transistor, a second transistor, and a first capacitor. The second circuit includes a fourth transistor, a fifth transistor, and a second capacitor. The first holding portion includes the first transistor and the first capacitor. The second holding portion includes the fourth transistor and the second capacitor. A first terminal of the first transistor is electrically connected to a first terminal of the first capacitor and a gate of the first driving transistor. A second terminal of the first transistor is electrically connected to the first wiring. A first terminal of the first driving transistor is electrically connected to a first terminal of the second transistor. A second terminal of the second transistor is electrically connected to the first wiring. A gate of the second transistor is electrically connected to the first input wiring. A first terminal of the fourth transistor is electrically connected to a first terminal of the second capacitor and a gate of the second driving transistor. A second terminal of the fourth transistor is electrically connected to the second wiring. A first terminal of the second driving transistor is electrically connected to a first terminal of the fifth transistor. A second terminal of the fifth transistor is electrically connected to the second wiring. A gate of the fifth transistor is electrically connected to the first input wiring.

(17)

Another embodiment of the present invention is an electronic device including the semiconductor device having any one of the above structures (1) to (16) and a housing, in which an arithmetic operation of a neural network is performed by the semiconductor device.

Note that in this specification and the like, a semiconductor device refers to a device that utilizes semiconductor characteristics, and means a circuit including a semiconductor element (a transistor, a diode, a photodiode, and the like), a device including the circuit, and the like. The semiconductor device also means all devices that can function by utilizing semiconductor characteristics. For example, an integrated circuit, a chip including an integrated circuit, and an electronic component including a chip in a package are examples of the semiconductor device. Moreover, a memory device, a display device, a light-emitting device, a lighting device, an electronic device, and the like themselves might be semiconductor devices, or might include semiconductor devices.

In the case where there is a description "X and Y are connected" in this specification and the like, the case where X and Y are electrically connected, the case where X and Y are functionally connected, and the case where X and Y are directly connected are regarded as being disclosed in this specification and the like. Accordingly, without being limited to a predetermined connection relation, for example, a connection relation shown in drawings or texts, a connection relation other than one shown in drawings or texts is regarded as being disclosed in the drawings or the texts. Each of X and Y denotes an object (e.g., a device, an element, a circuit, a wiring, an electrode, a terminal, a conductive film, or a layer).

For example, in the case where X and Y are electrically connected, one or more elements that allow electrical connection between X and Y (e.g., a switch, a transistor, a capacitor, an inductor, a resistor, a diode, a display device, a light-emitting device, and a load) can be connected between X and Y. Note that a switch has a function of being controlled to be turned on or off. That is, the switch has a function of being in a conduction state (on state) or a non-conduction state (off state) to determine whether a current flows or not.

For example, in the case where X and Y are functionally connected, one or more circuits that allow functional connection between X and Y (e.g., a logic circuit (an inverter, a NAND circuit, a NOR circuit, or the like); a signal converter circuit (a digital-analog converter circuit, an analog-digital converter circuit, a gamma correction circuit, or the like); a potential level converter circuit (a power supply circuit (a step-up circuit, a step-down circuit, or the like), a level shifter circuit for changing the potential level of a signal, or the like); a voltage source; a current source; a switching circuit; an amplifier circuit (a circuit that can increase signal amplitude, the amount of current, or the like, an operational amplifier, a differential amplifier circuit, a source follower circuit, a buffer circuit, or the like); a signal generation circuit; a memory circuit; or a control circuit) can be connected between X and Y. For example, even when another circuit is provided between X and Y, X and Y are regarded as being functionally connected when a signal output from X is transmitted to Y.

Note that an explicit description "X and Y are electrically connected" includes the case where X and Y are electrically connected (that is, the case where X and Y are connected with another element or another circuit provided therebetween), the case where X and Y are functionally connected (that is, the case where X and Y are functionally connected with another circuit provided therebetween), and the case where X and Y are directly connected (that is, the case where X and Y are connected without another element or another circuit provided therebetween). That is, the explicit expression "X and Y are electrically connected" is the same as the explicit simple expression "X and Y are connected".

It can be expressed as, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order". Alternatively, it can be expressed as "a source (or a first terminal or the like) of a transistor is electrically connected to X; a drain (or a second terminal or the like) of the transistor is electrically connected to Y; and X, the source (or the first terminal or the like) of the transistor, the drain (or the second terminal or the like) of the transistor, and Y are electrically connected to each other in this order". Alternatively, it can be expressed as "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided in this connection order". When the connection order in a circuit configuration is defined by an expression similar to the above examples, a source (or a first terminal or the like) and a drain (or a second terminal or the like) of a transistor can be distinguished from each other to specify the technical scope. Note that these expressions are examples, and the expression is not limited to these expressions. Here, X and Y each denote an object (e.g., a device, an element, a circuit, a wiring, an electrode, a terminal, a conductive film, or a layer).

Even when independent components are electrically connected to each other in a circuit diagram, one component has functions of a plurality of components in some cases. For example, when part of a wiring also functions as an electrode, one conductive film has functions of both components: a function of the wiring and a function of the electrode. Thus, "electrical connection" in this specification includes in its category such a case where one conductive film has functions of a plurality of components.

In this specification and the like, a "resistor" can be, for example, a circuit element or a wiring having a resistance value. Therefore, in this specification and the like, a "resistor" sometimes includes a wiring having a resistance value, a transistor in which current flows between the source and the drain, a diode, and a coil. Thus, the term "resistor" can be replaced with the terms "resistance", "load", and "a region having a resistance value", and the like; inversely, the terms "resistance", "load", and "a region having a resistance" can be replaced with the term "resistor" and the like. The resistance value can be, for example, preferably greater than or equal to 1 m$\Omega$ and less than or equal to 10$\Omega$, further preferably greater than or equal to 5 m$\Omega$ and less than or equal to 5$\Omega$, still further preferably greater than or equal to 10 m$\Omega$ and less than or equal to 1$\Omega$. As another example, the resistance value may be greater than or equal to 1$\Omega$ and less than or equal to $1\times10^9\Omega$.

In this specification and the like, a "capacitor" is, for example, a circuit element having an electrostatic capacitance value, a region of a wiring having an electrostatic capacitance value, parasitic capacitance, or gate capacitance of a transistor. Therefore, in this specification and the like, a "capacitor" sometimes includes not only a circuit element that has a pair of electrodes and a dielectric between the electrodes, but also parasitic capacitance generated between wirings, gate capacitance generated between a gate and one of a source and a drain of a transistor, and the like. The terms "capacitor", "parasitic capacitance", "gate capacitance", and the like can be replaced with the term "capacitance" and the like; inversely, the term "capacitance" can be replaced with the terms "capacitor", "parasitic capacitance", "gate capacitance", and the like. The term "pair of electrodes" of "capacitor" can be replaced with "pair of conductors", "pair of conductive regions", "pair of regions", and the like. Note that the electrostatic capacitance value can be greater than or equal to 0.05 fF and less than or equal to 10 pF, for example. Alternatively, the electrostatic capacitance value may be greater than or equal to 1 pF and less than or equal to 10 µF, for example.

In this specification and the like, a transistor includes three terminals called a gate, a source, and a drain. The gate functions as a control terminal for controlling the conduction state of the transistor. Two terminals functioning as the source and the drain are input/output terminals of the transistor. One of the two input/output terminals serves as the source and the other serves as the drain on the basis of the conductivity type (n-channel type or p-channel type) of the transistor and the levels of potentials applied to the three terminals of the transistor. Thus, the terms "source" and "drain" can be replaced with each other in this specification and the like. In this specification and the like, expressions "one of a source and a drain" (or a first electrode or a first terminal) and "the other of the source and the drain" (or a second electrode or a second terminal) are used in description of the connection relation of a transistor. Depending on the structure, a transistor may include a back gate in addition to the above three terminals. In that case, in this specification and the like, one of the gate and the back gate of the transistor may be referred to as a first gate and the other of the gate and the back gate of the transistor may be referred to as a second gate. Moreover, the terms "gate" and "back gate" can be replaced with each other in one transistor in some cases. In the case where a transistor includes three or more gates, the gates may be referred to as a first gate, a second gate, and a third gate, for example, in this specification and the like.

In this specification and the like, a node can be referred to as a terminal, a wiring, an electrode, a conductive layer, a conductor, an impurity region, or the like depending on the circuit configuration, the device structure, or the like. Furthermore, a terminal, a wiring, or the like can be referred to as a node.

In this specification and the like, "voltage" and "potential" can be replaced with each other as appropriate. The "voltage" refers to a potential difference from a reference potential, and when the reference potential is a ground potential, for example, the "voltage" can be replaced with the "potential". The ground potential does not necessarily mean 0 V. Potentials are relative values, and the potential applied to a wiring or the like is sometimes changed depending on the reference potential.

Note that "current" is a charge transfer (electrical conduction); for example, the description "electrical conduction of positively charged particles occurs" can be rephrased as "electrical conduction of negatively charged particles occurs in the opposite direction". Therefore, unless otherwise specified, "current" in this specification and the like refers to a charge transfer (electrical conduction) accompanied by carrier movement. Examples of a carrier here include an electron, a hole, an anion, a cation, and a complex ion, and the type of carrier differs between current flow systems (e.g., a semiconductor, a metal, an electrolyte solution, and a vacuum). The direction of a current in a wiring or the like refers to the direction in which a positive carrier moves, and the amount of current is expressed as a positive value. In other words, the direction in which a negative carrier moves is opposite to the direction of a current, and the amount of current is expressed as a negative value. Thus, in the case where the polarity of a current (or the direction of a current) is not specified in this specification and the like, the description "current flows from element A to element B" can be rephrased as "current flows from element B to element A", for example. The description "current is input to element A" can be rephrased as "current is output from element A", for example.

Ordinal numbers such as "first", "second", and "third" in this specification and the like are used to avoid confusion among components. Thus, the terms do not limit the number of components. In addition, the terms do not limit the order of components. In this specification and the like, for example, a "first" component in one embodiment can be referred to as a "second" component in other embodiments or claims. Furthermore, in this specification and the like, for example, a "first" component in one embodiment can be omitted in other embodiments or claims.

In this specification and the like, terms for describing arrangement, such as "over" and "below", are sometimes used for convenience to describe the positional relation between components with reference to drawings. The positional relation between components is changed as appropriate in accordance with a direction in which the components are described. Thus, terms for the description are not limited to terms used in the specification and the like, and the description can be made appropriately according to circumstances. For example, the expression "an insulator positioned over (on) a top surface of a conductor" can be replaced with the expression "an insulator positioned on a bottom surface of a conductor" when the direction of a drawing showing these components is rotated by 180°.

Furthermore, the term "over" or "below" does not necessarily mean that a component is placed directly over or directly below and in direct contact with another component. For example, the expression "electrode B over insulating layer A" does not necessarily mean that the electrode B is formed over and in direct contact with the insulating layer A, and does not exclude the case where another component is provided between the insulating layer A and the electrode B.

In this specification and the like, the terms "film", "layer", and the like can be interchanged with each other according to circumstances. For example, the term "conductive layer" can be changed into the term "conductive film" in some cases. Moreover, the term "insulating film" can be changed into the term "insulating layer" in some cases. Alternatively, the term "film", "layer", or the like is not used and can be interchanged with another term depending on the case or according to circumstances. For example, the term "conductive layer" or "conductive film" can be changed into the term "conductor" in some cases. Furthermore, for example, the term "insulating layer" or "insulating film" can be changed into the term "insulator" in some cases.

In this specification and the like, a term such as an "electrode", a "wiring", or a "terminal" does not limit the function of a component. For example, an "electrode" is used as part of a "wiring" in some cases, and vice versa. Furthermore, the term "electrode" or "wiring" also includes the case where a plurality of "electrodes" or "wirings" are formed in an integrated manner, for example. For example, a "terminal" is used as part of a "wiring" or an "electrode" in some cases, and vice versa. Furthermore, the term "terminal" can also include the case where a plurality of "electrodes", "wirings", "terminals", or the like are formed in an integrated manner. Therefore, for example, an "electrode" can be part of a "wiring" or a "terminal", and a "terminal" can be part of a "wiring" or an "electrode". Moreover, the terms "electrode", "wiring", and "terminal" are sometimes replaced with the term "region", for example.

In this specification and the like, the terms "wiring", "signal line", "power supply line", and the like can be interchanged with each other depending on the case or according to circumstances. For example, the term "wiring" can be changed into the term "signal line" in some cases. As another example, the term "wiring" can be changed into the term "power supply line" in some cases. Inversely, the term "signal line", "power supply line", or the like can be changed into the term "wiring" in some cases. The term "power supply line" or the like can be changed into the term "signal line" or the like in some cases. Inversely, the term "signal line" or the like can be changed into the term "power supply line" or the like in some cases. The term "potential" that is applied to a wiring can be changed into the term "signal" or the like depending on the case or according to circumstances. Inversely, the term "signal" or the like can be changed into the term "potential" in some cases.

In this specification and the like, an impurity in a semiconductor refers to an element other than a main component of a semiconductor layer, for example. For example, an element with a concentration of lower than 0.1 atomic % is an impurity. If a semiconductor contains an impurity, formation of the DOS (Density of States) in the semiconductor, decrease in the carrier mobility, or decrease in the crystallinity may occur, for example. In the case where the semiconductor is an oxide semiconductor, examples of an impurity that changes characteristics of the semiconductor include Group 1 elements, Group 2 elements, Group 13 elements, Group 14 elements, Group 15 elements, and transition metals other than the main components; specific examples are hydrogen (contained also in water), lithium, sodium, silicon, boron, phosphorus, carbon, and nitrogen. Specifically, when the semiconductor is a silicon layer, examples of an impurity that changes characteristics of the semiconductor include oxygen, Group 1 elements except hydrogen, Group 2 elements, Group 13 elements, and Group 15 elements.

In this specification and the like, a switch is in a conduction state (on state) or a non-conduction state (off state) to determine whether a current flows or not. Alternatively, a switch has a function of selecting and changing a current path. For example, an electrical switch or a mechanical switch can be used. That is, a switch can be any element capable of controlling a current, and is not limited to a certain element.

Examples of an electrical switch include a transistor (e.g., a bipolar transistor and a MOS transistor), a diode (e.g., a PN diode, a PIN diode, a Schottky diode, a MIM (Metal Insulator Metal) diode, a MIS (Metal Insulator Semiconductor) diode, and a diode-connected transistor), and a logic circuit in which such elements are combined. Note that in the case of using a transistor as a switch, a "conduction state" of the transistor refers to a state where a source electrode and a drain electrode of the transistor can be regarded as being electrically short-circuited. Furthermore, a "non-conduction state" of the transistor refers to a state where the source electrode and the drain electrode of the transistor can be regarded as being electrically disconnected. Note that in the case where a transistor operates just as a switch, there is no particular limitation on the polarity (conductivity type) of the transistor.

An example of a mechanical switch is a switch formed using a MEMS (micro electro mechanical system) technology. Such a switch includes an electrode that can be moved mechanically, and operates by controlling conduction and non-conduction with movement of the electrode.

In this specification, "parallel" indicates a state where two straight lines are placed at an angle greater than or equal to −10° and less than or equal to 10°. Thus, the case where the angle is greater than or equal to −5° and less than or equal to 5° is also included. In addition, the term "approximately parallel" or "substantially parallel" indicates a state where two straight lines are placed at an angle greater than or equal to −30° and less than or equal to 30°. Moreover, "perpendicular" indicates a state where two straight lines are placed at an angle greater than or equal to 80° and less than or equal to 100°. Thus, the case where the angle is greater than or equal to 85° and less than or equal to 95° is also included. Furthermore, "approximately perpendicular" or "substantially perpendicular" indicates a state where two straight lines are placed at an angle greater than or equal to 60° and less than or equal to 120°.

Effect of the Invention

One embodiment of the present invention can provide a semiconductor device and the like including a hierarchical artificial neural network. Another embodiment of the present invention can provide a semiconductor device and the like with low power consumption.

Another embodiment of the present invention can provide a semiconductor device and the like that are less affected by environmental temperature. Another embodiment of the present invention can provide a semiconductor device and the like that are less affected by variations in characteristics of a transistor. Another embodiment of the present invention can provide a semiconductor device and the like that are less affected by variations in characteristics of a current source. Another embodiment of the present invention can provide a novel semiconductor device and the like.

Note that the effects of one embodiment of the present invention are not limited to the effects listed above. The effects listed above do not preclude the existence of other effects. Note that the other effects are effects that are not described in this section and will be described below. The effects that are not described in this section will be derived from the descriptions of the specification, the drawings, and the like and can be extracted from these descriptions by those skilled in the art. Note that one embodiment of the present invention has at least one of the effects listed above and the other effects. Accordingly, depending on the case, one embodiment of the present invention does not have the effects listed above in some cases.

BRIEF DESCRIPTION OF THE DRAWINGS

FIG. 18A, FIG. 18B, and FIG. 18C are timing charts each showing an operation example of a semiconductor device.

FIG. 19A, FIG. 19B, and FIG. 19C are timing charts each showing an operation example of a semiconductor device.

FIG. 20A, FIG. 20B, and FIG. 20C are timing charts each showing an operation example of a semiconductor device.

FIG. 48A, FIG. 48B, and FIG. 48C are timing charts each showing an operation example of a semiconductor device.

MODE FOR CARRYING OUT THE INVENTION

Figure 1A:
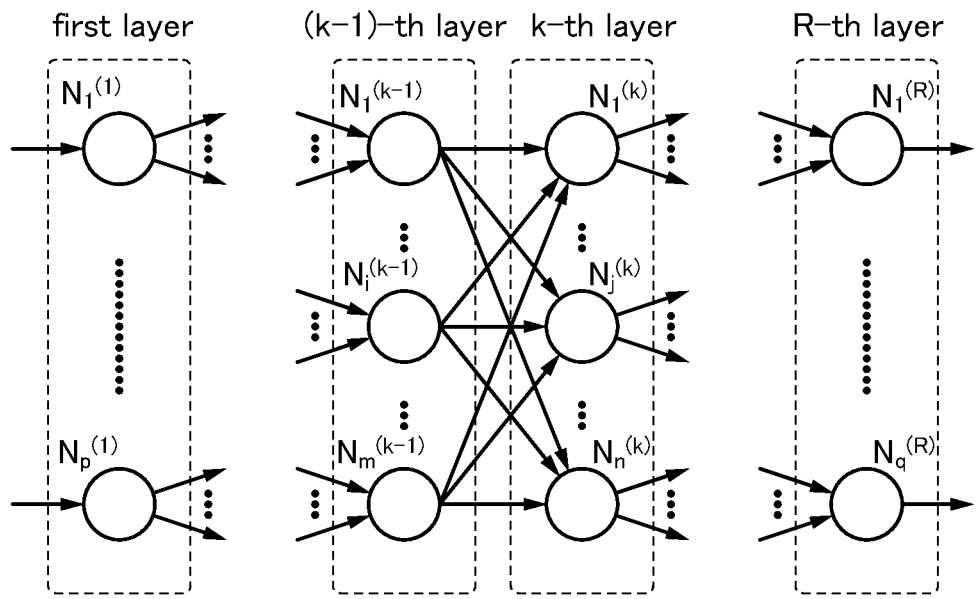
FIG. 1A and FIG. 1B are diagrams illustrating a hierarchical neural network.

In an artificial neural network (hereinafter, referred to as a neural network), the connection strength between synapses can be changed by providing the neural network with existing data. The processing for determining a connection strength by providing a neural network with existing data in such a manner is called "learning" in some cases.

Furthermore, when a neural network in which "learning" has been performed (the connection strength has been determined) is provided with some type of information, new information can be output on the basis of the connection strength. The processing for outputting new information on the basis of provided information and the connection strength in a neural network in such a manner is called "inference" or "recognition" in some cases.

Examples of the model of a neural network include a Hopfield type and a hierarchical type. In particular, a neural network with a multilayer structure is called a "deep neural network" (DNN), and machine learning using a deep neural network is called "deep learning" in some cases.

In this specification and the like, a metal oxide is an oxide of metal in a broad sense. Metal oxides are classified into an oxide insulator, an oxide conductor (including a transparent oxide conductor), an oxide semiconductor (also simply referred to as an OS), and the like. For example, in the case where a metal oxide is used in an active layer of a transistor, the metal oxide is referred to as an oxide semiconductor in some cases. That is, when a metal oxide can form a channel formation region of a transistor that has at least one of an amplifying function, a rectifying function, and a switching function, the metal oxide can be referred to as a metal oxide semiconductor or shortly as an OS. In the case where an OS transistor is mentioned, the OS transistor can also be referred to as a transistor including a metal oxide or an oxide semiconductor.

Furthermore, in this specification and the like, a metal oxide containing nitrogen is also collectively referred to as a metal oxide in some cases. A metal oxide containing nitrogen may be referred to as a metal oxynitride.

In this specification and the like, one embodiment of the present invention can be constituted by appropriately combining a structure described in an embodiment with any of the structures described in the other embodiments. In addition, in the case where a plurality of structure examples are described in one embodiment, the structure examples can be combined as appropriate.

Note that a content (or part of the content) described in one embodiment can be applied to, combined with, or replaced with at least one of another content (or part of the content) in the embodiment and a content (or part of the content) described in one or a plurality of different embodiments.

Note that in each embodiment, a content described in the embodiment is a content described with reference to a variety of diagrams or a content described with text in the specification.

Note that by combining a diagram (or part thereof) described in one embodiment with at least one of another part of the diagram, a different diagram (or part thereof) described in the embodiment, and a diagram (or part thereof)

described in one or a plurality of different embodiments, much more diagrams can be formed.

Embodiments described in this specification are described with reference to the drawings. Note that the embodiments can be implemented in many different modes, and it will be readily appreciated by those skilled in the art that modes and details can be changed in various ways without departing from the spirit and scope thereof. Therefore, the present invention should not be interpreted as being limited to the description in the embodiments. Note that in the structures of the invention in the embodiments, the same portions or portions having similar functions are denoted by the same reference numerals in different drawings, and repeated description thereof is omitted in some cases. In perspective views and the like, some components might not be illustrated for clarity of the drawings.

In this specification and the like, when a plurality of components are denoted by the same reference signs, and in particular need to be distinguished from each other, an identification numeral such as "_1", "[n]", or "[m,n]" is sometimes added to the reference signs.

In the drawings in this specification, the size, the layer thickness, or the region is exaggerated for clarity in some cases. Therefore, they are not limited to the illustrated scale.

The drawings are schematic views showing ideal examples, and embodiments of the present invention are not limited to shapes or values shown in the drawings. For example, variations in signal, voltage, or current due to noise, variations in signal, voltage, or current due to difference in timing, or the like can be included.

Note that in this specification and the like, In:Ga:Zn=4:2:3 or a neighborhood thereof refers to an atomic ratio where, when In is 4 with respect to the total number of atoms, Ga is greater than or equal to 1 and less than or equal to 3 ($1 \leq Ga \leq 3$) and Zn is greater than or equal to 2 and less than or equal to 4.1 ($2 \leq Zn \leq 4.1$). In:Ga:Zn=5:1:6 or a neighborhood thereof refers to an atomic ratio where, when In is 5 with respect to the total number of atoms, Ga is greater than 0.1 and less than or equal to 2 ($0.1 < Ga \leq 2$) and Zn is greater than or equal to 5 and less than or equal to 7 ($5 \leq Zn \leq 7$). In:Ga:Zn=1:1:1 or a neighborhood thereof refers to an atomic ratio where, when In is 1 with respect to the total number of atoms, Ga is greater than 0.1 and less than or equal to 2 ($0.1 < Ga \leq 2$) and Zn is greater than 0.1 and less than or equal to 2 ($0.1 < Zn \leq 2$). In:Ga:Zn=5:1:3 or a neighborhood thereof refers to an atomic ratio where, when In is 5 with respect to the total number of atoms, Ga is greater than or equal to 0.5 and less than or equal to 1.5 ($0.5 \leq Ga \leq 1.5$) and Zn is greater than or equal to 2 and less than or equal to 4.1 ($2 \leq Zn \leq 4.1$). In:Ga:Zn=10:1:3 or a neighborhood thereof refers to an atomic ratio where, when In is 10 with respect to the total number of atoms, Ga is greater than or equal to 0.5 and less than or equal to 1.5 ($0.5 \leq Ga \leq 1.5$) and Zn is greater than or equal to 2 and less than or equal to 4.1 ($2 \leq Zn \leq 4.1$). In:Zn=2:1 or a neighborhood thereof refers to an atomic ratio where, when In is 1 with respect to the total number of atoms, Zn is greater than or equal to 0.25 and less than or equal to 0.75 ($0.25 < Zn \leq 0.75$). In:Zn=5:1 or a neighborhood thereof refers to an atomic ratio where, when In is 1 with respect to the total number of atoms, Zn is greater than or equal to 0.12 and less than or equal to 0.25 ($0.12 < Zn \leq 0.25$). In:Zn=10:1 or a neighborhood thereof refers to atomic ratio where, when In is 1 with respect to the total number of atoms, Zn is greater than or equal to 0.07 and less than or equal to 0.12 ($0.07 < Zn \leq 0.12$).

Embodiment 1

In this embodiment, an arithmetic circuit that is a semiconductor device of one embodiment of the present invention and performs arithmetic operation of a neural network is described.

<Hierarchical Neural Network>

First, a hierarchical neural network is described. A hierarchical neural network includes one input layer, one or a plurality of intermediate layers (hidden layers), and one output layer, for example, and is configured with a total of at least three layers. A hierarchical neural network 100 illustrated in FIG. 1A shows one example, and the neural network 100 includes a first layer to an R-th layer (here, R can be an integer greater than or equal to 4). Specifically, the first layer corresponds to the input layer, the R-th layer corresponds to the output layer, and the other layers correspond to the intermediate layers. Note that FIG. 1A illustrates the (k−1)-th layer and the k-th layer (here, k is an integer greater than or equal to 3 and less than or equal to R−1) as the intermediate layers, and does not illustrate the other intermediate layers.

Each of the layers of the neural network 100 includes one or a plurality of neurons. In FIG. 1A, the first layer includes a neuron $N_1^{(1)}$ to a neuron $N_p^{(1)}$ (here, p is an integer greater than or equal to 1); the (k−1)-th layer includes a neuron $N_1^{(k-1)}$ to a neuron $N_m^{(k-1)}$ (here, m is an integer greater than or equal to 1); the k-th layer includes a neuron $N_1^{(k)}$ to a neuron $N_n^{(k)}$ (here, n is an integer greater than or equal to 1); and the R-th layer includes a neuron $N_1^{(R)}$ to a neuron $N_q^{(R)}$ (here, q is an integer greater than or equal to 1).

Note that FIG. 1A illustrates a neuron $N_i^{(k-1)}$ (here, i is an integer greater than or equal to 1 and less than or equal to m) in the (k−1)-th layer and a neuron $N_j^{(k)}$ (here, j is an integer greater than or equal to 1 and less than or equal to n) in the k-th layer, in addition to the neuron $N_1^{(1)}$, the neuron $N_p^{(1)}$, the neuron $N_1^{(k-1)}$, the neuron $N_m^{(k-1)}$, the neuron $N_1^{(k)}$, the neuron $N_n^{(k)}$, the neuron $N_1^{(R)}$, and the neuron $N_q^{(R)}$; the other neurons are not illustrated.

Next, signal transmission from a neuron in one layer to a neuron in the subsequent layer and signals input to and output from the neurons are described. Note that description here is made focusing on the neuron $N_j^{(k)}$ in the k-th layer.

Figure 1B:
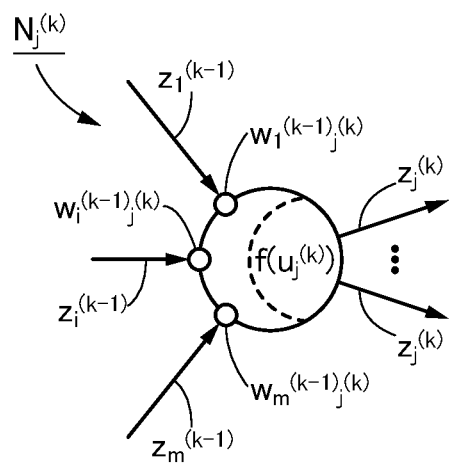

FIG. 1B illustrates the neuron $N_j^{(k)}$ in the k-th layer, signals input to the neuron $N_j^{(k)}$, and a signal output from the neuron $N_j^{(k)}$.

Specifically, $z_1^{(k-1)}$ to $z_m^{(k-1)}$ that are output signals from the neuron $N_1^{(k-1)}$ to the neuron $N_m^{(k-1)}$ in the (k−1)-th layer are output to the neuron $N_j^{(k)}$. Then, the neuron $N_j^{(k)}$ generates $z_j^{(k)}$ in accordance with $z_1^{(k-1)}$ to $z_m^{(k-1)}$, and outputs $z_j^{(k)}$ as the output signal to the neurons in the (k+1)-th layer (not illustrated).

The efficiency of transmitting a signal input from a neuron in one layer to a neuron in the subsequent layer depends on the connection strength (hereinafter, referred to as weight coefficient) of the synapse that connects the neurons to each other. In the neural network 100, a signal output from a neuron in one layer is multiplied by a corresponding weight coefficient and then is input to a neuron in the subsequent layer. When i is an integer greater than or equal to 1 and less than or equal to m and the weight coefficient of the synapse between the neuron $N_i^{(k-1)}$ in the (k−1)-th layer and the neuron $N_j^{(k)}$ in the k-th layer is $w_i^{(k-1)}{}_j^{(k)}$, a signal input to the neuron $N_j^{(k)}$ in the k-th layer can be expressed by Formula (1.1).

[Formula 1]

$$w_{i\ j}^{(k-1)\ (k)} \cdot z_i^{(k-1)} \quad (1.1)$$

That is, when the signals are transmitted from the neuron $N_1^{(k-1)}$ to the neuron $N_m^{(k-1)}$ in the (k−1)-th layer to the neuron $N_j^{(k)}$ in the k-th layer, the signals $z_i^{(k-1)}$ to $z_m^{(k-1)}$ are multiplied by the corresponding weight coefficients $w_1^{(k-1)\ (k)}{}_j$ to $w_m^{(k-1)\ (k)}{}_j$. Then, $w_1^{(k-1)\ (k)}{}_j \cdot z_1^{(k-1)}$ to $w_m^{(k-1)\ (k)}{}_j \cdot z_m^{(k-1)}$ are input to the neuron $N_j^{(k)}$ in the k-th layer. At this time, the total sum $u_j^{(k)}$ of the signals input to the neuron $N_j^{(k)}$ in the k-th layer is expressed by Formula (1.2).

[Formula 2]

$$u_j^{(k)} = \sum_{i=1}^{m} w_{i\ j}^{(k-1)\ (k)} \cdot z_i^{(k-1)} \quad (1.2)$$

In addition, a bias may be applied to the product-sum result of the weight coefficients $w_1^{(k-1)\ (k)}{}_j$ to $w_m^{(k-1)\ (k)}{}_j$ and the signals $z_i^{(k-1)}$ to $z_m^{(k-1)}$ of the neurons. When the bias is denoted by b, Formula (1.2) can be rewritten as the following formula.

[Formula 3]

$$u_j^{(k)} = \sum_{i=1}^{m} w_{i\ j}^{(k-1)\ (k)} \cdot z_i^{(k-1)} + b \quad (1.3)$$

The neuron $N_j^{(k)}$ generates the output signal $z_j^{(k)}$ in accordance with $u_j^{(k)}$. Here, the output signal $z_j^{(k)}$ from the neuron $N_j^{(k)}$ is defined by the following formula.

[Formula 4]

$$z_j^{(k)} = f(u_j^{(k)}) \quad (1.4)$$

A function $f(u_j^{(k)})$ is an activation function in a hierarchical neural network, and a step function, a linear ramp function, a sigmoid function, or the like can be used. Note that the activation function may be the same or different among all neurons. In addition, the neuron activation function may be the same or different between the layers.

Here, the signal output from each neuron in the layers, the weight coefficient w, and the bias b may each be an analog value or a digital value. For example, a binary or ternary digital value may be used. A value with a larger bit number may also be used. In the case of an analog value, for example, a linear ramp function, a sigmoid function, or the like is used as the activation function. In the case of a binary digital value, a step function with an output of −1 or 1 or an output of 0 or 1 is used, for example. Alternatively, the neurons in the layers may each output a ternary or higher-level signal; for example, as an activation function that outputs a ternary value, a step function with an output of −1, 0, or 1 or a step function with an output of 0, 1, or 2 is used, for example. Alternatively, as an activation function that outputs a quinary value, a step function with an output of −2, −1, 0, 1, or 2 may be used, for example. The use of a digital value as at least one of the signal output from each neuron in the layers, the weight coefficient w, and the bias b enables a smaller circuit scale, lower power consumption, higher-speed arithmetic operation, or the like. Furthermore, the use of an analog value as at least one of the signal output from each neuron in the layers, the weight coefficient w, and the bias b can improve the arithmetic operation accuracy.

The neural network 100 performs operation in which by input of an input signal to the first layer (the input layer), output signals are sequentially generated in the layers from the first layer (the input layer) to the last layer (the output layer) according to Formula (1.1), Formula (1.2) (or Formula (1.3)), and Formula (1.4) on the basis of the signals input from the previous layers, and the output signals are output to the subsequent layers. The signal output from the last layer (the output layer) corresponds to the calculation results of the neural network 100.

Configuration Example of Arithmetic Operation Circuit

Described here is an example of an arithmetic circuit that is capable of performing the arithmetic operation of Formula (1.2) (or Formula (1.3)) and Formula (1.4) in the above-described neural network 100. Note that in the arithmetic circuit, for example, a weight coefficient of a synapse circuit of the neural network 100 has two levels (e.g., a combination of "−1" and "+1" or a combination of "0" and "+1"), three levels (e.g., a combination of "−1", "0", and "1"), or multi levels of four or more levels (e.g., in the case of five levels, a combination of "−2", "−1", "0", "1", and "2"), and a neuron activation function is a function that outputs two levels (e.g., a combination of "−1" and "+1" or a combination of "0" and "+1"), three levels (e.g., a combination of "−1", "0", and "1"), or multi levels of four or more levels (e.g., in the case of four levels, a combination of "0", "1", "2", and "3"). In this specification and the like, one of a weight coefficient and a value of a signal (referred to as an arithmetic value in some cases) input from a neuron in one layer to a neuron in the subsequent layer is referred to as first data, and the other is referred to as second data in some cases. Note that the arithmetic value and the weight coefficient of the synapse circuit of the neural network 100 are not limited to digital values, and an analog value can be used as at least one of them.

Figure 2:
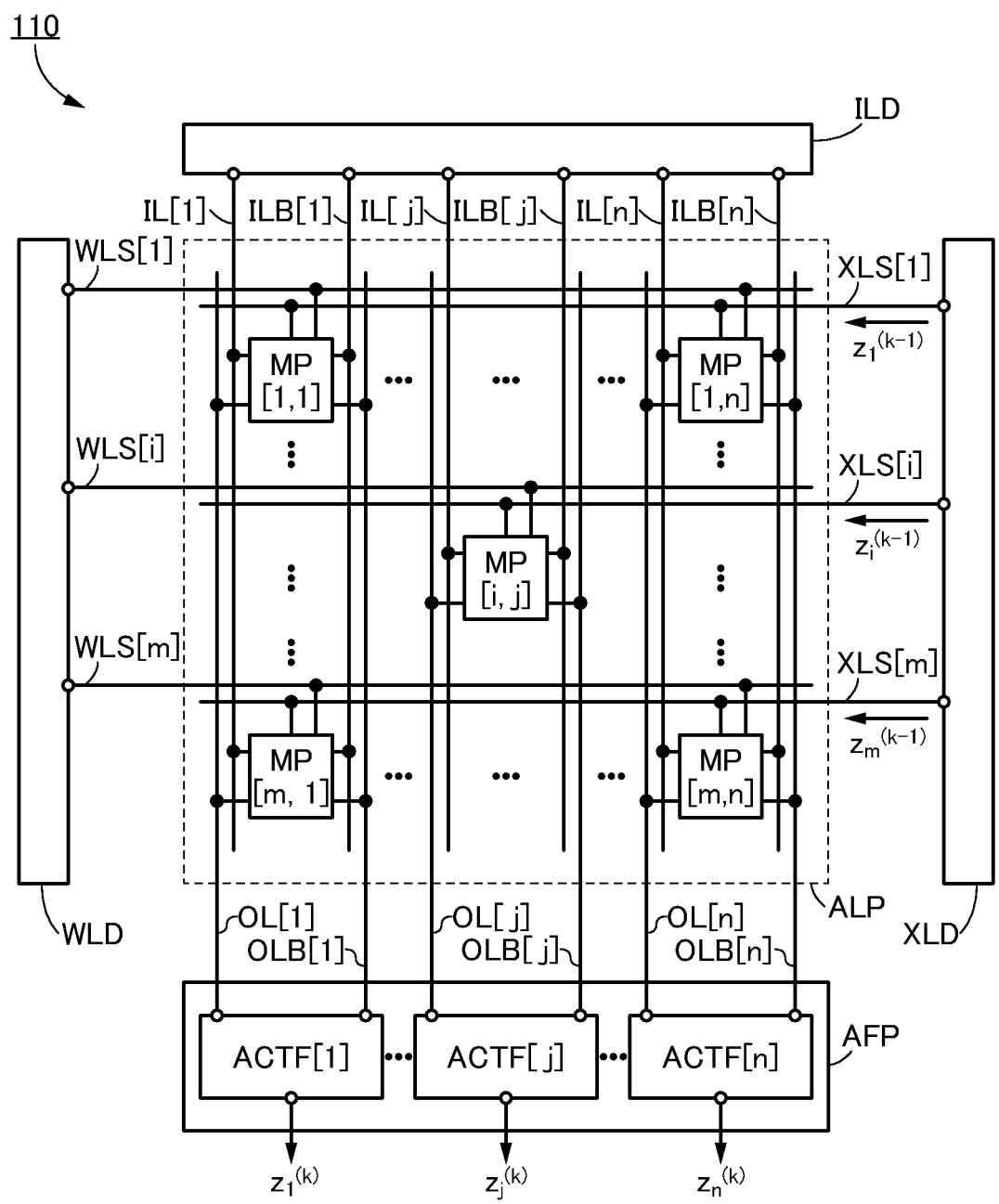
FIG. 2 is a circuit diagram showing a configuration example of a semiconductor device.

An arithmetic circuit 110 illustrated in FIG. 2 is a semiconductor device including an array portion ALP, a circuit ILD, a circuit WLD, a circuit XLD, and a circuit AFP, for example. The arithmetic circuit 110 is a circuit that processes the signals $z_1^{(k-1)}$ to $z_m^{(k-1)}$ input to the neuron $N_1^{(k)}$ to the neuron $N_n^{(k)}$ in the k-th layer in FIG. 1A and FIG. 1B and generates signals $z_1^{(k)}$ to $z_n^{(k)}$ respectively output from the neuron $N_1^{(k)}$ to the neuron $N_n^{(k)}$.

Note that the whole or part of the arithmetic circuit 110 may be used for applications other than a neural network and AI. For example, in the case where product-sum operation processing or matrix operation processing is performed in calculation for graphics, scientific calculation, or the like, the processing may be performed using the whole or part of the arithmetic circuit 110. In other words, the whole or part of the arithmetic circuit 110 may be used for not only calculation for AI but also general calculation.

The circuit ILD is electrically connected to a wiring IL[1] to a wiring IL[n] and a wiring ILB[1] to a wiring ILB[n], for example. The circuit WLD is electrically connected to a wiring WLS[1] to a wiring WLS[m], for example. The circuit XLD is electrically connected to a wiring XLS[1] to a wiring XLS[m], for example. The circuit AFP is electrically connected to a wiring OL[1] to a wiring OL[n] and a wiring OLB[1] to a wiring OLB[n], for example.

<<Array Portion ALP>>

The array portion ALP includes m×n circuits MP, for example. The circuits MP are arranged in a matrix of m rows and n columns in the array portion ALP, for example. Note that in FIG. 2, the circuit MP positioned in the i-th row and the j-th column (here, i is an integer greater than or equal to 1 and less than or equal to m, and j is an integer greater than or equal to 1 and less than or equal to n) is denoted by a circuit MP[i,j]. Note that FIG. 2 illustrates only the circuit MP[1,1], the circuit MP[m,1], the circuit MP[i,j], the circuit MP[1,n], and the circuit MP[m,n] and does not illustrate the other circuits MP.

The circuit MP[i,j] is electrically connected to a wiring IL[j], a wiring ILB[j], a wiring WLS[i], a wiring XLS[i], a wiring OL[j], and a wiring OLB[j], for example.

The circuit MP[i,j] has a function of holding a weight coefficient (sometimes referred to as one of the first data and the second data, and here referred to as the first data) between the neuron $N_i^{(k-1)}$ and the neuron $N_j^{(k)}$, for example. Specifically, the circuit MP[i,j] holds information (e.g., a potential, a resistance value, or a current value) corresponding to the first data (a weight coefficient) input from the wiring IL[j] and the wiring ILB[j]. In addition, the circuit MP[i,j] has a function of outputting the product of the first data and a signal $z_i^{(k-1)}$ (sometimes referred to as the other of the first data and the second data, and here referred to as the second data) output from the neuron $N_i^{(k-1)}$. As a specific example, when the second data $z_i^{(k-1)}$ is input from the wiring XLS[i], the circuit MP[i,j] outputs, to the wiring OL[j] and the wiring OLB[j], information (e.g., a current or a voltage) corresponding to the product of the first data and the second data or information (e.g., a current or a voltage) related to the product of the first data and the second data. Note that although an example of the case where the wiring IL[j] and the wiring ILB[j] are provided is described, one embodiment of the present invention is not limited thereto. Only one of the wiring IL[j] and the wiring ILB[j] may be provided.

<<Circuit ILD>>

The circuit ILD has a function of inputting, to the circuit MP[1,1] to the circuit MP[m,n], information (e.g., a potential, a resistance value, or a current value) corresponding to first data $w_1^{(k-1)}{}_1^{(k)}$ to $w_m^{(k-1)}{}_n^{(k)}$ that are weight coefficients, through the wiring IL[1] to the wiring IL[n] and the wiring ILB[1] to the wiring ILB[n], for example. As a specific example, the circuit ILD supplies, to the circuit MP[i,j], information (e.g., a potential, a resistance value, or a current value) corresponding to the first data $w_i^{(k-1)}{}_j^{(k)}$ that is a weight coefficient, through the wiring IL[j] and the wiring ILB[j].

<<Circuit XLD>>

Figure 3:
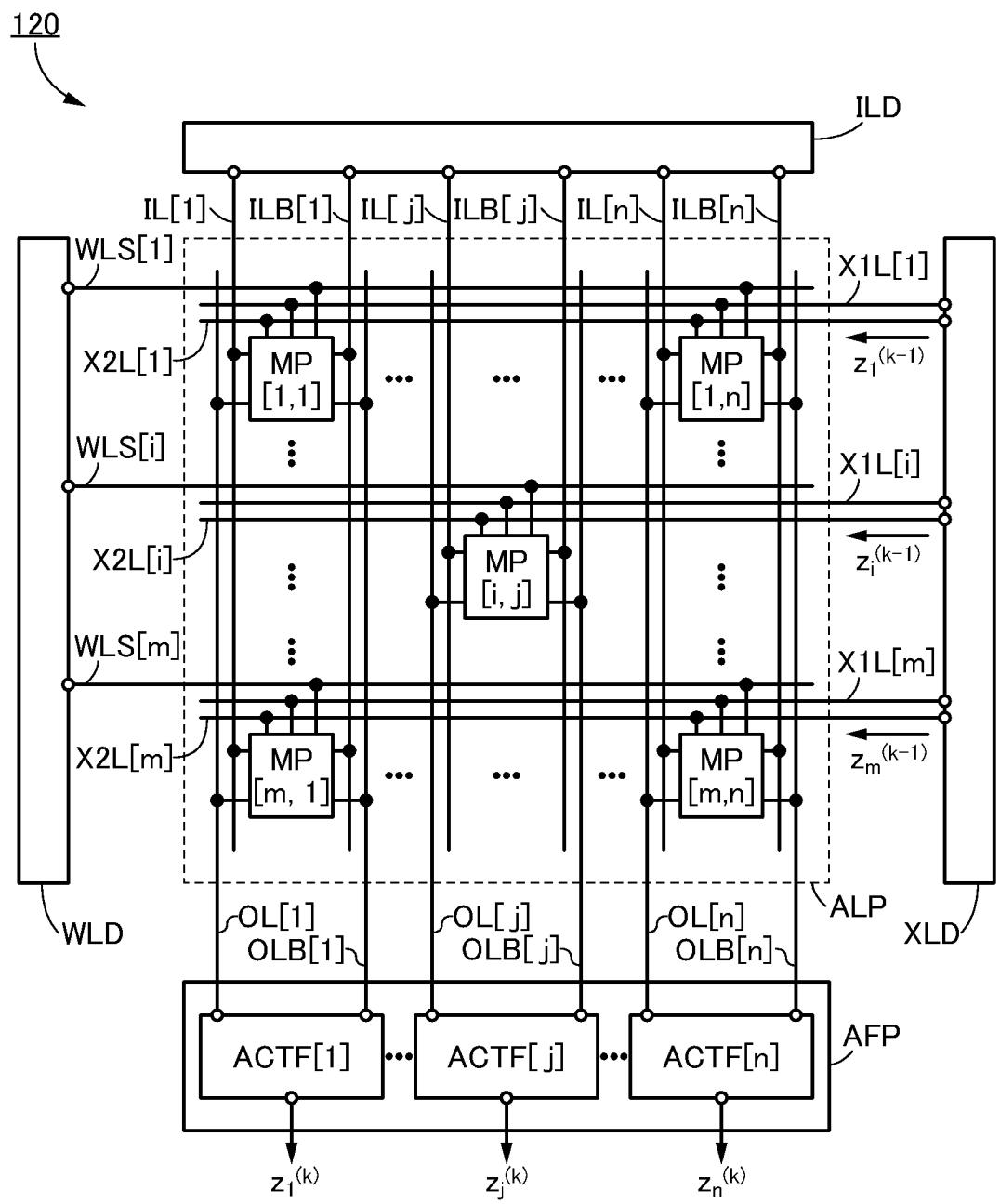
FIG. 3 is a circuit diagram showing a configuration example of a semiconductor device.

The circuit XLD has a function of supplying, to the circuit MP[1,1] to the circuit MP[m,n], the second data $z_1^{(k-1)}$ to $z_m^{(k-1)}$ corresponding to arithmetic values output from the neuron $N_1^{(k-1)}$ to a neuron $N_m^{(k)}$, through the wiring XLS[1] to the wiring XLS[n], for example. Specifically, the circuit XLD supplies, to the circuit MP[i,1] to the circuit MP[i,n], information (e.g., a potential or a current value) corresponding to the second data $z_i^{(k-1)}$ output from the neuron $N_i^{(k-1)}$ through the wiring XLS[i]. Although an example of the case where the wiring XLS[i] is provided is described, one embodiment of the present invention is not limited thereto. For example, in the arithmetic circuit 110 in FIG. 2, the wiring XLS[i] may be a plurality of wirings. As a specific example, FIG. 3 illustrates an arithmetic circuit 120 having a configuration in which the wiring XLS[i] electrically connected to the circuit MP[i,j] of the arithmetic circuit 110 is replaced with two wirings: a wiring X1L and a wiring X2L. Although an example of the case where the wiring XLS[i] is provided is described, one embodiment of the present invention is not limited thereto. For example, in addition to the wiring XLS[i], a wiring transmitting an inverted signal of a signal input to the wiring XLS[i] may be additionally provided.

<<Circuit WLD>>

The circuit WLD has a function of selecting the circuit MP to which information (e.g., a potential, a resistance value, or a current value) corresponding to the first data input from the circuit ILD is to be written, for example. In the case where information (e.g., a potential, a resistance value, or a current value) is written to the circuit MP[i,1] to the circuit MP[i,n] positioned in the i-th row of the array portion ALP, for example, the circuit WLD supplies, to the wiring WLS[i], a signal for bringing writing switching elements included in the circuit MP[i,1] to the circuit MP[i,n] into an on state or an off state, and supplies, to the other wirings WLS, a potential for bringing writing switching elements included in the circuits MP in rows other than the i-th row into an off state, for example. Although an example of the case where the wiring WLS[i] is provided is described, one embodiment of the present invention is not limited thereto. For example, in addition to the wiring WLS[i], a wiring transmitting an inverted signal of a signal input to the wiring WLS[i] may be additionally provided.

Although FIG. 2 shows a configuration example of the arithmetic circuit 110 provided with the wiring WLS[i], one embodiment of the present invention is not limited thereto. For example, the wiring WLS[i] may be replaced with a plurality of wirings. Alternatively, the wiring X1L[i] of the arithmetic circuit 120 in FIG. 3 may also be used as a selection signal line for writing information to the circuit MP[i,1] to the circuit MP[i,n], for example. Specifically, as in an arithmetic circuit 130 illustrated in FIG. 4, the wiring X1L[i] of the arithmetic circuit 120 may be replaced with a wiring WX1L[i] and the wiring WX1L may be electrically connected to the circuit WLD and the circuit XLD. Note that in the case where a signal for bringing the writing switching elements included in the circuit MP[i,1] to the circuit MP[i,n] into an on state or an off state is supplied from the circuit WLD to the wiring WX1L[i], the circuit XLD preferably has a function of establishing a non-conduction state between the circuit XLD and the wiring WX1L. In addition, in the case where signals of the second data $z_i^{(k-1)}$ to $z_m^{(k-1)}$ corresponding to the arithmetic values output from the neuron $N_1^{(k-1)}$ to the neuron $N_m^{(k)}$ are supplied from the circuit WLD to the circuit MP[i,1] to the circuit MP[i,n] through the wiring WX1L[i], the circuit WLD preferably has a function of establishing a non-conduction state between the circuit WLD and the wiring WX1L.

<<Circuit AFP>>

The circuit AFP includes a circuit ACTF[1] to a circuit ACTF[n], for example. The circuit ACTF[j] is electrically connected to the wiring OL[j] and the wiring OLB[j], for example. The circuit ACTF[j] generates, for example, a signal corresponding to information (e.g., a potential or a current value) input from the wiring OL[j] and the wiring OLB[j]. For example, information input from the wiring OL[j] and information input from the wiring OLB[j] (e.g., potentials or current values) are compared and a signal based on the comparison result is generated. The signal corresponds to the signal $z_j^{(k)}$ output from the neuron $N_j^{(k)}$. That is, the circuit ACTF[1] to the circuit ACTF[n] function as circuits that perform arithmetic operation of an activation function of the above-described neural network, for example. However, one embodiment of the present invention is not limited thereto. For example, the circuit ACTF[1] to the circuit ACTF[n] may have a function of converting an analog signal into a digital signal. Alternatively, for example, the circuit ACTF[1] to the circuit ACTF[n] may have a function of amplifying an analog signal and outputting the amplified signal, i.e., a function of converting output impedance. Alternatively, for example, the circuit ACTF[1] to the circuit ACTF[n] may have a function of converting a current or a charge into a voltage. Alternatively, for example, the circuit ACTF[1] to the circuit ACTF[n] may have a function of initializing potentials of the wiring OL[j] and the wiring OLB[j].

Figure 4:
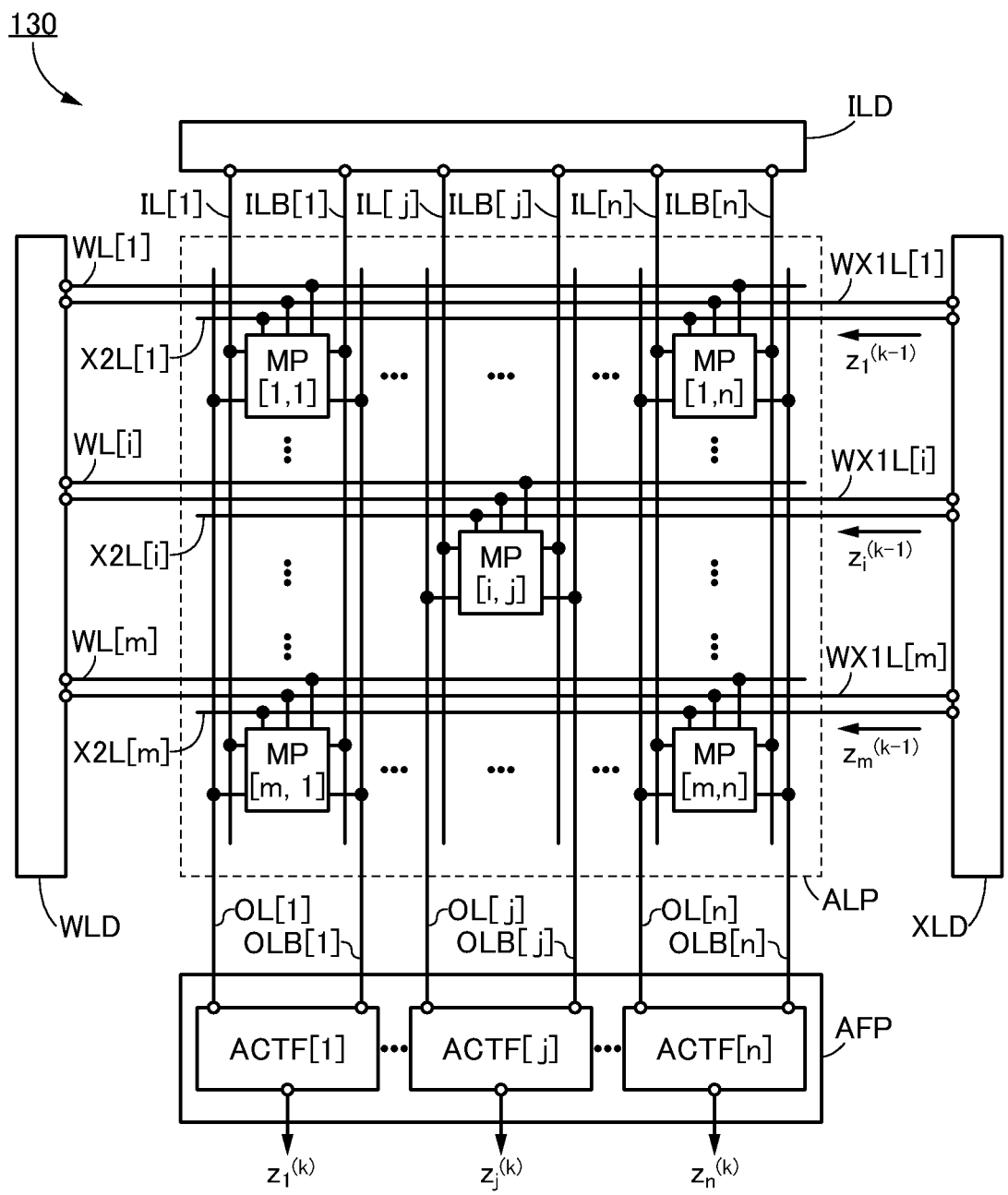
FIG. 4 is a circuit diagram showing a configuration example of a semiconductor device.

Although the arithmetic circuit 110, the arithmetic circuit 120, and the arithmetic circuit 130 illustrated in FIG. 2 to FIG. 4 each show an example of the case where the circuit ACTF is provided, one embodiment of the present invention is not limited thereto. For example, the circuit ACTF is not necessarily provided in the circuit AFP.

Figure 5A:
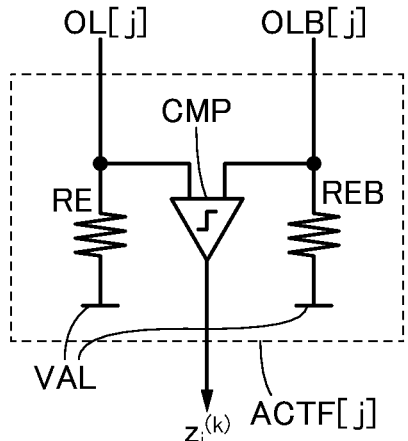
FIG. 5A, FIG. 5B, FIG. 5C, FIG. 5D, FIG. 5E, and FIG. 5F are circuit diagrams each showing a configuration example of a circuit included in a semiconductor device.

Next, the circuit ACTF[1] to the circuit ACTF[n] are described. The circuit ACTF[1] to the circuit ACTF[n] can have a circuit configuration shown in FIG. 5A, for example. FIG. 5A is a circuit that generates the signal $z_j^{(k)}$ in accordance with currents input from the wiring OL[j] and the wiring OLB[j], for example. Specifically, FIG. 5A shows an example of a circuit that performs arithmetic operation of an activation function and outputs the output signal $z_j^{(k)}$ expressed by a binary value.

In FIG. 5A, the circuit ACTF[j] includes a resistor RE, a resistor REB, and a comparator CMP. The resistor RE and the resistor REB have a function of converting a current into a voltage. Therefore, without limitation to the resistor, an element or a circuit can be used as long as it has a function of converting a current into a voltage. The wiring OL[j] is electrically connected to a first terminal of the resistor RE and a first input terminal of the comparator CMP, and the wiring OLB[j] is electrically connected to a first terminal of the resistor REB and a second input terminal of the comparator CMP. A second terminal of the resistor RE is electrically connected to a wiring VAL, and a second terminal of the resistor REB is electrically connected to the wiring VAL. Note that the second terminal of the resistor RE and the second terminal of the resistor REB may be connected to the same wiring. Alternatively, they may be connected to different wirings having the same potential.

The resistance values of the resistor RE and the resistor REB are preferably equal to each other. For example, the difference between the resistance values of the resistor RE and the resistor REB is desirably within 10%, further preferably within 5%. However, one embodiment of the present invention is not limited thereto. Depending on the case or according to circumstances, the resistance values of the resistor RE and the resistor REB may be different values.

The wiring VAL functions as a wiring for supplying a constant voltage, for example. The constant voltage can be VDD that is a high-level potential, VSS that is a low-level potential, or a ground potential (GND), for example. The constant voltage is preferably set as appropriate in accordance with the configuration of the circuit MP. Alternatively, the wiring VAL may be supplied with not a constant voltage but a pulse signal, for example.

A voltage between the first terminal and the second terminal of the resistor RE is determined in accordance with a current flowing from the wiring OL[j]. Thus, a voltage based on the resistance value of the resistor RE and the current is input to the first input terminal of the comparator CMP. Similarly, a voltage between the first terminal and the second terminal of the resistor REB is determined in accordance with a current flowing from the wiring OLB[j]. Thus, a voltage based on the resistance value of the resistor REB and the current is input to the second input terminal of the comparator CMP.

The comparator CMP has a function of, for example, comparing voltages input to the first input terminal and the second input terminal and outputting a signal from an output terminal of the comparator CMP on the basis of the comparison result. For example, the comparator CMP can output a high-level potential from the output terminal of the comparator CMP in the case where the voltage input to the second input terminal is higher than the voltage input to the first input terminal, and can output a low-level potential from the output terminal of the comparator CMP in the case where the voltage input to the first input terminal is higher than the voltage input to the second input terminal. In other words, since two potentials, a high-level potential and a low-level potential, are output from the output terminal of the comparator CMP, the circuit ACTF[j] can output the binary output signal $z_j^{(k)}$. For example, the high-level potential and the low-level potential output from the output terminal of the comparator CMP can correspond to "+1" and "−1" of the output signal $z_j^{(k)}$, respectively. Depending on the case, the high-level potential and the low-level potential output from the output terminal of the comparator CMP may correspond to "+1" and "0" of the output signal $z_j^{(k)}$, respectively.

Figure 5B:
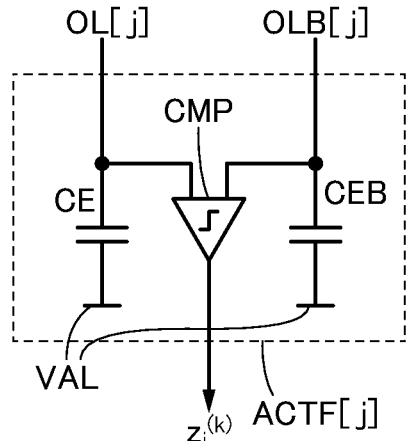
Figure 5C:
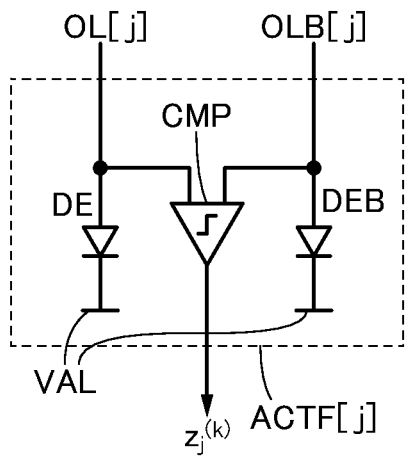

Although the resistor RE and the resistor REB are used for the circuit ACTF[j] in FIG. 5A, without limitation to the resistor, an element or a circuit can be used as long as it has a function of converting a current into a voltage. Thus, each of the resistor RE and the resistor REB of the circuit ACTF[j] in FIG. 5A can be replaced with another circuit element. For example, the circuit ACTF[j] illustrated in FIG. 5B is a circuit in which the resistor RE and the resistor REB included in the circuit ACTF[j] in FIG. 5A are replaced with a capacitor CE and a capacitor CEB, and can perform operation substantially the same as that of the circuit ACTF[j] in FIG. 5A. Note that the capacitance values of the capacitor CE and the capacitor CEB are preferably equal to each other. For example, the difference between the capacitance values of the capacitor CE and the capacitor CEB is desirably within 10%, further preferably within 5%. However, one embodiment of the present invention is not limited thereto. A circuit for initializing charge accumulated in the capacitor CE and the capacitor CEB may be provided. For example, a switch may be provided in parallel to the capacitor CE. In other words, a second terminal of the switch may be connected to the wiring VAL, and a first terminal of the switch may be connected to a first terminal of the capacitor CE, the wiring OL[j], and the first input terminal of the comparator CMP. Alternatively, the second terminal of the switch may be connected to a wiring different from the wiring VAL, and the first terminal of the switch may be connected to the first terminal of the capacitor CE, the wiring OL[j], and the first input terminal of the comparator CMP. In addition, the circuit ACTF[j] illustrated in FIG. 5C is a circuit in which the resistor RE and the resistor REB included in the circuit ACTF[j] in FIG. 5A are replaced with a diode element DE and a diode element DEB, and can perform operation substantially the same as that of the circuit ACTF[j] in FIG. 5A. The directions of the diode element DE and the diode element DEB (connection portions of an anode and a cathode) are desirably changed as appropriate in accordance with the level of a potential of the wiring VAL.

Figure 5D:
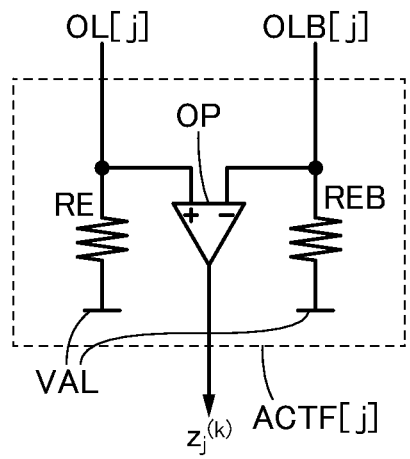

The comparator CMP included in each of the circuits ACTF[j] in FIG. 5A to FIG. 5C can be replaced with an operational amplifier OP, for example. FIG. 5D shows a circuit diagram illustrating the circuit ACTF[j] in which the comparator CMP of the circuit ACTF[j] in FIG. 5A is replaced with the operational amplifier OP.

Figure 5E:
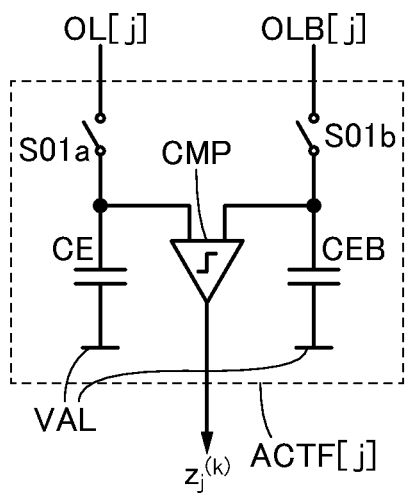

A switch S01a and a switch S01b may be provided in the circuit ACTF[j] in FIG. 5B. Thus, the circuit ACTF[j] can hold, in the capacitor CE and the capacitor CEB, potentials corresponding to currents input from the wiring OL[j] and the wiring OLB[j]. As a specific circuit example, a configuration may be employed in which the wiring OL[j] is electrically connected to a first terminal of the switch S01a, the first terminal of the capacitor CE and the first input terminal of the comparator CMP are electrically connected to a second terminal of the switch S01a, the wiring OLB[j] is electrically connected to a first terminal of the switch S01b, and a first terminal of the capacitor CEB and the second input terminal of the comparator CMP are electrically connected to a second terminal of the switch S01b, as illustrated in FIG. 5E. In the circuit ACTF[j] in FIG. 5E, the potentials of the wiring OL[j] and the wiring OLB[j] can be respectively input to the first input terminal and the second input terminal of the comparator CMP by bringing the switch S01a and the switch S01b into an on state. Then, the switch S01a and the switch S01b are brought into an off state, whereby the potentials input to the first input terminal and the second input terminal of the comparator CMP can be respectively held in the capacitor CE and the capacitor CEB. Note that as each of the switch S01a and the switch S01b, an electrical switch such as an analog switch or a transistor can be used, for example. As another example, a mechanical switch may be used as each of the switch S01a and the switch S01b. Note that in the case of using a transistor as each of the switch S01a and the switch S01b, the transistor can be an OS transistor or a transistor containing silicon in a channel formation region (hereinafter, referred to as a Si transistor). Moreover, by controlling the on-state periods of the switch S01a and the switch S01b, the voltage values of the capacitor CE and the capacitor CEB can be controlled. For example, in the case where the values of currents flowing through the capacitor CE and the capacitor CEB are large, the on-state periods of the switch S01a and the switch S01b are set short, whereby the voltage values of the capacitor CE and the capacitor CEB can be prevented from being too large.

Figure 5F:
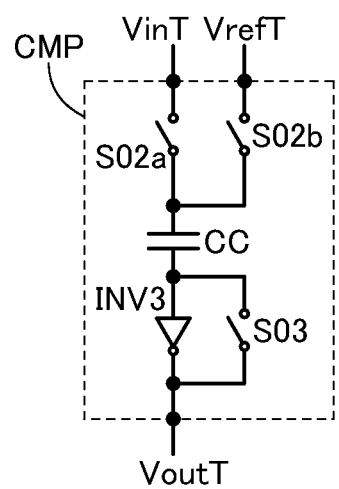

The comparator CMP included in each of the circuits ACTF[j] in FIG. 5A to FIG. 5C and FIG. 5E can be a chopper comparator, for example. The comparator CMP illustrated in FIG. 5F shows a chopper comparator, and the comparator CMP includes a switch S02a, a switch S02b, a switch S03, a capacitor CC, and an inverter circuit INV3. Like the above-described switch S01a and switch S01b, each of the switch S02a, the switch S02b, and the switch S03 can be a mechanical switch or a transistor such as an OS transistor or a Si transistor.

A first terminal of the switch S02a is electrically connected to a terminal VinT, a first terminal of the switch S02b is electrically connected to a terminal VrefT, and a second terminal of the switch S02a is electrically connected to a second terminal of the switch S02b and a first terminal of the capacitor CC. A second terminal of the capacitor CC is electrically connected to an input terminal of the inverter circuit INV3 and a first terminal of the switch S03. A terminal VoutT is electrically connected to an output terminal of the inverter circuit INV3 and a second terminal of the switch S03.

The terminal VinT functions as a terminal for inputting an input potential to the comparator CMP, the terminal VrefT functions as a terminal for inputting a reference potential to the comparator CMP, and the terminal VoutT functions as a terminal for outputting an output potential from the comparator CMP. Note that the terminal VinT can correspond to one of the first terminal and the second terminal of each of the comparators CMP in FIG. 5A to FIG. 5C and FIG. 5E, and the terminal VrefT can correspond to the other of the first terminal and the second terminal of each of the comparators CMP in FIG. 5A to FIG. 5C and FIG. 5E.

Although the circuits ACTF[j] in FIG. 5A to FIG. 5E are each a circuit that performs arithmetic operation of an activation function and outputs the output signal $z_j^{(k)}$ expressed by a binary value, the circuit ACTF[j] may output the output signal $z_j^{(k)}$ as a ternary or higher-level signal or an analog value.

FIG. 6A to FIG. 6F show examples of a circuit that generates the signal $z_j^{(k)}$ in accordance with currents input from the wiring OL[j] and the wiring OLB[j] and is a circuit that performs arithmetic operation of an activation function and outputs the output signal $z_j^{(k)}$ expressed by a ternary value.

Figure 6A:
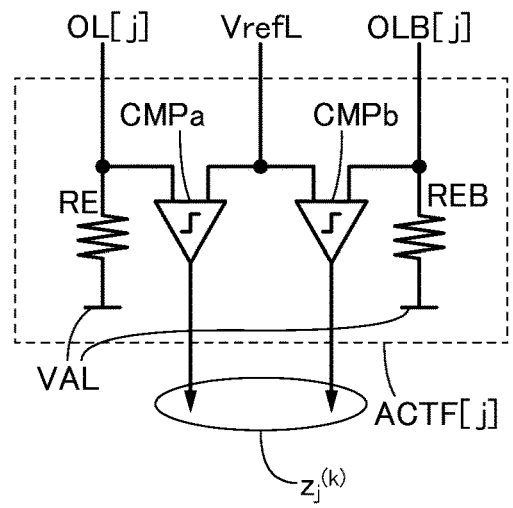
FIG. 6A, FIG. 6B, FIG. 6C, FIG. 6D, FIG. 6E, and FIG. 6F are circuit diagrams each showing a configuration example of a circuit included in a semiconductor device.

The circuit ACTF[j] illustrated in FIG. 6A includes the resistor RE, the resistor REB, a comparator CMPa, and a comparator CMPb. The wiring OL[j] is electrically connected to the first terminal of the resistor RE and a first input terminal of the comparator CMPa, and the wiring OLB[j] is electrically connected to the first terminal of the resistor REB and a first input terminal of the comparator CMPb. A second input terminal of the comparator CMPa and a second input terminal of the comparator CMPb are electrically connected to a wiring VrefL. Furthermore, the second terminal of the resistor RE is electrically connected to the wiring VAL, and the second terminal of the resistor REB is electrically connected to the wiring VAL.

The wiring VrefL functions as a voltage line for supplying a constant voltage $V_{ref}$, and $V_{ref}$ is preferably higher than or equal to GND and lower than or equal to VDD, for example. According to circumstances, $V_{ref}$ may be a potential lower than GND or a potential higher than VDD. Note that Via is used as a reference potential (potential for comparison) in the comparator CMPa and the comparator CMPb.

A voltage between the first terminal and the second terminal of the resistor RE is determined in accordance with a current flowing from the wiring OL[j]. Thus, a voltage based on the resistance value of the resistor RE and the current is input to the first input terminal of the comparator CMPa. Similarly, a voltage between the first terminal and the second terminal of the resistor REB is determined in accordance with a current flowing from the wiring OLB[j]. Thus, a voltage based on the resistance value of the resistor REB and the current is input to the first input terminal of the comparator CMPb.

The comparator CMPa compares voltages input to the first input terminal and the second input terminal and outputs a signal from an output terminal of the comparator CMPa on the basis of the comparison result. For example, the comparator CMPa can output a high-level potential from the output terminal of the comparator CMPa in the case where the voltage ($V_{ref}$) input to the second input terminal is higher than the voltage input to the first input terminal, and can output a low-level potential from the output terminal of the comparator CMPa in the case where the voltage input to the first input terminal is higher than the voltage ($V_{ref}$) input to the second input terminal.

Like the comparator CMPa, the comparator CMPb compares voltages input to the first input terminal and the second input terminal and outputs a signal from an output terminal of the comparator CMPb on the basis of the comparison result. For example, the comparator CMPb can output a high-level potential from the output terminal of the comparator CMPb in the case where the voltage ($V_{ref}$) input to the second input terminal is higher than the voltage input to the first input terminal, and can output a low-level potential from the output terminal of the comparator CMPb in the case where the voltage input to the first input terminal is higher than the voltage ($V_{ref}$) input to the second input terminal.

At this time, the ternary output signal $z_j^{(k)}$ can be expressed in accordance with potentials output from the output terminals of the comparator CMPa and the comparator CMPb. For example, the output signal $z_j^{(k)}$ can be "+1" in the case where a high-level potential is output from the output terminal of the comparator CMPa and a low-level potential is output from the output terminal of the comparator CMPb; the output signal $z_j(k)$ can be "−1" in the case where a low-level potential is output from the output terminal of the comparator CMPa and a high-level potential is output from the output terminal of the comparator CMPb; and the output signal $z_j^{(k)}$ can be "+0" in the case where a low-level potential is output from the output terminal of the comparator CMPa and a low-level potential is output from the output terminal of the comparator CMPb.

Figure 6B:
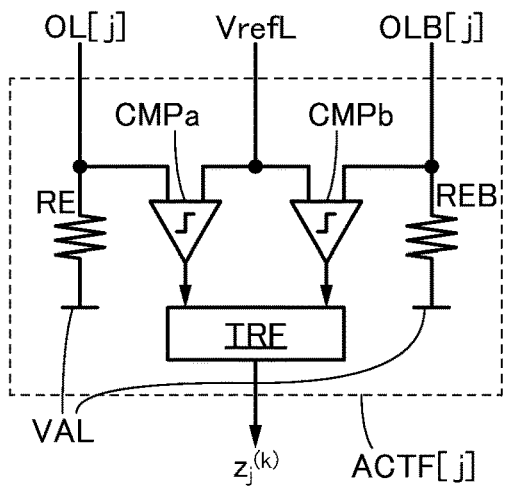

The circuit configuration of the circuit ACTF[j] is not limited to that illustrated in FIG. 6A and can be changed according to circumstances. For example, in the case where two output results of the comparator CMPa and the comparator CMPb are to be combined into one signal in the circuit ACTF[j] in FIG. 6A, a converter circuit TRF can be provided in the circuit ACTF[j]. FIG. 6B is a configuration example of the circuit ACTF[j] in which the converter circuit TRF is provided in the circuit ACTF[j] in FIG. 6A and the output terminals of the comparator CMPa and the comparator CMPb are electrically connected to input terminals of the converter circuit TRF. A specific example of the converter circuit TRF can be a digital-analog converter circuit (in this case, the signal $z_j^{(k)}$ is an analog value) or the like.

The wiring VrefL electrically connected to the second input terminals of the comparator CMPa and the comparator CMPb in FIG. 6A may be replaced with separate wirings: a wiring Vref1L and a wiring Vref2L, for example. In the circuit ACTF[j] in FIG. 6C, a second terminal of the comparator CMPa included in the circuit ACTF[j] in FIG. 6A is electrically connected to not the wiring VrefL but the wiring Vref1L, and a second terminal of the comparator CMPb is electrically connected to not the wiring VrefL but the wiring Vref2L. When potentials input to the wiring Vref1L and the wiring Vref2L have different values, reference potentials in the comparator CMPa and the comparator CMPb can be set independently.

Figure 6C:
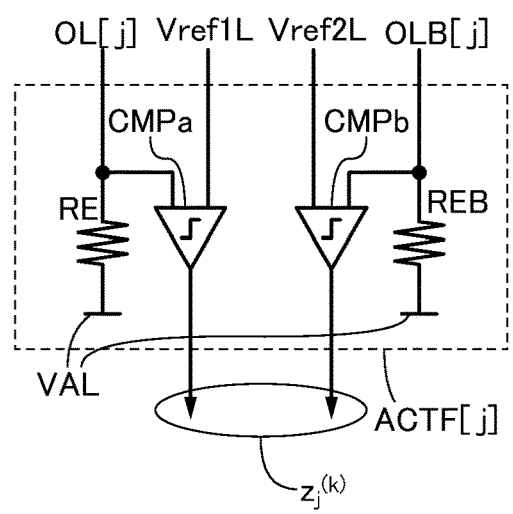

Alternatively, for example, as a component different from the circuits ACTF[j] in FIG. 6A to FIG. 6C, an amplifier circuit, an impedance converter circuit, or the like may be used. For example, the circuit ACTF[j] illustrated in FIG. 6D can be used for the circuit AFP of the arithmetic circuit 110 in FIG. 2. The circuit ACTF[j] in FIG. 6D includes the resistor RE, the resistor REB, an operational amplifier OPa, and an operational amplifier OPb, and functions as an amplifier circuit.

The wiring OL[j] is electrically connected to the first terminal of the resistor RE and a non-inverting input terminal of the operational amplifier OPa, and the wiring OLB[j] is electrically connected to the first terminal of the resistor REB and a non-inverting input terminal of the operational amplifier OPb. An inverting input terminal of the operational amplifier OPa is electrically connected to an output terminal of the operational amplifier OPa, and an inverting input terminal of the operational amplifier OPb is electrically connected to an output terminal of the operational amplifier OPb. Furthermore, the second terminal of the resistor RE is electrically connected to the wiring VAL, and the second terminal of the resistor REB is electrically connected to the wiring VAL.

Figure 6D:
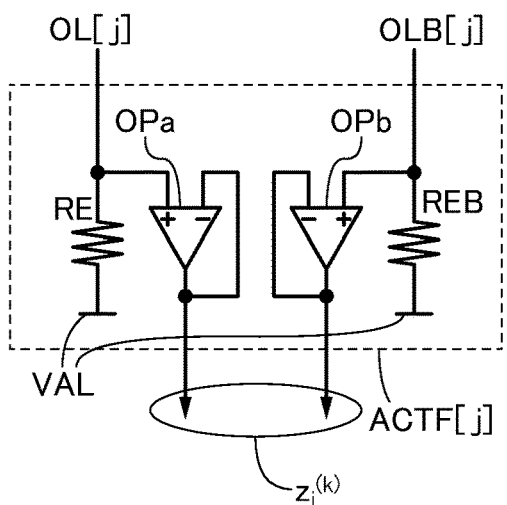

That is, the operational amplifier OPa and the operational amplifier OPb included in the circuit ACTF[j] in FIG. 6D have a connection configuration of a voltage follower. Accordingly, a potential output from the output terminal of the operational amplifier OPa is almost equal to a potential input to the non-inverting input terminal of the operational amplifier OPa, and a potential output from the output terminal of the operational amplifier OPb is almost equal to a potential input to the non-inverting input terminal of the operational amplifier OPb. In this case, the output signal $z_j^{(k)}$ is output from the circuit ACTF[j] as two analog values. Note that the output terminal of the operational amplifier OPa and the output terminal of the operational amplifier OPb may be connected to the input terminals of the comparator CMP. Then, output from the comparator CMP may be the output signal $z_j^{(k)}$.

Alternatively, as a component different from the circuits ACTF[j] in FIG. 6A to FIG. 6D, an integrator circuit, a current-voltage converter circuit, or the like may be used, for example. Furthermore, an integrator circuit or a current-voltage converter circuit may be formed using an operational amplifier. For example, the circuit ACTF[j] illustrated in FIG. 6E can be used for the circuit AFP of the arithmetic circuit 110 in FIG. 2. The circuit ACTF[j] in FIG. 6E includes the operational amplifier OPa, the operational amplifier OPb, a load LEa, and a load LEb.

The wiring OL[j] is electrically connected to a first input terminal (e.g., the inverting input terminal) of the operational amplifier OPa and a first terminal of the load LEa, and the wiring OLB[j] is electrically connected to a first input terminal (e.g., the inverting input terminal) of the operational amplifier OPb and a first terminal of the load LEb. Moreover, a second input terminal (e.g., the non-inverting input terminal) of the operational amplifier OPa is electrically connected to the wiring Vref1L, and a second input terminal (e.g., the non-inverting input terminal) of the operational amplifier OPb is electrically connected to the wiring Vref2L. A second terminal of the load LEa is electrically connected to the output terminal of the operational amplifier OPa, and the second terminal of the load LEa is electrically connected to the output terminal of the operational amplifier OPb.

Note that the wiring Vref1L and the wiring Vref2L function as wirings that supply voltages equal to or different from each other. Thus, the wiring Vref1L and the wiring Vref2L can be combined into one wiring in some cases.

Figure 6E:
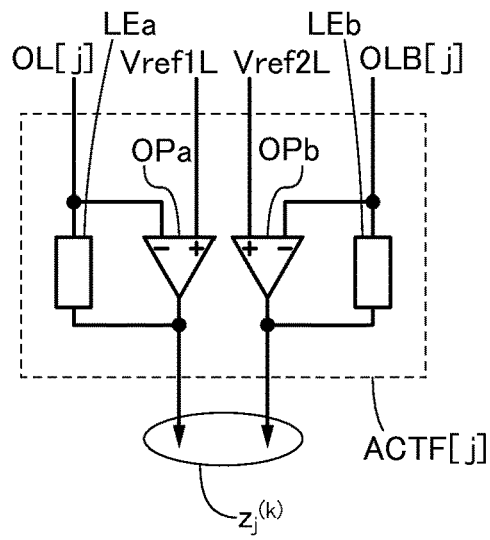

The load LEa and the load LEb of the circuit ACTF[j] in FIG. 6E can each be a resistor or a capacitor, for example. In particular, when a capacitor is used as each of the load LEa and the load LEb, a combination of the operational amplifier OPa and the load LEa and a combination of the operational amplifier OPb and the load LEb each function as an integrator circuit. In other words, charge is accumulated in each of the capacitors (the load LEa and the load LEb) in accordance with the amount of current flowing through the wiring OL[j] or the wiring OLB[j]. That is, the amount of current flowing from the wiring OL[j] and the wiring OLB[j] is integrated by the integrator circuit, the integrated amount of current is converted into a voltage, and the voltage is output as the signal $z_j^{(k)}$. Note that the output terminal of the operational amplifier OPa and the output terminal of the operational amplifier OPb may be connected to the input terminals of the comparator CMP. Then, output from the comparator CMP may be the output signal $z_j^{(k)}$. Note that a circuit for initializing charge accumulated in the load LEa and the load LEb that are the capacitors may be provided. For example, a switch may be provided in parallel to the load LEa (the capacitor). In other words, a second terminal of the switch may be connected to the output terminal of the operational amplifier OPa, and a first terminal of the switch may be connected to the wiring OL[j] and the first input terminal (e.g., the inverting input terminal) of the operational amplifier OPa.

In the circuit ACTF[j] in FIG. 6E, in the case where currents flowing from the wiring OL[j] and the wiring OLB[j] are each to be converted into a voltage to be output, a resistor can be used instead of a capacitor as each of the load LEa and the load LEb.

Figure 6F:
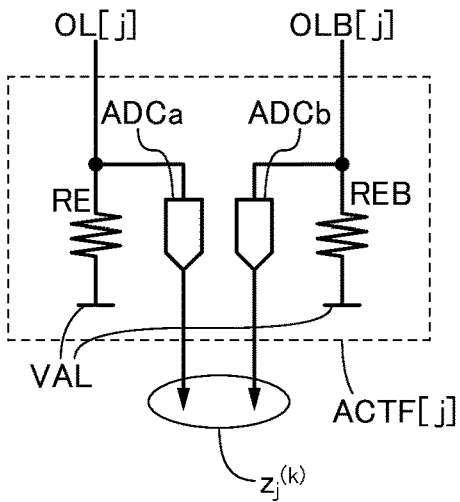

Alternatively, as a component different from the circuits ACTF[j] in FIG. 6A to FIG. 6E, the circuit ACTF[j] illustrated in FIG. 6F can be used for the circuit AFP of the arithmetic circuit 110 in FIG. 2, for example. The circuit ACTF[j] in FIG. 4F includes the resistor RE, the resistor REB, an analog-digital converter circuit ADCa, and an analog-digital converter circuit ADCb.

The wiring OL[j] is electrically connected to an input terminal of the analog-digital converter circuit ADCa and the first terminal of the resistor RE, and the wiring OLB[j] is electrically connected to an input terminal of the analog-digital converter circuit ADCb and the first terminal of the resistor REB. The second terminal of the resistor RE is electrically connected to the wiring VAL, and the second terminal of the resistor REB is electrically connected to the wiring VAL.

In the circuit ACTF[j] in FIG. 6F, the potentials of the first terminals of the resistor RE and the resistor REB are determined in accordance with currents flowing from the wiring OL[j] and the wiring OLB[j]. The circuit ACTF[j] has a function of converting the potential that is an analog value into a binary, ternary, or higher-level (e.g. 256-level) digital value by the analog-digital converter circuit ADCa and the analog-digital converter circuit ADCb and outputting the digital value as the signal $z_j^{(k)}$.

Note that as in FIG. 5B and FIG. 5C, the resistor RE and the resistor REB illustrated in FIG. 6A to FIG. 6D and FIG. 6F can be replaced with the capacitor CE and the capacitor CEB or the diode element DE and the diode element DEB. Specifically, in the case where the resistor RE and the resistor REB illustrated in FIG. 6A to FIG. 6D and FIG. 6F are replaced with the capacitor CE and the capacitor CEB, further providing the switch S01a and the switch S01b as in FIG. 5E allows potentials input from the wiring OL[j] and the wiring OLB[j] to be held.

Figure 7:
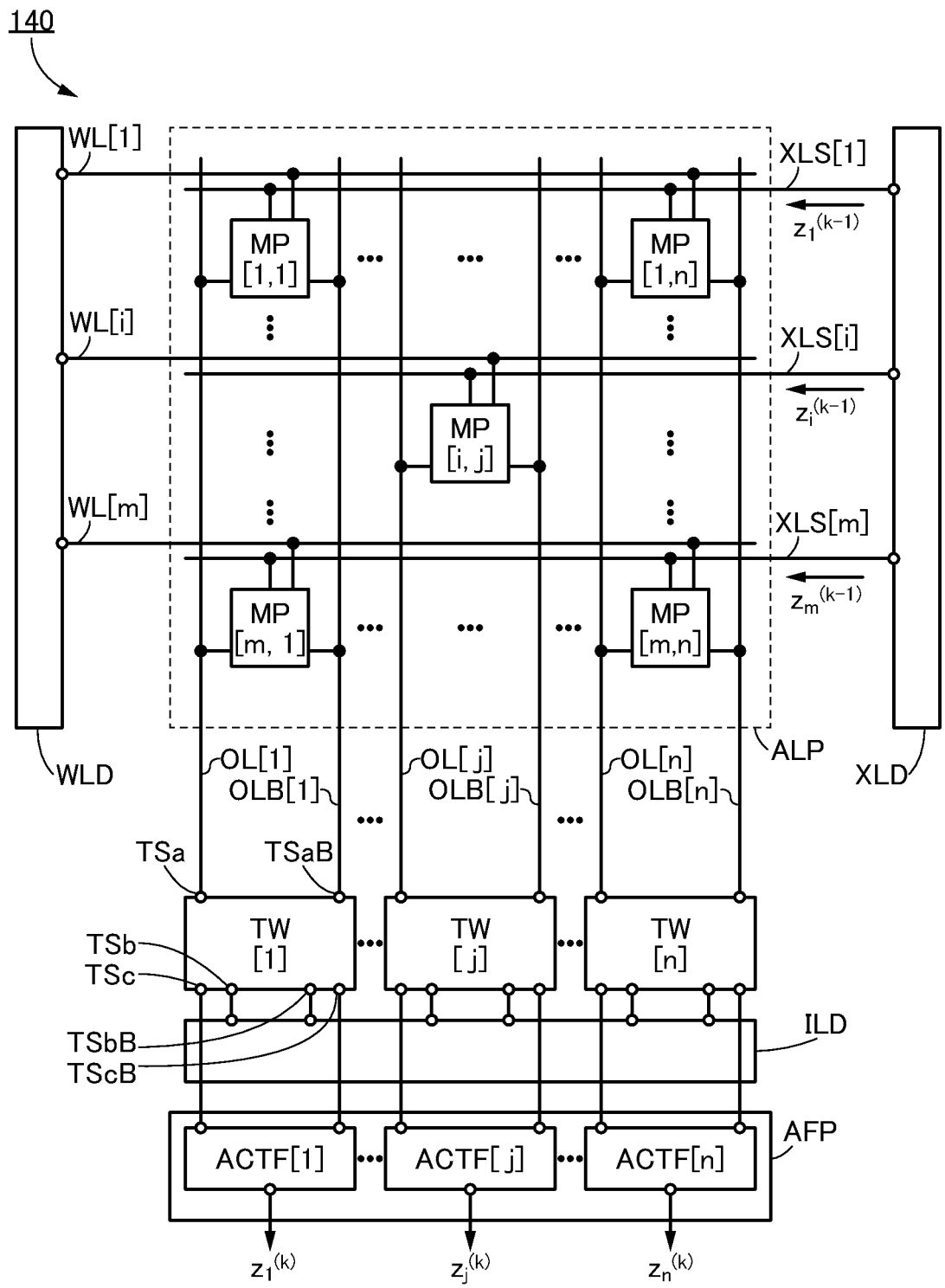
FIG. 7 is a circuit diagram showing a configuration example of a semiconductor device.

Although the arithmetic circuit 110, the arithmetic circuit 120, and the arithmetic circuit 130 illustrated in FIG. 2 to FIG. 4 each show an example of the case where the wiring IL, the wiring ILB, the wiring OL, and the wiring OLB are provided, one embodiment of the present invention is not limited thereto. For example, the arithmetic circuit 110, the arithmetic circuit 120, and the arithmetic circuit 130 may each have a configuration in which the wiring IL and the wiring OL are combined into one wiring and the wiring ILB and the wiring OLB are combined into one wiring. FIG. 7 shows a specific configuration in that case. An arithmetic circuit 140 illustrated in FIG. 7 includes a switching circuit TW[1] to a switching circuit TW[n].

The switching circuit TW[1] to the switching circuit TW[n] each include a terminal TSa, a terminal TSaB, a terminal TSb, a terminal TSbB, a terminal TSc, and a terminal TScB.

The terminal TSa is electrically connected to the wiring OL[j], the terminal TSbB is electrically connected to the circuit ILD, and the terminal TSc is electrically connected to the circuit ACTF[i]. The terminal TSaB is electrically connected to the wiring OLB[j], the terminal TSbB is electrically connected to the circuit ILD, and the terminal TScB is electrically connected to the circuit ACTF[j].

The switching circuit TW[j] has a function of establishing a conduction state between the terminal TSa and one of the terminal TSb and the terminal TSc, and establishing a non-conduction state between the terminal TSa and the other of the terminal TSb and the terminal TSc. In addition, the switching circuit TW[j] has a function of establishing a conduction state between the terminal TSaB and one of the terminal TSbB and the terminal TScB, and establishing a non-conduction state between the terminal TSaB and the other of the terminal TSbB and the terminal TScB.

That is, in the case where information (e.g., a potential, a resistance value, or a current value) corresponding to the first data $w_1^{(k-1)}{}_j^{(k)}$ to $w_m^{(k-1)}{}_n^{(k)}$ that are weight coefficients is to be input to any one of the circuit MP[1,j] to the circuit MP[m,j], a conduction state is established between the terminal TSa and the terminal TSb and a conduction state is established between the terminal TSaB and the terminal TSbB in the switching circuit TW[j], whereby information (e.g., a potential, a resistance value, or a current value) corresponding to the first data $w_1^{(k-1)}{}_1^{(k)}$ to $w_m^{(k-1)}{}_n^{(k)}$ can be supplied from the circuit ILD to the wiring OL[j] and the wiring OLB[j].

In addition, in the case where the circuit ACTF[j] needs to obtain the sum result of the products (Formula (1.2)) of the weight coefficients and the signals of neurons calculated by the circuit MP[1,j] to the circuit MP[m,j], a conduction state is established between the terminal TSa and the terminal TSc and a conduction state is established between the terminal TSaB and the terminal TScB in the switching circuit TW[j], whereby information (e.g., a potential, a resistance value, or a current value) corresponding to the product-sum result can be supplied from the wiring OL[j] and the wiring OLB[j] to the circuit ACTF[j]. Then, the value of the activation function is calculated from the input product-sum result in the circuit ACTF[j], whereby the signal $z_k^{(k)}$ can be obtained as the output signal of the neuron.

Figure 8A:
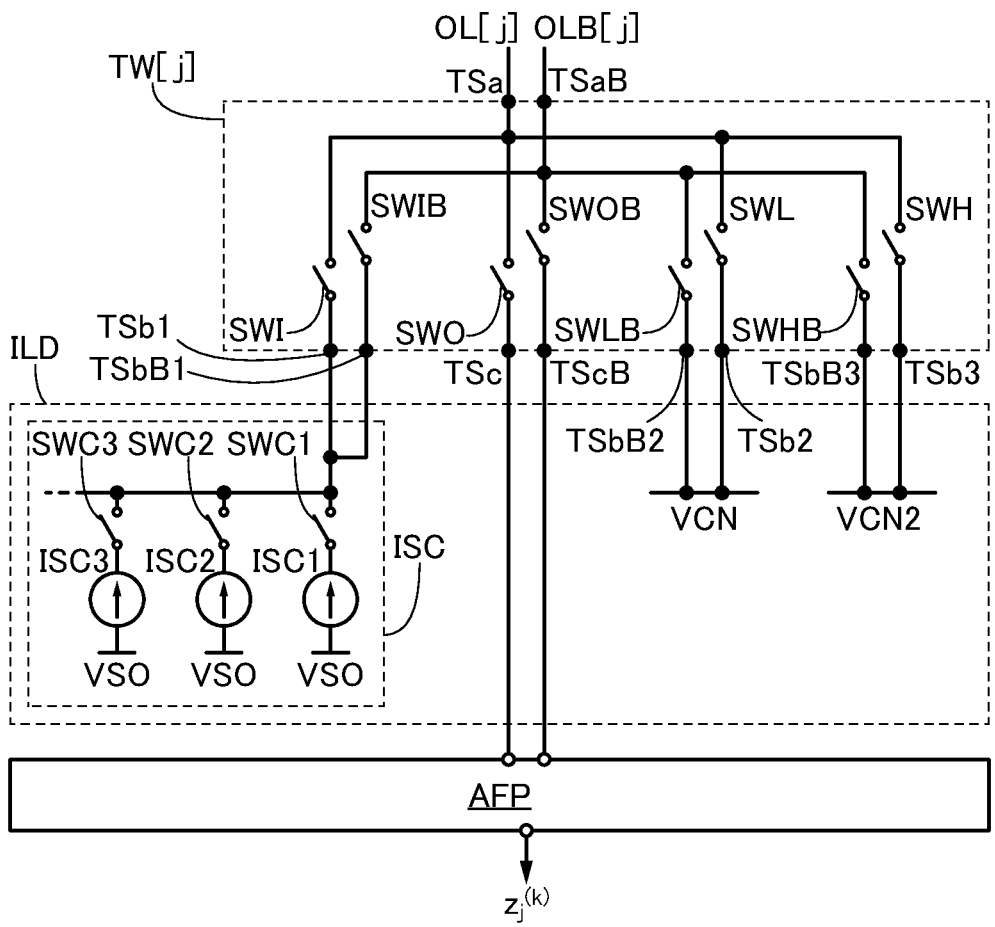
FIG. 8A, FIG. 8B, and FIG. 8C are circuit diagrams showing configuration examples of circuits included in a semiconductor device.

Next, the switching circuit TW[j] and the circuit ILD that are included in the arithmetic circuit 140 are described. FIG. 8A shows configuration examples of the switching circuit TW[j] and the circuit ILD which can be applied to the arithmetic circuit 140. Note that FIG. 8A illustrates the wiring OL[j], the wiring OLB[j], and the circuit AFP to show an electrical connection configuration of the switching circuit TW[j] and the circuit ILD.

The switching circuit TW[j] includes a switch SWI, a switch SWIB, a switch SWO, a switch SWOB, a switch SWL, a switch SWLB, a switch SWH, and a switch SWHB, for example.

The circuit ILD includes a current source circuit ISC, for example. However, one embodiment of the present invention is not limited thereto. For example, a voltage source circuit may be provided instead of the current source circuit ISC. The current source circuit ISC has a function of supplying, to the wiring OL[j] and/or the wiring OLB[j], a current corresponding to a weight coefficient (the first data) to be input to the circuit MP. Note that at least one current source circuit ISC as a circuit for the wiring OL[j] and at least one current source circuit ISC as a circuit for the wiring OLB[j] may be separately provided. Alternatively, as illustrated in FIG. 8A, at least one current source circuit ISC may be provided for a set of wirings of the wiring OL[j] and the wiring OLB[j].

In addition, the current source circuit ISC includes one or a plurality of constant current sources; for example, a constant current source circuit ISC1, a constant current source circuit ISC2, and a constant current source circuit ISC3 are included as the plurality of constant current sources in FIG. 8A. In addition, the current source circuit ISC includes a plurality of switches for selecting the plurality of constant current sources; for example, a switch SWC1, a switch SWC2, and a switch SWC3 are included as the plurality of switches in FIG. 8A. Note that in the case where the current source circuit ISC includes only one constant current source, the constant current source circuit ISC does not necessarily include the switch. In addition, in the case where the constant current source circuit ISC1, the constant current source circuit ISC2, and the constant current source circuit ISC3 each have a function of controlling whether or not to output a current, the switch SWC1, the switch SWC2, and the switch SWC3 are not necessarily provided.

Note that currents flowing to the wiring OL[j] and the wiring OLB[j] are preferably generated in the same current source circuit ISC, as shown in FIG. 8A. In the case where currents flowing to the wiring OL[j] and the wiring OLB[j] are generated in different current source circuits, there might be a difference in the performance of the different current source circuits because transistors therein sometimes have variations in their characteristics caused in a fabrication process or the like of the transistors. On the other hand, in the case where the same current source circuit is used, the same amount of current can be supplied to the wiring OL[j] and the wiring OLB[j], leading to higher arithmetic operation accuracy.

Note that as each of the switch SWI, the switch SWIB, the switch SWO, the switch SWOB, the switch SWL, the switch SWLB, the switch SWH, the switch SWHB, the switch SWC1, the switch SWC2, and the switch SWC3 illustrated in FIG. 8A, an electrical switch such as an analog switch or a transistor, a mechanical switch, or the like can be used, as in the case of the switch S01$a$ and the switch S01$b$.

In an example of the switching circuit TW[j], the terminal TSa is electrically connected to a first terminal of the switch SWI, a first terminal of the switch SWO, a first terminal of the switch SWL, and a first terminal of the switch SWH. The terminal TSaB is electrically connected to a first terminal of the switch SWIB, a first terminal of the switch SWOB, a first terminal of the switch SWLB, and a first terminal of the switch SWHB. A second terminal of the switch SWI is electrically connected to a terminal TSb1. A second terminal of the switch SWIB is electrically connected to a terminal TSbB1. A second terminal of the switch SWO is electrically connected to the terminal TSc. A second terminal of the switch SWOB is electrically connected to the terminal TScB. A second terminal of the switch SWL is electrically connected to a terminal TSb2. A second terminal of the switch SWLB is electrically connected to a terminal TSbB2. A second terminal of the switch SWH is electrically connected to a terminal TSb3. A second terminal of the switch SWHB is electrically connected to a terminal TSbB3.

The terminal TSb1, the terminal TSb2, and the terminal TSb3 illustrated in FIG. 8A correspond to the terminal TSb illustrated in FIG. 7. In addition, the terminal TSbB1, the terminal TSbB2, and the terminal TSbB3 illustrated in FIG. 8A correspond to the terminal TSbB illustrated in FIG. 7.

In the current source circuit ISC included in the circuit ILD, the terminal TSb1 is electrically connected to a first terminal of the switch SWC1, a first terminal of the switch SWC2, and a first terminal of the switch SWC3. In addition, the terminal TSbB1 is electrically connected to the first terminal of the switch SWC1, the first terminal of the switch SWC2, and the first terminal of the switch SWC3. A second terminal of the switch SWC1 is electrically connected to an output terminal of the constant current source circuit ISC1, a second terminal of the switch SWC2 is electrically connected to an output terminal of the constant current source circuit ISC2, and a second terminal of the switch SWC3 is electrically connected to an output terminal of the constant current source circuit ISC3. An input terminal of the constant current source circuit ISC1, an input terminal of the constant current source circuit ISC2, and an input terminal of the constant current source circuit ISC3 are each electrically connected to a wiring VSO.

FIG. 8A employs a configuration in which the output terminal of each of the constant current source circuit ISC1, the constant current source circuit ISC2, and the constant current source circuit ISC3 is electrically connected to the terminal of the corresponding switch and the input terminal is electrically connected to the wiring VSO; however, one embodiment of the present invention is not limited thereto. For example, a configuration may be employed in which the input terminal of each of the constant current source circuit ISC1, the constant current source circuit ISC2, and the constant current source circuit ISC3 is electrically connected to the terminal of the corresponding switch and the output terminal is electrically connected to the wiring VSO. Note that a wiring VCN2 may be provided to initialize the potentials of the wiring OL[j] and the wiring OLB[j] before the circuit MP outputs a current. The wiring VCN2 is connected to the wiring OL[j] through the switch SWH. In addition, the wiring VCN2 is connected to the wiring OLB[j] through the switch SWHB. The wiring VCN2 can supply a potential different from that of the wiring VCN. For example, in the case where VSS or a ground potential is supplied to the wiring VCN, VDD or the like is supplied to the wiring VCN2. Thus, the potentials of the wiring OL[j] and the wiring OLB[j] can be changed in accordance with a current output from the circuit MP.

Figure 8B:
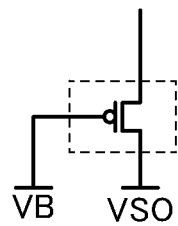
Figure 8C:
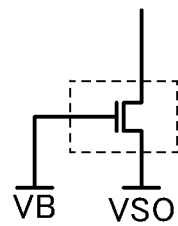

FIG. 8B and FIG. 8C show specific configuration examples of the constant current source circuit ISC1, the constant current source circuit ISC2, and the constant current source circuit ISC3. The constant current source circuit ISC1 (the constant current source circuit ISC2 or the constant current source circuit ISC3) illustrated in FIG. 8B includes a p-channel transistor. A first terminal of the transistor is electrically connected to the wiring VSO, a second terminal of the transistor is electrically connected to the second terminal of the switch SWC1 (the switch SWC2 or the switch SWC3), and a gate of the transistor is electrically connected to a wiring VB. The constant current source circuit ISC1 (the constant current source circuit ISC2 or the constant current source circuit ISC3) illustrated in FIG. 8C includes an n-channel transistor. A first terminal of the transistor is electrically connected to the wiring VSO, a second terminal of the transistor is electrically connected to the second terminal of the switch SWC1 (the switch SWC2 or the switch SWC3), and a gate of the transistor is electrically connected to the wiring VB. In the constant current source circuit ISC1 (the constant current source circuit ISC2 or the constant current source circuit ISC3) in each of FIG. 8B and FIG. 8C, the wiring VB functions as a wiring for inputting a bias voltage to the gate of the transistor. Note that a pulse signal may be supplied to the wiring VB. This makes it possible to control whether or not to output a current from the constant current source circuit. In that case, the switch SWC1, the switch SWC2, and the switch SWC3 are not necessarily provided. Alternatively, an analog voltage may be supplied to the wiring VB. This makes it possible to supply an analog current from the constant current source circuit.

The wiring VSO functions as a wiring for supplying a constant voltage to each of the constant current source circuit ISC1, the constant current source circuit ISC2, and the constant current source circuit ISC3. For example, in the case where a current is supplied from the circuit ILD to the wiring OL or the wiring OLB through the switching circuit TW[j], the constant voltage is preferably a potential higher than a ground potential (e.g., VDD), and it is further preferable to use the constant current source circuit ISC1 (the constant current source circuit ISC2 or the constant current source circuit ISC3) illustrated in FIG. 8B. Alternatively, for example, in the case where a current is supplied from the circuit ILD to the wiring OL or the wiring OLB through the switching circuit TW[j], the constant voltage is preferably a ground potential, a potential higher than a ground potential and lower than the high-level potential, or the like, and it is further preferable to use the constant current source circuit ISC1 (the constant current source circuit ISC2 or the constant current source circuit ISC3) illustrated in FIG. 8C. Note that in this specification, a current flowing from the circuit ILD to the wiring OL or the wiring OLB through the switching circuit TW[j] is referred to as a positive current in some cases. Thus, a current flowing from the wiring OL or the wiring OLB to the circuit ILD through the switching circuit TW[j] is referred to as a negative current in some cases.

When a current flowing from the constant current source circuit ISC1 has $I_{ut}$, a current flowing from the constant current source circuit ISC2 preferably has $2I_{ut}$ and a current flowing from the constant current source circuit ISC3 preferably has $4I_{ut}$, for example. That is, in the case where the current source circuit ISC includes P constant current sources (P is an integer greater than or equal to 1), a current flowing from the p-th constant current source (p is an integer greater than or equal to 1 and less than or equal to P) preferably has $2^{(p-1)} \times I_{ut}$. The amount of current flowing from the current source circuit ISC can be changed in this manner.

For example, the number of constant current sources in the current source circuit ISC is set to three (P=3). In the case where a current of $I_{ut}$ needs to flow to the wiring OL[j], the switch SWC1 is brought into an on state and the switch SWC2 and the switch SWC3 are brought into an off state, while the switch SWI is in an on state and the switch SWIB is in an off state. In addition, in the case where a current of $5I_{ut}$ needs to flow to the wiring OL[j], the switch SWC1 and the switch SWC3 are brought into an on state and the switch SWC2 is brought into an off state. That is, the current source circuit ISC can output a current having any one of eight levels ("0", "$I_{ut}$", "$2I_{ut}$", "$3I_{ut}$", "$4I_{ut}$", "$5I_{ut}$", "$6I_{ut}$", and "$7I_{ut}$"). Note that in the case where a current with nine or higher levels is to be output, the number of constant current sources is set to four or more. Similarly, by bringing the switch SWI into an off state and bringing the switch SWIB into an on state, a current having any one of the eight levels can flow to the wiring OLB[j]. Note that in the case where the current source circuit ISC does not output a current, the switch SWI and the switch SWIB of the switching circuit TW may be brought into an off state without bringing the switch SWC1 to the switch SWC3 of the current source circuit ISC into an off state. By providing a plurality of constant current sources in this manner, DA conversion can be easily achieved. Note that only one current source circuit may be provided so that a current value output in an analog manner is changed in the operation.

In addition, in the circuit ILD, the terminal TSb2 is electrically connected to the wiring VCN and the terminal TSbB2 is electrically connected to the wiring VCN.

The wiring VCN functions as a wiring for supplying a constant voltage to the wiring OL[j] and/or the wiring OLB[j]. In the case where a current (positive current) is supplied from the circuit ILD to the wiring OL or the wiring OLB through the switching circuit TW[j], for example, a constant voltage supplied from the wiring VCN is preferably a low-level potential (e.g., VSS). In the case where a current (negative current) is supplied from the wiring OL or the wiring OLB to the circuit ILD through the switching circuit TW[j], for example, a constant potential supplied from the wiring VCN is preferably a high-level potential. Note that in the case where a capacitor C3 is connected to a source terminal of a transistor M1 or the like and the source terminal is not connected to a power source line or the like as illustrated in FIG. 42 to FIG. 45 and the like that will be described later, a constant voltage supplied from the wiring VCN is preferably a high-level potential (e.g., VDD) when a positive current is supplied from the circuit ILD to the wiring OL or the wiring OLB through the switching circuit TW[j]. That is, when a constant voltage is supplied from the wiring VCN, a potential difference between ends of the capacitor C3 is desirably close to zero. In other words, a potential that does not allow the circuit MC to output a current is desirably supplied to the wiring VCN.

In addition, in the circuit ILD, the terminal TSb3 is electrically connected to the wiring VCN2 and the terminal TSbB3 is electrically connected to the wiring VCN2.

The wiring VCN2 functions as a wiring for supplying a constant voltage to the wiring OL[j] and/or the wiring OLB[j]. In the case where a current (positive current) is supplied from the circuit ILD to the wiring OL or the wiring OLB through the switching circuit TW[j], for example, a constant voltage supplied from the wiring VCN is preferably a high-level potential (e.g., VDD). In the case where a current (negative current) is supplied from the wiring OL or the wiring OLB to the circuit ILD through the switching circuit TW[j], for example, a constant potential supplied from the wiring VCN is preferably a low-level potential.

By switching the on state and the off state of each of the switch SWI, the switch SWIB, the switch SWO, the switch SWOB, the switch SWL, the switch SWLB, the switch SWH, and the switch SWHB, the switching circuit TW[j] can change a circuit that establishes a conduction state with the wiring OL[j] and the wiring OLB[j].

Here, a weight coefficient input to the circuit MP is described.

When a positive weight coefficient is to be input to the circuit MP, a current corresponding to the weight coefficient is input to the wiring OL[j] and a constant potential supplied from the wiring VCN is input to the wiring OLB[j]. For example, a conduction state is established between the current source circuit ISC and the wiring OL[j], a non-conduction state is established between the current source circuit ISC and the wiring OLB[j], a non-conduction state is established between the circuit AFP and the wiring OL[j], a non-conduction state is established between the circuit AFP and the wiring OLB[j], a non-conduction state is established between the wiring VCN and the wiring OL[j], a conduction state is established between the wiring VCN and the wiring OLB[j], a non-conduction state is established between the wiring VCN2 and the wiring OL[j], and a non-conduction state is established between the wiring VCN2 and the wiring OLB[j]. That is, in the switching circuit TW[j], the switches SWI and SWLB are brought into an on state, and the switch SWIB, the switch SWO, the switch SWOB, the switch SWL, the switch SWH, and the switch SWHB are each brought into an off state. Accordingly, a conduction state is established between the current source circuit ISC and the wiring OL[j], so that a current can flow from the current source circuit ISC to the circuit MP through the wiring OL[j]. When the number of constant current sources in the current source circuit ISC is P, the current has any one of $2^P-1$ levels (a zero current is not included). Since the positive weight coefficient input to the circuit MP is determined in accordance with the current, the weight coefficient can have any one of $2^P-1$ levels. In addition, a conduction state is established between the wiring VCN and the wiring OLB[j], so that a constant voltage is input from the wiring VCN to the wiring OLB[j].

When a negative weight coefficient is to be input to the circuit MP, a current corresponding to the weight coefficient is input to the wiring OLB[j] and a constant potential supplied from the wiring VCN is input to the wiring OL[j]. For example, a non-conduction state is established between the current source circuit ISC and the wiring OL[j], a conduction state is established between the current source circuit ISC and the wiring OLB[j], a non-conduction state is established between the circuit AFP and the wiring OL[j], a non-conduction state is established between the circuit AFP and the wiring OLB[j], a conduction state is established between the wiring VCN and the wiring OL[j], a non-conduction state is established between the wiring VCN and the wiring OLB[j], a non-conduction state is established between the wiring VCN2 and the wiring OL[j], and a non-conduction state is established between the wiring VCN2 and the wiring OLB[j]. That is, in the switching circuit TW[j], the switch SWIB and the switch SWL are brought into an on state, and the switch SWI, the switch SWO, the switch SWOB, the switch SWLB, the switch SWH, and the switch SWHB are each brought into an off state. Accordingly, a conduction state is established between the current source circuit ISC and the wiring OLB[j], so that a current can flow from the current source circuit ISC to the circuit MP through the wiring OLB[j]. When the number of constant current sources in the current source circuit ISC is P, the current has any one of $2^P-1$ levels (a zero current is not included). Since the negative weight coefficient input to the circuit MP is determined in accordance with the current, the weight coefficient can have any one of $2^P-1$ levels. In addition, a conduction state is established between the wiring VCN and the wiring OL[j], so that a constant voltage is input from the wiring VCN to the wiring OL[j].

When a weight coefficient of 0 is to be input to the circuit MP, a constant potential supplied from the wiring VCN is input to each of the wiring OL[j] and the wiring OLB[j]. For example, a non-conduction state is established between the current source circuit ISC and the wiring OL[j], a non-conduction state is established between the current source circuit ISC and the wiring OLB[j], a non-conduction state is established between the circuit AFP and the wiring OL[j], a non-conduction state is established between the circuit AFP and the wiring OLB[j], a conduction state is established between the wiring VCN and the wiring OL[j], a conduction state is established between the wiring VCN and the wiring OLB[j], anon-conduction state is established between the wiring VCN2 and the wiring OL[j], and a non-conduction state is established between the wiring VCN2 and the wiring OLB[j]. That is, in the switching circuit TW[j], the switch SWL and the switch SWLB are brought into an on state, and the switch SWI, the switch SWIB, the switch SWO, and the switch SWOB are each brought into an off state. Accordingly, a conduction state is established between the wiring VCN and the wiring OL[j], and a conduction state is established between the wiring VCN and the wiring OLB[j], so that a constant voltage is input from the wiring VCN to the wirings OL[j] and OLB[j].

That is, when the number of constant current sources in the current source circuit ISC is P, the number of weight coefficients (the sum of a positive weight coefficient, a negative weight coefficient, and a weight coefficient of 0) that can be input to the circuit MP is $2^{P+1}-1$.

Next, a case where information (e.g., a potential or a current) is supplied from the circuit MP to the circuit AFP is described.

Before information (e.g., a potential or a current) is supplied from the circuit MP to the circuit AFP, the wiring OL[j] and the wiring OLB[j] are each preferably set to have a predetermined potential. For example, in the case where a positive current flows from the circuit AFP to the circuit MP through the wiring OL or the wiring OLB, the predetermined potential is preferably a high-level potential. As another example, in the case where a positive current flows from the circuit MP to the circuit AFP through the wiring OL or the wiring OLB, the predetermined potential is preferably a low-level potential. Thus, before information (e.g., a potential or a current) is supplied from the circuit MP to the circuit AFP, for example, a non-conduction state is established between the current source circuit ISC and the wiring OL[j], a non-conduction state is established between the current source circuit ISC and the wiring OLB[j], a non-conduction state is established between the circuit AFP and the wiring OL[j], a non-conduction state is established between the circuit AFP and the wiring OLB[j], a non-conduction state is established between the wiring VCN and the wiring OL[j], a non-conduction state is established between the wiring VCN and the wiring OLB[j], a conduction state is established between the wiring VCN2 and the wiring OL[j], and a conduction state is established between the wiring VCN2 and the wiring OLB[j]. That is, in the switching circuit TW[j], the switch SWH and the switch SWHB are brought into an on state, and the switch SWI, the switch SWIB, the switch SWO, the switch SWOB, the switch SWL, and the switch SWLB are each brought into an off state. Accordingly, a conduction state is established between the wiring OL[j] and the wiring VCN2 and a conduction state is established between the wiring OLB[j] and the wiring VCN2, so that a constant voltage is input from the wiring VCN2 to the wiring OL and the wiring OLB.

When information (e.g., a potential or a current) is supplied from the circuit MP[i,j] to the circuit AFP, for example, a non-conduction state is established between the current source circuit ISC and the wiring OL[j], a non-conduction state is established between the current source circuit ISC and the wiring OLB[j], a conduction state is established between the circuit AFP and the wiring OL[j], a conduction state is established between the circuit AFP and the wiring OLB[j], a non-conduction state is established between the wiring VCN and the wiring OL[j], non-conduction state is established between the wiring VCN and the wiring OLB[j], a non-conduction state is established between the wiring VCN2 and the wiring OL[j], and a non-conduction state is established between the wiring VCN2 and the wiring OLB[j]. That is, in the switching circuit TW[j], the switch SWO and the switch SWOB are brought into an on state, and the switch SWI, the switch SWIB, the switch SWL, the switch SWLB, the switch SWH, and the switch SWHB are each brought into an off state. Accordingly, a conduction state is established between the circuit AFP and the circuit MP RA so that information (e.g., a potential or a current) can be supplied from the circuit MP[i,j] to the circuit AFP.

<<Circuit MP>>

Next, configuration examples of the circuit MP[i,j] included in the arithmetic circuit 110, the arithmetic circuit 120, the arithmetic circuit 130, and the arithmetic circuit 140 are described.

Figure 9A:
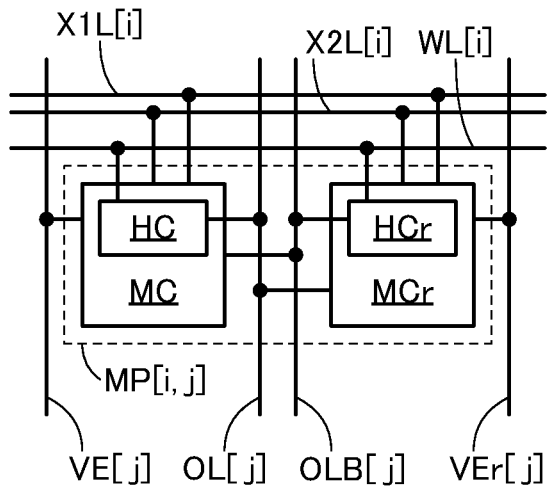
FIG. 9A, FIG. 9B, FIG. 9C, FIG. 9D, FIG. 9E, and FIG. 9F are circuit diagrams each showing a configuration example of a circuit included in a semiconductor device.

FIG. 9A shows a configuration example of the circuit MP[i,j] that can be used for the arithmetic circuit 140, and the circuit MP[i,j] includes the circuit MC and a circuit MCr, for example. The circuit MC and the circuit MCr are circuits that calculate the product of a weight coefficient and an input signal from a neuron (an arithmetic value) in the circuit MP. The circuit MC can have a configuration similar to that of the circuit MCr or a configuration different from that of the circuit MCr. Thus, "r" is added to the reference sign of the circuit MCr to differentiate it from the circuit MC. In addition, "r" is added to the reference signs of circuit elements included in the circuit MCr and described below.

The circuit MC includes a holding portion HC and the circuit MCr includes a holding portion HCr, for example. The holding portion HC and the holding portion HCr each have a function of holding information (e.g., a potential, a resistance value, or a current value). Note that the first data $w_i^{(k-1)}{}_j^{(k)}$ set in the circuit MP[i,j] is determined in accordance with information (e.g., a potential, a resistance value, or a current value) held in the holding portion HC and the holding portion HCr. Therefore, the holding portion HC and the holding portion HCr are respectively electrically connected to the wiring OL[j] and the wiring OLB[j] that supply information (e.g., a potential, a resistance value, or a current value) corresponding to the first data $w_i^{(k-1)}{}_j^{(k)}$.

In FIG. 9A, the circuit MP[i,j] is electrically connected to a wiring VE[j] and a wiring VEr[j]. The wiring VE[j] and the wiring VEr[j] each function as a wiring for supplying a constant voltage. In addition, the wiring VE[j] also functions as a wiring for releasing a current supplied from the wiring OL through the circuit MC. In addition, the wiring VEr[j] also functions as a wiring for releasing a current supplied from the wiring OLB through the circuit MCr.

A wiring WL[i] illustrated in FIG. 9A corresponds to the wiring WL[i] in FIG. 7. The wiring WL[i] is electrically connected to each of the holding portion HC and the holding portion HCr. To write information (e.g., a potential, a resistance value, or a current value) corresponding to the first data $w_i^{(k-1)}{}_j^{(k)}$ to the holding portion HC and the holding portion HCr included in the circuit MP[i,j], a predetermined potential is supplied to the wiring WL[i] so that a conduction state is established between the wiring OL[j] and the holding portion HC and a conduction state is established between the wiring OLB[j] and the holding portion HCr. Then, the potential or the like corresponding the first data $w_i^{(k-1)}{}_j^{(k)}$ is supplied to each of the wirings OL[j] and OLB[j], whereby the potential or the like can be input to each of the holding portion HC and the holding portion HCr. After that, a predetermined potential is supplied to the wiring WL[i], so that a non-conduction state is established between the wiring OL[j] and the holding portion HC and a non-conduction state is established between the wiring OLB[j] and the holding portion HCr. Then, the current or the like corresponding to the first data $w_i^{(k-1)}{}_j^{(k)}$ is held in each of the holding portion HC and the holding portion HCr.

The case where the first data $w_i^{(k-1)}{}_j^{(k)}$ has any one of three levels "−1", "0", and "1" is considered, for example. In the case where the first data $w_i^{(k-1)}{}_j^{(k)}$ is "1", for example, a predetermined potential is held in the holding portion HC so that a current corresponding to "1" flows from the wiring OL[j] to the wiring VE[j] through the circuit MC, and a potential $V_0$ is held in the holding portion HCr so that a current does not flow from the wiring OLB[j] to the wiring VEr[j] through the circuit MCr. In the case where the first data $w_i^{(k-1)}{}_j^{(k)}$ is "−1", for example, the potential $V_0$ is held in the holding portion HC so that a current does not flow from the wiring OL[j] to the wiring VE[j] through the circuit MC, and a predetermined potential is held in the holding portion HCr so that a current corresponding to "−1" flows from the wiring OLB[j] to the wiring VEr[j] through the circuit MCr. In the case where the first data $w_i^{(k-1)}{}_j^{(k)}$ is "0", for example, the potential $V_0$ is held in the holding portion HC so that a current does not flow from the wiring OL[j] to the wiring VE[j] through the circuit MC, and the potential $V_0$ is held in the holding portion HCr so that a current does not flow from the wiring OLB[j] to the wiring VEr[j] through the circuit MC. Note that the potential $V_0$ can be a potential supplied from the wiring VCN in the description of FIG. 8.

As another example, the case where the first data $w_i^{(k-1)}{}_j^{(k)}$ is an analog value, specifically, a "negative analog value", "0", or a "positive analog value" is considered. In the case where the first data $w_i^{(k-1)}{}_j^{(k)}$ is a "positive analog value", for example, a predetermined potential is held in the holding portion HC so that an analog current corresponding to the "positive analog value" flows from the wiring OL[j] to the wiring VE[j] through the circuit MC, and the potential $V_0$ is held in the holding portion HCr so that a current does not flow from the wiring OLB[j] to the wiring VEr[j] through the circuit MCr. In the case where the first data $w_i^{(k-1)}{}_j^{(k)}$ is a "negative analog value", for example, the potential $V_0$ is held in the holding portion HC so that a current does not flow from the wiring OL[j] to the wiring VE[j] through the circuit MC, and a predetermined potential is held in the holding portion HCr so that an analog current corresponding to the "negative analog value" flows from the wiring OLB[j] to the wiring VEr[j] through the circuit MCr. In the case where the first data $w_i^{(k-1)}{}_j^{(k)}$ is "0", for example, the potential $V_0$ is held in the holding portion HC so that a current does not flow from the wiring OL[j] to the wiring VE[j] through the circuit MC, and the potential $V_0$ is held in the holding portion HCr so that a current does not flow from the wiring OLB[j] to the wiring VEr[j] through the circuit MC. Note that as in the above example, the potential $V_0$ can be a potential supplied from the wiring VCN in the description of FIG. 8.

In addition, for example, the circuit MC has a function of outputting a current or the like corresponding to information (e.g., a potential, a resistance value, or a current value) held in the holding portion HC to one of the wiring OL[j] and the wiring OLB[j], and the circuit MCr has a function of outputting a current or the like corresponding to information (e.g., a potential, a resistance value, or a current value) held in the holding portion HCr to the other of the wiring OL[j] and the wiring OLB[j]. For example, in the case where a first potential is held in the holding portion HC, the circuit MC supplies a current having a first current value from the wiring OL[j] or the wiring OLB[j] to the wiring VE, and in the case where a second potential is held in the holding portion HC, the circuit MC supplies a current having a second current value from the wiring OL[j] or the wiring OLB[j] to the wiring VE. Similarly, in the case where the first potential is held in the holding portion HCr, the circuit MCr supplies a current having the first current value from the wiring OL[j] or the wiring OLB[j] to the wiring VEr, and in the case where the second potential is held in the holding portion HCr, the circuit MCr supplies a current having the second current value from the wiring OL[j] or the wiring OLB[j] to the wiring VE. Note that the levels of the first current value and the second current value are each determined in accordance with the value of the first data $w_i^{(k-1)}{}_j^{(k)}$. For example, the first current value may be larger than or smaller than the second current value. In addition, for example, one of the first current value and the second current value may be a zero current; that is, the current value may be 0. Moreover, the direction in which a current flows may be different between a current having the first current value and a current having the second current value.

In particular, in the case where the first data $w_i^{(k-1)}{}_j^{(k)}$ has any one of three levels "−1", "0", and "1", the circuits MC and MCr are preferably configured so that one of the first current value and the second current value is 0. Note that in the case where the first data $w_i^{(k-1)}{}_j^{(k)}$ is an analog value, e.g., a "negative analog value", "0", or a "positive analog value", the first current value or the second current value can be an analog value, for example.

In the case where a current flowing from the wiring OL[j] or the wiring OLB[j] to the wiring VE through the circuit MC and a current flowing from the wiring OL[j] or the wiring OLB[j] to the wiring VEr through the circuit MCr are equal to each other, a potential held in the circuit MC and a potential held in the circuit MCr might not be equal to each other because transistors therein sometimes have variations in their characteristics caused in a fabrication process or the like of the transistors. In the semiconductor device of one embodiment of the present invention, the amount of current flowing from the wiring OL[j] or the wiring OLB[j] to the wiring VE through the circuit MC can be almost equal to the amount of current flowing from the wiring OL[j] or the wiring OLB[j] to the wiring VEr through the circuit MCr, even when there are variations in characteristics of the transistors.

Note that in this specification and the like, a current, a voltage, or the like corresponding to information (e.g., a potential, a resistance value, or a current value) held in the holding portion HC and the holding portion HCr may be a positive current, voltage, or the like, may be a negative current, voltage, or the like, may be a zero current, a zero voltage, or the like; alternatively, a positive one, a negative one, and 0 may be mixed. That is, for example, the above description "the circuit MC has a function of outputting a current, a voltage, or the like corresponding to information (e.g., a potential, a resistance value, or a current value) held in the holding portion HC to one of the wiring OL[j] and the wiring OLB[j], and the circuit MCr has a function of outputting a current, a voltage, or the like corresponding to information (e.g., a potential, a resistance value, or a current value) held in the holding portion HCr to the other of the wiring OL[j] and the wiring OLB[j]" can be rephrased as a description "the circuit MC has a function of releasing a current, a voltage, or the like corresponding to information (e.g., a potential, a resistance value, or a current value) held in the holding portion HC from one of the wiring OL[j] and the wiring OLB[j], and the circuit MCr has a function of releasing a current corresponding to information (e.g., a potential, a resistance value, or a current value) held in the holding portion HCr from the other of the wiring OL[j] and the wiring OLB[j]".

The wiring X1L[i] and a wiring X2L[i] illustrated in FIG. 9A correspond to the wiring XLS[i] in FIG. 7. Note that, for example, the second data $z_i^{(k-1)}$ input to the circuit MP[i,j] is determined in accordance with the potentials, currents, or the like of the wiring X1L[i] and the wiring X2L[i]. Thus, potentials corresponding to the second data $z_i^{(k-1)}$ are input to the circuits MC and MCr through the wiring X1L[i] and the wiring X2L[i], for example.

The circuit MC is electrically connected to the wiring OL[j] and the wiring OLB[j], and the circuit MCr is electrically connected to the wiring OL[j] and the wiring OLB[j]. The circuit MC and the circuit MCr output currents, potentials, or the like corresponding to the product of the first data $w_i^{(k-1)}{}_j^{(k)}$ and the second data $z_i^{(k-1)}$ to the wiring OL[j] and the wiring OLB[j] in accordance with the potentials, currents, or the like input to the wiring X1L[i] and the wiring X2L[i], for example. As a specific example, the destinations of the currents output from the circuits MC and MCr are determined in accordance with the potentials of the wiring X1L[i] and the wiring X2L[i]. For example, the circuit MC and the circuit MCr have a circuit configuration in which a current output from the circuit MC flows to one of the wiring OL[j] and the wiring OLB[j], and a current output from the circuit MCr flows to the other of the wiring OL[j] and the wiring OLB[j]. That is, the currents output from the circuits MC and MCr flow to not the same wiring but different wirings. Note that for example, the currents from the circuit MC and the circuit MCr flow to neither the wiring OL[j] nor the wiring OLB[j] in some cases.

The case where the second data $z_i^{(k-1)}$ has any one of three levels "−1", "0", and "1" is considered, for example. In the case where the second data $z_1^{(k-1)}$ is "1", for example, the circuit MP establishes a conduction state between the circuit MC and the wiring OL[j] and establishes a conduction state between the circuit MCr and the wiring OLB[j]. In the case where the second data $z_i^{(k-1)}$ is "−1", for example, the circuit MP establishes a conduction state between the circuit MC and the wiring OLB[j] and establishes a conduction state between the circuit MCr and the wiring OL[j]. In the case where the second data $z_1^{(k-1)}$ is "0", for example, the circuit MP establishes a non-conduction state between the circuit MC and the wiring OL[j] and between the circuit MC and the wiring OLB[j] and establishes a non-conduction state between the circuit MCr and the wiring OL[j] and between the circuit MCr and the wiring OLB[j] so that currents output from the circuit MC and the circuit MCr flow to neither the wiring OL[j] nor the wiring OLB[j].

An example in which the above-described operations are combined is shown. In the case where the first data $w_1^{(k-1)}{}_j^{(k)}$ is "1", a current flows from the wiring OL[j] or the wiring OLB[j] to the wiring VE[j] through the circuit MC in some cases, and a current does not flow from the wiring OL[j] or the wiring OLB[j] to the wiring VEr[j] through the circuit MCr. In the case where the first data $w_i^{(k-1)}{}_j^{(k)}$ is "−1", a current does not flow from the wiring OL[j] or the wiring OLB[j] to the wiring VE[j] through the circuit MC, and a current flows from the wiring OL[j] or the wiring OLB[j] to the wiring VEr[j] through the circuit MCr in some cases. In the case where the second data $z_i^{(k-1)}$ is "1", a conduction state is established between the circuit MC and the wiring OL[j] and between the circuit MCr and the wiring OLB[j]. In the case where the second data $z_i^{(k-1)}$ is "−1", a conduction state is established between the circuit MC and the wiring OLB[j] and between the circuit MCr and the wiring OL[j]. From the above, in the case where the product of the first data $w_i^{(k-1)}{}_j^{(k)}$ and the second data $z_i^{(k-1)}$ is a positive value, a current flows from the wiring OL[j] to the wiring VE[j] through the circuit MCr or a current flows from the wiring OL[j] to the wiring VEr[j] through the circuit MCr. In the case where the product of the first data $w_i^{(k-1)}{}_j^{(k)}$ and the second data $z_i^{(k-1)}$ is a negative value, a current flows from the wiring OL[j] to the wiring VEr[j] through the circuit MCr or a current flows from the wiring OLB[j] to the wiring VE[j] through the circuit MC. In the case where the product of the first data $w_i^{(k-1)}{}_j^{(k)}$ and the second data $z_i^{(k-1)}$ is a value of 0, a current does not flow from the wiring OL[j] or the wiring OLB[j] to the wiring VE[j] and a current does not flow from the wiring OL[j] or the wiring OLB[j] to the wiring VEr[j].

The above-described example is described as a specific example as follows: in the case where the first data $w_i^{(k-1)}{}_j^{(k)}$ is "1" and the second data $z_i^{(k-1)}$ is "1", a current I1[i,j] having the first current value flows from the circuit MC to the wiring OL[j] and a current I2[i,j] having the second current value flows from the circuit MCr to the wiring OLB[j], for example. Here, the second current value is zero, for example. In the case where the first data $w_i^{(k-1)}{}_j^{(k)}$ is "−1" and the second data $z_i^{(k-1)}$ is "1", the current I1[i,j] having the second current value flows from the circuit MC to the wiring OL[j] and the current I2[i,j] having the first current value flows from the circuit MCr to the wiring OLB[j], for example. Here, the second current value is zero, for example. In the case where the first data $w_i^{(k-1)}{}_j^{(k)}$ is "0" and the second data $z_i^{(k-1)}$ is "1", the current I1[i,j] having the second current value flows from the circuit MC to the wiring OL[j] and the current I2[i,j] having the second current value flows from the circuit MCr to the wiring OLB[j]. Here, the second current value is zero, for example.

In the case where the first data $w_i^{(k-1)}{}_j^{(k)}$ is "1" and the second data $z_i^{(k-1)}$ is "−1", the current I1[i,j] having the first current value flows from the circuit MC to the wiring OLB[j] and the current I2[i,j] having the second current value flows from the circuit MCr to the wiring OL[j]. Here, the second current value is zero, for example. In the case where the first data $w_i^{(k-1)}{}_j^{(k)}$ is "−1" and the second data $z_i^{(k-1)}$ is "−1", the current I1[i,j] having the second current value flows from the circuit MC to the wiring OLB[j] and the current I2[i,j] having the first current value flows from the circuit MCr to the wiring OL[j]. Here, the second current value is zero, for example. In the case where the first data $w_i^{(k-1)}{}_j^{(k)}$ is "0" and the second data $z_i^{(k-1)}$ is "−1", the current I1[i,j] having the second current value flows from the circuit MC to the wiring OLB[j] and the current I2[i,j] having the second current value flows from the circuit MCr to the wiring OL[j]. Here, the second current value is zero, for example.

In the case where the second data $z_i^{(k-1)}$ is "0", a non-conduction state is established between the circuit MC and the wiring OL[j] and between the circuit MC and the wiring OLB[j], for example. Similarly, a non-conduction state is established between the circuit MCr and the wiring OL[j] and between the circuit MCr and the wiring OLB[j]. Therefore, whatever the level the first data $w_i^{(k-1)}{}_j^{(k)}$ has, currents are not output from the circuit MC and the circuit MCr to the wiring OL[j] and the wiring OLB[j].

As described above, in the case where the product value of the first data $w_i^{(k-1)}{}_j^{(k)}$ and the second data $z_i^{(k-1)}$ is a positive value, for example, a current flows from the circuit MC or the circuit MCr to the wiring OL[j]. Here, in the case where the first data $w_i^{(k-1)}{}_j^{(k)}$ is a positive value, a current flows from the circuit MC to the wiring OL[j], and in the case where the first data $w_i^{(k-1)}{}_j^{(k)}$ is a negative value, a current flows from the circuit MCr to the wiring OL[j]. In contrast, in the case where the product value of the first data $w_i^{(k-1)}{}_j^{(k)}$ and the second data $z_i^{(k-1)}$ is a negative value, a current flows from the circuit MC or the circuit MCr to the wiring OLB[j]. Here, in the case where the first data $w_i^{(k-1)}{}_j^{(k)}$ is a positive value, a current flows from the circuit MC to the wiring OLB[j], and in the case where the first data $w_i^{(k-1)}{}_j^{(k)}$ is a negative value, a current flows from the circuit MCr to the wiring OLB[j]. Accordingly, the sum total of the currents output from a plurality of circuits MC or a plurality of circuits MCr connected to the wiring OL[j] flows to the wiring OL[j]. That is, a current having a value which is the sum of positive values flows through the wiring OL[j]. In contrast, the sum total of the currents output from a plurality of circuits MC or a plurality of circuits MCr connected to the wiring OLB[j] flows to the wiring OLB[j]. That is, a current having a value which is the sum of negative values flows through the wiring OLB[j]. As a result of the above-described operation, the total value of the currents flowing through the wiring OL[j], that is, the sum total of positive values and the total value of the currents flowing through the wiring OLB[j], that is, the sum total of negative values are utilized, so that product-sum operation processing can be performed. For example, in the case where the total value of the currents flowing through the wiring OL[j] is larger than the total value of the currents flowing through the wiring OLB[j], it can be determined that the product-sum operation result has a positive value. In the case where the total value of the currents flowing through the wiring OL[j] is smaller than the total value of the currents flowing through the wiring OLB[j], it can be determined that the product-sum operation result has a negative value. In the case where the total value of the currents flowing through the wiring OL[j] is almost equal to the total value of the currents flowing through the wiring OLB[j], it can be determined that the product-sum operation result has a value of zero.

Note that even in the case where the second data $z_i^{(k-1)}$ has any two levels among "−1", "0", and "1", for example, two levels "−1" and "1" or two levels "0" and "1", operation can be performed in a similar manner. Similarly, even in the case where the first data $w_i^{(k-1)}{}_j^{(k)}$ has any two levels among "−1", "0", and "1", for example, two levels "−1" and "1" or two levels "0" and "1", operation can be performed in a similar manner.

Note that the first data $w_i^{(k-1)}{}_j^{(k)}$ may be an analog value or a multi-bit (multilevel) digital value. As a specific example, "−1" can be replaced with a "negative analog value", and "1" can be replaced with a "positive analog value". In this case, the amount of current flowing from the circuit MC or the circuit MCr is, for example, an analog value corresponding to the absolute value of the value of the first data $w_i^{(k-1)}{}_j^{(k)}$.

Next, a modification example of the circuit MP[i,j] in FIG. 9A is described. Note that in the modification example of the circuit MP[i,j], differences from the circuit MP[i,j] in FIG. 9A are mainly described and the description of portions common to the circuit MP[i,j] in FIG. 9A is sometimes omitted.

Figure 9B:
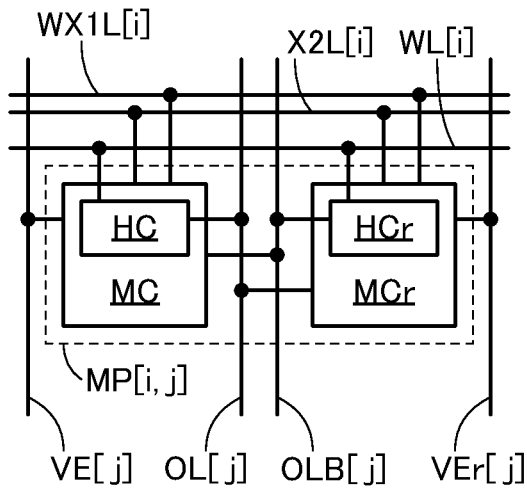

The circuit MP[i,j] illustrated in FIG. 9B has a configuration in which the wiring W1L is replaced with the wiring WX1L. That is, in the circuit MP[i,j] in FIG. 9B, the wiring WX1L and the wiring WL each function as a wiring for supplying a predetermined potential to switch a conduction state and a non-conduction state between the wiring OL[j] and the holding portion HC and to switch a conduction state and a non-conduction state between the wiring OLB[j] and the holding portion HCr. In addition, in the circuit MP[i,j] in FIG. 9B, the wiring X1L and the wiring X2L each function as a wiring for supplying a current, a voltage, or the like corresponding to the second data $z_i^{(k-1)}$ to be input to the circuit MP[i,j].

Figure 13:
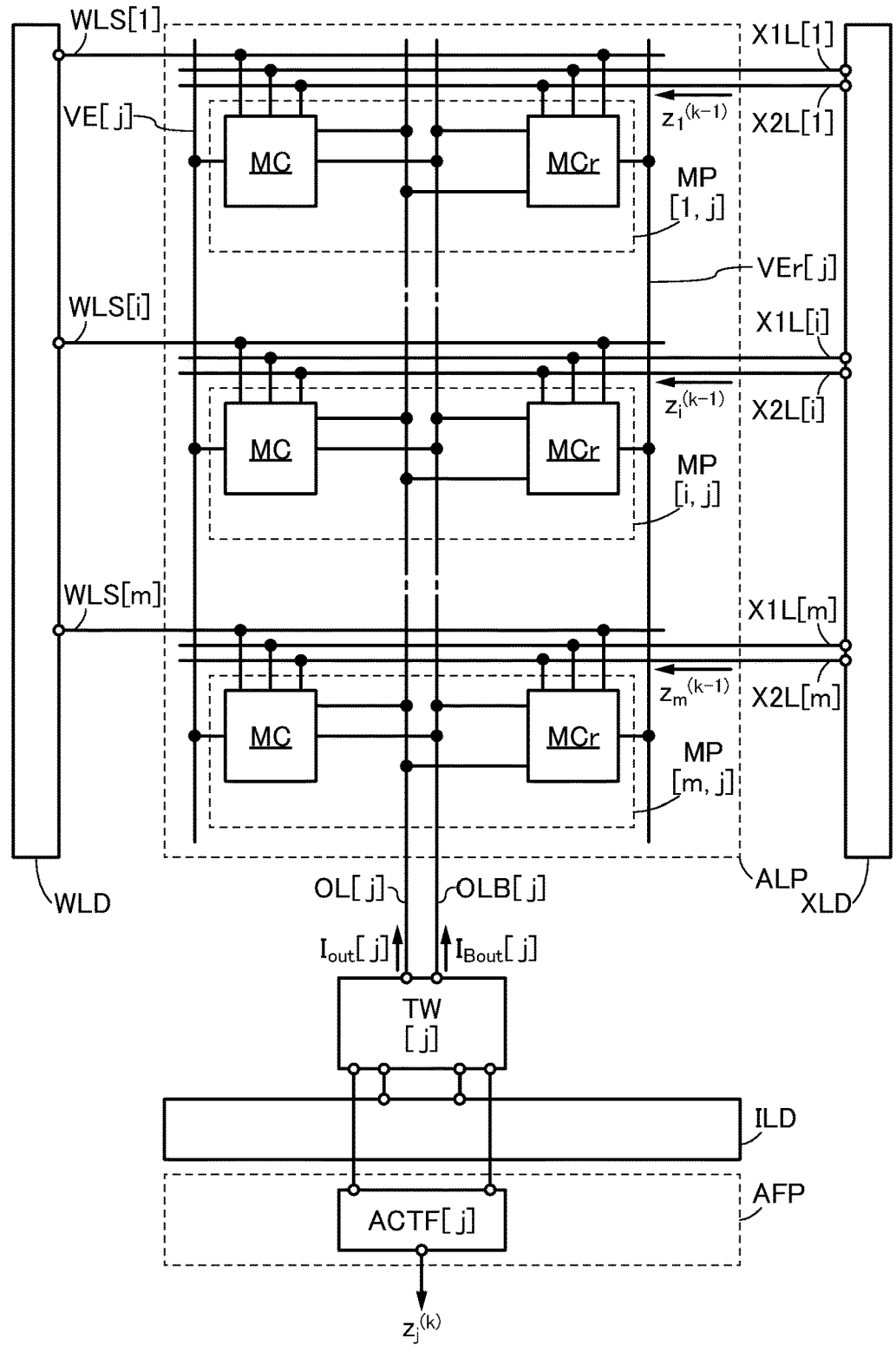
FIG. 13 is a circuit diagram showing a configuration example of a semiconductor device.

The circuit MP[i,j] in FIG. 9B can be used for an arithmetic circuit including the wiring WX1L, such as the arithmetic circuit 130 illustrated in FIG. 13, or an arithmetic circuit not including the wiring IL and the wiring ILB, such as the arithmetic circuit 140 illustrated in FIG. 7. Specifically, the circuit MP[i,j] in FIG. 9B can be used as the circuit MP[i,j] of an arithmetic circuit 150 illustrated in FIG. 11.

Figure 9C:
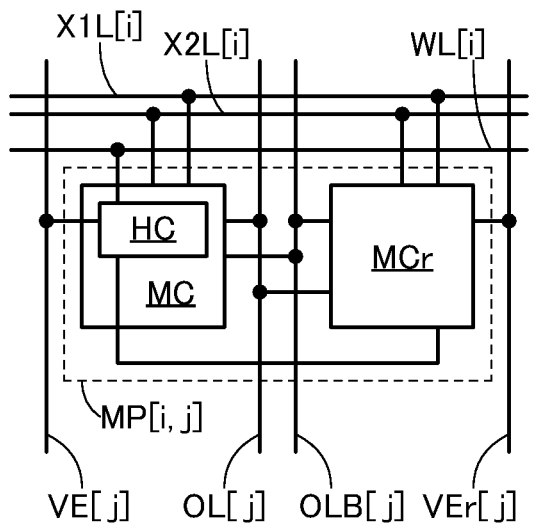

Next, a modification example of the circuit MP[i,j] in FIG. 9A, which is different from that in FIG. 9B, is described. The circuit MP[i,j] illustrated in FIG. 9C is a modification example of the circuit MP[i,j] in FIG. 9A. The circuit MP[i,j] in FIG. 9C includes the circuit MC and the circuit MCr like the circuit MP[i,j] in FIG. 9A. Note that the circuit MP[i,j] in FIG. 9C is different from the circuit MP[i,j] in FIG. 9A in that the holding portion HCr is not included in the circuit MCr.

Since the circuit MCr does not include the holding portion HCr, an arithmetic circuit using the circuit MP[i,j] in FIG. 9C does not necessarily include the wiring ILB[j] for supplying a potential to be held in the holding portion HCr. In addition, the circuit MCr is not necessarily electrically connected to the wiring WL[i].

In the circuit MP[i,j] in FIG. 9C, the holding portion HC included in the circuit MC is electrically connected to the circuit MCr. That is, the circuit MP[i,j] in FIG. 9C is configured so that the circuit MCr and the circuit MC share the holding portion HC. An inverted signal of a signal held in the holding portion HC can be supplied from the holding portion HC to the circuit MCr, for example. Accordingly, the circuit MC and the circuit MCr can perform different operations. Alternatively, it is also possible that the circuit MC and the circuit MCr have different internal circuit configurations so that the circuit MC and the circuit MCr output different amounts of current in accordance with the same signal held in the holding portion HC. Here, when a potential corresponding to the first data $w_i^{(k-1)}{}_j^{(k)}$ is held in the holding portion HC and a potential corresponding to the second data $z_i^{(k-1)}$ is supplied to the wiring X1L[i] and the wiring X2L[i], the circuit MP[i,j] can output to the wiring OL[j] and the wiring OLB[j] a current corresponding to the product of the first data $w_i^{(k-1)}{}_j^{(k)}$ and the second data $z_i^{(k-1)}$.

Figure 12:
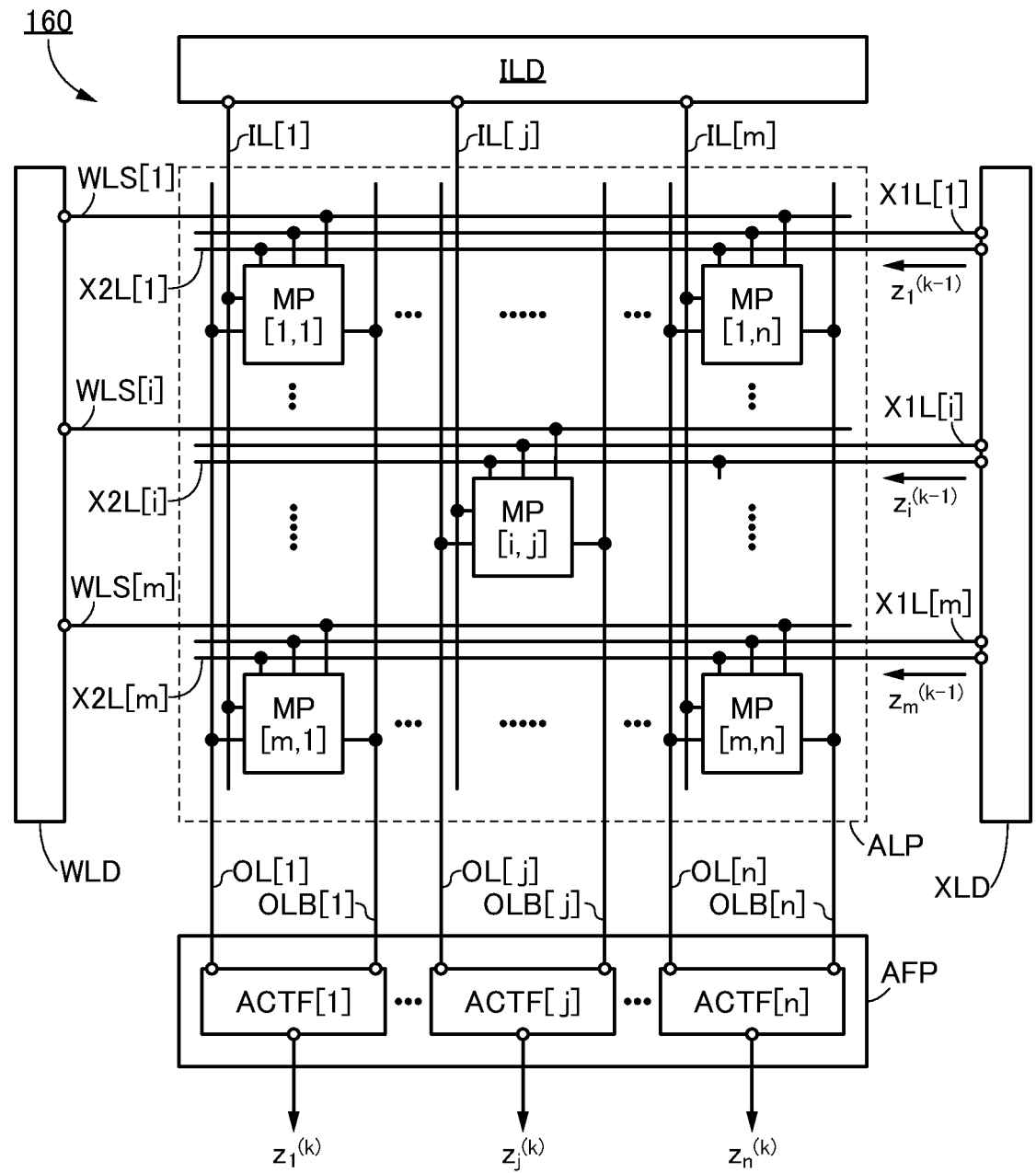
FIG. 12 is a circuit diagram showing a configuration example of a semiconductor device.

Note that the circuit configuration of the arithmetic circuit 110 using the circuit MP in FIG. 9C can be changed into that of an arithmetic circuit 160 illustrated in FIG. 12. The arithmetic circuit 160 has a configuration in which the wiring ILB[1] to a wiring ILB[m] are removed from the arithmetic circuit 110 in FIG. 2.

Figure 9D:
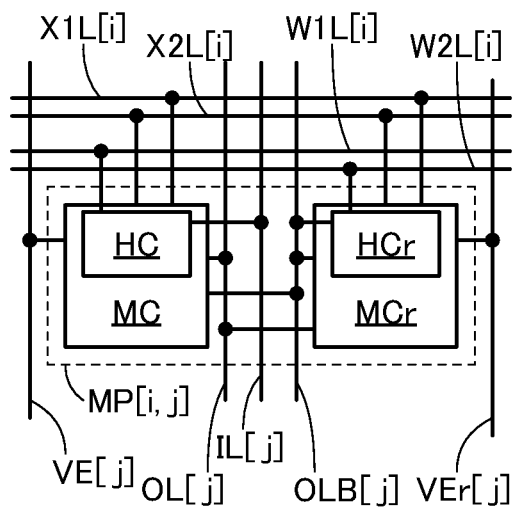

The circuit MP[i,j] illustrated in FIG. 9D is a modification example of the circuit MP[i,j] in FIG. 9A, and is a configuration example of the circuit MP[i,j] that can be used for the arithmetic circuit 160 in FIG. 12, specifically. The circuit MP[i,j] in FIG. 9D includes the circuit MC and the circuit MCr like the circuit MP[i,j] in FIG. 9A. Note that the circuit MP[i,j] in FIG. 9D and the circuit MP[i,j] in FIG. 9A are different from each other in the electrical connection configuration of wirings.

The wiring W1L[i] and a wiring W2L[i] illustrated in FIG. 9D correspond to the wiring WLS[i] in FIG. 12. The wiring W1L[i] is electrically connected to the holding portion HC, and the wiring W2L[i] is electrically connected to the holding portion HCr.

In addition, the wiring IL[j] is electrically connected to the holding portion HC and the holding portion HCr.

In the case where the holding portion HC and the holding portion HCr of the circuit MP[i,j] in FIG. 9D hold different information (e.g., a voltage, a resistance value, or a current), operations for holding the information in the holding portion HC and the holding portion HCr are preferably performed not concurrently but sequentially. The case is considered where the first data $w_i^{(k-1)}{}_j^{(k)}$ of the circuit MP[i,j] can be expressed when the holding portion HC holds first information and the holding portion HCr holds second information, for example. First, a predetermined potential is supplied to the wiring W1L[i] and the wiring W2L[i] so that a conduction state is established between the holding portion HC and the wiring IL[j] and a non-conduction state is established between the holding portion HCr and the wiring IL[j]. Then, a current, a voltage, or the like corresponding to the first information is supplied to the wiring IL[j], whereby the first information can be supplied to the holding portion HC. After that, a predetermined potential is supplied to the wiring W1L[i] and the wiring W2L[i] so that a non-conduction state is established between the holding portion HC and the wiring IL[j] and a conduction state is established between the holding portion HCr and the wiring IL[j]. Then, a current, a voltage, or the like corresponding to the second information is supplied to the wiring IL[j], whereby the second information can be supplied to the holding portion HCr. Thus, the circuit MP[i,j] can set $w_i^{(k-1)}{}_j^{(k)}$ as the first data.

In the case where the holding portion HC and the holding portion HCr hold substantially the same information (e.g., a voltage, a resistance value, or a current) (in the case where the first data $w_i^{(k-1)}{}_j^{(k)}$ of the circuit MP[i,j] is set when the holding portion HC and the holding portion HCr hold substantially the same information), a predetermined potential is supplied to the wiring W1L[i] and the wiring W2L[i] so that a conduction state is established between the holding portion HC and the wiring IL[j] and a conduction state is established between the holding portion HCr and the wiring IL[j], and then a current, a voltage, or the like corresponding to the information is supplied from the wiring IL[j] to the holding portion HC and the holding portion HCr.

When a potential corresponding to the first data $w_i^{(k-1)}{}_j^{(k)}$ is held in the holding portion HC and the holding portion HCr and a potential corresponding to the second data $z_i^{(k-1)}$ is supplied to the wiring X1L[i] and the wiring X2L[i], the circuit MP[i,j] in FIG. 9D can output to the wiring OL[j] and the wiring OLB[j] a current corresponding to the product of the first data $w_i^{(k-1)}{}_j^{(k)}$ and the second data $z_i^{(k-1)}$ like the circuit MP[i,j] in FIG. 9A.

Figure 9E:
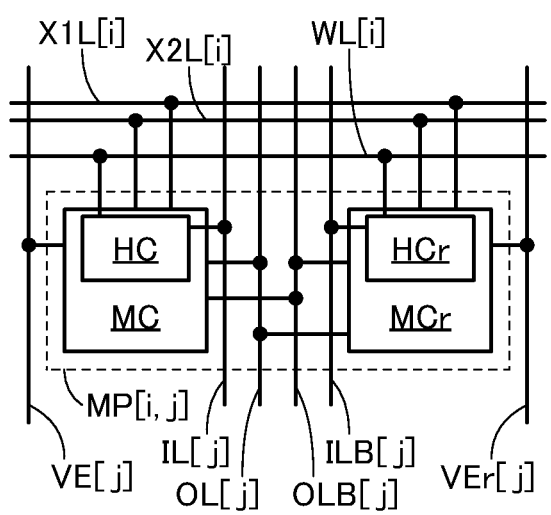

The circuit MP[i,j] illustrated in FIG. 9E is a modification example of the circuit MP[i,j] in FIG. 9D. The circuit MP[i,j] in FIG. 9E includes the circuit MC and the circuit MCr like the circuit MP[i,j] in FIG. 9D. Note that the circuit MP[i,j] in FIG. 9E and the circuit MP[i,j] in FIG. 9D are different from each other in the electrical connection configuration of wirings.

Specifically, the circuit MP in FIG. 9E has a configuration in which the wiring ILB[j] is added to the circuit MP in FIG. 9D and the wiring W1L[i] and the wiring W2L[i] that are electrically connected to the circuit MP in FIG. 9D are replaced with the wiring WL[i].

In the circuit MP in FIG. 9E, the wiring IL[j] is electrically connected to the holding portion HC and the wiring ILB[j] is electrically connected to the holding portion HCr. That is, in the circuit MP in FIG. 9D, the wiring IL[j] functions as a wiring for supplying a current, a voltage, or the like corresponding to information (e.g., a voltage, a resistance value, or a current) to each of the holding portion HC and the holding portion HCr; meanwhile, in the circuit MP in FIG. 9E, the wiring IL[j] functions as a wiring for supplying a current, a voltage, or the like corresponding to information to the holding portion HC and the wiring ILB [j] functions as a wiring for supplying a current, a voltage, or the like corresponding to information to the holding portion HC.

Moreover, in the circuit MP in FIG. 9E, the wiring IL[j] and the wiring ILB[j] are electrically connected respectively to the holding portion HC and the holding portion HCr, and thus a current, a voltage, or the like corresponding to information (e.g., a voltage, a resistance value, or a current) can be supplied to the holding portion HC and the holding portion HCr concurrently. Thus, switching of a conduction state and a non-conduction state between the holding portion HC and the wiring IL[j] and switching of a conduction state and a non-conduction state between the holding portion HCr and the wiring ILB[j] can be performed concurrently. In the circuit MP in FIG. 9D, the wiring W1L is illustrated as a wiring for controlling switching of a conduction state and a non-conduction state between the holding portion HC and the wiring IL[j], and the wiring W2L is illustrated as a wiring for controlling switching of a conduction state and a non-conduction state between the holding portion HCr and the wiring ILB[j]; meanwhile, in the circuit MP in FIG. 9E, the wiring WL[i] is illustrated as a wiring obtained by combining the wiring W1L and the wiring W2L.

Note that the circuit MP in FIG. 9E can be used for the arithmetic circuit 110 in FIG. 2 and the arithmetic circuit 120 in FIG. 3, for example.

Figure 9F:
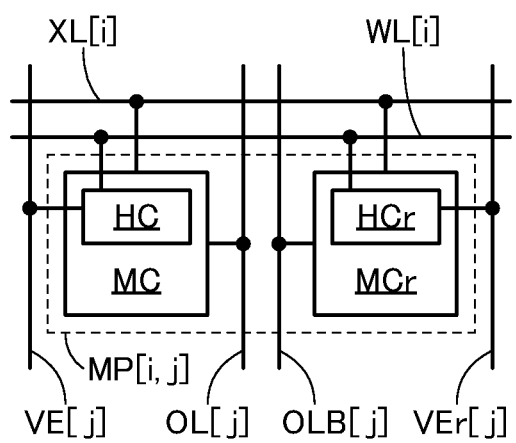

The circuit MP[i,j] illustrated in FIG. 9F is a modification example of the circuit MP[i,j] in FIG. 9A. The circuit MP[i,j] in FIG. 9F includes the circuit MC and the circuit MCr like the circuit MP[i,j] in FIG. 9A. Note that the circuit MP[i,j] in FIG. 9F is different from the circuit MP[i,j] in FIG. 9A in that the circuit MC is not electrically connected to the wiring OLB[j] and the circuit MCr is not electrically connected to the wiring OL[j].

The wiring WL[i] illustrated in FIG. 9F is electrically connected to the holding portion HC and the holding portion HCr. In addition, a wiring XL[i] illustrated in FIG. 9F is electrically connected to the circuit MC and the circuit MCr.

As described later, the circuit MC is not electrically connected to the wiring OLB[j] and the circuit MCr is not electrically connected to the wiring OL[j] in the circuit MP[i,j] in FIG. 9F. That is, unlike in the circuits MP[i,j] in FIG. 9A to FIG. 9E, a current output from the circuit MC does not flow to the wiring OLB[j] and a current output from the circuit MCr does not flow to the wiring OL[j] in the circuit MP[i,j] in FIG. 9F.

Thus, the circuit MP[i,j] in FIG. 9F is preferably used for an arithmetic circuit in the case where the second data $z_i^{(k-1)}$ has any one of two levels "0" and "1". In the case where the second data $z_i^{(k-1)}$ is "1", for example, the circuit MP establishes a conduction state between the circuit MC and the wiring OL[j] and establishes a conduction state between the circuit MCr and the wiring OLB[j]. In the case where the second data $z_i^{(k-1)}$ is "0", for example, the circuit MP establishes a non-conduction state between the circuit MC and the wiring OL[j] and between the circuit MC and the wiring OLB[j], and establishes a non-conduction state between the circuit MCr and the wiring OL[j] and between the circuit MCr and the wiring OLB[j] so that currents output from the circuit MC and the circuit MCr flow to neither the wiring OL[j] nor the wiring OLB[j].

When used for the arithmetic circuit 110, the circuit MP[i,j] in FIG. 9F can perform, for example, arithmetic operation of the case where the first data $w_i^{(k-1)}{}_j^{(k)}$ has any one of three levels "−1", "0", and "1" and the second data $z_i^{(k-1)}$ has two levels "0" and "1". Note that even in the case where the first data $w_i^{(k-1)}{}_j^{(k)}$ has any two levels among "−1", "0", and "1", for example, two levels "−1" and "1" or two levels "0" and "1", operation can be performed. Note that the first data $w_i^{(k-1)}{}_j^{(k)}$ may be an analog value or a multi-bit (multilevel) digital value. As a specific example, "−1" can be replaced with a "negative analog value", and "1" can be replaced with a "positive analog value". In this case, the amount of current flowing from the circuit MC or the circuit MCr is, for example, an analog value corresponding to the absolute value of the value of the first data $w_i^{(k-1)}{}_j^{(k)}$.

Figure 10:
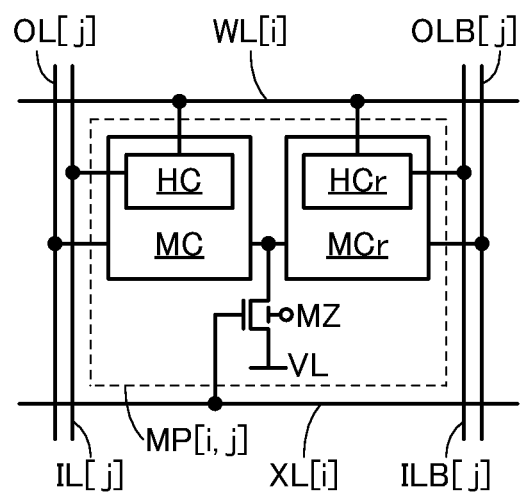
FIG. 10 is a circuit diagram showing a configuration example of a circuit included in a semiconductor device.

As in FIG. 9A, the circuit MP[i,j] illustrated in FIG. 10 is a circuit that can output a current corresponding to the product of the first data $w_i^{(k-1)}{}_j^{(k)}$ and the second data $z_i^{(k-1)}$ to the wiring OL[j] and the wiring OLB[j]. Note that the circuit MP[i,j] in FIG. 10 can be used for the arithmetic circuit 110 in FIG. 2, for example.

The circuit MP[i,j] in FIG. 10 includes a transistor MZ in addition to the circuit MC and the circuit MCr.

A first terminal of the transistor MZ is electrically connected to a first terminal of the circuit MC and a first terminal of the circuit MCr. A second terminal of the transistor MZ is electrically connected to a wiring VL. A gate of the transistor MZ is electrically connected to the wiring XL[i].

The wiring VL functions as a wiring for supplying a constant voltage, for example. The constant voltage is preferably determined in accordance with the configuration of the circuit MP[i,j], the arithmetic circuit 110, or the like. The constant voltage can be, for example, VDD that is a high-level potential, VSS that is a low-level potential, a ground potential, or the like.

The wiring WL[i] illustrated in FIG. 10 corresponds to the wiring WLS[i] in the arithmetic circuit 110 in FIG. 2. The wiring WL[i] is electrically connected to the holding portion HC and the holding portion HCr.

The wiring OL[j] is electrically connected to a second terminal of the circuit MC. The wiring OLB[j] is electrically connected to a second terminal of the circuit MCr.

The wiring IL[j] is electrically connected to the holding portion HC and the wiring ILB[j] is electrically connected to the holding portion HCr.

For the operation of the case where a potential corresponding to the first data is held in each of the holding portion HC and the holding portion HCr of the circuit MP[i,j] in FIG. 10, the description of the operation for holding a potential corresponding to the first data in the circuit MP[i,j] in FIG. 9A is referred to.

In the circuit MP[i,j] in FIG. 10, the circuit MC has a function of making a current corresponding to the potential held in the holding portion HC flow between the first terminal and the second terminal of the circuit MC while the constant voltage supplied from the wiring VL is supplied to the first terminal of the circuit MC. The circuit MCr has a function of making a current corresponding to the potential held in the holding portion HCr flow between the first terminal and the second terminal of the circuit MCr while the constant voltage is supplied from the wiring VL to the first terminal of the circuit MC. That is, by holding a potential corresponding to the first data $w_i^{(k-1)}{}_j^{(k)}$ in each of the holding portion HC and the holding portion HCr of the circuit MP[i,j], the amount of current flowing between the first terminal and the second terminal of the circuit MC and the amount of current flowing between the first terminal and the second terminal of the circuit MCr can be determined. Note that in the case where the first terminal of the circuit MC (the circuit MCr) is not supplied with the constant voltage supplied from the wiring VL, the circuit MC (the circuit MCr) does not necessarily make a current flow between the first terminal and the second terminal of the circuit MC (the circuit MCr), for example.

In the case where a potential corresponding to the first data $w_i^{(k-1)}{}_j^{(k)}$ of "1" is held in each of the holding portion HC and the holding portion HCr, for example, the circuit MC makes a predetermined current flow between the first terminal and the second terminal of the circuit MC when the constant voltage supplied from the wiring VL is supplied to the circuit MC. Thus, a current flows between the circuit MC and the wiring OL. Note that at this time, the circuit MCr does not make a current flow between the first terminal and the second terminal of the circuit MCr. Thus, a current does not flow between the circuit MCr and the wiring OLB. Moreover, in the case where a potential corresponding to the first data $w_i^{(k-1)}{}_j^{(k)}$ of "−1" is held in each of the holding portion HC and the holding portion HCr, for example, the circuit MCr makes a predetermined current flow between the first terminal and the second terminal of the circuit MCr when the constant voltage supplied from the wiring VL is supplied to the circuit MC. Thus, a current flows between the circuit MCr and the wiring OLB. Note that at this time, the circuit MC does not make a current flow between the first terminal and the second terminal of the circuit MC. Thus, a current does not flow between the circuit MC and the wiring OL. In the case where a potential corresponding to the first data $w_i^{(k-1)}{}_j^{(k)}$ of "0" is held in each of the holding portion HC and the holding portion HCr, for example, the circuit MC does not make a current flow between the first terminal and the second terminal of the circuit MC and the circuit MCr does not make a current flow between the first terminal and the second terminal of the circuit MCr regardless of whether the constant voltage from the wiring VL is supplied to the circuit MC and the circuit MCr. That is, a current does not flow between the circuit MC and the wiring OL and a current does not flow between the circuit MCr and the wiring OLB.

Note that for a specific example of the potential corresponding to the first data $w_i^{(k-1)}{}_j^{(k)}$ that is held in the holding portion HC and the holding portion HCr in the circuit MP[i,j] in FIG. 10, the description of the circuit MP[i,j] in FIG. 9A is referred to. In the circuit MP[i,j] in FIG. 10, the holding portion HC and the holding portion HCr may have a function of holding not a potential but information such as a current or a resistance value, and the circuit MC and the circuit MCr may have a function of making a current corresponding to the information flow as in the circuit MP[i,j] in FIG. 9A.

The wiring XL[i] illustrated in FIG. 10 corresponds to the wiring XLS[i] in the arithmetic circuit 110 in FIG. 2. Note that, for example, the second data $z_i^{(k-1)}$ input to the circuit MP[i,j] is determined in accordance with the potential, current, or the like of the wiring XL[i]. Thus, the potential corresponding to the second data $z_i^{(k-1)}$ is input to the gate of the transistor MZ through the wiring XL[i], for example.

The case where the second data $z_i^{(k-1)}$ has any one of two levels "0" and "1" is considered, for example. In the case where the second data $z_i^{(k-1)}$ is "1", for example, a high-level potential is supplied to the wiring XL[i]. At this time, the transistor MZ is brought into an on state; thus, the circuit MP establishes a conduction state between the wiring VL and the first terminal of the circuit MC and establishes a conduction state between the wiring VL and the first terminal of the circuit MCr. That is, in the case where the second data $z_i^{(k-1)}$ is "1", the constant voltage from the wiring VL is supplied to the circuit MC and the circuit MCr. Moreover, in the case where the second data $z_i^{(k-1)}$ is "0", for example, a low-level potential is supplied to the wiring XL[i]. In this case, the circuit MP establishes a non-conduction state between the circuit MC and the wiring OLB[j] and establishes a non-conduction state between the circuit MCr and the wiring OL[j]. That is, in the case where the second data $z_i^{(k-1)}$ is "0", the constant voltage from the wiring VL is not supplied to the circuit MC and the circuit MCr.

Here, in the case where the first data $w_i^{(k-1)}{}_j^{(k)}$ is "1" and the second data $z_i^{(k-1)}$ is "1", for example, the result is that a current flows between the circuit MC and the wiring OL and a current does not flow between the circuit MCr and the wiring OLB. In the case where the first data $w_i^{(k-1)}{}_j^{(k)}$ and the second data $z_i^{(k-1)}$ is "1", for example, the result is that a current does not flow between the circuit MC and the wiring OL and a current flows between the circuit MCr and the wiring OLB. In the case where the first data $w_i^{(k-1)}{}_j^{(k)}$ is "0" and the second data $z_i^{(k-1)}$ is "1", for example, the result is that a current does not flow between the circuit MC and the wiring OL and between the circuit MCr and the wiring OLB. In the case where the second data $z_i^{(k-1)}$ is "0", for example, the result is that a current does not flow between the circuit MC and the wiring OL and between the circuit MCr and the wiring OLB even when the first data $w_i^{(k-1)}{}_j^{(k)}$ is any one of "−1", "0", and "1".

That is, like the circuit MP[i,j] in FIG. 9F, the circuit MP[i,j] in FIG. 10 can perform, for example, arithmetic operation of the case where the first data $w_i^{(k-1)}{}_j^{(k)}$ has any one of three levels "−1", "0", and "1" and the second data $z_i^{(k-1)}$ has two levels "0" and "1". In addition, even in the case where the first data $w_i^{(k-1)}{}_j^{(k)}$ has any two levels among "−1", "0", and "1", for example, two levels "−1" and "1" or two levels "0" and "1", the circuit MP[i,j] in FIG. 10 can perform operation like the circuit MP[i,j] in FIG. 9F. Note that the first data $w_i^{(k-1)}{}_j^{(k)}$ may be an analog value or a multi-bit (multilevel) digital value. As a specific example, "−1" can be replaced with a "negative analog value", and "1" can be replaced with a "positive analog value". In this case, the amount of current flowing from the circuit MC or the circuit MCr is, for example, an analog value corresponding to the absolute value of the value of the first data $w_i^{(k-1)}{}_j^{(k)}$.

Operation Example of Arithmetic Circuit

Next, an operation example of the arithmetic circuit 140 in FIG. 7 is described. Note that in the description of this operation example, the arithmetic circuit 140 illustrated in FIG. 13 is used as an example.

The arithmetic circuit 140 in FIG. 13 is illustrated focusing on a circuit positioned in the j-th column of the arithmetic circuit 140 in FIG. 7. That is, the arithmetic circuit 140 in FIG. 13 corresponds to a circuit that performs product-sum operation of the weight coefficients $w_1^{(k-1)}{}_j^{(k)}$ to $w_m^{(k-1)}{}_j^{(k)}$ and the signals $z_1^{(k-1)}$ to $z_m^{(k-1)}$ input from the neuron $N_1^{(k-1)}$ to the neuron $N_m^{(k-1)}$ to the neuron $N_j^{(k)}$ in the neural network 100 illustrated in FIG. 1A and arithmetic operation of an activation function using the result of the product-sum operation. Furthermore, the circuit MP in FIG. 9B is used as the circuit MP included in the array portion ALP of the arithmetic circuit 110 in FIG. 13.

First, in the arithmetic circuit 140, the first data $w_1^{(k-1)(k)}_j$ to $w_m^{(k-1)(k)}_j$ are set in the circuit MP[1,j] to the circuit MP[m,j]. The first data $w_i^{(k-1)(k)}_j$ is set in the following manner: a predetermined potential is input to the wiring WLS[1] to the wiring WLS[m] sequentially by the circuit WLD to select the circuit MP[1,j] to the circuit MP[m,j] sequentially, and a potential, a current, or the like corresponding to the first data is supplied from the circuit ILD through the switching circuit TW[j], the wiring OL[j], and the wiring OLB[j] to the holding portion HC of the circuit MC and the holding portion HCr of the circuit MCr that are included in each of the selected circuits MP. After the supply of the potential, the current, or the like, the circuit WLD makes the circuit MP[1,j] to the circuit MP[m,j] unselected, so that the potential, the current, or the like corresponding to the first data $w_1^{(k-1)(k)}_j$ to $w_m^{(k-1)(k)}_j$ can be held in the holding portion HC of the circuit MC and the holding portion HCr of the circuit MCr that are included in each of the circuit MP[1,j] to the circuit MP[m,j]. For example, in the case where the first data $w_1^{(k-1)(k)}_j$ to $w_m^{(k-1)(k)}_j$ each be a positive value, a value corresponding to the positive value is input to the holding portion HC and a value corresponding to zero is input to the holding portion HCr. In contrast, in the case where the first data $w_1^{(k-1)(k)}_j$ to $w_m^{(k-1)(k)}_j$ each be a negative value, a value corresponding to zero is input to the holding portion HC and a value corresponding to the absolute value of the negative value is input to the holding portion HCr.

Next, the second data $z_1^{(k-1)}$ to $z_m^{(k-1)}$ are supplied to a wiring X1L[1] to a wiring X1L[m] and a wiring X2L[1] to a wiring X2L[m] by the circuit XLD. As a specific example, the second data $z_1^{(k-1)}$ is supplied to the wiring X1L[i] and the wiring X2L[i]. Note that the wiring X1L[i] and the wiring X2L[i] correspond to the wiring XLS[i] of the arithmetic circuit 140 illustrated in FIG. 7.

The conduction state between the circuit MC and the circuit MCr included in each of the circuit MP[1,j] to the circuit MP[m,j] and the wiring OL[j] and the wiring OLB[j] is determined in accordance with the second data $z_1^{(k-1)}$ to $z_m^{(k-1)}$ respectively input to the circuit MP[1,j] to the circuit MP[m,j]. As a specific example, in accordance with the second data $z_i^{(k-1)}$ the circuit MP[i,j] is in any one of a state where "electrical continuity is established between the circuit MC and the wiring OL[j] and electrical continuity is established between the circuit MCr and the wiring OLB[j]", a state where "electrical continuity is established between the circuit MC and the wiring OLB[j] and electrical continuity is established between the circuit MCr and the wiring OL[j]", and a state where "the circuit MC and the circuit MCr are each electrically disconnected to the wiring OL[j] and the wiring OLB[j]". For example, in the case where the second data $z_1^{(k-1)}$ is a positive value, a value with which a conduction state can be established between the circuit MC and the wiring OL[j] and a conduction state can be established between the circuit MCr and the wiring OLB[j] is input to the wiring X1L[1]. Then, a value with which a non-conduction state can be established between the circuit MC and the wiring OLB[j] and a non-conduction state can be established between the circuit MCr and the wiring OL[j] is input to the wiring X2L[1]. In the case where the second data $z_1^{(k-1)}$ is a negative value, a value with which a conduction state can be established between the circuit MC and the wiring OLB[j] and a conduction state can be established between the circuit MCr and the wiring OL[j] is input to the wiring X1L[1]. Then, a value with which a non-conduction state can be established between the circuit MC and the wiring OL[j] and a non-conduction state can be established between the circuit MCr and the wiring OLB[j] is input to the wiring X2L[1]. In the case where the second data $z_1^{(k-1)}$ is a value of zero, a value with which a non-conduction state can be established between the circuit MC and the wiring OLB[j] and a non-conduction state can be established between the circuit MCr and the wiring OL[j] is input to the wiring X1L[1]. Then, a value with which a non-conduction state can be established between the circuit MC and the wiring OL[j] and a non-conduction state can be established between the circuit MCr and the wiring OLB[j] is input to the wiring X2L[1].

A conduction state or a non-conduction state between the circuit MC and the circuit MCr that are included in the circuit MP[i,j] and the wiring OL[j] and the wiring OLB[j] is determined in accordance with the second data $z_i^{(k-1)}$ input to the circuit MP[i,j], whereby currents are input and output between the circuit MC and the circuit MCr and the wiring OL[j] and the wiring OLB[j]. Furthermore, the amount of the current is determined in accordance with the first data $w_i^{(k-1)(k)}_j$ and/or the second data $z_i^{(k-1)}$ set in the circuit MP[i,j].

For example, in the circuit MP[i,j], a current flowing from the wiring OL[j] to the circuit MC or the circuit MCr is I[i,j], and a current flowing from the wiring OLB[j] to the circuit MC or the circuit MCr is $I_B$[i,j]. When a current flowing from the circuit ACTF[j] to the wiring OL[j] is $I_{out}$[j] and a current flowing from the wiring OLB[j] to the circuit ACTF [j] is $I_{Bout}$[j], $I_{out}$[j] and $I_{Bout}$[j] can be expressed by the following formulae.

[Formula 5]

$$I_{out}[j] = \sum_{i=1}^{m} I[i, j] \quad (1.5)$$

$$I_{Bout}[j] = \sum_{i=1}^{m} I_B[i, j] \quad (1.6)$$

In the circuit MP[i,j], the circuit MC releases I(+1) and the circuit MCr releases I(−1) in the case where the first data $w_i^{(k-1)(k)}_j$ is "+1", the circuit MC releases I(−1) and the circuit MCr releases I(+1) in the case where the first data $w_i^{(k-1)(k)}_j$ is "−1", and the circuit MC releases I(−1) and the circuit MCr releases I(−1) in the case where the first data $w_i^{(k-1)(k)}_j$ is "0", for example.

Furthermore, the circuit MP[i,j] is in a state where "electrical continuity is established between the circuit MC and the wiring OL[j], electrical continuity is established between the circuit MCr and the wiring OLB[j], electrical continuity is broken between the circuit MC and the wiring OLB[j], and electrical continuity is broken between the circuit MCr and the wiring OL[j]" in the case where the second data $z_i^{(k-1)}$ is "+1"; the circuit MP[i,j] is in a state where "electrical continuity is established between the circuit MC and the wiring OLB[j], electrical continuity is established between the circuit MCr and the wiring OL[j], electrical continuity is broken between the circuit MC and the wiring OL[j], and electrical continuity is broken between the circuit MCr and the wiring OLB[j]" in the case where the second data $z_i^{(k-1)}$ is "−1"; and the circuit MP[i,j] is in a state where "electrical continuity is broken between the circuit MC and the wiring OL[j] and between the circuit MC and the wiring OLB[j], electrical continuity is broken between the circuit MCr and the wiring OL[j] and between the circuit MCr and the wiring OLB[j], and electrical continuity is broken between the circuit MCr and the wiring OL[j] and between the circuit MCr and OLB[j]" in the case where the second data $z_i^{(k-1)}$ is "0".

In this case, in the circuit MP[i,j], the current Hill flowing from the wiring OL[j] to the circuit MC or the circuit MCr and the current flowing from the wiring OLB[j] to the circuit MC or the circuit MCr are as shown in the following table. Note that depending on the case, the circuit MP[i,j] may be configured so that the amount of the current I(−1) is 0. Note that the current may be a current flowing from the circuit MC or the circuit MCr to the wiring OL[j]. Similarly, the current may be a current flowing from the circuit MC or the circuit MCr to the wiring OLB[j].

TABLE 1

| $w_i^{(k-1)(k)}{}_j$ | $z_i^{(k-1)}$ | I[i,j] | $I_B$[i,j] |
|---|---|---|---|
| 0 | +1 | I(−1) | I(−1) |
| +1 | +1 | I(+1) | I(−1) |
| −1 | +1 | I(−1) | I(+1) |
| 0 | −1 | I(−1) | I(−1) |
| +1 | −1 | I(−1) | I(+1) |
| −1 | −1 | I(+1) | I(−1) |
| 0 | 0 | 0 | 0 |
| +1 | 0 | 0 | 0 |
| −1 | 0 | 0 | 0 |

Then, $I_{out}$[j] and $I_{Bout}$[j] respectively flowing from the wiring OL[j] and the wiring OLB[j] are input to the circuit ACTF[j], and the circuit ACTF[j] compares $I_{out}$[j] and $I_{Bout}$[j], for example. On the basis of the comparison result, the circuit ACTF[j] outputs the signal $z_j^{(k)}$ to be transmitted from the neuron $N_j^{(k)}$ to a neuron in the (k+1)-th layer, for example.

The arithmetic circuit 140 in FIG. 13 can perform, for example, product-sum operation of the weight coefficients $w_1^{(k-1)(k)}{}_j$ to $w_m^{(k-1)(k)}{}_j$ and the signals $z_1^{(k-1)}$ to $z_m^{(k-1)}$ input from the neuron $N_1^{(k-1)}$ to the neuron $N_m^{(k-1)}$ to the neuron $N_j^{(k)}$ and arithmetic operation of an activation function using the result of the product-sum operation. Furthermore, a circuit comparable to the arithmetic circuit 140 in FIG. 7 can be formed by providing the circuits MP in n columns in the array portion ALP of the arithmetic circuit in FIG. 13. In other words, with the arithmetic circuit 140 in FIG. 7, the product-sum operation and the arithmetic operation of an activation function using the result of the product-sum operation can be performed in the neuron $N_1^{(k)}$ to the neuron $N_n^{(k)}$ concurrently.

Modification Example of Circuit or the Like Included in Arithmetic Circuit

The arithmetic circuit 110, the arithmetic circuit 120, the arithmetic circuit 130, the arithmetic circuit 140, the arithmetic circuit 150, and the arithmetic circuit 160 that are described above can each be changed into a circuit that performs not the arithmetic operation of Formula (1.2) but the arithmetic operation of Formula (1.3). Formula (1.3) corresponds to arithmetic operation in which a bias is applied to the product-sum result of Formula (1.2). Thus, a circuit for applying a bias value to the wiring OL and the wiring OLB may be provided in each of the arithmetic circuit 110, the arithmetic circuit 120, the arithmetic circuit 130, the arithmetic circuit 140, the arithmetic circuit 150, and the arithmetic circuit 160.

Figure 11:
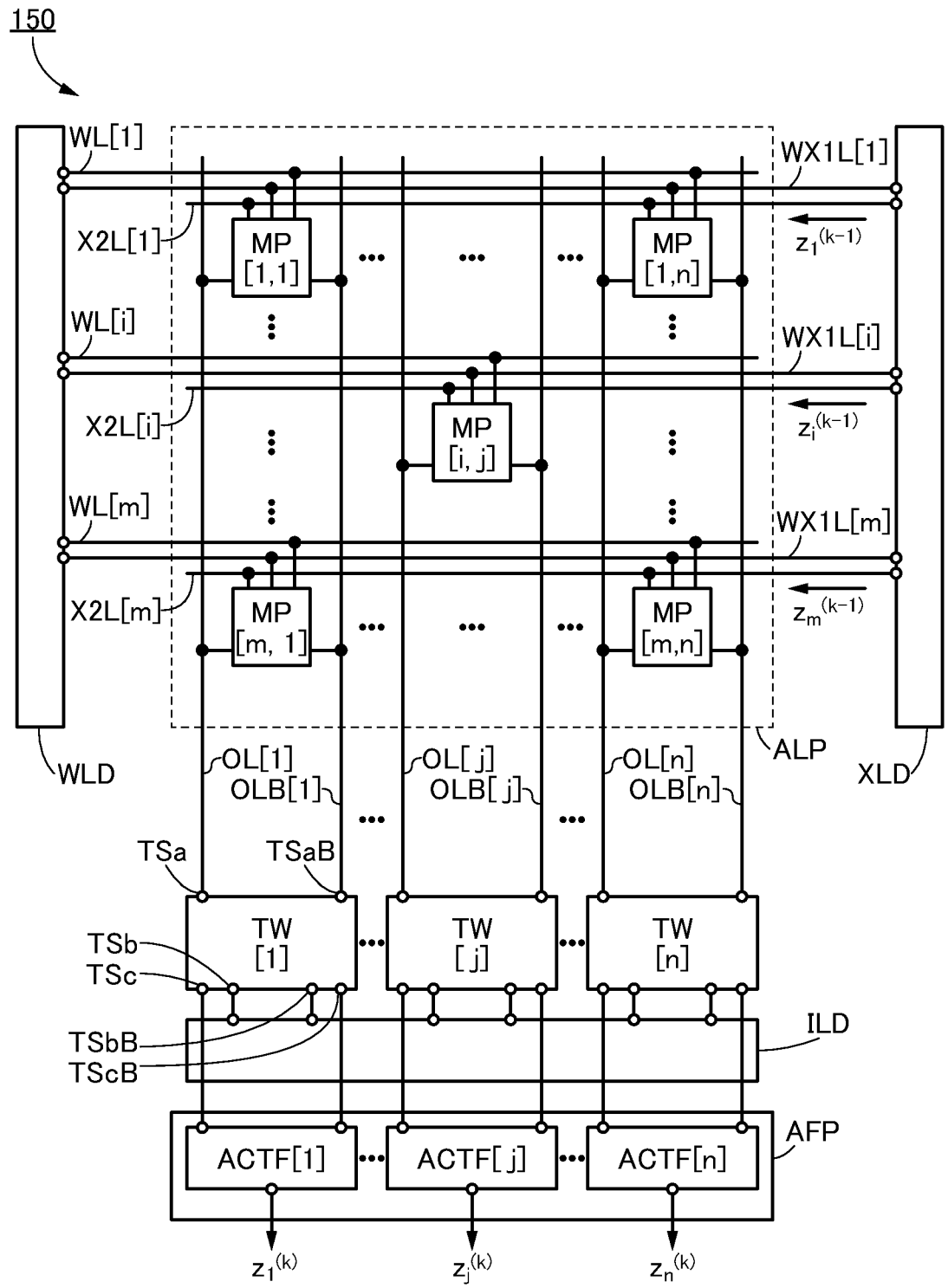
FIG. 11 is a circuit diagram showing a configuration example of a semiconductor device.
Figure 14:
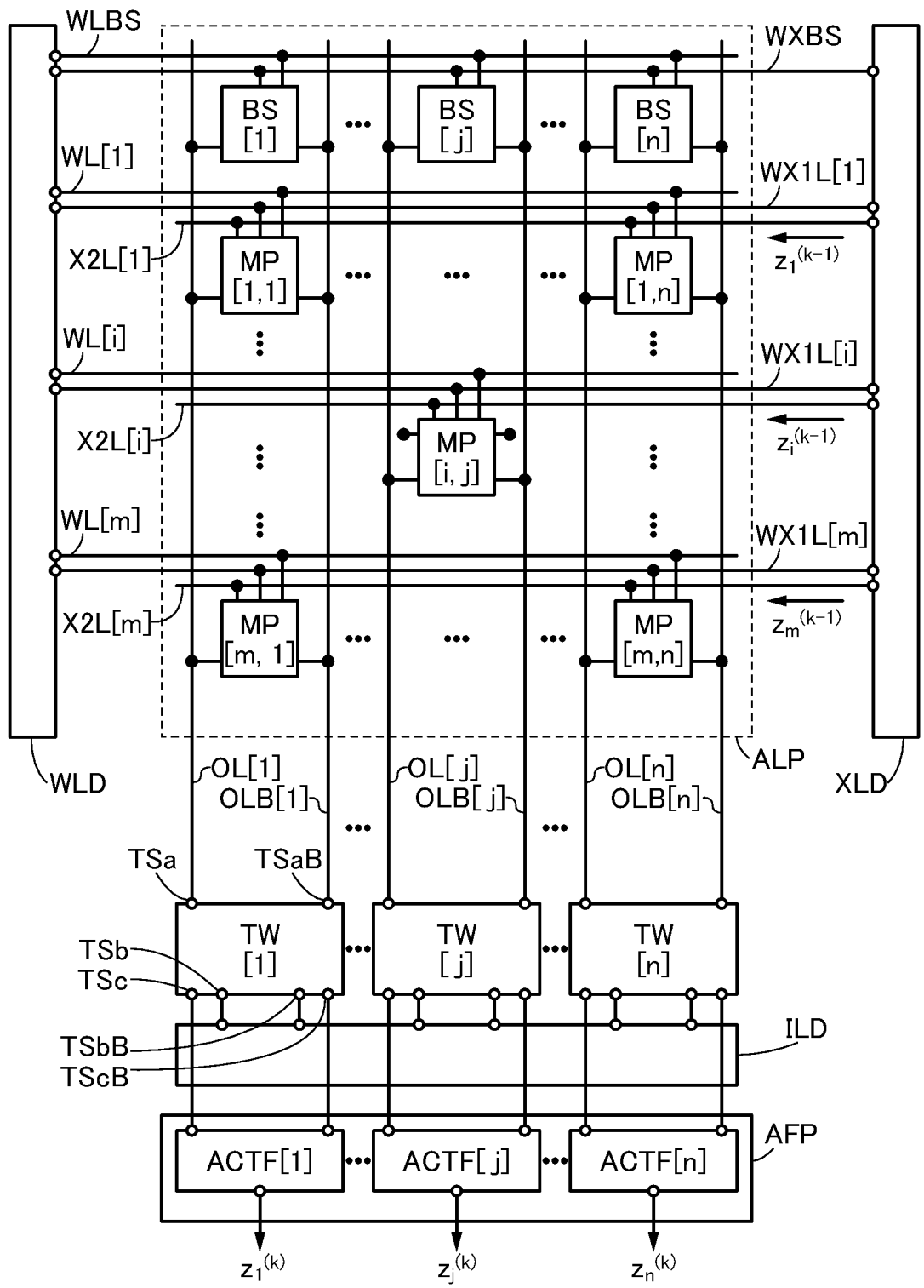
FIG. 14 is a circuit diagram showing a configuration example of a semiconductor device.

An arithmetic circuit 170 illustrated in FIG. 14 has a circuit configuration in which a circuit BS[1] to a circuit BS[n] are added to the array portion ALP of the arithmetic circuit 150 in FIG. 11.

The circuit BS[j] is electrically connected to the wiring OL[j], the wiring OLB[j], a wiring WLBS, and a wiring WXBS.

Like the wiring WLS[1] to the wiring WLS[m] of the arithmetic circuit 110 in FIG. 2, for example, and the wiring WL[1] to the wiring WL[m] of the arithmetic circuit 140 in FIG. 7, for example, the wiring WLBS functions as a wiring for supplying a signal that brings writing switching elements included in the circuit BS[1] to the circuit BS[n] into an on state or an off state. Thus, the signal can be supplied from the circuit WLD to the wiring WLBS when the wiring WLBS is electrically connected to the circuit WLD.

Like the wiring XLS[1] to the wiring XLS[m] of the arithmetic circuit 110 in FIG. 2, for example, the wiring WXBS functions as a wiring for supplying, to the circuit BS[1] to the circuit BS[n], information (e.g., a potential or a current value) corresponding to the second data $z_i^{(k-1)}$ output from the neuron $N_i^{(k-1)}$. Thus, the information can be supplied from the circuit XLD to the wiring WXBS when the wiring WXBS is electrically connected to the circuit XLD.

In addition, like the wiring WX1L[1] to the wiring WX1L[n] of the arithmetic circuit 140 in FIG. 7, for example, the wiring WXBS may also be used as a selection signal line for writing information to the circuit BS[1] to the circuit BS[n]. The arithmetic circuit 170 in FIG. 14 shows an example in which the wiring WXBS is electrically connected to the circuit WLD. In the case of such a configuration, the circuit WLD can supply, to each of the wiring WLBS and the wiring WXBS, a signal that brings the writing switching elements included in the circuit BS[1] to the circuit BS[n] into an on state or an off state.

In the j-th column of the array portion ALP of the arithmetic circuit 170, the amount of current flowing from the circuit MP[1,j] to the circuit MP[m,j] to the wiring OL[j] and the wiring OLB[j] can be expressed by Formula (1.5) and Formula (1.6). In addition, the wiring OL[j] and the wiring OLB[j] are each electrically connected to the circuit BS[j]; thus, when a current flowing from the circuit BS[j] to the wiring OL[j] is $I_{BIAS}$[j] and a current flowing from the circuit BS[j] to the wiring OLB[j] is $I_{BIASB}$[j], Formula (1.5) and Formula (1.6) can be rewritten as the following formulae.

[Formula 6]

$$I_{out}[j] = \sum_{i=1}^{m} I[i, j] + I_{BIAS}[j] \tag{1.7}$$

$$I_{Bout}[j] = \sum_{i=1}^{m} I_B[i, j] + I_{BIAS}[j] \tag{1.8}$$

Accordingly, $I_{out}$[j] and $I_{Bout}$[j] each including a bias can be generated as the arithmetic operation of Formula (1.3). In addition, when $I_{out}$[j] and $I_{Bout}$[j] each including a bias are input to the circuit ACTF[j], the biased output signal $z_j^{(k)}$ from the neuron $N_j^{(k)}$ can be generated.

Although the arithmetic circuit 170 in FIG. 14 has a configuration in which the circuit BS[1] to the circuit BS[n]

are provided for one row in the array portion ALP, one embodiment of the present invention is not limited thereto. For example, the circuit BS[1] to the circuit BS[n] may be provided for two or more rows in the array portion ALP.

Some or all of the transistors included in the above-described array portion ALP, circuit ILD, circuit WLD, circuit XLD, circuit AFP, circuit MP, switching circuit TW, and the like are preferably OS transistors, for example. For example, in the case of a transistor whose off-state current is desired to be low, specifically a transistor having a function of holding charge accumulated in a capacitor or the like, is preferably an OS transistor. In particular, in the case where an OS transistor is used as the transistor, the OS transistor preferably has a transistor structure described particularly in Embodiment 4. For a metal oxide included in a channel formation region of the OS transistor, one or more materials selected from indium, an element M (M is aluminum, gallium, yttrium, or tin), and zinc can be used, for example. In particular, a metal oxide containing indium, gallium, and zinc is an intrinsic (also referred to as i-type) or substantially intrinsic semiconductor that has a wide bandgap, and the carrier concentration of the metal oxide is preferably lower than or equal to $1\times10^{18}$ cm$^{-3}$, further preferably lower than $1\times10^{17}$ cm$^{-3}$, still further preferably lower than $1\times10^{16}$ cm$^{-3}$, yet further preferably lower than $1\times10^{13}$ cm$^{-3}$, yet still further preferably lower than $1\times10^{12}$ cm$^{-3}$. The off-state current per micrometer of channel width of the OS transistor including the metal oxide in the channel formation region can be lower than or equal to 10 aA ($1\times10^{-17}$ A), preferably lower than or equal to 1 aA ($1\times10^{-18}$ A), further preferably lower than or equal to 10 zA ($1\times10^{-20}$ A), still further preferably lower than or equal to 1 zA ($1\times10^{-21}$ A), yet further preferably lower than or equal to 100 yA ($1\times10^{-22}$ A). Since the carrier concentration of the metal oxide in the OS transistor is low, the off-state current remains low even when the temperature of the OS transistor is changed. For example, even when the temperature of the OS transistor is 150° C., the off-state current per micrometer of channel width can be 100 zA.

Note that one embodiment of the present invention is not limited to the above, and the transistors included in the array portion ALP, the circuit ILD, the circuit WLD, the circuit XLD, the circuit AFP, the circuit MP, the switching circuit TW, and the like are not necessarily OS transistors. Other than the OS transistor, a transistor containing silicon in a channel formation region (hereinafter, referred to as a Si transistor) may be used, for example. As silicon, single crystal silicon, hydrogenated amorphous silicon, microcrystalline silicon, or polycrystalline silicon can be used, for example. As transistors other than the OS transistor and the Si transistor, it is possible to use, for example, a transistor containing a semiconductor such as Ge in an active layer; a transistor containing a compound semiconductor such as ZnSe, CdS, GaAs, InP, GaN, or SiGe in an active layer; a transistor containing a carbon nanotube in an active layer; and a transistor containing an organic semiconductor in an active layer.

Note that for the metal oxides in the semiconductor layers of OS transistors, n-type semiconductors of a metal oxide containing indium (e.g., In oxide) and a metal oxide containing zinc (e.g., Zn oxide) have been manufactured but p-type semiconductors thereof are difficult to manufacture in terms of mobility and reliability in some cases. For that reason, in the arithmetic circuit 110, the arithmetic circuit 120, the arithmetic circuit 130, the arithmetic circuit 140, the arithmetic circuit 150, the arithmetic circuit 160, and the arithmetic circuit 170, OS transistors may be used as the n-channel transistors included in the array portion ALP, the circuit ILD, the circuit WLD, the circuit XLD, the circuit AFP, the circuit MP, and the like, and Si transistors may be used as the p-channel transistors.

Note that this embodiment can be combined with any of the other embodiments in this specification as appropriate.

Embodiment 2

This embodiment describes specific configuration examples of the circuit MP described in Embodiment 1.

Note that in Embodiment 1, [1,1], [i,j], [m,n], or the like which indicates a position in the array portion ALP is added to the reference sign of the circuit MP; however, in this embodiment, the addition of [1,1], [i,j], [m,n], or the like to the reference sign of the circuit MP is omitted unless otherwise specified.

Configuration Example 1

Figure 15A:
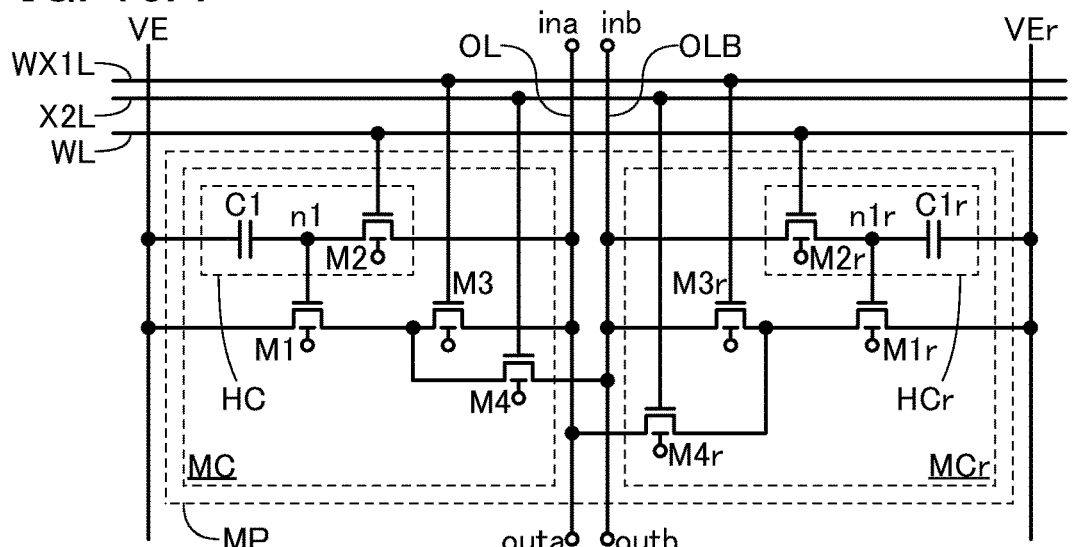
FIG. 15A, FIG. 15B, and FIG. 15C are circuit diagrams each showing a configuration example of a circuit included in a semiconductor device.

First, an example of a circuit configuration that can be applied to the circuit MP in FIG. 9B is described. The circuit MP illustrated in FIG. 15A is an example of the configuration of the circuit MP in FIG. 9B, and the circuit MC included in the circuit MP in FIG. 15A includes the transistor M1 to a transistor M4 and a capacitor C1, for example. Note that, for example, the holding portion HC includes the transistor M2 and the capacitor C1.

In the circuit MP in FIG. 9B, the circuit MCr has substantially the same circuit configuration as the circuit MC. Thus, "r" is added to the reference signs of the circuit elements and the like included in the circuit MCr to differentiate them from the circuit elements and the like included in the circuit MC.

Figure 15B:
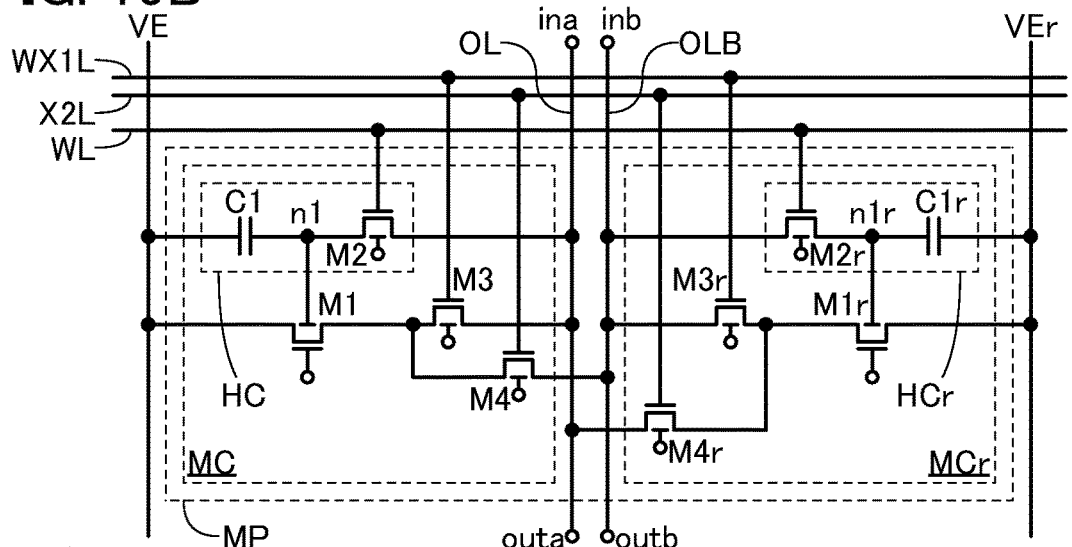

The transistor M1 to the transistor M4 illustrated in FIG. 15A are each an n-channel transistor having a multi-gate structure including gates over and under a channel, and the transistor M1 to the transistor M4 each include a first gate and a second gate. In particular, the sizes of the transistor M3 and the transistor M4 are preferably equal to each other, for example. Note that in this specification and the like, for convenience, the first gate is referred to as a gate (referred to as a front gate in some cases) and the second gate is referred to as a back gate so that they are distinguished from each other; however, the first gate and the second gate can be replaced with each other. Therefore, in this specification and the like, the term "gate" can be replaced with the term "back gate". Similarly, the term "back gate" can be replaced with the term "gate". As a specific example, a connection configuration in which "a gate is electrically connected to a first wiring and a back gate is electrically connected to a second wiring" can be replaced with a connection configuration in which "a back gate is electrically connected to a first wiring and a gate is electrically connected to a second wiring". For example, as illustrated in FIG. 15B, a configuration may be employed in which the back gate of the transistor M1 is electrically connected to a first terminal of the capacitor C1 and a first terminal of the transistor M2.

The semiconductor device of one embodiment of the present invention does not depend on the connection configuration of a back gate of a transistor. In the transistor M1 to the transistor M4 illustrated in FIG. 15A, the back gate is illustrated and the connection configuration of the back gate is not illustrated; however, a target to which the back gate is electrically connected can be determined at the design stage. For example, in a transistor including a back gate, a gate and the back gate may be electrically connected to each other to increase the on-state current of the transistor. In other words, the gate and the back gate of the transistor M2 may be electrically connected to each other, for example. Alternatively, for example, in a transistor including a back gate, a wiring electrically connected to an external circuit or the like may be provided and a potential may be supplied to the back gate of the transistor by the external circuit or the like to change the threshold voltage of the transistor or to reduce the off-state current of the transistor. Note that the same applies to a transistor described in other parts of the specification and a transistor illustrated in other drawings, not only to that in FIG. 15A.

Figure 15C:
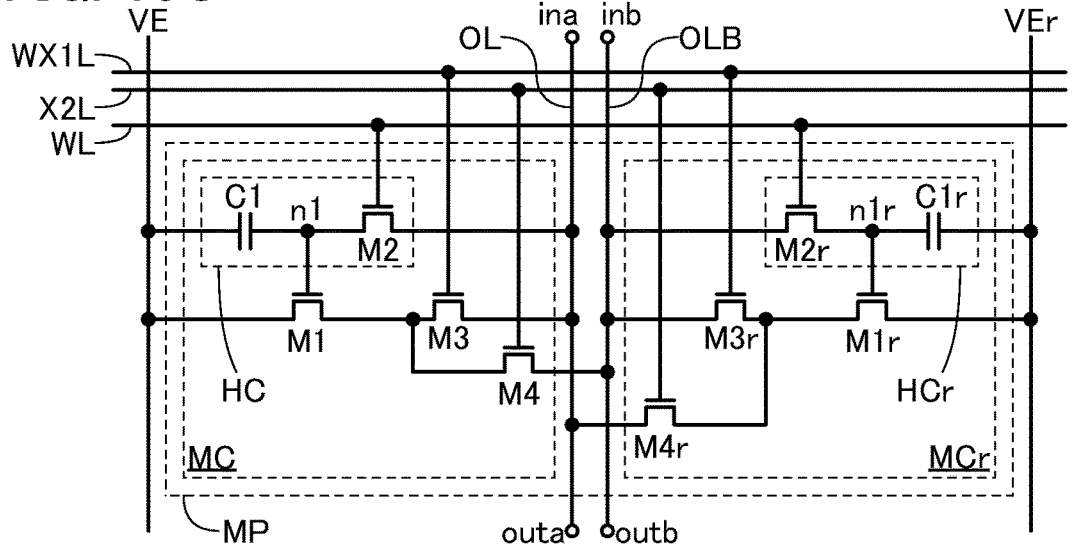

The semiconductor device of one embodiment of the present invention does not depend on the structure of a transistor included in the semiconductor device. For example, the transistor M1 to the transistor M4 illustrated in FIG. 15A may be a transistor having a structure not including a back gate, that is, a single-gate structure as illustrated in FIG. 15C. It is also possible that some transistors have a structure including a back gate and the other transistors have a structure not including a back gate. Note that the same applies to a transistor described in other parts of the specification and a transistor illustrated in other drawings, not only to that in the circuit diagram illustrated in FIG. 15A.

In this specification and the like, for example, transistors with a variety of structures can be used as a transistor. Thus, there is no limitation on the type of transistors used. Examples of the transistor include a transistor including single crystal silicon and a transistor including a non-single-crystal semiconductor film typified by amorphous silicon, polycrystalline silicon, microcrystalline (also referred to as microcrystal, nanocrystal, or semi-amorphous) silicon, or the like. Alternatively, a thin film transistor (TFT) including a thin film of any of these semiconductors can be used, for example. The use of the TFT has various advantages. For example, since the TFT can be manufactured at a lower temperature than the case of using single crystal silicon, manufacturing costs can be reduced or a larger manufacturing apparatus can be used. Since a larger manufacturing apparatus can be used, TFTs can be manufactured over a large substrate. This enables a large number of display devices to be manufactured at a time, resulting in low cost manufacturing. Alternatively, a low manufacturing temperature allows the use of a low heat-resistance substrate. Thus, transistors can be manufactured over a light-transmitting substrate. Alternatively, transmission of light in a display element can be controlled using the transistor over a light-transmitting substrate. Alternatively, some of the films included in the transistor can transmit light because the transistor is thin. Accordingly, the aperture ratio can be improved.

For example, a transistor including a compound semiconductor (e.g., SiGe or GaAs) or an oxide semiconductor (e.g., Zn—O, In—Ga—Zn—O, In—Zn—O, In—Sn—O (ITO), Sn—O, Ti—O, Al—Zn—Sn—O (AZTO), or In—Sn—Zn—O) can be used. Alternatively, a thin film transistor including a thin film of such a compound semiconductor or oxide semiconductor can be used. Accordingly, manufacturing temperature can be lowered and, for example, such a transistor can be manufactured at room temperature. As a result, the transistor can be formed directly on a substrate having low heat resistance, such as a plastic substrate or a film substrate. Note that such a compound semiconductor or oxide semiconductor can be used not only for a channel portion of the transistor but also for other applications. For example, such a compound semiconductor or oxide semiconductor can be used for a wiring, a resistor, a pixel electrode, or a light-transmitting electrode. Since such components can be deposited or formed at the same time as the transistor, the cost can be reduced.

As another example, a transistor formed by an inkjet method or a printing method can be used. The transistor can be manufactured at room temperature, manufactured at a low vacuum degree, or manufactured over a large substrate. Accordingly, the transistor can be manufactured without using a mask (reticle), so that the layout of the transistor can be easily changed. Alternatively, since the transistor can be manufactured without using a resist, the material cost is reduced, and the number of steps can be reduced. Alternatively, since a film can be formed only where needed, a material is not wasted as compared with a manufacturing method by which etching is performed after the film is formed over the entire surface; thus, the cost can be reduced.

As another example, a transistor containing an organic semiconductor or a carbon nanotube can be used. Thus, a transistor can be formed over a bendable substrate. A device using a transistor containing an organic semiconductor or a carbon nanotube can be highly resistant to impact.

Note that a transistor with any of a variety of other structures can also be used. For example, a MOS transistor, a junction transistor, a bipolar transistor, or the like can be used as the transistor. By using a MOS transistor as the transistor, the size of the transistor can be reduced. Thus, a large number of transistors can be mounted. By using a bipolar transistor as the transistor, a large amount of current can flow therethrough. Thus, a circuit can operate at high speed. Note that a MOS transistor and a bipolar transistor may be formed over one substrate. Thus, a reduction in power consumption, a reduction in size, high-speed operation, and the like can be achieved.

As another example, it is possible to use a transistor having a structure where gate electrodes are positioned above and below an active layer. With the structure where the gate electrodes are positioned above and below the active layer, a circuit configuration is such that a plurality of transistors are connected in parallel. Thus, a channel formation region is increased, so that the amount of current can be increased. Alternatively, with the structure where the gate electrodes are positioned above and below the active layer, a depletion layer can be easily formed, so that subthreshold swing can be improved.

As another example, it is possible to use a transistor having a structure where a gate electrode is positioned above an active layer, a structure where a gate electrode is positioned below an active layer, a staggered structure, an inverted staggered structure, a structure where a channel region is divided into a plurality of regions, a structure where active layers are connected in parallel, a structure where active layers are connected in series, or the like. Alternatively, a transistor can have a variety of structures such as a planar type, a FIN-type, a TRI-GATE type, a top-gate type, a bottom-gate type, and a double-gate type (with gates placed above and below a channel).

As another example, it is possible to use a transistor having a structure where a source electrode or a drain electrode overlaps with an active layer (or part thereof). Employing the structure where the source electrode or the drain electrode overlaps with the active layer (or part thereof) can prevent unstable operation due to charge accumulation in part of the active layer.

As another example, it is possible to use a transistor having a structure where an LDD region is provided. By providing the LDD region, it is possible to achieve a reduction in off-state current or an increase in withstand voltage (an improvement in reliability) of the transistor. Alternatively, by providing the LDD region, in the case of operation in a saturation region, the drain current does not change much even if the drain-source voltage changes, and thus the voltage-current characteristics having a flat slope can be obtained.

In this specification and the like, a transistor can be formed using a variety of substrates, for example. The type of the substrate is not limited to a certain type. Examples of the substrate include a semiconductor substrate (e.g., a single crystal substrate or a silicon substrate), an SOI substrate, a glass substrate, a quartz substrate, a plastic substrate, a sapphire glass substrate, a metal substrate, a stainless steel substrate, a substrate including stainless steel foil, a tungsten substrate, a substrate including tungsten foil, a flexible substrate, an attachment film, paper including a fibrous material, and a base material film. Examples of the glass substrate include barium borosilicate glass, aluminoborosilicate glass, and soda lime glass. As examples of the flexible substrate, the attachment film, the base material film, and the like, the following can be given. Examples include plastics typified by polyethylene terephthalate (PET), polyethylene naphthalate (PEN), polyether sulfone (PES), and polytetrafluoroethylene (PTFE). Another example is a synthetic resin such as acrylic. Other examples are polypropylene, polyester, polyvinyl fluoride, and polyvinyl chloride. Other examples are polyamide, polyimide, aramid, an epoxy resin, an inorganic vapor deposition film, and paper. In particular, the use of a semiconductor substrate, a single crystal substrate, an SOI substrate, or the like enables the manufacture of small-sized transistors with a small variations in characteristics, size, shape, or the like and with high current capability. When a circuit is formed with such transistors, lower power consumption of the circuit or higher integration of the circuit can be achieved.

Alternatively, a flexible substrate may be used as the substrate, and the transistor may be directly formed over the flexible substrate. Alternatively, a separation layer may be provided between the substrate and the transistor. After part or the whole of a semiconductor device is completed over the separation layer, the separation layer can be used for separation from the substrate and transfer to another substrate. In that case, the transistor can be transferred to even a substrate having low heat resistance or a flexible substrate. As the separation layer, a stacked-layer structure of inorganic films of a tungsten film and a silicon oxide film, or a structure in which an organic resin film of polyimide or the like is formed over a substrate can be used, for example.

In other words, the transistor may be formed using one substrate and then transferred to another substrate; thus, the transistor may be positioned over another substrate. Examples of the substrate to which the transistor is transferred include, in addition to the above-described substrates over which the transistor can be formed, a paper substrate, a cellophane substrate, an aramid film substrate, a polyimide film substrate, a stone substrate, a wood substrate, a cloth substrate (including a natural fiber (silk, cotton, or hemp), a synthetic fiber (nylon, polyurethane, or polyester), a regenerated fiber (acetate, cupro, rayon, or regenerated polyester), or the like), a leather substrate, and a rubber substrate. When such a substrate is used, forming a transistor with excellent characteristics, forming a transistor with low power consumption, manufacturing a device with high durability, providing high heat resistance, reducing weight, or reducing thickness can be achieved.

Note that all the circuits necessary to achieve a predetermined function can be formed over one substrate (e.g., a glass substrate, a plastic substrate, a single crystal substrate, or an SOI substrate). In this manner, the cost can be reduced by a reduction in the number of components or the reliability can be improved by a reduction in the number of connection points to circuit components.

Note that a structure is possible in which not all the circuits necessary to achieve a predetermined function are formed over one substrate. That is, it is possible to form part of the circuits necessary to achieve the predetermined function over a given substrate and form the other part of the circuits necessary to achieve the predetermined function over another substrate. For example, part of the circuits necessary to achieve the predetermined function can be formed over a glass substrate, and the other part of the circuits necessary to achieve the predetermined function can be formed over a single crystal substrate (or an SOI substrate). The single crystal substrate where the other part of the circuits necessary to achieve the predetermined function (also referred to as an IC chip) can be connected to the glass substrate by COG (Chip On Glass), and the IC chip can be provided over the glass substrate. Alternatively, the IC chip can be connected to the glass substrate by TAB (Tape Automated Bonding), COF (Chip On Film), or SMT (Surface Mount Technology), or using a printed circuit board, for example. When part of the circuits is formed over the same substrate as a pixel portion in this manner, the cost can be reduced by a reduction in the number of components or the reliability can be improved by a reduction in the number of connection points to circuit components. In particular, a circuit in a portion where the driving voltage is high, a circuit in a portion where the driving frequency is high, or the like consumes much power in many cases. In view of this, such a circuit is formed over a substrate (e.g., a single crystal substrate) different from a substrate where a pixel portion is formed, whereby an IC chip is formed. The use of this IC chip can prevent the increase in power consumption.

In the circuit MP in FIG. 15A, a first terminal of the transistor M1 is electrically connected to the wiring VE. A second terminal of the transistor M1 is electrically connected to a first terminal of the transistor M3 and a first terminal of the transistor M4. A gate of the transistor M1 is electrically connected to the first terminal of the capacitor C1 and the first terminal of the transistor M2. A second terminal of the capacitor C1 is electrically connected to the wiring VE. The second terminal of the transistor M2 is electrically connected to the wiring OL. A gate of the transistor M2 is electrically connected to the wiring WL. A second terminal of the transistor M3 is electrically connected to the wiring OL and a gate of the transistor M3 is electrically connected to the wiring WX1L. A second terminal of the transistor M4 is electrically connected to the wiring OLB and a gate of the transistor M4 is electrically connected to the wiring X2L.

The connection configuration of the circuit MCr different from that of the circuit MC is described. A second terminal of a transistor M3r is electrically connected to not the wiring OL but the wiring OLB, and a second terminal of a transistor M4r is electrically connected to not the wiring OLB but the wiring OL. A first terminal of a transistor M1r and a first terminal of a capacitor C1r are electrically connected to the wiring VEr.

Figure 16A:
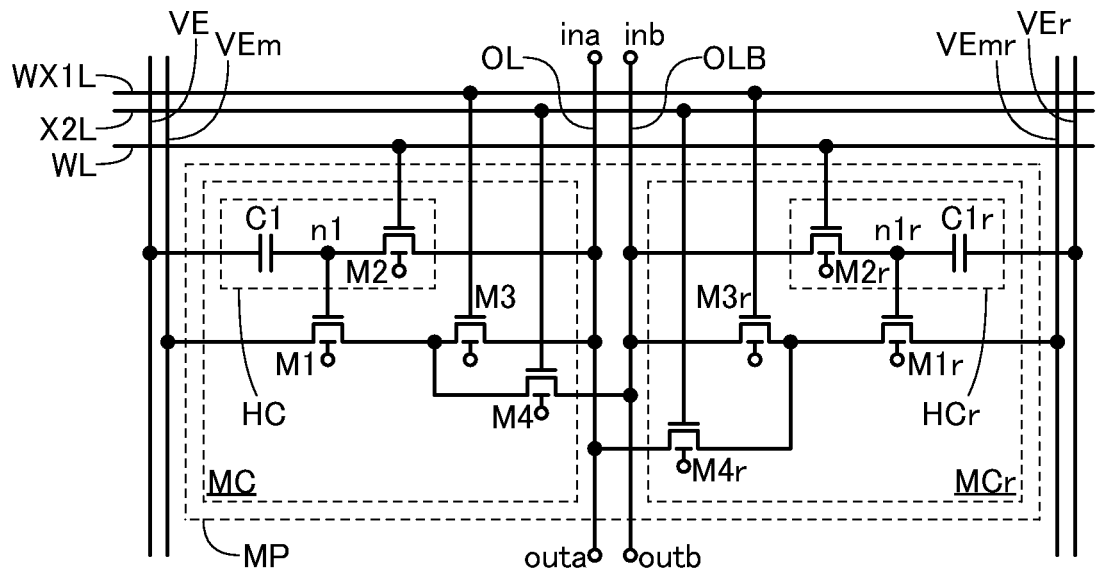
FIG. 16A and FIG. 16B are circuit diagrams each showing a configuration example of a circuit included in a semiconductor device.

Note that as illustrated in FIG. 16A, the first terminal of the transistor M1 may be electrically connected to not the wiring VE but another wiring VLm. Similarly, the first terminal of the transistor M1r may be electrically connected to not the wiring VEr but another wiring VEmr. Note that the first terminal of the transistor M1 may be electrically connected to not the wiring VE but another wiring VEm, and/or the first terminal of the transistor M1r may be electrically connected to not the wiring VEr but another wiring VEmr, not only in FIG. 15A but also in a circuit diagram in another drawing.

Note that in the holding portion HC illustrated in FIG. 15A, an electrical connection point of the gate of the transistor M1, the first terminal of the capacitor C1, and the first terminal of the transistor M2 is a node n1.

As described in Embodiment 1, the holding portion HC has a function of holding a potential corresponding to the first data, for example. The potential is held in the holding portion HC included in the circuit MC in FIG. 15A in the following manner: when the transistor M2 and the transistor M3 are brought into an on state, the potential is input from the wiring OL to be written to the capacitor C1, and then the transistor M2 is brought into an off state. Thus, the potential of the node n1 can be held as the potential corresponding to the first data. At this time, a current is input from the wiring OL and a potential having a level corresponding to the amount of the current can be held in the capacitor C1. Thus, the influence of variations in current characteristics of the transistor M1 can be reduced.

As the transistor M1, a transistor with a low off-state current is preferably used for a long-term holding of the potential of the node n1. As the transistor with a low off-state current, an OS transistor can be used, for example. Alternatively, a transistor including a back gate may be used as the transistor M1, and an off-state current may be reduced by applying a low-level potential to the back gate to shift the threshold voltage to the positive side.

In order to simply describe a current input to or output from the circuit MP in an operation example described below, ends of the wiring OL illustrated in FIG. 15A are referred to as a node ina and a node outa and ends of the wiring OLB are referred to as a node inb and a node outb.

The wiring VE functions as a wiring for supplying a constant voltage, for example. In the case where the transistor M3, the transistor M3r, the transistor M4, or the transistor M4r is an n-channel transistor, and/or in the case where a potential supplied from the wiring VSO is a high-level potential in FIG. 8, the constant voltage can be VSS that is a low-level potential, a ground potential, or a low-level potential other than those, for example. In addition, the wiring VEm, the wiring VEr, and the wiring VLmr each function as a voltage line for supplying a constant voltage like the wiring VE, and the constant voltage can be VSS that is a low-level potential, a low-level potential other than VSS, a ground potential, or the like. Alternatively, the constant voltage may be VDD that is a high-level potential. Here, in the case where any of FIG. 5A to FIG. 5E, FIG. 6A to FIG. 6D, and FIG. 6F is employed for the circuit ACTF[1] to the circuit ACTF[n] of each of the arithmetic circuit 110, the arithmetic circuit 120, the arithmetic circuit 130, the arithmetic circuit 140, the arithmetic circuit 150, and the arithmetic circuit 160, a constant voltage supplied from the wiring VAL electrically connected to the circuit ACTF[1] to the circuit ACTF[n] is preferably a potential higher than the potential VDD supplied from the wiring VE and the wiring VEr.

Figure 16B:
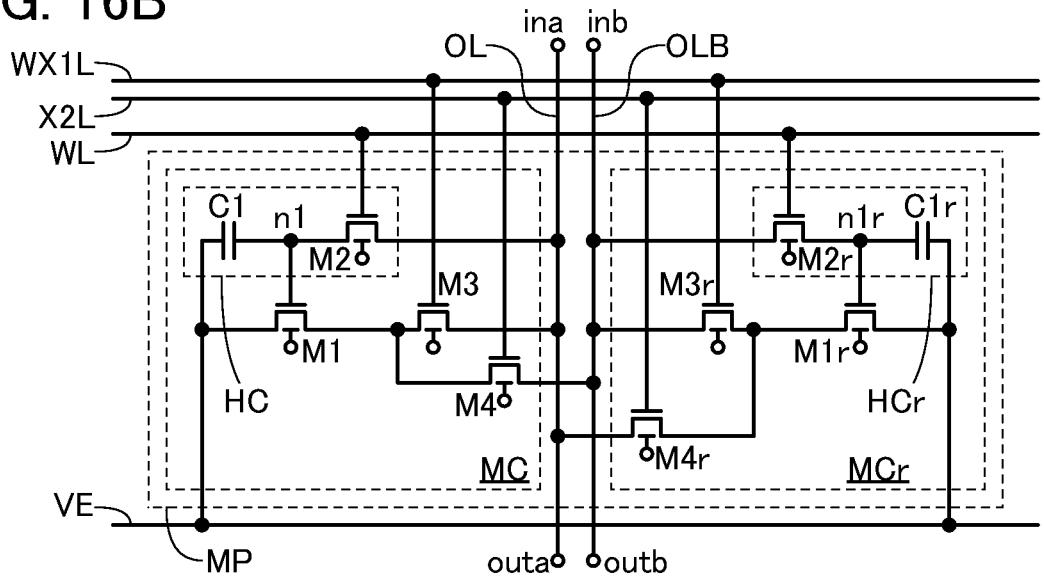

The constant voltages supplied from the wiring VE, the wiring VEm, the wiring VEr, and the wiring VEmr may be different from each other, or some or all of them may be the same. In the case where the constant voltages supplied from the wirings are the same, the wirings can be selected and combined into one wiring. For example, in the case where the constant voltages supplied from the wiring VE, the wiring VEm, the wiring VEr, and the wiring VEmr are almost equal to each other, the wiring VEm, the wiring VEr, and the wiring VEmr can be combined with the wiring VE, as in the circuit MP in FIG. 16B. Alternatively, for example, in the case where the constant voltages supplied from the wiring VL and the wiring VLr are almost equal to each other, the wiring VL and the wiring VLr can be combined into one wiring. Alternatively, for example, in the case where the constant voltages supplied from the wiring VLs and the wiring VLsr are almost equal to each other, the wiring VLs and the wiring VLsr can be combined into one wiring. Similarly, also in FIG. 16A, the wiring VL and the wiring VLr can be combined into one wiring and the wiring VLm and the wiring VLmr can be combined into one wiring. Alternatively, for example, the wiring VL and the wiring VLmr can be combined into one wiring and the wiring VLm and the wiring VLr can be combined into one wiring.

Figure 17A:
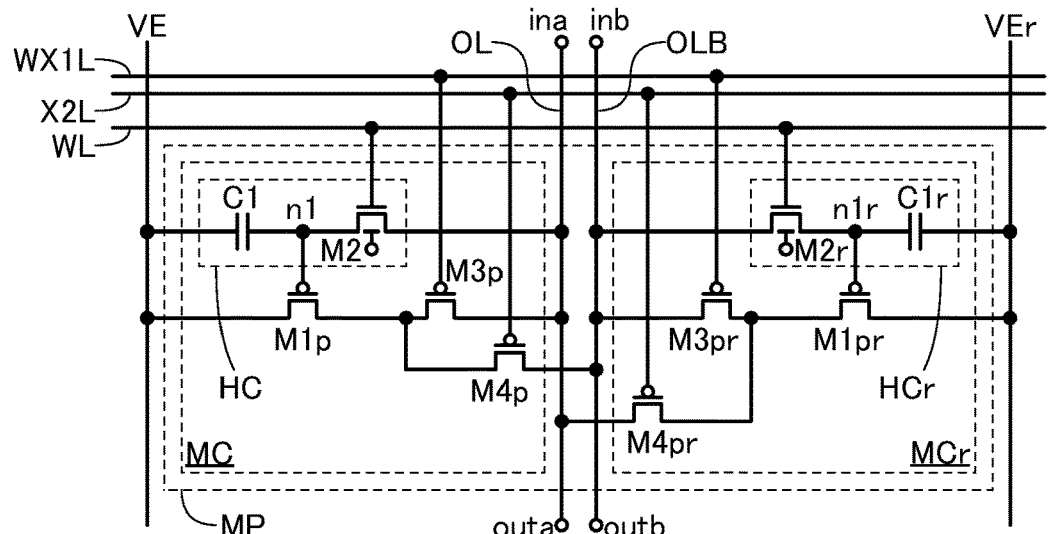
FIG. 17A, FIG. 17B, and FIG. 17C are circuit diagrams each showing a configuration example of a circuit included in a semiconductor device.

The configuration of the circuit MP in FIG. 15A can be changed according to circumstances. For example, as illustrated in FIG. 17A, the transistor M1, the transistor M1r, the transistor M3, the transistor M3r, the transistor M4, and the transistor M4r of the circuit MP in FIG. 15A are respectively replaced with a transistor M1p, a transistor M1pr, a transistor M3p, a transistor M3pr, a transistor M4p, and a transistor M4pr, which are p-channel transistors. As the transistor M3p, the transistor M3pr, the transistor M4p, and the transistor M4pr, p-channel transistors having an SOI (Silicon On Insulator) structure can be used, for example. In this case, the constant voltages supplied from the wiring VE and the wiring VEr are each preferably VDD that is a high-level potential. As well as this case, in the case where any of FIG. 5A to FIG. 5E, FIG. 6A to FIG. 6D, and FIG. 6F is employed for the circuit ACTF[1] to the circuit ACTF[n] of each of the arithmetic circuit 110, the arithmetic circuit 120, the arithmetic circuit 130, the arithmetic circuit 140, the arithmetic circuit 150, and the arithmetic circuit 160, the constant voltage supplied from the wiring VAL electrically connected to the circuit ACTF[1] to the circuit ACTF[n] is preferably a ground potential or VSS. When the potential of the wiring is changed as described above, the direction in which a current flows is also changed.

Similarly, the transistor M2 may also be replaced with a p-channel transistor.

Figure 17B:
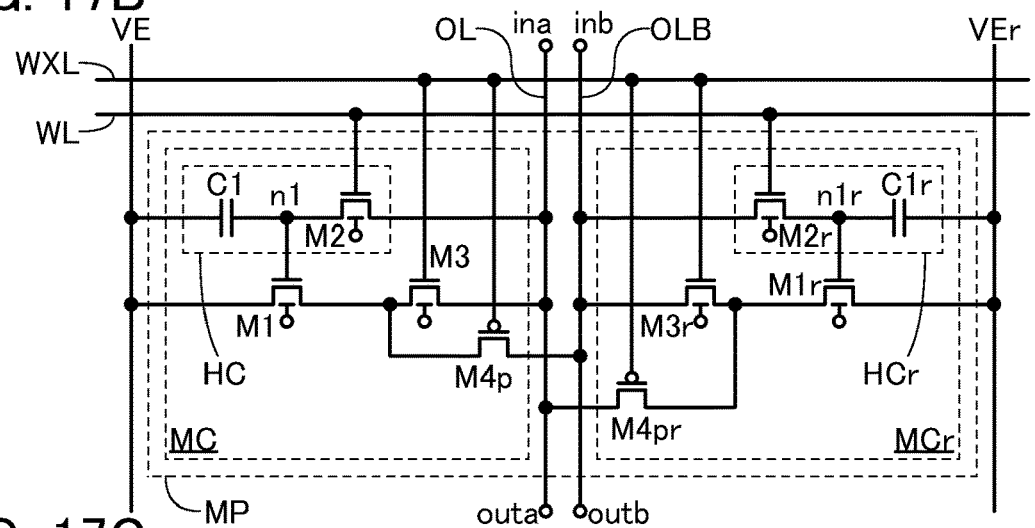

Alternatively, as illustrated in FIG. 17B, the transistors M4 and M4r of the circuit MP in FIG. 15A may be replaced with the transistors M4p and M4pr, which are p-channel transistors, for example. In addition, by combining the wirings connected to the gates of the transistor M3, the transistor M3r, the transistor M4p, and the transistor M4pr into one wiring WXL, the circuit MP can hold the first data (e.g., a weight coefficient) other than 0.

Figure 17C:
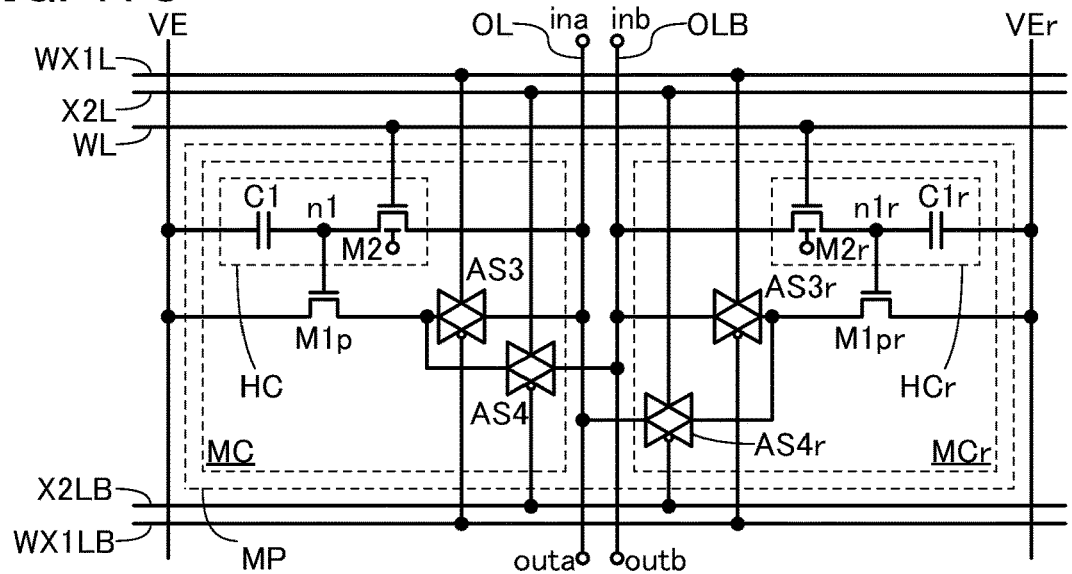

Alternatively, as illustrated in FIG. 17C, the transistor M3, the transistor M3r, the transistor M4, and the transistor M4r of the circuit MP in FIG. 15A may be replaced with an analog switch AS3, an analog switch AS4, an analog switch AS3r, and an analog switch AS4r, for example. Note that FIG. 17C also illustrates a wiring WX1LB and a wiring X2LB for driving the analog switch AS3, the analog switch AS4, the analog switch AS3r, and the analog switch AS4r. The wiring WX1LB is electrically connected to the analog switch AS3 and the analog switch AS3r, and the wiring X2LB is electrically connected to the analog switch AS4 and the analog switch AS4r. An inverted signal of a signal input to the wiring WX1L is input to the wiring WX1LB, and an inverted signal of a signal input to the wiring X2L is input to the wiring X2LB. The wiring WX1L and the wiring X2L may be combined into one wiring, and the wiring WX1LB and the wiring X2LB may be combined into one wiring (not illustrated). Note that for example, a CMOS structure in which an n-channel transistor and a p-channel transistor are used may be employed for the analog switch AS3, the analog switch AS4, the analog switch AS3r, and the analog switch AS4r.

Furthermore, it is preferable that the sizes, e.g., the channel lengths and the channel widths, of the transistor M3, the transistor M3r, the transistor M4, and the transistor M4r illustrated in FIG. 15A to FIG. 15C and FIG. 16A to FIG. 16C be equal to each other. Such a circuit configuration might enable efficient layout. In addition, currents flowing through the transistor M3, the transistor M3r, the transistor M4, and the transistor M4r can possibly be equal to each other. Similarly, it is preferable that the sizes of the transistor M1 and the transistor M1r illustrated in FIG. 15A to FIG. 15C and FIG. 16A to FIG. 16C be equal to each other. Similarly, it is preferable that the sizes of the transistor M2 and the transistor M2r illustrated in FIG. 15A to FIG. 15C and FIG. 16A to FIG. 16C be equal to each other. Similarly, it is preferable that the sizes of the transistor M1p and the transistor M1pr illustrated in FIG. 16C be equal to each other. Similarly, it is preferable that the sizes of the transistor M3p, the transistor M3pr, the transistor M4p, and the transistor M4pr illustrated in FIG. 16C be equal to each other.

Operation Example

Next, operation examples of the circuit MP illustrated in FIG. 15A are described. FIG. 18 to FIG. 20 are timing charts showing operation examples of the circuit MP, and each show changes in the potentials of the wiring WL, the wiring WX1L, the wiring X2L, the node n1, and a node n1r. Note that in FIG. 18 to FIG. 20, high denotes a high-level potential and low denotes a low-level potential. In this operation example, the amount of current output from the wiring OL to the node outa (or from the node outa to the wiring OL) is denoted by $I_{OL}$. In addition, the amount of current output from the wiring OLB to the node outb (or from the node outb to the wiring OLB) is denoted by $I_{OLB}$. In the timing charts shown in FIG. 18 to FIG. 20, the amounts of changes in $I_{OL}$ and $I_{OLB}$ are also shown.

In this operation example, the constant voltages supplied from the wiring VE, the wiring VEm, the wiring VEr, and the wiring VEmr are each VSS (a low-level potential). In this case, in FIG. 8, a high-level potential is supplied to the wiring VSO and a current flows from the wiring VSO to the wiring VE or the wiring VEr through the switching circuit TW and the wiring OL. Similarly, a current flows from the wiring VSO to the wiring VE or the wiring VEr through the switching circuit TW and the wiring OLB.

In this operation example, a potential supplied from the wiring VCN in FIG. 8 is VSS. When a conduction state is established between the wiring VCN and the second terminal of the transistor M1, VSS is supplied to the second terminal of the transistor M1. The potential of the gate of the transistor M1 also becomes VSS at this time, and accordingly the transistor M1 is brought into an off state, which will be described later. Similarly, the potentials of a second terminal and a gate of the transistor M1r become VSS when a conduction state is established between the wiring VCN and the second terminal of the transistor M1r, and accordingly the transistor M1r is brought into an off state.

In the circuit MP illustrated in FIG. 15A, the transistor M1 has a diode-connected configuration when the transistor M2 and the transistor M3 are in an on state. Thus, when a current flows from the wiring OL to circuit MC, the potentials of the second terminal of the transistor M1 and the gate of the transistor M1 become almost equal to each other. The potentials are determined in accordance with the amount of current flowing from the wiring OL to the circuit MC, the potential (VSS here) of the first terminal of the transistor M1, and the like. Here, when the potential of the gate of the transistor M1 is held in the capacitor C1 and then the transistor M2 is brought into an off state, the transistor M1 functions as a current source that supplies a current corresponding to the potential of the gate of the transistor M1. Thus, the influence of variations in current characteristics of the transistor M1 can be reduced.

When a current amount of $I_1$ is supplied from the wiring OL to the wiring VE through the circuit MC while the transistor M2 and the transistor M3 are in an off state, the potential of the gate of the transistor M1 (the node n1) is $V_1$. Here, the transistor M2 is brought into an off state, so that $V_1$ is held in the holding portion HC. Accordingly, the transistor M1 can make $I_1$, which is a current corresponding to the potential VSS of the first terminal of the transistor M1 and the potential $V_1$ of the gate of the transistor M1, flow between a source and a drain of the transistor M1. In this specification and the like, such an operation is expressed as "the transistor M1 is set such that the current amount of $I_1$ is supplied between the source and the drain of the transistor M1", or "the transistor M1 is programmed such that the current amount of $I_1$ is supplied between the source and the drain of the transistor M1".

In this operation example, there are three levels of current amount supplied from the wiring OL to the circuit MC: 0, $I_1$, and $I_2$. Thus, the three levels of current amount, 0, $I_1$, and $I_2$, are set in the transistor M1. For example, when the potential of the gate of the transistor M1 held in the holding portion HC is VSS, the potentials of the first terminal and the second terminal of the transistor M1 are each VSS, and thus the transistor M1 is brought into an off state when the threshold voltage of the transistor M1 is higher than 0. In this case, a current does not flow between the source and the drain of the transistor M1, which can be regarded that the amount of current flowing between the source and the drain of the transistor M1 is set to 0. As another example, when the potential of the gate of the transistor M1 held in the holding portion HC is $V_1$ and the threshold voltage of the transistor M1 is lower than $V_1$–VSS, the transistor M1 is brought into an on state. Here, the amount of current flowing through the transistor M1 is $I_1$. Thus, when the potential of the gate of the transistor M1 is $V_1$, it can be regarded that the amount of current flowing between the source and the drain of the transistor M1 is set to $I_1$. As another example, when the potential of the gate of the transistor M1 held in the holding portion HC is $V_2$ and the threshold voltage of the transistor M1 is lower than $V_2$–VSS, the transistor M1 is brought into an on state. Here, the amount of current flowing through the transistor M1 is $I_2$. Thus, when the potential of the gate of the transistor M1 is $V_2$, it can be regarded that the amount of current flowing between the source and the drain of the transistor M1 is set to $I_2$.

Note that the current amount of $I_1$ is larger than 0 and smaller than $I_2$. In addition, the potential $V_1$ is higher than VSS and lower than $V_2$. Moreover, the threshold voltage of the transistor M1 is higher than 0 and lower than $V_1$–VSS. Furthermore, $I_1$ can be replaced with $I_{ut}$ generated by the constant current source circuit ISC1 in the description of FIG. 8, for example, and $I_2$ can be replaced with $2I_{ut}$ generated by the constant current source circuit ISC2 in the description of FIG. 8, for example.

Before the description of the operation example, the first data (for example, a weight coefficient here) held in the circuit MP is defined as follows. When VSS is held at the node n1 of the holding portion HC and VSS is held at the node n1r of the holding portion HCr, the circuit MP holds "0" as the first data (a weight coefficient). When $V_1$ is held at the node n1 of the holding portion HC and VSS is held at the node n1r of the holding portion HCr, the circuit MP holds "+1" as the first data (a weight coefficient). When $V_2$ is held at the node n1 of the holding portion HC and VSS is held at the node n1r of the holding portion HCr, the circuit MP holds "+2" as the first data (a weight coefficient). When VSS is held at the node n1 of the holding portion HC and $V_1$ is held at the node n1r of the holding portion HCr, the circuit MP holds "−1" as the first data (a weight coefficient). When VSS is held at the node n1 of the holding portion HC and $V_2$ is held at the node n1r of the holding portion HCr, the circuit MP holds "−2" as the first data (a weight coefficient).

In addition, the second data (for example, a value of a signal of a neuron (an arithmetic value) here) input to the circuit MP is defined as follows, for example. When a high-level potential is applied to the wiring WX1L and a low-level potential is applied to the wiring X2L, "+1" is input to the circuit MP as the second data (a value of a signal of a neuron). When a low-level potential is applied to the wiring WX1L and a high-level potential is applied to the wiring X2L, "−1" is input to the circuit MP as the second data (a value of a signal of a neuron). When a low-level potential is applied to the wiring WX1L and a low-level potential is applied to the wiring X2L, "0" is input to the circuit MP as the second data (a value of a signal of a neuron). Note that the high-level potential is VDD or a potential higher than VDD by 10% or more or 20% or more.

In this specification and the like, unless otherwise specified, the transistor M1 and the transistor M1r in an on state may operate in a saturation region in the end. In other words, the gate voltage, the source voltage, and the drain voltage of each of the above transistors may be appropriately biased to voltages in the range where the transistor operates in a saturation region. However, one embodiment of the present invention is not limited thereto. The transistor M1 and the transistor M1r may operate in a linear region so that the amplitude value of a voltage to be supplied is decreased. Note that in the case where the first data (a weight coefficient) is an analog value, for example, the transistor M1 and the transistor M1r may operate in a linear region in some cases and may operate in a saturation region in other cases depending on the magnitude of the first data (a weight coefficient).

In this specification and the like, unless otherwise specified, the transistor M2, the transistor M2r, the transistor M3, the transistor M3r, the transistor M4, and the transistor M4r in an on state may operate in a linear region in the end. In other words, the gate voltage, the source voltage, and the drain voltage of each of the above transistors may be appropriately biased to voltages in the range where the transistor operates in the linear region. However, one embodiment of the present invention is not limited thereto. For example, the transistor M2, the transistor M2r, the transistor M3, the transistor M3r, the transistor M4, and the transistor M4r in an on state may operate in a saturation region; alternatively, the transistors may operate in a linear region in some cases and may operate in a saturation region in other cases.

Hereinafter, operation examples of the circuit MP are described for each combination of values that the first data (for example, a weight coefficient below) and the second data (for example, a value of a signal of a neuron (an arithmetic value) below) can have.

[Condition 1]

First, for example, the case is considered where the first data (a weight coefficient) is "0" and the second data (a value of a signal of a neuron (an arithmetic value)) input to the circuit MP is "+1". FIG. 18A is a timing chart of the circuit MP in this case.

From Time T1 to Time T2, an initial potential is held in the holding portion HC and the holding portion HCr. In FIG. 18A, a potential higher than the potential VSS is held at the node n1 and the node n1r as the initial potential, for example.

In addition, a low-level potential is applied to the wiring WL, the wiring WX1L, and the wiring X2L. Accordingly, the low-level potential is input to the gates of the transistor M2, the transistor M2r, the transistor M3, the transistor M3r, the transistor M4, and the transistor M4r, so that the transistor M2, the transistor M2r, the transistor M3, the transistor M3r, the transistor M4, and the transistor M4r are each brought into an off state.

From Time T2 to Time T3, a high-level potential is applied to the wiring WL and the wiring WX1L. Accordingly, the high-level potential is input to the gates of the transistor M2, the transistor M2r, the transistor M3, and the transistor M3r, so that the transistor M2, the transistor M2r, the transistor M3, and the transistor M3r are each brought into an on state.

Although not shown in FIG. 18A, an initialization potential $V_{ini}$ is applied to each of the wiring OL and the wiring OLB. Since the transistor M2, the transistor M2r, the transistor M3, and the transistor M3r are each in an on state, the potentials of the node n1 of the holding portion HC and the node n1r of the holding portion HCr each become $V_{ini}$. That is, from Time T2 to Time T3, the potentials of the node n1 of the holding portion HC and the node n1r of the holding portion HCr are each initialized.

Note that the initialization potential $V_{ini}$ is preferably a ground potential, for example. Alternatively, the initialization potential $V_{ini}$ may be VSS, a potential higher than a ground potential, or a potential lower than a ground potential. In addition, the initialization potentials $V_{ini}$ supplied to the wiring OL and the wiring OLB may be potentials different from each other.

Note that the initialization potential $V_{ini}$ is not necessarily input to each of the wiring OL and the wiring OLB. Note that the period from Time T2 to Time T3 is not necessarily provided. In addition, initialization is not necessarily performed from Time T2 to Time T3.

From Time T3 to Time T4, the potential VSS is input from the wiring OL to the circuit MC and the potential VSS is input from the wiring OLB to the circuit MCr. This is performed by bringing the switch SWL and the switch SWLB into an on state and bringing the switch SWI, the switch SWIB, the switch SWO, the switch SWOB, the switch SWH, and the switch SWHB into an off state in FIG. 8. Thus, the potential of the node n1 of the holding portion HC becomes VSS and the potential of the node n1r of the holding portion HCr becomes VSS. Accordingly, the transistor M1 in the circuit MC is set such that the current amount of 0 is supplied, and thus a current does not flow from the wiring OL to the wiring VE through the circuit MC. In addition, the transistor M1r in the circuit MCr is set such that the current amount of 0 is supplied, and thus a current does not flow from the wiring OLB to the wiring VEr through the circuit MCr. In other words, from Time T3 to Time T4, the transistor M1 and the transistor M1r are in an off state, and thus a non-conduction state is established between the wiring OL and the wiring VE and a non-conduction state is established between the wiring OLB and the wiring VEr.

From Time T4 to Time T5, a low-level potential is applied to the wiring WL and the wiring WX1L. Accordingly, the low-level potential is input to the gates of the transistor M2, the transistor M2r, the transistor M3, and the transistor M3r, so that the transistor M2, the transistor M2r, the transistor M3, and the transistor M3r are each brought into an off state. When the transistor M2 and the transistor M2r are brought into an off state, the potential VSS of the node n1 of the holding portion HC is held and the potential VSS of the node n1r of the holding portion HCr is held. In addition, when the transistor M3 is brought into an off state, a current does not flow from the wiring OL to the wiring VE through the circuit MC. Similarly, when the transistor M3r is brought into an off state, a current does not flow from the wiring OLB to the wiring VEr through the circuit MCr. Note that from Time T4 to Time T5, the switch SWH and the switch SWHB illustrated in FIG. 8A may be turned on to initialize the potentials of the wiring OL and the wiring OLB. By initializing the potentials of the wiring OL and the wiring OLB, the potentials of the wiring OL and the wiring OLB can be changed after Time T5 by a current output from the circuit MP.

By the operation from Time T1 to Time T5, "0" is set as the first data (a weight coefficient) of the circuit MP. Moreover, after the first data (a weight coefficient) is set in the circuit MP, the switch SWI, the switch SWIB, the switch SWO, the switch SWOB, the switch SWL, and the switch SWLB in FIG. 8 may be brought into an off state. Note that after the weight coefficient is set in the circuit MP, the switch SWH and the switch SWHB may be brought into an on state to initialize the potentials of the wiring OL and the wiring OLB. After the potentials of the wiring OL and the wiring OLB are initialized, the switch SWH and the switch SWHB may be brought into an off state.

After Time T5, as "+1" that is a signal of a neuron (an arithmetic value) input to the circuit MP, a high-level potential and a low-level potential are input to the wiring WX1L and the wiring X2L, respectively. At this time, the high-level potential is input to the gates of the transistor M3 and the transistor M3r, and the low-level potential is input to the gates of the transistor M4 and the transistor M4r. Thus, the transistor M3 and the transistor M3r are each brought into an on state and the transistor M4 and the transistor M4r are each brought into an off state. That is, by this operation, a conduction state is established between the circuit MC and the wiring OL and between the circuit MCr and the wiring OLB, and a non-conduction state is established between the circuit MC and the wiring OLB and between the circuit MCr and the wiring OL.

At this time, in FIG. 8, the switches SWO and SWOB are brought into an on state and the switch SWI, the switch SWIB, the switch SWL, the switch SWLB, the switch SWH, and the switch SWHB are brought into an off state so that a conduction state is established between the circuit AFP and each of the wiring OL and the wiring OLB. Since the transistor M1 is in an off state (is set such that the current amount of 0 is supplied), a current does not flow between the wiring VE and each of the wiring OL and the wiring OLB in the circuit MC. Similarly, since the transistor M1r is in an off state (is set such that the current amount of 0 is supplied), a current does not flow between the wiring VEr and each of the wiring OL and the wiring OLB in the circuit MCr. Thus, the current $I_{OL}$ output from the node outa of the wiring OL and the current $I_{OLB}$ output from the node outb of the wiring OLB do not change before and after Time T5. Consequently, the current $I_{OL}$ does not flow between the circuit AFP and the wiring OL, and the current $I_{OLB}$ does not flow between the circuit AFP and the wiring OLB.

Since the first data (a weight coefficient) is "0" and the second data (a value of a signal of a neuron (an arithmetic value)) input to the circuit MP is "+1" in this condition, the product of the first data (a weight coefficient) and the second data (a value of a signal of a neuron) obtained using Formula (1.1) is "0". The result that the product of the first data (a weight coefficient) and the second data (a value of a signal of a neuron) is "0" corresponds to the case where each of the current $I_{OL}$ and the current $I_{OLB}$ does not change after Time T5 in the operation of the circuit MP. The result that the product of the first data (a weight coefficient) and the second data (a value of a signal of a neuron) is "0" is output as the signal $z_j^{(k)}$ from the circuit AFP in FIG. 8.

Note that processing of a plurality of product-sum operations may be performed in such a manner that only the second data (a value of a signal of a neuron, an arithmetic value, or the like) is changed while the first data (e.g., a weight coefficient) once input is not updated. In this case, there is no need to update the first data (a weight coefficient), so that power consumption can be reduced. For less frequent update of the first data (a weight coefficient), the first data (a weight coefficient) needs to be held for a long time. In this case, the use of an OS transistor with a low off-state current enables a long-term holding of the first data (a weight coefficient).

[Condition 2]

Next, for example, the case is considered where the first data (a weight coefficient) is "+1" and the second data (a value of a signal of a neuron (an arithmetic value)) input to the circuit MP is "+1". FIG. 18B is a timing chart of the circuit MP in this case.

Since operation from Time T1 to Time T3 is similar to the operation from Time T1 to Time T3 in Condition 1, the description of the operation from Time T1 to Time T3 in Condition 1 is referred to.

From Time T3 to Time T4, the current amount of $I_1$ is input from the wiring OL to the circuit MC and the potential VSS is input from the wiring OLB to the circuit MCr. This is performed by bringing the switch SWI and the switch SWLB into an on state and bringing the switch SWIB, the switch SWO, the switch SWOB, the switch SWLB, the switch SWH, and the switch SWHB into an off state in FIG. 8. Thus, the potential of the node n1 of the holding portion HC becomes $V_1$ and the potential of the node n1r of the holding portion HCr becomes VSS. Accordingly, the transistor M1 is set such that the current amount of $I_1$ is supplied in the circuit MC, and thus the current amount of $I_1$ is supplied from the wiring OL to the wiring VE through the circuit MC. In addition, the transistor M1r is set such that the current amount of 0 is supplied in the circuit MCr, and thus a current does not flow from the wiring OLB to the wiring VEr through the circuit MCr.

From Time T4 to Time T5, a low-level potential is applied to the wiring WL and the wiring WX1L. Accordingly, the low-level potential is input to the gates of the transistor M2, the transistor M2r, the transistor M3, and the transistor M3r, so that the transistor M2, the transistor M2r, the transistor M3, and the transistor M3r are each brought into an off state. When the transistor M2 and the transistor M2r are brought into an off state, the potential $V_1$ of the node n1 of the holding portion HC is held and the potential VSS of the node n1r of the holding portion HCr is held. In addition, when the transistor M3 is brought into an off state, a current does not flow from the wiring OL to the wiring VE through the circuit MC. Similarly, when the transistor M3r is brought into an off state, a current does not flow from the wiring OLB to the wiring VEr through the circuit MCr. Note that from Time T4 to Time T5, the switch SWH and the switch SWHB illustrated in FIG. 8A may be turned on to initialize the potentials of the wiring OL and the wiring OLB. By initializing the potentials of the wiring OL and the wiring OLB, the potentials of the wiring OL and the wiring OLB can be changed after Time T5 by a current output from the circuit MP.

By the operation from Time T1 to Time T5, "+1" is set as the first data (a weight coefficient) of the circuit MP. Moreover, after the first data (a weight coefficient) is set in the circuit MP, the switch SWI, the switch SWIB, the switch SWO, the switch SWOB, the switch SWL, and the switch SWLB in FIG. 8 may be brought into an off state. Note that after the first data (a weight coefficient) is set in the circuit MP, the switch SWH and the switch SWHB may be brought into an on state to initialize the potentials of the wiring OL and the wiring OLB. After the potentials of the wiring OL and the wiring OLB are initialized, the switch SWH and the switch SWHB may be brought into an off state.

After Time T5, as "+1" that is the second data (a signal of a neuron (an arithmetic value)) input to the circuit MP, a high-level potential and a low-level potential are input to the wiring WX1L and the wiring X2L, respectively. At this time, the high-level potential is input to the gates of the transistor M3 and the transistor M3r, and the low-level potential is input to the gates of the transistor M4 and the transistor M4r. Thus, the transistor M3 and the transistor M3r are each brought into an on state and the transistor M4 and the transistor M4r are each brought into an off state. That is, by this operation, a conduction state is established between the circuit MC and the wiring OL and between the circuit MCr and the wiring OLB, and a non-conduction state is established between the circuit MC and the wiring OLB and between the circuit MCr and the wiring OL.

At this time, in FIG. 8, the switch SWO and the switch SWOB are brought into an on state and the switch SWI, the switch SWIB, the switch SWL, the switch SWLB, the switch SWH, and the switch SWHB are brought into an off state so that a conduction state is established between the circuit AFP and each of the wiring OL and the wiring OLB. Note that since the transistor M3 is in an on state and the transistor M1r is in an on state (is set such that the current amount of $I_1$ is supplied) in the circuit MC, a current flows between the wiring OL and the wiring VE. In addition, since the transistor M4 is in an off state in the circuit MC, a current does not flow between the wiring OLB and the wiring VE. Meanwhile, since the transistor M3r is in an on state and the transistor M1 is in an off state (is set such that the current amount of 0 is supplied) in the circuit MCr, a current does not flow between the wiring OLB and the wiring VEr. Furthermore, since the transistor M4r is in an off state in the circuit MCr, a current does not flow between the wiring OL and the wiring VEr. As described above, the current $I_{OL}$ output from the node outa of the wiring OL increases by $I_1$ after Time T5, and the current $I_{OLB}$ output from the node outb of the wiring OLB does not change before and after Time T5. Thus, the current $I_{OL}$ having the current amount of $I_1$ flows between the circuit AFP and the wiring OL, and the current $I_{OLB}$ does not flow between the circuit AFP and the wiring OLB.

Since the first data (a weight coefficient) is "+1" and the second data (a value of a signal of a neuron) input to the circuit MP is "+1" in this condition, the product of the first data (a weight coefficient) and the second data (a value of a signal of a neuron) obtained using Formula (1.1) is "+1". The result that the product of the first data (a weight coefficient) and the second data (a value of a signal of a neuron) is "+1" corresponds to the case where the current $I_{OL}$ increases by and the current $I_{OLB}$ does not change after Time T5 in the operation of the circuit MP. The result that the product of the first data (a weight coefficient) and the second data (a value of a signal of a neuron) is "+1" is output as the signal $z_j^{(k)}$ from the circuit AFP in FIG. 8.

When the current flowing from the wiring OL to the circuit MC is set to not $I_1$ but $I_2$ from Time T3 to Time T4 in this condition, $V_2$ can be held in the holding portion HC, for example. Accordingly, "+2" is set as the first data (a weight coefficient) of the circuit MP. When the first data (a weight coefficient) is "+2" and the signal of a neuron input to the circuit MP is "+1", the product of the first data (a weight coefficient) and the second data (a value of the signal of a neuron) obtained using Formula (1.1) is "+2". The result that the product of the first data (a weight coefficient) and the second data (a value of the signal of a neuron) is "+2" corresponds to the case where the current $I_{OL}$ increases by $I_2$ and the current $I_{OLB}$ does not change after Time T5 in the operation of the circuit MP. By holding VSS in the holding portion HCr of the circuit MCr and setting a current amount other than $I_1$ in the circuit MC in the above manner, a positive value other than "+1" can be set as the first data (a weight coefficient) of the circuit MP.

[Condition 3]

Next, for example, the case is considered where the first data (a weight coefficient) w is "−1" and the second data (a value of a signal of a neuron (an arithmetic value)) input to the circuit MP is "+1". FIG. 18C is a timing chart of the circuit MP in this case.

Since operation from Time T1 to Time T3 is similar to the operation from Time T1 to Time T3 in Condition 1, the description of the operation from Time T1 to Time T3 in Condition 1 is referred to.

From Time T3 to Time T4, the potential VSS is input from the wiring OL to the circuit MC and the current amount of $I_1$ is input from the wiring OLB to the circuit MCr. This is performed by bringing the switch SWIB and the switch SWL into an on state and bringing the switch SWI, the switch SWO, the switch SWOB, the switch SWLB, the switch SWH, and the switch SWHB into an off state in FIG. 8. Thus, the potential of the node n1 of the holding portion HC becomes VSS and the potential of the node n1r of the holding portion HCr becomes $V_1$. Accordingly, the transistor M1 in the circuit MCr is set such that the current amount of 0 is supplied, and thus a current does not flow from the wiring OL to the wiring VE through the circuit MC. In addition, the transistor M1r in the circuit MCr is set such that the current amount of $I_1$ is supplied, and thus the current amount of $I_1$ is supplied from the wiring OLB to the wiring VEr through the circuit MCr.

From Time T4 to Time T5, a low-level potential is applied to the wiring WL and the wiring WX1L. Accordingly, a low-level potential is input to the gates of the transistor M2, the transistor M2r, the transistor M3, and the transistor M3r, so that the transistor M2, the transistor M2r, the transistor M3, and the transistor M3r are each brought into an off state. When the transistor M2 and the transistor M2r are brought into an off state, the potential VSS of the node n1 of the holding portion HC is held and the potential $V_1$ of the node n1r of the holding portion HCr is held. In addition, when the transistor M3 is brought into an off state, a current does not flow from the wiring OL to the wiring VE through the circuit MC. Similarly, when the transistor M3r is brought into an off state, a current does not flow from the wiring OLB to the wiring VEr through the circuit MCr. Note that from Time T4 to Time T5, the switch SWH and the switch SWHB illustrated in FIG. 8A may be turned on to initialize the potentials of the wiring OL and the wiring OLB. By initializing the potentials of the wiring OL and the wiring OLB, the potentials of the wiring OL and the wiring OLB can be changed after Time T5 by a current output from the circuit MP.

By the operation from Time T1 to Time T5, "−1" is set as the first data (a weight coefficient) of the circuit MP. Moreover, after the first data (a weight coefficient) is set in the circuit MP, the switch SWI, the switch SWIB, the switch SWO, the switch SWOB, the switch SWL, and the switch SWLB in FIG. 8 may be brought into an off state. Note that after the first data (a weight coefficient) is set in the circuit MP, the switch SWH and the switch SWHB may be brought into an on state to initialize the potentials of the wiring OL and the wiring OLB. After the potentials of the wiring OL and the wiring OLB are initialized, the switch SWH and the switch SWHB may be brought into an off state.

After Time T5, as "+1" that is the second data (a signal of a neuron (an arithmetic value)) input to the circuit MP, a high-level potential and a low-level potential are input to the wiring WX1L and the wiring X2L, respectively. At this time, the high-level potential is input to the gates of the transistor M3 and the transistor M3r, and the low-level potential is input to the gates of the transistor M4 and the transistor M4r. Thus, the transistor M3 and the transistor M3r are each brought into an on state and the transistor M4 and the transistor M4r are each brought into an off state. That is, by this operation, a conduction state is established between the circuit MC and the wiring OL and between the circuit MCr and the wiring OLB, and a non-conduction state is established between the circuit MC and the wiring OLB and between the circuit MCr and the wiring OL.

At this time, in FIG. 8, the switch SWO and the switch SWOB are brought into an on state and the switch SWI, the switch SWIB, the switch SWL, the switch SWLB, the switch SWH, and the switch SWHB are brought into an off state so that a conduction state is established between the circuit AFP and each of the wiring OL and the wiring OLB. Note that since the transistor M3 is in an on state and the transistor M1 is in an off state (is set such that the current amount of 0 is supplied) in the circuit MC, a current does not flow between the wiring OL and the wiring VE. In addition, since the transistor M4 is in an off state in the circuit MC, a current does not flow between the wiring OLB and the wiring VE. Meanwhile, since the transistor M3r is in an on state and the transistor M1r is in an on state (is set such that the current amount of $I_1$ is supplied) in the circuit MCr, a current flows between the wiring OLB and the wiring VEr. Furthermore, since the transistor M4r is in an off state in the circuit MCr, a current does not flow between the wiring OL and the wiring VEr. As described above, the current $I_{OL}$ output from the node outa of the wiring OL does not change before and after Time T5, and the current $I_{OLB}$ output from the node outb of the wiring OLB increases by $I_1$ after Time T5. Thus, the current $I_{OL}$ does not flow between the circuit AFP and the wiring OL, and the current $I_{OLB}$ having the current amount of $I_1$ flows between the circuit AFP and the wiring OLB.

Since the first data (a weight coefficient) is "−1" and the second data (a value of a signal of a neuron (an arithmetic value)) input to the circuit MP is "+1" in this condition, the product of the first data (a weight coefficient) and the second data (a value of a signal of a neuron) obtained using Formula (1.1) is "−1". The result that the product of the first data (a weight coefficient) and the second data (a value of a signal of a neuron) is "−1" corresponds to the case where the current $I_{OL}$ does not change and the current $I_{OLB}$ increases by $I_1$ after Time T5 in the operation of the circuit MP. The result that the product of the first data (a weight coefficient) and the second data (a value of a signal of a neuron) is "−1" is output as the signal $z_j^{(k)}$ from the circuit AFP in FIG. 8.

When the current flowing from the wiring OLB to the circuit MCr is set to not $I_1$ but $I_2$, for example, from Time T3 to Time T4 in this condition, $V_2$ can be held in the holding portion HCr. Accordingly, "−2" is set as the first data (a weight coefficient) of the circuit MP. When the first data (a weight coefficient) is set to "−2" and the second data (a value of a signal of a neuron) input to the circuit MP is set to "+1", the product of the first data (a weight coefficient) and the second data (a value of a signal of a neuron) obtained using Formula (1.1) is "−2". The result that the product of the first data (a weight coefficient) and the second data (a value of a signal of a neuron) is "−2" corresponds to the case where the current $I_{OL}$ does not change and the current $I_{OLB}$ increases by $I_2$ after Time T5 in the operation of the circuit MP. By holding VSS in the holding portion HC of the circuit MC and setting a current amount other than $I_1$ in the circuit MCr in the above manner, a positive value other than "+1" can be set as the weight coefficient of the circuit MP.

[Condition 4]

Next, for example, the case is considered where the first data (a weight coefficient) is "0" and the second data (a value of a signal of a neuron (an arithmetic value)) input to the circuit MP is "−1". FIG. 19A is a timing chart of the circuit MP in this case.

Since operation from Time T1 to Time T5 is similar to the operation from Time T1 to Time T5 in Condition 1, the description of the operation from Time T1 to Time T5 in Condition 1 is referred to.

After Time T5, as "−1" that is the second data (a signal of a neuron (an arithmetic value)) input to the circuit MP, a low-level potential and a high-level potential are input to the wiring WX1L and the wiring X2L, respectively. At this time, the low-level potential is input to the gates of the transistor M3 and the transistor M3r, and the high-level potential is input to the gates of the transistor M4 and the transistor M4r. Accordingly, the transistor M3 and the transistor M3r are each brought into an off state and the transistor M4 and the transistor M4r are each brought into an on state. That is, by this operation, a non-conduction state is established between the circuit MC and the wiring OL and between the circuit MCr and the wiring OLB, and a non-conduction state is established between the circuit MC and the wiring OLB and between the circuit MCr and the wiring OL.

At this time, in FIG. 8, the switch SWO and the switch SWOB are brought into an on state and the switch SWI, the switch SWIB, the switch SWL, and the switch SWLB are brought into an off state so that a conduction state is established between the circuit AFP and each of the wiring OL and the wiring OLB. Note that the transistor M1 is in an off state (is set such that the current amount of 0 is supplied), a current does not flow between the wiring VE and each of the wiring OL and the wiring OLB in the circuit MC. In other words, the current $I_{OL}$ output from the node outa of the wiring OL and the current $I_{OLB}$ output from the node outb of the wiring OLB do not change before and after Time T5. Similarly, the transistor M1r is in an off state (is set such that the current amount of 0 is supplied), a current does not flow between the wiring VEr and each of the wiring OL and the wiring OLB in the circuit MCr. In other words, the current $I_{OL}$ output from the node outa of the wiring OL and the current $I_{OLB}$ output from the node outb of the wiring OLB do not change before and after Time T5. Thus, the current $I_{OL}$ does not flow between the circuit AFP and the wiring OL, and the current $I_{OLB}$ does not flow between the circuit AFP and the wiring OLB.

Since the first data (a weight coefficient) is "0" and the second data (a value of a signal of a neuron (an arithmetic value)) input to the circuit MP is "−1" in this condition, the product of the first data (a weight coefficient) and the second data (a value of a signal of a neuron) obtained using Formula (1.1) is "0". The result that the product of the first data (a weight coefficient) and the second data (a value of a signal of a neuron) is "0" corresponds to the case where the current $I_{OL}$ and the current $I_{OLB}$ do not change after Time T6 in the operation of the circuit MP, which agrees with the result of the circuit operation in Condition 1. The result that the product of the first data (a weight coefficient) and the second data (a value of a signal of a neuron) is "0" is output as the signal $z_j^{(k)}$ from the circuit AFP in FIG. 8, as in Condition 1.

[Condition 5]

In this condition, for example, the case is considered where the first data (a weight coefficient) is "+1" and the second data (a value of a signal of a neuron (an arithmetic value)) input to the circuit MP is "−1". FIG. 19B is a timing chart of the circuit MP in this case.

Since operation from Time T1 to Time T5 is similar to the operation from Time T1 to Time T5 in Condition 2, the description of the operation from Time T1 to Time T5 in Condition 2 is referred to.

After Time T5, as "−1" that is the second data (a signal of a neuron (an arithmetic value)) input to the circuit MP, a low-level potential and a high-level potential are input to the wiring WX1L and the wiring X2L, respectively. At this time, the low-level potential is input to the gates of the transistor M3 and the transistor M3r, and the high-level potential is input to the gates of the transistor M4 and the transistor M4r. Accordingly, the transistor M3 and the transistor M3r are each brought into an off state and the transistor M4 and the transistor M4r are each brought into an on state. That is, by this operation, a non-conduction state is established between the circuit MC and the wiring OL and between the circuit MCr and the wiring OLB, and a conduction state is established between the circuit MC and the wiring OLB and between the circuit MCr and the wiring OL.

At this time, in FIG. 8, the switch SWO and the switch SWOB are brought into an on state and the switch SWI, the switch SWIB, the switch SWL, the switch SWLB, the switch SWH, and the switch SWHB are brought into an off state so that a conduction state is established between the circuit AFP and each of the wiring OL and the wiring OLB. Since the transistor M3 is in an off state in the circuit MC, a current does not flow between the wiring OL and the wiring VE. In addition, since the transistor M4 is in an on state and the transistor M1r is in an on state (is set such that the current amount of $I_1$ is supplied) in the circuit MC, a current flows between the wiring OLB and the wiring VE. Meanwhile, since the transistor M3r is in an off state in the circuit MCr, a current does not flow between the wiring OLB and the wiring VEr. In addition, since the transistor M4r is in an on state and the transistor M1 is in an off state (is set such that the current amount of 0 is supplied) in the circuit MCr, a current does not flow between the wiring OL and the wiring VEr. As described above, the current $I_{OL}$ output from the node outa of the wiring OL does not change before and after Time T5, and the current $I_{OLB}$ output from the node outb of the wiring OLB increases by $I_1$ after Time T5. Thus, the current $I_{OL}$ does not flow between the circuit AFP and the wiring OL, and the current $I_{OLB}$ having the current amount of $I_1$ flows between the circuit AFP and the wiring OLB.

Since the first data (a weight coefficient) is "+1" and the second data (a value of a signal of a neuron (an arithmetic value)) input to the circuit MP is "−1" in this condition, the product of the first data (a weight coefficient) and the second data (a value of a signal of a neuron) obtained using Formula (1.1) is "−1". The result that the product of the first data (a weight coefficient) and the second data (a value of a signal of a neuron) is "−1" corresponds to the case where the current $I_{OL}$ does not change and the current $I_{OLB}$ increases by $I_1$ after Time T5 in the operation of the circuit MP, which agrees with the result of the circuit operation in Condition 3. The result that the product of the first data (a weight coefficient) and the second data (a value of a signal of a neuron) is "−1" is output as the signal $z_j^{(k)}$ from the circuit AFP in FIG. 8, as in Condition 3.

Note that as described in Condition 2, from Time T3 to Time T4 in this condition, the current flowing from the wiring OL to the circuit MC may be set to not $I_1$ but $I_2$ to hold $V_2$ in the holding portion HC, for example. In this case, "+2" is set as the first data (a weight coefficient) of the circuit MP. When the first data (a weight coefficient) is "+2" and the signal of a neuron input to the circuit MP is "−1", the product of the first data (a weight coefficient) and the second data (a value of the signal of a neuron) obtained using Formula (1.1) is "−2". The result that the product of the first data (a weight coefficient) and the second data (a value of the signal of a neuron) is "−2" corresponds to the case where the current $I_{OL}$ does not change and the current $I_{OLB}$ increases by $I_2$ after Time T5 in the operation of the circuit MP. By holding VSS in the holding portion HCr of the circuit MCr and setting a current amount other than $I_1$ in the circuit MC in the above manner, a positive value other than "+1" can be set as the weight coefficient of the circuit MP.

[Condition 6]

In this condition, for example, the operation of the circuit MP in the case where the first data (a weight coefficient) is "−1" and the second data (a value of a signal of a neuron (an arithmetic value)) input to the circuit MP is "−1" is considered. FIG. 19C is a timing chart of the circuit MP in this case.

Since operation from Time T1 to Time T5 is similar to the operation from Time T1 to Time T5 in Condition 3, the description of the operation from Time T1 to Time T5 in Condition 3 is referred to.

After Time T5, as "−1" that is the second data (a signal of a neuron (an arithmetic value)) input to the circuit MP, a low-level potential and a high-level potential are input to the wiring WX1L and the wiring X2L, respectively. At this time, the low-level potential is input to the gates of the transistor M3 and the transistor M3r, and the high-level potential is input to the gates of the transistor M4 and the transistor M4r. Accordingly, the transistor M3 and the transistor M3r are each brought into an off state and the transistor M4 and the transistor M4r are each brought into an on state. That is, by this operation, a non-conduction state is established between the circuit MC and the wiring OL and between the circuit MCr and the wiring OLB, and a conduction state is established between the circuit MC and the wiring OLB and between the circuit MCr and the wiring OL.

At this time, in FIG. 8, the switch SWO and the switch SWOB are brought into an on state and the switch SWI, the switch SWIB, the switch SWL, the switch SWLB, the switch SWH, and the switch SWHB are brought into an off state so that a conduction state is established between the circuit AFP and each of the wiring OL and the wiring OLB.

Since the transistor M3 is in an off state in the circuit MC, a current does not flow between the wiring OL and the wiring VE. In addition, since the transistor M4 is in an on state and the transistor M1 is in an off state (is set such that the current amount of 0 is supplied) in the circuit MC, a current does not flow between the wiring OLB and the wiring VE. Meanwhile, since the transistor M3r is in an off state in the circuit MCr, a current does not flow between the wiring OLB and the wiring VEr. In addition, since the transistor M4r is in an on state and the transistor M1 is in an on state (is set such that the current amount of $I_1$ is supplied) in the circuit MCr, a current flows between the wiring OL and the wiring VEr. As described above, the current $I_{OL}$ output from the node outa of the wiring OL increases by $I_1$ after Time T5 and the current $I_{OLB}$ output from the node outb of the wiring OLB does not change before and after Time T5. Thus, the current $I_{OL}$ having the current amount of $I_1$ flows between the circuit AFP and the wiring OL, and the current $I_{OLB}$ does not flow between the circuit AFP and the wiring OLB.

Since the first data (a weight coefficient) is "−1" and the second data (a value of a signal of a neuron (an arithmetic value)) input to the circuit MP is "−1" in this condition, the product of the first data (a weight coefficient) and the second data (a value of a signal of a neuron) obtained using Formula (1.1) is "+1". The result that the product of the first data (a weight coefficient) and the second data (a value of a signal of a neuron) is "+1" corresponds to the case where the current $I_{OL}$ changes and the current $I_{OLB}$ does not change after Time T6 in the operation of the circuit MP, which agrees with the result of the circuit operation in Condition 2. The result that the product of the first data (a weight coefficient) and the first data (a value of a signal of a neuron) is "+1" is output as the signal $z_j^{(k)}$ from the circuit AFP in FIG. 8, as in Condition 2.

Note that as described in Condition 3, from Time T3 to Time T4 in this condition, the current flowing from the wiring OLB to the circuit MCr may be set to not $I_1$ but $I_2$ to hold $V_2$ in the holding portion HC, for example. Accordingly, "−2" is set as the first data (a weight coefficient) of the circuit MP. When the first data (a weight coefficient) is "−2" and the second data (a value of a signal of a neuron) input to the circuit MP is "−1", the product of the first data (a weight coefficient) and the second data (a value of a signal of a neuron) obtained using Formula (1.1) is "+2". The result that the product of the first data (a weight coefficient) and the second data (a value of a signal of a neuron) is "+2" corresponds to the case where the current $I_{OL}$ does not change and the current $I_{OLB}$ increases by $I_2$ after Time T5 in the operation of the circuit MP. By holding VSS in the holding portion HC of the circuit MC and setting a current amount other than $I_1$ in the circuit MCr in the above manner, a positive value other than "+1" can be set as the weight coefficient of the circuit MP.

[Condition 7]

In this condition, for example, the operation of the circuit MP is considered using Condition 7 where the first data (a weight coefficient) is "0" and the second data (a value of a signal of a neuron (an arithmetic value)) input to the circuit MP is "0". FIG. 20A is a timing chart of the circuit MP in this case.

Since operation from Time T1 to Time T5 is similar to the operation from Time T1 to Time T5 in Condition 1, the description of the operation from Time T1 to Time T5 in Condition 1 is referred to.

After Time T5, as "0" that is the second data (a signal of a neuron (an arithmetic value)) input to the circuit MP, a low-level potential is input to the wiring WX1L and a low-level potential is input to the wiring X2L. At this time, the low-level potentials are input to the gates of the transistor M3, the transistor M3r, the transistor M4, and the transistor M4r. Accordingly, the transistor M3, the transistor M3r, the transistor M4, and the transistor M4r are each brought into an off state. That is, by this operation, a non-conduction state is established between the circuit MC and the wiring OL, between the circuit MCr and the wiring OLB, between the circuit MC and the wiring OLB, and between the circuit MCr and the wiring OL.

Thus, in the circuit MC, a current does not flow between the wiring OL and one of the wiring VE and the wiring VEr regardless of the set amount of current flowing through the transistor M1. Similarly, in the circuit MCr, a current does not flow between the wiring OLB and the other of the wiring VE and the wiring VEr regardless of the set amount of current flowing through the transistor M1r. In other words, the current $I_{OL}$ output from the node outa of the wiring OL and the current $I_{OLB}$ output from the node outb of the wiring OLB do not change before and after Time T5.

In this case, even when a conduction state is established between the circuit AFP and each of the wiring OL and the wiring OLB by bringing the switch SWO and the switch SWOB into an on state and bringing the switch SWI, the switch SWIB, the switch SWL, the switch SWLB, the switch SWH, and the switch SWHB into an off state in FIG. 8, the current $I_{OL}$ does not flow between the circuit AFP and the wiring OL and the current $I_{OLB}$ does not flow between the circuit AFP and the wiring OLB, as described above.

Since the first data (a weight coefficient) is "0" and the second data (a value of a signal of a neuron (an arithmetic value)) input to the circuit MP is "0" in this condition, the product of the first data (a weight coefficient) and the second data (a value of a signal of a neuron) obtained using Formula (1.1) is "0". The result that the product of the first data (a weight coefficient) and the second data (a value of a signal of a neuron) is "0" corresponds to the case where the current $I_{OL}$ and the current $I_{OLB}$ do not change after Time T5 in the operation of the circuit MP, which agrees with the results of the circuit operations in Condition 1 and Condition 4. The result that the product of the first data (a weight coefficient) and the second data (a value of a signal of a neuron) is "0" is output as the signal $z_1^{(k)}$ from the circuit AFP in FIG. 8, as in Condition 1 and Condition 4.

[Condition 8]

In this condition, for example, the operation of the circuit MP is considered using Condition 8 where the first data (a weight coefficient) is "+1" and the second data (a value of a signal of a neuron (an arithmetic value)) input to the circuit MP is "0". FIG. 20B is a timing chart of the circuit MP in this case.

Since operation from Time T1 to Time T5 is similar to the operation from Time T1 to Time T5 in Condition 2, the description of the operation from Time T1 to Time T5 in Condition 2 is referred to.

After Time T5, as "0" that is the second data (a value of a signal of a neuron (an arithmetic value)) input to the circuit MP, a low-level potential is input to the wiring WX1L and a low-level potential is input the wiring X2L. At this time, the low-level potentials are input to the gates of the transistor M3, the transistor M3r, the transistor M4, and the transistor M4r. Accordingly, the transistor M3, the transistor M3r, the transistor M4, and the transistor M4r are each brought into an off state. That is, by this operation, a non-conduction state is established between the circuit MC and the wiring OL, between the circuit MCr and the wiring OLB, between the circuit MC and the wiring OLB, and between the circuit MCr and the wiring OL regardless of the set amount of current flowing through the transistor M1 and the transistor M1r, as in Condition 7. In this case, a current does not flow between the wiring OL and one of the wiring VE and the wiring VEr and a current does not flow between the wiring OLB and the other of the wiring VE and the wiring VEr; thus, the current $I_{OL}$ output from the node outa of the wiring OL and the current $I_{OLB}$ output from the node outb of the wiring OLB do not change before and after Time T5.

In this case, even when a conduction state is established between the circuit AFP and each of the wiring OL and the wiring OLB by bringing the switch SWO and the switch SWOB into an on state and bringing the switch SWI, the switch SWIB, the switch SWL, and the switch SWLB into an off state in FIG. 8, the current $I_{OL}$ does not flow between the circuit AFP and the wiring OL and the current $I_{OLB}$ does not flow between the circuit AFP and the wiring OLB, as described above.

Since the first data (a weight coefficient) is "+1" and the second data (a value of a signal of a neuron (an arithmetic value)) input to the circuit MP is "0" in this condition, the product of the first data (a weight coefficient) and the second data (a value of a signal of a neuron) obtained using Formula (1.1) is "0". The result that the product of the first data (a weight coefficient) and the second data (a value of a signal of a neuron) is "0" corresponds to the case where the current $I_{OL}$ and the current $I_{OLB}$ do not change after Time T5 in the operation of the circuit MP, which agrees with the results of the circuit operations in Condition 1, Condition 4, and Condition 7. The result that the product of the first data (a weight coefficient) and the second data (a value of a signal of a neuron) is "0" is output as the signal $z_j^{(k)}$ from the circuit AFP in FIG. 8, as in Condition 1, Condition 4, and Condition 7.

[Condition 9]

In this condition, for example, the operation of the circuit MP is considered using Condition 9 where the first data (a weight coefficient) is "−1" and the second data (a value of a signal of a neuron (an arithmetic value)) input to the circuit MP is "0". FIG. 20C is a timing chart of the circuit MP in this case.

Since operation from Time T1 to Time T5 is similar to the operation from Time T1 to Time T5 in Condition 3, the description of the operation from Time T1 to Time T5 in Condition 3 is referred to.

After Time T5, as "0" that is the second data (a value of a signal of a neuron (an arithmetic value)) input to the circuit MP, a low-level potential is input to the wiring WX1L and a low-level potential is input to the wiring X2L. At this time, the low-level potentials are input to the gates of the transistor M3, the transistor M3r, the transistor M4, and the transistor M4r. Accordingly, the transistor M3, the transistor M3r, the transistor M4, and the transistor M4r are each brought into an off state. That is, by this operation, a non-conduction state is established between the circuit MC and the wiring OL, between the circuit MCr and the wiring OLB, between the circuit MC and the wiring OLB, and between the circuit MCr and the wiring OL regardless of the set amount of current flowing through the transistor M1 and the transistor M1r, as in Condition 7. In this case, a current does not flow between the wiring OL and one of the wiring VE and the wiring VEr and a current does not flow between the wiring OLB and the other of the wiring VE and the wiring VEr; thus, the current $I_{OL}$ output from the node outa of the wiring OL and the current $I_{OLB}$ output from the node outb of the wiring OLB do not change before and after Time T5.

In this case, even when a conduction state is established between the circuit AFP and each of the wiring OL and the wiring OLB by bringing the switch SWO and the switch SWOB into an on state and bringing the switch SWI, the switch SWIB, the switch SWL, the switch SWLB, the switch SWH, and the switch SWHB into an off state in FIG. 8, the current $I_{OL}$ does not flow between the circuit AFP and the wiring OL and the current $I_{OLB}$ does not flow between the circuit AFP and the wiring OLB, as described above.

Since the first data (a weight coefficient) is "−1" and the second data (a value of a signal of a neuron (an arithmetic value)) input to the circuit MP is "0" in this condition, the product of the first data (a weight coefficient) and the second data (a value of a signal of a neuron) obtained using Formula (1.1) is "0". The result that the product of the first data (a weight coefficient) and the second data (a value of a signal of a neuron) is "0" corresponds to the case where the current $I_{OL}$ and the current $I_{OLB}$ do not change after Time T6 in the operation of the circuit MP, which agrees with the results of the circuit operations in Condition 1, Condition 4, Condition 7, and Condition 8. The result that the product of the first data (a weight coefficient) and the second data (a value of a signal of a neuron) is "0" is output as the signal $z_j^{(k)}$ from the circuit AFP in FIG. 8, as in Condition 1, Condition 4, Condition 7, and Condition 8.

The results of the operation examples under Condition 1 to Condition 9 described above are listed in the following table. Note that in the following table, a high-level potential is denoted by high and a low-level potential is denoted by low.

TABLE 2

| Condition | Weight coefficient | n1 | n1r | Signal | X1L | X2L | Weight coefficient × signal | Amount of change in $I_{OL}$ | Amount of change in $I_{OLB}$ |
|---|---|---|---|---|---|---|---|---|---|
| Condition 1 | 0 | VSS | VSS | +1 | high | low | 0 | 0 | 0 |
| Condition 2 | +1 | $V_1$ | VSS | +1 | high | low | +1 | $I_1$ | 0 |
| Condition 3 | −1 | VSS | $V_1$ | +1 | high | low | −1 | 0 | $I_1$ |
| Condition 4 | 0 | VSS | VSS | −1 | low | high | 0 | 0 | 0 |
| Condition 5 | +1 | $V_1$ | VSS | −1 | low | high | −1 | 0 | $I_1$ |
| Condition 6 | −1 | VSS | $V_1$ | −1 | low | high | +1 | $I_1$ | 0 |
| Condition 7 | 0 | VSS | VSS | 0 | low | low | 0 | 0 | 0 |
| Condition 8 | +1 | $V_1$ | VSS | 0 | low | low | 0 | 0 | 0 |
| Condition 9 | −1 | VSS | V1 | 0 | low | low | 0 | 0 | 0 |

Here, the case where one circuit MC and one circuit MCr are connected to the wiring OL and the wiring OLB is illustrated as an example. In the case where a plurality of circuits MC and a plurality of circuits MCr are connected to the wiring OL and the wiring OLB as illustrated in FIG. 2, FIG. 3, FIG. 4, FIG. 7, FIG. 11, FIG. 12, FIG. 6, and the like, currents output from the circuits MC and the circuits MCr are added in accordance with Kirchhoff's current law. Consequently, sum operation is performed. In other words, the product operation is performed in the circuits MC and the circuits MCr and the sum operation is performed by adding the currents from the plurality of circuits MC and the plurality of circuits MCr. As a result of the above, product-sum operation processing is performed.

In the operation of the circuit MP, when calculation using the first data (a weight coefficient) having only two levels "+1" and "−1" and the second data (a value of a signal of a neuron) having only two levels "+1" and "−1" is performed, the circuit MP can perform operation similar to that of an exclusive NOR circuit (coincidence circuit).

In the operation of the circuit MP, when calculation using the first data (a weight coefficient) having only two levels "+1" and "0" and the second data (a value of a signal of a neuron) having only two levels "+1" and "0" is performed, the circuit MP can perform operation similar to that of a logical product circuit In this operation example, a potential held in the holding portions HC and HCr included in the circuits MC and MCr of the circuit MP represents a multilevel value of VSS, $V_1$, or $V_2$, for example; however, a potential representing a binary value or an analog value may be held in the holding portions HC and HCr. For example, in the case where the first data (a weight coefficient) is a "positive analog value", a high-level analog potential is held at the node n1 of the holding portion HC and a low-level potential is held at the node n1r of the holding portion HCr. In the case where the first data (a weight coefficient) is a "negative analog value", a low-level potential is held at the node n1 of the holding portion HC and a high-level analog potential is held at the node n1r of the holding portion HCr, for example. Then, the amount of the current $I_{OL}$ and the current $I_{OLB}$ becomes an amount corresponding to the analog potential. A potential representing an analog value may also be held in the holding portions HC and HCr in other circuits MP described in this specification and the like without limitation to the operation example of the circuit MP in FIG. 15A.

Note that this configuration example can be combined with any of the other configuration examples and the like described in this specification as appropriate.

Configuration Example 2

Next, examples of a circuit configuration that can be applied to the circuit MP illustrated in FIG. 9B and is different from the circuit configurations of FIG. 15A to FIG. 15C, FIG. 16A, and FIG. 16B are described.

Figure 21A:
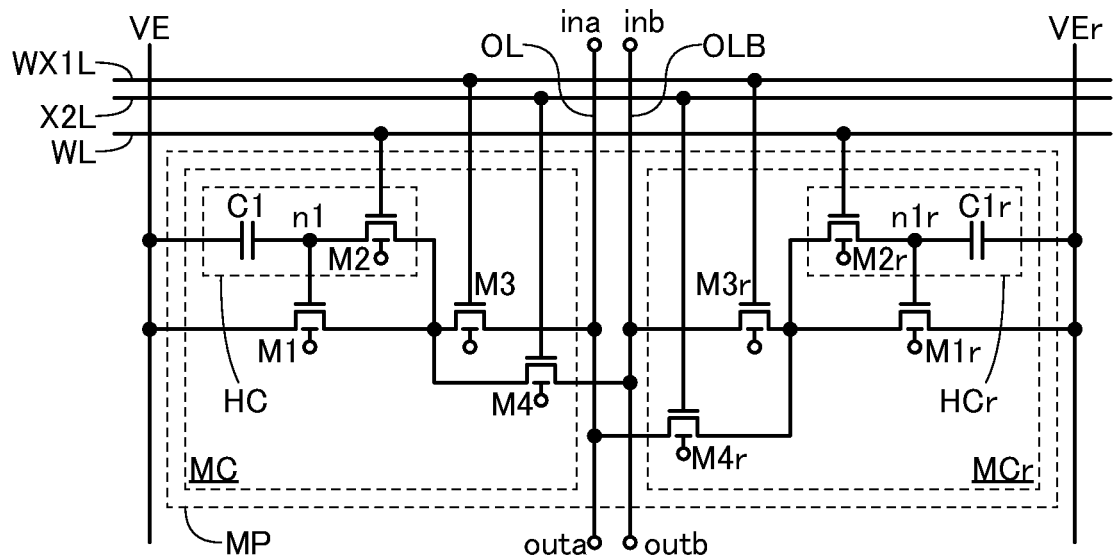
FIG. 21A and FIG. 21B are circuit diagrams each showing a configuration example of a circuit included in a semiconductor device.

The circuit MP illustrated in FIG. 21A shows a configuration example of the circuit MP in FIG. 9B, and is different from the circuit MP in FIG. 15A in that the second terminal of the transistor M2 is electrically connected to not the wiring OL but the second terminal of the transistor M1, the first terminal of the transistor M3, and the first terminal of the transistor M4, and that the second terminal of the transistor M2r is electrically connected to not the wiring OLB but the second terminal of the transistor M1r, a first terminal of the transistor M3r, and a first terminal of the transistor M4r.

The circuit MP in FIG. 21A can operate in a manner similar to that of the circuit MP in FIG. 15A.

In addition, another example of a circuit configuration that can be applied to the circuit MP illustrated in FIG. 9B and is different from that in FIG. 21A is described. The circuit MP illustrated in FIG. 21B shows a configuration example of the circuit MP in FIG. 9B, and is different from the circuit MP in FIG. 15A in that a transistor M1c is included in the circuit MC and the first terminal of the transistor M4 is electrically connected to not the second terminal of the transistor M1 and the second terminal of the transistor M3 but the transistor M1c, and that a transistor M1cr is included in the circuit MCr and the first terminal of the transistor M4r is electrically connected to not the second terminal of the transistor M1r and the second terminal of the transistor M3r but the transistor M1cr.

Note that in this specification and the like, unless otherwise specified, the transistor M1c and the transistor M1cr in an on state may operate in a saturation region in the end. In other words, the gate voltage, the source voltage, and the drain voltage of each of the above transistors may be appropriately biased to voltages in the range where the transistor operates in the linear region. However, one embodiment of the present invention is not limited thereto. The transistor M1c and the transistor M1cr may operate in a linear region so that the amplitude value of a voltage to be supplied is decreased. Note that in the case where the first data (for example, a weight coefficient here) is an analog value, the transistor M1c and the transistor M1cr may operate in a linear region in some cases and may operate in a saturation region in other cases depending on the magnitude of the first data (a weight coefficient).

Figure 21B:
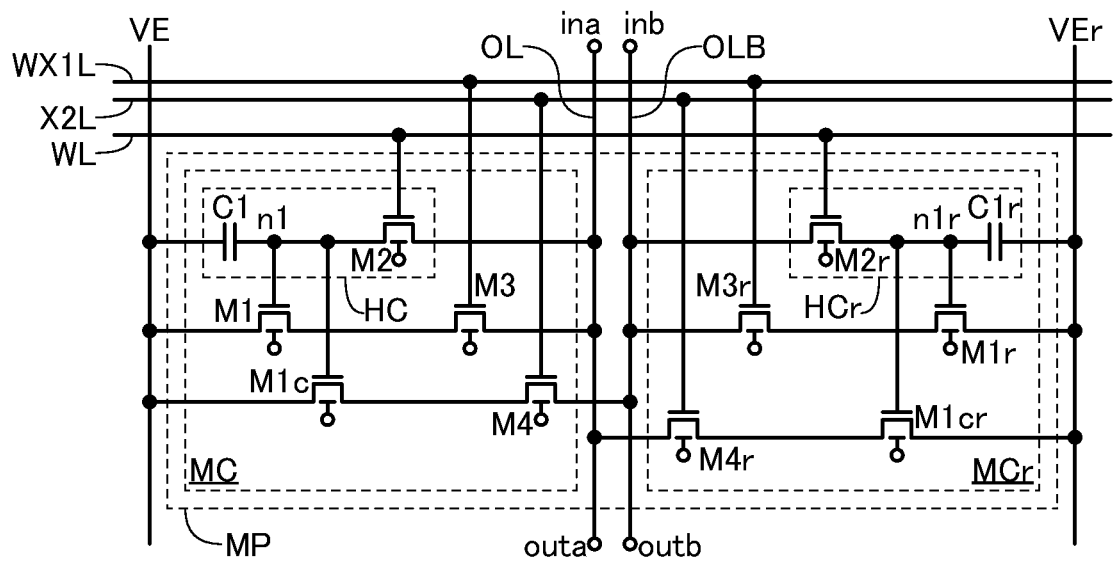

In the circuit MP in FIG. 21B, a first terminal of the transistor M1c is electrically connected to the wiring VE. In addition, a gate of the transistor M1c is electrically connected to the gate of the transistor M1, the first terminal of the transistor M2, and the first terminal of the capacitor C1. In addition, a second terminal of the transistor M1c is electrically connected to the first terminal of the transistor M4.

Note that in the circuit MP in FIG. 21B, the circuit MCr has substantially the same circuit configuration as the circuit MC. Thus, "r" is added to the reference signs of the circuit elements and the like included in the circuit MCr to differentiate them from the circuit elements and the like included in the circuit MC.

Note that the description of a portion of the circuit MP in FIG. 21B having a connection configuration similar to that of the circuit MP in FIG. 15A is omitted.

In the circuit MP illustrated in FIG. 21B, currents flowing through the transistor M3 and the transistor M4 are determined in accordance with the potentials of the gates of the transistor M1 and the transistor M1c. The sizes, e.g., the channel lengths and the channel widths, of the transistor M1 and the transistor M1c are preferably equal to each other, for example. Such a circuit configuration might enable efficient layout. In addition, there is a possibility that currents flowing through the transistor M3 and the transistor M4 can be equal to each other.

The circuit MP in FIG. 21B can operate in a manner similar to that of the circuit MP in FIG. 15A.

Note that this configuration example can be combined with any of the other configuration examples and the like described in this specification as appropriate.

Configuration Example 3

Next, examples of a circuit configuration that can be applied to the circuit MP illustrated in FIG. 9E are described.

Figure 22A:
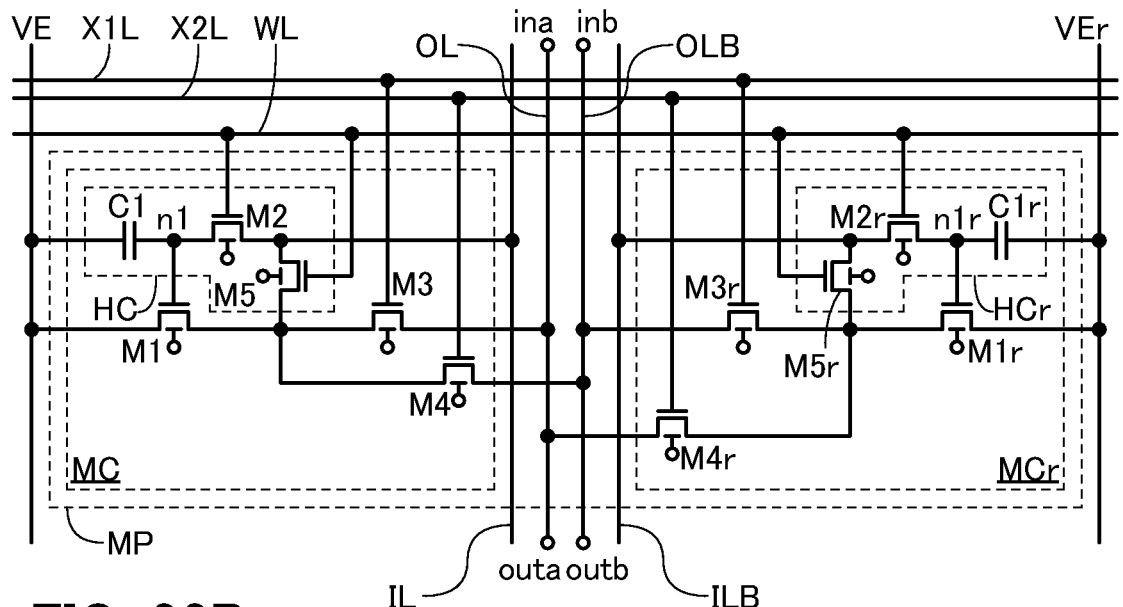
FIG. 22A and FIG. 22B are circuit diagrams each showing a configuration example of a circuit included in a semiconductor device.

The circuit MP illustrated in FIG. 22A shows a configuration example of the circuit MP in FIG. 9E, and is different from the circuit MP in FIG. 15A in that a transistor M5 is included in the circuit MC and a transistor M5r is included in the circuit MCr, and that the circuit MP is electrically connected to the wiring IL and the wiring ILB.

Note that in this specification and the like, unless otherwise specified, the transistor M5 and the transistor M5r in an on state may operate in a linear region in the end. In other words, the gate voltage, the source voltage, and the drain voltage of each of the above transistors may be appropriately biased to voltages in the range where the transistor operates in the linear region.

In the circuit MP in FIG. 22A, a first terminal of the transistor M5 is electrically connected to the second terminal of the transistor M2 and the wiring IL. A second terminal of the transistor M5 is electrically connected to the second terminal of the transistor M1, the first terminal of the transistor M3, and the first terminal of the transistor M4. A gate of the transistor M5 is electrically connected to the wiring WL.

Note that in the circuit MP in FIG. 22A, the circuit MCr has substantially the same circuit configuration as the circuit MC. Thus, "r" is added to the reference signs of the circuit elements and the like included in the circuit MCr to differentiate them from the circuit elements and the like included in the circuit MC.

Note that the description of a portion of the circuit MP in FIG. 22A having a connection configuration similar to that of the circuit MP in FIG. 15A is omitted.

In the circuit MP in FIG. 22A, as in Configuration example 1 and Configuration example 2, the sizes, e.g., the channel lengths and the channel widths, of the transistor M1, the transistor M2, the transistor M3, and the transistor M4 are preferably equal to the sizes of the transistor M1r, the transistor M2r, the transistor M3r, and the transistor M4r, respectively. Such a circuit configuration might enable efficient layout. In addition, the size of the transistor M5 is preferably equal to the size of the transistor M5r.

When a current is set in the circuits MC and MCr, a high-level potential is supplied to the wiring WL so that the transistor M2, the transistor M2r, the transistor M5, and the transistor M5r are brought into an on state. After the current is set in the circuit MC and the circuit MCr, in order to hold the set potential in the holding portion HC and the holding portion HCr, a low-level potential is supplied to the wiring WL so that the transistor M2, the transistor M2r, the transistor M5, and the transistor M5r are brought into an off state.

In the circuit MP described in Configuration example 1 and Configuration example 2, a wiring for transmitting the second data (for example, a value of a signal of a neuron here) and a wiring for supplying or holding information (e.g., a voltage or a current) corresponding to the first data (for example, a weight coefficient here) to or in the circuit MP are combined into the wiring WX1L; however, in the circuit MP having the configuration in FIG. 22, the wiring for transmitting the second data (a value of a signal of a neuron) can be the wiring X1L and the wiring for supplying or holding information (e.g., a voltage or a current) corresponding to the first data (a weight coefficient) to or in the circuit MP can be the wiring WL. That is, it can be said that the circuit MP in FIG. 22 has a configuration in which the wiring WX1L of the circuit MP in Configuration example 1 and Configuration example 2 is divided according to the functions.

Figure 22B:
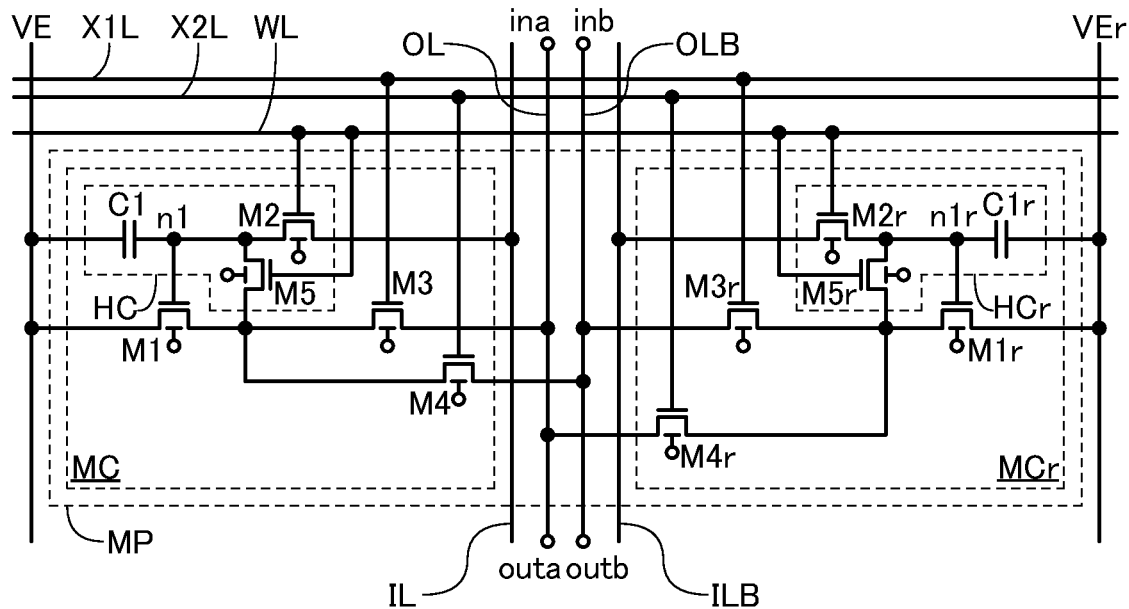

FIG. 22B shows a circuit configuration different from that of the circuit MP in FIG. 22A.

The circuit MP illustrated in FIG. 22B has a configuration in which the electrical connections of the first terminals of the transistor M5 and transistor M5r are changed from those of the circuit MP in FIG. 22A. Specifically, in the circuit MP in FIG. 22B, the first terminal of the transistor M5 is electrically connected to the first terminal of the transistor M2, the gate of the transistor M1, and the first terminal of the capacitor C1.

When the circuit MP is configured as shown in FIG. 22B, the circuit MP in FIG. 22B operates in substantially the same manner as the circuit MP in FIG. 22A.

Figure 23A:
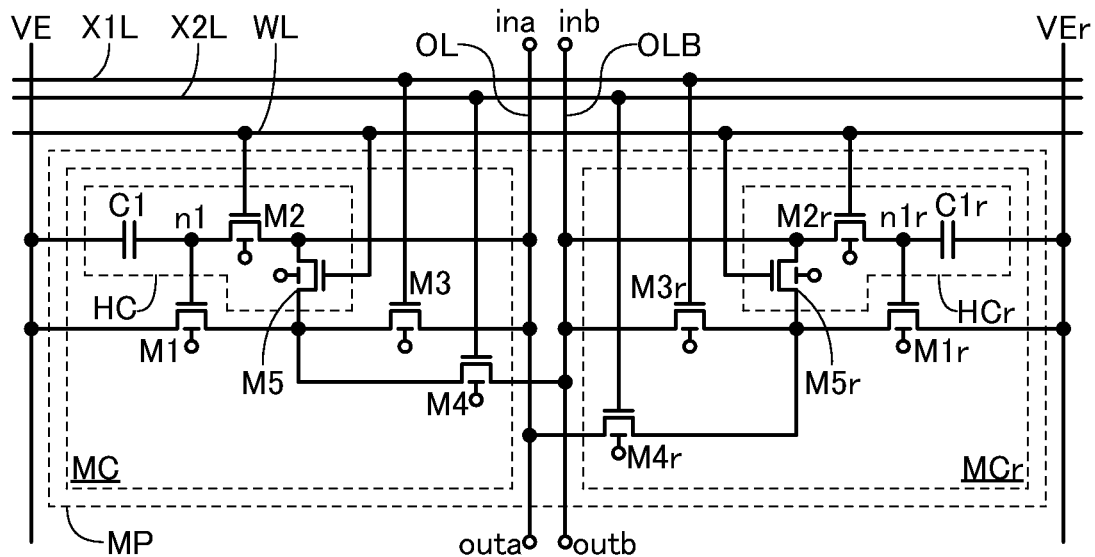
FIG. 23A and FIG. 23B are circuit diagrams each showing a configuration example of a circuit included in a semiconductor device.
Figure 23B:
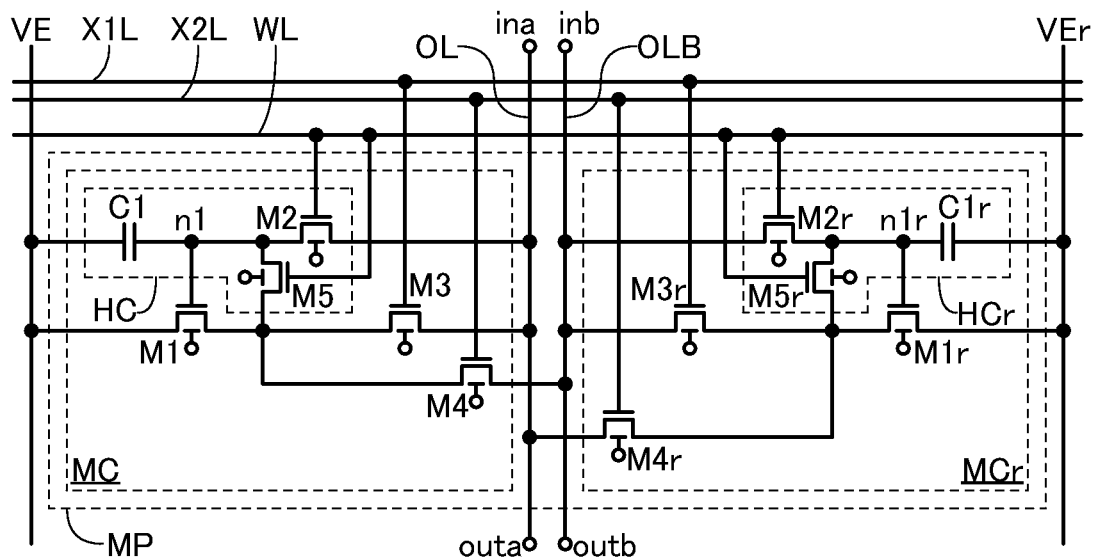

Note that the circuits MP illustrated in FIG. 22A and FIG. 22B may each have a configuration in which the wiring IL is combined into the wiring OL and the wiring ILB is combined into the wiring OLB. For example, by combining the wiring IL into the wiring OL and combining the wiring ILB into the wiring OLB in the circuit MP illustrated in FIG. 22A, the circuit MP having the configuration shown in FIG. 23A can be obtained. Alternatively, for example, by combining the wiring IL into the wiring OL and combining the wiring ILB into the wiring OLB in the circuit MP illustrated in FIG. 22B, the circuit MP having the configuration shown in FIG. 23B can be obtained. Note that the circuits MP in FIG. 23A and FIG. 23B each have a circuit configuration that can be applied to the circuit MP illustrated in FIG. 9A, and for the operations of the circuits MP in FIG. 23A and FIG. 23B, the description of the operation of the circuit MP in FIG. 15A is referred to.

Note that this configuration example can be combined with any of the other configuration examples and the like described in this specification as appropriate.

Configuration Example 4

Figure 24:
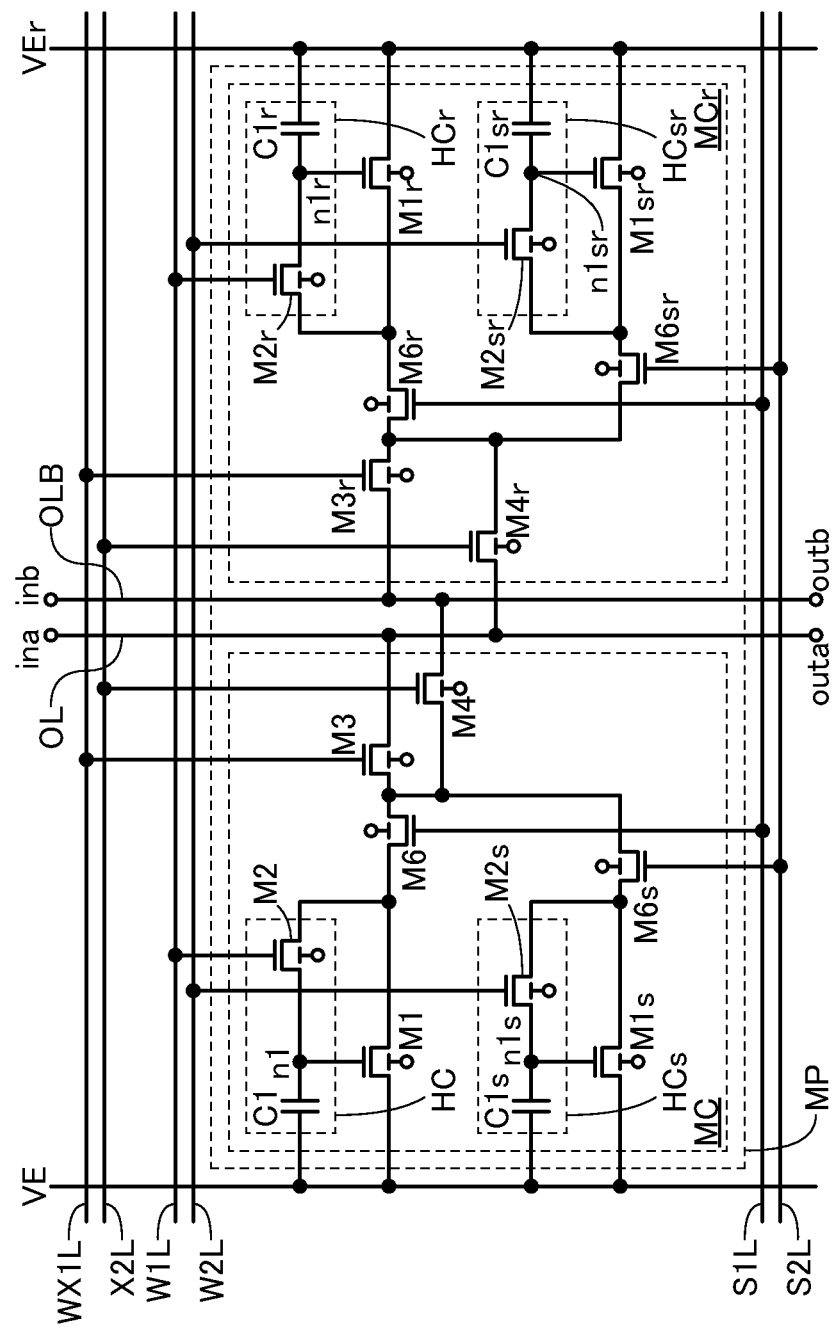
FIG. 24 is a circuit diagram showing a configuration example of a circuit included in a semiconductor device.

The circuit MP illustrated in FIG. 24 is an example of a circuit including a holding portion HCs and a holding portion HCsr in addition to the holding portion HC and the holding portion HCr, unlike the circuit MP in FIG. 15A.

The circuit MC included in the circuit MP in FIG. 24 includes a transistor M1s, a transistor M2s, a transistor M6, a transistor M6s, and a capacitor C1s in addition to the circuit elements included in the circuit MP in FIG. 21A. The circuit MCr included in the circuit MP in FIG. 20 includes circuit elements similar to those of the circuit MC, and thus includes a transistor M1sr, a transistor M2sr, a transistor M6r, a transistor M6sr, and a capacitor C1sr corresponding to the transistor M1s, the transistor M2s, the transistor M6, the transistor M6s, and the capacitor C1s of the circuit MC, respectively. Note that the transistor M2s and the capacitor C1s are included in the holding portion HCs and the transistor M2sr and the capacitor C1sr are included in the holding portion HCs.

In this specification and the like, unless otherwise specified, the transistor M2s, the transistor M6, the transistor M6s, the transistor M6r, and the transistor M6sr in an on state may operate in a linear region in the end. In other words, the gate voltage, the source voltage, and the drain voltage of each of the above transistors may be appropriately biased to voltages in the range where the transistor operates in the linear region.

Next, the configuration of the circuit MP in FIG. 24 is described. Note that the description of a portion of the circuit MP in FIG. 24 having a configuration similar to that of the circuit MP in FIG. 21A is omitted.

In the circuit MP in FIG. 24, the second terminal of the transistor M1 is electrically connected to the second terminal of the transistor M2 and a first terminal of the transistor M6. A second terminal of the transistor M6 is electrically connected to the first terminal of the transistor M3 and the second terminal of the transistor M4. A gate of the transistor M6 is electrically connected to a wiring S1L. A first terminal of the transistor M1s is electrically connected to the wiring VE. A second terminal of the transistor M1s is electrically connected to a first terminal of the transistor M6s. A gate of the transistor M1s is electrically connected to a first terminal of the capacitor C1s and a first terminal of the transistor M2s. A second terminal of the capacitor C1s is electrically connected to the wiring VE. The second terminal of the transistor M2 is electrically connected to the second terminal of the transistor M1s and the first terminal of the transistor M6s. A second terminal of the transistor M6s is electrically connected to the first terminal of the transistor M3 and the second terminal of the transistor M4. A gate of the transistor M6s is electrically connected to a wiring S2L.

In the circuit MP in FIG. 24, the circuit MCr has substantially the same circuit configuration as the circuit MC. Thus, "r" is added to the reference signs of the circuit elements and the like included in the circuit MCr to differentiate them from the circuit elements and the like included in the circuit MC.

The wiring S1L functions as a voltage line for supplying a potential for bringing the transistor M6 and the transistor M6r into an on state or an off state, and the wiring S2L functions as a voltage line for supplying a potential for bringing the transistor M6s and the transistor M6sr into an on state or an off state.

In the circuit MP in FIG. 24, the sizes, e.g., the channel lengths and the channel widths, of the transistor M6, the transistor M6s, the transistor M6r, and the transistor M6sr are preferably equal to each other. Such a circuit configuration might enable efficient layout.

For example, by applying the configuration of the circuit MP illustrated in FIG. 24 to the arithmetic circuit 150 illustrated in FIG. 11, the circuit MP of the arithmetic circuit 150 can hold two pieces of first data (for example, weight coefficients here). Specifically, the circuit MP in FIG. 24 can hold a potential corresponding to a first piece of first data (a weight coefficient) in the holding portion HC of the circuit MC and the holding portion HCr of the circuit MCr, and can hold a potential corresponding to a second piece of first data (a weight coefficient) in the holding portion HCs of the circuit MC and the holding portion HCsr of the circuit MC. In addition, the circuit MP in FIG. 24 can switch the first data (weight coefficients) used for arithmetic operation in accordance with potentials supplied from the wiring S1L and the wiring S2L. For example, potentials corresponding to the first data (weight coefficients) $w_1^{(k-1)(k)}_j$ to $w_m^{(k-1)(k)}_j$ are held in the holding portion HC and the holding portion HCr included in each of the circuit MP[1,j] to the circuit MP[m,j] of the arithmetic circuit 150, potentials corresponding to the first data (weight coefficients) $w_1^{(k-1)(k)}_h$ to $w_m^{(k-1)(k)}_h$ (here, h is an integer that is greater than or equal to 1 and not j) are held in the holding portion HCs and the holding portion HCsr included in each of the circuit MP[1,j] to the circuit MP[m,j] of the arithmetic circuit 110, and potentials corresponding to the signals $z_1^{(k-1)}$ to $z_m^{(k-1)}$ are input to the wiring XLS[1] to the wiring XLS[m] (the wiring WX1L and the wiring X2L of the circuit MP in FIG. 24). At this time, a high-level potential is applied to the wiring S1L to bring the transistor M6 and the transistor M6r into an on state and a low-level potential is applied to the wiring S2L to bring the transistor M6s and the transistor M6sr into an off state, whereby the circuit MP[1,j] to the circuit MP[m,j] of the arithmetic circuit 150 can perform arithmetic operation of the sum of products of the weight coefficients $w_1^{(k-1)(k)}_j$ $w_m^{(k-1)(k)}_j$ and the signals $z_1^{(k-1)}$ to $z_m^{(k-1)}$ and an activation function. Moreover, a low-level potential is applied to the wiring S1L to bring the transistor M6 and the transistor M6r into an off state and a high-level potential is applied to the wiring S2L to bring the transistor M6s and the transistor M6sr into an on state, whereby the circuit MP[1,j] to the circuit MP[m,j] of the arithmetic circuit 150 can perform arithmetic operation of the sum of products of the weight coefficients $w_1^{(k-1)(k)}_h$ to $w_1^{(k-1)(k)}_h$ and the signals $z_1^{(k-1)}$ to $z_m^{(k-1)}$ and an activation function.

As described above, the arithmetic circuit 150 for which the circuit MP in FIG. 24 is used can hold two weight coefficients and can perform arithmetic operation of the sum of products and an activation function by switching the weight coefficients. The arithmetic circuit 150 including the circuit MP in FIG. 24 is effective in the case where the number of neurons in the k-th layer is greater than n or in the case where arithmetic operation is performed in an intermediate layer different from the k-th layer, for example. In addition, although the circuit MC and the circuit MCr each include two holding portions in the circuit MP in FIG. 24, the circuit MC and the circuit MCr may each include three or more holding portions according to circumstances.

The circuit MP included in the semiconductor device of one embodiment of the present invention is not limited to the circuit MP in FIG. 24. The circuit configuration of the circuit MP of the semiconductor device of one embodiment of the present invention can be changed from that of the circuit MP in FIG. 24 according to circumstances.

Figure 25:
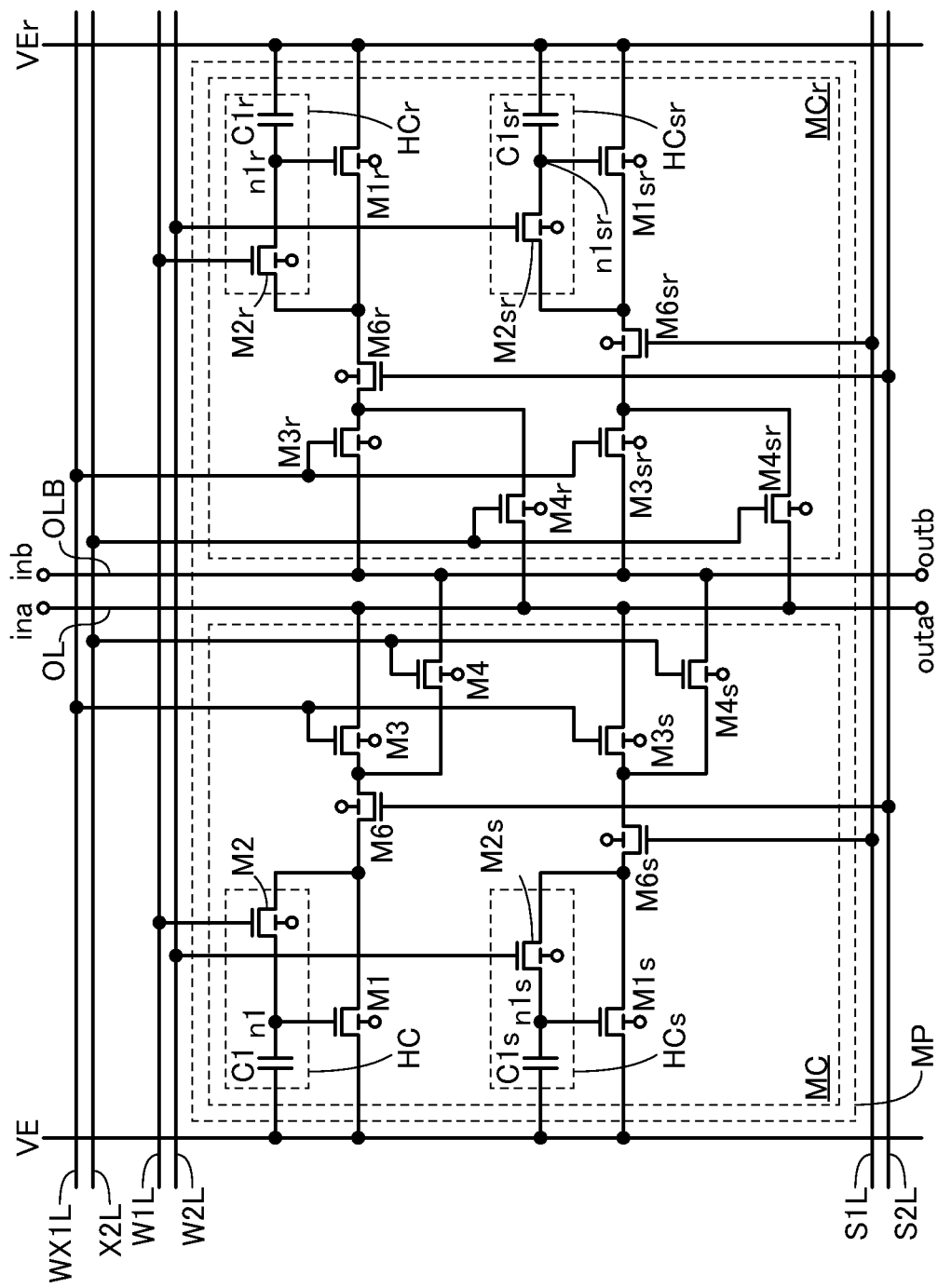
FIG. 25 is a circuit diagram showing a configuration example of a circuit included in a semiconductor device.

For example, the circuit MP illustrated in FIG. 25 has a circuit configuration changed from that of the circuit MP in FIG. 24. Specifically, in the circuit MP in FIG. 25, a transistor M3s, a transistor M4s, a transistor M3sr, and a transistor M4sr are added to the circuit MP in FIG. 24 and the electrical connections are changed. A first terminal of the transistor M3s is electrically connected to the second terminal of the transistor M6s and a first terminal of the transistor M4s, a second terminal of the transistor M3s is electrically connected to the wiring OL, and a gate of the transistor M3s is electrically connected to the wiring WX1L. A second terminal of the transistor M4s is electrically connected to the wiring OLB and a gate of the transistor M4s is electrically connected to the wiring X2L.

Note that in the circuit MP in FIG. 25, the circuit MCr has substantially the same circuit configuration as the circuit MC. Thus, "r" is added to the reference signs of the circuit elements and the like included in the circuit MCr to differentiate them from the circuit elements and the like included in the circuit MC. In addition, in the circuit MCr, a second terminal of the transistor M3sr is electrically connected to the wiring OL and a second terminal of the transistor M4sr is electrically connected to the wiring OLB.

In the circuit MP in FIG. 25, the sizes, e.g., the channel lengths and the channel widths, of the transistor M3, the transistor M3s, the transistor M3r, the transistor M3sr, the transistor M4, the transistor M4s, the transistor M4r, and the transistor M4sr are preferably equal to each other. Such a circuit configuration might enable efficient layout.

The circuit MP in FIG. 25 can hold two pieces of first data (weight coefficients) by performing operation similar to that of the circuit MP in FIG. 24, and can perform arithmetic operation of the sum of the products and an activation function by switching the first data (weight coefficients). In addition, although the circuit MC and the circuit MCr each include two holding portions in the circuit MP in FIG. 25, the circuit MC and the circuit MCr may each include three or more holding portions according to circumstances.

Note that this configuration example can be combined with any of the other configuration examples and the like described in this specification as appropriate.

Configuration Example 5

Figure 26:
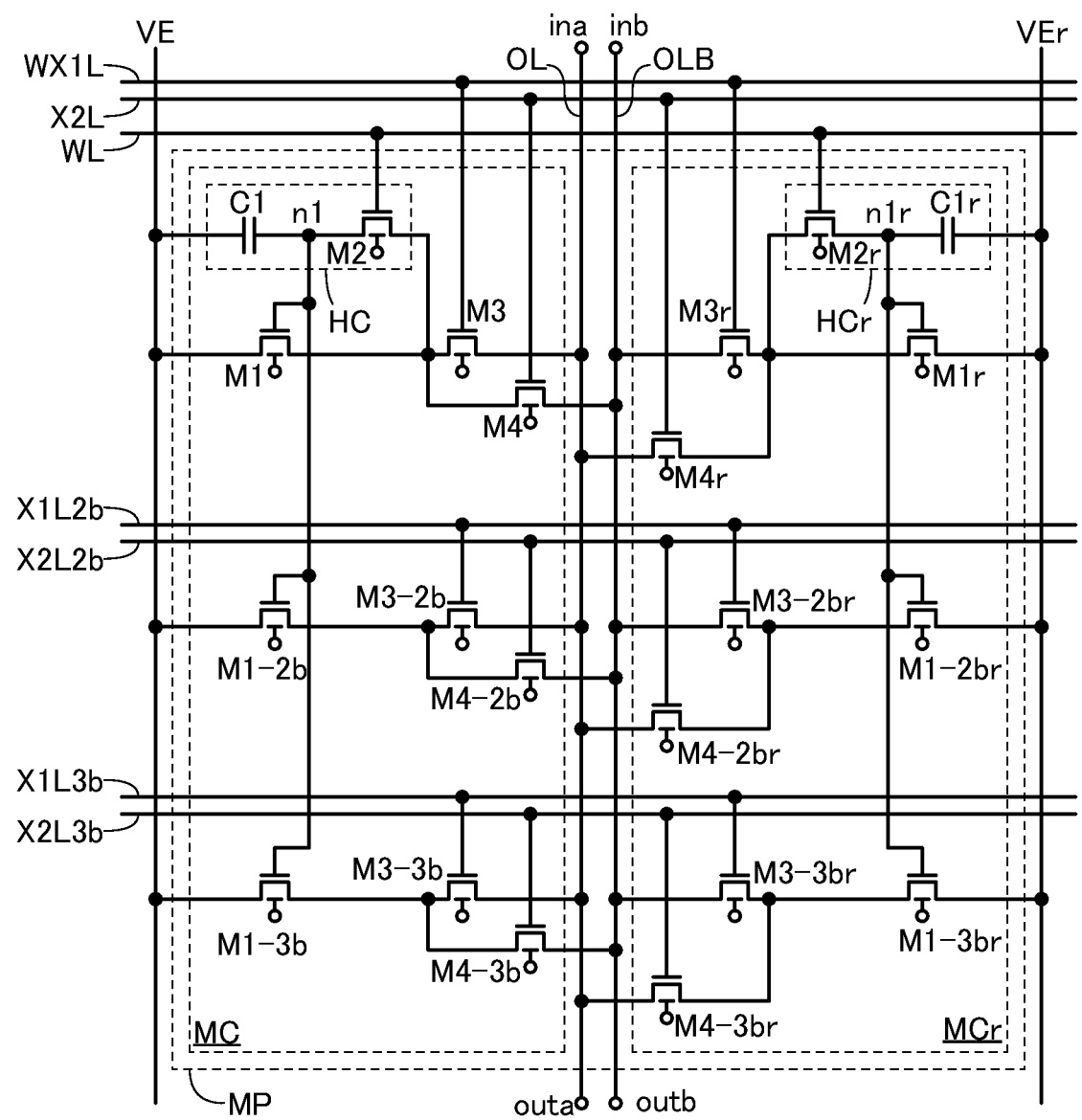
FIG. 26 is a circuit diagram showing a configuration example of a circuit included in a semiconductor device.

The circuit MP illustrated in FIG. 26 is different from the circuit MP in FIG. 21A in that the circuit MC includes the transistor M1, a transistor M1-2b, and a transistor M1-3b which differ in the ratio of the channel width (hereinafter referred to as W length) to the channel length (hereinafter referred to as L length), for example. Note that more transistors may be included in addition to the transistor M1, the transistor M1-2b, and the transistor M1-3b, or the transistor M1-3b and the transistor M1-2b are not necessarily included.

The circuit MC included in the circuit MP in FIG. 26 further includes a transistor M3-2b, a transistor M4-2b, a transistor M3-3b, and a transistor M4-3b in addition to the circuit elements included in the circuit MP in FIG. 21A.

In this specification and the like, unless otherwise specified, the transistor M1-2b and the transistor M1-3b in an on state may operate in a saturation region in the end, like the transistor M1. In other words, the gate voltage, the source voltage, and the drain voltage of each of the above transistors may be appropriately biased to voltages in the range where the transistor operates in a saturation region. However, one embodiment of the present invention is not limited thereto. The transistor M1-2b and the transistor M1-3b may operate in a linear region so that the amplitude value of a voltage to be supplied is decreased. Note that in the case where the first data (for example, a weight coefficient here) is an analog value, the transistor M1-2b and the transistor M1-3b may operate in a linear region in some cases and may operate in a saturation region in other cases depending on the magnitude of the first data (a weight coefficient).

In this specification and the like, unless otherwise specified, the transistor M3-2b, the transistor M4-2b, the transistor M3-3b, and the transistor M4-3b in an on state may operate in a linear region in the end. In other words, the gate voltage, the source voltage, and the drain voltage of each of the above transistors may be appropriately biased to voltages in the range where the transistor operates in the linear region.

Next, the configuration of the circuit MP in FIG. 26 is described. Note that the description of a portion of the circuit MP in FIG. 26 having a configuration similar to that of the circuit MP in FIG. 21A is omitted.

In the circuit MC of the circuit MP in FIG. 26, a first terminal of the transistor M1-2b is electrically connected to the wiring VE. A second terminal of the transistor M1-2b is electrically connected to a first terminal of the transistor M3-2b and a first terminal of the transistor M4-2b. A gate of the transistor M1-2b is electrically connected to the first terminal of the transistor M2 and the first terminal of the capacitor C1. A second terminal of the transistor M3-2b is electrically connected to the wiring OL. A gate of the transistor M3-2b is electrically connected to a wiring X1L2b. A second terminal of the transistor M4-2b is electrically connected to the wiring OLB. A gate of the transistor M4-2b is electrically connected to a wiring X2L2b. A first terminal of the transistor M1-3b is electrically connected to the wiring VE. A second terminal of the transistor M1-3b is electrically connected to a first terminal of the transistor M3-3b and a first terminal of the transistor M4-3b. A gate of the transistor M1-3b is electrically connected to the first terminal of the transistor M2 and the first terminal of the capacitor C1. A second terminal of the transistor M3-3b is electrically connected to the wiring OL. A gate of the transistor M3-3b is electrically connected to a wiring X1L3b. A second terminal of the transistor M4-3b is electrically connected to the wiring OLB. A gate of the transistor M4-3b is electrically connected to a wiring X2L3b.

Note that in the circuit MP in FIG. 26, the circuit MCr has substantially the same circuit configuration as the circuit MC. Thus, "r" is added to the reference signs of the circuit elements and the like included in the circuit MCr to differentiate them from the circuit elements and the like included in the circuit MC. In addition, a second terminal of a transistor M3-2br is electrically connected to the wiring OLB, a second terminal of a transistor M4-2br is electrically connected to the wiring OL, a second terminal of a transistor M3-3br is electrically connected to the wiring OLB, and a second terminal of a transistor M4-3br is electrically connected to the wiring OL.

In the circuit MP in FIG. 26, the sizes, e.g., the channel lengths and the channel widths, of the transistor M3, the transistor M3-2b, the transistor M3-3b, the transistor M3r, the transistor M3-2br, the transistor M3-3br, the transistor M4, the transistor M4-2b, the transistor M4-3b, the transistor M4r, the transistor M4-2br, and the transistor M4-3br are preferably equal to each other. Such a circuit configuration might enable efficient layout.

The wiring X1L2b is a wiring for switching the on state and the off state of the transistor M3-2b and the transistor M3-2br; the wiring X2L2b is a wiring for switching the on state and the off state of the transistor M4-2b and the transistor M4-2br; the wiring X1L3b is a wiring for switching the on state and the off state of the transistor M3-3b and the transistor M3-3br; and the wiring X2L3b is a wiring for switching the on state and the off state of the transistor M4-3b and the transistor M4-3br.

When the ratio of the W length to the L length of the transistor M1 is W/L, the ratio of the W length to the L length of the transistor M1-2b is preferably 2×W/L and the ratio of the W length to the L length of the transistor M1-3b is preferably 4×W/L. Since a current flowing between a source and a drain of a transistor is proportional to the ratio of the channel width to the channel length, in the case where the transistor M1, the transistor M1-2b, and the transistor M1-3b have the same structure or structure condition other than the ratio of the channel width to the channel length, a current flowing through the transistor M1-2b and a current flowing through the transistor M1-3b are respectively about twice and four times as large as the current flowing through the transistor M1. That is, the ratio of the amounts of currents flowing through the transistor M1, the transistor M1-2b, and the transistor M1-3b is approximately 1:2:4. Here, the case is considered where the circuit MC included in the circuit MP in FIG. 26 includes more transistors M1, for example, Q transistors (Q is an integer greater than or equal to 4). When a first transistor is the transistor M1, a second transistor is the transistor M1-2b, a third transistor is the transistor M1-3b, and the ratio of the W length to the L length of a q-th transistor (q is an integer greater than or equal to 4 and less than or equal to Q) is $2^{(q-1)}$ times as high as the ratio of the W length to the L length of the transistor M1, the ratio of the amounts of currents flowing through the first transistor, the second transistor, the third transistor, and the q-th transistor is $1:2:4:2^{(q-1)}$. That is, the circuit MC included in the circuit MP in FIG. 26 may include Q transistors so that the ratio of the amounts of currents flowing through the transistors becomes a power of two.

For example, when the amount of current flowing between the source and the drain of the transistor M1 is $I_{ut}$, from the above-described ratios of the channel widths to the channel lengths of the transistor M1, the transistor M1-2b, and the transistor M1-3b, the amounts of currents flowing through the transistor M1-2b and the transistor M1-3b are $2I_{ut}$ and $4I_{ut}$, respectively.

Furthermore, the ratio of the W length to the L length of the transistor M1r is preferably equal to the ratio of the W length to the L length of the transistor M1, the ratio of the W length to the L length of the transistor M1-2br is preferably equal to the ratio of the W length to the L length of the transistor M1-2b, and the ratio of the W length to the L length of the transistor M1-3br is preferably equal to the ratio of the W length to the L length of the transistor M1-3b.

Here, the amount of current flowing from the wiring OL to the circuit MC is considered. In this case, the positive first data (a positive weight coefficient) is set in the circuit MP, at least one of the transistor M3, the transistor M3-2b, and the transistor M3-3b is brought into an on state, and at least one of the transistor M4, the transistor M4-2b, and the transistor M4-3b is brought into an off state. At this time, the amount of current flowing from the wiring OL to the circuit MC changes depending on the combination of the on state and the off state of the transistor M3, the transistor M3-2b, and the transistor M3-3b.

For example, when the amount of current flowing between the source and the drain of the transistor M1 is set to $I_{ut}$, the amount of current flowing through the transistor M1-2b is $2I_{ut}$ and the amount of current flowing through the transistor M1-3b is $4I_{ut}$. Here, when a high-level potential is applied to the wiring WX1L, a low-level potential is applied to the wiring X2L, and furthermore, a low-level potential is applied to the wiring X1L2b, the wiring X2L2b, the wiring X1L3b, and the wiring X2L3b, the transistor M3 can be brought into an on state and the transistor M3-2b, the transistor M3-3b, the transistor M4, the transistor M4-2b, and the transistor M4-3b can be brought into an off state. At this time, the amount of current flowing from the wiring OL to the circuit MC is $I_{ut}$. Alternatively, for example, the amount of current flowing between the source and the drain of the transistor M1 is set to $I_{ut}$, a high-level potential is applied to the wiring WX1L and the wiring X1L2b, a low-level potential is applied to the wiring X2L and the wiring X2L2b, and furthermore, a low-level potential is applied to the wiring X1L3b and the wiring X2L3b. At this time, the transistor M3 and the transistor M3-2b can be brought into an on state and the transistor M3-3b, the transistor M4, the transistor M4-2b, and the transistor M4-3b can be brought into an off state, so that the amount of current flowing from the wiring OL to the circuit MC is $3I_{ut}$. Alternatively, for example, the amount of current flowing between the source and the drain of the transistor M1 is set to $I_{ut}$, a high-level potential is applied to the wiring X1L2b and the wiring X1L3b, a low-level potential is applied to the wiring X2L2b and the wiring X2L3b, and furthermore, a low-level potential is applied to the wiring WX1L and the wiring X2L. At this time, the transistor M3-2b and the transistor M3-3b can be brought into an on state and the transistor M3, the transistor M4, the transistor M4-2b, and the transistor M4-3b can be brought into an off state, so that the amount of current flowing from the wiring OL to the circuit MC is $6I_{ut}$.

Furthermore, for example, when the amount of current flowing between the source and the drain of the transistor M1 is set to $2I_{ut}$, the amount of current flowing through the transistor M1-2b is $4I_{ut}$ and the amount of current flowing through the transistor M1-3b is $8I_{ut}$. Here, when a high-level potential is applied to the wiring WX1L, a low-level potential is applied to the wiring X2L, and furthermore, a low-level potential is applied to the wiring X1L2b, the wiring X2L2b, the wiring X1L3b, and the wiring X2L3b, the transistor M3 can be brought into an on state and the transistor M3-2b, the transistor M3-3b, the transistor M4, the transistor M4-2b, and the transistor M4-3b can be brought into an off state. At this time, the amount of current flowing from the wiring OL to the circuit MC is $2I_{ut}$. Alternatively, for example, the amount of current flowing between the source and the drain of the transistor M1 is set to $2I_{ut}$, a high-level potential is applied to the wiring WX1L and the wiring X1L2b, a low-level potential is applied to the wiring X2L and the wiring X2L2b, and furthermore, a low-level potential is applied to the wiring X1L3b and the wiring X2L3b. At this time, the transistor M3 and the transistor M3-2b can be brought into an on state and the transistor M3-3b, the transistor M4, the transistor M4-2b, and the transistor M4-3b can be brought into an off state, so that the amount of current flowing from the wiring OL to the circuit MC is $6I_{ut}$. Alternatively, for example, the amount of current flowing between the source and the drain of the transistor M1 is set to $2I_{ut}$, a high-level potential is applied to the wiring X1L2b and the wiring X1L3b, a low-level potential is applied to the wiring X2L2b and the wiring X2L3b, and furthermore, a low-level potential is applied to the wiring WX1L and the wiring X2L. At this time, the transistor M3-2b and the transistor M3-3b can be brought into an on state and the transistor M3, the transistor M4, the transistor M4-2b, and the transistor M4-3b can be brought into an off state, so that the amount of current flowing from the wiring OL to the circuit MC is $12I_{ut}$.

That is, the circuit MP in FIG. 26 has a function of multiplying the set current between the source and the drain of the transistor M1 by an integer in accordance with the potentials of the wiring X1, the wiring X1L2b, and the wiring X1L3b and supplying the current multiplied by an integer from the wiring OL to the circuit MC. Note that by changing the ratio of the W length to the L length of each of the transistor M1, the transistor M1-2b, and the transistor M1-3b, the set current between the source and the drain of the transistor M1 can be supplied from the wiring OL to the circuit MC after multiplied by a real number, not by an integer.

Although the amount of current flowing from the wiring OL to the circuit MC is described in the above example, the amount of current flowing from the wiring OLB to the circuit MC can be considered in a similar manner. In this case, the positive first data (a positive weight coefficient) is set in the circuit MP, at least one of the transistor M4, the transistor M4-2b, and the transistor M4-3b is brought into an on state, and at least one of the transistor M3, the transistor M3-2b, and the transistor M3-3b is brought into an off state. At this time, the amount of current flowing from the wiring OLB to the circuit MC changes depending on the combination of the on state and the off state of the transistor M4, the transistor M4-2b, and the transistor M4-3b. In addition, the current flowing from the wiring OLB to the circuit MCr can be considered in a similar manner. In this case, the negative first data (a negative weight coefficient) is set in the circuit MP, at least one of the transistor M3, the transistor M3-2b, and the transistor M3-3b is brought into an on state, and at least one of the transistor M4, the transistor M4-2b, and the transistor M4-3b is brought into an off state. At this time, the amount of current flowing from the wiring OLB to the circuit MCr changes depending on the combination of the on state and the off state of the transistor M3, the transistor M3-2b, and the transistor M3-3b. Furthermore, a current flowing from the wiring OL to the circuit MCr can be considered in a similar manner. In this case, the negative first data (a negative weight coefficient) is set in the circuit MP, at least one of the transistor M4, the transistor M4-2b, and the transistor M4-3b is brought into an on state, and at least one of the transistor M3, the transistor M3-2b, and the transistor M3-3b is brought into an off state. At this time, the amount of current flowing from the wiring OL to the circuit MCr changes depending on the combination of the on state and the off state of the transistor M4, the transistor M4-2b, and the transistor M4-3b.

As described above, the circuit MP in FIG. 26 can multiply the set amount of current by an integer (by a real number) in accordance with the potentials of the wiring WX1L, the wiring X2L, the wiring X1L2b, the wiring X2L2b, the wiring X1L3b, and the wiring X2L3b, and can supply the current from the wiring OL to the circuit MC or the circuit MCr or supply the current from the wiring OLB to the circuit MC or the circuit MCr. Here, by determining the second data (for example, a value of a signal of a neuron here) depending on the combination of the potentials of the wiring WX1L, the wiring X2L, the wiring X1L2b, the wiring X2L2b, the wiring X1L3b, and the wiring X2L3b, the second data (a value of a signal of a neuron) can be processed as a multilevel value (15-level value in the configuration of the circuit MP in FIG. 26). That is, the circuit MP in FIG. 26 can be a circuit that can calculate the product of the multilevel first data (a weight coefficient) and the multilevel second data (a signal of a neuron).

The following table shows the changes in current amounts of the current $I_{OL}$ flowing from the wiring OL to the circuit MC or the circuit MCr and the current $I_{OLB}$ flowing from the wiring OLB to the circuit MC or the circuit MCr when the potentials of the wiring WX1L, the wiring X2L, the wiring X1L2b, the wiring X2L2b, the wiring X1L3b, and the wiring X2L3b corresponding to the second data (a value of a signal of a neuron) are input to the circuit MP, when the first data (a weight coefficient) set in the circuit MP is "+1" (the set amount of current between the source and the drain of the transistor M1 is $I_{ut}$ and the set amount of current between the source and the drain of the transistor M1r is 0. Note that the potential of the node n1 of the holding portion HC is $V_{ut}$ and the potential of the node n1r of the holding portion HCr is VSS). Note that in the following table, a high-level potential is denoted by high and a low-level potential is denoted by low.

TABLE 3

| Weight Coefficient | n1 | n1r | Signal | WX1L | X2L | X1L2b | X2L2b | X1L3b | X2L3b | Weight coefficient × signal | Amount of change in $I_{OL}$ | Amount of change in $I_{OLB}$ |
|---|---|---|---|---|---|---|---|---|---|---|---|---|
| +1 | $V_1$ | VSS | 0 | low | low | low | low | low | low | 0 | 0 | 0 |
| +1 | $V_1$ | VSS | +1 | high | low | low | low | low | low | +1 | $I_{ut}$ | 0 |
| +1 | $V_1$ | VSS | +2 | low | low | high | low | low | low | +2 | $2I_{ut}$ | 0 |
| +1 | $V_1$ | VSS | +3 | high | low | high | low | low | low | +3 | $3I_{ut}$ | 0 |
| +1 | $V_1$ | VSS | +4 | low | low | low | low | high | low | +4 | $4I_{ut}$ | 0 |
| +1 | $V_1$ | VSS | +5 | high | low | low | low | high | low | +5 | $5I_{ut}$ | 0 |
| +1 | $V_1$ | VSS | +6 | low | low | high | low | high | low | +6 | $6I_{ut}$ | 0 |
| +1 | $V_1$ | VSS | +7 | high | low | high | low | high | low | +7 | $7I_{ut}$ | 0 |
| +1 | $V_1$ | VSS | −1 | low | high | low | low | low | low | −1 | 0 | $I_{ut}$ |
| +1 | $V_1$ | VSS | −2 | low | low | low | high | low | low | −2 | 0 | $2I_{ut}$ |
| +1 | $V_1$ | VSS | −3 | low | high | low | high | low | low | −3 | 0 | $3I_{ut}$ |
| +1 | $V_1$ | VSS | −4 | low | low | low | low | tew | high | −4 | 0 | $4I_{ut}$ |
| +1 | $V_1$ | VSS | −5 | low | high | low | low | low | high | −5 | 0 | $5I_{ut}$ |
| +1 | $V_1$ | VSS | −6 | low | low | low | high | low | high | −6 | 0 | $6I_{ut}$ |
| +1 | $V_1$ | VSS | −7 | low | high | low | high | low | high | −7 | 0 | $7I_{ut}$ |

In addition, the following table shows the changes in current amounts of the current $I_{OL}$ flowing from the wiring OL to the circuit MC or the circuit MCr and the current $I_{OLB}$ flowing from the wiring OLB to the circuit MC or the circuit MCr when the potentials of the wiring WX1L, the wiring X2L, the wiring X1L2b, the wiring X2L2b, the wiring X1L3b, and the wiring X2L3b corresponding to the second data (a value of a signal of a neuron) are input to the circuit MP, when the first data (a weight coefficient) set in the circuit MP is "−1" (the set amount of current between the source and the drain of the transistor M1 is 0 and the set amount of current between the source and the drain of the transistor M1r is $I_{ut}$. Note that the potential of the node n1 of the holding portion HC is VSS and the potential of the node n1r of the holding portion HCr is $V_{ut}$). Note that in the following table, a high-level potential is denoted by high and a low-level potential is denoted by low.

TABLE 4

| Weight Coefficient | n1 | n1r | Signal | WX1L | X2L | X1L2b | X2L2b | X1L3b | X2L3b | Weight coefficient × signal | Amount of change in $I_{OL}$ | Amount of change in $I_{OLB}$ |
|---|---|---|---|---|---|---|---|---|---|---|---|---|
| −1 | VSS | $V_1$ | 0 | low | low | low | low | low | low | 0 | 0 | 0 |
| −1 | VSS | $V_1$ | +1 | high | low | low | low | low | low | −1 | 0 | $I_{ut}$ |
| −1 | VSS | $V_1$ | +2 | low | low | high | low | low | low | −2 | 0 | $2I_{ut}$ |
| −1 | VSS | $V_1$ | +3 | high | low | high | low | low | low | −3 | 0 | $3I_{ut}$ |
| −1 | VSS | $V_1$ | +4 | low | low | low | low | high | low | −4 | 0 | $4I_{ut}$ |
| −1 | VSS | $V_1$ | +5 | high | low | low | low | high | low | −5 | 0 | $5I_{ut}$ |
| −1 | VSS | $V_1$ | +6 | low | low | high | low | high | low | −6 | 0 | $6I_{ut}$ |
| −1 | VSS | $V_1$ | +7 | high | low | high | low | high | low | −7 | 0 | $7I_{ut}$ |
| −1 | VSS | $V_1$ | −1 | low | high | low | low | low | low | +1 | $1_{ut}$ | 0 |
| −1 | VSS | $V_1$ | −2 | low | low | low | high | low | low | +2 | $2I_{ut}$ | 0 |
| −1 | VSS | $V_1$ | −3 | low | high | low | high | low | low | +3 | $3I_{ut}$ | 0 |
| −1 | VSS | $V_1$ | −4 | low | low | low | low | low | high | +4 | $4I_{ut}$ | 0 |
| −1 | VSS | $V_1$ | −5 | low | high | low | low | low | high | +5 | $5I_{ut}$ | 0 |
| −1 | VSS | $V_1$ | −6 | low | low | low | high | low | high | +6 | $6I_{ut}$ | 0 |
| −1 | VSS | $V_1$ | −7 | low | high | low | high | low | high | +7 | $7I_{ut}$ | 0 |

When the amount of current flowing between the source and the drain of the transistor M1 is 0, the potential of the node n1 is VSS, for example. In this case, the amount of current flowing between the sources and the drains of the transistor M1-2b and the transistor M1-3b as well as the transistor M1 can also be 0. Thus, a current does not flow from the wiring OL or the wiring OLB to the circuit MC regardless of the on state or the off state of the transistor M3, the transistor M3-2b, the transistor M3-3b, the transistor M4, the transistor M4-2b, and the transistor M4-3b.

As described above, by applying a low-level potential or a high-level potential to each of the wiring WX1L, the wiring X2L, the wiring X1L2b, the wiring X2L2b, the wiring X1L3b, and the wiring X2L3b, the circuit MP in FIG. 26 can express the second data (a value of a signal of a neuron) as a 15-level value and can calculate the product of the multilevel first data (a weight coefficient) and the multilevel second data (a value of a signal of a neuron).

The circuit MP included in the semiconductor device of one embodiment of the present invention is not limited to the circuit MP in FIG. 26. The circuit configuration of the circuit MP of the semiconductor device of one embodiment of the present invention can be changed from the circuit MP in FIG. 26 according to circumstances.

Figure 27:
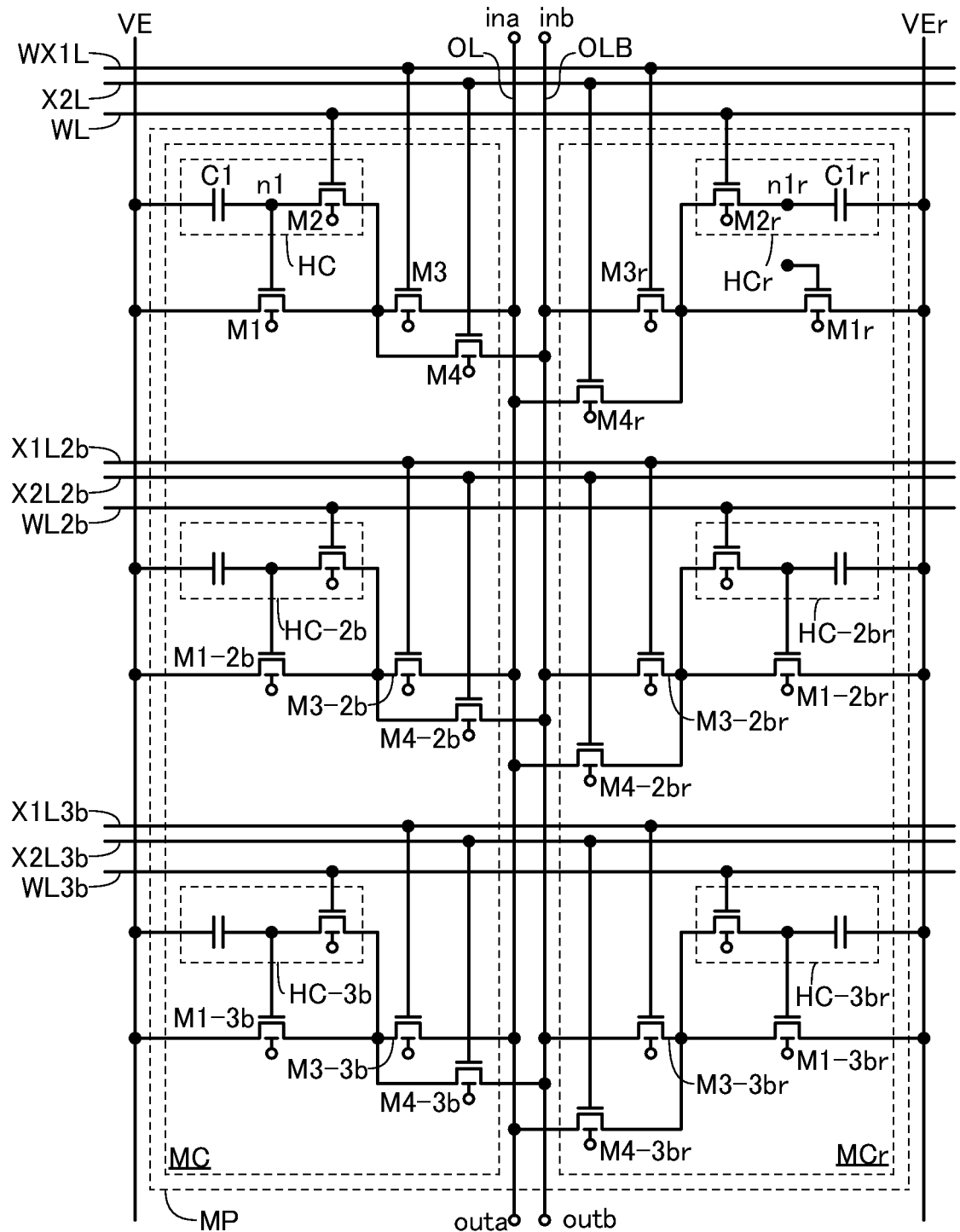
FIG. 27 is a circuit diagram showing a configuration example of a circuit included in a semiconductor device.

For example, the circuit MP illustrated in FIG. 27 has a circuit configuration changed from that of the circuit MP in FIG. 26. Specifically, the circuit MP in FIG. 27 has a configuration in which a holding portion HC-2b, a holding portion HC-3b, a holding portion HC-2br, and a holding portion HC-3br are added to the circuit MP in FIG. 26. Since the configurations of the holding portion HC-2b, the holding portion HC-3b, the holding portion HC-2br, and the holding portion HC-3br are similar to those of the holding portion HC and the holding portion HCr, the descriptions of the holding portion HC and the holding portion HCr are referred to.

In the circuit MC, the electrical connection configuration around the transistor M1-2b, the transistor M3-2b, the transistor M4-2b, and the holding portion HC-2b is similar to the electrical connection configuration around the transistors M1, M3, and M4 and the holding portion HC. In addition, the electrical connection configuration around the transistor M1-3b, the transistor M3-3b, the transistor M4-3b, and the holding portion HC-3b is similar to the electrical connection configuration around the transistor M1, the transistor M3, the transistor M4, and the holding portion HC. In the circuit MCr, the electrical connection configuration around the transistor M1-2br, the transistor M3-2br, the transistor M4-2br, and the holding portion HC-2br is similar to the electrical connection configuration around the transistor M1r, the transistor M3r, the transistor M4r, and the holding portion HCr. In addition, the electrical connection configuration around the transistor M1-3br, the transistor M3-3br, the transistor M4-3br, and the holding portion HC-3br is similar to the electrical connection configuration around the transistor M1r, the transistor M3r, the transistor M4r, and the holding portion HCr.

Moreover, the holding portion HC-2b is electrically connected to a wiring WL2b, the holding portion HC-3b is electrically connected to a wiring WL3b, the holding portion HC-2br is electrically connected to the wiring WL2b, and the holding portion HC-3br is electrically connected to the wiring WL3b.

The circuit MP in FIG. 27 can operate in a manner similar to that of the circuit MP in FIG. 26 by, for example, setting the ratios of the W lengths to the L lengths of the transistor M1, the transistor M1-2b, and the transistor M1-3b respectively to W/L, 2×W/L, and 4×W/L; holding in the holding portion HC a potential with which the amount of current flowing between the source and the drain of the transistor M1 is set to $I_{ut}$; and holding in the holding portion HC-2b and the holding portion HC-3b a potential almost equal to the potential, as in the circuit MP in FIG. 26.

Almost equal potentials are written to the holding portion HC, the holding portion HC-2b, and the holding portion HC-3b, and thus the wiring WL, the wiring WL2b, and the wiring WL3b may be combined into one wiring (not illustrated).

Alternatively, in the case where the ratios of the W lengths to the L lengths of the transistor M1, the transistor M1-2b, and the transistor M1-3b are set to be equal to each other and the amount of current flowing between the source and the drain of the transistor M1 is set to I, for example, the operation can be similar to that of the circuit MP in FIG. 26 by setting the amount of current flowing between the source and the drain of the transistor M1-2b to 2I and setting the amount of current flowing between the source and the drain of the transistor M1-3b to 4I.

Figure 28:
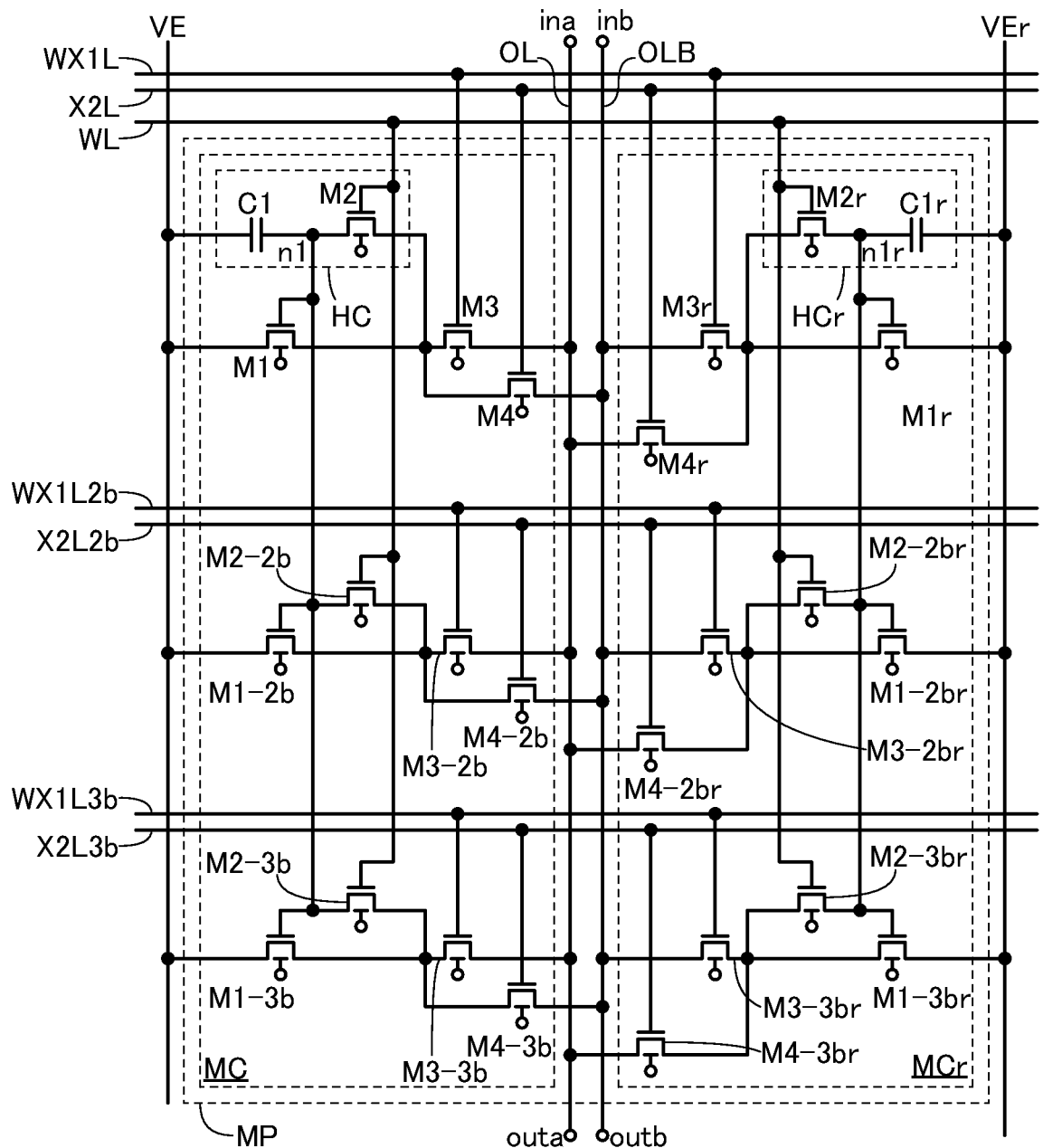
FIG. 28 is a circuit diagram showing a configuration example of a circuit included in a semiconductor device.

Alternatively, as a circuit configuration changed from that of the circuit MP in FIG. 26 and different from that of the circuit MP in FIG. 27, the circuit MP illustrated in FIG. 28 may be employed. The circuit MP in FIG. 28 has a configuration in which a transistor M2-2b, a transistor M2-3b, a transistor M2-2br, and a transistor M2-3br are added to the circuit MP in FIG. 26. Note that the ratios of the W lengths to the L lengths of the transistor M1, the transistor M1-2b, and the transistor M1-3b are respectively W/L, 2×W/L, and 4×W/L as in FIG. 26, for example. Note that the amount of current is determined by the set amount and does not depend on the W length and the L length. Thus, the ratios of the W lengths to the L lengths of the transistor M1, the transistor M1-2b, and the transistor M1-3b may be the same. However, in that case, the gate potentials of the transistors are different from each other depending on the amount of current. In the case where the gate potentials of the transistors are to be almost equal to each other, the ratios of the W lengths to the L lengths are desirably W/L, 2×W/L, and 4×W/L.

In this specification and the like, unless otherwise specified, the transistor M2-2b, the transistor M2-3b, the transistor M2-2br, and the transistor M2-3br may operate in the linear region in the end, like the transistor M2 and the transistor M2r. In other words, the gate voltage, the source voltage, and the drain voltage of each of the above transistors may be appropriately biased to voltages in the range where the transistor operates in the linear region.

In the circuit MC, a first terminal of the transistor M2-2b is electrically connected to a first terminal of the transistor M2-3b, the first terminal of the transistor M2, the gate of the transistor M1, the gate of the transistor M1-2b, the gate of the transistor M1-3b, and the first terminal of the capacitor C1. A second terminal of the transistor M2-2b is electrically connected to the second terminal of the transistor M1-2b, the first terminal of the transistor M3-2b, and the first terminal of the transistor M3-2b. A second terminal of the transistor M2-3b is electrically connected to the second terminal of the transistor M1-3b, the first terminal of the transistor M3-3b, and the first terminal of the transistor M3-3b. A gate of the transistor M2-2b and a gate of the transistor M2-3b are electrically connected to the wiring WL.

Similarly, in the circuit MCr, a first terminal of the transistor M2-2br is electrically connected to a first terminal of the transistor M2-3br, a first terminal of the transistor M2r, the gate of the transistor M1r, a gate of the transistor M1-2br, a gate of the transistor M1-3br, and the first terminal of the capacitor C1. A second terminal of the transistor M2-2br is electrically connected to a second terminal of the transistor M1-2br, a first terminal of the transistor M3-2br, and the first terminal of the transistor M3-2br. A second terminal of the transistor M2-3br is electrically connected to the second terminal of the transistor M1-3br, a first terminal of the transistor M3-3br, and the first terminal of the transistor M3-3br. A gate of the transistor M2-2br and a gate of the transistor M2-3br are electrically connected to the wiring WL.

In FIG. 28, the wiring X1L2b and the wiring X1L3b illustrated in FIG. 26 are illustrated as a wiring WX1L2b and a wiring WX1L3b, respectively.

When currents flowing through the transistor M1, the transistor M1-2b, the transistor M1-3b, the transistor M1r, the transistor M1-2br, and the transistor M1-3br are to be set, a high-level potential is input to the wiring WL, the wiring WX1L, the wiring WX1L2b, and the wiring WX1L3b so that the transistor M2, the transistor M2-2b, the transistor M2-3b, the transistor M3, the transistor M3-2b, and the transistor M3-3b are each brought into an on state. Furthermore, a low-level potential is input to the wiring X2L, the wiring X2L2b, and the wiring X2L3b so that the transistor M4, the transistor M4-2b, the transistor M4-3b, the transistor M4r, the transistor M4-2br, and the transistor M4-3br are brought into an off state.

At this time, the total sum of the currents to be set in the transistor M1, the transistor M1-2b, and the transistor M1-3b, e.g., $7I_{ut}$, is supplied from the wiring OL to the circuit MC, so that the node n1 of the holding portion HC has a predetermined potential. Here, a low-level potential is input to the wiring WL so that the transistor M2 is brought into an off state, whereby the predetermined potential is held in the node n1 of the holding portion HC. Accordingly, currents of $I_{ut}$, $2I_{ut}$, and $4I_{ut}$ are set to flow between the sources and the drains of the transistor M1, the transistor M1-2b, and the transistor M1-3b, respectively.

Similarly, the total sum of the currents to be set in the transistor M1r, the transistor M1-2br, and the transistor M1-3br, e.g., $7I_{ut}$, is supplied from the wiring OLB to the circuit MCr, so that the node n1r of the holding portion HCr has a predetermined potential. Then, a low-level potential is input to the wiring WL so that the predetermined potential is held in the node n1 of the holding portion HCr, whereby currents of $I_{ut}$, $2I_{ut}$, and $4I_{ut}$ are set to flow between the sources and the drains of the transistor M1r, the transistor M1-2br, and the transistor M1-3br, respectively.

The circuit MP having the configuration in FIG. 28 can operate in a manner similar to that of the circuit MP in FIG. 26. Furthermore, in the circuit MP having the configuration in FIG. 28, the influence of structure variations caused at the time of forming the transistor M1, the transistor M1-2b, and the transistor M1-3b can be reduced in the circuit MC. Similarly, the influence of structure variations caused at the time of forming the transistor M1r, the transistor M1-2br, and the transistor M1-3br can be reduced in the circuit MCr.

As another modification example of the circuit MP in FIG. 26, the holding portion HC and the holding portion HCr may each have a different configuration. The circuit MP illustrated in FIG. 29 has a configuration in which the holding portion HC and the holding portion HCr included in the circuit MP in FIG. 26 are replaced with a circuit HCS and a circuit HCSr, respectively. Note that the ratios of the W lengths to the L lengths of the transistor M1, the transistor M1-2b, and the transistor M1-3b are W/L, 2×W/L, and 4×W/L, respectively, as in FIG. 26.

The circuit HCS is electrically connected to the wiring OL and the wiring OLB, for example. The circuit HCS has a function of receiving information (a potential, a current, or the like) input from one or both of the wiring OL and the wiring OLB and holding a potential corresponding to the information. In addition, the circuit HCS is electrically connected to the gates of the transistor M1, the transistor M1-2b, and the transistor M1-3b. The circuit HCS has a function of applying the held potential to the gates of the transistor M1, the transistor M1-2b, and the transistor M1-3b. Thus, a source-drain current based on the potential supplied from the circuit HCS and the ratio of the W length to the L length flows through each of the transistor M1, the transistor M1-2b, and the transistor M1-3b. Note that the circuit HCSr has a function similar to that of the circuit HCS, and a source-drain current based on the potential supplied from the circuit HCSr and the ratio of the W length to the L length flows through each of the transistor M1r, the transistor M1-2br, and the transistor M1-3br.

Figure 29:
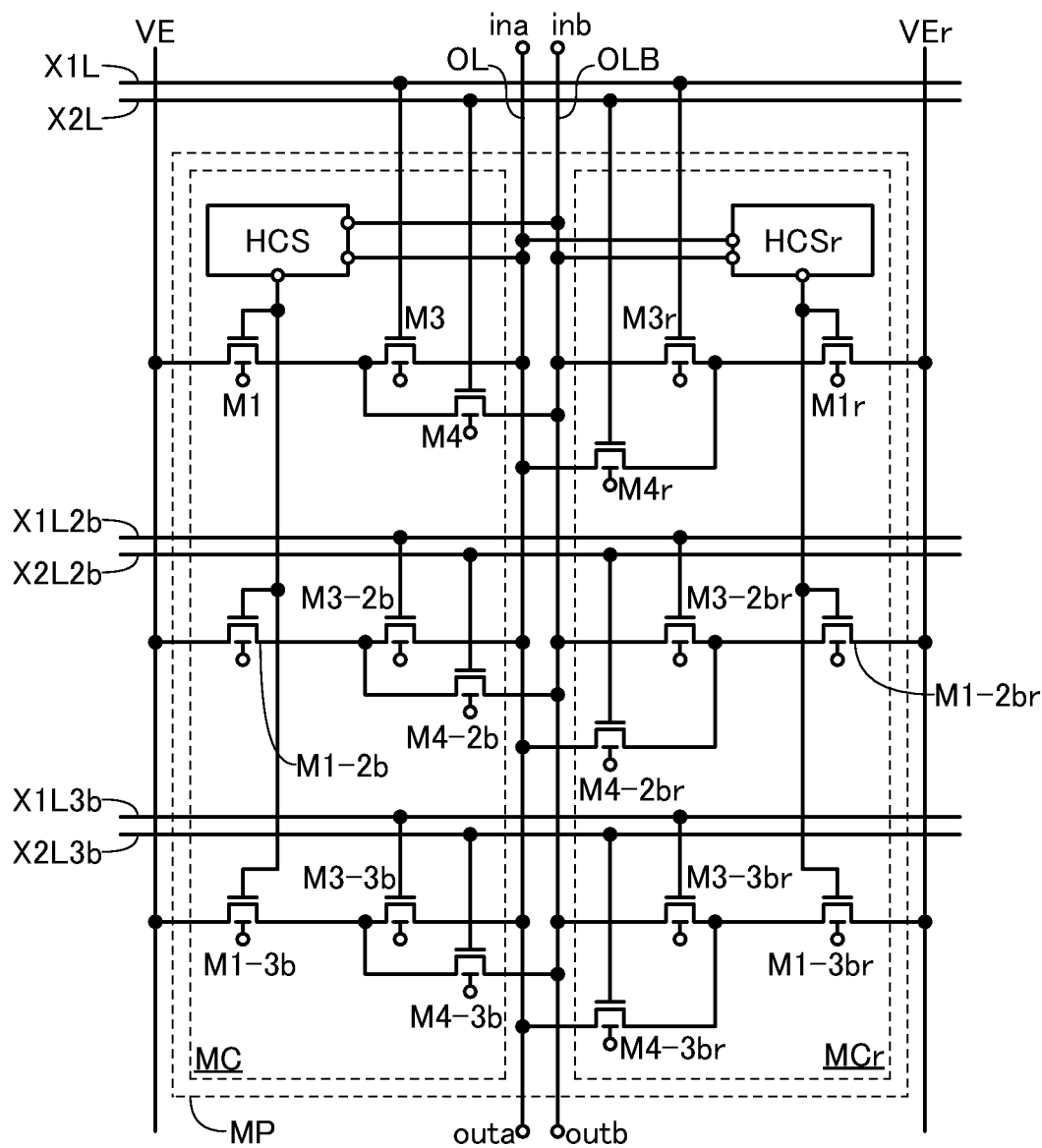
FIG. 29 is a circuit diagram showing a configuration example of a circuit included in a semiconductor device.
Figure 30A:
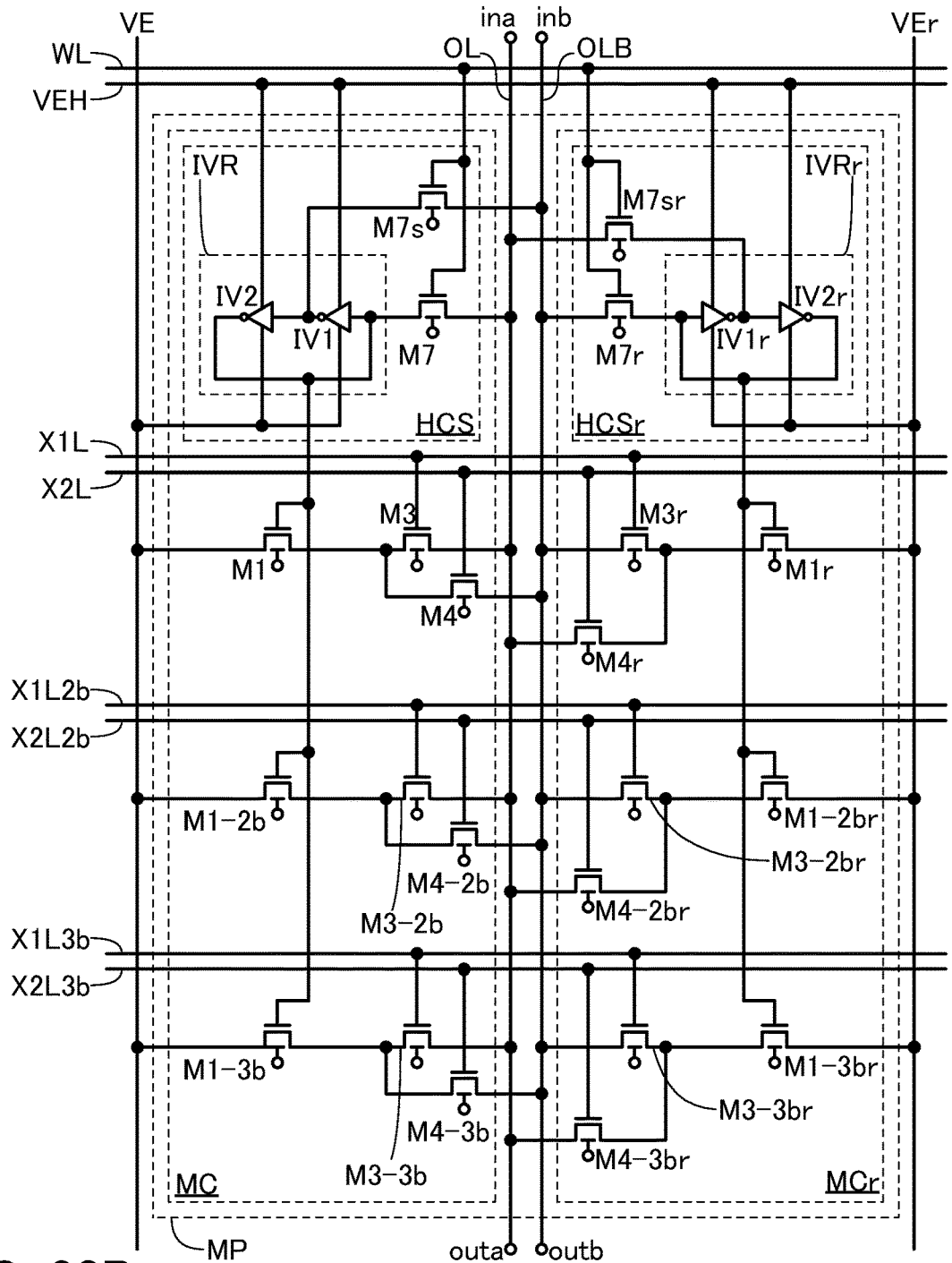
FIG. 30A and FIG. 30B are circuit diagrams showing configuration examples of circuits included in a semiconductor device.

FIG. 30A illustrates specific examples of the circuit HCS and the circuit HCSr included in the circuit MP illustrated in FIG. 29. The circuit HCS and the circuit HCSr illustrated in FIG. 30A each have a configuration including an SRAM (Static Random Access Memory), for example. Note that FIG. 30A illustrates the whole circuit MP to show the electrical connection configuration of the circuit elements included in the circuit HCS and the circuit HCSr.

Note that in the case where the circuit HCS and the circuit HCSr each have a configuration including an SRAM, the SRAM holds one of a high-level potential and a low-level potential; thus, the first data (a weight coefficient) set in the circuit MP is limited to have two levels (e.g., a combination of "−1" and "+1") or three levels (e.g., a combination of "−1", "0", and "+1"), for example. When the first data (a weight coefficient) set in the circuit MP is "+1", for example, a high-level potential is held in the circuit HCS and a low-level potential is held in the circuit HCSr. Alternatively, when the first data (a weight coefficient) set in the circuit MP is "−1", for example, a low-level potential is held in the circuit HCS and a high-level potential is held in the circuit HCSr. Alternatively, when the first data (a weight coefficient) set in the circuit MP is "0", for example, a low-level potential is held in the circuit HCS and a low-level potential is held in the circuit HCSr.

The circuit HCS includes a transistor M7, a transistor M7s, and an inverter loop circuit IVR. The inverter loop circuit IVR includes an inverter circuit IV1 and an inverter circuit IV2.

In this specification and the like, unless otherwise specified, the transistor M7 and the transistor M7s in an on state may operate in a linear region in the end. In other words, the gate voltage, the source voltage, and the drain voltage of each of the above transistors may be appropriately biased to voltages in the range where the transistor operates in the linear region.

Figure 30B:
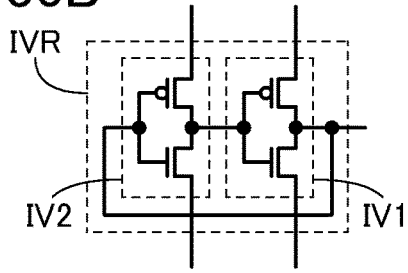

The inverter circuit IV1 and the inverter circuit IV2 each have a function of outputting, from its output terminal, an inverted signal of an input signal that is input to an input terminal. Thus, an inverter circuit can be used as each of the inverter circuit IV1 and the inverter circuit IV2, for example. FIG. 30B shows configuration examples of the inverter circuit IV1 and the inverter circuit IV2. As shown in FIG. 30B, the inverter circuit IV1 and the inverter circuit IV2 can each be configured as a CMOS (Complementary MOS) circuit. However, one embodiment of the present invention is not limited thereto, and a single-polarity circuit formed of only n-channel transistors or only p-channel transistors may be used instead of a CMOS circuit.

Alternatively, the inverter circuit IV1 and the inverter circuit IV2 may each be a NAND circuit, a NOR circuit, an XOR circuit, or a circuit in which these are combined. Specifically, in the case where the inverter circuit is replaced with a NAND circuit, a high-level potential is input to one of two input terminals of the NAND circuit as a fixed potential, so that the NAND circuit can function as an inverter circuit. In the case where the inverter circuit is replaced with a NOR circuit, a low-level potential is input to one of two input terminals of the NOR circuit as a fixed potential, so that the NOR circuit can function as an inverter circuit. In the case where the inverter circuit is replaced with an XOR circuit, a high-level potential is input to one of two input terminals of the XOR circuit as a fixed potential, so that the XOR circuit can function as an inverter circuit.

As described above, an inverter circuit described in this specification and the like can be replaced with a logic circuit such as a NAND circuit, a NOR circuit, an XOR circuit, or a circuit in which these are combined. Therefore, in this specification and the like, the term "inverter circuit" can be referred to as a "logic circuit".

A first terminal of the transistor M7 is electrically connected to the wiring OL; a second terminal of the transistor M7 is electrically connected to the input terminal of the inverter circuit IV1, the output terminal of the inverter circuit IV2, the gate of the transistor M1, the gate of the transistor M1-2b, and the gate of the transistor M1-3b; and a gate of the transistor M7 is electrically connected to the wiring WL. A first terminal of the transistor M7s is electrically connected to the wiring OLB, a second terminal of the transistor M7s is electrically connected to the output terminal of the inverter circuit IV1 and the input terminal of the inverter circuit IV2, and a gate of the transistor M7s is electrically connected to the wiring WL. A wiring VEH is electrically connected to high power supply potential input terminals of the inverter circuit IV1 and the inverter circuit IV2, and the wiring VE is electrically connected to low power supply potential input terminals of the inverter circuit IV1 and the inverter circuit IV2.

The wiring VEH functions as a wiring for supplying a constant voltage, for example. The constant voltage can be, for example, VDD that is a high-level potential, or VDDL that is a potential higher than the low-level potential VSS and lower than VDD. The constant voltage is preferably set as appropriate in accordance with the configuration of the circuit MP. Note that the wiring VAL may be supplied with not a constant voltage but a pulse signal, for example. Note that in the description of this configuration example, the wiring VEH functions as a wiring for supplying the potential VDD.

Note that in the circuit MP in FIG. 30, the circuit HCs has substantially the same circuit configuration as the circuit HCSr. Thus, "r" is added to the reference signs of the circuit elements included in the circuit HCSr to differentiate them from the circuit elements included in the circuit HCS. In addition, a first terminal of a transistor M7r is electrically connected to the wiring OLB and a first terminal of a transistor M7sr is electrically connected to the wiring OL.

When information (e.g., a potential or a current) is written to the circuit HCS and the circuit HCSr, a high-level potential is applied to the wiring WL so that the transistor M7, the transistor M7s, the transistor M7r, and the transistor M7sr are brought into an on state. After that, one of a high-level potential and a low-level potential is input to the wiring OL and the other of the high-level potential and the low-level potential is input to the wiring OLB. It is particularly preferable that the high-level potential be almost equal to a potential supplied from the wiring VEH. Here, the high-level potential is described as the potential VDDL and the low-level potential is described as the potential VSS, for example.

After one of VDDL and VSS is written to the circuit HCS and the other of VDDL and VSS is written to the circuit HCSr, a low-level potential is applied to the wiring WL so that the transistor M7, the transistor M7s, the transistor M7r, and the transistor M7sr are brought into an off state. Accordingly, the circuit HCS can hold one of VDDL and VSS in the inverter loop circuit IVR and the circuit HCS can hold the other of VDDL and VSS in an inverter loop circuit IVRr.

After a predetermined potential is held in each of the circuit HCS and the circuit HCSr, as in the circuit MP in FIG. 26, a high-level potential is input to one of the wiring X1L (the wiring WX1L in FIG. 26) and the wiring X2L and a low-level potential is input to the other, a high-level potential is input to one of the wiring X1L2b and the wiring X2L2b and a low-level potential is input to the other, and a high-level potential is input to one of the wiring X1L3b and the wiring X2L3b and a low-level potential is input to the other, whereby the amount of current flowing from the circuit MC or the circuit MCr to the wiring OL or the wiring OLB can be processed as the product of the binary or ternary first data (a weight coefficient) and the multilevel (15-level in the configuration example in FIG. 30) second data (a value of a signal of a neuron).

Figure 31:
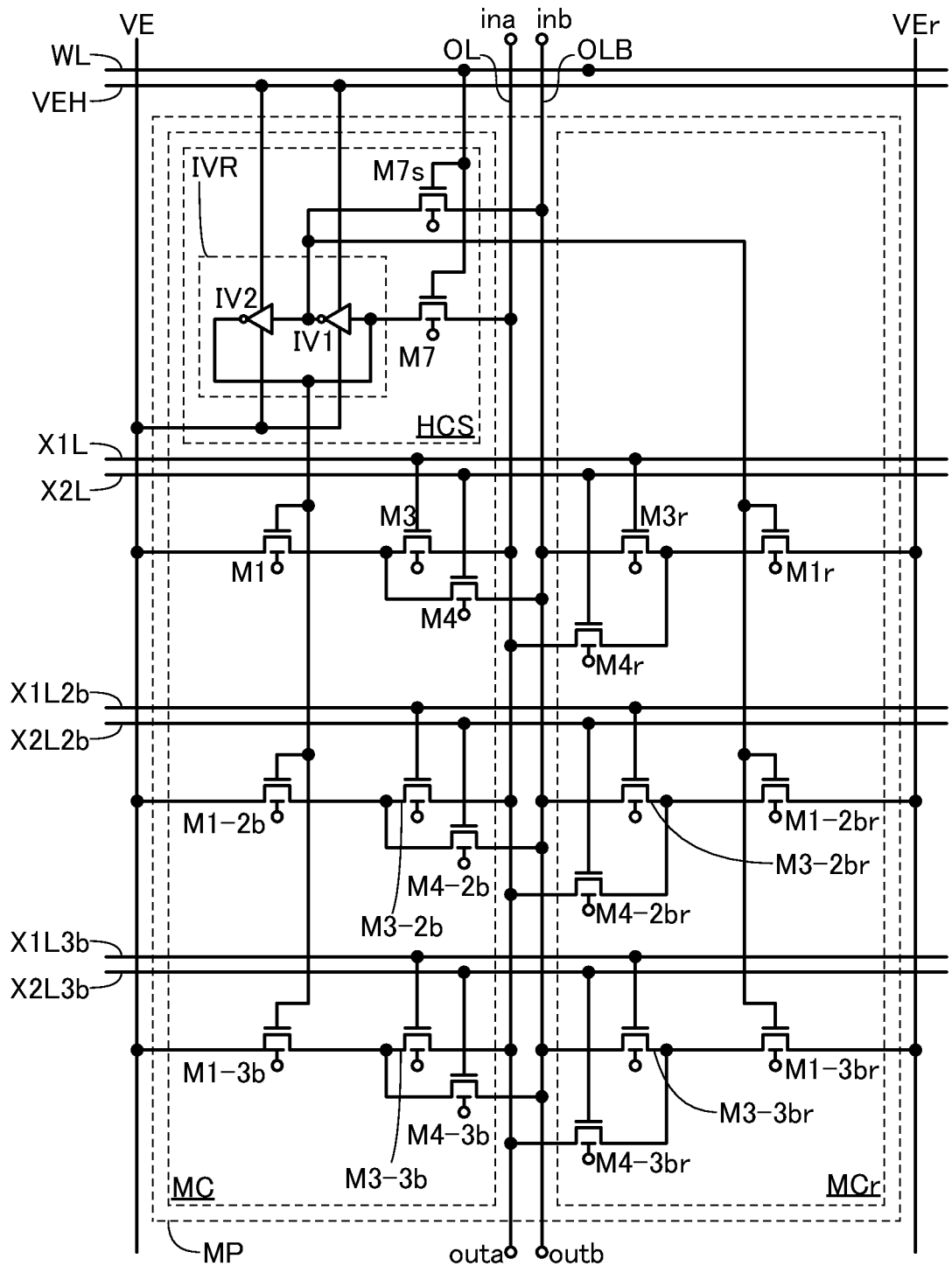
FIG. 31 is a circuit diagram showing a configuration example of a circuit included in a semiconductor device.

In addition, the circuit MP in FIG. 30A can be changed into the circuit MP illustrated in FIG. 31, for example. The circuit MP in FIG. 31 has a configuration in which the circuit HCSr is removed from the circuit MP in FIG. 30A. As a specific configuration, the output terminal of the inverter circuit IV1 included in the inverter loop circuit IVR is electrically connected to the gate of the transistor M1r of the circuit MCr, the gate of the transistor M1-2br of the circuit MCr, and the gate of the transistor M1-3br of the circuit MCr.

The circuit MP having the circuit configuration in FIG. 31 can operate in a manner similar to that of the circuit MP in FIG. 30A. Since the circuit MP in FIG. 31 has a configuration in which the circuit HCSr is removed from the circuit MP in FIG. 30A, the power consumption can be lower than that of the circuit MP in FIG. 30A.

Figure 32:
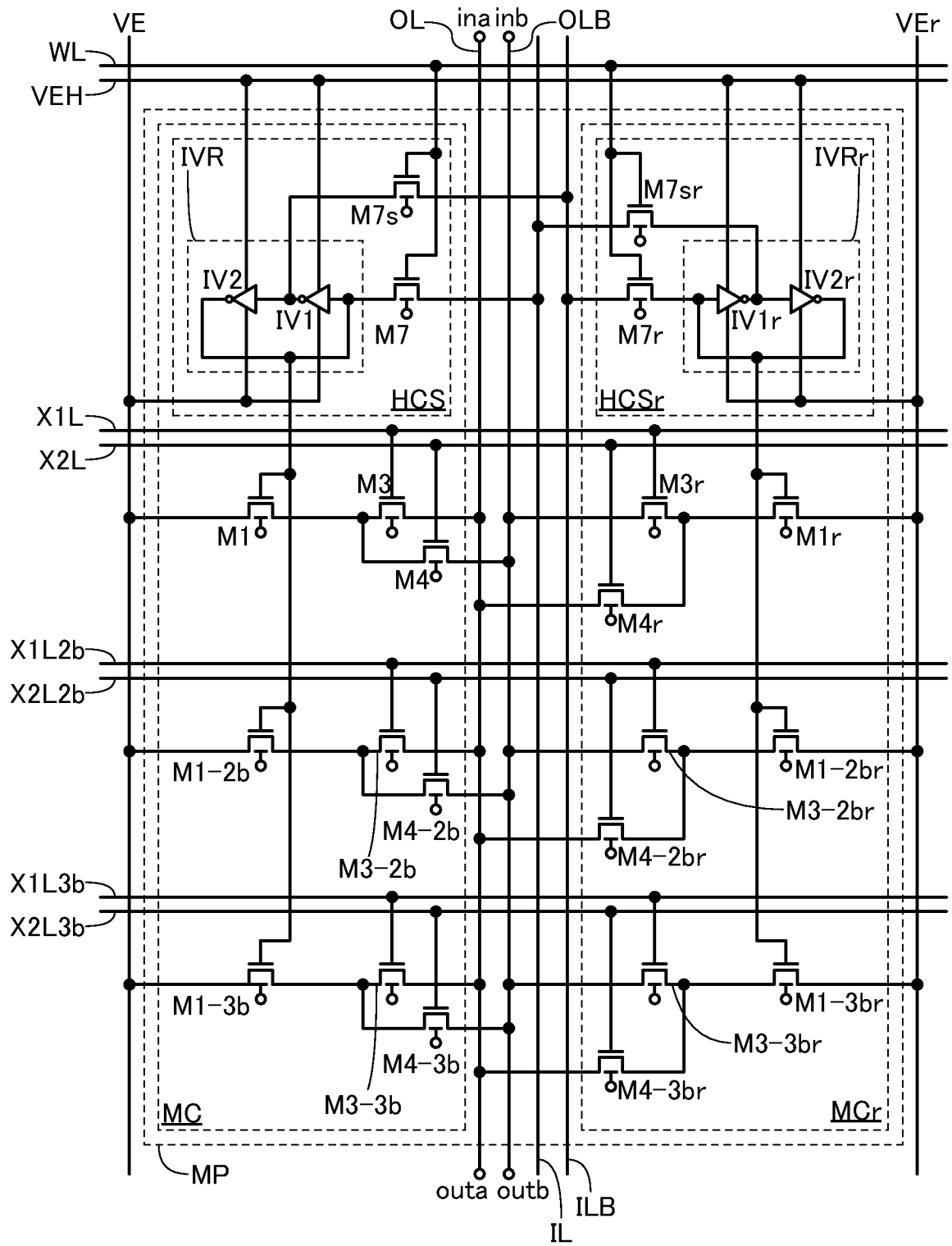
FIG. 32 is a circuit diagram showing a configuration example of a circuit included in a semiconductor device.

Alternatively, the circuit MP in FIG. 30A can be changed into the circuit MP illustrated in FIG. 32, for example. The circuit MP in FIG. 32 has a configuration in which the wiring IL and the wiring ILB are added to the circuit MP in FIG. 30A, like the circuits MP in FIG. 22A and FIG. 22B.

The circuit MP in FIG. 32 has a configuration in which the wiring OL and the wiring OLB of the circuit MP in FIG. 30A are each divided according to the functions.

Specifically, the wiring OL of the circuit MP in FIG. 30A functions as a wiring for inputting a high-level potential or a low-level potential to the circuit HCS, functions as a wiring for supplying a current to the wiring VE through the circuit MC, and functions as a wiring for supplying a current to the wiring VEr through the circuit MCr. In addition, the wiring OLB of the circuit MP in FIG. 30A functions as a wiring for inputting a high-level potential or a low-level potential to the circuit HCSr, functions as a wiring for supplying a current to the wiring VE through the circuit MC, and functions as a wiring for supplying a current to the wiring VEr through the circuit MCr.

In contrast, the wiring OL of the circuit MP in FIG. 32 functions as a wiring for supplying a current to the wiring VE through the circuit MC and functions as a wiring for supplying a current to the wiring VEr through the circuit MCr. In addition, the wiring OLB of the circuit MP in FIG. 32 functions as a wiring for supplying a current to the wiring VE through the circuit MC and functions as a wiring for supplying a current to the wiring VEr through the circuit MCr. Furthermore, the wiring IL of the circuit MP in FIG. 32 functions as a wiring for inputting one of a high-level potential and a low-level potential to the circuit HCS, and the wiring ILB of the circuit MP in FIG. 32 functions as a wiring for inputting the other of the high-level potential and the low-level potential to the circuit HCSr.

The circuit MP having the configuration in FIG. 32 can operate in a manner similar to that of the circuit MP in FIG. 30A.

Figure 33:
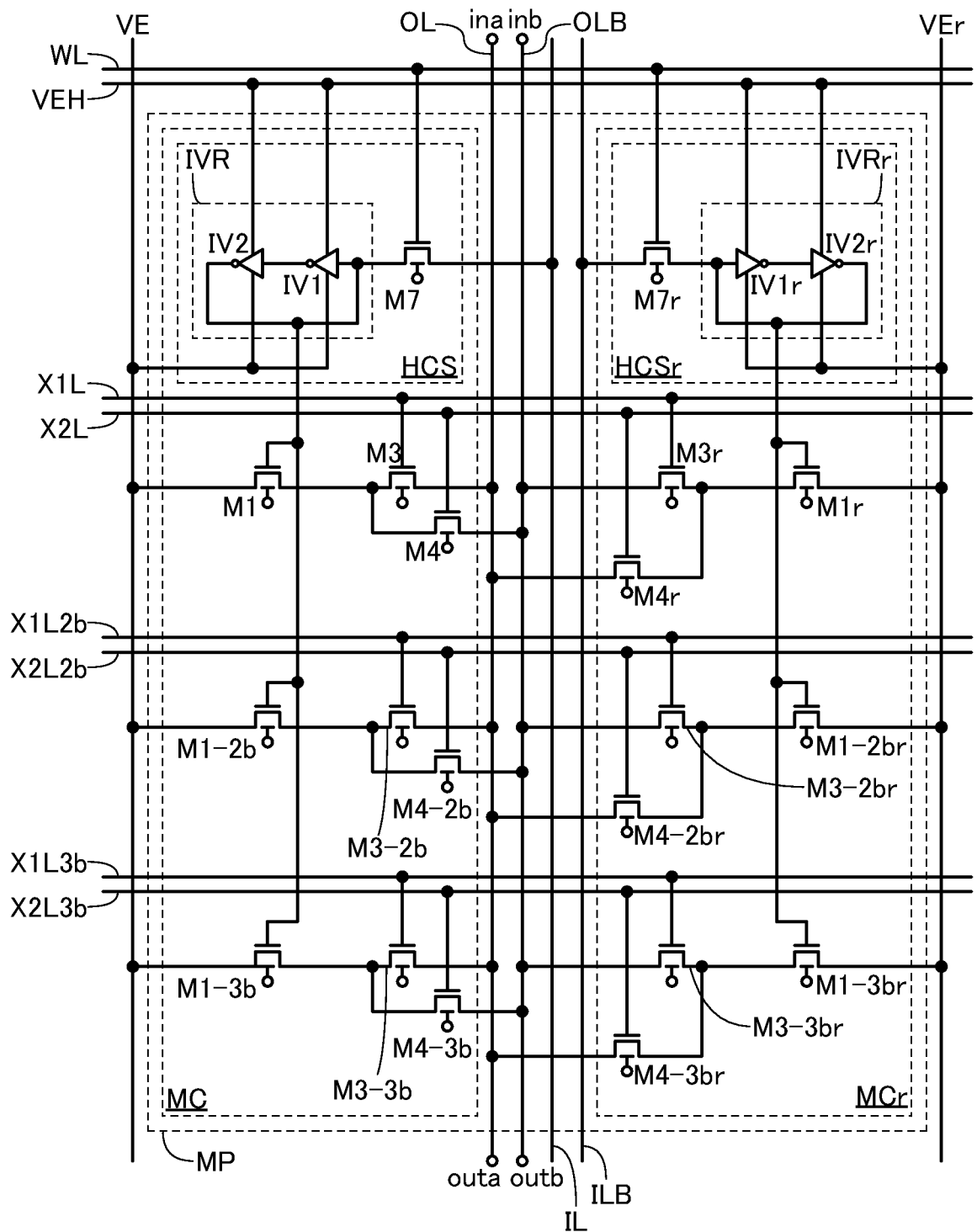
FIG. 33 is a circuit diagram showing a configuration example of a circuit included in a semiconductor device.

In the case where the configuration of the circuit MP in FIG. 32 is applied to the arithmetic circuit 110 in FIG. 2 or the arithmetic circuit 120 in FIG. 3, the circuit MP in FIG. 32 may have a configuration in which the transistor M7s and the transistor M7sr are removed as in the circuit MP illustrated in FIG. 33, for example. The circuit MP having the configuration in FIG. 33 can operate in a manner similar to that of the circuit MP in FIG. 30A.

Figure 34:
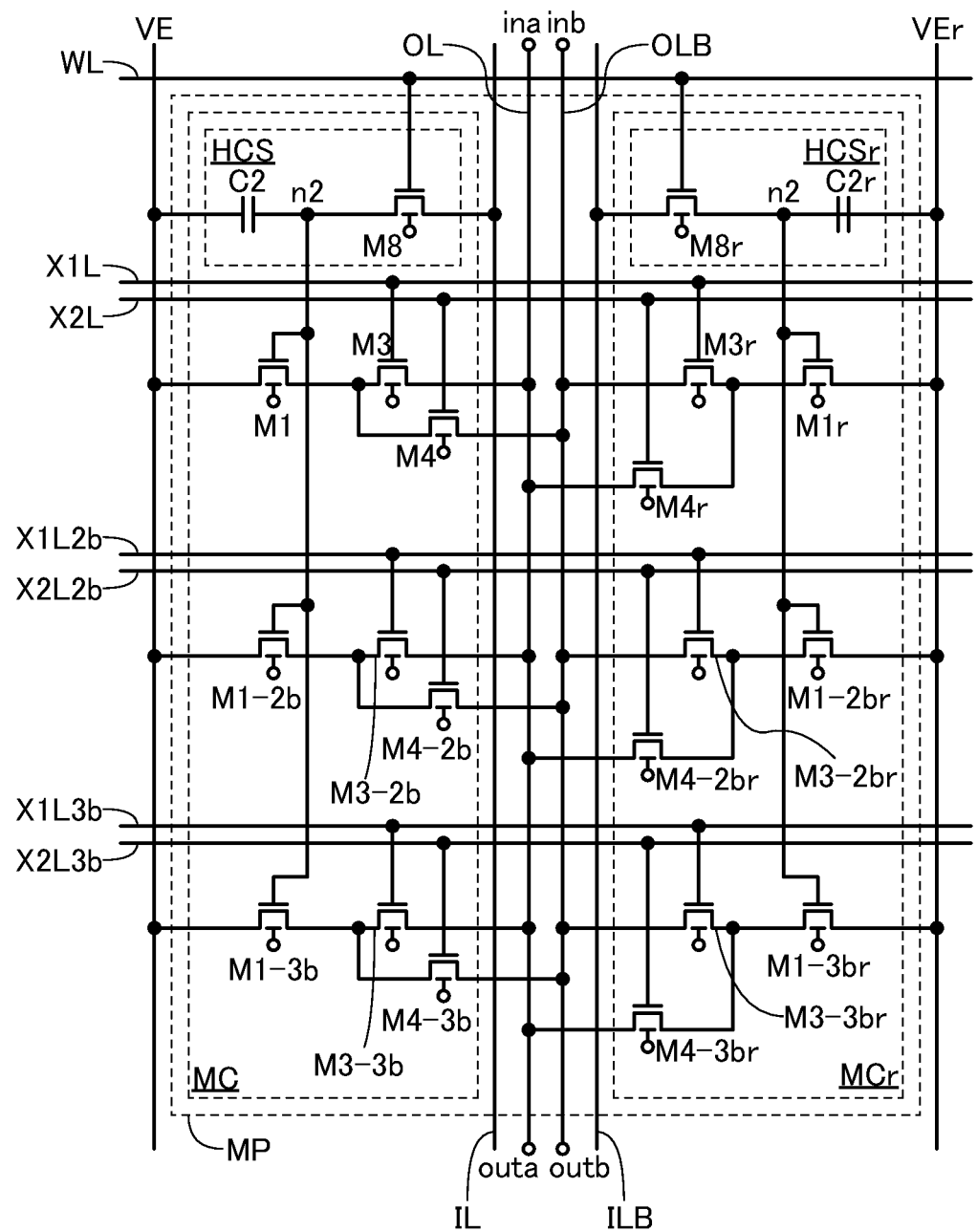
FIG. 34 is a circuit diagram showing a configuration example of a circuit included in a semiconductor device.

In addition, FIG. 34 shows specific examples of the circuit HCS and the circuit HCSr included in the circuit MP illustrated in FIG. 29, which are different from those in FIG. 30A. The circuit MP illustrated in FIG. 34 has a configuration including a memory circuit called a NOSRAM (Non-volatile Oxide Semiconductor Random Access Memory). Note that FIG. 34 illustrates the whole circuit MP to show the electrical connection configuration of the circuit elements included in the circuit HCS and the circuit HCSr.

The circuit HCS includes a transistor M8 and a capacitor C2.

In this specification and the like, unless otherwise specified, the transistor M8 in an on state may operate in a linear region in the end. In other words, the gate voltage, the source voltage, and the drain voltage of each of the above transistors may be appropriately biased to voltages in the range where the transistor operates in the linear region.

A first terminal of the transistor M8 is electrically connected to the wiring IL; a second terminal of the transistor M8 is electrically connected to a first terminal of the capacitor C2, the gate of the transistor M1, the gate of the transistor M1-2b, and the gate of the transistor M1-3b; and a gate of the transistor M8 is electrically connected to the wiring WL. A second terminal of the capacitor C2 is electrically connected to the wiring VE.

Note that in the circuit HCS illustrated in FIG. 34, an electrical connection point of the second terminal of the transistor M8 and the first terminal of the capacitor C2 is a node n2.

In addition, in the circuit MP in FIG. 34, the circuit HCS has substantially the same circuit configuration as the circuit HCSr. Thus, "r" is added to the reference signs of the circuit elements and the like included in the circuit HCSr to differentiate them from the circuit elements and the like included in the circuit HCS. A first terminal of a transistor M8r is electrically connected to the wiring ILB.

Note that in the case where the circuit HCS and the circuit HCSr each have a configuration including a NOSRAM, one of a high-level potential and a low-level potential can be held in each of the circuit HCS and the circuit HCSr. Thus, the first data (a weight coefficient) set in the circuit MP is limited to have two levels (e.g., "−1" and "+1") or three levels (e.g., "−1", "0", and "+1"), for example. When the first data (a weight coefficient) set in the circuit MP is "+1", for example, a high-level potential is held in the circuit HCS and a low-level potential is held in the circuit HCSr. Alternatively, when the first data (a weight coefficient) set in the circuit MP is "−1", for example, a low-level potential is held in the circuit HCS and a high-level potential is held in the circuit HCSr. Alternatively, when the first data (a weight coefficient) set in the circuit MP is "0", for example, a low-level potential is held in the circuit HCS and a low-level potential is held in the circuit HCSr. Note that instead of a binary value (a digital value) of a high-level potential or a low-level potential, a ternary or higher-level digital value or an analog value may be held in the circuit HCS and the circuit HCSr.

When information (a potential here) is written to the circuit HCS and the circuit HCSr, a high-level potential is applied to the wiring WL so that the transistor M8 and the transistor M8r are brought into an on state. After that, one of a high-level potential and a low-level potential is input to the wiring IL and the other of the high-level potential and the low-level potential is input to the wiring ILB. Here, the high-level potential is described as the potential VDDL and the low-level potential is described as the potential VSS, for example.

After one of VDDL and VSS is written to the first terminal of the capacitor C2 of the circuit HCS and the other of VDDL and VSS is written to a first terminal of a capacitor C2r of the circuit HCSr, a low-level potential is applied to the wiring WL so that the transistor M8 and the transistor M8r are brought into an off state. Accordingly, the circuit HCS can hold one of VDDL and VSS at the node n2 and the circuit HCS can hold the other of VDDL and VSS at the node n2r.

After a predetermined potential is held in each of the circuit HCS and the circuit HCSr, as in the circuit MP in FIG. 26, a high-level potential is input to one of the wiring X1L (the wiring WX1L in FIG. 26) and the wiring X2L and a low-level potential is input to the other, a high-level potential is input to one of the wiring X1L2b and the wiring X2L2b and a low-level potential is input to the other, and a high-level potential is input to one of the wiring X1L3b and the wiring X2L3b and a low-level potential is input to the other, whereby the amount of current flowing from the circuit MC or the circuit MCr to the wiring OL or the wiring OLB can be processed as 3-bit data.

The circuit MP having the configuration in FIG. 34 can operate in a manner similar to that of the circuit MP in FIG. 30A.

Although the circuits MP illustrated in FIG. 29 to FIG. 34 each have a configuration including one circuit HCS and one circuit HCSr, the circuit MP may have a configuration including a plurality of circuits HCS and a plurality of circuits HCSr.

Figure 35:
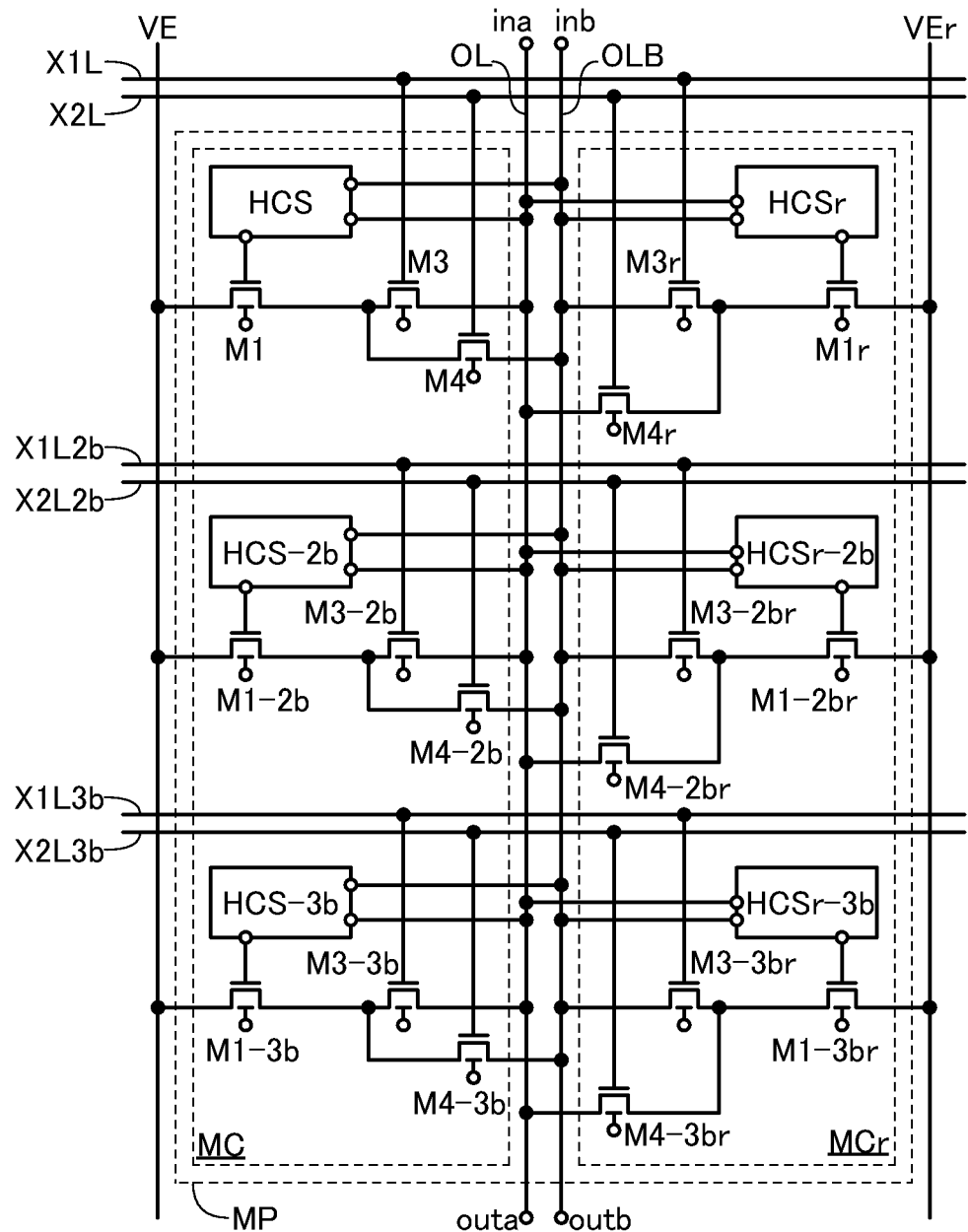
FIG. 35 is a circuit diagram showing a configuration example of a circuit included in a semiconductor device.

The circuit MP illustrated in FIG. 35 includes a circuit HCS-2b and a circuit HCS-3b having a function similar to that of the circuit HCS, and a circuit HCS-2br and a circuit HCS-3br having a function similar to that of the circuit HCSr. Specifically, the circuit HCS-2b, the circuit HCS-3b, the circuit HCS-2br, and the circuit HCS-3br have a function of receiving information (a potential, a current, or the like) input from one or both of the wiring OL and the wiring OLB and holding a potential corresponding to the information. In particular, the circuit HCS-2b has a function of applying the held potential to the gate of the transistor M1-2b, the circuit HCS-3b has a function of applying the held potential to the gate of the transistor M1-3b, the circuit HCS-2br has a function of applying the held potential to the gate of the transistor M1-2br, and the circuit HCS-3br has a function of applying the held potential to the gate of the transistor M1-3br.

The circuit HCS, the circuit HCS-2b, the circuit HCS-3b, the circuit HCSr, the circuit HCS-2br, and the circuit HCS-3br may all have a configuration including an SRAM or a configuration including a NOSRAM, for example. Alternatively, one or more circuits selected from the circuit HCS, the circuit HCS-2b, the circuit HCS-3b, the circuit HCSr, the circuit HCS-2br, and the circuit HCS-3br may have a configuration including an SRAM and the other circuits may have a configuration including a NOSRAM.

Although the circuit HCS, the circuit HCS-2b, the circuit HCS-3b, the circuit HCSr, the circuit HCS-2br, and the circuit HCS-3br included in the circuit MP in FIG. 35 are each electrically connected to the wiring OL and the wiring OLB, the configuration of the circuit MP of one embodiment of the present invention is not limited thereto. For example, in the circuit MP in FIG. 35, the wirings IL and ILB may be provided and the circuit HCS, the circuit HCS-2b, and the HCS-3b may be electrically connected to the wiring IL and the wiring ILB, as in the circuit MP in FIG. 32. Alternatively, for example, in the circuit MP in FIG. 35, the wiring IL and the wiring ILB may be provided; the circuit HCS, the circuit HCS-2b, and HCS-3b may be electrically connected to the wiring IL; and the circuit HCSr, the circuit HCS-2br, and the circuit HCS-3br may be electrically connected to the wiring ILB, as in the circuits MP in FIG. 33 and FIG. 34.

Note that this configuration example can be combined with any of the other configuration examples and the like described in this specification as appropriate.

Configuration Example 6

Figure 36:
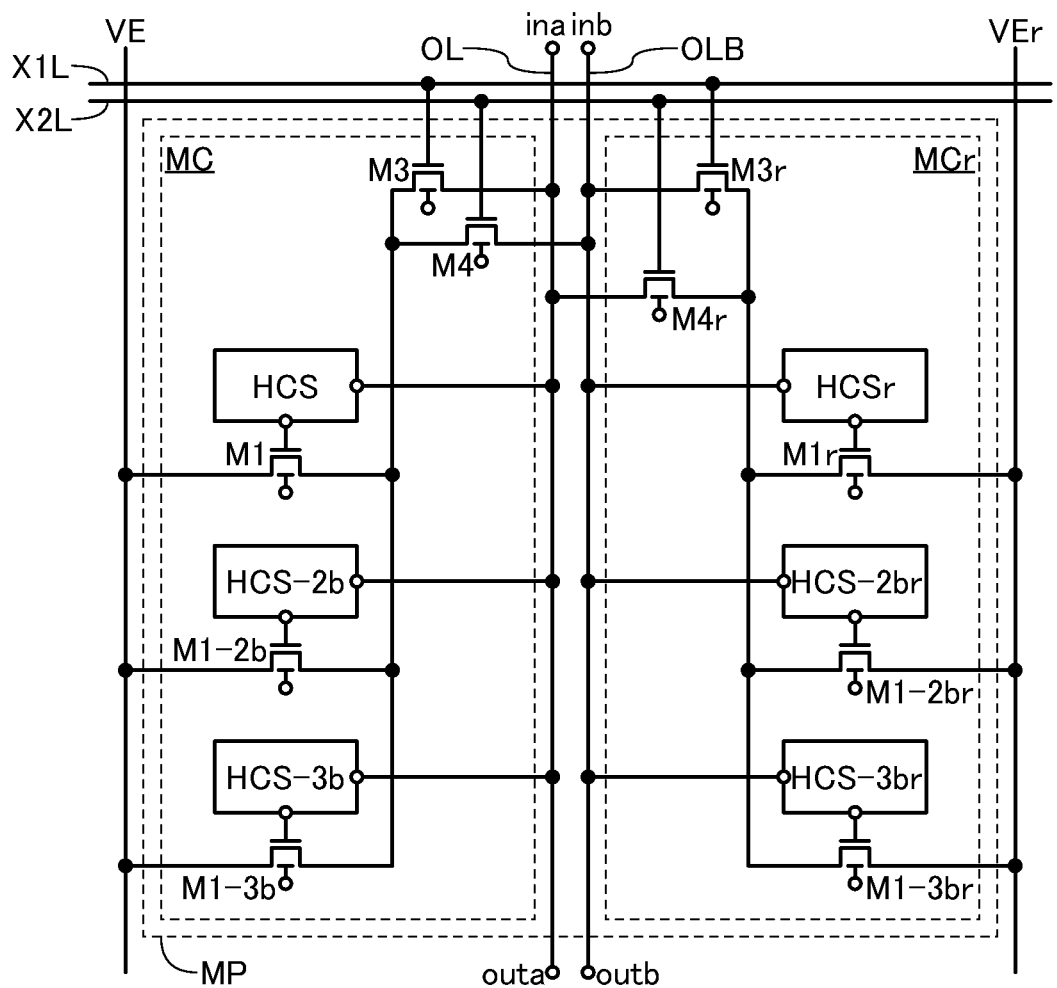
FIG. 36 is a circuit diagram showing a configuration example of a circuit included in a semiconductor device.

FIG. 36 shows an example of the circuit MP that includes the circuit HCS, the circuit HCS-2b, the circuit HCS-3b, the circuit HCSr, the circuit HCS-2br, and the circuit HCS-3br as the plurality of holding portions and has a circuit configuration different from that of the circuit MP in FIG. 35.

When the ratio of the W length to the L length of the transistor M1 included in the circuit MP in FIG. 36 is W/L, the ratio of the W length to the L length of the transistor M1-2b is preferably 2×W/L and the ratio of the W length to the L length of the transistor M1-3b is preferably 4×W/L. Furthermore, the size of the transistor M1r is preferably equal to that of the transistor M1, the size of the transistor M1-2br is preferably equal to that of the transistor M1-2b, and the size of the transistor M1-3br is preferably equal to that of the transistor M1-3b.

The circuit HCS is electrically connected to the wiring OL and the gate of the transistor M1, the circuit HCS-2b is electrically connected to the wiring OL and the gate of the transistor M1-2b, and the circuit HCS-3b is electrically connected to the wiring OL and the gate of the transistor M1-3b.

The first terminals of the transistor M1, the transistor M1-2b, and the transistor M1-3b are each electrically connected to the wiring VE, and the first terminal of the transistor M3 is electrically connected to the first terminal of the transistor M4 and the second terminals of the transistor M1, the transistor M1-2b, and the transistor M1-3b. The second terminal of the transistor M3 is electrically connected to the wiring OL and the gate of the transistor M3 is electrically connected to the wiring X1L. The second terminal of the transistor M4 is electrically connected to the wiring OLB and the gate of the transistor M4 is electrically connected to the wiring X2L.

In the circuit MP in FIG. 36, the circuit MCr has substantially the same circuit configuration as the circuit MC. Thus, "r" is added to the reference signs of the circuit elements and the like included in the circuit MCr to differentiate them from the circuit elements and the like included in the circuit MC. The second terminal of the transistor M3 is electrically connected to the wiring OLB and the second terminal of the transistor M4 is electrically connected to the wiring OL.

When a low-level potential, e.g., VSS, is held in the circuit HCSr, the circuit HCS-2*br*, and the circuit HCS-3*br* included in the circuit MCr, the transistor M1*r*, the transistor M1-2*br*, and the transistor M1-3*br* can each be brought into an off state. Here, when a high-level potential or a low-level potential is held in each of the circuit HCS, the circuit HCS-2*b*, and the circuit HCS-3*b* included in the circuit MC, the amounts of currents flowing through the transistor M1, the transistor M1-2*b*, and the transistor M1-3*b* are determined in accordance with the potentials held in the circuit HCS, the circuit HCS-2*b*, and the circuit HCS-3*b*, respectively. After that, the currents can flow from the wiring OL to the wiring VE through the circuit MC by bringing the transistor M3 into an on state and bringing the transistor M4 into an off state. Alternatively, the currents can flow from the wiring OLB to the wiring VE through the circuit MC by bringing the transistor M3 into an off state and bringing the transistor M4 into an on state.

When a low-level potential, e.g., VSS, is held in the circuit HCS, the circuit HCS-2*b*, and the circuit HCS-3*b*, the transistor M1, the transistor M1-2*b*, and the transistor M1-3*b* can each be brought into an off state. Here, when a high-level potential or a low-level potential is held in each of the circuit HCSr, the circuit HCS-2*br*, and the circuit HCS-3*br* included in the circuit MC, the amounts of currents flowing through the transistor M1*r*, the transistor M1-2*br*, and the transistor M1-3*br* are determined in accordance with the potentials held in the circuit HCSr, the circuit HCS-2*br*, and the circuit HCS-3*br*, respectively. After that, the currents can flow from the wiring OLB to the wiring VEr through the circuit MCr by bringing the transistor M3*r* into an on state and bringing the transistor M4*r* into an off state. Alternatively, the currents can flow from the wiring OL to the wiring VEr through the circuit MCr by bringing the transistor M3*r* into an off state and bringing the transistor M4*r* into an on state.

In the case where the positive first data (for example, a weight coefficient here) is held in the circuit MP in FIG. 36, for example, a low-level potential is held in the circuit HCSr, the circuit HCS-2*br*, and the circuit HCS-3*br*, and a combination of potentials corresponding to the positive first data (a weight coefficient) is held in each of the circuit HCS, the circuit HCS-2*b*, and the circuit HCS-3*b*. In the case where the negative first data (a weight coefficient) is held in the circuit MP in FIG. 36, for example, a low-level potential is held in the circuit HCS, the circuit HCS-2*b*, and the circuit HCS-3*b*, and a combination of potentials corresponding to the negative first data (a weight coefficient) is held in each of the circuit HCSr, the circuit HCS-2*br*, and the circuit HCS-3*br*.

Figure 37:
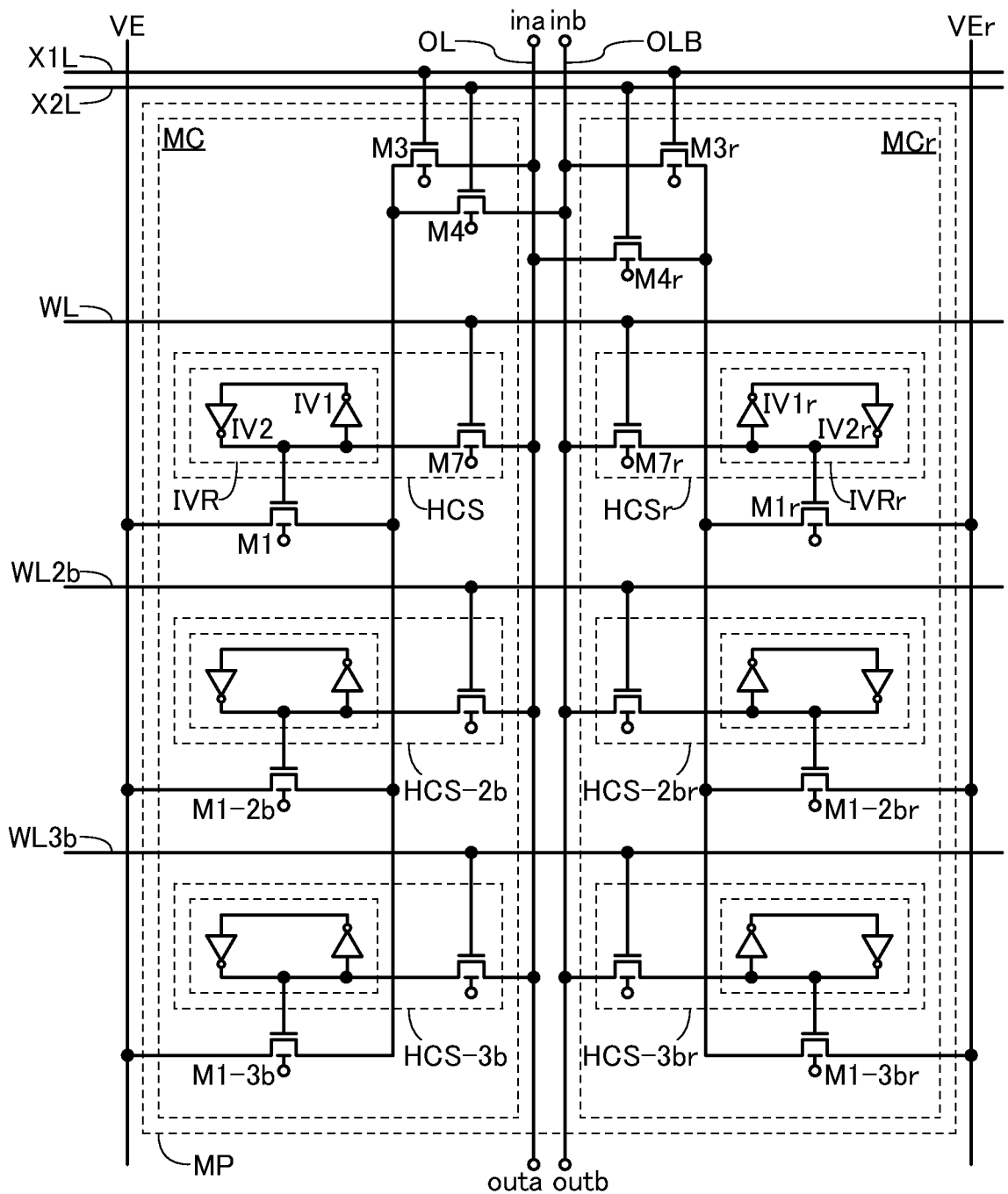
FIG. 37 is a circuit diagram showing a configuration example of a circuit included in a semiconductor device.

FIG. 37 shows specific examples of the circuit HCS, the circuit HCS-2*b*, the circuit HCS-3*b*, the circuit HCSr, the circuit HCS-2*br*, and the circuit HCS-3*br* included in the circuit MP illustrated in FIG. 36. The circuit HCS, the circuit HCS-2*b*, the circuit HCS-3*b*, the circuit HCSr, the circuit HCS-2*br*, and the circuit HCS-3*br* illustrated in FIG. 37 each have a configuration including an SRAM. Note that the high power supply potential input terminals and the low power supply potential input terminals of the inverter circuit IV1 and the inverter circuit IV2 are not illustrated in FIG. 37. In addition, for the configurations of the circuit HCS, the circuit HCS-2*b*, the circuit HCS-3*b*, the circuit HCSr, the circuit HCS-2*br*, and the circuit HCS-3*br* illustrated in FIG. 37, the description of the circuit HCS and the circuit HCSr included in the circuit MP in FIG. 30A is referred to.

Figure 38:
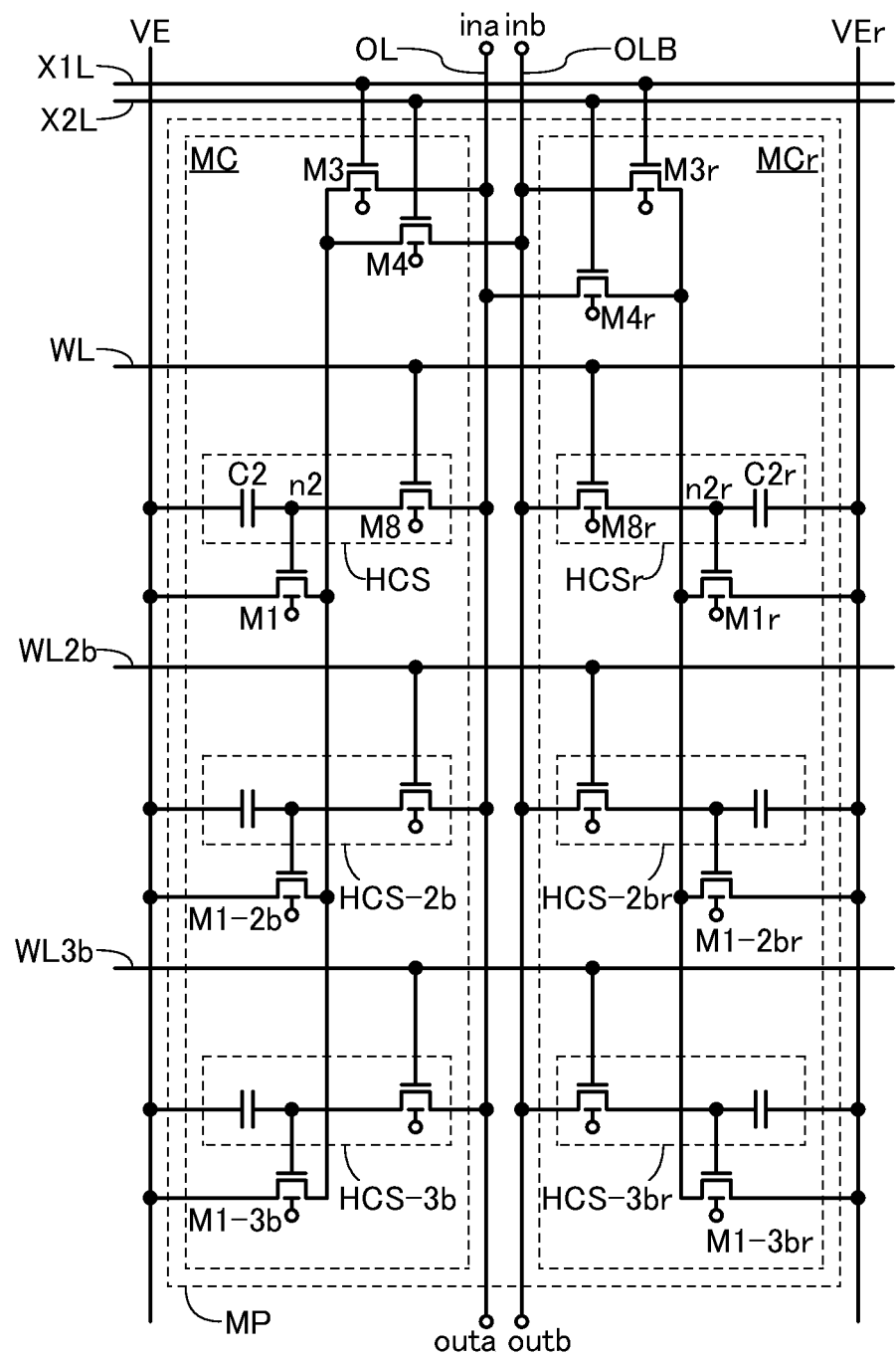
FIG. 38 is a circuit diagram showing a configuration example of a circuit included in a semiconductor device.

As a specific example different from that in FIG. 37, the circuit HCS, the circuit HCS-2*b*, the circuit HCS-3*b*, the circuit HCSr, the circuit HCS-2*br*, and the circuit HCS-3*br* included in the circuit MP illustrated in FIG. 36 may each have a configuration including a NOSRAM, as illustrated in FIG. 38. Note that for the configurations of the circuit HCS, the circuit HCS-2*b*, the circuit HCS-3*b*, the circuit HCSr, the circuit HCS-2*br*, and the circuit HCS-3*br* illustrated in FIG. 38, the description of the circuit HCS and the circuit HCSr included in the circuit MP in FIG. 34 is referred to.

Figure 39:
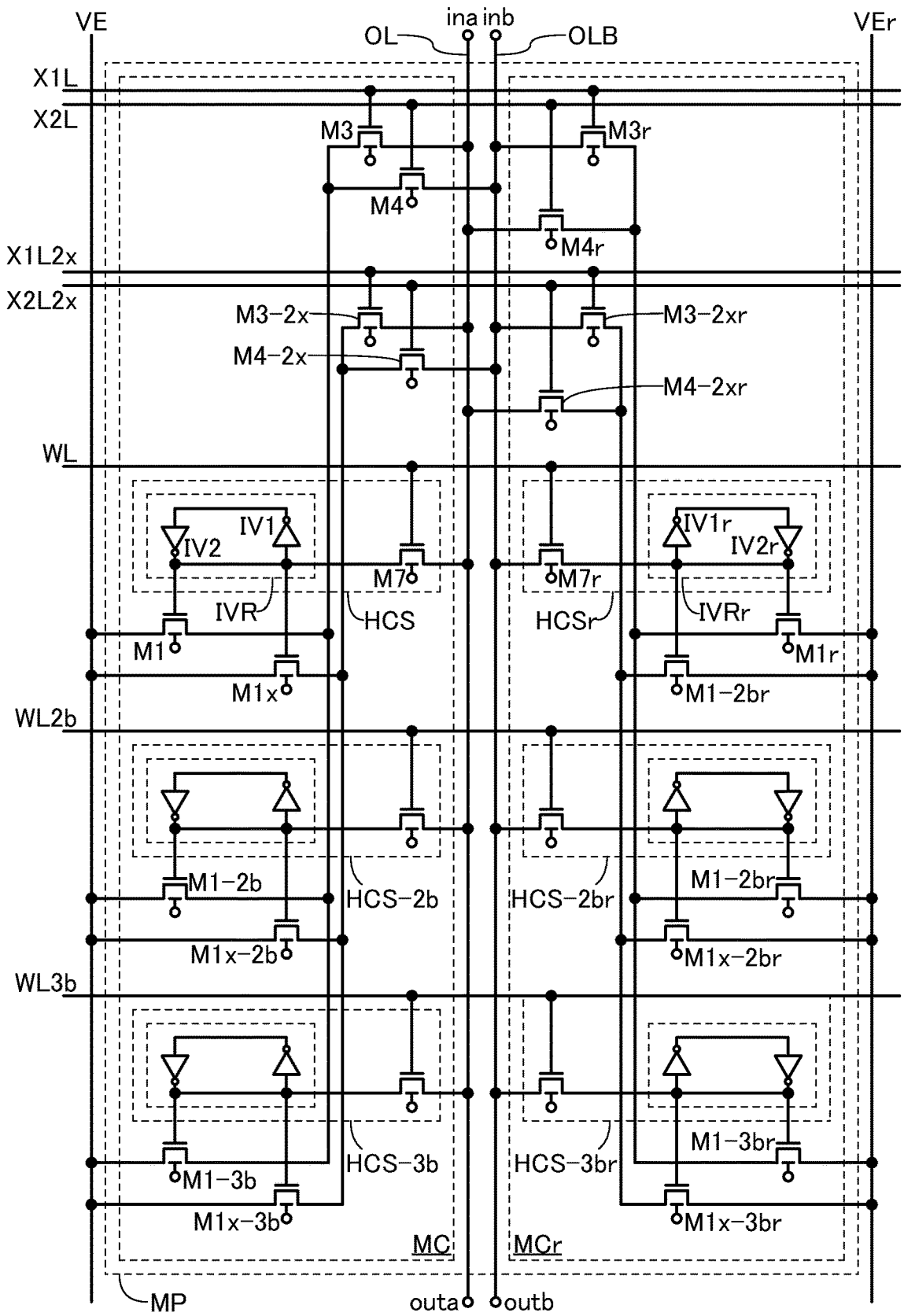
FIG. 39 is a circuit diagram showing a configuration example of a circuit included in a semiconductor device.

The circuit MP in FIG. 36 can be changed into the circuit MP illustrated in FIG. 39, for example. The circuit MP in FIG. 39 is a circuit that can process the multilevel second data (for example, a value of a signal of a neuron (an arithmetic value) here), like the circuits MP illustrated in FIG. 26 to FIG. 35. The circuit MP in FIG. 39 has a configuration in which a transistor M3-2*x*, a transistor M4-2*x*, a transistor M1*x*, a transistor M1*x*-2*b*, and a transistor M1*x*-3*b* are added to the circuit MC included in the circuit MP in FIG. 36. The circuit HCS, the circuit HCS-2*b*, the circuit HCS-3*b*, the circuit HCSr, the circuit HCS-2*br*, and the circuit HCS-3*br* included in the circuit MP in FIG. 39 each have a configuration including an SRAM, as illustrated in FIG. 37.

In this specification and the like, unless otherwise specified, the transistor M1*x*, the transistor M1*x*-2*b*, and the transistor M1*x*-3*b* in an on state may operate in a saturation region in the end, like the transistor M1. In other words, the gate voltage, the source voltage, and the drain voltage of each of the above transistors may be appropriately biased to voltages in the range where the transistor operates in a saturation region. However, one embodiment of the present invention is not limited thereto. The transistor M1*x*, the transistor M1*x*-2*b*, and the transistor M1*x*-3*b* may operate in a linear region to reduce the amplitude value of a voltage to be supplied. Note that in the case where the first data (a weight coefficient) is an analog value, for example, the transistor M1*x*, the transistor M1*x*-2*b*, and the transistor M1*x*-3*b* may operate in a linear region in some cases and may operate in a saturation region in other cases depending on the magnitude of the first data (a weight coefficient).

In this specification and the like, unless otherwise specified, the transistor M3-2*x* and the transistor M4-2*x* in an on state may operate in a saturation region in the end, like the transistor M3 and the transistor M4. In other words, the gate voltage, the source voltage, and the drain voltage of each of the above transistors may be appropriately biased to voltages in the range where the transistor operates in the linear region. However, one embodiment of the present invention is not limited thereto. For example, the transistor M3-2*x* and the transistor M4-2*x* in an on state may operate in a saturation region; alternatively, the transistors may operate in a linear region in some cases and may operate in a saturation region in other cases.

The ratio of the W length to the L length of the transistor M1*x* included in the circuit MP in FIG. 39 is preferably 2×W/L. The ratio of the W length to the L length of the transistor M1*x*-2*b* is preferably 4×W/L. The ratio of the W length to the L length of the transistor M1*x*-4*b* is preferably 8×W/L. In the case of providing more transistors, the ratio of the W length to the L length can be increased to be a power of two in a similar manner.

First terminals of the transistor M1*x*, the transistor M1*x*-2*b*, and the transistor M1*x*-3*b* are each electrically connected to the wiring VE. A gate of the transistor M1*x* is electrically connected to the circuit HCS, a gate of the transistor M1*x*-2*b* is electrically connected to the circuit HCS-2*b*, and a gate of the transistor M1*x*-3*b* is electrically connected to the circuit HCS-3*b*. A first terminal of the transistor M3-2*x* is electrically connected to a first terminal of the transistor M4-2x and second terminals of the transistor M1x, the transistor M1x-2b, and the transistor M1x-3b. A second terminal of the transistor M3-2x is electrically connected to the wiring OL, and a gate of the transistor M3-2x is electrically connected to a wiring X1L2x. A second terminal of the transistor M4-2x is electrically connected to the wiring OLB, and a gate of the transistor M4-2x is electrically connected to a wiring X2L2x.

Note that in the circuit MP in FIG. 39, the circuit HCS has substantially the same circuit configuration as the circuit HCsr. Thus, "r" is added to the reference signs of the circuit elements and the like included in the circuit HCsr to differentiate them from the circuit elements and the like included in the circuit HCS. In addition, a second terminal of a transistor M3-2xr is electrically connected to the wiring OLB, and a second terminal of a transistor M4-2xr is electrically connected to the wiring OL.

The wiring X1L2x is a wiring for switching the on state and the off state of the transistor M3-2x and the transistor M3-2xr, and the wiring X2L2x is a wiring for switching the on state and the off state of the transistors M4-2x and M4-2xr.

When a high-level potential, e.g., VDDL, is held in the circuit HCS, the current amount of $I_{ut}$ is supplied between the source and the drain of the transistor M1. When a high-level potential, e.g., VDDL, is held in the circuit HCS-2b in this case, the amount of current flowing between the source and the drain of the transistor M1-2b is $2I_{ut}$ because the ratio of the W length to the L length of the transistor M1-2b is twice as high as the ratio of the W length to the L length of the transistor M1. When a high-level potential, e.g., VDDL, is held in the circuit HCS-3b, the amount of current flowing between the source and the drain of the transistor M1-3b is $4I_{ut}$ because the ratio of the W length to the L length of the transistor M1-3b is four times as high as the ratio of the W length to the L length of the transistor M1.

That is, a current flowing from the electrical connection point of the first terminal of the transistor M3 and the first terminal of the transistor M4 to the wiring VE through the circuit MC change from 0 to $7I_{ut}$ in steps of $I_{ut}$, in accordance with the potentials held in the circuit HCS, the circuit HCS-2b, and the circuit HCS-3b. Here, the amount of the current is referred to as Ix'.

When a high-level potential, e.g., VDDL, is held in the circuit HCS, the current amount of $2I_{ut}$ is supplied between the source and the drain of the transistor M1x because the ratio of the W length to the L length of the transistor M1x is twice as high as the ratio of the W length to the L length of the transistor M1. When a high-level potential, e.g., VDDL, is held in the circuit HCS-2b, the amount of current flowing between the source and the drain of the transistor M1x-2b is $4I_{ut}$ because the ratio of the W length to the L length of the transistor M1x-2b is four times as high as the ratio of the W length to the L length of the transistor M1. When a high-level potential, e.g., VDDL, is held in the circuit HCS-3b, the amount of current flowing between the source and the drain of the transistor M1x-3b is $8I_{ut}$ because the ratio of the W length to the L length of the transistor M1x-3b is eight times as high as the ratio of the W length to the L length of the transistor M1.

That is, currents flowing from the electrical connection point of the first terminal of the transistor M3-2x and the first terminal of the transistor M4-2x to the wiring VE through the circuit MC change from 0 to $14I_{ut}$ in steps of $2I_{ut}$, in accordance with the potentials held in the circuit HCS, the circuit HCS-2b, and the circuit HCS-3b. Here, the amount of the current is referred to as $I_{x2}$. That is, $I_{x2}=2I_{x1}$ is satisfied.

Here, the case is considered where a high-level potential or a low-level potential is supplied to each of the wiring X1L, the wiring X2L, the wiring X1L2x, and the wiring X2L2x when the positive first data (a weight coefficient) is set in the circuit MP in FIG. 39.

When a low-level potential is supplied to each of the wiring X1L, the wiring X2L, the wiring X1L2x, and the wiring X2L2x, the transistor M3, the transistor M3x-2, the transistor M4, and the transistor M4x-2 are brought into an off state in the circuit MC. At this time, a current does not flow from the wiring OL to the wiring VE through the circuit MC.

When a high-level potential is supplied to the wiring X1L and a low-level potential is supplied to each of the wiring X2L, the wiring X1L2x, and the wiring X2L2x, the transistor M3 is brought into an on state and the transistor M3x-2, the transistor M4, and the transistor M4x-2 are brought into an off state in the circuit MC. At this time, the current amount of $I_{x1}$ is supplied from the wiring OL to the wiring VE through the circuit MC.

When a high-level potential is supplied to the wiring X2L and a low-level potential is supplied to each of the wiring X1L, the wiring X1L2x, and the wiring X2L2x, the transistor M4 is brought into an on state and the transistor M3, the transistor M3x-2, and the transistor M4x-2 are brought into an off state in the circuit MC. At this time, the current amount of $I_{x1}$ is supplied from the wiring OLB to the wiring VE through the circuit MC.

When a high-level potential is supplied to the wiring X1L2x and a low-level potential is supplied to each of the wiring X1L, the wiring X2L, and the wiring X2L2x, the transistor M3-2x is brought into an on state and the transistor M3, the transistor M4, and the transistor M4x-2 are brought into an off state in the circuit MC. At this time, the current amount of $I_{x2}=2I_{x1}$ is supplied from the wiring OL to the wiring VE through the circuit MC.

When a high-level potential is supplied to the wiring X2L2L and a low-level potential is supplied to each of the wiring X1L, the wiring X1L2x, and the wiring X1L2x, the transistor M4-2x is brought into an on state and the transistor M3, the transistor M4, and the transistor M3x-2 are brought into an off state. At this time, the current amount of $I_{x2}=2I_{x1}$ is supplied from the wiring OLB to the wiring VE through the circuit MC.

When a high-level potential is supplied to the wiring X1L and the wiring X1L2x and a low-level potential is supplied to each of the wiring X2L and the wiring X2L2x, the transistor M3 and the transistor M3-2x are brought into an on state and the transistor M4 and the transistor M4x-2 are brought into an off state in the circuit MC. At this time, the current amount of $I_{x1}+I_{x2}=3I_{x1}$ is supplied from the wiring OL to the wiring VE through the circuit MC.

Similarly, when a high-level potential is supplied to the wiring X2L and the wiring X2L2x and a low-level potential is supplied to each of the wiring X1L and the wiring X1L2x, the transistor M4 and the transistor M4x-2 are brought into an on state and the transistor M3 and the transistor M3-2x are brought into an off state in the circuit MC. At this time, the current amount of $I_{x1}+I_{x2}=3I_{x1}$ is supplied from the wiring OLB to the wiring VE through the circuit MC.

As described above, the circuit MC included in the circuit MP in FIG. 39 can make a current corresponding to the potentials held in the circuit HCS, the circuit HCS-2b, and the circuit HCS-3b flow from the wiring OL or the wiring OLB to the wiring VE through the circuit MC, and can output the current after multiplication by 0, 1, 2, or 3 in accordance with the potentials input to the wiring X1L, the wiring X2L, the wiring X1L2x, and the wiring X2L2x.

Although an example in which the positive first data (a weight coefficient) is set in the circuit MP in FIG. 39 is described above, also in the case where the negative first data (a weight coefficient) is set in the circuit MP in FIG. 39, the circuit MP can make a current flow from the wiring OL or the wiring OLB to the wiring VEr through the circuit MCr, and can output the current after multiplication by 0, 1, 2, or 3 in accordance with the potentials input to the wiring X1L, the wiring X2L, the wiring X1L2x, and the wiring X2L2x.

In the case where the first data (a weight coefficient) of 0 is set in the circuit MP in FIG. 39, a low-level potential, e.g., VSS, is supplied to each of the circuit HCS, the circuit HCS-2b, the circuit HCS-3b, the circuit HCSr, the circuit HCS-2br, and the circuit HCS-3br. Accordingly, the amounts of currents flowing between the sources and the drains of the transistor M1, the transistor M1-2b, the transistor M1-3b, the transistor M1r, the transistor M1-2br, the transistor M1-3br, the transistor M1x, the transistor M1x-2b, the transistor M1x-3b, a transistor M1xr, a transistor M1x-2br, and a transistor M1x-3br can each be set to 0. Thus, a current flows from the wiring OL to neither the circuit MC nor the circuit MCr, and a current flows from the wiring OLB to neither the circuit MC nor the circuit MCr, regardless of the potentials supplied from the wiring X1L, the wiring X2L, the wiring X1L2x, and the wiring X2L2x.

By setting the potentials held in the circuit HCS, the circuit HCS-2b, and the circuit HCS-3b to potentials corresponding to the first data (a weight coefficient) and setting the potentials input to the wiring X1L, the wiring X2L, the wiring X1L2x, and the wiring X2L2x to potentials corresponding to the second data (a value of a signal of a neuron), the amount of current flowing from the wiring OL or the wiring OLB to the wiring VE through the circuit MC can be processed as a product of the first data (a weight coefficient) and the second data (a value of a signal of a neuron).

Note that this configuration example can be combined with any of the other configuration examples and the like described in this specification as appropriate.

Configuration Example 7

Configuration example 1 to Configuration example 6 each describe the circuit MP that can calculate a product of the first data (for example, a weight coefficient here) that is a "positive multilevel value", "0", or a "negative multilevel value" held in the circuit MP and the second data (for example, a value of a signal of a neuron here); meanwhile, this configuration example describes the circuit MP that can calculate a product of the first data (a weight coefficient) that is a "positive multilevel value", "0", or a "negative multilevel value" and the second data (a value of a signal of a neuron) having two levels "+1" and "0", for example.

Figure 40:
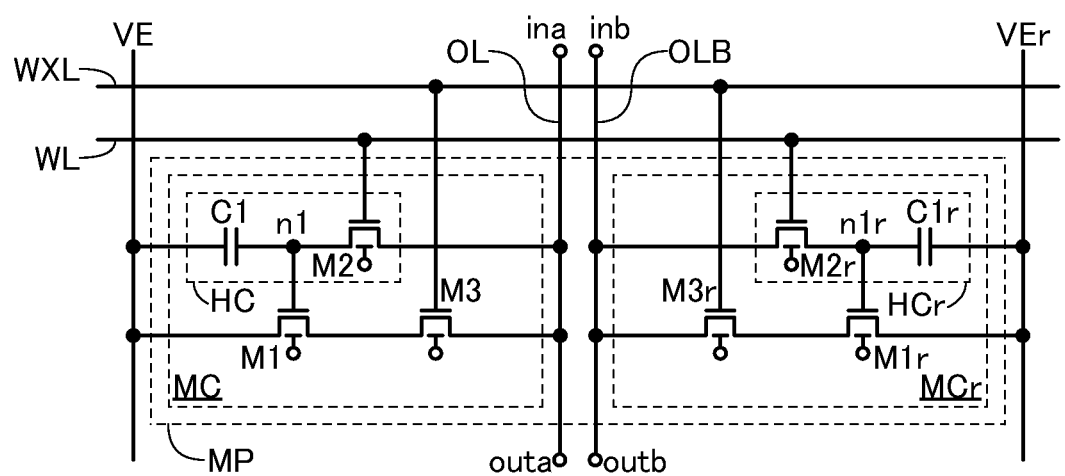
FIG. 40 is a circuit diagram showing a configuration example of a circuit included in a semiconductor device.

The circuit MP illustrated in FIG. 40 is a circuit in which the transistor M4 and the transistor M4r are removed from the circuit MP in FIG. 16A. In addition, since the transistor M4 and the transistor M4r are removed, the wiring X2L for inputting a potential to the gates of the transistor M4 and the transistor M4r is also removed in FIG. 40. Furthermore, a wiring corresponding to the wiring X1L is shown as the wiring WXL in FIG. 40. Although an example of application to FIG. 16A is shown here, one embodiment of the present invention is not limited thereto. The transistor M4 and the transistor M4r can be removed in a similar manner in other drawings.

The first data (a weight coefficient) set in the circuit MP in FIG. 40 is similar to the first data (a weight coefficient) set in the circuit MP in FIG. 15A. Thus, for the first data (a weight coefficient) set in the circuit MP in FIG. 40, the description of the circuit MP in FIG. 15A is referred to. The first data (a weight coefficient) can be "−2", "−1", "0", "+1", or "+2", for example.

The second data (a value of a signal of a neuron) input to the circuit MP in FIG. 40 is "+1" when a high-level potential is applied to the wiring WXL and "0" when a low-level potential is applied to the wiring WXL.

For the operation of the circuit MP in FIG. 40, the description of the operation example in Configuration example 1 is referred to.

In the case where the first data (a weight coefficient) and the second data (a value of a signal of a neuron) to be input are defined as described above in the circuit MP in FIG. 40, the current $I_{OL}$ output from the node outa of the wiring OL changes or does not change and the current $I_{OLB}$ output from the node outb of the wiring OLB changes or does not change as in the following table, depending on the combination of the weight coefficient and the second data (a value of a signal of a neuron) input to the circuit MP. Note that in the following table, a high-level potential is denoted by high and a low-level potential is denoted by low.

TABLE 5

| Weight coefficient | n1 | n1r | Signal | WXL | Weight coefficient × signal | Amount of change in $I_{OL}$ | Amount of change in $I_{OLB}$ |
|---|---|---|---|---|---|---|---|
| −2 | VSS | $V_2$ | +1 | high | −2 | 0 | $I_2$ |
| −1 | VSS | $V_1$ | +1 | high | −1 | 0 | $I_1$ |
| 0 | VSS | VSS | +1 | high | 0 | 0 | 0 |
| +1 | $V_1$ | VSS | +1 | high | +1 | $I_1$ | 0 |
| +2 | $V_2$ | VSS | +1 | high | +2 | $I_2$ | 0 |
| −2 | VSS | $V_2$ | 0 | low | 0 | 0 | 0 |
| −1 | VSS | $V_1$ | 0 | low | 0 | 0 | 0 |
| 0 | VSS | VSS | 0 | low | 0 | 0 | 0 |
| +1 | $V_1$ | VSS | 0 | low | 0 | 0 | 0 |
| +2 | $V_2$ | VSS | 0 | low | 0 | 0 | 0 |

As shown in the above table, the circuit MP in FIG. 40 can calculate the product of the first data (a weight coefficient) that is a positive multilevel value or a negative multilevel value and the second data (a value of a signal of a neuron) that has two levels "+1" and "0". Note that the first data (a weight coefficient) is not limited to have five levels, and may have two levels or multi levels other than five levels. Two levels may be, for example, two levels "+1" and "0" or two levels "+1" and "−1". Alternatively, the first data (a weight coefficient) may be an analog value or a multibit (multilevel) digital value, for example.

Although a current set in each of the holding portion HC of the circuit MC and the holding portion HCr of the circuit MCr of the circuit MP has a multilevel value in this operation example, the set current may have an analog value. For example, in the case where the first data (a weight coefficient) is a "positive analog value", a current having an analog value is set at the node n1 of the holding portion HC, a potential corresponding to the current is held at the node n1, and a low-level potential is held at the node n1r of the holding portion HCr. In the case where the first data (a weight coefficient) is a "negative analog value", for example, a low-level potential is held at the node n1 of the holding portion HC, a current having an analog value is set at the node n1r of the holding portion HC, and a potential corresponding to the current is held at the node n1r. Then, the amounts of the current $I_{OL}$ and the current $I_{OLB}$ each become an amount corresponding to the analog potential.

Note that this configuration example can be combined with any of the other configuration examples and the like described in this specification as appropriate.

Configuration Example 8

Next, a configuration example of the circuit MP in the case where a transistor included in the circuit ILD and a transistor included in the circuit MP have the same polarity is described.

Described here is the configuration example of the case where the constant current source circuit ISC1 (the constant current source circuit ISC2 or the constant current source circuit ISC3) included in the current source circuit ISC of the circuit ILD has a configuration including the n-channel transistor in FIG. 8C, and all of the transistors included in the circuit MP are n-channel transistors.

Figure 41A:
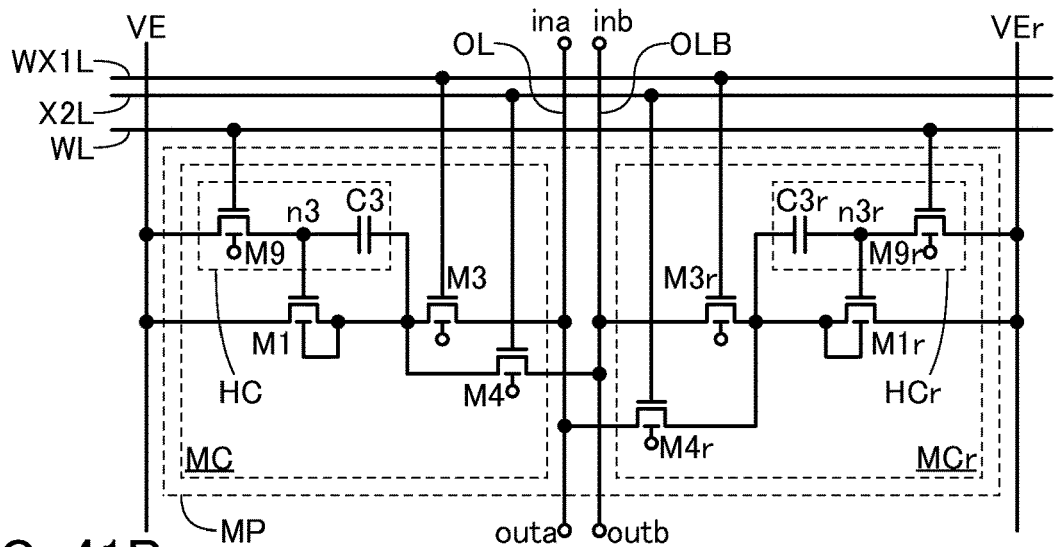
FIG. 41A, FIG. 41B, and FIG. 41C are circuit diagrams each showing a configuration example of a circuit included in a semiconductor device.

The circuit MP illustrated in FIG. 41A is a circuit having a configuration changed from that of the circuit MP in FIG. 21A, and the circuit MP in FIG. 41A is different from the circuit MP in FIG. 21A in the configuration of the holding portion HC and the target to which the back gate of the transistor M1 is connected. Thus, the description of a portion of the circuit MP in FIG. 41A having a connection configuration similar to that of the circuit MP in FIG. 21A is omitted.

In the circuit MP in FIG. 41A, the holding portion HC includes a transistor M9 and the capacitor C3.

In this specification and the like, unless otherwise specified, the transistor M9 in an on state may operate in a linear region in the end. In other words, the gate voltage, the source voltage, and the drain voltage of each of the above transistors may be appropriately biased to voltages in the range where the transistor operates in the linear region.

The gate of the transistor M1 is electrically connected to a first terminal of the transistor M9 and the first terminal of the capacitor C3. A second terminal of the transistor M9 is electrically connected to the wiring VE. The back gate of the transistor M1 is electrically connected to the second terminal of the transistor M1, a second terminal of the capacitor C3, the first terminal of the transistor M3, and the first terminal of the transistor M4.

When the back gate of the transistor M1 and the second terminal of the transistor M1 are electrically connected to each other and a high-level potential is supplied to the first terminal of the transistor M1, the transistor M1 can increase the threshold voltage of the transistor M1 in some cases. Note that the semiconductor device of one embodiment of the present invention is not limited thereto; for example, the circuit MP in FIG. 41A may have a configuration in which the back gate of the transistor M1 is electrically connected to a wiring for supplying a low-level potential. Alternatively, the circuit MP in FIG. 41A may have a configuration in which the transistor M1 does not include a back gate.

In the holding portion HC illustrated in FIG. 41A, the electrical connection point of the gate of the transistor M1, the first terminal of the transistor M9, and the first terminal of the capacitor C3 is a node n3.

In the circuit MP in FIG. 41A, the circuit MCr has substantially the same circuit configuration as the circuit MC. Thus, "r" is added to the reference signs of the circuit elements and the like included in the circuit MCr to differentiate them from the circuit elements and the like included in the circuit MC.

In the circuit MP in FIG. 41A, potentials supplied from the wiring VE and the wiring VEr are each preferably a high-level potential, for example. Since the wiring VSO has a low-level potential in the constant current source circuit ISC1 (the constant current source circuit ISC2 or the constant current source circuit ISC3) illustrated in FIG. 8C, a current can be supplied from the circuit MC or the circuit MCr to the circuit ILD through the wiring OL or the circuit OLB by supplying a high-level potential from the wiring VE or the wiring VEr. Here, the potentials supplied from the wiring VE and the wiring VEr are each described as VDD.

When a current flowing between the source and the drain of the transistor M1 is set in the circuit MC in FIG. 41A (when the first data (for example, a weight coefficient here) is set), a high-level potential is supplied to the wiring WX1L and the wiring WL so that the transistor M3 and the transistor M9 are brought into an on state. Accordingly, a potential of the node n3 of the holding portion HC becomes VDD. After that, a current is generated in the current source circuit ISC in FIG. 8A, whereby the current flows from the wiring VE to the current source circuit ISC through the source and the drain of the transistor M1, the source and the drain of the transistor M3 of the circuit MC, and the wiring OL. At this time, the potential of the second terminal of the capacitor C3 (the potential of the second terminal of the transistor M1) is determined by the current. Here, a low-level potential is supplied to the wiring WX1L and the wiring WL so that the transistors M3 and M9 are brought into an off state, whereby the capacitor C3 can hold a voltage between the gate of the transistor M1 and the second terminal of the transistor M1. Thus, the current can be set between the source and the drain of the transistor M1. After that, a predetermined potential is supplied to each of the wiring WX1L and the wiring X2L so that one of the transistor M3 and the transistor M4 is brought into an on state and the other of the transistor M3 and the transistor M4 is brought into an off state, whereby the set current can be supplied from the wiring VE to the wiring OL or the wiring OLB through the circuit MC.

Figure 41B:
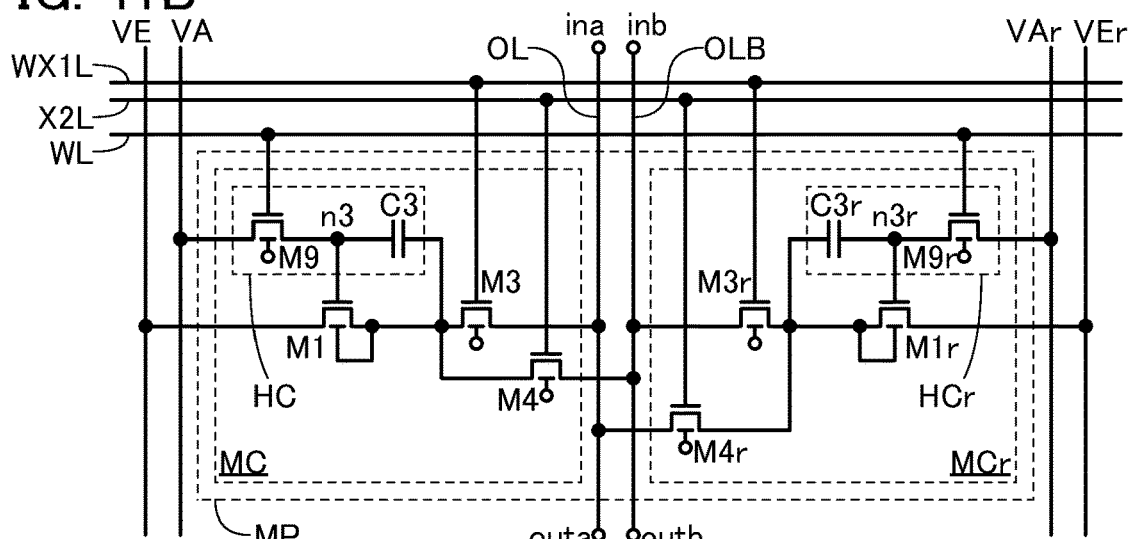

FIG. 41B shows a modification example of the configuration of the circuit MP in FIG. 41A. The circuit MP in FIG. 41B is different from the circuit MP in FIG. 41A in that the second terminal of the transistor M9 is electrically connected to not the wiring VE but the wiring VA, and a second terminal of a transistor M9r is electrically connected to not the wiring VEr but the wiring VA.

The wiring VA functions as a wiring for supplying a constant voltage, for example. It is particularly preferable that the constant voltage be a ground potential, a low-level potential, or a potential higher than VSS and lower than a high-level potential supplied from the wiring VE, i.e., VDD. Here, the constant voltage supplied from the wiring VA is $V_M$, and the potential $V_M$ is a ground potential, a low-level potential, or a potential higher than VSS and lower than a high-level potential supplied form the wiring VE, i.e., VDD.

When the potential of the second terminal of the transistor M1 is $V_S$ in the circuit MP in FIG. 41A, the source-drain voltage of the transistor M1 is $VDD-V_S$. In the case where $V_M$ is input to the gate of the transistor M1, the gate-source voltage of the transistor M1 is $V_M-V_S$. In order to make the transistor M1 operate in a saturation region, when the threshold voltage of the transistor M1 is $V_{th}$, the relation of $VDD-V_S>V_M-V_S-V_{th}$ is satisfied. In the case where the transistor M1 has normally-on characteristics, the transistor M1 can operate in a saturation region because the gate-source voltage $VDD-V_S$ is a positive value even when the gate-source voltage $V_M-V_S$ is a negative value.

Note that "normally-on characteristics" means a state where a channel exists without application of a voltage to a gate of a transistor and a current flows through the transistor.

In the circuit MP in FIG. 41B, the wiring VA and a wiring VAr may be combined into one wiring. For example, as in the circuit MP illustrated in FIG. 41C, the wiring VA and the wiring VAr may be combined into one wiring VA that is provided along the column direction. Note that the wiring VA may be provided along not the column direction but the row direction (not illustrated).

Figure 41C:
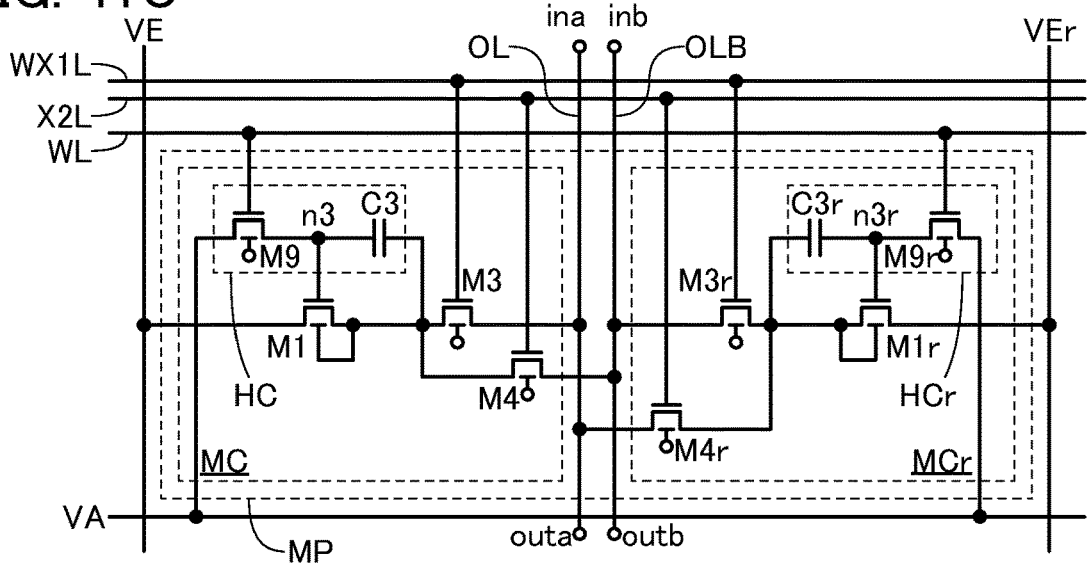

Next, a configuration example of the circuit MP, which is different from those in FIG. 41A to FIG. 41C, in the case where the constant current source circuit ISC1 (the constant current source circuit ISC2 or the constant current source circuit ISC3) and the circuit MP are each a single-polarity circuit of n-channel transistors is described.

Figure 42:
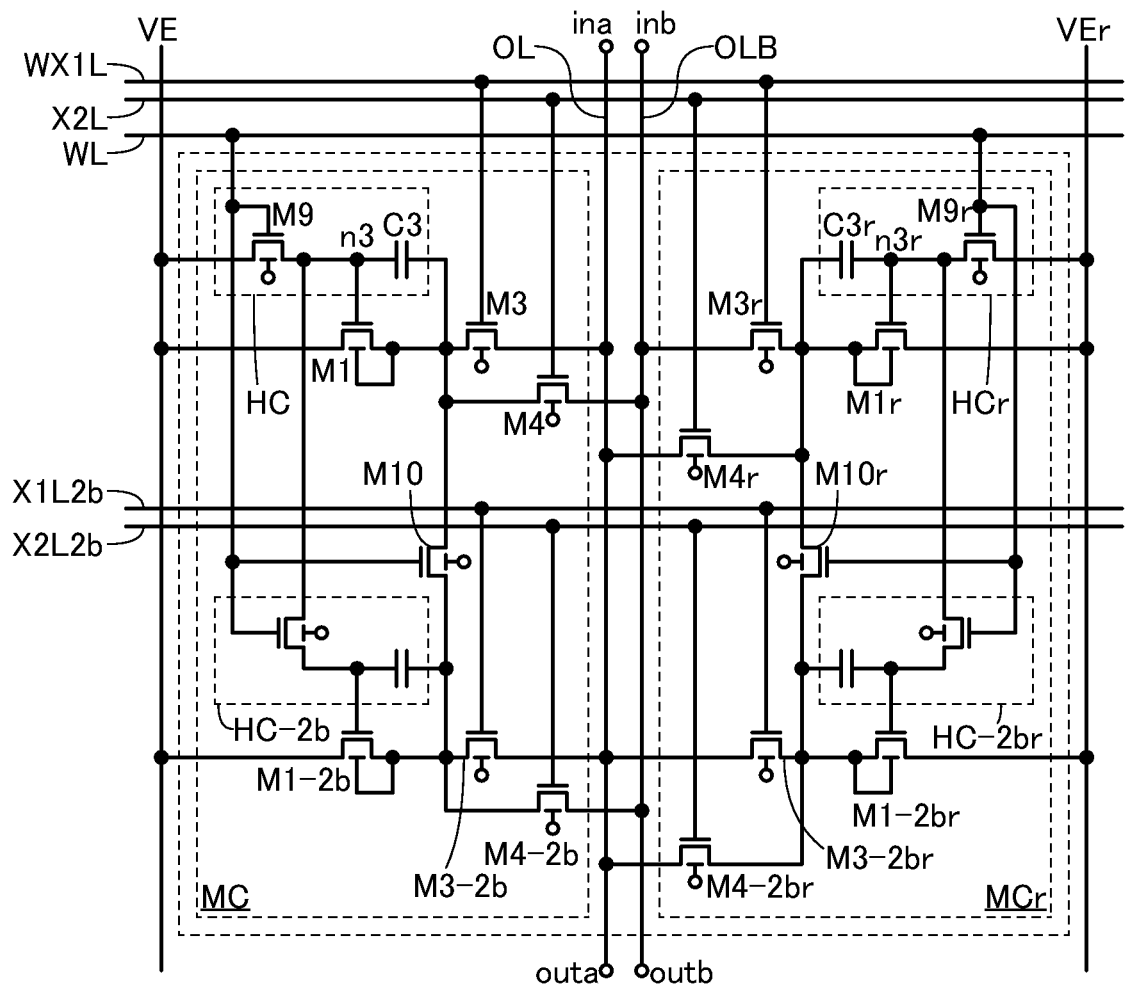
FIG. 42 is a circuit diagram showing a configuration example of a circuit included in a semiconductor device.

The circuit MP illustrated in FIG. 42 is a circuit obtained by modifying the circuit MP in FIG. 41A so that the multilevel second data (for example, a value of a signal of a neuron (an arithmetic value) here) can be processed.

The circuit MC included in the circuit MP in FIG. 42 includes the transistor M1-2*b*, the transistor M3-2*b*, the transistor M4-2*b*, a transistor M10, and the holding portion HC-2*b* in addition to the circuit elements included in the circuit MP in FIG. 41A.

In this specification and the like, unless otherwise specified, the transistor M1-2*b* in an on state may operate in a saturation region in the end, like the transistor M1. In other words, the gate voltage, the source voltage, and the drain voltage of each of the above transistors may be appropriately biased to voltages in the range where the transistor operates in a saturation region. However, one embodiment of the present invention is not limited thereto. The transistor M1-2*b* may operate in a linear region so that the amplitude value of a voltage to be supplied is decreased. Note that in the case where the first data (a weight coefficient) is an analog value, for example, the transistor M1-2*b* may operate in a linear region in some cases and may operate in a saturation region in other cases depending on the magnitude of the first data (a weight coefficient).

In this specification and the like, unless otherwise specified, the transistor M3-2*b*, the transistor M4-2*b*, and the transistor M10 in an on state may operate in a saturation region in the end. In other words, the gate voltage, the source voltage, and the drain voltage of each of the above transistors may be appropriately biased to voltages in the range where the transistor operates in the linear region.

Next, the configuration of the circuit MP in FIG. 42 is described. Note that the description of a portion of the circuit MP in FIG. 42 having a configuration similar to that of the circuit MP in FIG. 41A is omitted.

The holding portion HC-2*b* has a configuration similar to that of the holding portion HC. Thus, in the description of the circuit elements and the like included in the holding portion HC-2*b*, the description is made using the reference signs of the circuit elements included in the holding portion HC in some cases.

In the circuit MC of the circuit MP in FIG. 42, the first terminal of the transistor M1-2*b* is electrically connected to the wiring VE. The second terminal of the transistor M1-2*b* is electrically connected to a back gate of the transistor M1-2*b*, the first terminal of the transistor M3-2*b*, and the first terminal of the transistor M4-2*b*. The gate of the transistor M1-2*b* is electrically connected to the first terminal of the transistor M9 of the holding portion HC-2*b* and the first terminal of the capacitor C1 of the holding portion HC-2*b*. The capacitor C3 of the holding portion HC-2*b* is electrically connected to a first terminal of the transistor M10 and the second terminal of the transistor M1. The second terminal of the transistor M3-2*b* is electrically connected to the wiring OL. The gate of the transistor M3-2*b* is electrically connected to the wiring X1L2*b*. The second terminal of the transistor M4-2*b* is electrically connected to the wiring OLB. The gate of the transistor M4-2*b* is electrically connected to the wiring X2L2*b*. A second terminal of the transistor M10 is electrically connected to the second terminal of the transistor M1, the first terminal of the transistor M3, the first terminal of the transistor M4, and the second terminal of the capacitor C3 of the holding portion HC. The second terminal of the transistor M9 of the holding portion HC-2*b* is electrically connected to the first terminal of the transistor M1 of the holding portion HC. The gate of the transistor M9 of the holding portion HC-2*b* and the gate of the transistor M10 are electrically connected to the wiring WL.

Note that the circuit MCr of the circuit MP in FIG. 42 has substantially the same circuit configuration as the circuit MC. Thus, "r" is added to the reference signs of the circuit elements and the like included in the circuit MCr to differentiate them from the circuit elements and the like included in the circuit MC. A second terminal of the transistor M3-2*br* is electrically connected to the wiring OLB, and a second terminal of the transistor M4-2*br* is electrically connected to the wiring OL.

In the circuit MP in FIG. 42, the sizes, e.g., the channel lengths and the channel widths, of the transistor M3, the transistor M3-2*b*, the transistor M3*r*, the transistor M3-2*br*, the transistor M4, the transistor M4-2*b*, the transistor M4*r*, and the transistor M4-2*br* are preferably equal to each other. Such a circuit configuration might enable efficient layout.

In addition, in the circuit MP in FIG. 42, the sizes, e.g., the channel lengths and the channel widths, of the transistors M9*r* included in the holding portion HCr and the holding portion HC-2*br* are preferably equal to those of the transistors M9 included in the holding portion HC and the holding portion HC-2*b*. Furthermore, the size of the transistor M10*r* is preferably equal to that of the transistor M10.

When the ratio of the W length to the L length of the transistor M1 is W/L, the ratio of the W length to the L length of the transistor M1-2*b* is preferably 2 W/L. In addition, the size of the transistor M1*r* is preferably equal to that of the transistor M1, and the size of the transistor M1-2*br* is preferably equal to that of the transistor M1-2*b*.

The wiring X1L2*b* is a wiring for switching the on state and the off state of the transistor M3-2*b* and the transistor M3-2*br*, and the wiring X2L2*b* is a wiring for switching the on state and the off state of the transistor M4-2*b* and the transistor M4-2*br*.

Next, a method for setting a current (a method for setting the first data (a weight coefficient)) in the circuit MP in FIG. 42 is described.

First, a high-level potential is supplied to the wiring WX1L and the wiring WL so that the transistor M3, the transistor M10, the transistor M9 of the holding portion HC, and the transistor M9 of the holding portion HC-2*b* are brought into an on state. Accordingly, the potential of the node n3 of the holding portion HC becomes VDD and the potential of the node n3 of the holding portion HC-2*b* becomes VDD. After that, a current having the current amount of $3I_{ut}$ is generated in the current source circuit ISC in FIG. 8A, whereby different currents from the wiring VE flow between the source and the drain of the transistor M1 and between the source and the drain of the transistor M1-2b. Specifically, since the ratio of the W length to the L length of the transistor M1-2b is twice as high as the ratio of the W length to the L length of the transistor M1, the amount of current flowing between the source and the drain of the transistor M1 is $I_{ut}$ and the amount of current flowing between the source and the drain of the transistor M1-2b is $2I_{ut}$. The currents flowing between the sources and the drains of the transistor M1 and the transistor M1-2b flow to the current source circuit ISC through the source and the drain of the transistor M3 and the wiring OL. At this time, the potential of the second terminal of the capacitor C3 of the holding portion HC (the potential of the second terminal of the transistor M1) is determined in accordance with the current flowing between the source and the drain of the transistor M1, and the potential of the second terminal of the capacitor C3 of the holding portion HC-2b (the potential of the second terminal of the transistor M1-2b) is determined in accordance with the current flowing between the source and the drain of the transistor M1-2b. Here, a low-level potential is supplied to the wiring WX1L and the wiring WL so that the transistors M3 and M10, the transistor M9 of the holding portion HC, and the transistor M9 of the holding portion HC-2b are brought into an off state, whereby the capacitor C3 of the holding portion HC can hold a voltage between the gate of the transistor M1 and the second terminal of the transistor M1 and the capacitor C3 of the holding portion HC-2b can hold a voltage between the gate of the transistor M1-2b and the second terminal of the transistor M1-2b. In this manner, the amount of current flowing between the source and the drain of the transistor M1 can be set to $I_{ut}$ and the amount of current flowing between the source and the drain of the transistor M1-2b can be set to $2I_{ut}$.

After that, a predetermined potential is supplied to each of the wiring WX1L, the wiring X2L, the wiring X1L2b, and the wiring X2L2b in accordance with the second data (a value of a signal of a neuron), whereby the circuit MP can calculate the product of the set first data (a weight coefficient) and the second data (a value of a signal of a neuron). Note that the calculation of the product of the multilevel first data (a weight coefficient) and the multilevel second data (a value of a signal of a neuron) are described in detail in Configuration example 5.

Figure 43:
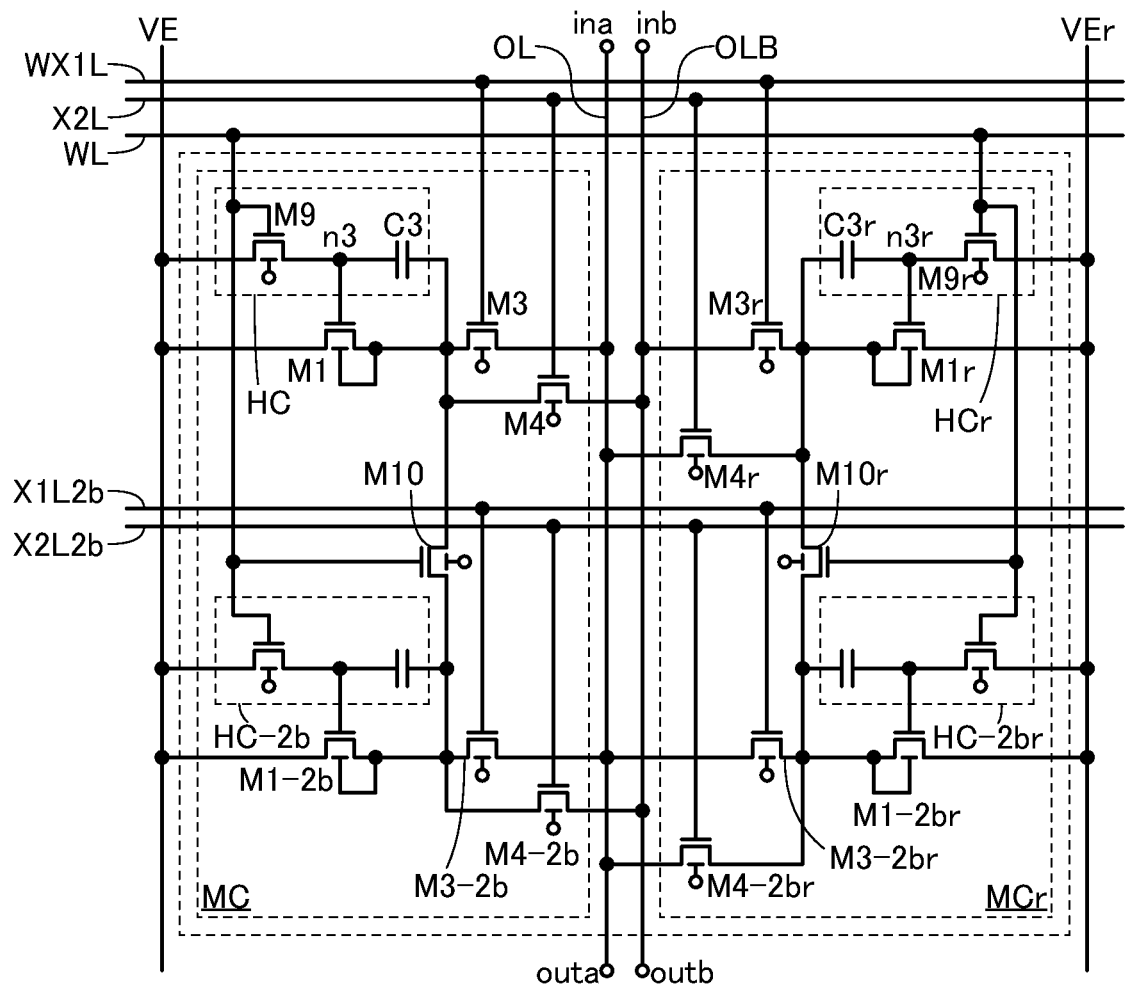
FIG. 43 is a circuit diagram showing a configuration example of a circuit included in a semiconductor device.

Note that the configuration of the circuit MP in FIG. 42 can be changed into that of the circuit MP in FIG. 43. The configuration of the circuit MP in FIG. 43 corresponds to the configuration in which the target to which the second terminal of the transistor M9 of the holding portion HC-2b is connected is changed from the first terminal of the transistor M9 of the holding portion HC to the wiring VE, and the target to which the second terminal of the transistor M9r of the holding portion HC-2br is connected is changed from the first terminal of the transistor M9r of the holding portion HCr to the wiring VEr, in the circuit MP in FIG. 42. The circuit MP in FIG. 43 can operate in a manner similar to that of the circuit MP in FIG. 42.

In the circuit MP in FIG. 42 and the circuit MP in FIG. 43, the wiring VE may be divided into the wiring VE and the wiring VA and the wiring VEr may be divided into the wiring VEr and the wiring VAr, as in the circuit MP in FIG. 41B. The circuit MP illustrated in FIG. 44 has a configuration in which the wiring VE is divided into the wiring VE and the wiring VA in the circuit MP in FIG. 42, and the circuit MP illustrated in FIG. 45 has a configuration in which the wiring VE is divided into the wiring VE and the wiring VA in the circuit MP in FIG. 43.

Figure 44:
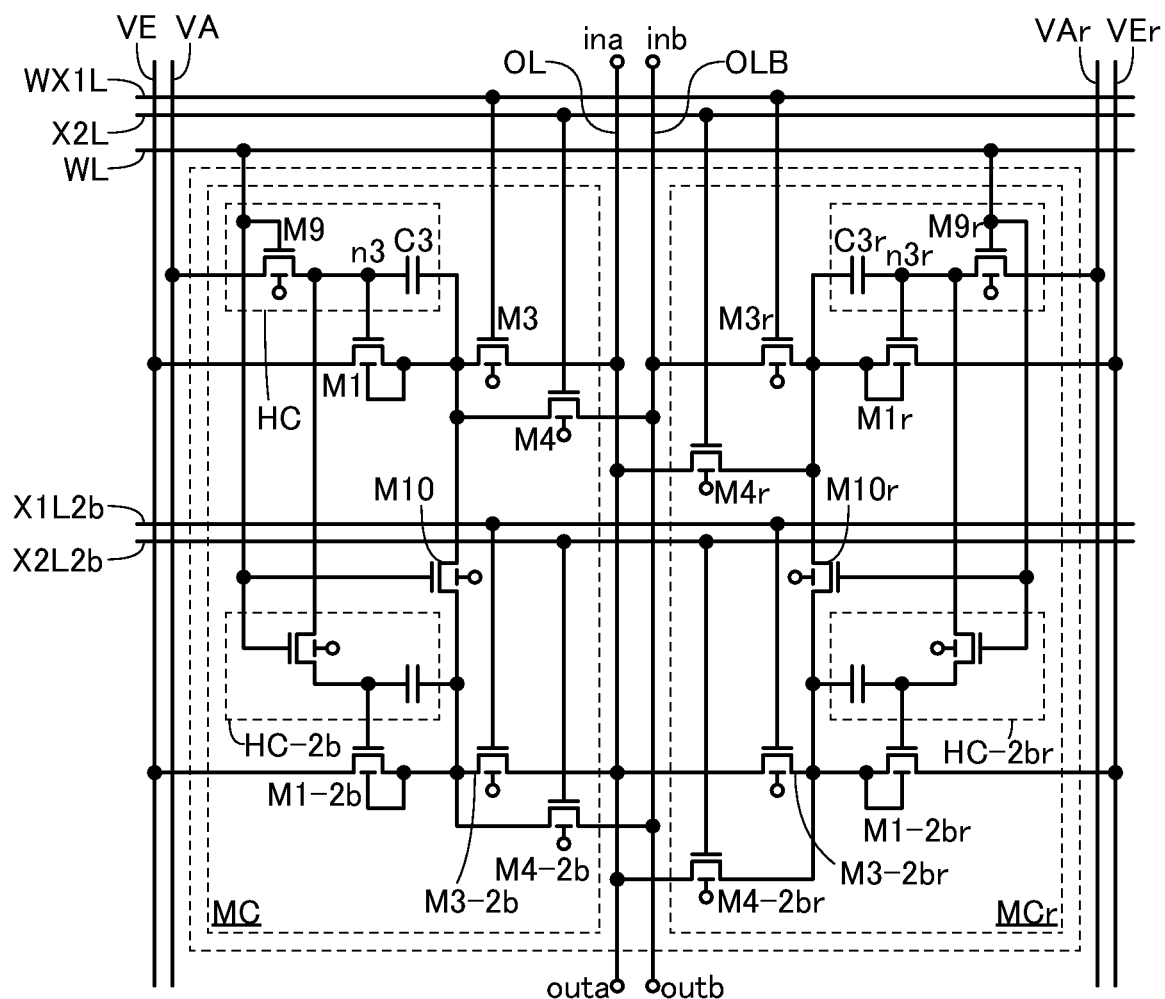
FIG. 44 is a circuit diagram showing a configuration example of a circuit included in a semiconductor device.
Figure 45:
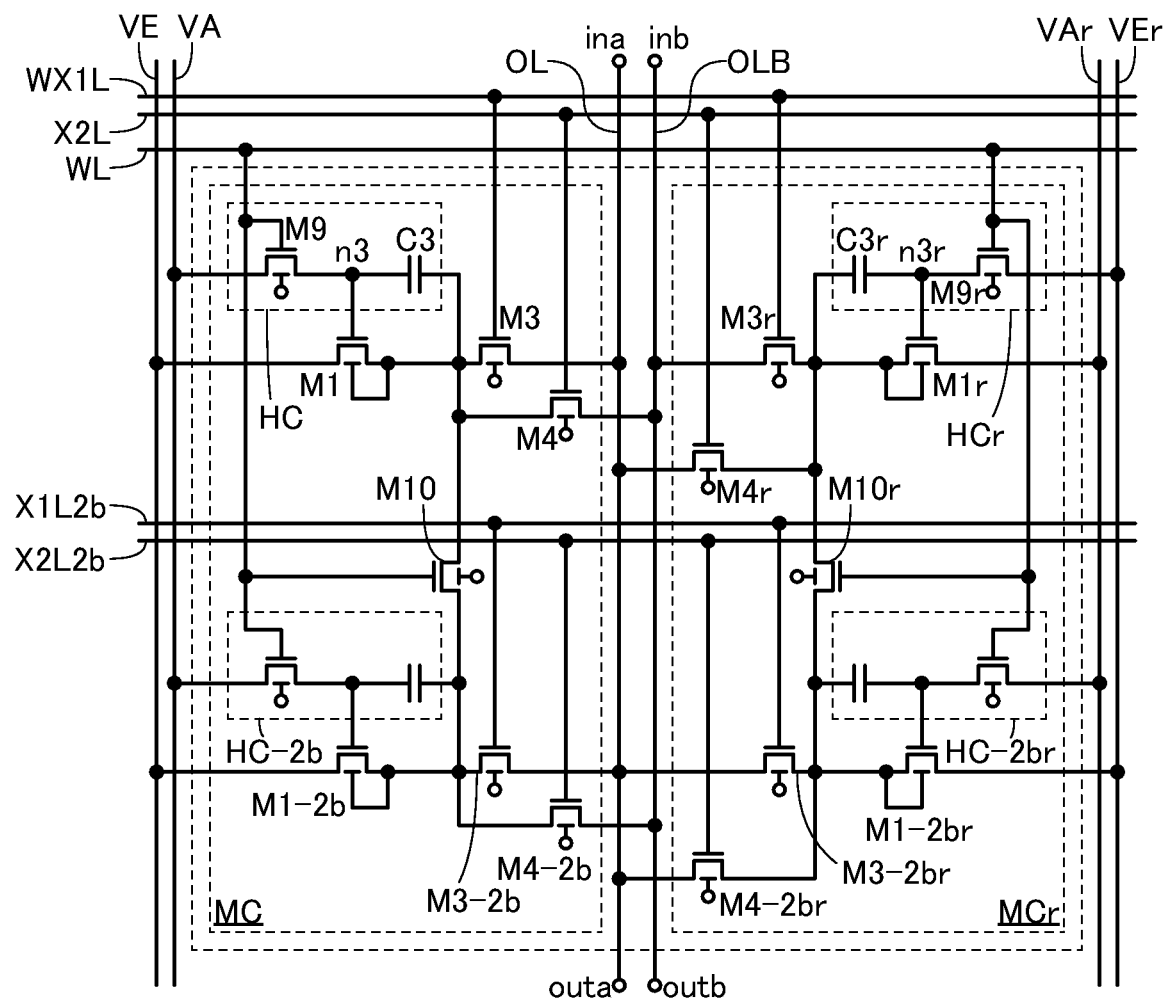
FIG. 45 is a circuit diagram showing a configuration example of a circuit included in a semiconductor device.

The circuit MP in FIG. 44 and the circuit MP in FIG. 45 can operate in a manner similar to those of the circuit MP in FIG. 42 and the circuit MP in FIG. 43, respectively. In the case where the capacitor C3 is connected to the source terminal of the transistor M1 and the like, the source terminal is not connected to a power source line or the like, and the drain terminal is connected to the power source line or the like as illustrated in FIG. 42, FIG. 43, FIG. 44, FIG. 45, and the like, the constant voltage supplied from the wiring VCN is preferably a voltage supplied to the wiring VE or the wiring VA, e.g., a high-level potential (e.g., VDD), when a positive current is supplied from the circuit ILD to the wiring OL or the wiring OLB through the switching circuit TW[j]. That is, when a constant voltage is supplied from the wiring VCN, a potential difference between ends of the capacitor C3 is desirably close to zero. That is, the transistor M1 is desirably brought into an off state. In other words, a potential that does not allow the circuit MC to output a current is desirably supplied to the wiring VCN. In contrast, a low-level potential such as VSS or a ground potential is desirably supplied to the wiring VCN2. Thus, the potentials of the wiring OL and the wiring OLB can be changed in accordance with a current output from the circuit MP.

Note that this configuration example can be combined with any of the other configuration examples described in this specification as appropriate.

Configuration Example 9

Figure 46:
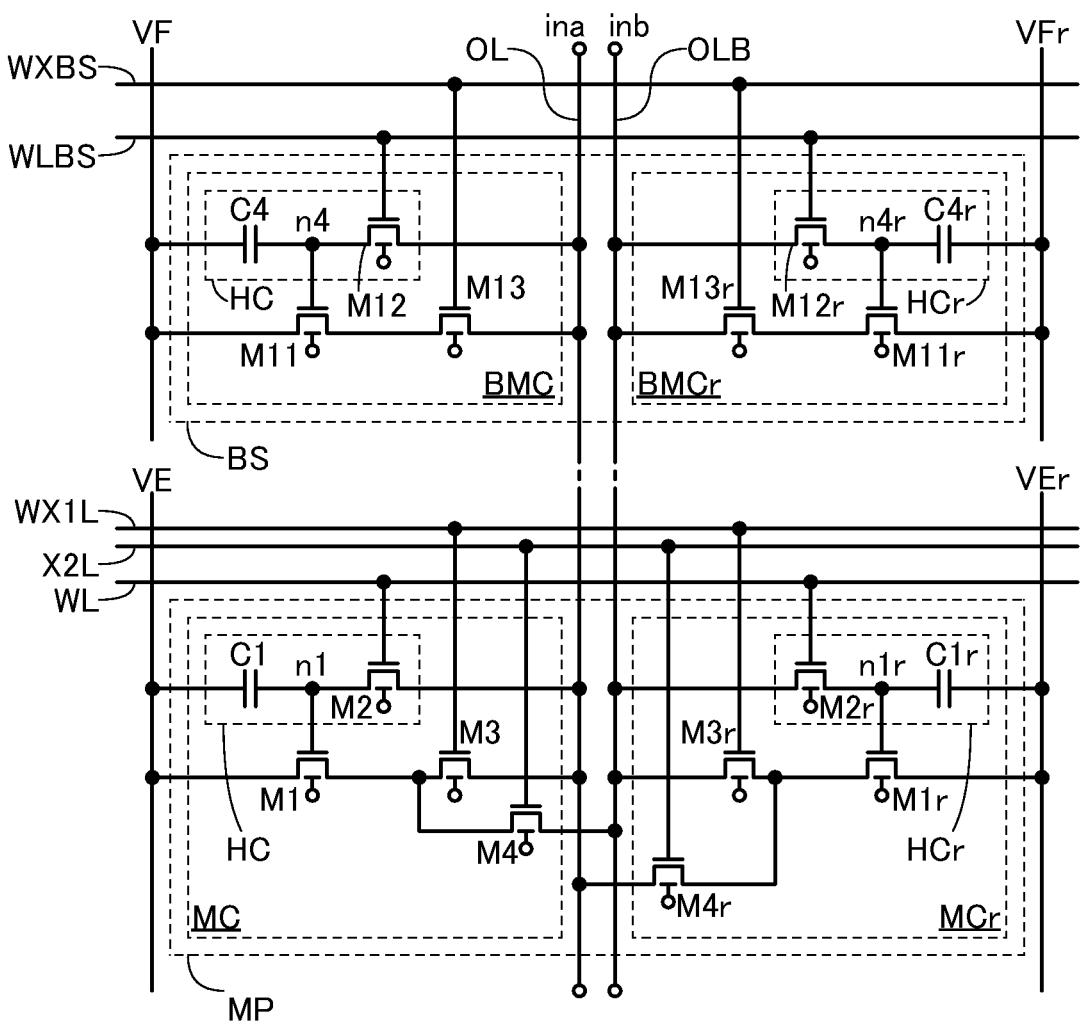
FIG. 46 is a circuit diagram showing a configuration example of a circuit included in a semiconductor device.

FIG. 46 shows an example of the circuit BS and the circuit MP that can be used for the arithmetic circuit 170 in FIG. 14.

As shown in FIG. 46, the circuit MP in FIG. 40 can be used as the circuit BS, for example. A circuit BMC corresponds to the circuit MC of the circuit MP in FIG. 40, and a circuit BMCr corresponds to the circuit MCr of the circuit MP in FIG. 40. A transistor M11 corresponds to the transistor M1 of the circuit MP in FIG. 40, a transistor M12 corresponds to the transistor M12 of the circuit MP in FIG. 40, a transistor M13 corresponds to the transistor M13 of the circuit MP in FIG. 40, a capacitor C4 corresponds to the capacitor C1 of the circuit MP in FIG. 40, and a node n4 corresponds to the node n1 of the circuit MP in FIG. 40. The wiring WXBS corresponds to the wiring WXL of the circuit MP in FIG. 40, the wiring WLBS corresponds to the wiring WL of the circuit MP in FIG. 40, and a wiring VF corresponds to the wiring VE of the circuit MP in FIG. 40. Thus, for the configuration of the circuit BS illustrated in FIG. 46, the description of the circuit MP in FIG. 40 is referred to.

As shown in FIG. 46, the circuit MP in FIG. 15A can be used as the circuit MP, for example. Thus, for the configuration of the circuit MP illustrated in FIG. 46, the description of the circuit MP in FIG. 15A is referred to.

In the circuit BS in FIG. 46, the circuit BMC has substantially the same circuit configuration as the circuit BMCr. In the circuit MP, the circuit MCr has substantially the same circuit configuration as the circuit MC. Thus, "r" is added to the reference signs of the circuit elements and the like included in a circuit BSr to differentiate them from the circuit elements and the like included in the circuit BS, and "r" is added to the reference signs of the circuit elements and the like included in the circuit MCr to differentiate them from the circuit elements and the like included in the circuit MC.

When a "positive bias" is set in the circuit BS, a high-level potential is supplied to the wiring WXBS and the wiring WLBS so that the transistor M12, the transistor M13, a transistor M12r, and a transistor M13r are brought into an on state, as in the operation of the circuit MP in FIG. 40. After that, a current corresponding to the bias is selected in the current source circuit ISC in FIG. 8A and a conduction state is established between the wiring OL and the current source circuit ISC. Accordingly, the current flows from the current source circuit ISC to the wiring VF through the wiring OL and the circuit BMC, so that the potential of the node n4 becomes a potential corresponding to the current. At this time, a conduction state is established between the wiring OLB and the wiring VCN, so that the potential VSS is supplied from the wiring VCN to a node n4r on the circuit BMCr side and the potential of the node n4r becomes VSS. After that, a low-level potential is supplied to the wiring WXBS and the wiring WLBS so that the transistor M12, the transistor M13, the transistor M12r, and the transistor M13r are brought into an off state, whereby the potentials of the node n4 and the node n4r can be held. Accordingly, the "positive bias" can be set in the circuit BS.

When a "negative bias" is set in the circuit BS, a high-level potential is supplied to the wiring WXBS and the wiring WLBS so that the transistor M12, the transistor M13, the transistor M12r, and the transistor M13r are brought into an on state. After that, a current corresponding to the bias is selected in the current source circuit ISC in FIG. 8A and a conduction state is established between the wiring OLB and the current source circuit ISC. Accordingly, the current flows from the current source circuit ISC to a wiring VFr through the wiring OLB and the circuit BMCr, so that the potential of the node n4r becomes a potential corresponding to the current. At this time, a conduction state is established between the wiring OL and the wiring VCN, so that the potential VSS is supplied from the wiring VCN to the node n4 on the circuit BMC side and the potential of the node n4 becomes VSS. After that, a low-level potential is supplied to the wiring WXBS and the wiring WLBS so that the transistor M12, the transistor M13, the transistor M12r, and the transistor M13r are brought into an off state, whereby the potentials of the node n4 and the node n4r can be held. Accordingly, the "negative bias" can be set in the circuit BS.

When a "bias of 0" is set in the circuit BS, a high-level potential is supplied to the wiring WXBS and the wiring WLBS so that the transistor M12, the transistor M13, the transistor M12r, and the transistor M13r are brought into an on state, a conduction state is established between the wiring VCN and each of the wiring OL and the wiring OLB, and the potentials of the nodes n4 and n4r become VSS. After that, a low-level potential is supplied to the wiring WXBS and the wiring WLBS so that the transistor M12, the transistor M13, the transistor M12r, and the transistor M13r are brought into an off state and the potentials VSS of the node n4 and the node n4r are held, whereby the "bias of 0" can be set in the circuit BS.

Depending on the case, a potential other than VSS may be supplied to each of the node n4 and the node n4r when a bias is set in the circuit BS.

After a bias is set in the circuit BS, the first data (for example, a weight coefficient here) is held in the circuit MP and the second data (for example, a value of a signal of a neuron) is supplied to the circuit MP. Specifically, a current corresponding to the weight coefficient is set in the circuit MP, and a potential corresponding to the second data (a value of a signal of a neuron) is supplied from each of the wiring WX1L and the wiring X2L to the circuit MP. Furthermore, the wiring WXBS is set to have a high-level potential in the circuit BS, so that the bias set in the circuit BS can be applied to the product of the first data (a weight coefficient) and the second data (a value of a signal of a neuron), which is calculated in the circuit MP.

Alternatively, it is also possible to hold the first data (a weight coefficient) in the circuit MP in advance, calculate the product of the first data (a weight coefficient) and the second data (a value of a signal of a neuron) in the circuit MP once, set a bias in the circuit BS on the basis of the calculation result, and then perform arithmetic operation again. That is, operation for changing a bias on the basis of the arithmetic operation result may be performed as appropriate.

Although the wiring VF, the wiring VFr, the wiring VE, and the wiring VEr are illustrated in the configuration example in FIG. 46, one embodiment of the present invention is not limited thereto. For example, in the configuration in FIG. 46, the wiring VF and the wiring VE may be combined into one wiring and the wiring VFr and the wiring VEr may be combined into one wiring. Alternatively, for example, in the configuration in FIG. 46, the wiring VF and the wiring VFr may be combined into one wiring and the wiring VE and the wiring VEr may be combined into one wiring, as in the circuit MP in FIG. 16B. Alternatively, for example, in the configuration in FIG. 46, the wiring VF, the wiring VFr, the wiring VE, and the wiring VEr may be combined into one wiring. For example, in the configuration in FIG. 46, two or more wirings selected from the wiring VF, the wiring VFr, the wiring VE, and the wiring VEr may be combined into one wiring.

Note that this configuration example can be combined with any of the other configuration examples and the like described in this specification as appropriate.

Configuration Example 10

Next, an example of a circuit configuration that can be applied to the circuit MP illustrated in FIG. 10 is described.

Figure 47A:
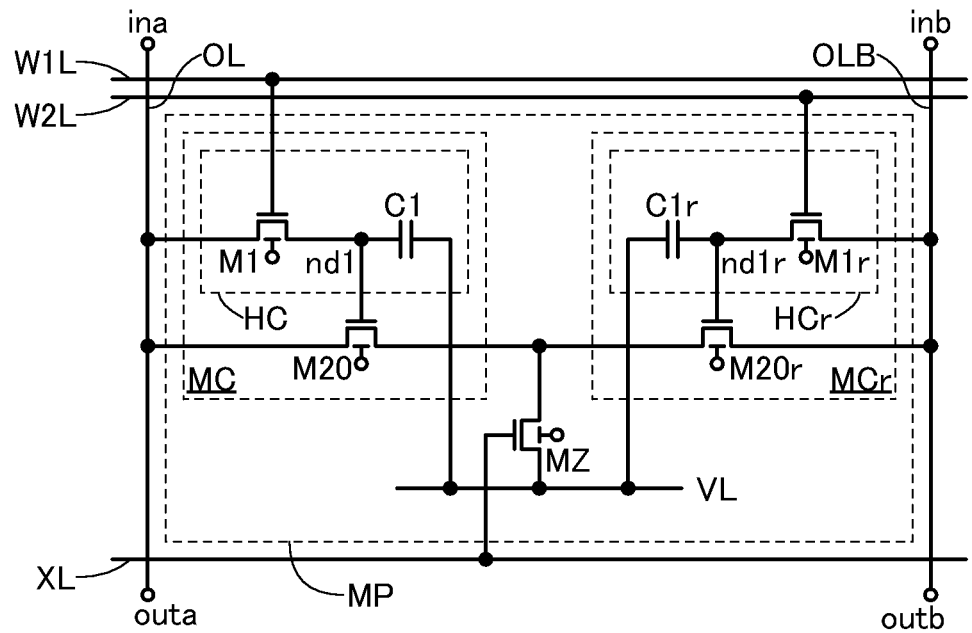
FIG. 47A and FIG. 47B are circuit diagrams each showing a configuration example of a circuit included in a semiconductor device.

The circuit MP illustrated in FIG. 47A shows a configuration example of the circuit MP in FIG. 10 that can be used for the arithmetic circuit 140 in FIG. 7, for example. Note that the circuit MP in FIG. 47A corresponds to a circuit in which the transistor M3 and the transistor M3r of the circuit MP in FIG. 40 are combined into one transistor and the wiring VE and the wiring VEr are combined into one wiring. Specifically, the transistor M3 and the transistor M3r of the circuit MP illustrated in FIG. 40 are combined into the transistor MZ in the circuit MP in FIG. 47A, and the wiring VE and the wiring VEr of the circuit MP illustrated in FIG. 40 are combined into the wiring VE in the circuit MP in FIG. 47A.

The circuit MCr of the circuit MP in FIG. 47A has substantially the same circuit configuration as the circuit MC. Thus, "r" is added to the reference signs of the circuit elements included in the circuit MCr to differentiate them from the circuit elements included in the circuit MC.

Note that in this specification and the like, unless otherwise specified, the transistor MZ in an on state may operate in a linear region in the end. In other words, the gate voltage, the source voltage, and the drain voltage of each of the above transistors may be appropriately biased to voltages in the range where the transistor operates in the linear region.

The circuit MC includes the holding portion HC and a transistor M20, and the circuit MCr includes the holding portion HCr and a transistor M20r.

A first terminal of the transistor M20 is electrically connected to the first terminal of the transistor MZ, a gate of the transistor M20 is electrically connected to the second terminal of the transistor M1 and the first terminal of the capacitor C1, and a second terminal of the transistor M20 is electrically connected to the wiring OL. The second terminal of the capacitor C1 is electrically connected to the wiring VL. The first terminal of the transistor M1 is electrically connected to the wiring OL.

A first terminal of the transistor M20r is electrically connected to the first terminal of the transistor MZ, a gate of the transistor M20r is electrically connected to a second terminal of the transistor M1r and a first terminal of the capacitor C1r, and a second terminal of the transistor M20r is electrically connected to the wiring OLB. A second terminal of the capacitor C1r is electrically connected to the wiring VL. The first terminal of the transistor M1 is electrically connected to the wiring OLB.

The wiring VL functions as a wiring for supplying a constant voltage, for example. The constant voltage can be VSS that is a low-level potential or a ground potential (GND), for example.

As in the holding portion HC and the holding portion HCr included in the circuit MP illustrated in FIG. 15A or the like, a current amount corresponding to a weight coefficient can be set in the holding portion HC and the holding portion HCr included in the circuit MP in FIG. 47A. Specifically, for example, a predetermined potential is supplied to the wiring XL so that the transistor MZ is brought into an on state, and a predetermined potential is supplied to the wiring WL so that the transistor M1 is brought into an on state in the holding portion HC, whereby the current amount corresponding to the weight coefficient is supplied from the wiring OL to the first terminal of the capacitor C1 and the second terminal of the transistor M20. At this time, the transistor M20 is diode-connected, and thus the gate-source voltage of the transistor M20 is determined in accordance with the current amount (the amount of current flowing between the source and the drain). On the assumption that the source potential of the transistor M20 is a potential supplied from the wiring VL, the gate potential of the transistor M20 is determined. By bringing the transistor M1 into an off state here, the gate potential of the transistor M20 can be held. Similarly, in the holding portion HCr, the current amount corresponding to the weight coefficient is supplied from the wiring OLB to the first terminal of the capacitor C1r and the second terminal of the transistor M20r, whereby a potential corresponding to the current amount can be held in the gate of the transistor M20r.

Here, for example, the weight coefficient set in the circuit MP in FIG. 48 is "+1" when the current of $I_{ut}$ is set in the transistor M20 of the holding portion HC and a current is set not to flow through the transistor M20r of the holding portion HCr; "−1" when a current is set not to flow through the transistor M20 of the holding portion HC and the current of $I_{ut}$ is set in the transistor M20r of the holding portion HCr; and "0" when a current is set not to flow through the transistor M20 of the holding portion HC and the transistor M20r of the holding portion HCr.

When a current corresponding to a weight coefficient is set in each of the holding portion HC and the holding portion HCr, the gate potentials of the transistor M20 and the transistor M20r are determined. Here, when a potential corresponding to the value of a signal of a neuron is supplied to the wiring XL, for example, a current flowing between the circuit MP and the wiring OL and/or the wiring OLB is determined. For example, when a high-level potential is supplied as the second data of "+1" to the wiring XL, the constant voltage supplied from the wiring VL is supplied to the first terminal of the transistor M20 and the first terminal of the transistor M20r. Alternatively, for example, when a low-level potential is supplied as the second data of "0" to the wiring XL, the constant voltage supplied from the wiring VL is not supplied to the first terminal of the transistor M20 and the first terminal of the transistor M20r. That is, a current does not flow through the transistor M20 and the transistor M20r.

When the current amount of $I_{ut}$ is set in the transistor M20 and a potential is supplied from the wiring VL to the source of the transistor M20, the current amount of $I_{ut}$ is supplied between the first terminal and the second terminal of the transistor M20. When the transistor M20 is set such that a current does not flow, a current does not flow between the first terminal and the second terminal of the transistor M20 even when a potential is supplied from the wiring VL to the source of the transistor M20. Similarly, when the current amount of $I_{ut}$ is set in the transistor M20r and a potential is supplied from the wiring VL to the source of the transistor M20r, the current amount of $I_{ut}$ is supplied between the first terminal and the second terminal of the transistor M20r. When the transistor M20r is set such that a current does not flow, a current does not flow between the first terminal and the second terminal of the transistor M20r even when a potential is supplied from the wiring VL to the source of the transistor M20r.

That is, the summary of the above description is as follows: when the product of a weight coefficient and a value of a signal of a neuron is "+1", the current amount of $I_{ut}$ is supplied between the circuit MC and the wiring OL and a current does not flow between the circuit MCr and the wiring OLB. When the product of a weight coefficient and a value of a signal of a neuron is "−1", the current amount of $I_{ut}$ is supplied between the circuit MCr and the wiring OLB and a current does not flow between the circuit MC and the wiring OL. When the product of a weight coefficient and a value of a signal of a neuron is "0", a current does not flow between the circuit MC and the wiring OL and a current does not flow between the circuit MCr and the wiring OLB.

As described above, the circuit MP in FIG. 47A can calculate the product of a weight coefficient having three levels "+1", "−1", and "0" and a signal of a neuron (an arithmetic value) having two levels "+1" and "0". In addition, like the circuit MP described in Configuration example 7, the circuit MP in FIG. 47A can calculate the product of the first data (a weight coefficient) that is a "positive multilevel value", "0", or a "negative multilevel value" and the second data (a value of a signal of a neuron) having two levels "+1" and "0", by changing the current amount set in the transistor M20 and the transistor M20r, for example.

Figure 47B:
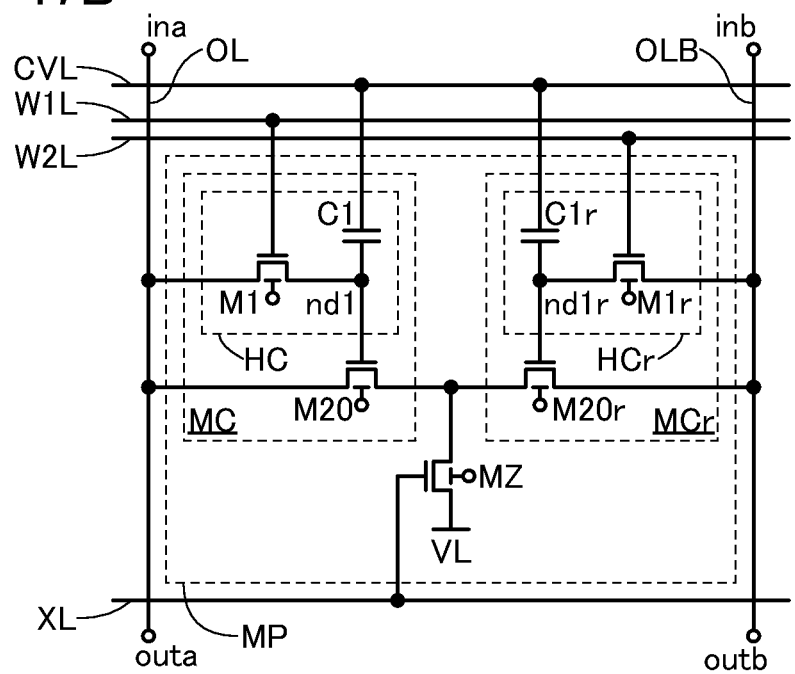

In addition, the circuit MP illustrated in FIG. 47A may be changed into the circuit MP illustrated in FIG. 47B, for example. The circuit MP illustrated in FIG. 47B is different from the circuit MP in FIG. 47A in that the second terminal of the capacitor C1 and the second terminal of the capacitor C1r are electrically connected to not the wiring VL but a wiring CVL.

The wiring CVL functions as a wiring for supplying a constant voltage, for example. The constant voltage can be, for example, a high-level potential, a low-level potential, a ground potential, or the like.

Note that this configuration example can be combined with any of the other configuration examples and the like described in this specification as appropriate.

Note that this embodiment can be combined with any of the other embodiments described in this specification as appropriate.

Embodiment 3

This embodiment describes semiconductor devices capable of product-sum operation of the multilevel first data (for example, one of a weight coefficient and a signal of a neuron) and the multilevel second data (for example, the other of the weight coefficient and the signal of a neuron) and operation methods of the semiconductor devices.

Operation Method Example 1

First, described here is an operation method example of the product-sum operation of the multilevel first data (for example, one of a weight coefficient and a signal of a neuron) and the multilevel second data (for example, the other of the weight coefficient and the signal of a neuron) performed using the semiconductor device described in the above embodiments, for example.

As an example, an operation method of the arithmetic circuit 150 in FIG. 11 for which the circuit MP in FIG. 21A is used is considered. To avoid complexity of description, a current flowing through the wiring OL and the wiring OLB is changed by only one circuit MP electrically connected to the wiring OL and the wiring OLB. The wiring VE and the wiring VEr electrically connected to the circuit MP each supply VSS as a constant voltage to the circuit MP. The circuits ACTF[1] to ACTF[n] included in the circuit AFP are each the circuit ACTF having a configuration of an integrator circuit (or a current-charge (IQ) converter circuit), for example. A configuration may be employed in which the load LEa and the load LEb in the circuit ACTF[j] in FIG. 6E are each a capacitor or the like, for example.

FIG. 48A is a timing chart showing the operation method example. Specifically, FIG. 48A shows changes in the potential of the node n1 of the holding portion HC, the potential of the node n1r of the holding portion HCr, the potential of the wiring WX1L, the current amount of the current $I_{OL}$ flowing through the wiring OL, the current amount of the current $I_{OLB}$ flowing through the wiring OLB, and the amount of charge accumulated in the capacitor of the integrator circuit of the circuit ACTF, from Time T11 to Time T15 and time around the period. In particular, in FIG. 48A, the amount of charge accumulated by a current flowing from the wiring OL to the capacitor of the load LEa is denoted by $Q_{OL}$, and the amount of charge accumulated by a current flowing from the wiring OLB to the capacitor of the load LEb is denoted by $Q_{OLB}$.

In addition, in the timing chart shown in FIG. 48A, a current corresponding to the multilevel first data (for example, a weight coefficient here) is set at time before Time T11. Note that for the method for setting the current, the description in Embodiment 2 is referred to.

In the operation example of the timing chart in FIG. 48A, a weight coefficient of "+1" is set in the circuit MP in advance. Specifically, at time before Time T11, the transistor M1 is set such that the current amount of $I_1$ is supplied, $V_1$ is held at the node n1 of the holding portion HC, and VSS is held at the node n1r of the holding portion HCr. Note that the potential $V_1$ is a potential higher than VSS. In addition, the switches SWH and SWHB are brought into an on state and the switch SWI, the switch SWIB, the switch SWO, the switch SWOB, the switch SWL, and the switch SWLB are brought into an off state in advance so that a conduction state is established between the wiring VCN2 and each of the wiring OL and the wiring OLB and the potentials of the wiring OL and the wiring OLB are set to high-level potentials.

After Time T11, the switch SWO and the switch SWOB are brought into an on state and the switch SWI, the switch SWIB, the switch SWL, the switch SWLB, the switch SWH, and the switch SWHB are brought into an off state so that a conduction state is established between the circuit AFP and each of the wiring OL and the wiring OLB in FIG. 8A.

From Time T12 to Time T13, the second data (for example, a value of a signal of a neuron here) is input to the circuit MP. Note that the input time from Time T12 to Time T13 is denoted by $t_{ut}$. The length of the input time corresponds to the level of the value of a signal of a neuron. That is, by changing the length of the input time, the arithmetic operation result can be changed.

In the operation example in FIG. 48A, a high-level potential is input to the wiring WX1L and a low-level potential is input to the wiring X2L as an input of the second data (a value of a signal of a neuron) to the circuit MP. Accordingly, the high-level potential is input to the gates of the transistor M3 and the transistor M3r and the low-level potential is input to the gates of the transistor M4 and the transistor M4r, so that the transistor M3 and the transistor M3r are each brought into an on state and the transistor M4 and the transistor M4r are each brought into an off state. By this operation, a conduction state is established between the circuit MC and the wiring OL and between the circuit MCr and the wiring OLB, and a non-conduction state is established between the circuit MC and the wiring OLB and between the circuit MCr and the wiring OL.

At this time, the transistor M1 is set such that a current having the current amount of $I_1$ flows, and thus the current having the current amount of $I_1$ flows from the circuit ACTF to the wiring VE through the switching circuit TW, the wiring OL, and the circuit MC. Since the transistor M1r is in an off state (is set such that the current amount of 0 is supplied), a current does not flow from the circuit ACTF to the wiring VEr through the switching circuit TW, the wiring OLB, and the circuit MCr.

Here, the integrator circuit of the circuit ACTF is focused on. Since the second data (a value of a signal of a neuron) is input from Time T12 to Time T13, charge is continuously accumulated from Time T12 to Time T13 in the capacitor (the load LEa) of the integrator circuit included in the circuit ACTF, which is in a conduction state with the wiring OL. Ideally, charge of $t_{ut} \times I_1$ is accumulated in the capacitor at Time T13. Note that in the timing chart in FIG. 48A, the amount of charge accumulated in the capacitor from Time T12 to Time T13 is denoted by Qt. In contrast, charge is not accumulated in the capacitor (the load LEb) of the integrator circuit included in the circuit ACTF, which is in a conduction state with the wiring OLB. As a result, the circuit ACTF can output the signal $z_j^{(k)}$ of a neuron, which corresponds to the charge amount $Q_1$ supplied through the wiring OL and the charge amount of 0 supplied through the wiring OLB.

Next, the case is considered where the input time of a signal of a neuron to the circuit MP in the timing chart in FIG. 48A is changed from $t_{ut}$ to $2t_{ut}$. A timing chart shown in FIG. 48B shows an operation example of the case where the input time of a signal of a neuron to the circuit MP in the timing chart in FIG. 48A is changed from $t_{ut}$ to $2t_{ut}$.

Operations before Time T12 in the timing chart in FIG. 48B are similar to those before Time T12 in the operation example of the timing chart in FIG. 48A. Thus, for the operations before Time T12 in the timing chart in FIG. 48B, the description of the operations before Time T12 in the timing chart in FIG. 48A is referred to.

From Time T12 to Time T14 in the operation example in FIG. 48B, the signal of a neuron is input to the circuit MP. As described above, the input time from Time T12 to Time T14 is $2t_{ut}$.

In the operation example in FIG. 48B, as in the operation example in FIG. 48A, a high-level potential is input to the wiring WX1L and a low-level potential is input to the wiring X2L as an input of the second data (a value of a signal of a neuron) to the circuit MP. Thus, a current having the current amount of $I_1$ flows from the circuit ACTF to the wiring VE through the switching circuit TW, the wiring OL, and the circuit MC. A current does not flow from the circuit ACTF to the wiring VEr through the switching circuit TW, the wiring OLB, and the circuit MCr.

Since the second data (a value of a signal of a neuron) is input from Time T12 to Time T14, charge is continuously accumulated from Time T12 to Time T14 in the capacitor (the load LEa) of the integrator circuit, which is in a conduction state with the wiring OL. Ideally, charge of $2t_{ut} \times I_1$ ($=2Q_1$) is accumulated in the capacitor at Time T14. Note that in the timing chart in FIG. 48B, the amount of charge accumulated in the capacitor from Time T12 to Time T14 is denoted by $Q_2$. In contrast, charge is not accumulated in the capacitor (the load LEb) of the integrator circuit included in the circuit ACTF, which is in a conduction state with the wiring OLB. As a result, the circuit ACTF can output the signal $z_j^{(k)}$ of a neuron, which corresponds to the charge amount $Q_2$ supplied through the wiring OL and the charge amount of 0 supplied through the wiring OLB.

Next, the case is considered where the weight coefficient set in the circuit MP is changed from "+1" to "−2" in the timing chart in FIG. 48A. Specifically, at time before Time T11 in the timing chart shown in FIG. 48C, the transistors M1 and M1r are set such that the current of $I_2$ ($=2I_1$) flows, $V_2$ is held at the node n1r of the holding portion HCr, and VSS is held at the node n1 of the holding portion HC in advance. Note that the potential $V_2$ is a potential higher than $V_1$ and VSS.

Operations before Time T12 in the timing chart in FIG. 48C are similar to those before Time T12 in the operation example of the timing chart in FIG. 48A. Thus, for the operations before Time T12 in the timing chart in FIG. 48C, the description of the operations before Time T12 in the timing chart in FIG. 48A is referred to.

From Time T12 to Time T13 in the operation example in FIG. 48C, a signal of a neuron is input to the circuit MP. As described above, the input time from Time T12 to Time T13 is $t_{ut}$.

In the operation example in FIG. 48C, as in the operation example in FIG. 48A, a high-level potential is input to the wiring WX1L and a low-level potential is input to the wiring X2L as an input of the second data (a value of a signal of a neuron) to the circuit MP. Thus, a current having the current amount of $I_2$ flows from the circuit ACTF to the wiring VEr through the switching circuit TW, the wiring OLB, and the circuit MCr. A current does not flow from the circuit ACTF to the wiring VE through the switching circuit TW, the wiring OL, and the circuit MC.

Since the second data (a value of a signal of a neuron) is input from Time T12 to Time T13, charge is continuously accumulated from Time T12 to Time T13 in the capacitor (the load LEb) of the integrator circuit, which is in a conduction state with the wiring OLB. Ideally, charge of $t_{ut} \times I2$ ($=2t_{ut} \times I_1 = 2Q_1$) is accumulated in the capacitor at Time T13. Note that in the timing chart in FIG. 48C, the amount of charge accumulated in the capacitor from Time T12 to Time T13 is denoted by $Q_2$. In contrast, charge is not accumulated in the capacitor (the load LEa) of the integrator circuit included in the circuit ACTF, which is in a conduction state with the wiring OL. As a result, the circuit ACTF can output the signal $z_j^{(k)}$ of a neuron, which corresponds to the charge amount of 0 supplied through the wiring OL and the charge amount $Q_2$ supplied through the wiring OLB.

As described in the operation examples in FIG. 48A to FIG. 48C, the second data (a value of a signal of a neuron) can be determined in accordance with the input period of the second data to the circuit MP, and the arithmetic operation result output from the circuit ACTF is determined in accordance with the length of the input period. Thus, by defining the second data (a value of a signal of a neuron) in accordance with the length of the input period and the potentials applied to the wiring WX1L and the wiring X2L, the circuit MP can process the three or higher-level second data (a value of a signal of a neuron) and can perform the product-sum operation of the multilevel first data (a weight coefficient) and the three or higher-level second data (a value of a signal of a neuron) and/or arithmetic operation of an activation function.

In this operation example, the second data (a value of a signal of a neuron) input to the circuit MP can be defined as follows, for example. The second data (a value of a signal of a neuron) when a high-level potential is input to the wiring WX1L and a low-level potential is input to the wiring X2L for the input period of $t_{ut}$ is "+1"; the second data (a value of a signal of a neuron) when a high-level potential is input to the wiring WX1L and a low-level potential is input to the wiring X2L for the input period of $2t_{ut}$ is "+2"; and the second data (a value of a signal of a neuron) when a high-level potential is input to the wiring WX1L and a low-level potential is input to the wiring X2L for an input period of $3t_{ut}$ is "+3". In addition, the second data (a value of a signal of a neuron) when a low-level potential is input to the wiring WX1L and a high-level potential is input to the wiring X2L for the input period of $t_{ut}$ is "−1"; the second data (a value of a signal of a neuron) when a high-level potential is input to the wiring WX1L and a low-level potential is input to the wiring X2L for the input period of $2t_{ut}$ is "−2"; and the second data (a value of a signal of a neuron) when a high-level potential is input to the wiring WX1L and a low-level potential is input to the wiring X2L for the input period of $3t_{ut}$ is "−3". Furthermore, the second data (a value of a signal of a neuron) when a low-level potential is input to the wiring WX1L and a low-level potential is input to the wiring X2L is "0".

By defining the second data (a value of a signal of a neuron) input to the circuit MP as described above, "+1" can be obtained as the product of the first data (a weight coefficient) of "+1" and the second data (a value of a signal of a neuron) of "+1" in the operation example shown in FIG. 48A. In the operation example shown in FIG. 48B, "+2" can be obtained as the product of the first data (a weight coefficient) of "+1" and the second data (a value of a signal of a neuron) of "+2". In the operation example shown in FIG. 48C, "−2" can be obtained as the product of the first data (a weight coefficient) of "−2" and the second data (a value of a signal of a neuron) of "+1". The following table shows the charge amount $Q_{OL}$ supplied through the wiring OL and the charge amount $Q_{OLB}$ supplied through the wiring OLB in the case where the first data (a weight coefficient) is any one of "−2", "−1", "0", "+1", and "+2" and the second data (a value of a signal of a neuron) is any one of "−2", "−1", "0", "+1", and "+2" in this operation example. Note that in the following table, a high-level potential is denoted by high and a low-level potential is denoted by low.

TABLE 6

| | | -3<br>(WX1L: low,<br>X2L: high,<br>$3t_{ut}$) | -2<br>(WX1L: low,<br>X2L: high,<br>$2t_{ut}$) | -1<br>(WX1L: low,<br>X2L: high,<br>$t_{ut}$) | 0<br>(WX1L: low,<br>X2L: low) | +1<br>(WX1L: high,<br>X2L: low,<br>$t_{ut}$) | +2<br>(WX1L: high,<br>X2L: low,<br>$2t_{ut}$) | +3<br>(WX1L: high,<br>X2L: low,<br>$3t_{ut}$) |
|---|---|---|---|---|---|---|---|---|
| Weight coefficient | -3 | $Q_{OL} = 9Q_1$,<br>$Q_{OLB} = 0$ | $Q_{OL} = 6Q_1$,<br>$Q_{OLB} = 0$ | $Q_{OL} = 3Q_1$,<br>$Q_{OLB} = 0$ | $Q_{OL} = 0$,<br>$Q_{OLB} = 0$ | $Q_{OL} = 0$,<br>$Q_{OLB} = 3Q_1$ | $Q_{OL} = 0$,<br>$Q_{OLB} = 6Q_1$ | $Q_{OL} = 0$,<br>$Q_{OLB} = 9Q_1$ |
| | -2 | $Q_{OL} = 2Q_1$,<br>$Q_{OLB} = 0$ | $Q_{OL} = 4Q_1$,<br>$Q_{OLB} = 0$ | $Q_{OL} = 2Q_1$,<br>$Q_{OLB} = 0$ | $Q_{OL} = 0$,<br>$Q_{OLB} = 0$ | $Q_{OL} = 0$,<br>$Q_{OLB} = 2Q_1$ | $Q_{OL} = 0$,<br>$Q_{OLB} = 4Q_1$ | $Q_{OL} = 0$,<br>$Q_{OLB} = 6Q_1$ |
| | -1 | $Q_{OL} = 3Q_1$,<br>$Q_{OLB} = 0$ | $Q_{OL} = 2Q_1$,<br>$Q_{OLB} = 0$ | $Q_{OL} = Q_1$,<br>$Q_{OLB} = 0$ | $Q_{OL} = 0$,<br>$Q_{OLB} = 0$ | $Q_{OL} = 0$,<br>$Q_{OLB} = Q_1$ | $Q_{OL} = 0$,<br>$Q_{OLB} = 2Q_1$ | $Q_{OL} = 0$,<br>$Q_{OLB} = 3Q_1$ |
| | 0 | $Q_{OL} = 0$,<br>$Q_{OLB} = 0$ | $Q_{OL} = 0$,<br>$Q_{OLB} = 0$ | $Q_{OL} = 0$,<br>$Q_{OLB} = 0$ | $Q_{OL} = 0$,<br>$Q_{OLB} = 0$ | $Q_{OL} = 0$,<br>$Q_{OLB} = 0$ | $Q_{OL} = 0$,<br>$Q_{OLB} = 0$ | $Q_{OL} = 0$,<br>$Q_{OLB} = 0$ |
| | +1 | $Q_{OL} = 0$,<br>$Q_{OLB} = 3Q_1$ | $Q_{OL} = 0$,<br>$Q_{OLB} = 2Q_1$ | $Q_{OL} = 0$,<br>$Q_{OLB} = Q_1$ | $Q_{OL} = 0$,<br>$Q_{OLB} = 0$ | $Q_{OL} = Q_1$,<br>$Q_{OLB} = 0$ | $Q_{OL} = 2Q_1$,<br>$Q_{OLB} = 0$ | $Q_{OL} = 3Q_1$,<br>$Q_{OLB} = 0$ |
| | +2 | $Q_{OL} = 0$,<br>$Q_{OLB} = 6Q_1$ | $Q_{OL} = 0$,<br>$Q_{OLB} = 4Q_1$ | $Q_{OL} = 0$,<br>$Q_{OLB} = 2Q_1$ | $Q_{OL} = 0$,<br>$Q_{OLB} = 0$ | $Q_{OL} = 2Q_1$,<br>$Q_{OLB} = 0$ | $Q_{OL} = 4Q_1$,<br>$Q_{OLB} = 0$ | $Q_{OL} = 6Q_1$,<br>$Q_{OLB} = 0$ |
| | +3 | $Q_{OL} = 0$,<br>$Q_{OLB} = 9Q_1$ | $Q_{OL} = 0$,<br>$Q_{OLB} = 6Q_1$ | $Q_{OL} = 0$,<br>$Q_{OLB} = 3Q_1$ | $Q_{OL} = 0$,<br>$Q_{OLB} = 0$ | $Q_{OL} = 3Q_1$,<br>$Q_{OLB} = 0$ | $Q_{OL} = 6Q_1$,<br>$Q_{OLB} = 0$ | $Q_{OL} = 9Q_1$,<br>$Q_{OLB} = 0$ |

Table header spanning columns: Value of signal of neuron

One embodiment of the present invention is not limited to the above definition. Although the second data (a value of a signal of a neuron) is defined above as a positive multilevel value, a negative multilevel value, or 0, the second data (a value of a signal of a neuron) can be processed as an analog value by using not a discrete value but a continuous value as the input period (by setting the input period to $a \times t_{ut}$, where a is a positive real number).

In addition, although the first data (a weight coefficient) set in the circuit MP is "+1" in the operation examples shown in FIG. 48A and FIG. 48B and the first data (a weight coefficient) set in the circuit MP is "−2" in the operation example shown in FIG. 48C, calculation may be performed using the first data (a weight coefficient) other than "+1" and "−2". As described in Embodiment 1 and Embodiment 2, an analog value or the like can be set in the circuit MP as the first data (a weight coefficient); thus, the amount of charge accumulated in the capacitor of the integrator circuit included in the circuit ACTF can also be calculated in accordance with the first data (a weight coefficient) that is an analog value or the like.

In the operation examples shown in FIG. 48A to FIG. 48C, the case is considered where only one circuit MP is electrically connected to the wiring OL and the wiring OLB to avoid complexity of description; however, a plurality of circuits MP may be electrically connected to the wiring OL and the wiring OLB as in the arithmetic circuit 150 in FIG. 11. In this case, the sum of the amounts of charges input from the wiring OL and the wiring OLB to the plurality of circuits MP can be accumulated in the capacitor of the integrator circuit included in the circuit ACTF, which enables the circuit ACTF to output the signal $z_j^{(k)}$ of a neuron corresponding to the amounts of charges flowing through the wiring OL and the wiring OLB. Note that in FIG. 48A to FIG. 48C, the potential of the wiring WX1L begins to change at Time T12. That is, even when the period during which the potential of the wiring WX1L is a high-level potential is different between FIG. 48A to FIG. 48C, the potential of the wiring WX1L changes from a low-level potential to a high-level potential at the same time (Time T12); however, one embodiment of the present invention is not limited thereto. For example, even when the period during which the potential of the wiring WX1L is a high-level potential is different between FIG. 48A to FIG. 48C, operation may be performed such that the potential of the wiring WX1L changes from a high-level potential to a low-level potential at the same time. Alternatively, even when the period during which the potential of the wiring WX1L is a high-level potential is different between FIG. 48A to FIG. 48C, operation may be performed such that the middle time of the period during which the potential of the wiring WX1L is a high-level potential is the same.

Although the arithmetic circuit 150 in FIG. 11 is used as an example in this operation example, operation similar to that of this operation example can be performed by changing the arithmetic circuit to another one according to circumstances. For example, the case is considered where the circuit MP in FIG. 47A is used for the arithmetic circuit 140 in FIG. 7 and the circuits ACTF[1] to ACTF[n] included in the circuit AFP each have a configuration of an integrator circuit (or a current-charge (IQ) converter circuit). In the case of this circuit configuration, the product of the first data that is any of a "positive multilevel value", a "negative multilevel value", and "0" and the second data that is a "positive multilevel value" or "0" can be calculated as in this operation example, by setting the amount of current flowing through the transistor M8 and the transistor M8r in accordance with the first data (a weight coefficient) and setting a period for supplying a high-level potential to the wiring XL in accordance with the second data (a value of a signal of a neuron). Alternatively, the calculation may be performed using an analog value as the first data and/or the second data.

Note that this operation method example can be combined with any of the other operation method examples and the like described in this specification as appropriate.

Operation Method Example 2

Next, other operation method examples different from the operation examples shown in FIG. 48A to FIG. 48C are described.

As an example, an operation method of the arithmetic circuit 150 in FIG. 11 for which the circuit MP in FIG. 21A is used is considered, as in FIG. 48A to FIG. 48C. To avoid complexity of description, a current flowing through the wiring OL and the wiring OLB is changed by only one circuit MP electrically connected to the wiring OL and the wiring OLB. The wiring VE and the wiring VEr electrically connected to the circuit MP each supply VSS as a constant voltage to the circuit MP. The circuits ACTF[1] to ACTF[n] included in the circuit AFP are each the circuit ACTF having a configuration of an integrator circuit (or a current charge (IQ) converter circuit), for example. A configuration may be employed in which the load LEa and the load LEb in the circuit ACTF[j] in FIG. 6E are each a capacitor or the like, for example.

Figures 49A, 49B, 49C:
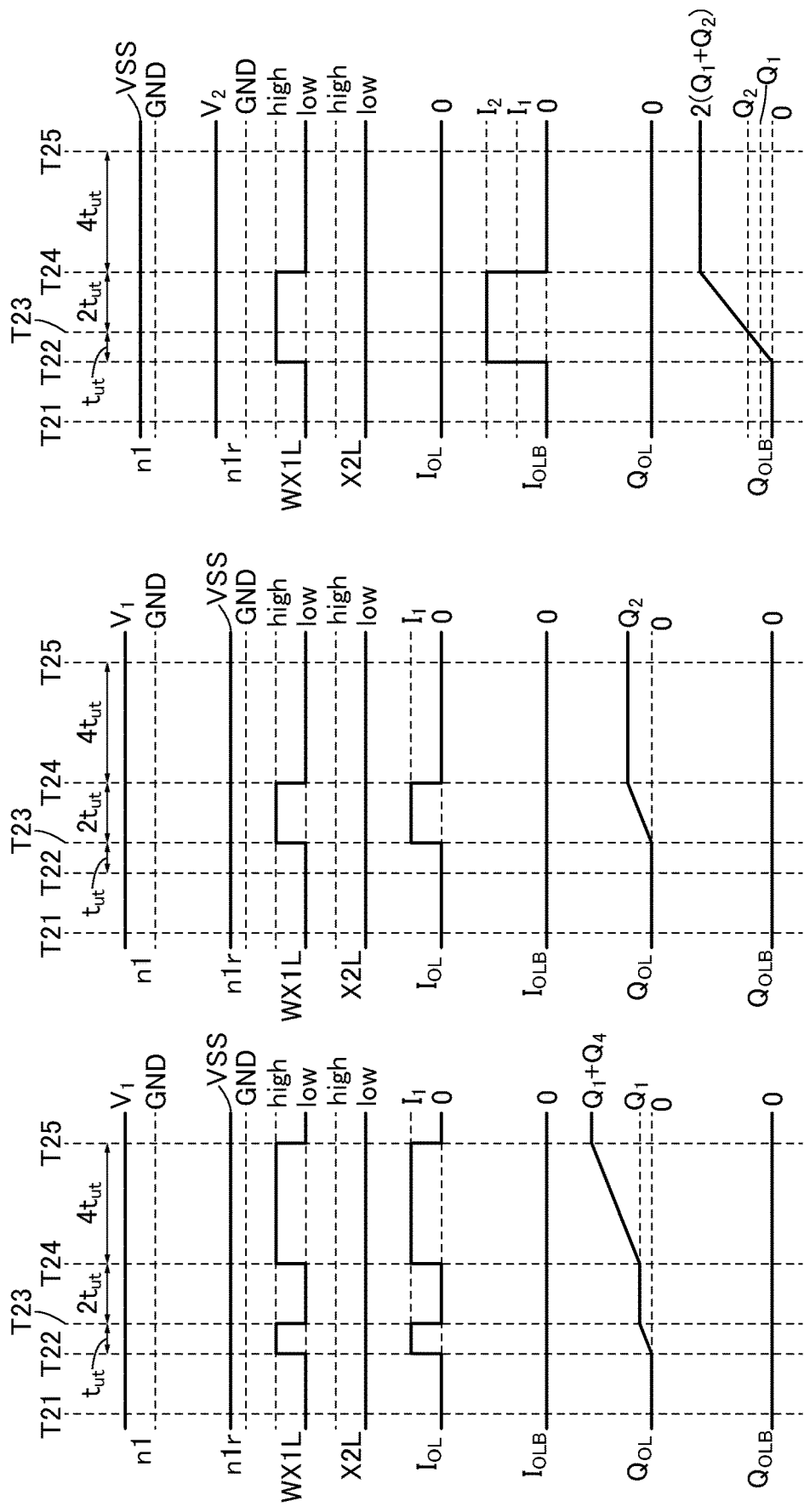
FIG. 49A, FIG. 49B, and FIG. 49C are timing charts each showing an operation example of a semiconductor device.

FIG. 49A is a timing chart showing the operation method example. Specifically, FIG. 49A shows changes in the potential of the node n1 of the holding portion HC, the potential of the node n1r of the holding portion HCr, the potential of the wiring WX1L, the current amount of the current $I_{OL}$ flowing through the wiring OL, the current amount of the current $I_{OLB}$ flowing through the wiring OLB, and the amount of charge accumulated in the capacitor of the integrator circuit of the circuit ACTF, from Time T21 to Time T25 and time around the period. In particular, in FIG. 49A, the amount of charge accumulated by a current flowing from the wiring OL to the capacitor of the load LEa is denoted by $Q_{OL}$, and the amount of charge accumulated by a current flowing from the wiring OLB to the capacitor of the load LEb is denoted by $Q_{OLB}$.

In addition, in the timing chart shown in FIG. 49A, a current corresponding to the multilevel first data (for example, a weight coefficient here) is set at time before Time T21. Note that for the method for setting the current, the description in Embodiment 2 is referred to.

In the operation example of the timing chart in FIG. 49A, the first data (for example, a weight coefficient here) of "+1" is set in the circuit MP in advance. Specifically, at time before Time T21, the transistor M1 is set such that the current amount of $I_1$ is supplied, $V_1$ is held at the node n1 of the holding portion HC, and VSS is held at the node n1r of the holding portion HCr. Note that the potential $V_1$ is a potential higher than VSS. In addition, the switch SWH and the switch SWHB are brought into an on state and the switch SWI, the switch SWIB, the switch SWO, the switch SWOB, the switch SWL, and the switch SWLB are brought into an off state in advance so that a conduction state is established between the wiring VCN2 and each of the wiring OL and the wiring OLB and the potentials of the wiring OL and the wiring OLB are set to high-level potentials.

After Time T21, the switch SWO and the switch SWOB are brought into an on state and the switch SWI, the switch SWIB, the switch SWL, the switch SWLB, the switch SWH, and the switch SWHB are brought into an off state so that a conduction state is established between the circuit AFP and each of the wiring OL and the wiring OLB in FIG. 8A.

After Time T22, the second data (for example, a value of a signal of a neuron here) is input to the circuit MP. Note that in the operation example in FIG. 48A, the input time of the second data (a value of a signal of a neuron) to the circuit MP is divided into a period from Time T22 to Time T23, a period from Time T23 to Time T24, and a period from Time T24 to Time T25. Specifically, the input time from Time T22 to Time T23 is $t_{ut}$, the input time from Time T23 to Time T24 is $2t_{ut}$, and the input time from Time T24 to Time T25 is $4t_{ut}$, which are respectively referred to as a first subperiod, a second subperiod, and a third subperiod in this specification and the like.

In the operation example in FIG. 49A, a high-level potential is input to the wiring WX1L and a low-level potential is input to the wiring X2L as an input of the second data (a value of a signal of a neuron) to the circuit MP in the first subperiod and the third subperiod. Accordingly, the high-level potential is input to the gates of the transistor M3 and the transistor M3r and the low-level potential is input to the gates of the transistor M4 and the transistor M4r, so that the transistor M3 and the transistor M3r are each brought into an on state and the transistor M4 and the transistor M4r are each brought into an off state. By this operation, a conduction state is established between the circuit MC and the wiring OL and between the circuit MCr and the wiring OLB, and a non-conduction state is established between the circuit MC and the wiring OLB and between the circuit MCr and the wiring OL.

At this time, the transistor M1 is set such that the current amount of $I_1$ is supplied, and thus a current having the current amount of $I_1$ flows from the circuit ACTF to the wiring VE through the switching circuit TW, the wiring OL, and the circuit MC in the first subperiod and the third subperiod. In the second subperiod, a low-level potential is input to the wiring WX1L and the wiring X2L and the low-level potential is input to the gates of the transistor M3, the transistor M3r, the transistor M4, and the transistor M4r; thus, the transistor M3, the transistor M3r, the transistor M4, and the transistor M4r are each brought into an off state, so that a current does not flow from the circuit ACTF to the wiring VE through the switching circuit TW, the wiring OL, and the circuit MC.

Since the transistor M1r is in an off state (is set such that the current amount of 0 is supplied) in the first subperiod, the second subperiod, and the third subperiod, a current does not flow from the circuit ACTF to the wiring VEr through the switching circuit TW, the wiring OLB, and the circuit MCr.

Here, the integrator circuit of the circuit ACTF is focused on. Since the second data (a signal of a neuron) is input after Time T22, charge is continuously accumulated after Time T22 in the capacitor (the load LEa) of the integrator circuit included in the circuit ACTF, which is in a conduction state with the wiring OL. Ideally, charge of $t_{ut} \times I_1$ is accumulated in the capacitor in the first subperiod and charge of $4t_{ut} \times I_1$ is accumulated in the third subperiod. Note that in the timing chart in FIG. 49A, the amount of charge accumulated in the capacitor in the first subperiod is denoted by $Q_1$ and the amount of charge accumulated in the capacitor in the third subperiod is denoted by $Q_4$. Thus, the amount of charge accumulated in the capacitor after Time T25 is denoted by $Q_1+Q_4$. In contrast, charge is not accumulated in the capacitor (the load LEb) of the integrator circuit included in the circuit ACTF, which is in a conduction state with the wiring OLB. As a result, the circuit ACTF can output the signal $z_j^{(k)}$ of a neuron, which corresponds to the charge amount $Q_1+Q_4$ ($=5Q_1$) supplied through the wiring OL and the charge amount of 0 supplied through the wiring OLB.

Next, the case is considered where the input period of a signal of a neuron to the circuit MP in the timing chart in FIG. 49A is changed from the first period and the third period to the second period. A timing chart shown in FIG. 49B shows an operation example of the case where the input period of a signal of a neuron to the circuit MP in the timing chart in FIG. 49A is changed from the first period and the third period to the second period.

Operations before Time T22 in the timing chart in FIG. 49B are similar to those before Time T22 in the operation example of the timing chart in FIG. 49A. Thus, for the operations before Time T22 in the timing chart in FIG. 49B, the description of the operations before Time T22 in the timing chart in FIG. 49A is referred to.

In the operation example in FIG. 49B, a signal of a neuron is input to the circuit MP after Time T22. Specifically, a signal of a neuron is input to the circuit MP in the second subperiod, as described above.

In the operation example in FIG. 49B, a high-level potential is input to the wiring WX1L and a low-level potential is input to the wiring X2L as an input of a signal of a neuron (an arithmetic value) to the circuit MP in the second subperiod. Thus, a current having the current amount of $I_1$ flows from the circuit ACTF to the wiring VE through the switching circuit TW, the wiring OL, and the circuit MC in the second subperiod. Since a low-level potential is input to the wiring WX1L and the wiring X2L in the first subperiod and the third subperiod, the transistor M3, the transistor M3$r$, the transistor M4, and the transistor M4$r$ are each brought into an off state, so that a current does not flow from the circuit ACTF to the wiring VE through the switching circuit TW, the wiring OL, and the circuit MC.

Since the transistor M1$r$ is in an off state (is set such that the current amount of 0 is supplied) in the first subperiod, the second subperiod, and the third subperiod, a current does not flow from the circuit ACTF to the wiring VE$r$ through the switching circuit TW, the wiring OLB, and the circuit MC$r$.

Since the second data (a value of a signal of a neuron) is input after Time T22, charge is continuously accumulated after Time T22 in the capacitor (the load LEa) of the integrator circuit, which is in a conduction state with the wiring OL. Ideally, charge of $2t_{ut} \times I_1$ is accumulated in the capacitor at Time T25. Note that in the timing chart in FIG. 49B, the amount of charge accumulated in the capacitor after Time T22 is denoted by $Q_2$. In contrast, charge is not accumulated in the capacitor (the load LEb) of the integrator circuit included in the circuit ACTF, which is in a conduction state with the wiring OLB. As a result, the circuit ACTF can output the signal $z_j^{(k)}$ of a neuron, which corresponds to the charge amount $Q_2$ ($=2Q_1$) supplied through the wiring OL and the charge amount of 0 supplied through the wiring OLB.

Next, the case is considered where the weight coefficient set in the circuit MP in the timing chart in FIG. 49A is changed from "+1" to "−2" and the input period of the second data (a signal of a neuron) is changed from the first subperiod and the third subperiod to the first subperiod and the second subperiod.

At time before Time T21 in the timing chart shown in FIG. 49C, the transistor M1 is set such that the current of $I_2$ ($=2I_1$) flows, $V_2$ is held at the node n1 of the holding portion HC, and VSS is held at the node n1$r$ of the holding portion HCr in advance. Note that the potential $V_2$ is a potential higher than $V_1$ and VSS.

Operations before Time T22 in the timing chart in FIG. 49C are similar to those before Time T22 in the operation example of the timing chart in FIG. 49A. Thus, for the operations before Time T22 in the timing chart in FIG. 49C, the description of the operations before Time T22 in the timing chart in FIG. 49A is referred to.

In the operation example in FIG. 49C, a signal of a neuron is input to the circuit MP after Time T22. As described above, a signal of a neuron is input to the circuit MP in the first subperiod and the second subperiod.

In the operation example in FIG. 49C, a high-level potential is input to the wiring WX1L and a low-level potential is input to the wiring X2L as an input of the second data (a value of a signal of a neuron) to the circuit MP in the first subperiod and the second subperiod. Thus, a current having the current amount of $I_2$ flows from the circuit ACTF to the wiring VE$r$ through the switching circuit TW, the wiring OLB, and the circuit MC$r$ in the first subperiod and the second subperiod. Since a low-level potential is input to the wiring WX1L and the wiring X2L in a fourth subperiod, the transistor M3, the transistor M3$r$, the transistor M4, and the transistor M4$r$ are each brought into an off state, so that a current does not flow from the circuit ACTF to the wiring VE$r$ through the switching circuit TW, the wiring OLB, and the circuit MC$r$.

Since the transistor M1 is in an off state (is set such that the current amount of 0 is supplied) in the first subperiod, the second subperiod, and the third subperiod, a current does not flow from the circuit ACTF to the wiring VE through the switching circuit TW, the wiring OL, and the circuit MC.

Since the second data (a signal of a neuron) is input after Time T22, charge is continuously accumulated after Time T22 in the capacitor (the load LEb) of the integrator circuit, which is in a conduction state with the wiring OLB. Ideally, charge of $6t_{ut} \times I_1$ ($=t_{ut} \times 2I_1 + 2t_{ut} \times 2I_1$) is accumulated in the capacitor at Time T25. Note that in the timing chart in FIG. 49C, the amount of charge accumulated in the capacitor after Time T25 is denoted by $2(Q_1+Q_2)$. In contrast, charge is not accumulated in the capacitor (the load LEa) of the integrator circuit included in the circuit ACTF, which is in a conduction state with the wiring OLB. As a result, the circuit ACTF can output the signal $z_j^{(k)}$ of a neuron, which corresponds to the charge amount of 0 supplied through the wiring OL and the charge amount $Q_2$ corresponding to the charge amount $2(Q_1+Q_2)$ ($=6Q_1$) supplied through the wiring OLB.

As described in the operation examples shown in FIG. 49A to FIG. 49C, the second data (a value of a signal of a neuron) can be determined in accordance with one or more periods selected from a plurality of subperiods provided in a period during which the second data (a value of a signal of a neuron) can be input to the circuit MP, and the arithmetic operation result output from the circuit ACTF is determined in accordance with the selected period(s). Thus, by defining the second data (a value of a signal of a neuron) in accordance with the selected subperiod(s) and the potentials applied to the wiring WX1L and the wiring X2L, the circuit MP can process the three or higher-level second data (a value of a signal of a neuron) and can perform the product-sum operation of the multilevel first data (a weight coefficient) and the three or higher-level second data (a value of a signal of a neuron) and/or arithmetic operation of an activation function.

In this operation example, the second data (a value of a signal of a neuron) input to the circuit MP can be defined as follows, for example. The second data (a value of a signal of a neuron) when a high-level potential is input to the wiring WX1L and a low-level potential is input to the wiring X2L only in the first subperiod is "+1"; the second data (a value of a signal of a neuron) when a high-level potential is input to the wiring WX1L and a low-level potential is input to the wiring X2L only in the second subperiod is "+2"; and the second data (a value of a signal of a neuron) when a high-level potential is input to the wiring WX1L and a low-level potential is input to the wiring X2L only in the third subperiod is "+4". The second data (a value of a signal of a neuron) when a low-level potential is input to the wiring WX1L and a high-level potential is input to the wiring X2L only in the first subperiod is "−1"; the second data (a value of a signal of a neuron) when a low-level potential is input to the wiring WX1L and a high-level potential is input to the wiring X2L only in the second subperiod is "−2"; and the second data (a value of a signal of a neuron) when a low-level potential is input to the wiring WX1L and a high-level potential is input to the wiring X2L only in the third subperiod is "−4". Furthermore, the second data (a value of a signal of a neuron) when a low-level potential is input to the wiring WX1L and a low-level potential is input to the wiring X2L in the first subperiod, the second subperiod, and the third subperiod is "0".

In the case where the second data (a value of a signal of a neuron) is to be "+3", a high-level potential is input to the wiring WX1L and a low-level potential is input to the wiring X2L only in the first subperiod and the second subperiod, and in the case where the second data (a value of a signal of a neuron) is to be "+5", a high-level potential is input to the wiring WX1L and a low-level potential is input to the wiring X2L in the first subperiod and the third subperiod. In the case where the second data (a value of a signal of a neuron) is to be "−6", a low-level potential is input to the wiring WX1L and a high-level potential is input to the wiring X2L only in the second subperiod and the third subperiod, and in the case where the second data (a value of a signal of a neuron) is to be "−7", a low-level potential is input to the wiring WX1L and a high-level potential is input to the wiring X2L in the first subperiod, the second subperiod, and the third subperiod.

By defining the second data (a value of a signal of a neuron) input to the circuit MP as described above, "+5" can be obtained as the product of the first data (a weight coefficient) of "+1" and the second data (a value of a signal of a neuron) of "+5" in the operation example shown in FIG. 49A. In the operation example shown in FIG. 49B, "+2" can be obtained as the product of the first data (a weight coefficient) of "+1" and the second data (a value of a signal of a neuron) of "+2". In the operation example shown in FIG. 49C, "−6" can be obtained as the product of the first data (a weight coefficient) of "−2" and the second data (a value of a signal of a neuron) of "+3".

One embodiment of the present invention is not limited to the above definition. Although the first subperiod, the second subperiod, and the third subperiod are provided as periods during which the second data (a value of a signal of a neuron) can be input in the above description, four or more subperiods may be provided. For example, a period during which the second data (a value of a signal of a neuron) can be input is divided into the first subperiod to a T-th subperiod (T is an integer greater than or equal to 4), and a length of an s-th subperiod (s is an integer greater than or equal to 4 and less than or equal to T) is set to $2^{(s-1)} \times t_{ut}$. Alternatively, for example, a period during which the second data (a value of a signal of a neuron) can be input may be divided into the first subperiod to the T-th subperiod (T is an integer greater than or equal to 4), and the length of the s-th subperiod (s is an integer greater than or equal to 4 and less than or equal to T) may be set to $s \times t_{ut}$. Alternatively, the second data (a value of a signal of a neuron) may be defined as a real number; for example, the second data (a value of a signal of a neuron) when a high-level potential is input to the wiring WX1L and a low-level potential is input to the wiring X2L only in the first subperiod may be "+0.1", the second data (a value of a signal of a neuron) when a high-level potential is input to the wiring WX1L and a low-level potential is input to the wiring X2L only in the second subperiod may be "+0.2", and the second data (a value of a signal of a neuron) when a high-level potential is input to the wiring WX1L and a low-level potential is input to the wiring X2L only in the third subperiod may be "+0.4".

In addition, although the first data (a weight coefficient) set in the circuit MP is "+1" in the operation examples shown in FIG. 49A and FIG. 49B and the first data (a weight coefficient) set in the circuit MP is "+2" in the operation example shown in FIG. 49C, calculation may be performed using the first data (a weight coefficient) other than "+1" and "+2". As described in Embodiment 1 and Embodiment 2, a negative value, a multilevel value, an analog value, or the like can be set in the circuit MP as the first data (a weight coefficient); thus, the amount of charge accumulated in the capacitor of the integrator circuit included in the circuit ACTF can also be calculated in accordance with the first data (a weight coefficient) that is a negative value, a multi-level value, an analog value, or the like.

In the operation examples shown in FIG. 49A to FIG. 49C, the case is considered where only one circuit MP is electrically connected to the wiring OL and the wiring OLB to avoid complexity of description; however, a plurality of circuits MP may be electrically connected to the wiring OL and the wiring OLB as in the arithmetic circuit 150 in FIG. 11. In this case, the sum of the amounts of charges input from the wiring OL and the wiring OLB to the plurality of circuits MP can be accumulated in the capacitor of the integrator circuit included in the circuit ACTF, which enables the circuit ACTF to output the signal $z_j^{(k)}$ of a neuron corresponding to the amounts of charges flowing through the wiring OL and the wiring OLB.

In the configuration where a plurality of subperiods are provided as periods during which the second data (a value of a signal of a neuron) can be input, one or more subperiods are selected from the plurality of subperiods, and signals are input in the selected periods as in the operation examples in FIG. 49A to FIG. 49C, the length of each subperiod is preferably determined in advance at a circuit design stage, for example. Such a circuit configuration might enable easier and/or more efficient layout of the arithmetic circuit than the circuit configuration required for the operation examples in FIG. 48A to FIG. 48C.

Although the arithmetic circuit 150 in FIG. 11 is used as an example in this operation example, operation similar to that of this operation example can be performed by changing the arithmetic circuit to another one according to circumstances.

Note that this operation method example can be combined with any of the other operation method examples and the like described in this specification as appropriate.

Operation Method Example 3

Figure 50:
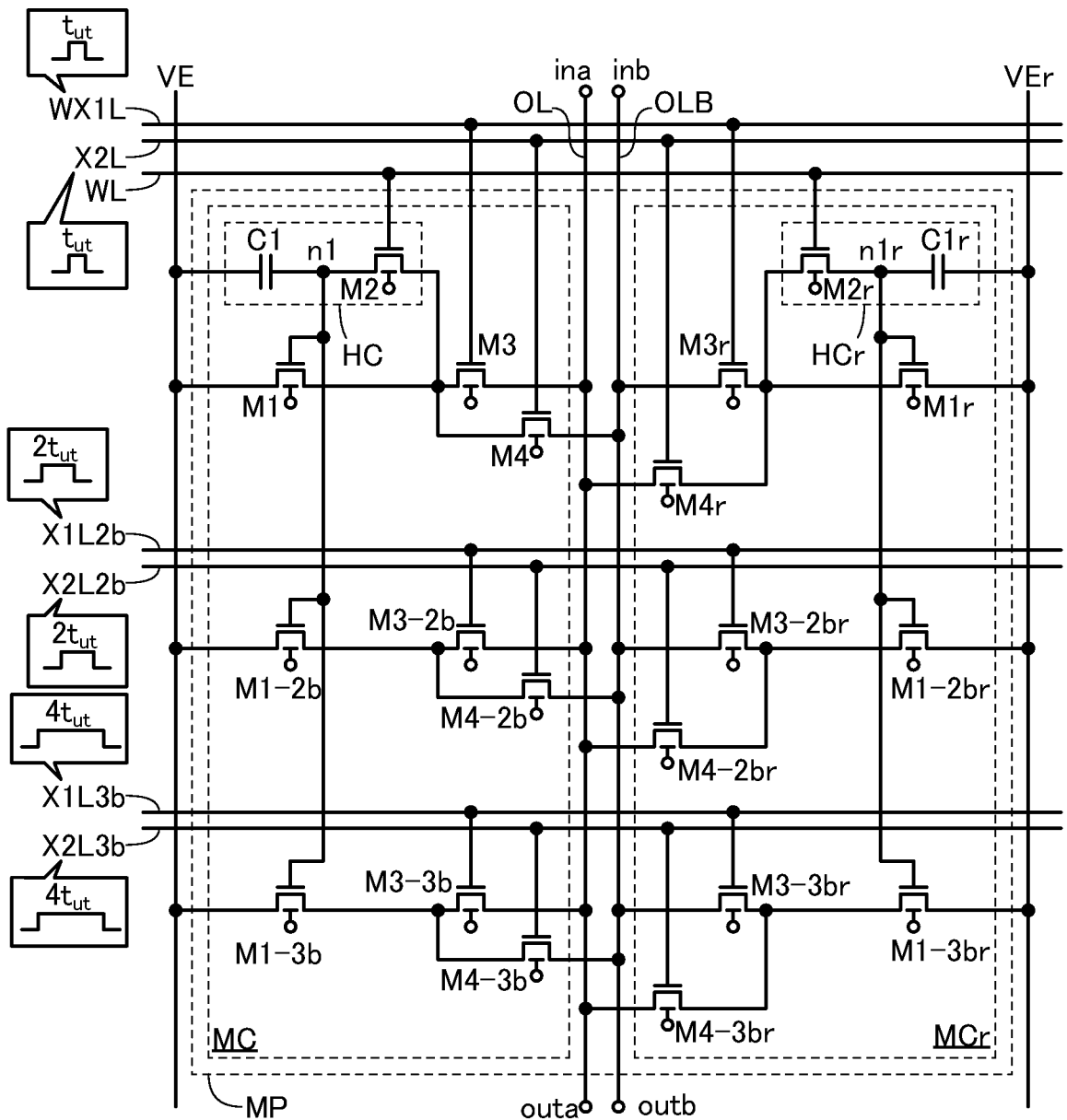
FIG. 50 is a circuit diagram showing a configuration example of a circuit included in a semiconductor device.

Described here is an operation method of the arithmetic circuit 150 in FIG. 11 for which the circuit MP in FIG. 50 is used.

As in Operation method example 1 and Operation method example 2, to avoid complexity of description, a current flowing through the wiring OL and the wiring OLB is changed by only one circuit MP electrically connected to the wiring OL and the wiring OLB. The wiring VE and the wiring VEr electrically connected to the circuit MP each supply VSS as a constant voltage to the circuit MP. The circuits ACTF[1] to ACTF[n] included in the circuit AFP are each the circuit ACTF having a configuration of an integrator circuit (or a current charge (IQ) converter circuit), for example. A configuration may be employed in which the load LEa and the load LEb in the circuit ACTF[j] in FIG. 6E are each a capacitor or the like, for example.

FIG. 50 shows a circuit configuration similar to that of the circuit MP illustrated in FIG. 26. Note that the sizes, e.g., the W lengths and the L lengths, of the transistor M1, the transistor M1r, the transistor M1-2b, the transistor M1-2br, the transistor M1-3b, and the transistor M1-3br are preferably equal to each other. This operation method example is different from the operation example of the circuit MP in FIG. 26 described in Embodiment 2.

Specifically, in inputting the second data (for example, a value of a signal of a neuron here) to the circuit MP, the input time of a high-level potential to one of the wiring WX1L and the wiring X2L is $t_{ut}$, the input time of a high-level potential to one of the wiring X1L2b and the wiring X2L2b is $2t_{ut}$, and the input time of a high-level potential to one of the wiring X1L3b and the wiring X2L3b is $4t_{ut}$ in the operation. That is, the operation is performed such that the time during which the transistor M3 and the transistor M3r are in an on state or the transistor M4 and the transistor M4r are in an on state is $t_{ut}$, the time during which the transistor M3-2b and the transistor M3-2br are in an on state or the transistor M4-2b and the transistor M4-2br are in an on state is $2t_{ut}$, and the time during which the transistor M3-3b and the transistor M3-3br are in an on state or the transistor M4-3b and the transistor M4-3br are in an on state is $4t_{ut}$. Thus, to show the difference in operation between the circuit MP in FIG. 26 and the circuit MP in FIG. 50, schematic views of pulse voltages and the input times are shown around the reference signs of the wiring WX1L, the wiring X2L, the wiring X1L2b, the wiring X2L2b, the wiring X1L3b, and the wiring X2L3b.

As described in Operation method example 1 and Operation method example 2, the amount of charge flowing from the wiring OL or the wiring OLB to the wiring VE through the transistor M1 is determined by setting the first data (for example, a weight coefficient here) in the circuit MP and setting the time during which the transistor M3 or the transistor M4 is in an on state. In addition, the amount of charge flowing from the wiring OL or the wiring OLB to the wiring VEr through the transistor M1r is determined by setting the first data (a weight coefficient) in the circuit MP and setting the time during which the transistor M3r or the transistor M4r is in an on state.

Similarly, the amount of charge flowing from the wiring OL or the wiring OLB to the wiring VE through the transistor M1-2b and the amount of charge flowing from the wiring OL or the wiring OLB to the wiring VEr through the transistor M1-2br are also determined by setting the times during which the transistor M3-2b, the transistor M3-2br, the transistor M4-2b, and the transistor M4-2br are in an on state. In addition, the amount of charge flowing from the wiring OL or the wiring OLB to the wiring VE through the transistor M1-3b and the amount of charge flowing from the wiring OL or the wiring OLB to the wiring VEr through the transistor M1-3br are also determined by setting the times during which the transistor M3-3b, the transistor M3-3br, the transistor M4-3b, and the transistor M4-3br are in an on state.

Thus, the second data (a value of a signal of a neuron) can be defined in the circuit MP as in the following table.

TABLE 7

| Signal | WX1L ($t_{ut}$) | X2L ($t_{ut}$) | X1L2b ($2t_{ut}$) | X2L2b ($2t_{ut}$) | X1L3b ($4t_{ut}$) | X2L2b ($4t_{ut}$) |
|---|---|---|---|---|---|---|
| 0 | low | low | low | low | low | low |
| +1 | high | low | low | low | low | low |
| +2 | low | low | high | low | low | low |
| +3 | high | low | high | low | low | low |
| +4 | low | low | low | low | high | low |
| +5 | high | low | low | low | high | low |
| +6 | low | low | high | low | high | low |
| +7 | high | low | high | low | high | low |
| −1 | low | high | low | low | low | low |
| −2 | low | low | low | high | low | low |
| −3 | low | high | low | high | low | low |
| −4 | low | low | low | low | low | high |
| −5 | low | high | low | low | low | high |
| −6 | low | low | low | high | low | high |
| −7 | low | high | low | high | low | high |

Here, the first data (a weight coefficient) of "+1" is set in the circuit MP in advance, for example. Specifically, the transistor M1 is set such that the current amount of $I_1$ is supplied, and the transistor M1r, the transistor M1-2br, and the transistor M1-3br are in an off state.

In the circuit MC, the sizes of the transistor M1, the transistor M1-2b, and the transistor M1-3b are equal to each other, the gates of the transistor M1, the transistor M1-2b, and the transistor M1-3b are each electrically connected to the node n1 of the holding portion HC, and the first terminals of the transistor M1, the transistor M1-2b, and the transistor M1-3b are each electrically connected to the wiring VE; thus, almost equal currents flow between the sources and the drains of the transistor M1, the transistor M1-2b, and the transistor M1-3b. The amount of the current is denoted by $I_{ut}$.

In the case where "+7" is input to the circuit MP as the second data (a value of a signal of a neuron), the transistor M3 is in an on state only for the time $t_{ut}$ and the transistor M4 is in an off state, so that the amount of charge flowing from the wiring OL to the wiring VE through the transistor M1 is $t_{ut} \times I_{ut}$. Note that $t_{ut} \times I_{ut} = Q_{ut}$ is satisfied here. Similarly, the transistor M3-2b is in an on state only for the time $2t_{ut}$ and the transistor M4-2b is in an off state, so that the amount of charge flowing from the wiring OL to the wiring VE through the transistor M1-2b is $2t_{ut} \times I_{ut} = 2Q_{ut}$. The transistor M3-3b is in an on state only for the time $4t_{ut}$ and the transistor M4-3b is in an off state, so that the amount of charge flowing from the wiring OL to the wiring VE through the transistor M1-3b is $4t_{ut} \times I_{ut} = 4Q_{ut}$. Thus, the amount of charge flowing from the wiring OL to the wiring VE through the circuit MC is $Q_{ut} + 2Q_{ut} + 4Q_{ut} = 7Q_{ut}$. Meanwhile, the amount of charge flowing from the wiring OLB to the wiring VEr through the circuit MCr is 0 because the transistor M1r, the transistor M1-2br, and the transistor M1-3br are in an off state.

In the case where "−7" is input to the circuit MP as the second data (a value of a signal of a neuron), a conduction state is established between the wiring OLB and the circuit MC and between the wiring OL and the circuit MCr, and a non-conduction state is established between the wiring OL and the circuit MCr and between the wiring OL and the circuit MC, so that the amount of charge flowing from the wiring OLB to the wiring VE through the circuit MC is $Q_{ut} + 2Q_{ut} + 4Q_{ut} = 7Q_{ut}$ and the amount of charge flowing from the wiring OL to the wiring VEr through the circuit MCr is 0.

Furthermore, the first data (a weight coefficient) of "−1" is set in the circuit MP in advance, for example. Specifically, the transistor M1r is set such that the current amount of $I_1$ is supplied and the transistor M1, the transistor M1-2b, and the transistor M1-3b are in an off state.

In the circuit MCr, the sizes of the transistor M1r, the transistor M1-2br, and the transistor M1-3br are equal to each other, the gates of the transistor M1r, the transistor M1-2br, and the transistor M1-3br are each electrically connected to the node n1r of the holding portion HCr, and the first terminals of the transistor M1r, the transistor M1-2br, and the transistor M1-3br are each electrically connected to the wiring VEr. Thus, almost equal currents flow between the sources and the drains of the transistor M1r, the transistor M1-2br, and the transistor M1-3br. Like the current flowing between the source and the drain of the transistor M1, the amount of the current is denoted by $I_{ut}$.

In the case where "+7" is input to the circuit MP as the second data (a value of a signal of a neuron), the transistor M3r is in an on state only for the time $t_{ut}$ and the transistor M4r is in an off state, so that the amount of charge flowing from the wiring OLB to the wiring VEr through the transistor M1r is $t_{ut} \times I_{ut} = Q_{ut}$. Similarly, the transistor M4-2br is in an on state only for the time $2t_{ut}$ and the transistor M3-2*br* is in an off state, so that the amount of charge flowing from the wiring OLB to the wiring VEr through the transistor M1-2*br* is $2t_{ut} \times I_{ut} = 2Q_{ut}$, and the transistor M4-3*br* is in an on state only for the time $4t_{ut}$ and the transistor M3-3*br* is in an off state, so that the amount of charge flowing from the wiring OLB to the wiring VEr through the transistor M1-3*br* is $4t_{ut} \times I_{ut} = 4Q_{ut}$. Thus, the amount of charge flowing from the wiring OLB to the wiring VEr through the circuit MCr is $Q_{ut} + 2Q_{ut} + 4Q_{ut} = 7Q_{ut}$. Meanwhile, the amount of charge flowing from the wiring OL to the wiring VE through the circuit MC is 0 because the transistor M1*r*, the transistor M1-2*br*, and the transistor M1-3*br* are in an off state.

In the case where "−7" is input to the circuit MP as the second data (a value of a signal of a neuron), a conduction state is established between the wiring OLB and the circuit MC and between the wiring OL and the circuit MCr, and a non-conduction state is established between the wiring OL and the circuit MCr and between the wiring OL and the circuit MC, so that the amount of charge flowing from the wiring OL to the wiring VEr through the circuit MCr is $Q_{ut} + 2Q_{ut} + 4Q_{ut} = 7Q_{ut}$ and the amount of charge flowing from the wiring OLB to the wiring VE through the circuit MC is 0.

Thus, by setting the first data (a weight coefficient) of "+1" in the circuit MP and selecting one or more transistors to be brought into an on state from the transistor M3, the transistor M3-2*b*, and the transistor M3-3*b* included in the circuit MP in accordance with the positive second data (a value of a signal of a neuron), the amount of charge flowing from the wiring OL to the wiring VE through the circuit MC can be any one of $Q_{ut}$, $2Q_{ut}$, $3Q_{ut}$, $4Q_{ut}$, $5Q_{ut}$, $6Q_{ut}$, and $7Q_{ut}$. Note that the amount of charge flowing from the wiring OLB to the wiring VEr through the circuit MCr is 0 at this time. In addition, by setting the first data (a weight coefficient) of "−1" in the circuit MP and selecting one or more transistors to be brought into an on state from the transistor M3*r*, the transistor M3-2*br*, and the transistor M3-3*br* included in the circuit MP in accordance with the positive second data (a value of a signal of a neuron), the amount of charge flowing from the wiring OLB to the wiring VEr through the circuit MCr can be any one of $Q_{ut}$, $2Q_{ut}$, $3Q_{ut}$, $4Q_{ut}$, $5Q_{ut}$, $6Q_{ut}$, and $7Q_{ut}$. Note that the amount of charge flowing from the wiring OL to the wiring VE through the circuit MC is 0 at this time.

In addition, by setting the first data (a weight coefficient) of "+1" in the circuit MP and selecting one or more transistors to be brought into an on state from the transistor M4, the transistor M4-2*b*, and the transistor M4-3*b* included in the circuit MP in accordance with the negative second data (a value of a signal of a neuron), the amount of charge flowing from the wiring OLB to the wiring VE through the circuit MC can be any one of $Q_{ut}$, $2Q_{ut}$, $3Q_{ut}$, $4Q_{ut}$, $5Q_{ut}$, $6Q_{ut}$, and $7Q_{ut}$. Note that the amount of charge flowing from the wiring OL to the wiring VEr through the circuit MCr is 0 at this time. In addition, by setting the first data (a weight coefficient) of "−1" in the circuit MP and selecting one or more transistors to be brought into an on state from the transistor M4*r*, the transistor M4-2*br*, and the transistor M4-3*br* included in the circuit MP in accordance with the negative second data (a value of a signal of a neuron), the amount of charge flowing from the wiring OL to the wiring VEr through the circuit MCr can be any one of $Q_{ut}$, $2Q_{ut}$, $3Q_{ut}$, $4Q_{ut}$, $5Q_{ut}$, $6Q_{ut}$, and $7Q_{ut}$. Note that the amount of charge flowing from the wiring OLB to the wiring VE through the circuit MC is 0 at this time.

Assume that the first data (a weight coefficient) set in the circuit MP is changed from "+1" to "A" that is a positive integer, for example. Specifically, the transistor M1 is set such that a current amount of $I_A$ ($=AI_1$) is supplied and the transistor M1*r*, the transistor M1-2*br*, and the transistor M1-3*br* are in an off state. In this case, the amount of current flowing between the sources and the drains of the transistor M1-2*b* and the transistor M1-3*b* is also $I_A$. Thus, by selecting one or more transistors to be brought into an on state from the transistor M3, the transistor M3-2*b*, and the transistor M3-3*b* included in the circuit MP in accordance with the second data (a value of a signal of a neuron), the amount of charge flowing from the wiring OL to the wiring VE through the circuit MC becomes any one of $AQ_{ut}$, $2AQ_{ut}$, $3QA_{ut}$, $4AQ_{ut}$, $5AQ_{ut}$, $6AQ_{ut}$, and $7AQ_{ut}$. When "A" is a negative integer, the amount of charge flowing from the wiring OLB to the wiring VEr through the circuit MCr is any one of $AQ_{ut}$, $2AQ_{ut}$, $3QA_{ut}$, $4AQ_{ut}$, $5AQ_{ut}$, $6AQ_{ut}$, and $7AQ_{ut}$.

In the case where the first data (a weight coefficient) of "0" is set in the circuit MP in advance, the transistor M1 and the transistor M1*r* are each in an off state. Thus, a current does not flow from the wiring OL or the wiring OLB to the wiring VE through the circuit MC, and a current does not flow from the wiring OL or the wiring OLB to the wiring VEr through the circuit MCr. In other words, the amount of charge flowing through the wiring OL and the wiring OLB is 0.

Here, the integrator circuit of the circuit ACTF is focused on. When a current flows from the wiring OL or the wiring OLB to the wiring VE through the circuit MC or when a current flows from the wiring OL or the wiring OLB to the wiring VEr through the circuit MCr, the switches SWO and SWOB are brought into an on state and the switch SWI, the switch SWIB, the switch SWL, the switch SWLB, the switch SWH, and the switch SWHB are brought into an off state so that a conduction state is established between the circuit AFP and the wirings OL and OLB in FIG. 8A, whereby the amount of charge flowing through the wiring OL and the wiring OLB can be accumulated in the capacitor of the integrator circuit included in the circuit ACTF. As a result, the circuit ACTF can output the signal $z_j^{(k)}$ of a neuron, which corresponds to the charge amount $Q_{OL}$ supplied through the wiring OL and the charge amount $Q_{OLB}$ supplied through the wiring OLB.

The following table shows the charge amount $Q_{OL}$ supplied through the wiring OL and the charge amount $Q_{OLB}$ supplied through the wiring OLB in the case of the above operation example where the first data (a weight coefficient) is "+1" or "−1" and the second data (a value of a signal of a neuron) is defined as described above.

TABLE 8

| Weight coefficient | n1 | n1r | Value of signal of neuron | Weight coefficient × signal | Charge amount $Q_{OL}$ supplied through wiring OL | Charge amount $Q_{OLB}$ supplied through wiring OLB |
|---|---|---|---|---|---|---|
| +1 | $V_1$ | VSS | 0 | 0 | 0 | 0 |
| +1 | $V_1$ | VSS | +1 | +1 | $Q_{ut}$ | 0 |
| +1 | $V_1$ | VSS | +2 | +2 | $2Q_{ut}$ | 0 |
| +1 | $V_1$ | VSS | +3 | +3 | $3Q_{ut}$ | 0 |
| +1 | $V_1$ | VSS | +4 | +4 | $4Q_{ut}$ | 0 |
| +1 | $V_1$ | VSS | +5 | +5 | $5Q_{ut}$ | 0 |
| +1 | $V_1$ | VSS | +6 | +6 | $6Q_{ut}$ | 0 |
| +1 | $V_1$ | VSS | +7 | +7 | $7Q_{ut}$ | 0 |
| +1 | $V_1$ | VSS | −1 | −1 | 0 | $Q_{ut}$ |
| +1 | $V_1$ | VSS | −2 | −2 | 0 | $2Q_{ut}$ |

TABLE 8-continued

| Weight coefficient | n1 | n1r | Value of signal of neuron | Weight coefficient × signal | Charge amount $Q_{OL}$ supplied through wiring OL | Charge amount $Q_{OLB}$ supplied through wiring OLB |
|---|---|---|---|---|---|---|
| +1 | $V_1$ | VSS | −3 | −3 | 0 | $3Q_{ut}$ |
| +1 | $V_1$ | VSS | −4 | −4 | 0 | $4Q_{ut}$ |
| +1 | $V_1$ | VSS | −5 | −5 | 0 | $5Q_{ut}$ |
| +1 | $V_1$ | VSS | −6 | −6 | 0 | $6Q_{ut}$ |
| +1 | $V_1$ | VSS | −7 | −7 | 0 | $7Q_{ut}$ |

TABLE 9

| Weight coefficient | n1 | n1r | Value of signal of neuron | Weight coefficient × signal | Charge amount $Q_{OL}$ supplied through wiring OL | Charge amount $Q_{OLB}$ supplied through wiring OLB |
|---|---|---|---|---|---|---|
| −1 | VSS | $V_1$ | 0 | 0 | 0 | 0 |
| −1 | VSS | $V_1$ | +1 | −1 | 0 | $Q_{ut}$ |
| −1 | VSS | $V_1$ | +2 | −2 | 0 | $2Q_{ut}$ |
| −1 | VSS | $V_1$ | +3 | −3 | 0 | $3Q_{ut}$ |
| −1 | VSS | $V_1$ | +4 | −4 | 0 | $4Q_{ut}$ |
| −1 | VSS | $V_1$ | +5 | −5 | 0 | $5Q_{ut}$ |
| −1 | VSS | $V_1$ | +6 | −6 | 0 | $6Q_{ut}$ |
| −1 | VSS | $V_1$ | +7 | −7 | 0 | $7Q_{ut}$ |
| −1 | VSS | $V_1$ | −1 | +1 | $Q_{ut}$ | 0 |
| −1 | VSS | $V_1$ | −2 | +2 | $2Q_{ut}$ | 0 |
| −1 | VSS | $V_1$ | −3 | +3 | $3Q_{ut}$ | 0 |
| −1 | VSS | $V_1$ | −4 | +4 | $4Q_{ut}$ | 0 |
| −1 | VSS | $V_1$ | −5 | +5 | $5Q_{ut}$ | 0 |
| −1 | VSS | $V_1$ | −6 | +6 | $6Q_{ut}$ | 0 |
| −1 | VSS | $V_1$ | −7 | +7 | $7Q_{ut}$ | 0 |

By setting the first data (a weight coefficient) and the second data (a value of a signal of a neuron) as described above, the charge amount $Q_{OL}$ of a current flowing from the wiring OL to the circuit MC or the circuit MCr and the charge amount $Q_{OLB}$ of a current flowing from the wiring OLB to the circuit MC or the circuit MCr are determined in accordance with the result of the product of the first data (a weight coefficient) and the second data (a value of a signal of a neuron). In the case where the result of the product of the first data (a weight coefficient) and the second data (a value of a signal of a neuron) is a positive value, a current flows from the wiring OL to the circuit MC or the circuit MCr, and in the case where the result of the product of the first data (a weight coefficient) and the second data (a value of a signal of a neuron) is a negative value, a current flows from the wiring OLB to the circuit MC or the circuit MCr. That is, the product of the first data (a weight coefficient) and the second data (a value of a signal of a neuron) can be calculated from the charge amount $Q_{OL}$ and the charge amount $Q_{OLB}$. For example, in the case where the first data (a weight coefficient) is "−1" or "+1", the second data (a value of a signal of a neuron) is any one of "−7" to "+7", and the product of the first data (a weight coefficient) and the second data (a value of a signal of a neuron) is a positive number, the product of the first data (a weight coefficient) and the second data (a value of a signal of a neuron) can be calculated from the charge amount $Q_{OL}$ by replacing $Q_{ut}$ with "+1" in the charge amount $Q_{OL}$ of a current flowing from the wiring OL to the circuit MC or the circuit MCr in the above table. Alternatively, for example, in the case where the first data (a weight coefficient) is "−1" or "+1", the second data (a value of a signal of a neuron) is any one of "−7" to "+7", and the product of the first data (a weight coefficient) and the second data (a value of a signal of a neuron) is a negative number, the product of the first data (a weight coefficient) and the second data (a value of a signal of a neuron) can be calculated from the charge amount $Q_{OLB}$ by replacing $Q_{ut}$ with "−1" in the charge amount $Q_{OLB}$ of a current flowing from the wiring OL to the circuit MC or the circuit MCr in the above table.

Although the first data (a weight coefficient) set in the circuit MP is "+1" or "−1" in the above operation example, the first data (a weight coefficient) of "0" or an analog value may be used for calculation, for example. Thus, the circuit MP can perform the product-sum operation of the first data (a weight coefficient) that is a binary value, a multilevel value, an analog value, or the like, and the second multilevel data (a value of a signal of a neuron) and/or arithmetic operation of an activation function.

One embodiment of the present invention is not limited to the above definition. Although the second data (a value of a signal of a neuron) is defined above as a positive multilevel value, a negative multilevel value, or 0, the second data (a value of a signal of a neuron) can be processed as an analog value by using not a discrete value but a continuous value as the input period (by setting the input period to $a \times t_{ut}$, where a is a positive real number).

When the time during which the transistor M3 and the transistor M3r are in an on state or the transistor M4 and the transistor M4r are in an on state is $t_{ut}$, the time during which the transistor M3-2b and the transistor M3-2br are in an on state or the transistor M4-2b and the transistor M4-2br are in an on state is $2t_{ut}$, and the time during which the transistor M3-3b and the transistor M3-3br are in an on state or the transistor M4-3b and the transistor M4-3br are in an on state is $4t_{ut}$, for example, the second data (a value of a signal of a neuron) when a high-level potential is input to the wiring WX1L, a low-level potential is input to the wiring X2L, and a low-level potential is input to the wiring X1L2b, the wiring X2L2b, the wiring X1L3b, and the wiring X2L3b may be defined as not "+1" but a real number such as "+0.1".

In addition, the configuration of the semiconductor device of one embodiment of the present invention is not limited to that of the circuit MP in FIG. 50. For example, in the circuit MP in FIG. 50, the circuit MC includes three transistors of the transistor M1, the transistor M1-2b, and the transistor M1-3b, and the circuit MCr includes three transistors of the transistor M1r, the transistor M1-2br, and the transistor M1-3br as transistors for setting current amounts; however, the circuit MC and the circuit MCr may each include two transistors or four or more transistors for setting current amounts.

The semiconductor device of one embodiment of the present invention and the operation method of the semiconductor device are not limited to the above. Although the sizes of the transistor M1, the transistor M1r, the transistor M1-2b, the transistor M1-2br, the transistor M1-3b, and the transistor M1-3br of the circuit MP in FIG. 50 are equal to each other in the above description, the ratios of the W lengths to the L lengths of the transistor M1, the transistor M1r, the transistor M1-2b, and the transistor M1-2br may each be W/L and the ratios of the W lengths to the L lengths of the transistor M1-3b and the transistor M1-3br may each be 2 W/L, for example. In this case, when the transistor M1 is set such that a current having the current amount of $I_1$ flows between its source and drain, the current amount of $2I_1$ is supplied between the sources and the drains of the transistor M1-2b and the transistor M1-3b because the ratio of the W length to the L length of the transistor M1-2b and the ratio of the W length to the L length of the transistor M1-3b are each twice as high as the ratio of the W length to the L length of the transistor M1. Similarly, when the transistor M1r is set such that a current having the current amount of $I_1$ flows between its source and drain, the current amount of $2I_1$ is supplied between the sources and the drains of the transistor M1-2br and the transistor M1-3br because the ratio of the W length to the L length of the transistor M1-2br and the ratio of the W length to the L length of the transistor M1-3br are each twice as high as the ratio of the W length to the L length of the transistor M1r.

Figure 51:
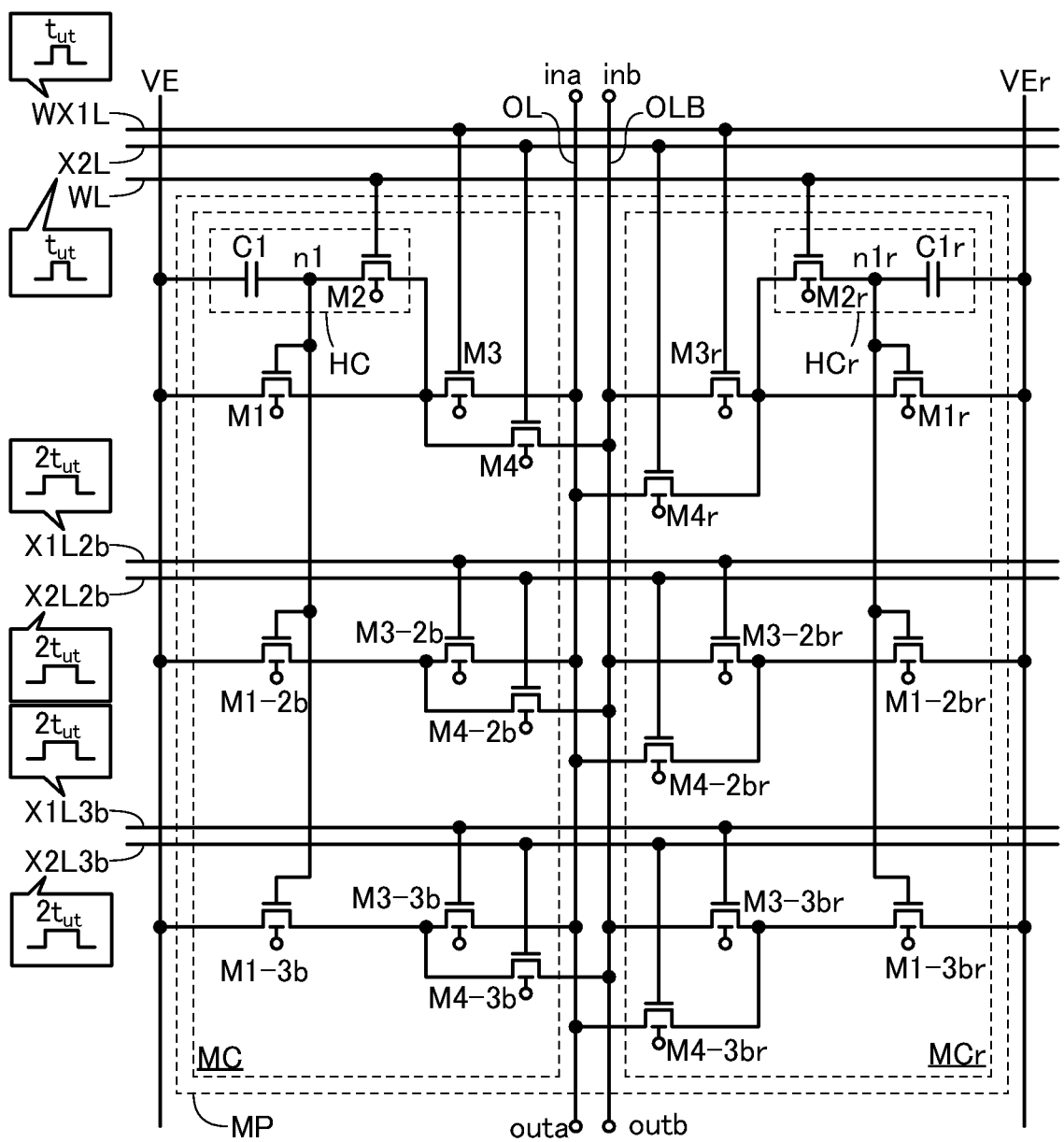
FIG. 51 is a circuit diagram showing a configuration example of a circuit included in a semiconductor device.

Here, the time during which the transistor M3 and the transistor M3r are in an on state or the transistor M4 and the transistor M4r are in an on state is $t_{ut}$, the time during which the transistor M3-2b and the transistor M3-2br are in an on state or the transistor M4-2b and the transistor M4-2br are in an on state is $2t_{ut}$, and the time during which the transistor M3-3b and the transistor M3-3br are in an on state or the transistor M4-3b and the transistor M4-3br are in an on state is $2t_{ut}$. That is, in inputting the second data (a value of a signal of a neuron) to the circuit MP, the input time of a high-level potential to one of the wiring WX1L and the wiring X2L is $t_{ut}$, the input time of a high-level potential to one of the wiring X1L2b and the wiring X2L2b is $2t_{ut}$, and the input time of a high-level potential to one of the wiring X1L3b and the wiring X2L3b is $2t_{ut}$. The circuit MP in FIG. 51 shows schematic views of pulse voltages and the input times, which are different from those in FIG. 50, around the reference signs of the wiring WX1L, the wiring X2L, the wiring X1L2b, the wiring X2L2b, the wiring X1L3b, and the wiring X2L3b.

When the transistor M1 is set such that a current having the current amount of $I_{ut}$ flows between the source and the drain, one of the transistor M3-3b and the transistor M4-3b is in an on state only for the time $2t_{ut}$ and the other of the transistor M3-3b and the transistor M4-3b is in an off state, so that the amount of charge flowing from the wiring OL or the wiring OLB to the wiring VE through the transistor M1-3b is $2t_{ut} \times 2I_{ut} = 4Q_{ut}$. Note that the conditions of the amount of charge flowing from the wiring OL to the wiring VE through the transistor M1 and the amount of charge flowing from the wiring OL to the wiring VE through the transistor M1-2b are the same as those of the above-described operation example, and thus the description is omitted.

When the transistor M1r is set such that a current having the current amount of $I_{ut}$ flows between the source and the drain, one of the transistor M3-3br and the transistor M4-3br is in an on state only for the time $2t_{ut}$ and the other of the transistor M3-3br and the transistor M4-3br is in an off state, so that the amount of charge flowing from the wiring OL or the wiring OLB to the wiring VE through the transistor M1-3br is $2t_{ut} \times 2I_{ut} = 4Q_{ut}$. Note that the conditions of the amount of charge flowing from the wiring OL or the wiring OLB to the wiring VEr through the transistor M1r and the amount of charge flowing from the wiring OL or the wiring OLB to the wiring VEr through the transistor M1-2br are the same as those of the above-described operation example, and thus the description is omitted.

As described above, the sizes of the transistor M1, the transistor M1r, the transistor M1-2b, the transistor M1-2br, the transistor M1-3b, and the transistor M1-3br and the input time of a high-level potential to each of the wiring WX1L, the wiring X2L, the wiring X1L2b, the wiring X2L2b, the wiring X1L3b, and the wiring X2L3b are appropriately changed, whereby the operation can be similar to that of the operation example of the circuit MP shown in FIG. 50.

The configuration of the semiconductor device of one embodiment of the present invention is not limited to those of the circuits MP in FIG. 50 and FIG. 51. For example, in the circuit MP in FIG. 50, the circuit MC includes three transistors of the transistor M1, the transistor M1-2b, and the transistor M1-3b, and the circuit MCr includes three transistors of the transistor M1r, the transistor M1-2br, and the transistor M1-3br as transistors for setting current amounts; however, the circuit MC and the circuit MCr may each include two transistors or four or more transistors for setting current amounts. In addition, the number of holding portions and the number of wirings may be increased and decreased in accordance with the number of transistors.

In addition, the operation method of the semiconductor device of one embodiment of the present invention is not limited to the above operation method. For example, as described in Operation method example 2, the input period of signals that are input to the wiring WX1L, the wiring X2L, the wiring X1L2b, the wiring X2L2b, the wiring X1L3b, and the wiring X2L3b may be divided into a plurality of subperiods.

In this operation method example, the case is considered where only one circuit MP is electrically connected to the wiring OL and the wiring OLB to avoid complexity of description; however, a plurality of circuits MP may be electrically connected to the wiring OL and the wiring OLB as in the arithmetic circuit 150 in FIG. 11. In this case, the sum of the amounts of charges input from the wiring OL and the wiring OLB to the plurality of circuits MP can be accumulated in the capacitor of the integrator circuit included in the circuit ACTF, which enables the circuit ACTF to output the signal $z_j^{(k)}$ of a neuron corresponding to the amounts of charges flowing through the wiring OL and the wiring OLB.

Although the arithmetic circuit 150 in FIG. 11 is used as an example in this operation example, operation similar to that of this operation example can be performed by changing the arithmetic circuit to another one according to circumstances.

Note that this operation method example can be combined with any of the other operation method examples and the like described in this specification as appropriate.

Operation Method Example 4

Figure 52:
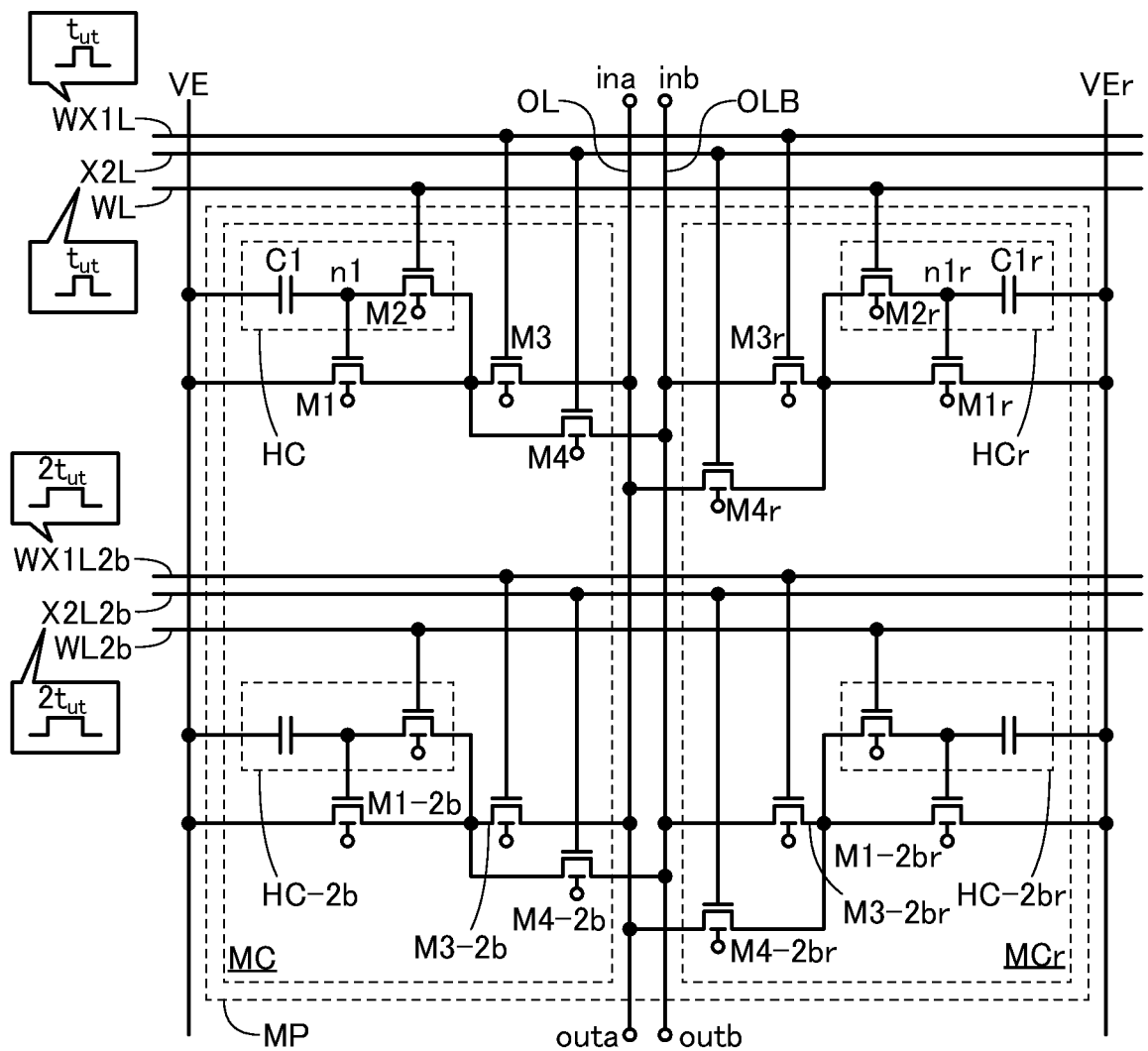
FIG. 52 is a circuit diagram showing a configuration example of a circuit included in a semiconductor device.

Described here is an operation method example of the arithmetic circuit 150 in FIG. 11 for which the circuit MP in FIG. 52 is used.

As in Operation method example 1 to Operation method example 3, to avoid complexity of description, a current flowing through the wiring OL and the wiring OLB is changed by only one circuit MP electrically connected to the wiring OL and the wiring OLB. The wiring VE and the wiring VEr electrically connected to the circuit MP each supply VSS as a constant voltage to the circuit MP. The circuit ACTF[1] to the circuit ACTF[n] included in the circuit AFP are each the circuit ACTF having a configuration of an integrator circuit (or a current charge (IQ) converter circuit), for example. A configuration may be employed in which the load LEa and the load LEb in the circuit ACTF[j] in FIG. 6E are each a capacitor or the like, for example.

FIG. 52 shows a configuration in which the transistor M1-3b, the transistor M1-3br, the transistor M3-3b, the transistor M3-3br, the transistor M4-3b, the transistor M4-3br, the holding portion HC-3b, and the holding portion HC-3br are removed from the circuit MP illustrated in FIG. 27. In addition, the wiring WX1L3b, the wiring X2L2b, and the wiring WL3b are also removed from FIG. 27. The sizes, e.g., the W lengths and the L lengths, of the transistor M1, the transistor M1r, the transistor M1-2b, and the transistor M1-2br are preferably equal to each other. Furthermore, this operation method example is different from the operation example of the circuit MP in FIG. 26 described in Embodiment 2.

Specifically, when a current flows from the circuit AFP to the circuit MP, the input time of a high-level potential to one of the wiring WX1L and the wiring X2L is $t_{ut}$ and the input time of a high-level potential to one of the wiring X1L2b and the wiring X2L2b is $2t_{ut}$ in the operation. That is, the operation is performed such that the time during which the transistor M3 and the transistor M3r are in an on state or the transistor M4 and the transistor M4r are in an on state is $t_{ut}$, the time during which the transistor M3-2b and the transistor M3-2br are in an on state or the transistor M4-2b and the transistor M4-2br are in an on state is $2t_{ut}$. Thus, to show the difference in operation between the circuit MP in FIG. 27 and the circuit MP in FIG. 52, schematic views of pulse voltages and the input times are shown around the reference signs of the wiring WX1L, the wiring X2L, the wiring X1L2b, and the wiring X2L2b.

As described in Operation method example 1 and Operation method example 2, the amount of charge flowing from the wiring OL or the wiring OLB to the wiring VE through the transistor M1 is determined by setting the first data (for example, a weight coefficient here) in the circuit MP and setting the time during which the transistor M3 or the transistor M4 is in an on state. In addition, the amount of charge flowing from the wiring OL or the wiring OLB to the wiring VEr through the transistor M1r is determined by setting the first data (for example, a weight coefficient here) in the circuit MP and setting the time during which the transistor M3r or the transistor M4r is in an on state.

Similarly, the amount of charge flowing from the wiring OL or the wiring OLB to the wiring VE through the transistor M1-2b and the amount of charge flowing from the wiring OL or the wiring OLB to the wiring VEr through the transistor M1-2br are also determined by setting the times during which the transistor M3-2b, the transistor M3-2br, the transistor M4-2b, and the transistor M4-2br are in an on state.

Note that VSS or $V_1$ is held as a digital value (a binary value) in each of the holding portion HC and the holding portion HC-2b in FIG. 52. The potential VSS is held in the holding portion HC and/or the holding portion HC-2b by establishing a conduction state between the wiring VCN in FIG. 8 and the node n1 of the holding portion HC and/or the node n1 of the holding portion HC-2b in FIG. 52. In addition, the potential $V_1$ is held in the holding portion HC and/or the holding portion HC-2b by setting a current having the current amount of $I_1$ between the source and the drain of the transistor M1 and/or the transistor M1-2b. When the current amount of $I_1$ is set in each of the transistors M1 and M1-2b, the voltages held in the holding portions HC and HC-2b might be different from each other due to variations in transistor characteristics caused in the manufacturing process of the transistors M1 and M1-2b, for example.

In a manner similar to the above, VSS or $V_1$ is held as a digital value (a binary value) in each of the holding portion HCr and the holding portion HC-2br.

Here, the first data (a weight coefficient) set in the circuit MP is defined.

In the case where "+1" is set in the circuit MP as the first data (a weight coefficient), for example, the transistor M1 is set such that the current amount of $I_1$ is supplied, and VSS is held in the holding portion HC-2b, the holding portion HCr, and the holding portion HC-2br. The first terminal of the transistor M1 is electrically connected to the wiring OL through the transistor M3 and electrically connected to the wiring OLB through the transistor M4; thus, in the case where a high-level potential is input to one of the wiring WX1L and the wiring X2L, the amount of charge flowing from the wiring OL or the wiring OLB to the wiring VE through the transistor M1 is $t_{ut} \times I_1$ ($=Q_{ut}$). Here, $t_{ut} \times I_1 = Q_{ut}$ is satisfied. Since the transistor M1r, the transistor M1-2b, and the transistor M1-2br are in an off state, the amount of current flowing between the sources and the drains of the transistor M1r, the transistor M1-2b, and the transistor M1-2br is 0.

In the case where "+2" is set in the circuit MP as the first data (a weight coefficient), the transistor M1-2b is set such that the current amount of $I_1$ is supplied, and VSS is held in the holding portion HC, the holding portion HCr, and the holding portion HC-2br. The first terminal of the transistor M1-2b is electrically connected to the wiring OL through the transistor M3-2b and electrically connected to the wiring OLB through the transistor M4-2b; thus, in the case where a high-level potential is input to one of the wiring X1L2b and the wiring X2L2b, the amount of charge flowing from the wiring OL or the wiring OLB to the wiring VE through the transistor M1-2b is $2t_{ut} \times I_1$ ($=2Q_{ut}$). Since the transistor M1, the transistor M1r, and the transistor M1-2br are in an off state, the amount of current flowing between the sources and the drains of the transistor M1, the transistor M1r, and the transistor M1-2br is 0.

In the case where "+3" is set in the circuit MP as the first data (a weight coefficient), the transistor M1 and the transistor M1-2b are set such that the current amount of $I_1$ is supplied, and VSS is held in the holding portion HCr and the holding portion HC-2br. As described above, the amount of charge flowing from the wiring OL or the wiring OLB to the wiring VE through the transistor M1 is $t_{ut} \times I_t$ in the case where a high-level potential is input to one of the wiring WX1L and the wiring X2L, and the amount of charge flowing from the wiring OL or the wiring OLB to the wiring VE through the transistor M1 is $2t_{ut} \times I_t$ in the case where a high-level potential is input to one of the wiring X1L2b and the wiring X2L2b. Thus, the amount of charge flowing from the wiring OL or the wiring OLB to the wiring VE through the circuit MC is $t_{ut} \times I_1 + 2t_{ut} \times I_1 = 3Q_{ut}$. Since the transistor M1r and the transistor M1-2br are in an off state, the amount of current flowing between the sources and the drains of the transistor M1r and the transistor M1-2br is 0.

In the case where the first data (a weight coefficient) is "−1", the transistor M1r is set such that the current amount of $I_1$ is supplied, and VSS is held in the holding portion HC, the holding portion HC-2b, and the holding portion HC-2br. The first terminal of the transistor M1r is electrically connected to the wiring OLB through the transistor M3r and electrically connected to the wiring OL through the transistor M4r; thus, in the case where a high-level potential is input to one of the wiring WX1L and the wiring X2L, the amount of charge flowing from the wiring OL or the wiring OLB to the wiring VEr through the transistor M1r is $t_{ut} \times I_1$ ($=Q_{ut}$). Here, $t_{ut} \times I_1 = Q_{ut}$ is satisfied. Since the transistor M1r, the transistor M1-2b, and the transistor M1-2br are in an off state, the amount of current flowing between the sources and the drains of the transistor M1, the transistor M1-2b, and the transistor M1-2br is 0.

In the case where "−2" is set in the circuit MP as the first data (a weight coefficient), the transistor M1-2br is set such that the current amount of $I_1$ is supplied, and VSS is held in the holding portion HC, the holding portion HCr, and the holding portion HC-2b. The first terminal of the transistor M1-2br is electrically connected to the wiring OLB through the transistor M3-2br and electrically connected to the wiring OL through the transistor M4-2b; thus, in the case where a high-level potential is input to one of the wiring X1L2b and the wiring X2L2b, the amount of charge flowing from the wiring OL or the wiring OLB to the wiring VEr through the transistor M1-2br is $2t_{ut} \times I_1$ ($=2Q_{ut}$). Since the transistor M1, the transistor M1r, and the transistor M1-2b are brought into an off state, the amount of current flowing between the sources and the drains of the transistor M1, the transistor M1r, and the transistor M1-2b is 0.

In the case where "−3" is set in the circuit MP as the first data (a weight coefficient), the transistor M1r and the transistor M1-2br are each set such that the current amount of $I_1$ is supplied, and VSS is held in the holding portion HC and the holding portion HC-2b. As described above, the amount of charge flowing from the wiring OL or the wiring OLB to the wiring VEr through the transistor M1r is $t_{ut} \times I_1$ in the case where a high-level potential is input to one of the wiring WX1L and the wiring X2L, and the amount of charge flowing from the wiring OL or the wiring OLB to the wiring VEr through the transistor M1r is $2t_{ut} \times I_1$ in the case where a high-level potential is input to one of the wiring X1L2b and the wiring X2L2b. Thus, the amount of charge flowing from the wiring OL or the wiring OLB to the wiring VEr through the circuit MCr is $t_{ut} \times I_1 + 2t_{ut} \times I_1 = 3Q_{ut}$. Since the transistor M1 and the transistor M1-2b are brought into an off state, the amount of current flowing between the sources and the drains of the transistor M1 and the transistor M1-2b is 0.

In the case where the first data (a weight coefficient) is "0", VSS is held in the holding portion HC, the holding portion HCr, the holding portion HC-2b, and the holding portion HC-2br. Thus, the amount of current flowing between the sources and the drains of the transistor M1, the transistor M1r, the transistor M1-2b, and the transistor M1-2br is 0.

That is, a digital value (a binary value) is held in the holding portion HC, the holding portion HCr, the holding portion HC-2b, and the holding portion HC-2br, the input period of a high-level potential to one of the wiring WX1L and the wiring X2L is set to $t_{ut}$, and the input period of a high-level potential to one of the wiring WX1L2b and the wiring X2L2b is set to $2t_{ut}$, whereby the first data (a weight coefficient) having multi levels (in this operation example, seven levels "−3", "−2", "−1", "0", "+1", "+2", and "+3") can be expressed.

Note that in this operation example, the second data (for example, a signal of a neuron here) input to the circuit MP is defined as follows, for example: a high-level potential is input to the wiring WX1L and the wiring X1L2b and a low-level potential is input to the wiring X2L and the wiring X2L2b when the second data is "+1"; a low-level potential is input to the wiring WX1L and the wiring X1L2b and a high-level potential is input to the wiring X2L and the wiring X2L2b when the second data is "−1"; and a low level potential is input to each of the wiring WX1L, the wiring X1L2b, the wiring X2L, and the wiring X2L2b when the second data is "0".

Here, the integrator circuit of the circuit ACTF is focused on. When a current flows from the wiring OL or the wiring OLB to the wiring VE through the circuit MC or when a current flows from the wiring OL or the wiring OLB to the wiring VEr through the circuit MCr, the switch SWO and the switch SWOB are brought into an on state and the switch SWI, the switch SWIB, the switch SWL, the switch SWLB, the switch SWH, and the switch SWHB are brought into an off state so that a conduction state is established between the circuit AFP and each of the wiring OL and the wiring OLB in FIG. 8A, whereby the amount of charge flowing through the wiring OL and the wiring OLB can be accumulated in the capacitor of the integrator circuit included in the circuit ACTF. As a result, the circuit ACTF can output the signal $z_j^{(k)}$ of a neuron, which corresponds to the charge amount $Q_{OL}$ supplied through the wiring OL and the charge amount $Q_{OLB}$ supplied through the wiring OLB.

The following table shows the charge amount $Q_{OL}$ supplied through the wiring OL and the charge amount $Q_{OLB}$ supplied through the wiring OLB in the case of the above operation example where the first data (a weight coefficient) is set to any one of "+3", "+2", "+1", "0", "−1", "−2", and "−3" and the second data (a value of a signal of a neuron) is defined as described above.

TABLE 10

| | | Value of signal of neuron | | |
|---|---|---|---|---|
| | | −1 (WX1L: low, X2L: high) | 0 (WX1L: low, X2L: low) | +1 (WX1L: high, X2L: low) |
| Weight coefficient | −3 | $Q_{OL} = 3Q_{ut}$, $Q_{OLB} = 0$ | $Q_{OL} = 0$, $Q_{OLB} = 0$ | $Q_{OL} = 0$, $Q_{OLB} = 3Q_{ut}$ |
| | −2 | $Q_{OL} = 2Q_{ut}$, $Q_{OLB} = 0$ | $Q_{OL} = 0$, $Q_{OLB} = 0$ | $Q_{OL} = 0$, $Q_{OLB} = 2Q_{ut}$ |
| | −1 | $Q_{OL} = Q_{ut}$, $Q_{OLB} = 0$ | $Q_{OL} = 0$, $Q_{OLB} = 0$ | $Q_{OL} = 0$, $Q_{OLB} = Q_{ut}$ |
| | 0 | $Q_{OL} = 0$, $Q_{OLB} = 0$ | $Q_{OL} = 0$, $Q_{OLB} = 0$ | $Q_{OL} = 0$, $Q_{OLB} = 0$ |
| | +1 | $Q_{OL} = 0$, $Q_{OLB} = Q_{ut}$ | $Q_{OL} = 0$, $Q_{OLB} = 0$ | $Q_{OL} = Q_{ut}$, $Q_{OLB} = 0$ |
| | +2 | $Q_{OL} = 0$, $Q_{OLB} = 2Q_{ut}$ | $Q_{OL} = 0$, $Q_{OLB} = 0$ | $Q_{OL} = 2Q_{ut}$, $Q_{OLB} = 0$ |
| | +3 | $Q_{OL} = 0$, $Q_{OLB} = 3Q_{ut}$ | $Q_{OL} = 0$, $Q_{OLB} = 0$ | $Q_{OL} = 3Q_{ut}$, $Q_{OLB} = 0$ |

By setting the first data (a weight coefficient) and the second data (a value of a signal of a neuron) as described above, the charge amount $Q_{OL}$ of a current flowing from the wiring OL to the circuit MC or the circuit MCr and the charge amount $Q_{OLB}$ of a current flowing from the wiring OLB to the circuit MC or the circuit MCr are determined in accordance with the result of the product of the first data (a weight coefficient) and the second data (a value of a signal of a neuron). In the case where the result of the product of the first data (a weight coefficient) and the second data (a value of a signal of a neuron) is a positive value, a current flows from the wiring OL to the circuit MC or the circuit MCr, and in the case where the result of the product of the first data (a weight coefficient) and the second data (a value of a signal of a neuron) is a negative value, a current flows from the wiring OLB to the circuit MC or the circuit MCr. That is, the product of the first data (a weight coefficient) and the second data (a value of a signal of a neuron) can be calculated from the charge amount $Q_{OL}$ and the charge amount $Q_{OLB}$. For example, in the case where the first data (a weight coefficient) is "−3" to "+3", the second data (a value of a signal of a neuron) is any one of "−1", "0", and "+1", and the product of the first data (a weight coefficient) and the second data (a value of a signal of a neuron) is a positive number, the product of the first data (a weight coefficient) and the second data (a value of a signal of a neuron) can be calculated from the charge amount $Q_{OL}$ by replacing $Q_{ut}$ with "+1" in the charge amount $Q_{OL}$ of a current flowing from the wiring OL to the circuit MC or the circuit MCr in the above table. Alternatively, for example, in the case where the first data (a weight coefficient) is "−1" or "+1", the second data (a value of a signal of a neuron) is any one of "−7" to "+7", and the product of the first data (a weight coefficient) and the second data (a value of a signal of a neuron) is a negative number, the product of the first data (a weight coefficient) and the second data (a value of a signal of a neuron) can be calculated from the charge amount $Q_{OLB}$ by replacing $Q_{ut}$ with "−1" in the charge amount $Q_{OLB}$ of a current flowing from the wiring OL to the circuit MC or the circuit MCr in the above table.

Although the first data (a weight coefficient) set in the circuit MP is "+3", "+2", "+1", "0", "−1", "−2", or "−3" in the above operation example, the first data (a weight coefficient) may be used as an analog value or the like by adjusting the input time of a high-level potential to the wiring WX1L, the wiring X2L, the wiring X1L2b, and the wiring X2L2b. Thus, the circuit MP can perform the product-sum operation of the first data (a weight coefficient) that is an analog value or the like and the multilevel second data (a value of a signal of a neuron) and/or arithmetic operation of an activation function.

The configuration of the semiconductor device of one embodiment of the present invention is not limited to that of the circuit MP in FIG. 52. For example, in the circuit MP in FIG. 52, the circuit MC includes two transistors of the transistor M1 and the transistor M1-2b and the circuit MCr includes two transistors of the transistor M1r and the transistor M1-2br as transistors for setting current amounts; however, the circuit MC and the circuit MCr may each include three or more transistors for setting current amounts. In addition, the number of holding portions and the number of wirings may be increased and decreased in accordance with the number of transistors.

In addition, the operation method of the semiconductor device of one embodiment of the present invention is not limited to the above. For example, as described in Operation method example 2, the input period of signals that are input to the wiring WX1L, the wiring X2L, the wiring X1L2b, and the wiring X2L2b may be divided into a plurality of sub-periods.

In this operation method example, the case is considered where only one circuit MP is electrically connected to the wiring OL and the wiring OLB to avoid complexity of description; however, a plurality of circuits MP may be electrically connected to the wiring OL and the wiring OLB as in the arithmetic circuit 150 in FIG. 11. In this case, the sum of the amounts of charges input from the wiring OL and the wiring OLB to the plurality of circuits MP can be accumulated in the capacitor of the integrator circuit included in the circuit ACTF, which enables the circuit ACTF to output the signal $z_j^{(k)}$ of a neuron corresponding to the amounts of charges flowing through the wiring OL and the wiring OLB.

Although the arithmetic circuit 150 in FIG. 11 is used as an example in this operation example, operation similar to that of this operation example can be performed by changing the arithmetic circuit to another one according to circumstances.

Note that this operation method example can be combined with any of the other operation method examples and the like described in this specification as appropriate.

Operation Method Example 5

Figure 53:
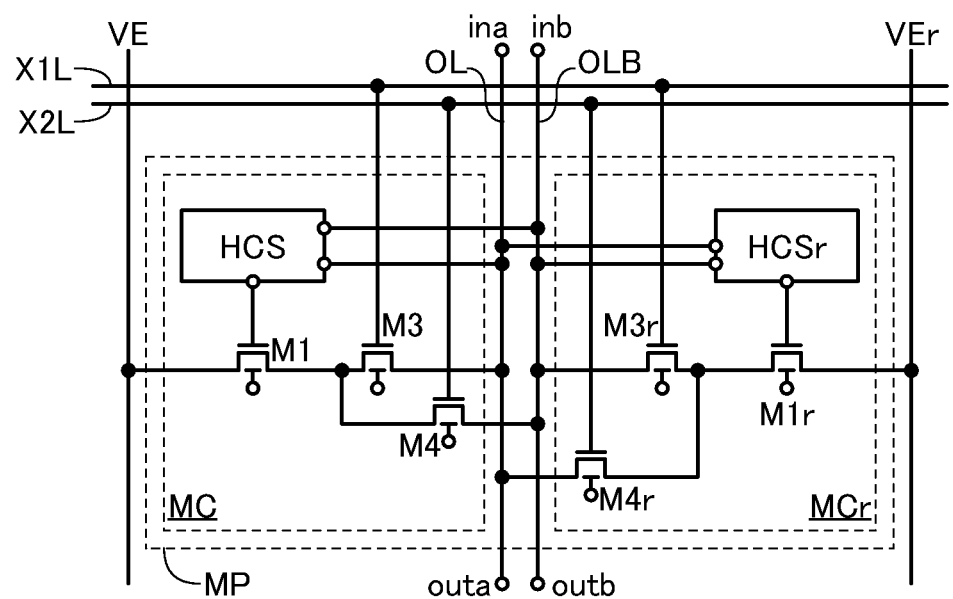
FIG. 53 is a circuit diagram showing a configuration example of a circuit included in a semiconductor device.

Described here is an operation method example of the arithmetic circuit 150 in FIG. 11 for which the circuit MP in FIG. 53 is used.

As in Operation method example 1 to Operation method example 4, to avoid complexity of description, a current flowing through the wiring OL and the wiring OLB is changed by only one circuit MP electrically connected to the wiring OL and the wiring OLB. The wiring VE and the wiring VEr electrically connected to the circuit MP each supply VSS as a constant voltage to the circuit MP. The circuit ACTF[1] to the circuit ACTF[n] included in the circuit AFP are each the circuit ACTF having a configuration of an integrator circuit (or a current charge (IQ) converter circuit), for example. A configuration may be employed in which the load LEa and the load LEb in the circuit ACTF[j] in FIG. 6E are each a capacitor or the like, for example.

FIG. 53 shows a configuration in which the transistor M1-2b, the transistor M1-2br, the transistor M1-3b, the transistor M1-3br, the transistor M3-2b, the transistor M3-2br, the transistor M3-3b, the transistor M3-3br, the transistor M4-2b, the transistor M4-2br, the transistor M4-3b, the transistor M4-3br, the holding portion HC-2b, the holding portion HC-2br, the holding portion HC-3b, and the holding portion HC-3br are removed from the circuit MP illustrated in FIG. 29. In addition, the wiring X1L2b, the wiring X2L2b, the wiring X1L3b, and the wiring X2L3b are also removed from FIG. 29. This operation method example is different from the operation example of the circuit MP in FIG. 29 described in Embodiment 2.

Specifically, in inputting the second data (for example, a value of a signal of a neuron here) to the circuit MP, the input time of a high-level potential to one of the wiring WX1L and the wiring X2L is set in accordance with the second data (a value of a signal of a neuron). That is, the time during which the transistor M3 and the transistor M3r are in an on state or the transistor M4 and the transistor M4r are in an on state is set.

As described in Operation method example 1, the amount of charge flowing from the wiring OL or the wiring OLB to the wiring VE through the transistor M1 is determined by setting the first data (for example, a weight coefficient here) in the circuit MP and setting the time during which the transistor M3 or the transistor M4 is in an on state. In addition, the amount of charge flowing from the wiring OL or the wiring OLB to the wiring VEr through the transistor M1r is determined by setting the first data (a weight coefficient) in the circuit MP and setting the time during which the transistor M3r or the transistor M4r is in an on state.

For example, in the case where a high-level potential is applied to the wiring X1L for the input time $t_{ut}$ and a low-level potential is applied to the wiring X2L when the second data (a value of a signal of a neuron) is "+1", the second data (a value of a signal of a neuron) of the other cases can be defined as in the following table. Note that the following table only shows integers from "−3" to "+3".

TABLE 11

| Signal | X1L | X2L |
| --- | --- | --- |
| −3 | low | high ($3t_{ut}$) |
| −2 | low | high ($2t_{ut}$) |
| −1 | low | high ($t_{ut}$) |
| 0 | low | low |
| +1 | high ($t_{ut}$) | low |
| +2 | high ($2t_{ut}$) | low |
| +3 | high ($3t_{ut}$) | low |

As described in Configuration example 5 in Embodiment 2, the circuit HCS and the circuit HCSr can each have a configuration including an SRAM or a configuration including a NOSRAM. Here, a potential having a binary value (a digital value) is held in the circuit HCS and the circuit HCSr. Thus, for example, a high-level potential (for example, VDDL here) is held in the circuit HCS and a low-level potential (for example, VSS here) is held in the circuit HCSr when the first data (a weight coefficient) set in the circuit MP is "+1"; a low-level potential is held in the circuit HCS and a high-level potential is held in the circuit HCSr when the first data (a weight coefficient) set in the circuit MP is "−1"; and a low-level potential is held in the circuit HCS and a low-level potential is held in the circuit HCSr when the first data (a weight coefficient) set in the circuit MP is "0".

Note that the amount of current flowing through the transistor M1 is $I_1$ in the case where the voltage VDDL is held in the circuit HCS. The amount of current flowing through the transistor M1 is 0 in the case where the voltage VSS is held in the circuit HCS. Similarly, the amount of current flowing through the transistor M1r is $I_1$ in the case where the voltage VDDL is held in the circuit HCSr, and the amount of current flowing through the transistor M1r is 0 in the case where the voltage VSS is held in the circuit HCSr.

Next, a specific operation example of the circuit MP in FIG. 53 is described.

The first data (a weight coefficient) of "+1" is set in the circuit MP in advance.

In the case where "+3" is input to the circuit MP as the second data (a value of a signal of a neuron), the transistor M3 is in an on state only for the time $3t_{ut}$ and the transistor M4 is in an off state, so that the amount of charge flowing from the wiring OL to the wiring VE through the transistor M1 is $3t_{ut} \times I_{ut}$. Note that $t_{ut} \times I_{ut} = Q_{ut}$ is satisfied here. Meanwhile, the amount of charge flowing from the wiring OLB to the wiring VEr through the circuit MCr is 0 because the transistor M1r is in an off state.

In the case where "−3" is input to the circuit MP as the second data (a value of a signal of a neuron), a conduction state is established between the wiring OLB and the circuit MC and between the wiring OL and the circuit MCr, and a non-conduction state is established between the wiring OL and the circuit MCr and between the wiring OL and the circuit MC, so that the amount of charge flowing from the wiring OLB to the wiring VEr through the circuit MC is $3t_{ut} \times I_{ut} = 3Q_{ut}$ and the amount of charge flowing from the wiring OL to the wiring VEr through the circuit MCr is 0.

In addition, the case is considered where the first data (a weight coefficient) of "−1" is set in the circuit MP in advance.

In the case where "+3" is input to the circuit MP as the second data (a value of a signal of a neuron), the transistor M3 is in an on state only for the time $3t_{ut}$ and the transistor M4 is in an off state, so that the amount of charge flowing from the wiring OLB to the wiring VEr through the transistor M1r is $3t_{ut} \times I_{ut} = 3Q_{ut}$. Meanwhile, the amount of charge flowing from the wiring OL to the wiring VE through the circuit MCr is 0 because the transistor M1 is in an off state.

In the case where "−3" is input to the circuit MP as the second data (a value of a signal of a neuron), a conduction state is established between the wiring OLB and the circuit MC and between the wiring OL and the circuit MCr, and a non-conduction state is established between the wiring OL and the circuit MCr and between the wiring OL and the circuit MC, so that the amount of charge flowing from the wiring OL to the wiring VEr through the circuit MCr is $3t_{ut} \times I_{ut} = 3Q_{ut}$ and the amount of charge flowing from the wiring OLB to the wiring VE through the circuit MC is 0.

Here, the integrator circuit of the circuit ACTF is focused on. When a current flows from the wiring OL or the wiring OLB to the wiring VE through the circuit MC or when a current flows from the wiring OL or the wiring OLB to the wiring VEr through the circuit MCr, the switch SWO and the switch SWOB are brought into an on state and the switch SWI, the switch SWIB, the switch SWL, the switch SWLB, the switch SWH, and the switch SWHB are brought into an off state so that a conduction state is established between the circuit AFP and each of the wiring OL and the wiring OLB in FIG. 8A, whereby the amount of charge flowing through the wiring OL and the wiring OLB can be accumulated in the capacitor of the integrator circuit included in the circuit ACTF. As a result, the circuit ACTF can output the signal $z_j^{(k)}$ of a neuron, which corresponds to the charge amount $Q_{OL}$ supplied through the wiring OL and the charge amount $Q_{OLB}$ supplied through the wiring OLB.

The following table shows the charge amount $Q_{OL}$ supplied through the wiring OL and the charge amount $Q_{OLB}$ supplied through the wiring OLB in the case of the above operation example where the first data (a weight coefficient) is "+1" or "−1" and the second data (a value of a signal of a neuron) is defined as described above.

TABLE 12

| | | Value of signal of neuron | | | | | | |
|---|---|---|---|---|---|---|---|---|
| | | −3 (X1L: low, X2L: high, $3t_{ut}$) | −2 (X1L: low, X2L: high, $2t_{ut}$) | −1 (X1L: low, X2L: high, $t_{ut}$) | 0 (X1L: low, X2L: low) | +1 (X1L: high, X2L: low, $t_{ut}$) | +2 (X1L: high, X2L: low, $2t_{ut}$) | +3 (X1L: high, X2L: low, $3t_{ut}$) |
| Weight coefficient | −1 | $Q_{OL} = 3Q_1$, $Q_{OLB} = 0$ | $Q_{OL} = 2Q_1$, $Q_{OLB} = 0$ | $Q_{OL} = Q_1$, $Q_{OLB} = 0$ | $Q_{OL} = 0$, $Q_{OLB} = 0$ | $Q_{OL} = 0$, $Q_{OLB} = Q_1$ | $Q_{OL} = 0$, $Q_{OLB} = 2Q_1$ | $Q_{OL} = 0$, $Q_{OLB} = 3Q_1$ |
| | 0 | $Q_{OL} = 0$, $Q_{OLB} = 0$ | $Q_{OL} = 0$, $Q_{OLB} = 0$ | $Q_{OL} = 0$, $Q_{OLB} = 0$ | $Q_{OL} = 0$, $Q_{OLB} = 0$ | $Q_{OL} = 0$, $Q_{OLB} = 0$ | $Q_{OL} = 0$, $Q_{OLB} = 0$ | $Q_{OL} = 0$, $Q_{OLB} = 0$ |
| | +1 | $Q_{OL} = 0$, $Q_{OLB} = 3Q_1$ | $Q_{OL} = 0$, $Q_{OLB} = 2Q_1$ | $Q_{OL} = 0$, $Q_{OLB} = Q_1$ | $Q_{OL} = 0$, $Q_{OLB} = 0$ | $Q_{OL} = Q_1$, $Q_{OLB} = 0$ | $Q_{OL} = 2Q_1$, $Q_{OLB} = 0$ | $Q_{OL} = 3Q_1$, $Q_{OLB} = 0$ |

When the second data (a value of a signal of a neuron) is an integer or a real number other than "−3", "−2", "−1", "0", "+1", "+2", and "+3", the input time of a high-level potential to one of the wiring X1L and the wiring X2L is set in accordance with the integer or the real number. For example, by setting the input time to $a \times t_{ut}$, where a is a positive real number, the second data (a value of a signal of a neuron) can be processed as an analog value.

Accordingly, the multilevel second data (a value of a signal of a neuron) can be supplied to the circuit MP, as in Operation method example 1 to Operation method example 3.

Figure 54A:
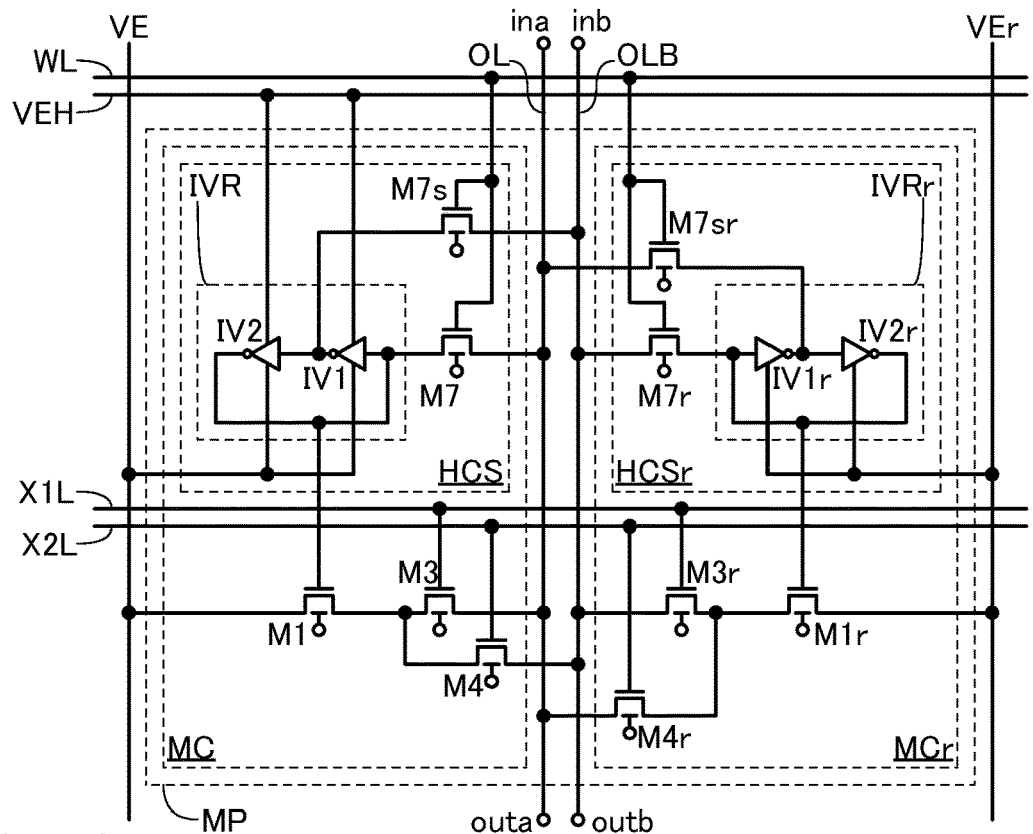
FIG. 54A and FIG. 54B are circuit diagrams each showing a configuration example of a circuit included in a semiconductor device.

Note that as described above, the circuit HCS and the circuit HCSr included in the circuit MP in FIG. 53 can each have a configuration including an SRAM. FIG. 54A shows a specific example showing the details of the circuit MP in FIG. 53, in which the circuit HCS and the circuit HCSr each have a configuration including an SRAM. For the reference signs shown in FIG. 54A, the method for holding the first data (a weight coefficient), and the like, the description of the circuit MP in FIG. 30 is referred to.

Figure 54B:
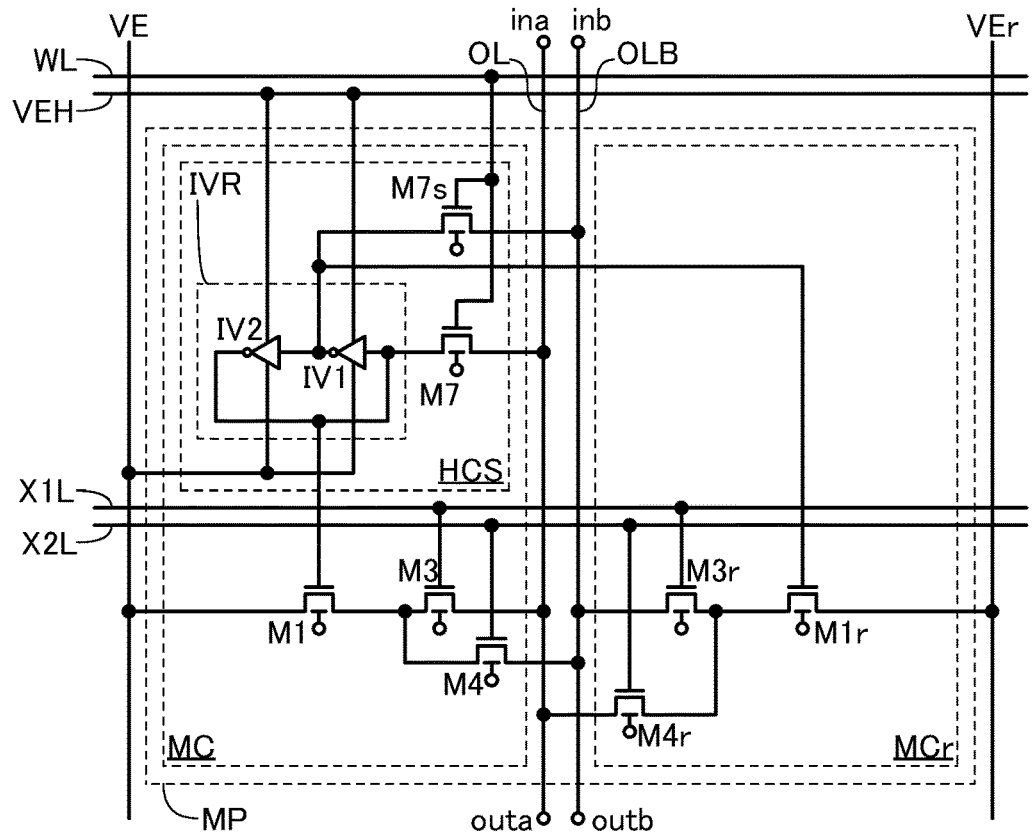

In the case where one of a low-level potential and a high-level potential is held in the circuit HCS and the other of the low-level potential and the high-level potential is held in the circuit HCSr in the circuit MP in FIG. 54A, that is, in the case where the circuit HCS and the circuit HCSr do not need to hold the same potential, the configuration of the circuit MP in FIG. 54A can be changed into that of the circuit MP in FIG. 54B. The circuit MP in FIG. 54B has a configuration in which the circuit MC includes the circuit HCS and the inverter loop circuit IVR included in the circuit HCS supplies, to the transistor M1r, an inverted signal of a signal supplied to the gate of the transistor M1. In this case, for example, the first data (a weight coefficient) set in the circuit MP can be "+1" when a high-level potential is supplied to the gate of the transistor M1 (when a low-level potential is supplied to the gate of the transistor M1r), and the first data (a weight coefficient) set in the circuit MP can be "−1" when a low-level potential is supplied to the gate of the transistor M1 (when a high-level potential is supplied to the gate of the transistor M1r).

Figure 55A:
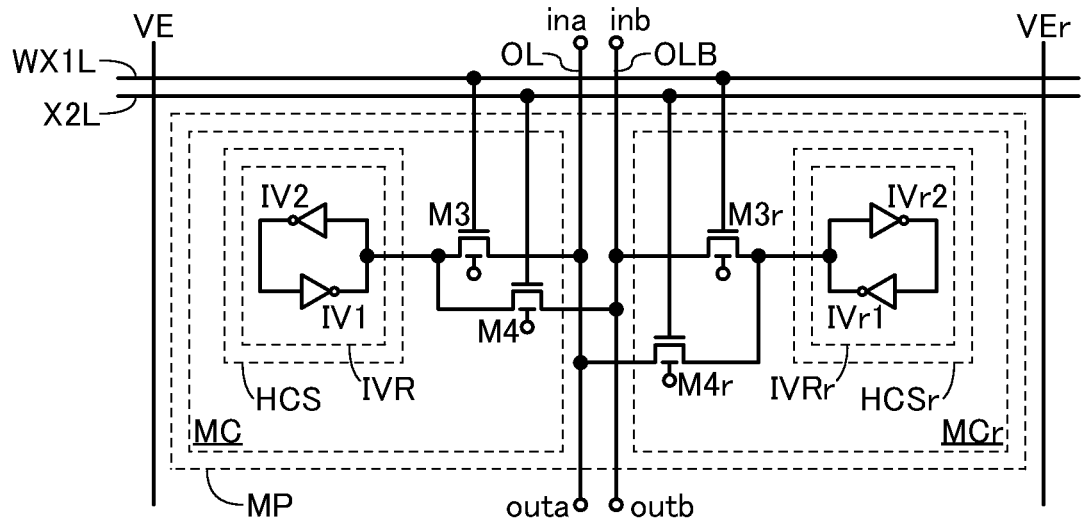
FIG. 55A, FIG. 55B, and FIG. 55C are circuit diagrams each showing a configuration example of a circuit included in a semiconductor device.

In addition, FIG. 55A shows an example of a configuration that includes the inverter loop circuit IVR in the circuit HCS and the circuit HCSr and is different from that of the circuit MP in FIG. 54A. In the circuit MP illustrated in FIG. 55A, the circuit MC includes the transistors M3 and M4 and the circuit HCS including the inverter loop circuit IVR, and the circuit MCr includes the transistor M3r, the transistor M4r, and the circuit HCSr including the inverter loop circuit IVRr. The inverter loop circuit IVR includes the inverter circuit IV1 and the inverter circuit IV2, and the inverter loop circuit IVRr includes an inverter circuit IV1r and an inverter circuit IV2r.

The output terminal of the inverter circuit IV1 is electrically connected to the input terminal of the inverter circuit IV2, the first terminal of the transistor M3, and the first terminal of the transistor M4, and the output terminal of the inverter circuit IV2 is electrically connected to the input terminal of the inverter circuit IV1. The second terminal of the transistor M3 is electrically connected to the wiring OL, and the gate of the transistor M3 is electrically connected to the wiring WX1L. The second terminal of the transistor M4 is electrically connected to the wiring OLB, and the gate of the transistor M4 is electrically connected to the wiring X2L. An output terminal of the inverter circuit IV1r is electrically connected to an input terminal of the inverter circuit IV2r, the first terminal of the transistor M3r, and the first terminal of the transistor M4r, and an output terminal of the inverter circuit IV2r is electrically connected to an input terminal of the inverter circuit IV1r. The second terminal of the transistor M3r is electrically connected to the wiring OLB, and the gate of the transistor M3r is electrically connected to the wiring WX1L. The second terminal of the transistor M4r is electrically connected to the wiring OL, and the gate of the transistor M4r is electrically connected to the wiring X2L.

The circuit HCS has a function of holding one of a high-level potential and a low-level potential in the output terminal of the inverter circuit IV1 of the inverter loop circuit IVR, and the circuit HCSr has a function of holding one of a high-level potential and a low-level potential in the output terminal of the inverter circuit IV1 of the inverter loop circuit IVRr. Thus, as in FIG. 53 and FIG. 54A, for example, a high-level potential (for example, VDDL here) is held in the output terminal of the inverter circuit IV1 and a low-level potential (for example, VSS here) is held in the output terminal of the inverter circuit IV1r when the first data (a weight coefficient) set in the circuit MP is "+1"; a low-level potential is held in the output terminal of the inverter circuit IV1 and a high-level potential is held in the output terminal of the inverter circuit IV1r when the first data (a weight coefficient) set in the circuit MP is "−1"; and a low-level potential is held in the output terminal of the inverter circuit IV1 and a low-level potential is held in the output terminal of the inverter circuit IV1r when the first data (a weight coefficient) set in the circuit MP is "0".

For the input of the second data (a value of a signal of a neuron) to the circuit MP in FIG. 55A, the input time of a high-level potential to one of the wiring WX1L and the wiring X2L is set as in FIG. 53 and FIG. 54A.

The circuit MP in FIG. 55A has a configuration in which a current is made to flow from the wiring OL or the wiring OLB to the circuit MC using a transistor included in the inverter loop circuit IVR of the circuit HCS and a current is made to flow from the wiring OL or the wiring OLB to the circuit MCr using a transistor included in the inverter loop circuit IVRr of the circuit HCSr, which is different from the circuits MP in FIG. 53, FIG. 54A, and FIG. 54B.

Figure 55B:
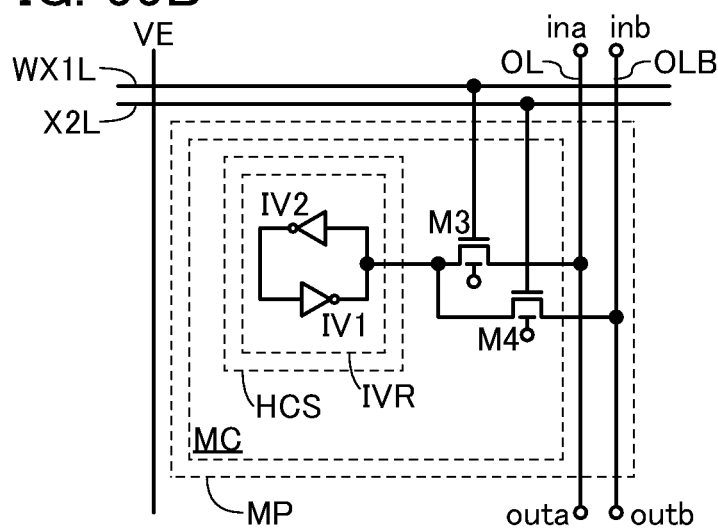

The configuration of the circuit MP in FIG. 55A can be changed into that of the circuit MP illustrated in FIG. 55B. The circuit MP in FIG. 55B has a configuration in which the circuit MCr included in the circuit MP in FIG. 55A is removed. That is, a configuration is employed in which a current is made to flow from the wiring OL or the wiring OLB using the transistor included in the inverter loop circuit IVR of the circuit HCS. In this case, for example, the first data (a weight coefficient) set in the circuit MP can be "+1" when a high-level potential is supplied to the output terminal of the inverter circuit IV1, and the first data (a weight coefficient) set in the circuit MP can be "0" when a low-level potential is supplied to the output terminal of the inverter circuit IV1.

Figure 55C:
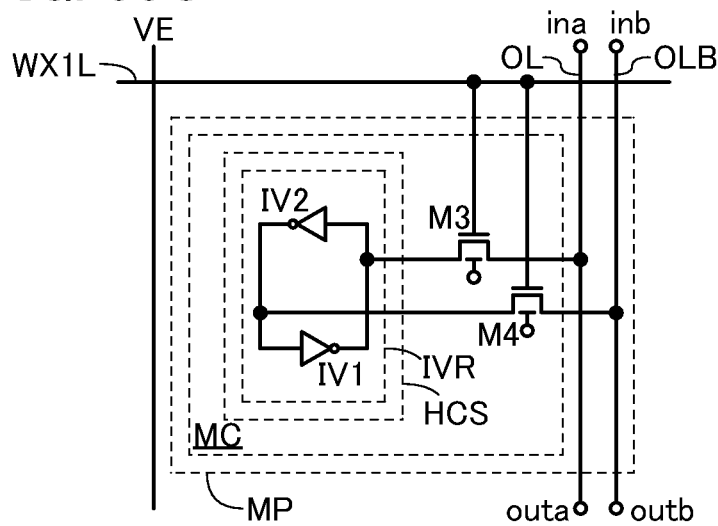

The circuit MP in FIG. 55C has a configuration in which the wiring X2L is removed from the circuit MP in FIG. 55B and the first terminal of the transistor M4 is electrically connected to the input terminal of the inverter circuit IV1 and the output terminal of the inverter circuit IV2. When the potential of the wiring WX1L is a high-level potential, the inverted signal is output to the wiring OL or the wiring OLB. In this case, for example, the first data (a weight coefficient) set in the circuit MP can be "+1" when a high-level potential is supplied to the output terminal of the inverter circuit IV1, and the first data (a weight coefficient) set in the circuit MP can be "−1" when a low-level potential is supplied to the output terminal of the inverter circuit IV1. As another example, in supplying information (e.g., a current or a voltage) from the circuit MP to the circuit AFP, the second data (a value of a signal of a neuron) input to the circuit MP can be "+1" when a high-level potential is input to the wiring WX1L, and the second data (a value of a signal of a neuron) input to the circuit MP can be "0" when a low-level potential is input to the wiring WX1L.

Note that the circuits MP in FIG. 55A to FIG. 55C can each be used as the circuit MP of the arithmetic circuit 140 illustrated in FIG. 7.

Figure 56A:
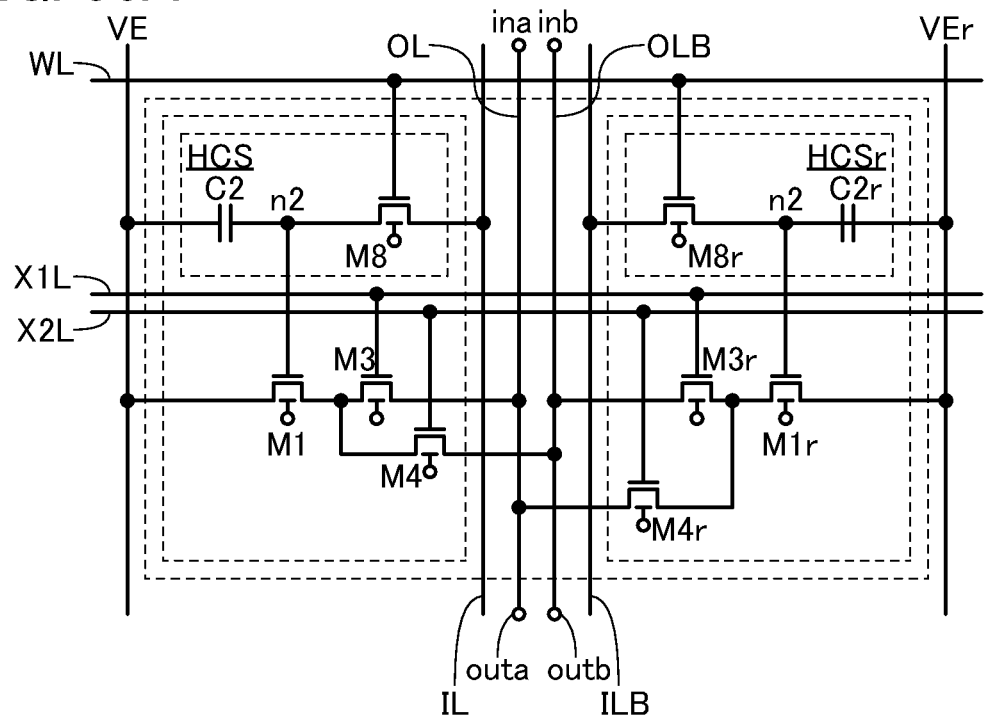
FIG. 56A and FIG. 56B are circuit diagrams each showing a configuration example of a circuit included in a semiconductor device.

As described above, the circuit HCS and the circuit HCSr included in the circuit MP in FIG. 53 can each have a configuration including a NOSRAM. FIG. 56A shows a specific example showing the details of the circuit MP in FIG. 53, in which the circuit HCS and the circuit HCSr each have a configuration including a NOSRAM. For the reference signs shown in FIG. 56A, the method for holding the first data (a weight coefficient), and the like, the description of the circuit MP in FIG. 34 is referred to.

Figure 56B:
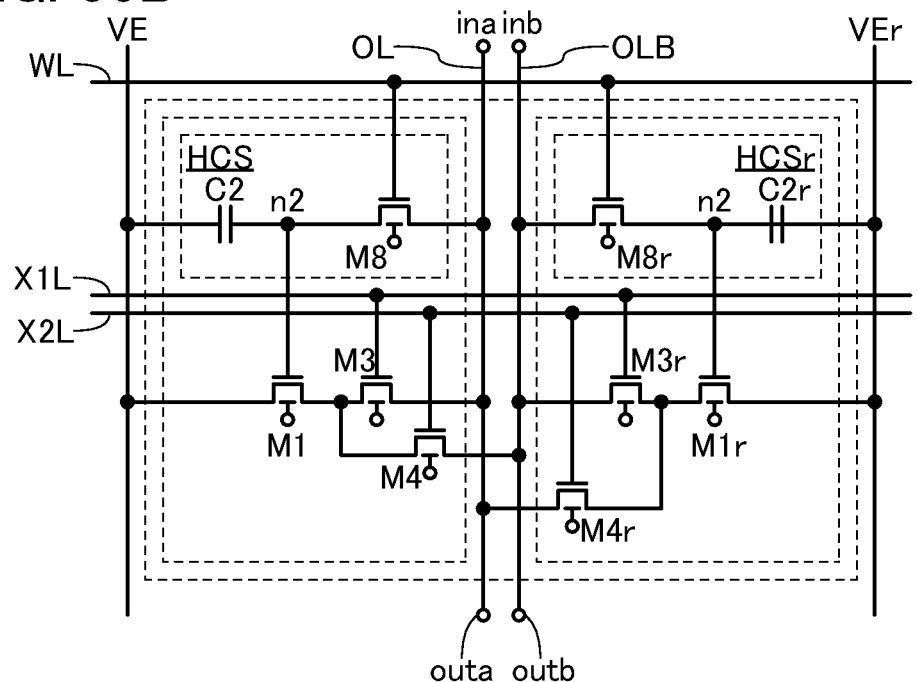

In the circuit MP in FIG. 56A, the wiring IL and the wiring OL may be combined into one wiring and/or the wiring ILB and the wiring OLB may be combined into one wiring. The circuit MP in FIG. 56B has a configuration in which the wiring IL and the wiring OL are combined into one wiring OL and the wiring ILB and the wiring OLB are combined into one wiring OL.

In addition, the operation method of the semiconductor device of one embodiment of the present invention is not limited to the above. For example, as described in Operation method example 2, the input period of signals that are input to the wiring X1L (the wiring WX1L in FIG. 55AB) and the wiring X2L may be divided into a plurality of subperiods in the circuits MP in FIG. 53 to FIG. 56.

In this operation method example, the case is considered where only one circuit MP is electrically connected to the wiring OL and the wiring OLB to avoid complexity of description; however, a plurality of circuits MP may be electrically connected to the wiring OL and the wiring OLB as in the arithmetic circuit 150 in FIG. 11. In this case, the sum of the amounts of charges input from the wiring OL and the wiring OLB to the plurality of circuits MP can be accumulated in the capacitor of the integrator circuit included in the circuit ACTF, which enables the circuit ACTF to output the signal $z_j^{(k)}$ of a neuron corresponding to the amounts of charges flowing through the wiring OL and the wiring OLB.

Although the arithmetic circuit 150 in FIG. 11 is used as an example in this operation example, operation similar to that of this operation example can be performed by changing the arithmetic circuit to another one according to circumstances.

Note that this operation method example can be combined with any of the other operation method examples and the like described in this specification as appropriate.

Operation Method Example 6

Figure 57:
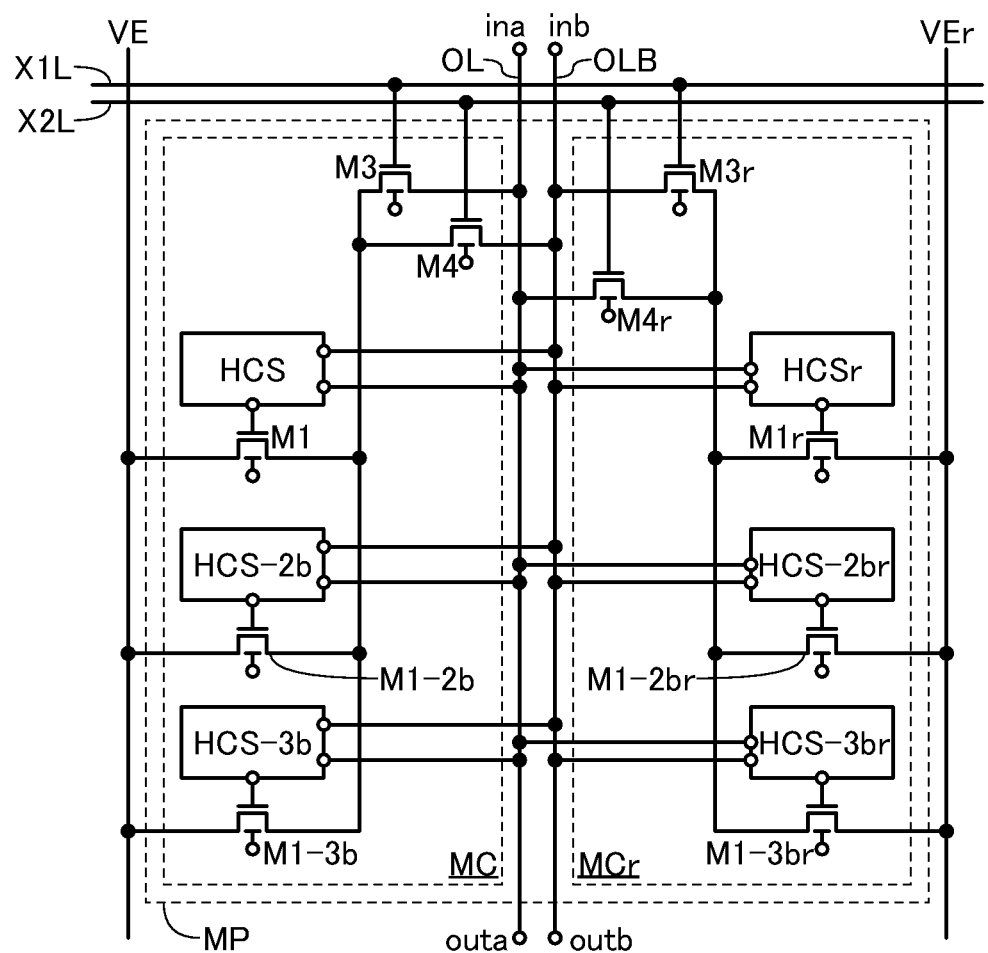
FIG. 57 is a circuit diagram showing a configuration example of a circuit included in a semiconductor device.

Described here is an operation method example of the arithmetic circuit 150 in FIG. 11 for which the circuit MP in FIG. 57 is used.

As in Operation method example 1 to Operation method example 5, to avoid complexity of description, a current flowing through the wiring OL and the wiring OLB is changed by only one circuit MP electrically connected to the wiring OL and the wiring OLB. The wiring VE and the wiring VEr electrically connected to the circuit MP each supply VSS as a constant voltage to the circuit MP. The circuits ACTF[1] to ACTF[n] included in the circuit AFP are each the circuit ACTF having a configuration of an integrator circuit (or a current charge (IQ) converter circuit), for example. A configuration may be employed in which the load LEa and the load LEb in the circuit ACTF[j] in FIG. 6E are each a capacitor or the like, for example.

FIG. 57 shows a circuit configuration similar to that of the circuit MP illustrated in FIG. 36. The circuit MP in FIG. 57 has a configuration in which the circuit HCS, the circuit HCS-2b, and the circuit HCS-3b are each electrically connected to the wiring OLB and the circuit HCSr, the circuit HCS-2br, and the circuit HCS-3br are each electrically connected to the wiring OLB. This operation method example is different from the operation example of the circuit MP in FIG. 36 described in Embodiment 2.

Specifically, the input time of a high-level potential to one of the wiring WX1L and the wiring X2L is set in accordance with the second data (for example, a value of a signal of a neuron here) in the circuit MP, as in Operation method example 5. That is, the time during which the transistor M3 and the transistor M3r are in an on state or the transistor M4 and the transistor M4r are in an on state is set.

As described in Operation method example 1, the amount of charge flowing from the wiring OL or the wiring OLB to the wiring VE through the transistor M1 is determined by setting the first data (for example, a weight coefficient here) in the circuit MP and setting the time during which the transistor M3 or the transistor M4 is in an on state. In addition, the amount of charge flowing from the wiring OL or the wiring OLB to the wiring VEr through the transistor M1r is determined by setting the first data (a weight coefficient) in the circuit MP and setting the time during which the transistor M3r or the transistor M4r is in an on state.

Similarly, the amount of charge flowing from the wiring OL or the wiring OLB to the wiring VE through the transistor M1-2b and the amount of charge flowing from the wiring OL or the wiring OLB to the wiring VEr through the transistor M1-2br are also determined by setting the times during which the transistor M3, the transistor M3r, the transistor M4, and the transistor M4r are in an off state.

Thus, the second data (a value of a signal of a neuron) in the circuit MP in FIG. 57 can be defined in a manner similar to that of the second data (a value of a signal of a neuron) in the circuit MP in FIG. 53.

As described in Configuration example 6 in Embodiment 2, the circuit HCS, the circuit HCS-2b, the circuit HCS-3b, the circuit HCSr, the circuit HCS-2br, and the circuit HCS-3br illustrated in FIG. 57 can each have a configuration including an SRAM or a configuration including a NOSRAM, for example. Here, a potential having a binary value (a digital value) is held in the circuit HCS, the circuit HCS-2b, the circuit HCS-3b, the circuit HCSr, the circuit HCS-2br, and the circuit HCS-3br.

When the ratios of the W lengths to the L lengths of the transistor M1 and the transistor M1r are each W/L, the ratios of the W lengths to the L lengths of the transistor M1 and the transistor M1r are each 2 W/L, and the ratios of the W lengths to the L lengths of the transistor M1 and the transistor M1r are each 4 W/L.

Thus, for the first data (for example, a weight coefficient here) set in the circuit MP, the contents of Configuration example 6 in Embodiment 2 can be referred to. Specifically, for example, the first data (a weight coefficient) set in the circuit MP is determined in accordance with currents flowing through the transistor M1, the transistor M1r, the transistor M1-2b, the transistor M1-2br, the transistor M1-3b, and the transistor M1-3br. In other words, the first data (a weight coefficient) set in the circuit MP is determined in accordance with potentials held in the circuit HCS, the circuit HCS-2b, the circuit HCS-3b, the circuit HCSr, the circuit HCS-2br, and the circuit HCS-3br. From the above, by holding a potential in each of the circuit HCS, the circuit HCS-2b, the circuit HCS-3b, the circuit HCSr, the circuit HCS-2br, and the circuit HCS-3br as in the following table, the first data (a weight coefficient) to be set in the circuit MP can be set.

TABLE 13

| Weight coefficient | HCS | HCSr | HCS-2b | HCS-2br | HCS-3b | HCS-3br |
|---|---|---|---|---|---|---|
| +1 | VDDL | VSS | VSS | VSS | VSS | VSS |
| +2 | VSS | VSS | VDDL | VSS | VSS | VSS |
| +3 | VDDL | VSS | VDDL | VSS | VSS | VSS |
| +4 | VSS | VSS | VSS | VSS | VDDL | VSS |
| +5 | VDDL | VSS | VSS | VSS | VDDL | VSS |
| +6 | VSS | VSS | VDDL | VSS | VDDL | VSS |
| +7 | VDDL | VSS | VDDL | VSS | VDDL | VSS |
| −1 | VSS | VDDL | VSS | VSS | VSS | VSS |
| −2 | VSS | VSS | VSS | VDDL | VSS | VSS |
| −3 | VSS | VDDL | VSS | VDDL | VSS | VSS |
| −4 | VSS | VSS | VSS | VSS | VSS | VDDL |
| −5 | VSS | VDDL | VSS | VSS | VSS | VDDL |
| −6 | VSS | VSS | VSS | VDDL | VSS | VDDL |
| −7 | VSS | VDDL | VSS | VDDL | VSS | VDDL |
| 0 | VSS | VSS | VSS | VSS | VSS | VSS |

Note that the amount of current flowing through the transistor M1 is $I_1$ in the case where the voltage VDDL is held in the circuit HCS. Since the ratio of the W length to the L length of the transistor M1-2b is twice as high as the ratio of the W length to the L length of the transistor M1, the amount of current flowing through the transistor M1 is $2I_1$ in the case where the voltage VDDL is held in the circuit HCS-2b. Since the ratio of the W length to the L length of the transistor M1-3b is four times as high as the ratio of the W length to the L length of the transistor M1, the amount of current flowing through the transistor M1-3b is $4I_1$ in the case where the voltage VDDL is held in the circuit HCS-3b. Similarly, the amount of current flowing through the transistor M1r is $I_1$ in the case where the voltage VDDL is held in the circuit HCSr, the amount of current flowing through the transistor M1-2br is $2I_1$ in the case where the voltage VDDL is held in the circuit HCS-2br, and the amount of current flowing through the transistor M1-3br is $4I_1$ in the case where the voltage VDDL is held in the circuit HCS-3br. Note that the amount of current flowing through the transistor M1, the transistor M1r, the transistor M1-2b, the transistor M1-2br, the transistor M1-3b, and the transistor M1-3br is 0 in the case where the voltage VSS is held in each of the circuit HCS, the circuit HCSr, the circuit HCS-2b, the circuit HCS-2br, the circuit HCS-3b, and the circuit HCS-2br.

Next, a specific operation example of the circuit MP in FIG. 57 is described.

The first data (a weight coefficient) of "+7" is set in the circuit MP in advance. At this time, the current of $I_{ut}$ flows between the source and the drain of the transistor M1, the current of $2I_{ut}$ flows between the source and the drain of the transistor M1-2b, and the current of $4I_{ut}$ flows between the source and the drain of the transistor M1-3b.

In the case where "+3" is input to the circuit MP as the second data (a value of a signal of a neuron), the transistor M3 is in an on state only for the time $3t_{ut}$ and the transistor M4 is in an off state, so that the amount of charge flowing from the wiring OL to the wiring VE through the transistor M1 is $3t_{ut} \times I_{ut} + 3t_{ut} \times 2I_{ut} + 3t_{ut} \times 4I_{ut} = 21t_{ut} \times I_{ut}$. Note that $t_{ut} \times I_{ut} = Q_{ut}$ is satisfied here. That is, the amount of charge flowing from the wiring OL to the wiring VE through the circuit MC is $21t_{ut} \times I_{ut} = 21Q_{ut}$. Meanwhile, the amount of charge flowing from the wiring OLB to the wiring VEr through the circuit MCr is 0 because the transistor M1r, the transistor M1-2br, and the transistor M1-3br are in an off state.

In the case where "−3" is input to the circuit MP as the second data (a value of a signal of a neuron), a conduction state is established between the wiring OLB and the circuit MC and between the wiring OL and the circuit MCr, and a non-conduction state is established between the wiring OL and the circuit MCr and between the wiring OL and the circuit MC, so that the amount of charge flowing from the wiring OLB to the wiring VE through the circuit MC is $21t_{ut} \times I_{ut} = 21Q_{ut}$ and the amount of charge flowing from the wiring OL to the wiring VEr through the circuit MCr is 0.

In addition, the case is considered where the first data of "−7" is set in the circuit MP in advance. At this time, the current of $I_1$ flows between the source and the drain of the transistor M1r, the current of $2I_1$ flows between the source and the drain of the transistor M1-2br, and the current of $4I_1$ flows between the source and the drain of the transistor M1-3br.

In the case where "+3" is input to the circuit MP as the second data (a value of a signal of a neuron), the transistor M3 is in an on state only for the time $3t_{ut}$ and the transistor M4 is in an off state, so that the amount of charge flowing from the wiring OLB to the wiring VEr through the transistor M1r is $3t_{ut} \times I_{ut} + 3t_{ut} \times 2I_{ut} + 3t_{ut} \times 4I_{ut} = 21t_{ut} \times I_{ut}$. That is, the amount of charge flowing from the wiring OLB to the wiring VEr through the circuit MCr is $21t_{ut} \times I_{ut} = 21Q_{ut}$. Meanwhile, the amount of charge flowing from the wiring OL to the wiring VE through the circuit MC is 0 because the transistor M1r, the transistor M1-2br, and the transistor M1-3br are in an off state. Meanwhile, the amount of charge flowing from the wiring OL to the wiring VE through the circuit MC is 0 because the transistors M1, M1-2b, and M1-3b are in an off state.

In the case where "−3" is input to the circuit MP as the second data (a value of a signal of a neuron), a conduction state is established between the wiring OLB and the circuit MC and between the wiring OL and the circuit MCr, and a non-conduction state is established between the wiring OL and the circuit MCr and between the wiring OL and the circuit MC, so that the amount of charge flowing from the wiring OL to the wiring VEr through the circuit MCr is $21t_{ut} \times I_{ut} = 21Q_{ut}$ and the amount of charge flowing from the wiring OLB to the wiring VE through the circuit MC is 0.

The combination of potentials held in the circuit HCS, the circuit HCS-2b, the circuit HCS-3b, the circuit HCSr, the circuit HCS-2br, and the circuit HCS-3br is changed by changing the first data (a weight coefficient) set in the circuit MP, and accordingly the amount of current flowing through each of the transistor M1, the transistor M1r, the transistor M1-2b, the transistor M1-2br, the transistor M1-3b, and the transistor M1-3br changes. Thus, the amount of charge flowing from the wiring OL or the wiring OLB to the wiring VE through the circuit MC and the amount of charge flowing from the wiring OL or the wiring OLB to the wiring VEr through the circuit MCr can be determined in accordance with the first data (a weight coefficient).

In the case where the first data (a weight coefficient) of "0" is set in the circuit MP in advance, the transistor M1, the transistor M1r, the transistor M1-2b, the transistor M1-2br, the transistor M1-3b, and the transistor M1-3br are each in an off state. Thus, a current does not flow from the wiring OL or wiring OLB to the wiring VE through the circuit MC, and a current does not flow from the wiring OL or the wiring OLB to the wiring VEr through the circuit MCr. In other words, the amount of charge flowing through the wiring OL and the wiring OLB is 0.

In the case where "0" is input to the circuit MP as the second data (a value of a signal of a neuron), a low-level potential is input to each of the wiring X1L and the wiring X2L, and thus the transistor M3, the transistor M3r, the transistor M4, and the transistor M4r are in an off state. Thus, a current does not flow from the wiring OL or the wiring OLB to the wiring VE through the circuit MC, and a current does not flow from the wiring OL or the wiring OLB to the wiring VEr through the circuit MCr. In other words, the amount of charge flowing through the wiring OL and the wiring OLB is 0.

When a current flows from the wiring OL or the wiring OLB to the wiring VE through the circuit MC or when a current flows from the wiring OL or the wiring OLB to the wiring VEr through the circuit MCr, the switch SWO and the switch SWOB are brought into an on state and the switch SWI, the switch SWIB, the switch SWL, the switch SWLB, the switch SWH, and the switch SWHB are brought into an off state so that a conduction state is established between the circuit AFP and the wirings OL and OLB in FIG. 8A, whereby the amount of charge flowing through the wiring OL and the wiring OLB can be accumulated in the capacitor of the integrator circuit included in the circuit ACTF. As a result, the circuit ACTF can output the signal $z_j^{(k)}$ of a neuron, which corresponds to the amount of charge flowing through the wiring OL and the wiring OLB.

By setting the first data (a weight coefficient) and the second data (a value of a signal of a neuron) as described above, the charge amount $Q_{OL}$ of a current flowing from the wiring OL to the circuit MC or the circuit MCr and the charge amount $Q_{OLB}$ of a current flowing from the wiring OLB to the circuit MC or the circuit MCr are determined in accordance with the result of the product of the first data (a weight coefficient) and the second data (a value of a signal of a neuron). In the case where the result of the product of the first data (a weight coefficient) and the second data (a value of a signal of a neuron) is a positive value, a current flows from the wiring OL to the circuit MC or the circuit MCr, and in the case where the result of the product of the first data (a weight coefficient) and the second data (a value of a signal of a neuron) is a negative value, a current flows from the wiring OLB to the circuit MC or the circuit MCr. That is, the product of the first data (a weight coefficient) and the second data (a value of a signal of a neuron) can be calculated from the charge amount $Q_{OL}$ and the charge amount $Q_{OLB}$. For example, in the case where the first data (a weight coefficient) is "+7" and the second data (a value of a signal of a neuron) is "+3", $Q_{OL}=21Q_{ut}$ and $Q_{OLB}=0$ are satisfied. In this case, a current flows from the wiring OL to the circuit MC or the circuit MCr, and thus the result of the product is a positive value. Thus, "+21" can be calculated from the charge amount $Q_{OL}$ as the result of the product of the first data (a weight coefficient) and the second data (a value of a signal of a neuron), for example, by replacing $Q_{ut}$ with "+1" in the charge amount $Q_{OL}$ of a current flowing from the wiring OL to the circuit MC or the circuit MCr. Alternatively, for example, when the first data (a weight coefficient) is "−7" and the second data (a value of a signal of a neuron) is "+3", $Q_{OL}=0$ and $Q_{OLB}=21Q_{ut}$ are satisfied. In this case, a current flows from the wiring OLB to the circuit MC or the circuit MCr, and thus the result of the product is a negative value. Thus, "−21" can be calculated from the charge amount $Q_{OLB}$ as the result of the product of the first data (a weight coefficient) and the second data (a value of a signal of a neuron), for example, by replacing $Q_{ut}$ with "−1" in the charge amount $Q_{OLB}$ of a current flowing from the wiring OLB to the circuit MC or the circuit MCr.

When the second data (a value of a signal of a neuron) is an integer or a real number other than "−3", "−2", "−1", "0", "+1", "+2", and "+3", the input time of a high-level potential to one of the wiring X1L and the wiring X2L is set in accordance with the integer or the real number. For example, by setting the input time to $a \times t_{ut}$, where a is a positive real number, the second data (a value of a signal of a neuron) can be processed as an analog value.

Accordingly, the multilevel second data (a value of a signal of a neuron) can be supplied to the circuit MP, as in Operation method example 1 to Operation method example 3 and Operation method example 5.

The configuration of the semiconductor device of one embodiment of the present invention is not limited to that of the circuit MP in FIG. 57. For example, in the circuit MP in FIG. 57, the circuit MC includes three transistors of the transistor M1, the transistor M1-2b, and the transistor M1-3b and the circuit MCr includes three transistors of the transistor M1r, the transistor M1-2br, and the transistor M1-3br as transistors for setting current amounts; however, the circuit MC and the circuit MCr may each include two transistors or four or more transistors for setting current amounts. In addition, the number of holding portions and the number of wirings may be increased and decreased in accordance with the number of transistors.

Note that the operation method of the semiconductor device of one embodiment of the present invention is not limited to the above. For example, as described in Operation method example 2, the input period of signals that are input to the wiring X1L and the wiring X2L may be divided into a plurality of subperiods in the circuit MP in FIG. 57.

In this operation method example, the case is considered where only one circuit MP is electrically connected to the wiring OL and the wiring OLB to avoid complexity of description; however, a plurality of circuits MP may be electrically connected to the wiring OL and the wiring OLB as in the arithmetic circuit 150 in FIG. 11. In this case, the sum of the amounts of charges input from the wiring OL and the wiring OLB to the plurality of circuits MP can be accumulated in the capacitor of the integrator circuit included in the circuit ACTF, which enables the circuit ACTF to output the signal $z_j^{(k)}$ of a neuron corresponding to the amounts of charges flowing through the wiring OL and the wiring OLB.

Although the arithmetic circuit 150 in FIG. 11 is used as an example in this operation example, operation similar to that of this operation example can be performed by changing the arithmetic circuit to another one according to circumstances.

Note that this operation method example can be combined with any of the other operation method examples and the like described in this specification as appropriate.

Operation Method Example 7

Figure 58:
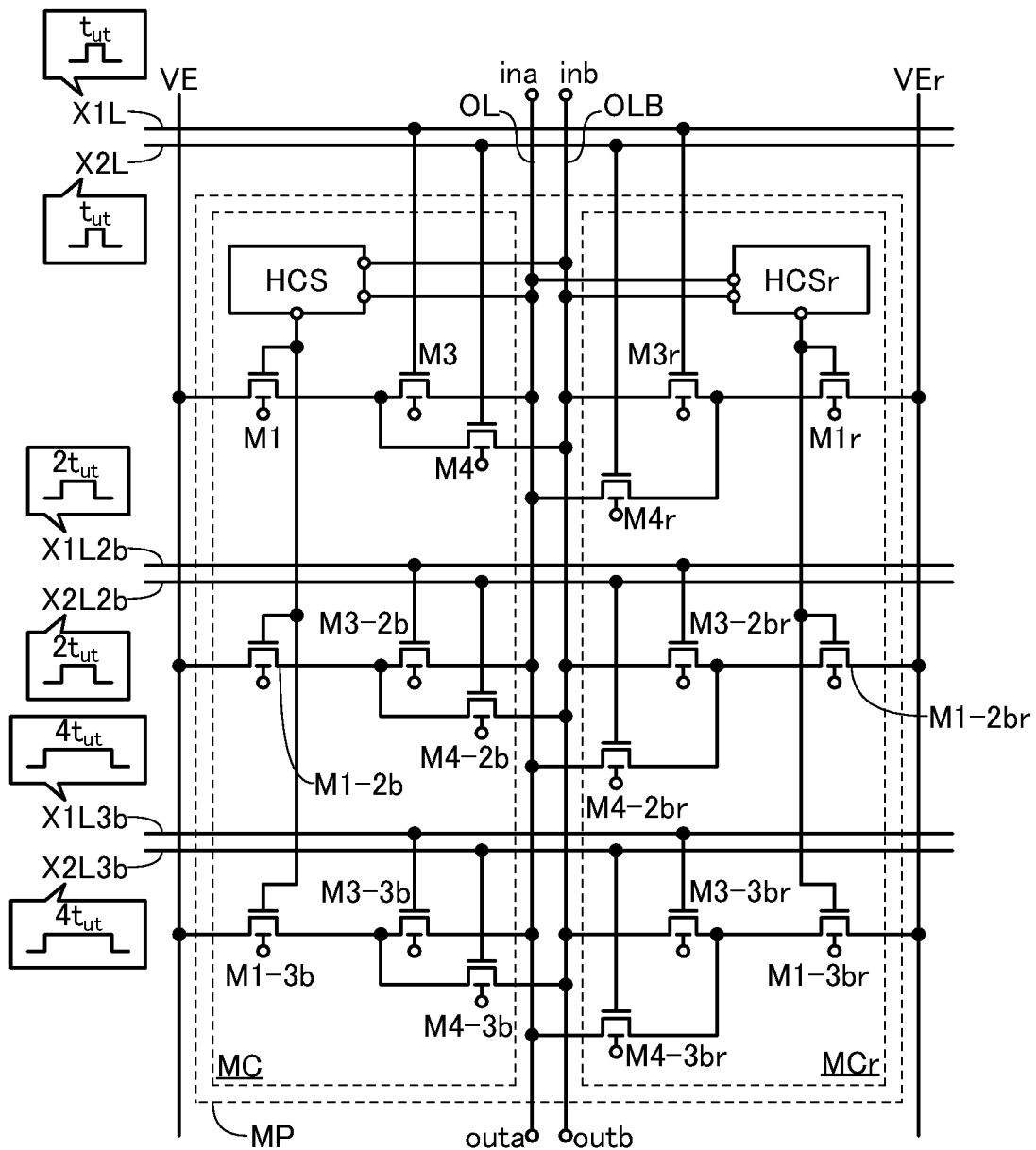
FIG. 58 is a circuit diagram showing a configuration example of a circuit included in a semiconductor device.

Described here is an operation method example of the arithmetic circuit 150 in FIG. 11 for which the circuit MP in FIG. 58 is used.

As in Operation method example 1 to Operation method example 6, to avoid complexity of description, a current flowing through the wiring OL and the wiring OLB is changed by only one circuit MP electrically connected to the wiring OL and the wiring OLB. The wiring VE and the wiring VEr electrically connected to the circuit MP each supply VSS as a constant voltage to the circuit MP. The circuit ACTF[1] to the circuit ACTF[n] included in the circuit AFP are each the circuit ACTF having a configuration of an integrator circuit (or a current charge (IQ) converter circuit), for example. A configuration may be employed in which the load LEa and the load LEb in the circuit ACTF[j] in FIG. 6E are each a capacitor or the like, for example.

FIG. 58 shows a circuit configuration similar to that of the circuit MP illustrated in FIG. 29. Note that the sizes, e.g., the W lengths and the L lengths, of the transistor M1, the transistor M1r, the transistor M1-2b, the transistor M1-2br, the transistor M1-3b, and the transistor M1-3br are preferably equal to each other. This operation method example is different from the operation example of the circuit MP in FIG. 29 described in Embodiment 2.

Specifically, as in the circuit MP in FIG. 50, in inputting the second data (for example, a value of a signal of a neuron here) to the circuit MP, the input time of a high-level potential to one of the wiring WX1L and the wiring X2L is $t_{ut}$, the input time of a high-level potential to one of the wiring X1L2b and the wiring X2L2b is $2t_{ut}$, and the input time of a high-level potential to one of the wiring X1L3b and the wiring X2L3b is $4t_{ut}$ in the operation. That is, the operation is performed such that the time during which the transistor M3 and the transistor M3r are in an on state or the transistor M4 and the transistor M4r are in an on state is $t_{ut}$, the time during which the transistor M3-2b and the transistor M3-2br are in an on state or the transistor M4-2b and the transistor M4-2br are in an on state is $2t_{ut}$, and the time during which the transistor M3-3b and the transistor M3-3br are in an on state or the transistor M4-3b and the transistor M4-3br are in an on state is $4t_{ut}$. Thus, to show the difference in operation between the circuit MP in FIG. 29 and the circuit MP in FIG. 58, schematic views of pulse voltages and the input times are shown around the reference signs of the wiring WX1L, the wiring X2L, the wiring X1L2b, the wiring X2L2b, the wiring X1L3b, and the wiring X2L3b.

As described in Operation method example 1 and Operation method example 2, the amount of charge flowing from the wiring OL or the wiring OLB to the wiring VE through the transistor M1 is determined by setting the first data (for example, a weight coefficient here) in the circuit MP and setting the time during which the transistor M3 or the transistor M4 is in an on state. In addition, the amount of charge flowing from the wiring OL or the wiring OLB to the wiring VEr through the transistor M1r is determined by setting the first data (a weight coefficient) in the circuit MP and setting the time during which the transistor M3r or the transistor M4r is in an on state.

Similarly, the amount of charge flowing from the wiring OL or the wiring OLB to the wiring VE through the transistor M1-2b and the amount of charge flowing from the wiring OL or the wiring OLB to the wiring VEr through the transistor M1-2br are also determined by setting the times during which the transistor M3-2b, the transistor M3-2br, the transistor M4-2b, and the transistor M4-2br are in an on state. In addition, the amount of charge flowing from the wiring OL or the wiring OLB to the wiring VE through the transistor M1-3b and the amount of charge flowing from the wiring OL or the wiring OLB to the wiring VEr through the transistor M1-3br are also determined by setting the times during which the transistor M3-3b, the transistor M3-3br, the transistor M4-3b, and the transistor M4-3br are in an on state.

Thus, the second data (a value of a signal of a neuron) in the circuit MP in FIG. 58 can be defined in a manner similar to that of the second data (a value of a signal of a neuron) in the circuit MP in FIG. 50 described in Operation method example 3.

As described in Configuration example 5 in Embodiment 2, the circuit HCS and the circuit HCSr illustrated in FIG. 58 can each have a configuration including an SRAM or a configuration including a NOSRAM. Here, a potential having a binary value (a digital value) is held in the circuit HCS and the circuit HCSr. Thus, for example, a high-level potential (for example, VDDL here) is held in the circuit HCS and a low-level potential (for example, VSS here) is held in the circuit HCSr when the first data (a weight coefficient) set in the circuit MP is "+1"; a low-level potential is held in the circuit HCS and a high-level potential is held in the circuit HCSr when the first data (a weight coefficient) set in the circuit MP is "−1"; and a low-level potential is held in the circuit HCS and a low-level potential is held in the circuit HCSr when the first data (a weight coefficient) set in the circuit MP is "0".

Note that the amount of current flowing through the transistor M1 is $I_1$ in the case where the voltage VDDL is held in the circuit HCS. The amount of current flowing through the transistor M1 is 0 in the case where the voltage VSS is held in the circuit HCS. Similarly, the amount of current flowing through the transistor M1r is $I_{ut}$ in the case where the voltage VDDL is held in the circuit HCSr, and the amount of current flowing through the transistor M1r is 0 in the case where the voltage VSS is held in the circuit HCSr.

In the circuit MC, the sizes of the transistor M1, the transistor M1-2b, and the transistor M1-3b are equal to each other, the gates of the transistor M1, the transistor M1-2b, and the transistor M1-3b are each electrically connected to the circuit HCS, and the first terminals of the transistor M1, the transistor M1-2b, and the transistor M1-3b are each electrically connected to the wiring VE; thus, almost equal currents flow between the sources and the drains of the transistor M1, the transistor M1-2b, and the transistor M1-3b. Therefore, the amount of current flowing between the sources and the drains of the transistor M1-2b and the transistor M1-3b is $I_{ut}$ as in the transistor M1. In addition, the sizes of the transistor M1r, the transistor M1-2br, and the transistor M1-3br are equal to that of the transistor M1, the gates of the transistor M1r, the transistor M1-2br, and the transistor M1-3br are electrically connected to the circuit HCSr, and the first terminals of the transistor M1r, the transistor M1-2br, and the transistor M1-3br are each electrically connected to the wiring VEr; thus, the current flowing between the sources and the drains of the transistor M1r, the transistor M1-2br, and the transistor M1-3br is equal to the current flowing between the source and the drain of the transistor M1. Therefore, the amount of current flowing between the sources and the drains of the transistor M1r, the transistor M1-2br, and the transistor M1-3br is $I_{ut}$ as in the transistor M1.

Next, a specific operation example of the circuit MP in FIG. 58 is described.

The first data (a weight coefficient) of "+1" is set in the circuit MP in advance.

In the case where "+7" is input to the circuit MP as the second data (a value of a signal of a neuron), the transistor M3 is in an on state only for the time $t_{ut}$ and the transistor M4 is in an off state, so that the amount of charge flowing from the wiring OL to the wiring VE through the transistor M1 is $t_{ut} \times I_{ut}$. Note that $t_{ut} \times I_{ut} = Q_{ut}$ is satisfied here. Similarly, the transistor M3-2b is in an on state only for the time $2t_{ut}$ and the transistor M4-2b is in an off state, so that the amount of charge flowing from the wiring OL to the wiring VE through the transistor M1-2b is $2t_{ut} \times I_{ut} = 2Q_{ut}$, and the transistor M3-3b is in an on state only for the time $4t_{ut}$ and the transistor M4-3b is in an off state, so that the amount of charge flowing from the wiring OL to the wiring VE through the transistor M1-3b is $4t_{ut} \times I_{ut} = 4Q_{ut}$. Thus, the amount of charge flowing from the wiring OL to the wiring VE through the circuit MC is $Q_{ut} + 2Q_{ut} + 4Q_{ut} = 7Q_{ut}$. Meanwhile, the amount of charge flowing from the wiring OLB to the wiring VEr through the circuit MCr is 0 because the transistor M1r, the transistor M1-2br, and the transistor M1-3br are in an off state.

In the case where "−7" is input to the circuit MP as the second data (a value of a signal of a neuron), a conduction state is established between the wiring OLB and the circuit MC and between the wiring OL and the circuit MCr, and a non-conduction state is established between the wiring OL and the circuit MCr and between the wiring OL and the circuit MC, so that the amount of charge flowing from the wiring OLB to the wiring VE through the circuit MC is $Q_{ut}+2Q_{ut}+4Q_{ut}=7Q_{ut}$ and the amount of charge flowing from the wiring OL to the wiring VEr through the circuit MCr is 0.

In addition, the case is considered where the first data (a weight coefficient) of "−1" is set in the circuit MP in advance.

In the case where "+7" is input to the circuit MP as the second data (a value of a signal of a neuron), the transistor M3r is in an on state only for the time $t_{ut}$ and the transistor M4r is in an off state, so that the amount of charge flowing from the wiring OLB to the wiring VEr through the transistor M1r is $t_{ut} \times I_{ut} = Q_{ut}$. Similarly, the transistor M4-2br is in an on state only for the time $2t_{ut}$ and the transistor M3-2br is in an off state, so that the amount of charge flowing from the wiring OLB to the wiring VEr through the transistor M1-2br is $2t_{ut} \times I_{ut} = 2Q_{ut}$, and the transistor M4-3br is in an on state only for the time $4t_{ut}$ and the transistor M3-3br is in an off state, so that the amount of charge flowing from the wiring OLB to the wiring VEr through the transistor M1-3br is $4t_{ut} \times I_{ut} = 4Q_{ut}$. Thus, the amount of charge flowing from the wiring OLB to the wiring VEr through the circuit MCr is $Q_{ut}+2Q_{ut}+4Q_{ut}=7Q_{ut}$. Meanwhile, the amount of current flowing from the wiring OL to the wiring VE through the circuit MC is 0 because the transistors M1r, M1-2br, and M1-3br are in an off state.

In the case where "−7" is input to the circuit MP as the second data (a value of a signal of a neuron), a conduction state is established between the wiring OLB and the circuit MC and between the wiring OL and the circuit MCr, and a non-conduction state is established between the wiring OL and the circuit MCr and between the wiring OL and the circuit MC, so that the amount of charge flowing from the wiring OL to the wiring VEr through the circuit MCr is $Q_{ut}+2Q_{ut}+4Q_{ut}=7Q_{ut}$ and the amount of charge flowing from the wiring OLB to the wiring VE through the circuit MC is 0.

Thus, by setting the first data (a weight coefficient) of "+1" in the circuit MP and selecting one or more transistors to be brought into an on state from the transistor M3, the transistor M3-2b, and the transistor M3-3b included in the circuit MP in accordance with the positive second data (a value of a signal of a neuron), the amount of charge flowing from the wiring OL to the wiring VE through the circuit MC can be any one of $Q_{ut}$, $2Q_{ut}$, $3Q_{ut}$, $4Q_{ut}$, $5Q_{ut}$, $6Q_{ut}$, and $7Q_{ut}$. Note that the amount of charge flowing from the wiring OLB to the wiring VEr through the circuit MCr is 0 at this time. In addition, by setting the first data (a weight coefficient) of "−1" in the circuit MP and selecting one or more transistors to be brought into an on state from the transistor M3r, the transistor M3-2br, and the transistor M3-3br included in the circuit MP in accordance with the positive second data (a value of a signal of a neuron), the amount of charge flowing from the wiring OLB to the wiring VEr through the circuit MCr can be any one of $Q_{ut}$, $2Q_{ut}$, $3Q_{ut}$, $4Q_{ut}$, $5Q_{ut}$, $6Q_{ut}$, and $7Q_{ut}$. Note that the amount of charge flowing from the wiring OL to the wiring VE through the circuit MC is 0 at this time.

In addition, by setting the first data (a weight coefficient) of "+1" in the circuit MP and selecting one or more transistors to be brought into an on state from the transistor M4, the transistor M4-2b, and the transistor M4-3b included in the circuit MP in accordance with the negative second data (a value of a signal of a neuron), the amount of charge flowing from the wiring OLB to the wiring VE through the circuit MC can be any one of $Q_{ut}$, $2Q_{ut}$, $3Q_{ut}$, $4Q_{ut}$, $5Q_{ut}$, $6Q_{ut}$, and $7Q_{ut}$. Note that the amount of charge flowing from the wiring OL to the wiring VEr through the circuit MCr is 0 at this time. In addition, by setting the first data (a weight coefficient) of "−1" in the circuit MP and selecting one or more transistors to be brought into an on state from the transistor M4r, the transistor M4-2br, and the transistor M4-3br included in the circuit MP in accordance with the negative second data (a value of a signal of a neuron), the amount of charge flowing from the wiring OL to the wiring VEr through the circuit MCr can be any one of $Q_{ut}$, $2Q_{ut}$, $3Q_{ut}$, $4Q_{ut}$, $5Q_{ut}$, $6Q_{ut}$, and $7Q_{ut}$. Note that the amount of charge flowing from the wiring OLB to the wiring VE through the circuit MC is 0 at this time.

In the case where the first data (a weight coefficient) of "0" is set in the circuit MP in advance, the transistor M1, the transistor M1r, the transistor M1-2b, the transistor M1-2br, the transistor M1-3b, and the transistor M1-3br are each in an off state. Thus, a current does not flow from the wiring OL or wiring OLB to the wiring VE through the circuit MC, and a current does not flow from the wiring OL or the wiring OLB to the wiring VEr through the circuit MCr. In other words, the amount of charge flowing through the wiring OL and the wiring OLB is 0.

In the case where the first data (a weight coefficient) of "0" is input to the circuit MP, the transistor M3, the transistor M3-2b, the transistor M3-3b, the transistor M4, the transistor M4-2b, the transistor M4-3b, the transistor M3r, the transistor M3-2br, the transistor M3-3br, the transistor M4r, the transistor M4-2br, and the transistor M4-3br are each in an off state. Thus, a current does not flow from the wiring OL or wiring OLB to the wiring VE through the circuit MC, and a current does not flow from the wiring OL or the wiring OLB to the wiring VEr through the circuit MCr. In other words, the amount of charge flowing through the wiring OL and the wiring OLB is 0.

Here, the integrator circuit of the circuit ACTF is focused on. When a current flows from the wiring OL or the wiring OLB to the wiring VE through the circuit MC or when a current flows from the wiring OL or the wiring OLB to the wiring VEr through the circuit MCr, the switch SWO and the switch SWOB are brought into an on state and the switch SWI, the switch SWIB, the switch SWL, the switch SWLB, the switch SWH, and the switch SWHB are brought into an off state so that a conduction state is established between the circuit AFP and each of the wiring OL and the wiring OLB in FIG. 8A, whereby the amount of charge flowing through the wiring OL and the wiring OLB can be accumulated in the capacitor of the integrator circuit included in the circuit ACTF. As a result, the circuit ACTF can output the signal $z_j^{(k)}$ of a neuron, which corresponds to the charge amount $Q_{OL}$ supplied through the wiring OL and the charge amount $Q_{OLB}$ supplied through the wiring OLB.

The following table shows the charge amount $Q_{OL}$ supplied through the wiring OL and the charge amount $Q_{OLB}$ supplied through the wiring OLB in the case of the above operation example where the first data (a weight coefficient)

is "+1" or "−1" and the second data (a value of a signal of a neuron) is defined as described above.

TABLE 14

| Weight coefficient | Value of signal of neuron | Weight coefficient × signal | Charge amount $Q_{OL}$ supplied through wiring OL | Charge amount $Q_{OLB}$ supplied through wiring OLB |
|---|---|---|---|---|
| +1 | 0  | 0  | 0        | 0        |
| +1 | +1 | +1 | $Q_{ut}$   | 0        |
| +1 | +2 | +2 | $2Q_{ut}$  | 0        |
| +1 | +3 | +3 | $3Q_{ut}$  | 0        |
| +1 | +4 | +4 | $4Q_{ut}$  | 0        |
| +1 | +5 | +5 | $5Q_{ut}$  | 0        |
| +1 | +6 | +6 | $6Q_{ut}$  | 0        |
| +1 | +7 | +7 | $7Q_{ut}$  | 0        |
| +1 | −1 | −1 | 0        | $Q_{ut}$   |
| +1 | −2 | −2 | 0        | $2Q_{ut}$  |
| +1 | −3 | −3 | 0        | $3Q_{ut}$  |
| +1 | −4 | −4 | 0        | $4Q_{ut}$  |
| +1 | −5 | −5 | 0        | $5Q_{ut}$  |
| +1 | −6 | −6 | 0        | $6Q_{ut}$  |
| +1 | −7 | −7 | 0        | $7Q_{ut}$  |

TABLE 15

| Weight coefficient | Value of signal of neuron | Weight coefficient × signal | Charge amount $Q_{OL}$ supplied through wiring OL | Charge amount $Q_{OLB}$ supplied through wiring OLB |
|---|---|---|---|---|
| −1 | 0  | 0  | 0        | 0        |
| −1 | +1 | −1 | 0        | $Q_{ut}$   |
| −1 | +2 | −2 | 0        | $2Q_{ut}$  |
| −1 | +3 | −3 | 0        | $3Q_{ut}$  |
| −1 | +4 | −4 | 0        | $4Q_{ut}$  |
| −1 | +5 | −5 | 0        | $5Q_{ut}$  |
| −1 | +6 | −6 | 0        | $6Q_{ut}$  |
| −1 | +7 | −7 | 0        | $7Q_{ut}$  |
| −1 | −1 | +1 | $Q_{ut}$   | 0        |
| −1 | −2 | +2 | $2Q_{ut}$  | 0        |
| −1 | −3 | +3 | $3Q_{ut}$  | 0        |
| −1 | −4 | +4 | $4Q_{ut}$  | 0        |
| −1 | −5 | +5 | $5Q_{ut}$  | 0        |
| −1 | −6 | +6 | $6Q_{ut}$  | 0        |
| −1 | −7 | +7 | $7Q_{ut}$  | 0        |

By setting the first data (a weight coefficient) and the second data (a value of a signal of a neuron) as described above, the charge amount $Q_{OL}$ of a current flowing from the wiring OL to the circuit MC or the circuit MCr and the charge amount $Q_{OLB}$ of a current flowing from the wiring OLB to the circuit MC or the circuit MCr are determined in accordance with the result of the product of the first data (a weight coefficient) and the second data (a value of a signal of a neuron). In the case where the result of the product of the first data (a weight coefficient) and the second data (a value of a signal of a neuron) is a positive value, a current flows from the wiring OL to the circuit MC or the circuit MCr, and in the case where the result of the product of the first data (a weight coefficient) and the second data (a value of a signal of a neuron) is a negative value, a current flows from the wiring OLB to the circuit MC or the circuit MCr. That is, the product of the first data (a weight coefficient) and the second data (a value of a signal of a neuron) can be calculated from the charge amount $Q_{OL}$ and the charge amount $Q_{OLB}$. For example, in the case where the first data (a weight coefficient) is "−1" or "+1", the second data (a value of a signal of a neuron) is any one of "−7" to "+7", and the product of the first data (a weight coefficient) and the second data (a value of a signal of a neuron) is a positive number, the product of the first data (a weight coefficient) and the second data (a value of a signal of a neuron) can be calculated from the charge amount $Q_{OL}$ by replacing $Q_{ut}$ with "+1" in the charge amount $Q_{OL}$ of a current flowing from the wiring OL to the circuit MC or the circuit MCr in the above table. Alternatively, for example, in the case where the first data (a weight coefficient) is "−1" or "+1", the second data (a value of a signal of a neuron) is any one of "−7" to "+7", and the product of the first data (a weight coefficient) and the second data (a value of a signal of a neuron) is a negative number, the product of the first data (a weight coefficient) and the second data (a value of a signal of a neuron) can be calculated from the charge amount $Q_{OLB}$ by replacing $Q_{ut}$ with "−1" in the charge amount $Q_{OLB}$ of a current flowing from the wiring OL to the circuit MC or the circuit MCr in the above table.

One embodiment of the present invention is not limited to the above definition. Although the second data (a value of a signal of a neuron) is defined above as a positive multilevel value, a negative multilevel value, or 0, the second data (a value of a signal of a neuron) can be processed as an analog value by using not a discrete value but a continuous value as the input period (by setting the input period to $axt_{ut}$, where $a$ is a positive real number).

When the time during which the transistor M3 and the transistor M3r are in an on state or the transistor M4 and the transistor M4r are in an on state is $t_{ut}$, the time during which the transistor M3-2b and the transistor M3-2br are in an on state or the transistor M4-2b and the transistor M4-2br are in an on state is $2t_{ut}$, and the time during which the transistor M3-3b and the transistor M3-3br are in an on state or the transistor M4-3b and the transistor M4-3br are in an on state is $4t_{ut}$, for example, the second data (a value of a signal of a neuron) when a high-level potential is input to the wiring WX1L, a low-level potential is input to the wiring X2L, and a low-level potential is input to the wiring X1L2b, the wiring X2L2b, the wiring X1L3b, and the wiring X2L3b may be defined as not "+1" but a real number such as "+0.1".

The configuration of the semiconductor device of one embodiment of the present invention is not limited to that of the circuit MP in FIG. 58. For example, in the circuit MP in FIG. 58, the circuit MC includes three transistors of the transistor M1, the transistor M1-2b, and the transistor M1-3b and the circuit MCr includes three transistors of the transistor M1r, the transistor M1-2br, and the transistor M1-3br as transistors for setting current amounts; however, the circuit MC and the circuit MCr may each include two transistors or four or more transistors for setting current amounts.

The semiconductor device of one embodiment of the present invention and the operation method of the semiconductor device are not limited to the above. Although the sizes of the transistor M1, the transistor M1r, the transistor M1-2b, the transistor M1-2br, the transistor M1-3b, and the transistor M1-3br of the circuit MP in FIG. 58 are equal to each other in the above description, the ratios of the W lengths to the L lengths of the transistor M1, the transistor M1r, the transistor M1-2b, and the transistor M1-2br may each be W/L and the ratios of the W lengths to the L lengths of the transistor M1-3b and the transistor M1-3br may each be 2 W/L, as in the circuit MP in FIG. 51. In the case where the potential VDDL is held in the circuit HCS and the transistor M1 is set such that a current having the current amount of $I_1$ flows between the source and the drain, the current amount of $2I_1$ is supplied between the sources and the drains of the transistor M1-2b and the transistor M1-3b because the ratio of the W length to the L length of the transistor M1-2b and the ratio of the W length to the L length of the transistor M1-3b are each twice as high as the ratio of the W length to the L length of the transistor M1. Similarly, in the case where the potential VDDL is held in the circuit HCSr and the transistor M1r is set such that a current having the current amount of $I_1$ flows between the source and the drain, the current amount of $2I_1$ is supplied between the sources and the drains of the transistor M1-2br and the transistor M1-3br because the ratio of the W length to the L length of the transistor M1-2br and the ratio of the W length to the L length of the transistor M1-3br are each twice as high as the ratio of the W length to the L length of the transistor M1r.

Figure 59:
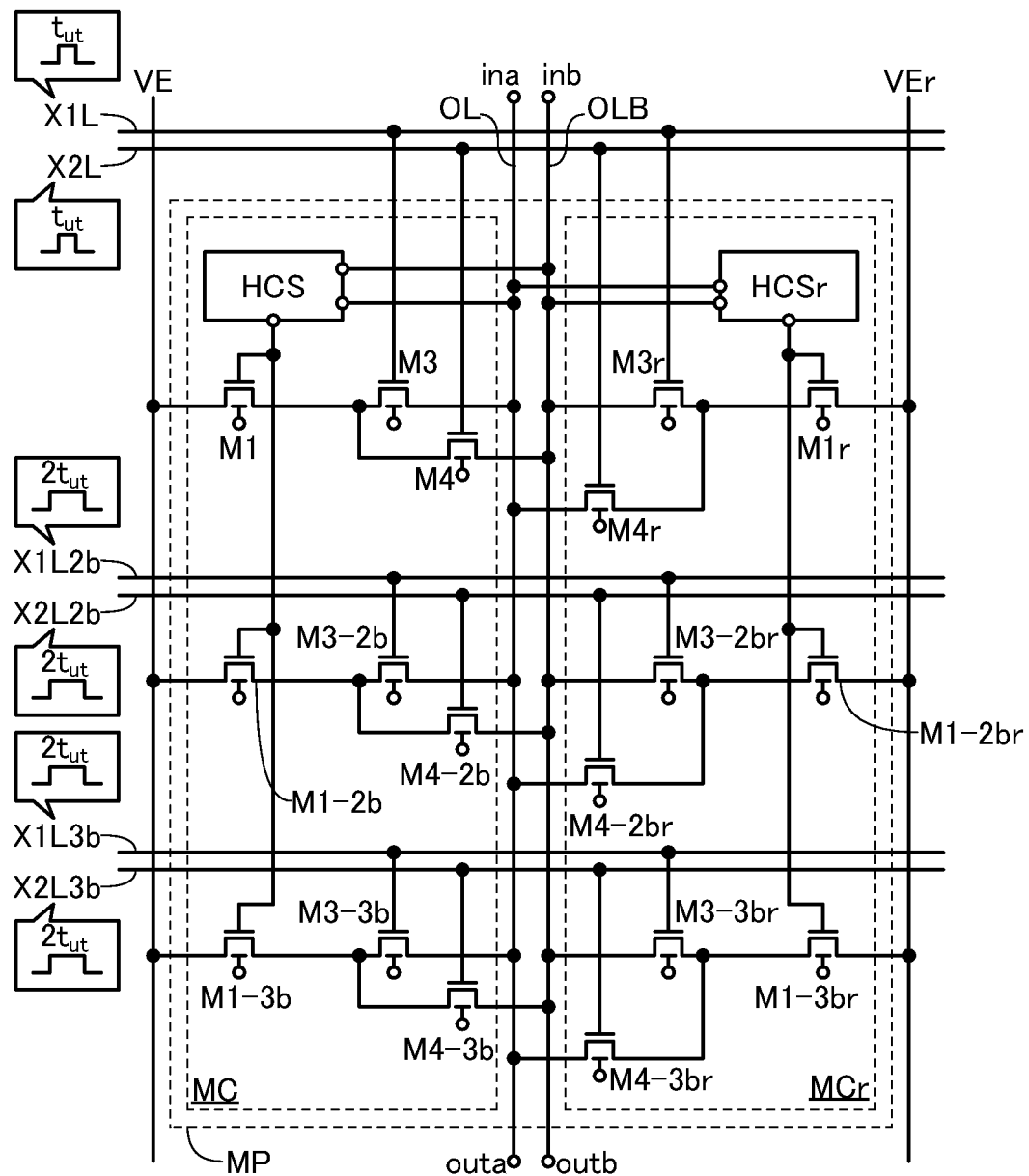
FIG. 59 is a circuit diagram showing a configuration example of a circuit included in a semiconductor device.

Here, the time during which the transistor M3 and the transistor M3r are in an on state or the transistor M4 and the transistor M4r are in an on state is $t_{ut}$, the time during which the transistor M3-2b and the transistor M3-2br are in an on state or the transistor M4-2b and the transistor M4-2br are in an on state is $2t_{ut}$, and the time during which the transistor M3-3b and the transistor M3-3br are in an on state or the transistor M4-3b and the transistor M4-3br are in an on state is $2t_{ut}$. That is, in inputting the second data (a value of a signal of a neuron) to the circuit MP, the input time of a high-level potential to one of the wiring WX1L and the wiring X2L is $t_{ut}$, the input time of a high-level potential to one of the wiring X1L2b and the wiring X2L2b is $2t_{ut}$, and the input time of a high-level potential to one of the wiring X1L3b and the wiring X2L3b is $2t_{ut}$. The circuit MP in FIG. 59 shows schematic views of pulse voltages and the input times, which are different from those in FIG. 58, around the reference signs of the wiring WX1L, the wiring X2L, the wiring X1L2b, the wiring X2L2b, the wiring X1L3b, and the wiring X2L3b.

When the potential VDDL is held in the circuit HCS and the transistor M1 is set such that a current having the current amount of $I_{ut}$ flows between the source and the drain, one of the transistor M3-3b and the transistor M4-3b is in an on state only for the time $2t_{ut}$ and the other of the transistor M3-3b and the transistor M4-3b is in an off state, so that the amount of charge flowing from the wiring OL or the wiring OLB to the wiring VE through the transistor M1-3b is $2t_{ut} \times 2I_{ut} = 4Q_{ut}$. Note that the conditions of the amount of charge flowing from the wiring OL to the wiring VE through the transistor M1 and the amount of charge flowing from the wiring OL to the wiring VE through the transistor M1-2b are the same as those of the above-described operation example, and thus the description is omitted.

When the potential VDDL is held in the circuit HCSr and the transistor M1r is set such that a current having the current amount of $I_1$ flows between the source and the drain, one of the transistor M3-3br and the transistor M4-3br is brought into an on state only for the time $2t_{ut}$ and the other of the transistor M3-3br and the transistor M4-3br is brought into an off state, so that the amount of charge flowing from the wiring OL or the wiring OLB to the wiring VEr through the transistor M1-3br is $2t_{ut} \times 2I_{ut} = 4Q_{ut}$. Note that the conditions of the amount of charge flowing from the wiring OLB to the wiring VEr through the transistor M1r and the amount of charge flowing from the wiring OLB to the wiring VEr through the transistor M1-2br are the same as those of the above-described operation example, and thus the description is omitted.

As described above, the sizes of the transistor M1, the transistor M1r, the transistor M1-2b, the transistor M1-2br, the transistor M1-3b, and the transistor M1-3br and the input time of a high-level potential to each of the wiring X1L, the wiring X2L, the wiring X1L2b, the wiring X2L2b, the wiring X1L3b, and the wiring X2L3b are appropriately changed, whereby the operation can be similar to that of the operation example of the circuit MP shown in FIG. 58.

The configuration of the semiconductor device of one embodiment of the present invention is not limited to those of the circuits MP in FIG. 58 and FIG. 59. For example, in the circuit MP in FIG. 58, there are three transistors of the transistor M1, the transistor M1-2b, and the transistor M1-3b through which a current corresponding to a potential held in the circuit HCS flows, and there are three transistors of the transistor M1r, the transistor M1-2br, and the transistor M1-3br through which a current corresponding to a potential held in the circuit HCSr flows; however, the circuits MC and MCr may each include two transistors or four or more transistors for setting current amounts. In addition, the number of holding portions and the number of wirings may be increased and or decreased in accordance with the number of transistors.

In addition, the operation method of the semiconductor device of one embodiment of the present invention is not limited to the above operation method. For example, as described in Operation method example 2, the input period of signals that are input to the wiring X1L, the wiring X2L, the wiring X1L2b, the wiring X2L2b, the wiring X1L3b, and the wiring X2L3b may be divided into a plurality of sub-periods in the circuit MP in FIG. 57.

In this operation method example, the case is considered where only one circuit MP is electrically connected to the wiring OL and the wiring OLB to avoid complexity of description; however, a plurality of circuits MP may be electrically connected to the wiring OL and the wiring OLB as in the arithmetic circuit 150 in FIG. 11. In this case, the sum of the amounts of charges input from the wiring OL and the wiring OLB to the plurality of circuits MP can be accumulated in the capacitor of the integrator circuit included in the circuit ACTF, which enables the circuit ACTF to output the signal $z_j^{(k)}$ of a neuron corresponding to the amounts of charges flowing through the wiring OL and the wiring OLB.

Although the arithmetic circuit 150 in FIG. 11 is used as an example in this operation example, operation similar to that of this operation example can be performed by changing the arithmetic circuit to another one according to circumstances.

Note that this operation method example can be combined with any of the other operation method examples and the like described in this specification as appropriate.

Operation Method Example 8

Figure 60:
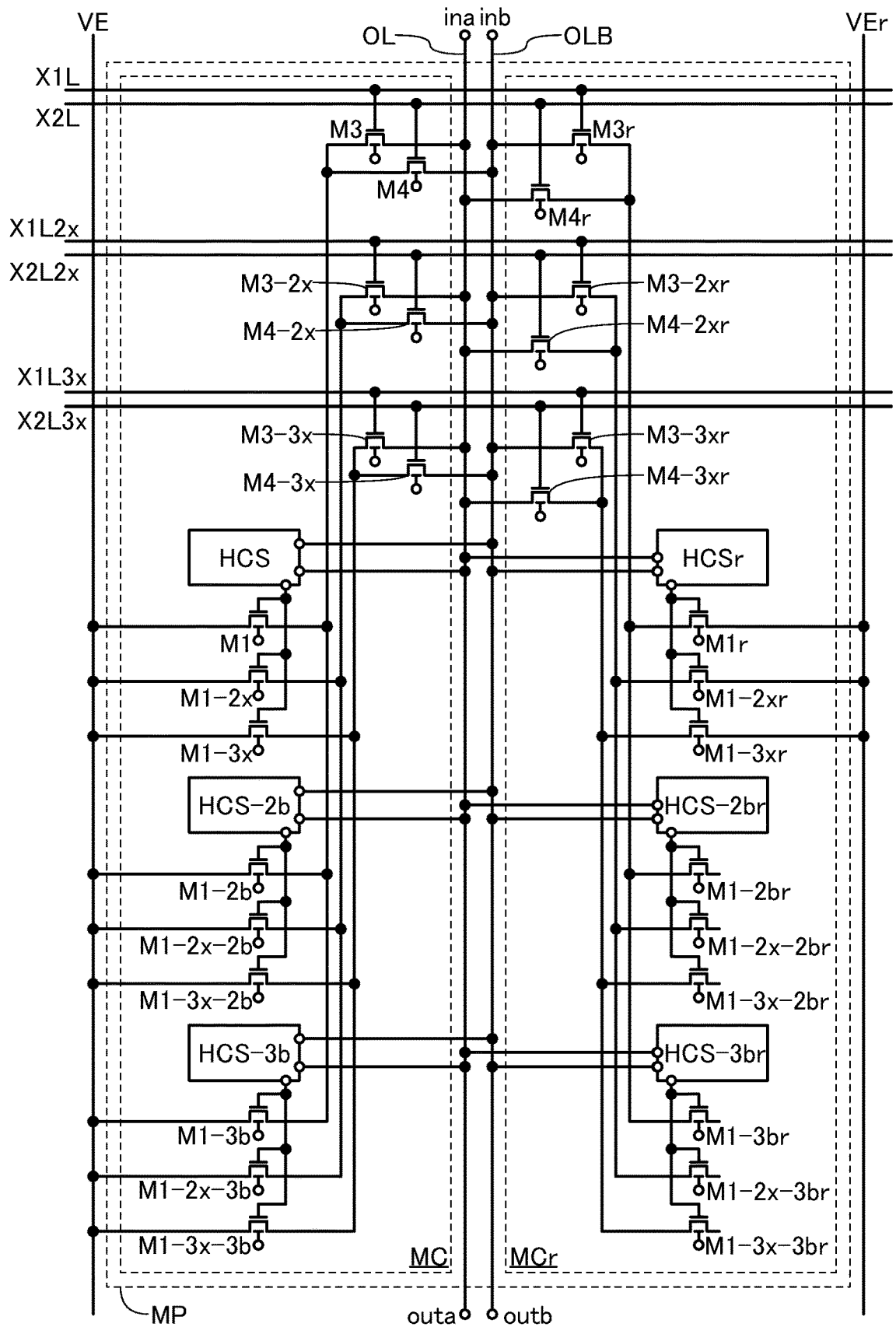
FIG. 60 is a circuit diagram showing a configuration example of a circuit included in a semiconductor device.

Described here is an operation method example of the arithmetic circuit 150 in FIG. 11 for which the circuit MP in FIG. 60 is used.

As in Operation method example 1 to Operation method example 7, to avoid complexity of description, a current flowing through the wiring OL and the wiring OLB is changed by only one circuit MP electrically connected to the wiring OL and the wiring OLB. The wiring VE and the wiring VEr electrically connected to the circuit MP each supply VSS as a constant voltage to the circuit MP. The circuit ACTF[1] to the circuit ACTF[n] included in the circuit AFP are each the circuit ACTF having a configuration of an integrator circuit (or a current charge (IQ) converter circuit), for example. A configuration may be employed in which the load LEa and the load LEb in the circuit ACTF[j] in FIG. 6E are each a capacitor or the like, for example.

Although the case where three transistors (e.g., three transistors of the transistor M1, a transistor M1-2x, and a transistor M1-3x) are connected to one holding portion (e.g., the circuit HCS) is described as an example, one embodiment of the present invention is not limited thereto. A given number of transistors may be provided for each holding portion. Similarly, although the transistor M3, the transistor M3-2x, and a transistor M3-3x are described as the case of three transistors (e.g., the transistor M3, the transistor M3-2x, and the transistor M3-3x, or the transistor M4, the transistor M4-2x, and a transistor M4-3x), one embodiment of the present invention is not limited thereto, and a given number of transistors may be provided. In addition, although the case of three holding portions (e.g., the circuit HCS, the circuit HCS-2b, and the circuit HCS-3b) is described, one embodiment of the present invention is not limited thereto. A given number of holding portions may be provided.

In the circuit MP in FIG. 60, the circuit MC includes the transistor M1, the transistor M1-2x, the transistor M1-3x, the transistor M1-2b, a transistor M1-2x-2b, a transistor M1-3x-2b, the transistor M1-3b, a transistor M1-2x-3b, a transistor M1-3x-2b, the transistor M3, the transistor M3-2x, the transistor M3-3x, the transistor M4, the transistor M4-2x, the transistor M4-3x, the circuit HCS, the circuit HCS-2b, and the circuit HCS-3b.

Note that the sizes, e.g., the W lengths and the L lengths, of the transistor M1, the transistor M1-2x, and the transistor M1-3x are preferably equal to each other. In addition, the sizes of the transistor M1-2b, the transistor M1-2x-2b, and the transistor M1-3x-2b are preferably equal to each other. Furthermore, the sizes of the transistor M1-3b, the transistor M1-2x-3b, and the transistor M1-3x-3b are preferably equal to each other.

Furthermore, when the ratios of the W lengths to the L lengths of the transistor M1, the transistor M1-2x, and the transistor M1-3x are each W/L, the ratios of the W lengths to the L lengths of the transistor M1-2b, the transistor M1-2x-2b, and the transistor M1-3x-2b are each preferably 2 W/L and the ratios of the W lengths to the L lengths of the transistor M1-3b, the transistor M1-2x-3b, and the transistor M1-3x-3b are each preferably 4 W/L. That is, the ratios W/L of the W lengths to the L lengths of the transistors (e.g., the transistor M1, the transistor M1-2b, and the transistor M1-3b) whose gates are electrically connected to the holding portions (e.g., the circuit HCS, the circuit HCS-2b, and the circuit HCS-3b) can be increased to be a power of two in accordance with the number of the holding portions.

Like the circuit HCS included in the circuit MP in FIG. 29, the circuit HCS, the circuit HCS-2b, and the circuit HCS-3b each have a function of receiving information (a potential, a current, or the like) input from one or both of the wiring OL and the wiring OLB and holding a potential corresponding to the information. In addition, the circuit HCS has a function of applying the held potential to the gate of the transistor which is electrically connected to the circuit HCS. The circuit HCS, the circuit HCS-2b, and the circuit HCS-3b can each have a configuration including an SRAM or a configuration including a NOSRAM, for example. The circuit HCS, the circuit HCS-2b, and the circuit HCS-3b included in the circuit MP in FIG. 60 each hold one of a high-level potential (for example, VDDL here) and a low-level potential (for example, VSS here) as a digital value (a binary value).

Note that the gates of the transistor M1-2b, the transistor M1-2x-2b, and the transistor M1-3x-2b are each electrically connected to the circuit HCS-2b. The gates of the transistor M1-3b, the transistor M1-2x-3b, and the transistor M1-3x-2b are each electrically connected to the circuit HCS-3b.

When VDDL held in the circuit HCS is input to the gates of the transistor M1, the transistor M1-2x, and the transistor M1-3x, the amount of current flowing between the sources and the drains of the transistor M1, the transistor M1-2x, and the transistor M1-3x is $I_{ut}$. Since the ratios of the W lengths to the L lengths of the transistor M1-2b, the transistor M1-2x-2b, and the transistor M1-3x-2b are each twice as high as the ratio of the W length to the L length of the transistor M1, the amount of current flowing between the sources and the drains of the transistor M1-2b, the transistor M1-2x-2b, and the transistor M1-3x-2b is $2I_{ut}$ when VDD held in the circuit HCS-2b is input to the gates of the transistor M1-2b, the transistor M1-2x-2b, and the transistor M1-3x-2b. Since the ratios of the W lengths to the L lengths of the transistor M1-3b, the transistor M1-2x-3b, and the transistor M1-3x-3b are each four times as high as the ratio of the W length to the L length of the transistor M1, the amount of current flowing between the sources and the drains of the transistor M1-3b, the transistor M1-2x-3b, and the transistor M1-3x-3b is $4I_{ut}$ when VDD held in the circuit HCS-3b is input to the gates of the transistor M1-3b, the transistor M1-2x-3b, and the transistor M1-3x-3b.

The first terminals of the transistor M1, the transistor M1-2x, the transistor M1-3x, the transistor M1-2b, the transistor M1-2x-2b, the transistor M1-3x-2b, the transistor M1-3b, the transistor M1-2x-3b, and the transistor M1-3x-2b are electrically connected to the wiring VE. The gates of the transistor M1, the transistor M1-2x, and the transistor M1-3x are electrically connected to the circuit HCS.

The second terminals of the transistor M1, the transistor M1-2b, and the transistor M1-3b are each electrically connected to the first terminal of the transistor M3 and the first terminal of the transistor M4. The second terminals of the transistor M1-2x, the transistor M1-2x-2b, and the transistor M1-2x-3b are each electrically connected to the first terminal of the transistor M3-2x and the first terminal of the transistor M4-2x. The second terminals of the transistor M1-3x, the transistor M1-3x-2b, and the transistor M1-3x-3b are each electrically connected to a first terminal of the transistor M3-3x and a first terminal of the transistor M4-3x.

The gate of the transistor M3 is electrically connected to the wiring X1L and the gate of the transistor M4 is electrically connected to the wiring X2L. The gate of the transistor M3-2x is electrically connected to the wiring X1L2x and the gate of the transistor M4-2x is electrically connected to the wiring X2L2x. The gate of the transistor M3-3x is electrically connected to the wiring X1L3x and the gate of the transistor M4-3x is electrically connected to the wiring X2L3x.

The second terminals of the transistor M3, the transistor M3-2x, and the transistor M3-3x are each electrically connected to the wiring OL, and the second terminals of the transistor M4, the transistor M4-2x, and the transistor M4-3x are each electrically connected to the wiring OLB.

Note that in the circuit MP in FIG. 60, the circuit MCr has substantially the same circuit configuration as the circuit MC. Thus, "r" is added to the reference signs of the circuit elements and the like included in the circuit MCr to differentiate them from the circuit elements and the like included in the circuit MC. In addition, the second terminals of the transistor M3r, the transistor M3-2xr, and the transistor M3-3xr are electrically connected to the wiring OLB, and the second terminals of the transistor M4, the transistor M4-2x, and the transistor M4-3x are electrically connected to the wiring OL.

The first data (for example, a weight coefficient here) set in the circuit MP in FIG. 60 is described. The first data (a weight coefficient) set in the circuit MP in FIG. 60 can be defined by a combination of potentials held in the circuits HCS and HCS-2*b*, the circuit HCS-3*b*, the circuit HCSr, the circuit HCS-2*br*, and the circuit HCS-3*br*. Specifically, as in the circuit MP in FIG. 57 described in Operation method example 6, the first data (a weight coefficient) can be set by holding a predetermined potential in each of the circuit HCS, the circuit HCS-2*b*, the circuit HCS-3*b*, the circuit HCSr, the circuit HCS-2*br*, and the circuit HCS-3*br*. Thus, the first data (a weight coefficient) in the circuit MP in FIG. 60 can be defined, for example, in a manner similar to that of the first data (a weight coefficient) in the circuit MP in FIG. 57 described in Operation method example 6.

Next, the second data (for example, a value of a signal of a neuron here) input to the circuit MP is described. Assume that, in inputting the second data (a value of a signal of a neuron) to the circuit MP, the input time of a high-level potential to one of the wiring X1L and the wiring X2L is $t_{ut}$, the input time of a high-level potential to one of the wiring X1L2*x* and the wiring X2L2*x* is $2t_{ut}$, and the input time of a high-level potential to one of the wiring X1L3*x* and the wiring X2L3*x* is $4t_{ut}$ in the operation. That is, the operation is performed such that the time during which the transistor M3 and the transistor M3*r* are in an on state or the transistor M4 and the transistor M4*r* are in an on state is $t_{ut}$, the time during which the transistor M3-2*x* and the transistor M3-2*xr* are in an on state or the transistor M4-2*b* and the transistor M4-2*br* are in an on state is $2t_{ut}$, and the time during which the transistor M3-3*x* and the transistor M3-3*xr* are in an on state or the transistor M4-3*x* and the transistor M4-3*xr* are in an on state is $4t_{ut}$.

As described in Operation method example 1 and Operation method example 2, the amount of charge flowing from the wiring OL or the wiring OLB to the wiring VE through the transistors M1 and M1-2*b* and the transistor M1-3*b* is determined by setting the first data (for example, a weight coefficient here) in the circuit MP and setting the time during which the transistor M3 or the transistor M4 is in an on state. In addition, the amount of charge flowing from the wiring OL or the wiring OLB to the wiring VEr through the transistor M1*r*, the transistor M1-2*br*, and the transistor M1-3*br* is determined by setting the first data (a weight coefficient) in the circuit MP and setting the time during which the transistor M3*r* or the transistor M4*r* is in an on state.

Similarly, the amount of charge flowing from the wiring OL or the wiring OLB to the wiring VE through the transistors M1-2*x*, M1-2*x*-2*b*, and M1-2*x*-3*b* and the amount of charge flowing from the wiring OL or the wiring OLB to the wiring VEr through the transistor M1-2*xr*, the transistor M1-2*x*-2*br*, and the transistor M1-2*x*-3*br* are also determined by setting the times during which the transistor M3-2*b*, the transistor M3-2*br*, the transistor M4-2*b*, and the transistor M4-2*br* are in an on state. In addition, the amount of charge flowing from the wiring OL or the wiring OLB to the wiring VE through the transistor M1-3*x*, the transistor M1-3*x*-2*b*, and the transistor M1-3*x*-3*b* and the amount of charge flowing from the wiring OL or the wiring OLB to the wiring VEr through the transistor M1-3*xr*, the transistor M1-3*x*-2*br*, and the transistor M1-3*x*-3*br* are also determined by setting the times during which the transistor M3-3*b*, the transistor M3-3*br*, the transistor M4-3*b*, and the transistor M4-3*br* are in an on state.

Thus, the second data (a value of a signal of a neuron) in the circuit MP in FIG. 60 can be defined, for example, in a manner similar to that of the second data (a value of a signal of a neuron) in the circuit MP in FIG. 50 described in Operation method example 3.

When the first data (a weight coefficient) and the second data (a value of a signal of a neuron) are determined as described above, the product of the first data (a weight coefficient) and the second data (a value of a signal of a neuron) can be expressed by the charge amount of a current flowing from the wiring OL to the circuit MC or the circuit MCr and the charge amount of a current flowing from the wiring OLB to the circuit MC or the circuit MCr.

Next, a specific operation example of the circuit MP in FIG. 60 is described.

The first data (a weight coefficient) of "+7" is set in the circuit MP in advance. At this time, the current of $I_{ut}$ flows between the sources and the drains of the transistor M1, the transistor M1-2*x*, and the transistor M1-3*x*, the current of $2I_{ut}$ flows between the sources and the drains of the transistor M1-2*b*, the transistor M1-2*x*-2*b*, and the transistor M1-3*x*-2*b*, and the current of $4I_{ut}$ flows between the sources and the drains of the transistor M1-3*b*, the transistor M1-2*x*-3*b*, and the transistor M1-3*x*-3*b*. Meanwhile, the amount of current flowing between the sources and the drains of the transistor M1*r*, the transistor M1-2*xr*, the transistor M1-3*xr*, the transistor M1-2*br*, the transistor M1-2*x*-2*br*, the transistor M1-3*x*-2*br*, the transistor M1-3*br*, the transistor M1-2*x*-3*br*, and the transistor M1-3*x*-3*br* is 0.

In the case where "+7" is input to the circuit MP as the second data (a value of a signal of a neuron), the transistor M3 is in an on state only for the time $t_{ut}$ and the transistor M4 is in an off state, so that the amount of charge flowing from the wiring OL to the wiring VE through the transistor M1, the transistor M1-2*b*, and the transistor M1-3*b* is $t_{ut} \times I_{ut} + t_{ut} \times 2I_{ut} + t_{ut} \times 4I_{ut} = 7t_{ut} \times I_{ut}$. Note that $t_{ut} \times I_{ut} = Q_{ut}$ is satisfied here. In addition, the transistor M3-2*x* is in an on state only for the time $2t_{ut}$ and the transistor M4-2*x* is in an off state, so that the amount of charge flowing from the wiring OL to the wiring VE through the transistor M1-2*x*, the transistor M1-2*x*-2*b*, and the transistor M1-2*x*-3*b* is $2t_{ut} \times I_{ut} + 2t_{ut} \times 2I_{ut} + 2t_{ut} \times 4I_{ut} = 14t_{ut} \times I_{ut}$. In addition, the transistor M3-3*x* is in an on state only for the time $4t_{ut}$ and the transistor M4-3*x* is in an off state, so that the amount of charge flowing from the wiring OL to the wiring VE through the transistor M1-3*x*, the transistor M1-3*x*-2*b*, and the transistor M1-3*x*-3*b* is $4t_{ut} \times I_{ut} + 4t_{ut} \times 2I_{ut} + 4t_{ut} \times 4I_{ut} = 28t_{ut} \times I_{ut}$. Thus, the amount of charge flowing from the wiring OL to the wiring VE through the circuit MC is $7Q_{ut} + 14Q_{ut} + 28Q_{ut} = 49Q_{ut}$. Meanwhile, the amount of charge flowing from the wiring OLB to the wiring VEr through the circuit MCr is 0 because the transistor M1*r*, the transistor M1-2*xr*, the transistor M1-3*xr*, the transistor M1-2*br*, the transistor M1-2*x*-2*br*, the transistor M1-3*x*-2*br*, the transistor M1-3*br*, the transistor M1-2*x*-3*br*, and the transistor M1-3*x*-3*br* are each in an off state.

In the case where "−7" is input to the circuit MP as the second data (a value of a signal of a neuron), a conduction state is established between the wiring OLB and the circuit MC and between the wiring OL and the circuit MCr, and a non-conduction state is established between the wiring OL and the circuit MCr and between the wiring OL and the circuit MC, so that the amount of charge flowing from the wiring OLB to the wiring VE through the circuit MC is $7Q_{ut} + 14Q_{ut} + 28Q_{ut} = 49Q_{ut}$ and the amount of charge flowing from the wiring OL to the wiring VEr through the circuit MCr is 0.

Here, the first data (a weight coefficient) of "−7" is set in the circuit MP in advance, for example. At this time, the current of $I_{ut}$ flows between the sources and the drains of the transistor M1r, the transistor M1-2xr, and the transistor M1-3xr; the current of $2I_{ut}$ flows between the sources and the drains of the transistor M1-2br, the transistor M1-2x-2br, and the transistor M1-3x-2br; and the current of $4I_{ut}$ flows between the sources and the drains of the transistor M1-3br, the transistor M1-2x-3br, and the transistor M1-3x-3br. Meanwhile, the amount of current flowing between the sources and the drains of the transistor M1, the transistor M1-2x, the transistor M1-3x, the transistor M1-2b, the transistor M1-2x-2b, the transistor M1-3x-2b, the transistor M1-3b, the transistor M1-2x-3b, and the transistor M1-3x-3b is 0.

In the case where "+7" is input to the circuit MP as the second data (a value of a signal of a neuron), the transistor M3r is in an on state only for the time $t_{ut}$ and the transistor M4r is in an off state, so that the amount of charge flowing from the wiring OLB to the wiring VEr through the transistor M1r, the transistor M1-2br, and the transistor M1-3br is $t_{ut} \times I_{ut} + t_{ut} \times 2I_{ut} + t_{ut} \times 4I_{ut} = 7t_{ut} \times I_{ut}$. Note that $t_{ut} \times I_{ut} = Q_{ut}$ is satisfied here. In addition, the transistor M3-2xr is in an on state only for the time $2t_{ut}$ and the transistor M4-2xr is in an off state, so that the amount of charge flowing from the wiring OL to the wiring VEr through the transistor M1-2xr, the transistor M1-2x-2br, and the transistor M1-2x-3br is $2t_{ut} \times I_{ut} + 2t_{ut} \times 2I_{ut} + 2t_{ut} \times 4I_{ut} = 14t_{ut} \times I_{ut}$. In addition, the transistor M3-3xr is in an on state only for the time $4t_{ut}$ and the transistor M4-3xr is in an off state, so that the amount of charge flowing from the wiring OLB to the wiring VEr through the transistor M1-3xr, the transistor M1-3x-2br, and the transistor M1-3x-3br is $4t_{ut} \times I_{ut} + 4t_{ut} \times 2I_{ut} + 4t_{ut} \times 4I_{ut} = 28t_{ut} \times I_{ut}$. Thus, the amount of charge flowing from the wiring OLB to the wiring VEr through the circuit MCr is $7Q_{ut} + 14Q_{ut} + 28Q_{ut} = 49Q_{ut}$. Meanwhile, the amount of charge flowing from the wiring OL to the wiring VE through the circuit MC is 0 because the transistor M1, the transistor M1-2x, the transistor M1-3x, the transistor M1-2b, the transistor M1-2x-2b, the transistor M1-3x-2b, the transistor M1-3b, the transistor M1-2x-3b, and the transistor M1-3x-3b are each in an off state.

In the case where "−7" is input to the circuit MP as the second data (a value of a signal of a neuron), a conduction state is established between the wiring OLB and the circuit MC and between the wiring OL and the circuit MCr, and a non-conduction state is established between the wiring OL and the circuit MCr and between the wiring OL and the circuit MC, so that the amount of charge flowing from the wiring OLB to the wiring VE through the circuit MC is $7Q_{ut} + 14Q_{ut} + 28Q_{ut} = 49Q_{ut}$ and the amount of charge flowing from the wiring OL to the wiring VEr through the circuit MCr is 0.

Thus, by setting the positive first data (a weight coefficient) of any one of seven levels "+1" to "+7" in the circuit MP and selecting one or more transistors to be brought into an on state from the transistor M3, the transistor M3-2x, and the transistor M3-3x included in the circuit MP in accordance with the positive second data (a value of a signal of a neuron), the amount of charge flowing from the wiring OL to the wiring VE through the circuit MC can be any one of "$Q_{ut}$" to "$49Q_{ut}$" in steps of $Q_{ut}$. Note that the amount of charge flowing from the wiring OLB to the wiring VEr through the circuit MCr is 0 at this time. In addition, by setting the positive first data (a weight coefficient) of any one of seven levels "−7" to "−1" in the circuit MP and selecting one or more transistors to be brought into an on state from the transistor M3r, the transistor M3-2xr, and the transistor M3-3xr included in the circuit MP in accordance with the positive second data (a value of a signal of a neuron), the amount of charge flowing from the wiring OLB to the wiring VEr through the circuit MCr can be any one of "$Q_{ut}$" to "$49Q_{ut}$" in steps of $Q_{ut}$. Note that the amount of charge flowing from the wiring OL to the wiring VE through the circuit MC is 0 at this time.

In addition, by setting the positive first data (a weight coefficient) of any one of seven levels "+1" to "+7" in the circuit MP and selecting one or more transistors to be brought into an on state from the transistor M4, the transistor M4-2x, and the transistor M4-3x included in the circuit MP in accordance with the negative second data (a value of a signal of a neuron), the amount of charge flowing from the wiring OLB to the wiring VE through the circuit MC can be any one of "$Q_{ut}$" to "$49Q_{ut}$" in steps of $Q_{ut}$. Note that the amount of charge flowing from the wiring OL to the wiring VEr through the circuit MCr is 0 at this time. In addition, by setting the positive first data (a weight coefficient) of any one of seven levels "−7" to "−1" in the circuit MP and selecting one or more transistors to be brought into an on state from the transistor M4r, the transistor M4-2xr, and the transistor M4-3xr included in the circuit MP in accordance with the negative second data (a value of a signal of a neuron), the amount of charge flowing from the wiring OL to the wiring VEr through the circuit MCr can be any one of "$Q_{ut}$" to "$49Q_{ut}$" in steps of $Q_{ut}$. Note that the amount of charge flowing from the wiring OLB to the wiring VE through the circuit MC is 0 at this time.

In the case where the first data (a weight coefficient) of "0" is set in the circuit MP in advance, the transistor M1, the transistor M1-2x, the transistor M1-3x, the transistor M1-2b, the transistor M1-2x-2b, the transistor M1-3x-2b, the transistor M1-3b, the transistor M1-2x-3b, the transistor M1-3x-3b, the transistor M1r, the transistor M1-2xr, the transistor M1-3xr, the transistor M1-2br, the transistor M1-2x-2br, the transistor M1-3x-2br, the transistor M1-3br, the transistor M1-2x-3br, and the transistor M1-3x-3br are each in an off state. Thus, a current does not flow from the wiring OL or the wiring OLB to the wiring VE through the circuit MC, and a current does not flow from the wiring OL or the wiring OLB to the wiring VEr through the circuit MCr. In other words, the amount of charge flowing through the wiring OL and the wiring OLB is 0.

In the case where the second data (a value of a signal of a neuron) of "0" is input to the circuit MP, the transistor M3, the transistor M3-2x, the transistor M3-3x, the transistor M4, the transistor M4-2x, the transistor M4-3x, the transistor M3r, the transistor M3-2xr, the transistor M3-3xr, the transistor M4r, the transistor M4-2xr, and the transistor M4-3xr are each in an off state. Thus, a current does not flow from the wiring OL or the wiring OLB to the wiring VE through the circuit MC, and a current does not flow from the wiring OL or the wiring OLB to the wiring VEr through the circuit MCr. In other words, the amount of charge flowing through the wiring OL and the wiring OLB is 0.

Here, the integrator circuit of the circuit ACTF is focused on. When a current flows from the wiring OL or the wiring OLB to the wiring VE through the circuit MC or when a current flows from the wiring OL or the wiring OLB to the wiring VEr through the circuit MCr, the switch SWO and the switch SWOB are brought into an on state and the switch SWI, the switch SWIB, the switch SWL, the switch SWLB, the switch SWH, and the switch SWHB are brought into an off state so that a conduction state is established between the circuit AFP and the wirings OL and OLB in FIG. 8A, whereby the amount of charge flowing through the wiring OL and the wiring OLB can be accumulated in the capacitor of the integrator circuit included in the circuit ACTF. As a result, the circuit ACTF can output the signal $z_j^{(k)}$ of a neuron, which corresponds to the charge amount $Q_{OL}$ supplied through the wiring OL and the charge amount $Q_{OLB}$ supplied through the wiring OLB.

The following table shows the charge amount $Q_{OL}$ supplied through the wiring OL and the charge amount $Q_{OLB}$ supplied through the wiring OLB in the case of the above operation example where the first data (a weight coefficient) is any one of "−7" to "+7" except for "0" and the second data (a value of a signal of a neuron) is any one of "−7" to "+7" except for "0". When at least one of the first data (a weight coefficient) and the second data (a value of a signal of a neuron) is "0", $Q_{OL}=0$ and $Q_{OLB}=0$ are satisfied.

TABLE 16

| | | Value of signal of neuron | | | | | | |
|---|---|---|---|---|---|---|---|---|
| | | +1 | +2 | +3 | +4 | +5 | +6 | +7 |
| Weight coefficient | +1 | $Q_{OL}=Q_{ut}$, $Q_{OLB}=0$ | $Q_{OL}=2Q_{ut}$, $Q_{OLB}=0$ | $Q_{OL}=3Q_{ut}$, $Q_{OLB}=0$ | $Q_{OL}=4Q_{ut}$, $Q_{OLB}=0$ | $Q_{OL}=5Q_{ut}$, $Q_{OLB}=0$ | $Q_{OL}=6Q_{ut}$, $Q_{OLB}=0$ | $Q_{OL}=7Q_{ut}$, $Q_{OLB}=0$ |
| | +2 | $Q_{OL}=2Q_{ut}$, $Q_{OLB}=0$ | $Q_{OL}=4Q_{ut}$, $Q_{OLB}=0$ | $Q_{OL}=6Q_{ut}$, $Q_{OLB}=0$ | $Q_{OL}=8Q_{ut}$, $Q_{OLB}=0$ | $Q_{OL}=10Q_{ut}$, $Q_{OLB}=0$ | $Q_{OL}=12Q_{ut}$, $Q_{OLB}=0$ | $Q_{OL}=14Q_{ut}$, $Q_{OLB}=0$ |
| | +3 | $Q_{OL}=3Q_{ut}$, $Q_{OLB}=0$ | $Q_{OL}=6Q_{ut}$, $Q_{OLB}=0$ | $Q_{OL}=9Q_{ut}$, $Q_{OLB}=0$ | $Q_{OL}=12Q_{ut}$, $Q_{OLB}=0$ | $Q_{OL}=15Q_{ut}$, $Q_{OLB}=0$ | $Q_{OL}=18Q_{ut}$, $Q_{OLB}=0$ | $Q_{OL}=21Q_{ut}$, $Q_{OLB}=0$ |
| | +4 | $Q_{OL}=4Q_{ut}$, $Q_{OLB}=0$ | $Q_{OL}=8Q_{ut}$, $Q_{OLB}=0$ | $Q_{OL}=12Q_{ut}$, $Q_{OLB}=0$ | $Q_{OL}=16Q_{ut}$, $Q_{OLB}=0$ | $Q_{OL}=20Q_{ut}$, $Q_{OLB}=0$ | $Q_{OL}=24Q_{ut}$, $Q_{OLB}=0$ | $Q_{OL}=28Q_{ut}$, $Q_{OLB}=0$ |
| | +5 | $Q_{OL}=5Q_{ut}$, $Q_{OLB}=0$ | $Q_{OL}=10Q_{ut}$, $Q_{OLB}=0$ | $Q_{OL}=15Q_{ut}$, $Q_{OLB}=0$ | $Q_{OL}=20Q_{ut}$, $Q_{OLB}=0$ | $Q_{OL}=25Q_{ut}$, $Q_{OLB}=0$ | $Q_{OL}=30Q_{ut}$, $Q_{OLB}=0$ | $Q_{OL}=35Q_{ut}$, $Q_{OLB}=0$ |
| | +6 | $Q_{OL}=6Q_{ut}$, $Q_{OLB}=0$ | $Q_{OL}=12Q_{ut}$, $Q_{OLB}=0$ | $Q_{OL}=18Q_{ut}$, $Q_{OLB}=0$ | $Q_{OL}=24Q_{ut}$, $Q_{OLB}=0$ | $Q_{OL}=30Q_{ut}$, $Q_{OLB}=0$ | $Q_{OL}=36Q_{ut}$, $Q_{OLB}=0$ | $Q_{OL}=42Q_{ut}$, $Q_{OLB}=0$ |
| | +7 | $Q_{OL}=7Q_{ut}$, $Q_{OLB}=0$ | $Q_{OL}=14Q_{ut}$, $Q_{OLB}=0$ | $Q_{OL}=21Q_{ut}$, $Q_{OLB}=0$ | $Q_{OL}=28Q_{ut}$, $Q_{OLB}=0$ | $Q_{OL}=35Q_{ut}$, $Q_{OLB}=0$ | $Q_{OL}=42Q_{ut}$, $Q_{OLB}=0$ | $Q_{OL}=49Q_{ut}$, $Q_{OLB}=0$ |

TABLE 17

| | | Value of signal neuron | | | | | | |
|---|---|---|---|---|---|---|---|---|
| | | −7 | −6 | −5 | −4 | −3 | −2 | −1 |
| Weight coefficient | +1 | $Q_{OL}=0$, $Q_{OLB}=7Q_{ut}$ | $Q_{OL}=0$, $Q_{OLB}=6Q_{ut}$ | $Q_{OL}=0$, $Q_{OLB}=5Q_{ut}$ | $Q_{OL}=0$, $Q_{OLB}=4Q_{ut}$ | $Q_{OL}=0$, $Q_{OLB}=3Q_{ut}$ | $Q_{OL}=0$, $Q_{OLB}=2Q_{ut}$ | $Q_{OL}=0$, $Q_{OLB}=Q_{ut}$ |
| | +2 | $Q_{OL}=0$, $Q_{OLB}=14Q_{ut}$ | $Q_{OL}=0$, $Q_{OLB}=12Q_{ut}$ | $Q_{OL}=0$, $Q_{OLB}=10Q_{ut}$ | $Q_{OL}=0$, $Q_{OLB}=8Q_{ut}$ | $Q_{OL}=0$, $Q_{OLB}=6Q_{ut}$ | $Q_{OL}=0$, $Q_{OLB}=4Q_{ut}$ | $Q_{OL}=0$, $Q_{OLB}=2Q_{ut}$ |
| | +3 | $Q_{OL}=0$, $Q_{OLB}=21Q_{ut}$ | $Q_{OL}=0$, $Q_{OLB}=18Q_{ut}$ | $Q_{OL}=0$, $Q_{OLB}=15Q_{ut}$ | $Q_{OL}=0$, $Q_{OLB}=12Q_{ut}$ | $Q_{OL}=0$, $Q_{OLB}=9Q_{ut}$ | $Q_{OL}=0$, $Q_{OLB}=6Q_{ut}$ | $Q_{OL}=0$, $Q_{OLB}=3Q_{ut}$ |
| | +4 | $Q_{OL}=0$, $Q_{OLB}=28Q_{ut}$ | $Q_{OL}=0$, $Q_{OLB}=24Q_{ut}$ | $Q_{OL}=0$, $Q_{OLB}=20Q_{ut}$ | $Q_{OL}=0$, $Q_{OLB}=16Q_{ut}$ | $Q_{OL}=0$, $Q_{OLB}=12Q_{ut}$ | $Q_{OL}=0$, $Q_{OLB}=8Q_{ut}$ | $Q_{OL}=0$, $Q_{OLB}=4Q_{ut}$ |
| | +5 | $Q_{OL}=0$, $Q_{OLB}=35Q_{ut}$ | $Q_{OL}=0$, $Q_{OLB}=30Q_{ut}$ | $Q_{OL}=0$, $Q_{OLB}=25Q_{ut}$ | $Q_{OL}=0$, $Q_{OLB}=20Q_{ut}$ | $Q_{OL}=0$, $Q_{OLB}=15Q_{ut}$ | $Q_{OL}=0$, $Q_{OLB}=10Q_{ut}$ | $Q_{OL}=0$, $Q_{OLB}=5Q_{ut}$ |
| | +6 | $Q_{OL}=0$, $Q_{OLB}=42Q_{ut}$ | $Q_{OL}=0$, $Q_{OLB}=36Q_{ut}$ | $Q_{OL}=0$, $Q_{OLB}=30Q_{ut}$ | $Q_{OL}=0$, $Q_{OLB}=24Q_{ut}$ | $Q_{OL}=0$, $Q_{OLB}=18Q_{ut}$ | $Q_{OL}=0$, $Q_{OLB}=12Q_{ut}$ | $Q_{OL}=0$, $Q_{OLB}=6Q_{ut}$ |
| | +7 | $Q_{OL}=0$, $Q_{OLB}=49Q_{ut}$ | $Q_{OL}=0$, $Q_{OLB}=42Q_{ut}$ | $Q_{OL}=0$, $Q_{OLB}=35Q_{ut}$ | $Q_{OL}=0$, $Q_{OLB}=28Q_{ut}$ | $Q_{OL}=0$, $Q_{OLB}=21Q_{ut}$ | $Q_{OL}=0$, $Q_{OLB}=14Q_{ut}$ | $Q_{OL}=0$, $Q_{OLB}=7Q_{ut}$ |

TABLE 18

| | | Value of signal neuron | | | | | | |
|---|---|---|---|---|---|---|---|---|
| | | +1 | +2 | +3 | +4 | +5 | +6 | +7 |
| Weight coefficient | −7 | $Q_{OL}=0$, $Q_{OLB}=7Q_{ut}$ | $Q_{OL}=0$, $Q_{OLB}=14Q_{ut}$ | $Q_{OL}=0$, $Q_{OLB}=21Q_{ut}$ | $Q_{OL}=0$, $Q_{OLB}=28Q_{ut}$ | $Q_{OL}=0$, $Q_{OLB}=35Q_{ut}$ | $Q_{OL}=0$, $Q_{OLB}=42Q_{ut}$ | $Q_{OL}=0$, $Q_{OLB}=49Q_{ut}$ |
| | −6 | $Q_{OL}=0$, $Q_{OLB}=6Q_{ut}$ | $Q_{OL}=0$, $Q_{OLB}=12Q_{ut}$ | $Q_{OL}=0$, $Q_{OLB}=18Q_{ut}$ | $Q_{OL}=0$, $Q_{OLB}=24Q_{ut}$ | $Q_{OL}=0$, $Q_{OLB}=30Q_{ut}$ | $Q_{OL}=0$, $Q_{OLB}=36Q_{ut}$ | $Q_{OL}=0$, $Q_{OLB}=42Q_{ut}$ |
| | −5 | $Q_{OL}=0$, $Q_{OLB}=5Q_{ut}$ | $Q_{OL}=0$, $Q_{OLB}=10Q_{ut}$ | $Q_{OL}=0$, $Q_{OLB}=15Q_{ut}$ | $Q_{OL}=0$, $Q_{OLB}=20Q_{ut}$ | $Q_{OL}=0$, $Q_{OLB}=25Q_{ut}$ | $Q_{OL}=0$, $Q_{OLB}=30Q_{ut}$ | $Q_{OL}=0$, $Q_{OLB}=35Q_{ut}$ |
| | −4 | $Q_{OL}=0$, $Q_{OLB}=4Q_{ut}$ | $Q_{OL}=0$, $Q_{OLB}=8Q_{ut}$ | $Q_{OL}=0$, $Q_{OLB}=12Q_{ut}$ | $Q_{OL}=0$, $Q_{OLB}=16Q_{ut}$ | $Q_{OL}=0$, $Q_{OLB}=20Q_{ut}$ | $Q_{OL}=0$, $Q_{OLB}=24Q_{ut}$ | $Q_{OL}=0$, $Q_{OLB}=28Q_{ut}$ |
| | −3 | $Q_{OL}=0$, $Q_{OLB}=3Q_{ut}$ | $Q_{OL}=0$, $Q_{OLB}=6Q_{ut}$ | $Q_{OL}=0$, $Q_{OLB}=9Q_{ut}$ | $Q_{OL}=0$, $Q_{OLB}=12Q_{ut}$ | $Q_{OL}=0$, $Q_{OLB}=15Q_{ut}$ | $Q_{OL}=0$, $Q_{OLB}=18Q_{ut}$ | $Q_{OL}=0$, $Q_{OLB}=21Q_{ut}$ |
| | −2 | $Q_{OL}=0$, $Q_{OLB}=2Q_{ut}$ | $Q_{OL}=0$, $Q_{OLB}=4Q_{ut}$ | $Q_{OL}=0$, $Q_{OLB}=6Q_{ut}$ | $Q_{OL}=0$, $Q_{OLB}=8Q_{ut}$ | $Q_{OL}=0$, $Q_{OLB}=10Q_{ut}$ | $Q_{OL}=0$, $Q_{OLB}=12Q_{ut}$ | $Q_{OL}=0$, $Q_{OLB}=14Q_{ut}$ |
| | −1 | $Q_{OL}=0$, $Q_{OLB}=Q_{ut}$ | $Q_{OL}=0$, $Q_{OLB}=2Q_{ut}$ | $Q_{OL}=0$, $Q_{OLB}=3Q_{ut}$ | $Q_{OL}=0$, $Q_{OLB}=4Q_{ut}$ | $Q_{OL}=0$, $Q_{OLB}=5Q_{ut}$ | $Q_{OL}=0$, $Q_{OLB}=6Q_{ut}$ | $Q_{OL}=0$, $Q_{OLB}=7Q_{ut}$ |

TABLE 19

| | | \multicolumn{7}{c|}{Value of signal of neuron} |
|---|---|---|---|---|---|---|---|---|
| | | −7 | −6 | −5 | −4 | −3 | −2 | −1 |
| Weight coefficient | −7 | $Q_{OL} = 49Q_{ut}$, $Q_{OLB} = 0$ | $Q_{OL} = 42Q_{ut}$, $Q_{OLB} = 0$ | $Q_{OL} = 35Q_{ut}$, $Q_{OLB} = 0$ | $Q_{OL} = 28Q_{ut}$, $Q_{OLB} = 0$ | $Q_{OL} = 21Q_{ut}$, $Q_{OLB} = 0$ | $Q_{OL} = 14Q_{ut}$, $Q_{OLB} = 0$ | $Q_{OL} = 7Q_{ut}$, $Q_{OLB} = 0$ |
| | −6 | $Q_{OL} = 42Q_{ut}$, $Q_{OLB} = 0$ | $Q_{OL} = 36Q_{ut}$, $Q_{OLB} = 0$ | $Q_{OL} = 30Q_{ut}$, $Q_{OLB} = 0$ | $Q_{OL} = 24Q_{ut}$, $Q_{OLB} = 0$ | $Q_{OL} = 18Q_{ut}$, $Q_{OLB} = 0$ | $Q_{OL} = 12Q_{ut}$, $Q_{OLB} = 0$ | $Q_{OL} = 6Q_{ut}$, $Q_{OLB} = 0$ |
| | −5 | $Q_{OL} = 35Q_{ut}$, $Q_{OLB} = 0$ | $Q_{OL} = 30Q_{ut}$, $Q_{OLB} = 0$ | $Q_{OL} = 25Q_{ut}$, $Q_{OLB} = 0$ | $Q_{OL} = 20Q_{ut}$, $Q_{OLB} = 0$ | $Q_{OL} = 15Q_{ut}$, $Q_{OLB} = 0$ | $Q_{OL} = 10Q_{ut}$, $Q_{OLB} = 0$ | $Q_{OL} = 5Q_{ut}$, $Q_{OLB} = 0$ |
| | −4 | $Q_{OL} = 28Q_{ut}$, $Q_{OLB} = 0$ | $Q_{OL} = 24Q_{ut}$, $Q_{OLB} = 0$ | $Q_{OL} = 20Q_{ut}$, $Q_{OLB} = 0$ | $Q_{OL} = 16Q_{ut}$, $Q_{OLB} = 0$ | $Q_{OL} = 12Q_{ut}$, $Q_{OLB} = 0$ | $Q_{OL} = 8Q_{ut}$, $Q_{OLB} = 0$ | $Q_{OL} = 4Q_{ut}$, $Q_{OLB} = 0$ |
| | −3 | $Q_{OL} = 21Q_{ut}$, $Q_{OLB} = 0$ | $Q_{OL} = 18Q_{ut}$, $Q_{OLB} = 0$ | $Q_{OL} = 15Q_{ut}$, $Q_{OLB} = 0$ | $Q_{OL} = 12Q_{ut}$, $Q_{OLB} = 0$ | $Q_{OL} = 9Q_{ut}$, $Q_{OLB} = 0$ | $Q_{OL} = 6Q_{ut}$, $Q_{OLB} = 0$ | $Q_{OL} = 3Q_{ut}$, $Q_{OLB} = 0$ |
| | −2 | $Q_{OL} = 14Q_{ut}$, $Q_{OLB} = 0$ | $Q_{OL} = 12Q_{ut}$, $Q_{OLB} = 0$ | $Q_{OL} = 10Q_{ut}$, $Q_{OLB} = 0$ | $Q_{OL} = 8Q_{ut}$, $Q_{OLB} = 0$ | $Q_{OL} = 6Q_{ut}$, $Q_{OLB} = 0$ | $Q_{OL} = 4Q_{ut}$, $Q_{OLB} = 0$ | $Q_{OL} = 2Q_{ut}$, $Q_{OLB} = 0$ |
| | −1 | $Q_{OL} = 7Q_{ut}$, $Q_{OLB} = 0$ | $Q_{OL} = 6Q_{ut}$, $Q_{OLB} = 0$ | $Q_{OL} = 5Q_{ut}$, $Q_{OLB} = 0$ | $Q_{OL} = 4Q_{ut}$, $Q_{OLB} = 0$ | $Q_{OL} = 3Q_{ut}$, $Q_{OLB} = 0$ | $Q_{OL} = 2Q_{ut}$, $Q_{OLB} = 0$ | $Q_{OL} = Q_{ut}$, $Q_{OLB} = 0$ |

By setting the first data (a weight coefficient) and the second data (a value of a signal of a neuron) as described above, the charge amount $Q_{OL}$ of a current flowing from the wiring OL to the circuit MC or the circuit MCr and the charge amount $Q_{OLB}$ of a current flowing from the wiring OLB to the circuit MC or the circuit MCr are determined in accordance with the result of the product of the first data (a weight coefficient) and the second data (a value of a signal of a neuron). In the case where the result of the product of the first data (a weight coefficient) and the second data (a value of a signal of a neuron) is a positive value, a current flows from the wiring OL to the circuit MC or the circuit MCr, and in the case where the result of the product of the first data (a weight coefficient) and the second data (a value of a signal of a neuron) is a negative value, a current flows from the wiring OLB to the circuit MC or the circuit MCr. That is, the product of the first data (a weight coefficient) and the second data (a value of a signal of a neuron) can be calculated from the charge amount $Q_{OL}$ and the charge amount $Q_{OLB}$. For example, in the case where the first data (a weight coefficient) is any one of "−7" to "+7", the second data (a value of a signal of a neuron) is any one of "−7" to "+7", and the product of the first data (a weight coefficient) and the second data (a value of a signal of a neuron) is a positive number, the product of the first data (a weight coefficient) and the second data (a value of a signal of a neuron) can be calculated from the charge amount $Q_{OL}$ by replacing $Q_{ut}$ with "+1" in the charge amount $Q_{OL}$ of a current flowing from the wiring OL to the circuit MC or the circuit MCr in the above table. Alternatively, for example, in the case where the first data (a weight coefficient) is any one of "−7" to "+7", the second data (a value of a signal of a neuron) is any one of "−7" to "+7", and the product of the first data (a weight coefficient) and the second data (a value of a signal of a neuron) is a negative number, the product of the first data (a weight coefficient) and the second data (a value of a signal of a neuron) can be calculated from the charge amount $Q_{OLB}$ by replacing $Q_{ut}$ with "−1" in the charge amount $Q_{OLB}$ of a current flowing from the wiring OL to the circuit MC or the circuit MCr in the above table.

One embodiment of the present invention is not limited to the above definition. Although the second data (a value of a signal of a neuron) is defined above as a positive multilevel value, a negative multilevel value, or 0, the second data (a value of a signal of a neuron) can be processed as an analog value by using not a discrete value but a continuous value as the input period (by setting the input period to $a \times t_{ut}$, where a is a positive real number).

The configuration of the semiconductor device of one embodiment of the present invention is not limited to that of the circuit MP in FIG. 60. For example, in the circuit MP in FIG. 60, there are six circuits of the circuit HCS, the circuit HCS-2b, the circuit HCS-3b, the circuit HCSr, the circuit HCS-2br, and the circuit HCS-3br that hold potentials, and each of the circuits is electrically connected to the gates of three transistors (e.g., the transistor M1, the transistor M1-2x, and the transistor M1-3x); however, the number of circuits holding potentials and the number of transistors may be increased and decreased in accordance with the values that the first data (a weight coefficient) and the second data (a value of a signal of a neuron) can have. In addition, the number of holding portions and the number of wirings may be increased and decreased in accordance with the number of transistors.

In addition, the operation method of the semiconductor device of one embodiment of the present invention is not limited to the above operation method. For example, as described in Operation method example 2, the input period of signals that are input to the wiring X1L, the wiring X2L, the wiring X1L2b, the wiring X2L2b, the wiring X1L3b, and the wiring X2L3b may be divided into a plurality of sub-periods in the circuit MP in FIG. 60.

In this operation method example, the case is considered where only one circuit MP is electrically connected to the wiring OL and the wiring OLB to avoid complexity of description; however, a plurality of circuits MP may be electrically connected to the wiring OL and the wiring OLB as in the arithmetic circuit 150 in FIG. 11. In this case, the sum of the amounts of charges input from the wiring OL and the wiring OLB to the plurality of circuits MP can be accumulated in the capacitor of the integrator circuit included in the circuit ACTF, which enables the circuit ACTF to output the signal $z_j^{(k)}$ of a neuron corresponding to the amounts of charges flowing through the wiring OL and the wiring OLB.

Although the arithmetic circuit 150 in FIG. 11 is used as an example in this operation example, operation similar to that of this operation example can be performed by changing the arithmetic circuit to another one according to circumstances.

Note that this operation method example can be combined with any of the other operation method examples and the like described in this specification as appropriate.

Note that this embodiment can be combined with any of the other embodiments in this specification as appropriate.

Embodiment 4

In this embodiment, structure examples of the semiconductor device described in the above embodiment and structure examples of a transistor that can be used in the semiconductor device will be described.

Structure Example of Semiconductor

Figure 61:
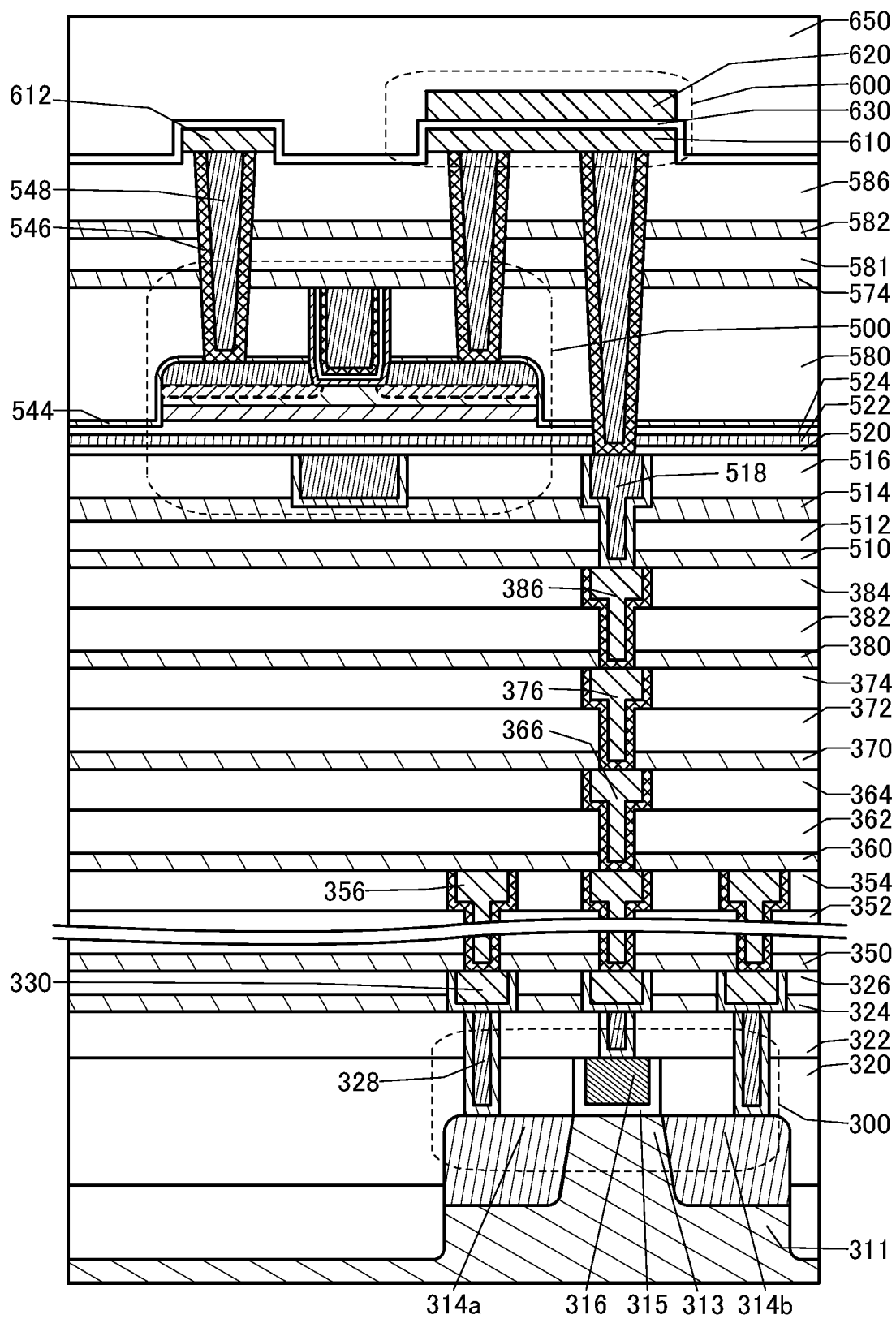
FIG. 61 is a schematic cross-sectional view showing a structure of a semiconductor device.
Figure 63A:
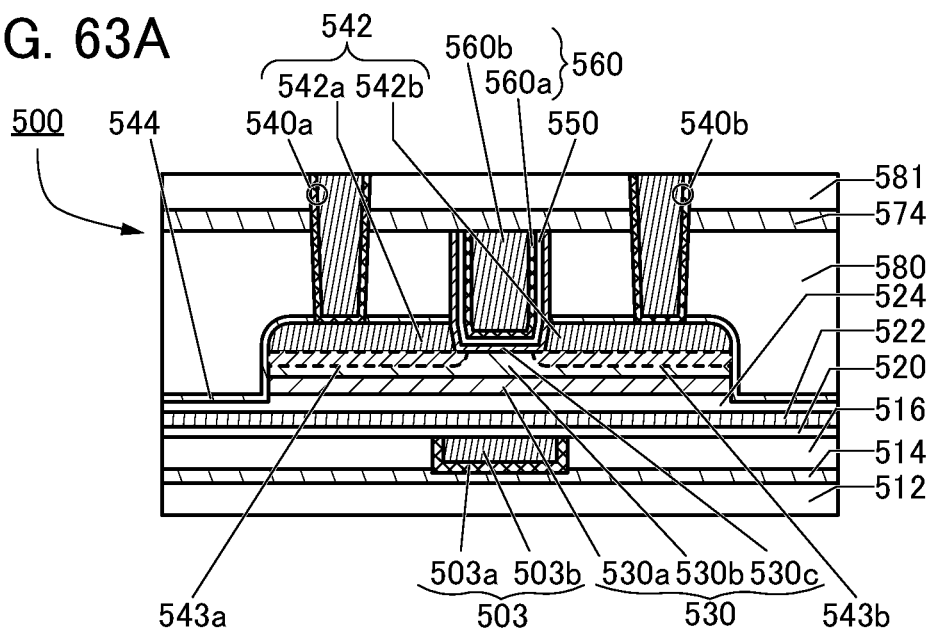
FIG. 63A, FIG. 63B, and FIG. 63C are schematic cross-sectional views showing a structure of a semiconductor device.
Figure 63B:
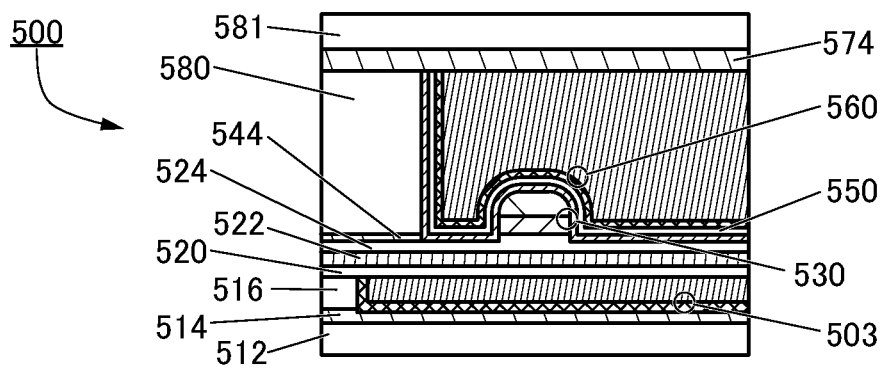
Figure 63C:
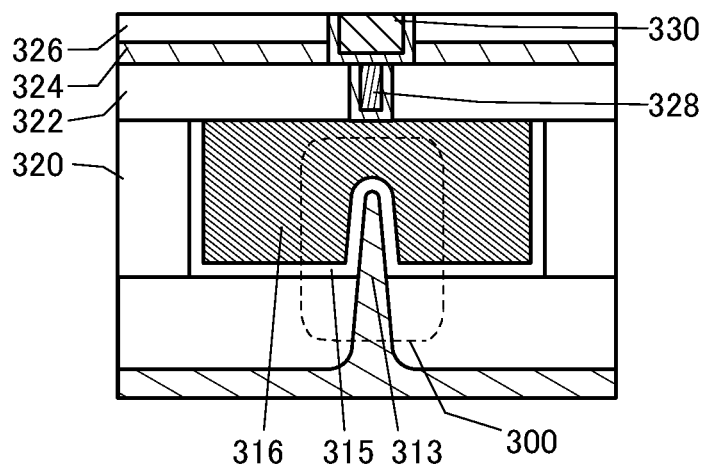

A semiconductor device illustrated in FIG. 61 includes a transistor 300, a transistor 500, and a capacitor 600. FIG. 63A is a cross-sectional view of the transistor 500 in the channel length direction, FIG. 63B is a cross-sectional view of the transistor 500 in the channel width direction, and FIG. 63C is a cross-sectional view of the transistor 300 in the channel width direction.

The transistor 500 is a transistor including a metal oxide in its channel formation region (an OS transistor). The transistor 500 has a small off-state current, and thus enables long-term holding of written data when used as the transistor M2 and the like of the circuit MP included in a semiconductor device such as the arithmetic circuit 110, the arithmetic circuit 120, the arithmetic circuit 130, the arithmetic circuit 140, the arithmetic circuit 150, the arithmetic circuit 160, or the arithmetic circuit 170. In other words, the frequency of refresh operation is low or refresh operation is not required; thus, power consumption of the semiconductor device can be reduced.

The semiconductor device described in this embodiment includes the transistor 300, the transistor 500, and the capacitor 600 as illustrated in FIG. 61. The transistor 500 is provided above the transistor 300, and the capacitor 600 is provided above the transistor 300 and the transistor 500. Note that the capacitor 600 can be the capacitor C1, the capacitor C2, the capacitor C3, and the like included in the circuit MP included in the arithmetic circuit 110, the arithmetic circuit 120, the arithmetic circuit 130, the arithmetic circuit 140, the arithmetic circuit 150, the arithmetic circuit 160, the arithmetic circuit 170, and the like that are described in the above embodiment.

The transistor 300 is provided on a substrate 311 and includes a conductor 316, an insulator 315, a semiconductor region 313 that is part of the substrate 311, and a low-resistance region 314a and a low-resistance region 314b functioning as a source region and a drain region. Note that the transistor 300 can be used as, for example, the transistor M2 and the like of the circuit MP included in the arithmetic circuit 110, the arithmetic circuit 120, the arithmetic circuit 130, the arithmetic circuit 140, the arithmetic circuit 150, the arithmetic circuit 160, the arithmetic circuit 170, and the like that are described in the above embodiment.

A semiconductor substrate (e.g., a single crystal substrate or a silicon substrate) is preferably used as the substrate 311.

In the transistor 300, a top surface and a side surface in the channel width direction of the semiconductor region 313 are covered with the conductor 316 with the insulator 315 therebetween, as illustrated in FIG. 63C. Such a Fin-type transistor 300 can have an increased effective channel width, and thus the transistor 300 can have improved on-state characteristics. In addition, since contribution of an electric field of a gate electrode can be increased, the off-state characteristics of the transistor 300 can be improved.

Note that the transistor 300 can be either a p-channel transistor or an n-channel transistor.

A region of the semiconductor region 313 where a channel is formed, a region in the vicinity thereof, the low-resistance region 314a and the low-resistance region 314b functioning as the source region and the drain region, and the like preferably contain a semiconductor such as a silicon-based semiconductor, further preferably contain single crystal silicon. Alternatively, the regions may be formed using a material containing Ge (germanium), SiGe (silicon germanium), GaAs (gallium arsenide), GaAlAs (gallium aluminum arsenide), or the like. A structure may be employed in which silicon whose effective mass is controlled by applying stress to the crystal lattice and changing the lattice spacing is used. Alternatively, the transistor 300 may be an HEMT (High Electron Mobility Transistor) with GaAs and GaAlAs, or the like.

The low-resistance region 314a and the low-resistance region 314b contain an element that imparts n-type conductivity, such as arsenic or phosphorus, or an element that imparts p-type conductivity, such as boron, in addition to a semiconductor material used for the semiconductor region 313.

For the conductor 316 functioning as a gate electrode, a semiconductor material such as silicon containing an element that imparts n-type conductivity, such as arsenic or phosphorus, or an element that imparts p-type conductivity, such as boron, or a conductive material such as a metal material, an alloy material, or a metal oxide material can be used.

Note that since the work function of a conductor depends on the material of the conductor, the threshold voltage of the transistor can be adjusted by selecting the material of the conductor. Specifically, it is preferable to use a material such as titanium nitride or tantalum nitride for the conductor. Moreover, in order to ensure both conductivity and embeddability, it is preferable to use stacked layers of metal materials such as tungsten and aluminum for the conductor, and it is particularly preferable to use tungsten in terms of heat resistance.

Figure 62:
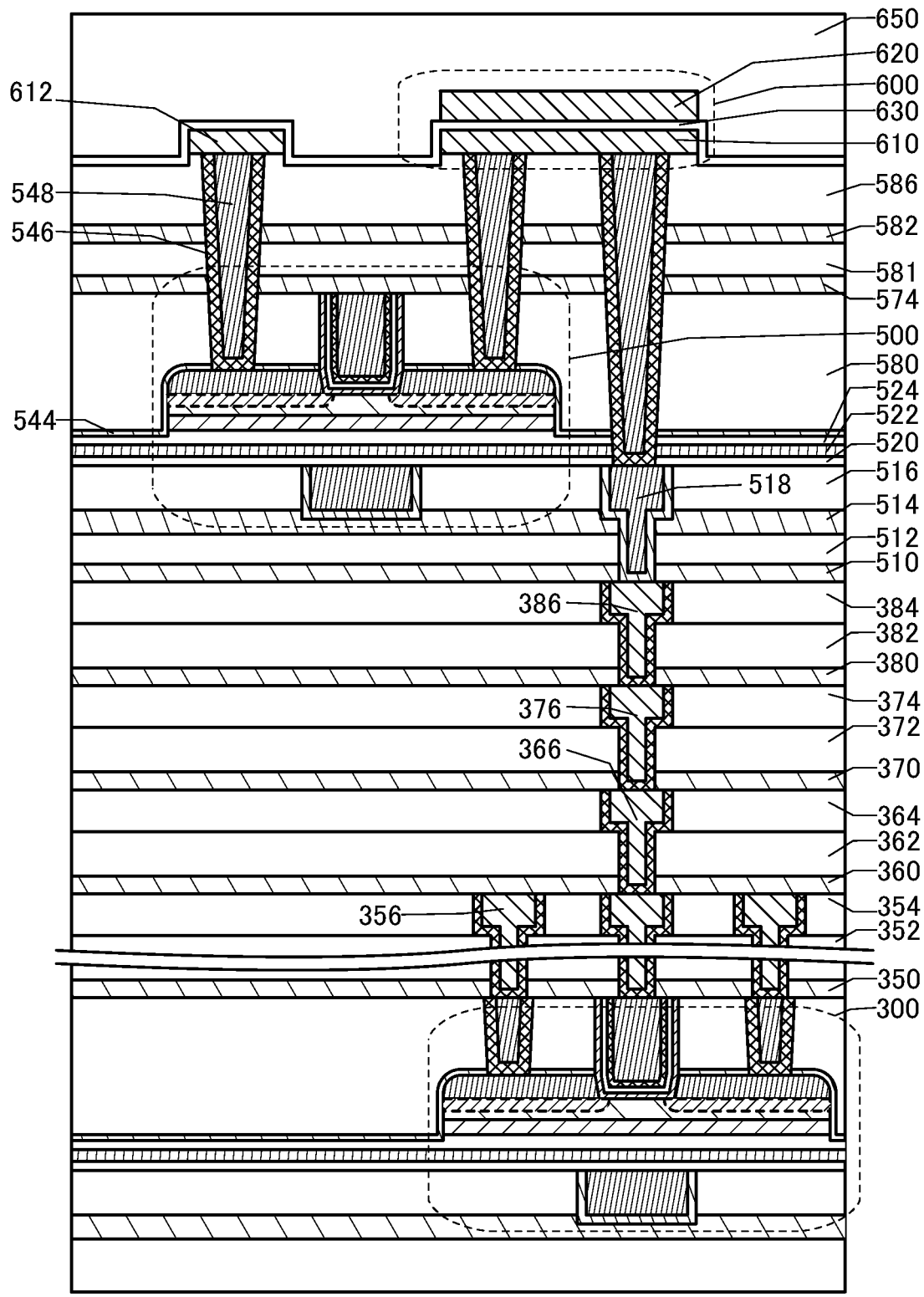
FIG. 62 is a schematic cross-sectional view showing a structure of a semiconductor device.

Note that the transistor 300 illustrated in FIG. 61 is only an example and the structure is not limited thereto; an appropriate transistor can be used in accordance with a circuit configuration or a driving method. For example, when a semiconductor device is a single-polarity circuit using only OS transistors, the transistor 300 has a structure similar to that of the transistor 500 using an oxide semiconductor, as illustrated in FIG. 62. Note that the details of the transistor 500 are described later.

An insulator 320, an insulator 322, an insulator 324, and an insulator 326 are provided to be stacked in this order to cover the transistor 300.

For the insulator 320, the insulator 322, the insulator 324, and the insulator 326, silicon oxide, silicon oxynitride, silicon nitride oxide, silicon nitride, aluminum oxide, aluminum oxynitride, aluminum nitride oxide, or aluminum nitride can be used, for example.

Note that in this specification, silicon oxynitride refers to a material that has a higher oxygen content than a nitrogen content, and silicon nitride oxide refers to a material that has a higher nitrogen content than an oxygen content. Moreover, in this specification, aluminum oxynitride refers to a material that has a higher oxygen content than a nitrogen content, and aluminum nitride oxide refers to a material that has a higher nitrogen content than an oxygen content.

The insulator 322 may have a function of a planarization film for planarizing a level difference caused by the transistor 300 or the like provided below the insulator 322. For example, a top surface of the insulator 322 may be planarized by planarization treatment using a chemical mechanical polishing (CMP) method or the like to improve planarity.

As the insulator 324, it is preferable to use a film having a barrier property that prevents diffusion of hydrogen or impurities from the substrate 311, the transistor 300, or the like into a region where the transistor 500 is provided.

For the film having a barrier property against hydrogen, silicon nitride formed by a CVD method can be used, for example. Here, diffusion of hydrogen into a semiconductor element including an oxide semiconductor, such as the transistor 500, degrades the characteristics of the semiconductor element in some cases. Therefore, a film that inhibits hydrogen diffusion is preferably used between the transistor 500 and the transistor 300. The film that inhibits hydrogen diffusion is specifically a film from which a small amount of hydrogen is released.

The amount of released hydrogen can be analyzed by thermal desorption spectroscopy (TDS), for example. The amount of hydrogen released from the insulator 324 that is converted into hydrogen atoms per area of the insulator 324 is less than or equal to $10\times10^{15}$ atoms/cm$^2$, preferably less than or equal to $5\times10^{15}$ atoms/cm$^2$, in the TDS analysis in a film-surface temperature range of 50° C. to 500° C., for example.

Note that the permittivity of the insulator 326 is preferably lower than that of the insulator 324. For example, the dielectric constant of the insulator 326 is preferably lower than 4, further preferably lower than 3. The dielectric constant of the insulator 326 is, for example, preferably 0.7 times or less, further preferably 0.6 times or less the dielectric constant of the insulator 324. When a material with a low permittivity is used for the interlayer film, the parasitic capacitance generated between wirings can be reduced.

A conductor 328, a conductor 330, and the like that are connected to the capacitor 600 or the transistor 500 are embedded in the insulator 320, the insulator 322, the insulator 324, and the insulator 326. Note that the conductor 328 and the conductor 330 have a function of a plug or a wiring. A plurality of conductors having a function of a plug or a wiring are collectively denoted by the same reference numeral in some cases. Moreover, in this specification and the like, a wiring and a plug connected to the wiring may be a single component. That is, in some cases, part of a conductor functions as a wiring or part of a conductor functions as a plug.

As a material of each of plugs and wirings (e.g., the conductor 328 and the conductor 330), a single layer or a stacked layer of a conductive material such as a metal material, an alloy material, a metal nitride material, or a metal oxide material can be used. It is preferable to use a high-melting-point material that has both heat resistance and conductivity, such as tungsten or molybdenum, and it is preferable to use tungsten. Alternatively, a low-resistance conductive material such as aluminum or copper is preferably used. The use of a low-resistance conductive material can reduce wiring resistance.

A wiring layer may be provided over the insulator 326 and the conductor 330. For example, in FIG. 61, an insulator 350, an insulator 352, and an insulator 354 are provided to be stacked in this order. Furthermore, a conductor 356 is formed in the insulator 350, the insulator 352, and the insulator 354. The conductor 356 has a function of a plug or a wiring that is connected to the transistor 300. Note that the conductor 356 can be provided using a material similar to those for the conductor 328 and the conductor 330.

As the insulator 350, it is preferable to use, for example, an insulator having a barrier property against hydrogen, like the insulator 324. The conductor 356 preferably includes a conductor having a barrier property against hydrogen. In particular, the conductor having a barrier property against hydrogen is formed in an opening portion included in the insulator 350 having a barrier property against hydrogen. With this structure, the transistor 300 and the transistor 500 can be separated by the barrier layer, so that diffusion of hydrogen from the transistor 300 into the transistor 500 can be inhibited.

For the conductor having a barrier property against hydrogen, tantalum nitride is preferably used, for example. In addition, the use of a stack including tantalum nitride and tungsten, which has high conductivity, can inhibit diffusion of hydrogen from the transistor 300 while the conductivity of a wiring is kept. In that case, a structure is preferable in which a tantalum nitride layer having a barrier property against hydrogen is in contact with the insulator 350 having a barrier property against hydrogen.

A wiring layer may be provided over the insulator 354 and the conductor 356. For example, in FIG. 61, an insulator 360, an insulator 362, and an insulator 364 are provided to be stacked in this order. Furthermore, a conductor 366 is formed in the insulator 360, the insulator 362, and the insulator 364. The conductor 366 has a function of a plug or a wiring. Note that the conductor 366 can be provided using a material similar to those for the conductor 328 and the conductor 330.

As the insulator 360, it is preferable to use, for example, an insulator having a barrier property against hydrogen, like the insulator 324. Furthermore, the conductor 366 preferably includes a conductor having a barrier property against hydrogen. In particular, the conductor having a barrier property against hydrogen is formed in an opening portion included in the insulator 360 having a barrier property against hydrogen. With this structure, the transistor 300 and the transistor 500 can be separated by the barrier layer, so that diffusion of hydrogen from the transistor 300 into the transistor 500 can be inhibited.

A wiring layer may be provided over the insulator 364 and the conductor 366. For example, in FIG. 61, an insulator 370, an insulator 372, and an insulator 374 are provided to be stacked in this order. Furthermore, a conductor 376 is formed in the insulator 370, the insulator 372, and the insulator 374. The conductor 376 has a function of a plug or a wiring. Note that the conductor 376 can be provided using a material similar to those for the conductor 328 and the conductor 330.

As the insulator 370, it is preferable to use, for example, an insulator having a barrier property against hydrogen, like the insulator 324. Furthermore, the conductor 376 preferably includes a conductor having a barrier property against hydrogen. In particular, the conductor having a barrier property against hydrogen is formed in an opening portion included in the insulator 370 having a barrier property against hydrogen. With this structure, the transistor 300 and the transistor 500 can be separated by the barrier layer, so that diffusion of hydrogen from the transistor 300 into the transistor 500 can be inhibited.

A wiring layer may be provided over the insulator 374 and the conductor 376. For example, in FIG. 61, an insulator 380, an insulator 382, and an insulator 384 are provided to be stacked in this order. Furthermore, a conductor 386 is formed in the insulator 380, the insulator 382, and the insulator 384. The conductor 386 has a function of a plug or a wiring. Note that the conductor 386 can be provided using a material similar to those for the conductor 328 and the conductor 330.

As the insulator 380, it is preferable to use, for example, an insulator having a barrier property against hydrogen, like the insulator 324. Furthermore, the conductor 386 preferably includes a conductor having a barrier property against hydrogen. In particular, the conductor having a barrier property against hydrogen is formed in an opening portion included in the insulator 380 having a barrier property against hydrogen. With this structure, the transistor 300 and the transistor 500 can be separated by the barrier layer, so that diffusion of hydrogen from the transistor 300 into the transistor 500 can be inhibited.

Although the wiring layer including the conductor 356, the wiring layer including the conductor 366, the wiring layer including the conductor 376, and the wiring layer including the conductor 386 are described above, the semiconductor device of this embodiment is not limited thereto. Three or less wiring layers that are similar to the wiring layer including the conductor 356 may be provided, or five or more wiring layers that are similar to the wiring layer including the conductor 356 may be provided.

An insulator 510, an insulator 512, an insulator 514, and an insulator 516 are provided to be stacked in this order over the insulator 384. A substance with a barrier property against oxygen or hydrogen is preferably used for any of the insulator 510, the insulator 512, the insulator 514, and the insulator 516.

For example, as the insulator 510 and the insulator 514, it is preferable to use a film having a barrier property that prevents diffusion of hydrogen or impurities from the substrate 311, a region where the transistor 300 is provided, or the like into the region where the transistor 500 is provided. Thus, a material similar to that for the insulator 324 can be used.

For the film having a barrier property against hydrogen, silicon nitride formed by a CVD method can be used, for example. Here, diffusion of hydrogen into a semiconductor element including an oxide semiconductor, such as the transistor 500, degrades the characteristics of the semiconductor element in some cases. Therefore, a film that inhibits hydrogen diffusion is preferably used between the transistor 500 and the transistor 300. The film that inhibits hydrogen diffusion is specifically a film from which a small amount of hydrogen is released.

For the film having a barrier property against hydrogen used for the insulator 510 and the insulator 514, a metal oxide such as aluminum oxide, hafnium oxide, or tantalum oxide is preferably used, for example.

In particular, aluminum oxide has an excellent blocking effect that prevents transmission of oxygen and impurities such as hydrogen and moisture which would cause a change in the electrical characteristics of the transistor. Accordingly, aluminum oxide can prevent entry of impurities such as hydrogen and moisture into the transistor 500 in and after the manufacturing process of the transistor. In addition, release of oxygen from the oxide included in the transistor 500 can be inhibited. Therefore, aluminum oxide is suitably used for a protective film of the transistor 500.

For the insulator 512 and the insulator 516, a material similar to that for the insulator 320 can be used, for example. Furthermore, when a material with a comparatively low permittivity is used for these insulators, parasitic capacitance generated between wirings can be reduced. A silicon oxide film or a silicon oxynitride film can be used for the insulator 512 and the insulator 516, for example.

A conductor 518, a conductor included in the transistor 500 (e.g., a conductor 503), and the like are embedded in the insulator 510, the insulator 512, the insulator 514, and the insulator 516. Note that the conductor 518 has a function of a plug or a wiring that is connected to the capacitor 600 or the transistor 300. The conductor 518 can be provided using a material similar to those for the conductor 328 and the conductor 330.

In particular, a region of the conductor 518 that is in contact with the insulator 510 and the insulator 514 is preferably a conductor having a barrier property against oxygen, hydrogen, and water. With this structure, the transistor 300 and the transistor 500 can be separated by the layer having a barrier property against oxygen, hydrogen, and water; hence, the diffusion of hydrogen from the transistor 300 into the transistor 500 can be inhibited.

The transistor 500 is provided above the insulator 516.

As illustrated in FIG. 63A and FIG. 63B, the transistor 500 includes the conductor 503 positioned to be embedded in the insulator 514 and the insulator 516, an insulator 520 positioned over the insulator 516 and the conductor 503, an insulator 522 positioned over the insulator 520, an insulator 524 positioned over the insulator 522, an oxide 530a positioned over the insulator 524, an oxide 530b positioned over the oxide 530a, a conductor 542a and a conductor 542b positioned apart from each other over the oxide 530b, an insulator 580 that is positioned over the conductor 542a and the conductor 542b and is provided with an opening formed to overlap with a region between the conductor 542a and the conductor 542b, an oxide 530c positioned on a bottom and a side surface of the opening, an insulator 550 positioned on a formation surface of the oxide 530c, and a conductor 560 positioned on a formation surface of the insulator 550.

As illustrated in FIG. 63A and FIG. 63B, an insulator 544 is preferably positioned between the insulator 580 and the oxide 530a, the oxide 530b, the conductor 542a, and the conductor 542b. In addition, as illustrated in FIG. 63A and FIG. 63B, the conductor 560 preferably includes a conductor 560a provided inside the insulator 550 and a conductor 560b provided to be embedded inside the conductor 560a. As illustrated in FIG. 63A and FIG. 63B, an insulator 574 is preferably positioned over the insulator 580, the conductor 560, and the insulator 550.

Hereinafter, the oxide 530a, the oxide 530b, and the oxide 530c may be collectively referred to as an oxide 530.

The transistor 500 having a structure in which the three layers of the oxide 530a, the oxide 530b, and the oxide 530c are stacked in the region where the channel is formed and its vicinity is shown; however, one embodiment of the present invention is not limited to this. For example, the transistor may have a single-layer structure of the oxide 530b, a two-layer structure of the oxide 530b and the oxide 530a, a two-layer structure of the oxide 530b and the oxide 530c, or a stacked-layer structure of four or more layers. Furthermore, although the conductor 560 is shown to have a stacked-layer structure of two layers in the transistor 500, one embodiment of the present invention is not limited thereto. For example, the conductor 560 may have a single-layer structure or a stacked-layer structure of three or more layers. Moreover, the transistor 500 illustrated in FIG. 61 and FIG. 63A is an example and the structure is not limited thereto; an appropriate transistor is used in accordance with a circuit configuration or a driving method.

Here, the conductor 560 functions as a gate electrode of the transistor, and the conductor 542a and the conductor 542b function as a source electrode and a drain electrode. As described above, the conductor 560 is formed to be embedded in an opening in the insulator 580 and the region sandwiched between the conductor 542a and the conductor 542b. The positions of the conductor 560, the conductor 542a, and the conductor 542b are selected in a self-aligned manner with respect to the opening in the insulator 580. That is, in the transistor 500, the gate electrode can be positioned between the source electrode and the drain electrode in a self-aligned manner. Thus, the conductor 560 can be formed without an alignment margin, resulting in a reduction in the area occupied by the transistor 500. Accordingly, miniaturization and high integration of the semiconductor device can be achieved.

Since the conductor 560 is formed in the region between the conductor 542a and the conductor 542b in a self-aligned manner, the conductor 560 includes neither a region overlapping with the conductor 542a nor the region overlapping with the conductor 542b. Thus, parasitic capacitance formed between the conductor 560 and each of the conductor 542a and the conductor 542b can be reduced. As a result, the transistor 500 can have increased switching speed and excellent frequency characteristics.

The conductor 560 sometimes functions as a first gate (also referred to as top gate) electrode. In addition, the conductor 503 sometimes functions as a second gate (also referred to as bottom gate) electrode. In that case, the threshold voltage of the transistor 500 can be controlled by changing a potential applied to the conductor 503 independently of a potential applied to the conductor 560. In particular, the threshold voltage of the transistor 500 can be higher than 0 V and the off-state current can be reduced by applying a negative potential to the conductor 503. Thus, a drain current at the time when a potential applied to the conductor 560 is 0 V can be lower in the case where a negative potential is applied to the conductor 503 than in the case where a negative potential is not applied to the conductor 503.

The conductor 503 is positioned to overlap with the oxide 530 and the conductor 560. Thus, when potentials are applied to the conductor 560 and the conductor 503, an electric field generated from the conductor 560 and an electric field generated from the conductor 503 are connected and can cover the channel formation region formed in the oxide 530. In this specification and the like, a transistor structure in which a channel formation region is electrically surrounded by electric fields of a first gate electrode and a second gate electrode is referred to as a surrounded channel (S-channel) structure.

The conductor 503 has a structure similar to that of the conductor 518; a conductor 503a is formed in contact with an inner wall of the opening in the insulator 514 and the insulator 516, and a conductor 503b is formed on the inner side. Although the transistor 500 having a structure in which the conductor 503a and the conductor 503b are stacked is illustrated, one embodiment of the present invention is not limited thereto. For example, the conductor 503 may be provided as a single layer or to have a stacked-layer structure of three or more layers.

Here, for the conductor 503a, a conductive material that has a function of inhibiting diffusion of impurities such as a hydrogen atom, a hydrogen molecule, a water molecule, and a copper atom (through which the above impurities are less likely to pass) is preferably used. Alternatively, it is preferable to use a conductive material that has a function of inhibiting diffusion of oxygen (e.g., at least one of an oxygen atom, an oxygen molecule, and the like) (through which the above oxygen is less likely to pass). Note that in this specification, a function of inhibiting diffusion of impurities or oxygen means a function of inhibiting diffusion of any one or all of the above impurities and the above oxygen.

For example, when the conductor 503a has a function of inhibiting diffusion of oxygen, a reduction in conductivity of the conductor 503b due to oxidation can be inhibited.

When the conductor 503 also functions as a wiring, for the conductor 503b, it is preferable to use a conductive material that has high conductivity and contains tungsten, copper, or aluminum as its main component. In that case, a conductor 505 is not necessarily provided. Note that the conductor 503b is shown as a single layer but may have a stacked-layer structure, for example, a stack of any of the above conductive materials and titanium or titanium nitride.

The insulator 520, the insulator 522, and the insulator 524 have a function of a second gate insulating film.

Here, as the insulator 524 in contact with the oxide 530, an insulator that contains oxygen more than oxygen in the stoichiometric composition is preferably used. That is, an excess-oxygen region is preferably formed in the insulator 524. When such an insulator containing excess oxygen is provided in contact with the oxide 530, oxygen vacancies in the oxide 530 can be reduced and the reliability of the transistor 500 can be improved.

As the insulator including an excess-oxygen region, specifically, an oxide material that releases part of oxygen by heating is preferably used. An oxide that releases oxygen by heating is an oxide film in which the amount of released oxygen converted into oxygen atoms is greater than or equal to $1.0 \times 10^{18}$ atoms/cm$^3$, preferably greater than or equal to $1.0 \times 10^{19}$ atoms/cm$^3$, further preferably greater than or equal to $2.0 \times 10^{19}$ atoms/cm$^3$ or greater than or equal to $3.0 \times 10^{20}$ atoms/cm$^3$ in TDS (Thermal Desorption Spectroscopy) analysis. Note that the temperature of the film surface in the TDS analysis is preferably in the range of 100° C. to 700° C. or 100° C. to 400° C.

One or more of heat treatment, microwave treatment, and RF treatment may be performed in a state in which the insulator including the excess-oxygen region and the oxide 530 are in contact with each other. By the treatment, water or hydrogen in the oxide 530 can be removed. For example, in the oxide 530, dehydrogenation can be performed when a reaction in which a bond of $V_OH$ is cut occurs, i.e., a reaction of "$V_OH \rightarrow V_O+H$" occurs. Part of hydrogen generated at this time is bonded to oxygen to be H$_2$O, and removed from the oxide 530 or an insulator near the oxide 530 in some cases. Part of hydrogen is diffused into or gettered (also referred to as gettering) by the conductor 542a and the conductor 542b in some cases.

For the microwave treatment, for example, an apparatus including a power supply that generates high-density plasma or an apparatus including a power supply that applies RF to the substrate side is suitably used. For example, the use of an oxygen-containing gas and high-density plasma enables high-density oxygen radicals to be generated, and application of the RF to the substrate side allows the oxygen radicals generated by the high-density plasma to be efficiently introduced into the oxide 530 or an insulator in the vicinity of the oxide 530. The pressure in the microwave treatment is higher than or equal to 133 Pa, preferably higher than or equal to 200 Pa, further preferably higher than or equal to 400 Pa. As a gas introduced into an apparatus for performing the microwave treatment, for example, oxygen and argon are used and the oxygen flow rate (O$_2$/(O$_2$+Ar)) is lower than or equal to 50%, preferably higher than or equal to 10% and lower than or equal to 30%.

In a manufacturing process of the transistor 500, heat treatment is preferably performed with the surface of the oxide 530 exposed. The heat treatment is performed at higher than or equal to 100° C. and lower than or equal to 450° C., preferably higher than or equal to 350° C. and lower than or equal to 400° C., for example. Note that the heat treatment is performed in a nitrogen gas or inert gas atmosphere, or an atmosphere containing an oxidizing gas at 10 ppm or more, 1% or more, or 10% or more. For example, the heat treatment is preferably performed in an oxygen atmosphere. Accordingly, oxygen can be supplied to the oxide 530 to reduce oxygen vacancies ($V_O$). The heat treatment may be performed under reduced pressure. Alternatively, the heat treatment may be performed in such a manner that heat treatment is performed in a nitrogen gas or inert gas atmosphere, and then another heat treatment is performed in an atmosphere containing an oxidizing gas at 10 ppm or more, 1% or more, or 10% or more in order to compensate for released oxygen. Alternatively, the heat treatment may be performed in such a manner that heat treatment is performed in an atmosphere containing an oxidizing gas at 10 ppm or more, 1% or more, or 10% or more, and then another heat treatment is successively performed in a nitrogen gas or inert gas atmosphere.

Note that the oxygen adding treatment performed on the oxide 530 can promote a reaction in which oxygen vacancies in the oxide 530 are filled with supplied oxygen, i.e., a reaction of "$V_O+O \rightarrow null$". Furthermore, hydrogen remaining in the oxide 530 reacts with supplied oxygen, so that the hydrogen can be removed as $H_2O$ (dehydration). This can inhibit recombination of hydrogen remaining in the oxide 530 with oxygen vacancies and formation of $V_OH$.

In the case where the insulator 524 includes an excess-oxygen region, it is preferable that the insulator 522 have a function of inhibiting diffusion of oxygen (e.g., an oxygen atom and an oxygen molecule) (or the insulator 522 be less likely to transmit the above oxygen).

When the insulator 522 has a function of inhibiting diffusion of oxygen or impurities, oxygen contained in the oxide 530 is not diffused to the insulator 520 side, which is preferable.

Furthermore, the conductor 503 can be inhibited from reacting with oxygen contained in the insulator 524 or the oxide 530.

The insulator 522 is preferably a single layer or stacked layers using an insulator containing a high-k material such as aluminum oxide, hafnium oxide, an oxide containing aluminum and hafnium (hafnium aluminate), tantalum oxide, zirconium oxide, lead zirconate titanate (PZT), strontium titanate ($SrTiO_3$), or $(Ba,Sr)TiO_3$ (BST). As miniaturization and high integration of transistors progress, a problem such as leakage current may arise because of a thinner gate insulating film. When a high-k material is used for the insulator functioning as the gate insulating film, a gate potential at the time when the transistor operates can be reduced while the physical thickness is maintained.

It is particularly preferable to use an insulator containing an oxide of one or both of aluminum and hafnium, which is an insulating material having a function of inhibiting diffusion of impurities, oxygen, and the like (through which the above oxygen is less likely to pass). As the insulator containing an oxide of one or both of aluminum and hafnium, aluminum oxide, hafnium oxide, an oxide containing aluminum and hafnium (hafnium aluminate), or the like is preferably used. In the case where the insulator 522 is formed using such a material, the insulator 522 functions as a layer that inhibits release of oxygen from the oxide 530 and mixing of impurities such as hydrogen from the periphery of the transistor 500 into the oxide 530.

Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the above insulator.

It is preferable that the insulator 520 be thermally stable. For example, silicon oxide and silicon oxynitride, which have thermal stability, are suitable. Furthermore, when an insulator that is a high-k material is combined with silicon oxide or silicon oxynitride, the insulator 520 having a stacked-layer structure that has thermal stability and a high relative permittivity can be obtained.

Note that in the transistor 500 in FIG. 63A and FIG. 63B, the insulator 520, the insulator 522, and the insulator 524 are shown as the second gate insulating film having a stacked-layer structure of three layers; however, the second gate insulating film may be a single layer or may have a stacked-layer structure of two layers or four or more layers. In such cases, without limitation to a stacked-layer structure formed of the same material, a stacked-layer structure formed of different materials may be employed.

In the transistor 500, a metal oxide functioning as an oxide semiconductor is preferably used as the oxide 530 including the channel formation region. For example, as the oxide 530, a metal oxide such as an In-M-Zn oxide (the element M is one or more selected from aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like) is used. In particular, the In-M-Zn oxide which can be used for the oxide 530 is preferably a CAAC-OS (C-Axis Aligned Crystalline Oxide Semiconductor) or a CAC-OS (Cloud-Aligned Composite Oxide Semiconductor). Furthermore, an In—Ga oxide, an In—Zn oxide, an In oxide, or the like may be used as the oxide 530.

Furthermore, a metal oxide with a low carrier concentration is preferably used in the transistor 500. In order to reduce the carrier concentration of the metal oxide, the concentration of impurities in the metal oxide is reduced so that the density of defect states can be reduced. In this specification and the like, a state with a low impurity concentration and a low density of defect states is referred to as a highly purified intrinsic or substantially highly purified intrinsic state. Examples of impurities in a metal oxide include hydrogen, nitrogen, alkali metal, alkaline earth metal, iron, nickel, and silicon.

In particular, hydrogen contained in a metal oxide reacts with oxygen bonded to a metal atom to be water, and thus forms oxygen vacancies in the metal oxide in some cases. In the case where hydrogen enters an oxygen vacancy in the oxide 530, the oxygen vacancy and the hydrogen are bonded to each other to form $V_OH$ in some cases. The $V_OH$ serves as a donor and an electron that is a carrier is generated in some cases. In other cases, bonding of part of hydrogen to oxygen bonded to a metal atom generates an electron serving as a carrier. Thus, a transistor using a metal oxide containing a large amount of hydrogen is likely to have normally-on characteristics. Moreover, hydrogen in a metal oxide is easily transferred by a stress such as heat or an electric field; thus, a large amount of hydrogen contained in a metal oxide might reduce the reliability of the transistor. In one embodiment of the present invention, $V_OH$ in the oxide 530 is preferably reduced as much as possible so that the oxide 530 becomes a highly purified intrinsic or substantially highly purified intrinsic oxide. It is important to remove impurities such as moisture and hydrogen in a metal oxide (sometimes described as dehydration or dehydrogenation treatment) and to compensate for oxygen vacancies by supplying oxygen to the metal oxide (sometimes described as oxygen supplying treatment) to obtain a metal oxide whose $V_OH$ is reduced enough. When a metal oxide in which impurities such as $V_OH$ are sufficiently reduced is used for a channel formation region of a transistor, stable electrical characteristics can be given.

A defect that is an oxygen vacancy into which hydrogen has entered can function as a donor of a metal oxide. However, it is difficult to evaluate the defects quantitatively. Thus, the metal oxide is sometimes evaluated by not its donor concentration but its carrier concentration. Therefore, in this specification and the like, the carrier concentration assuming the state where an electric field is not applied is sometimes used, instead of the donor concentration, as the parameter of the metal oxide. That is, "carrier concentration" in this specification and the like can be replaced with "donor concentration" in some cases.

Consequently, when a metal oxide is used for the oxide 530, hydrogen in the metal oxide is preferably reduced as much as possible. Specifically, the hydrogen concentration of the metal oxide, which is measured by secondary ion mass spectrometry (SIMS), is lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$. When a metal oxide with a sufficiently low concentration of impurities such as hydrogen is used for a channel formation region of a transistor, stable electrical characteristics can be given.

In the case where a metal oxide is used as the oxide 530, the metal oxide is an intrinsic (also referred to as i-type) or substantially intrinsic semiconductor that has a large band gap, and the carrier concentration of the metal oxide in the channel formation region is preferably lower than $1\times10^{18}$ cm$^{-3}$, further preferably lower than $1\times10^{17}$ cm$^{-3}$, still further preferably lower than $1\times10^{16}$ cm$^{-3}$, yet further preferably lower than $1\times10^{13}$ cm$^{-3}$, yet still further preferably lower than $1\times10^{12}$ cm$^{-3}$. Note that the lower limit of the carrier concentration of the metal oxide in the channel formation region is not particularly limited and can be, for example, $1\times10^{-9}$ cm$^{-3}$.

In the case where a metal oxide is used as the oxide 530, contact between the oxide 530 and each of the conductor 542a and the conductor 542b may diffuse oxygen in the oxide 530 into the conductor 542a and the conductor 542b, resulting in oxidation of the conductor 542a and the conductor 542b. It is highly possible that oxidation of the conductor 542a and the conductor 542b lowers the conductivity of the conductor 542a and the conductor 542b. Note that diffusion of oxygen from the oxide 530 into the conductor 542a and the conductor 542b can be rephrased as absorption of oxygen in the oxide 530 by the conductor 542a and the conductor 542b.

When oxygen in the oxide 530 is diffused into the conductor 542a and the conductor 542b, a layer is sometimes formed between the conductor 542a and the oxide 530b and between the conductor 542b and the oxide 530b. The layer contains a larger amount of oxygen than the conductor 542a and the conductor 542b and thus presumably has an insulating property. In this case, a three-layer structure of the conductor 542a or the conductor 542b, the layer, and the oxide 530b can be regarded as a three-layer structure of a metal, an insulator, and a semiconductor and is sometimes referred to as a MIS (Metal-Insulator-Semiconductor) structure or referred to as a diode-connected structure mainly formed of the MIS structure.

Note that the layer is not necessarily formed between the oxide 530b and each of the conductor 542a and the conductor 542b; for example, the layer is formed between the oxide 530c and each of the conductor 542a and the conductor 542b in some cases.

The metal oxide functioning as the channel formation region in the oxide 530 has a band gap of preferably 2 eV or more, further preferably 2.5 eV or more. With the use of a metal oxide having such a wide bandgap, the off-state current of the transistor can be reduced.

When the oxide 530 includes the oxide 530a under the oxide 530b, it is possible to inhibit diffusion of impurities into the oxide 530b from the components formed below the oxide 530a. Moreover, including the oxide 530c over the oxide 530b makes it possible to inhibit diffusion of impurities into the oxide 530b from the components formed above the oxide 530c.

Note that the oxide 530 preferably has a stacked-layer structure of a plurality of oxide layers that differ in the atomic ratio of metal atoms. Specifically, the atomic proportion of the element M in the constituent elements in the metal oxide used as the oxide 530a is preferably higher than the atomic proportion of the element M in the constituent elements in the metal oxide used as the oxide 530b. In addition, the atomic ratio of the element M to In in the metal oxide used as the oxide 530a is preferably higher than the atomic ratio of the element M to In in the metal oxide used as the oxide 530b. Furthermore, the atomic ratio of In to the element M in the metal oxide used as the oxide 530b is preferably higher than the atomic ratio of In to the element M in the metal oxide used as the oxide 530a. As the oxide 530c, it is possible to use a metal oxide that can be used as the oxide 530a or the oxide 530b.

Specifically, as the oxide 530a, a metal oxide in which an atomic ratio of In to Ga and Zn is In:Ga:Zn=1:3:4 or 1:1:0.5 is used. In addition, as the oxide 530b, a metal oxide in which an atomic ratio of In to Ga and Zn is In:Ga:Zn=4:2:3 or 1:1:1 is used. In addition, as the oxide 530c, a metal oxide in which an atomic ratio of In to Ga and Zn is In:Ga:Zn=1:3:4 or an atomic ratio of Ga to Zn is Ga:Zn=2:1 or Ga:Zn=2:5 is used. Specific examples of the case where the oxide 530c has a stacked-layer structure include a stacked-layer structure of a layer in which an atomic ratio of In to Ga and Zn is In:Ga:Zn=4:2:3 and a layer with In:Ga:Zn=1:3:4; a stacked-layer structure of a layer in which an atomic ratio of Ga to Zn is Ga:Zn=2:1 and a layer in which an atomic ratio of In to Ga and Zn is In:Ga:Zn=4:2:3; a stacked-layer structure of a layer in which an atomic ratio of Ga to Zn is Ga:Zn=2:5 and a layer in which an atomic ratio of In to Ga and Zn is In:Ga:Zn=4:2:3; and a stacked-layer structure of gallium oxide and a layer in which an atomic ratio of In to Ga and Zn is In:Ga:Zn=4:2:3.

For example, in the case where the atomic ratio of In to the element M in the metal oxide used as the oxide 530a is lower than the atomic ratio of In to the element M in the metal oxide used as the oxide 530b, an In—Ga—Zn oxide having a composition with an atomic ratio of In:Ga:Zn=5:1:6 or a neighborhood thereof, In:Ga:Zn=5:1:3 or a neighborhood thereof, In:Ga:Zn=10:1:3 or a neighborhood thereof, or the like can be used as the oxide 530b.

As the oxide 530b, it is also possible to use a metal oxide having a composition of In:Zn=2:1, a composition of In:Zn=5:1, a composition of In:Zn=10:1, or a composition in the neighborhood of any one of these compositions, other than the above-described compositions.

These oxide 530a, the oxide 530b, and the oxide 530c are preferably combined to satisfy the above relation of the atomic ratios. For example, it is preferable that the oxide 530a and the oxide 530c each be a metal oxide having a composition of In:Ga:Zn=1:3:4 or a composition in the neighborhood thereof and the oxide 530b be a metal oxide having a composition of In:Ga:Zn=4:2:3 to 4:2:4.1 or a composition in the neighborhood thereof. Note that the above composition represents the atomic ratio of an oxide formed over a base or the atomic ratio of a sputtering target. Moreover, the proportion of In is preferably increased in the composition of the oxide 530b because the transistor can have a higher on-state current, higher field effect mobility, or the like.

The energy of the conduction band minimum of the oxide 530a and the oxide 530c is preferably higher than the energy of the conduction band minimum of the oxide 530b. In other words, the electron affinity of the oxide 530a and the oxide 530c is preferably smaller than the electron affinity of the oxide 530b.

Here, the energy level of the conduction band minimum gradually changes at junction portions of the oxide 530a, the oxide 530b, and the oxide 530c. In other words, the energy level of the conduction band minimum at the junction portions of the oxide 530a, the oxide 530b, and the oxide 530c continuously changes or is continuously connected. To change the energy level gradually, the density of defect states in a mixed layer formed at the interface between the oxide 530a and the oxide 530b and the interface between the oxide 530b and the oxide 530c is decreased.

Specifically, when the oxide 530a and the oxide 530b or the oxide 530b and the oxide 530c contain a common element (as a main component) in addition to oxygen, a mixed layer with a low density of defect states can be formed. For example, in the case where the oxide 530b is an In—Ga—Zn oxide, it is preferable to use an In—Ga—Zn oxide, a Ga—Zn oxide, gallium oxide, or the like as the oxide 530a and the oxide 530c.

At this time, the oxide 530b serves as a main carrier path. When the oxide 530a and the oxide 530c have the above structure, the density of defect states at the interface between the oxide 530a and the oxide 530b and the interface between the oxide 530b and the oxide 530c can be made low. Thus, the influence of interface scattering on carrier conduction is small, and the transistor 500 can have a high on-state current.

The conductor 542a and the conductor 542b functioning as the source electrode and the drain electrode are provided over the oxide 530b. For the conductor 542a and the conductor 542b, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that maintain their conductivity even after absorbing oxygen. Furthermore, a metal nitride film of tantalum nitride or the like is preferable because it has a barrier property against hydrogen or oxygen.

The conductor 542a and the conductor 542b are shown to have a single-layer structure in FIG. 63A and FIG. 63B, but may have a stacked-layer structure of two or more layers. For example, it is preferable to stack a tantalum nitride film and a tungsten film. Alternatively, a titanium film and an aluminum film may be stacked. Alternatively, a two-layer structure in which an aluminum film is stacked over a tungsten film, a two-layer structure in which a copper film is stacked over a copper-magnesium-aluminum alloy film, a two-layer structure in which a copper film is stacked over a titanium film, or a two-layer structure in which a copper film is stacked over a tungsten film may be employed.

Other examples include a three-layer structure in which a titanium film or a titanium nitride film is formed, an aluminum film or a copper film is stacked over the titanium film or the titanium nitride film, and a titanium film or a titanium nitride film is formed over the aluminum film or the copper film; and a three-layer structure in which a molybdenum film or a molybdenum nitride film is formed, an aluminum film or a copper film is stacked over the molybdenum film or the molybdenum nitride film, and a molybdenum film or a molybdenum nitride film is formed over the aluminum film or the copper film. Note that a transparent conductive material containing indium oxide, tin oxide, or zinc oxide may be used.

As illustrated in FIG. 63A, a region 543a and a region 543b are sometimes formed as low-resistance regions in the oxide 530 at and near the interface with the conductor 542a (the conductor 542b). In this case, the region 543a functions as one of a source region and a drain region, and the region 543b functions as the other of the source region and the drain region. Furthermore, the channel formation region is formed in a region sandwiched between the region 543a and the region 543b.

When the conductor 542a (the conductor 542b) is provided to be in contact with the oxide 530, the oxygen concentration in the region 543a (the region 543b) sometimes decreases. In addition, a metal compound layer that contains the metal contained in the conductor 542a (the conductor 542b) and the component of the oxide 530 is sometimes formed in the region 543a (the region 543b). In such a case, the carrier concentration of the region 543a (the region 543b) increases, and the region 543a (the region 543b) becomes a low-resistance region.

The insulator 544 is provided to cover the conductor 542a and the conductor 542b and inhibits oxidation of the conductor 542a and the conductor 542b. At this time, the insulator 544 may be provided to cover a side surface of the oxide 530 and to be in contact with the insulator 524.

A metal oxide containing one or more selected from hafnium, aluminum, gallium, yttrium, zirconium, tungsten, titanium, tantalum, nickel, germanium, neodymium, lanthanum, magnesium, and the like can be used as the insulator 544. Moreover, silicon nitride oxide, silicon nitride, or the like can be used as the insulator 544.

It is particularly preferable to use an insulator containing an oxide of one or both of aluminum and hafnium, such as aluminum oxide, hafnium oxide, or an oxide containing aluminum and hafnium (hafnium aluminate), as the insulator 544. In particular, hafnium aluminate has higher heat resistance than a hafnium oxide film. Therefore, hafnium aluminate is preferable because it is less likely to be crystallized by heat treatment in a later step. Note that the insulator 544 is not an essential component when the conductor 542*a* and the conductor 542*b* are oxidation-resistant materials or do not significantly lose the conductivity even after absorbing oxygen. Design is appropriately determined in consideration of required transistor characteristics.

With the insulator 544, diffusion of impurities such as water and hydrogen contained in the insulator 580 into the oxide 530*b* through the oxide 530*c* and the insulator 550 can be inhibited. Furthermore, oxidation of the conductor 560 due to excess oxygen contained in the insulator 580 can be inhibited.

The insulator 550 functions as a first gate insulating film. The insulator 550 is preferably positioned in contact with the inner side (the top surface and the side surface) of the oxide 530*c*. Like the insulator 524 described above, the insulator 550 is preferably formed using an insulator that contains excess oxygen and releases oxygen by heating.

Specifically, it is possible to use any of silicon oxide, silicon oxynitride, silicon nitride oxide, silicon nitride, silicon oxide to which fluorine is added, silicon oxide to which carbon is added, silicon oxide to which carbon and nitrogen are added, and porous silicon oxide, each of which contains excess oxygen. In particular, silicon oxide and silicon oxynitride, which have thermal stability, are preferable.

When an insulator that releases oxygen by heating is provided as the insulator 550 in contact with the top surface of the oxide 530*c*, oxygen can be effectively supplied from the insulator 550 to the channel formation region of the oxide 530*b* through the oxide 530*c*. Furthermore, as in the insulator 524, the concentration of impurities such as water or hydrogen in the insulator 550 is preferably lowered. The thickness of the insulator 550 is preferably greater than or equal to 1 nm and less than or equal to 20 nm.

To efficiently supply excess oxygen contained in the insulator 550 to the oxide 530, a metal oxide may be provided between the insulator 550 and the conductor 560. The metal oxide preferably inhibits diffusion of oxygen from the insulator 550 to the conductor 560. Providing the metal oxide that inhibits diffusion of oxygen inhibits diffusion of excess oxygen from the insulator 550 to the conductor 560. That is, a reduction in the amount of excess oxygen supplied to the oxide 530 can be inhibited. Moreover, oxidation of the conductor 560 due to excess oxygen can be inhibited. For the metal oxide, a material that can be used for the insulator 544 is used.

Note that the insulator 550 may have a stacked-layer structure like the second gate insulating film. As miniaturization and high integration of transistors progress, a problem such as leakage current may arise because of a thinner gate insulating film; for that reason, when the insulator functioning as a gate insulating film has a stacked-layer structure of a high-k material and a thermally stable material, a gate potential at the time when the transistor operates can be lowered while the physical thickness of the gate insulating film is maintained. Furthermore, the stacked-layer structure can be thermally stable and have a high dielectric constant.

The conductor 560 functioning as the first gate electrode is shown to have a two-layer structure in FIG. 63A and FIG. 63B, but may have a single-layer structure or a stacked-layer structure of three or more layers.

For the conductor 560*a*, it is preferable to use a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, and the like), and a copper atom. Alternatively, it is preferable to use a conductive material having a function of inhibiting diffusion of oxygen (e.g., at least one of an oxygen atom, an oxygen molecule, and the like). When the conductor 560*a* has a function of inhibiting diffusion of oxygen, it is possible to inhibit a reduction in conductivity of the conductor 560*b* due to oxidation caused by oxygen contained in the insulator 550. As a conductive material having a function of inhibiting oxygen diffusion, tantalum, tantalum nitride, ruthenium, or ruthenium oxide is preferably used, for example. For the conductor 560*a*, the oxide semiconductor that can be used as the oxide 530 can be used. In that case, when the conductor 560*b* is deposited by a sputtering method, the conductor 560*a* can have a reduced electrical resistance value to be a conductor. This can be referred to as an OC (Oxide Conductor) electrode.

For the conductor 560*b*, it is preferable to use a conductive material containing tungsten, copper, or aluminum as its main component. Furthermore, the conductor 560*b* also functions as a wiring and thus a conductor having high conductivity is preferably used for the conductor 560*b*. For example, a conductive material containing tungsten, copper, or aluminum as its main component can be used. Moreover, the conductor 560*b* may have a stacked-layer structure, for example, a stacked-layer structure of any of the above conductive materials and titanium or titanium nitride.

The insulator 580 is provided over the conductor 542*a* and the conductor 542*b* with the insulator 544 therebetween. The insulator 580 preferably includes an excess-oxygen region. For example, the insulator 580 preferably contains silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. Silicon oxide and silicon oxynitride, which have thermal stability, are particularly preferable. In particular, silicon oxide and porous silicon oxide are preferable because an excess-oxygen region can be easily formed in a later step.

The insulator 580 preferably includes an excess-oxygen region. When the insulator 580 that releases oxygen by heating is provided in contact with the oxide 530*c*, oxygen in the insulator 580 can be efficiently supplied to the oxide 530 through the oxide 530*c*. The concentration of impurities such as water or hydrogen in the insulator 580 is preferably lowered.

The opening in the insulator 580 is formed to overlap with the region between the conductor 542*a* and the conductor 542*b*. Accordingly, the conductor 560 is formed to be embedded in the opening in the insulator 580 and the region sandwiched between the conductor 542*a* and the conductor 542*b*.

The gate length needs to be short for miniaturization of the semiconductor device, but it is necessary to prevent a reduction in conductivity of the conductor 560. When the conductor 560 is made thick to achieve this, the conductor 560 might have a shape with a high aspect ratio. In this embodiment, the conductor 560 is provided to be embedded in the opening in the insulator 580; thus, even when the conductor 560 has a shape with a high aspect ratio, the conductor 560 can be formed without collapsing during the process.

The insulator 574 is preferably provided in contact with a top surface of the insulator 580, a top surface of the conductor 560, and a top surface of the insulator 550. When the insulator 574 is deposited by a sputtering method, an excess-oxygen region can be provided in the insulator 550 and the insulator 580. Thus, oxygen can be supplied from the excess-oxygen regions to the oxide 530.

For example, a metal oxide containing one or more selected from hafnium, aluminum, gallium, yttrium, zirconium, tungsten, titanium, tantalum, nickel, germanium, magnesium, and the like can be used as the insulator 574.

In particular, aluminum oxide has a high barrier property, and even a thin aluminum oxide film having a thickness of greater than or equal to 0.5 nm and less than or equal to 3.0 nm can inhibit diffusion of hydrogen and nitrogen. Thus, aluminum oxide deposited by a sputtering method serves as an oxygen supply source and can also have a function of a barrier film against impurities such as hydrogen.

An insulator 581 functioning as an interlayer film is preferably provided over the insulator 574. As in the insulator 524 and the like, the concentration of impurities such as water or hydrogen in the insulator 581 is preferably lowered.

A conductor 540a and a conductor 540b are positioned in openings formed in the insulator 581, the insulator 574, the insulator 580, and the insulator 544. The conductor 540a and the conductor 540b are provided to face each other with the conductor 560 sandwiched therebetween. The conductor 540a and the conductor 540b each have a structure similar to that of a conductor 546 and a conductor 548 that will be described later.

An insulator 582 is provided over the insulator 581. A substance having a barrier property against oxygen or hydrogen is preferably used for the insulator 582. Therefore, a material similar to that for the insulator 514 can be used for the insulator 582. For example, a metal oxide such as aluminum oxide, hafnium oxide, or tantalum oxide is preferably used for the insulator 582.

In particular, aluminum oxide has an excellent blocking effect that prevents transmission of oxygen and impurities such as hydrogen and moisture which would cause a change in the electrical characteristics of the transistor. Accordingly, the use of aluminum oxide can prevent entry of impurities such as hydrogen and moisture into the transistor 500 in and after the manufacturing process of the transistor. In addition, release of oxygen from the oxide included in the transistor 500 can be inhibited. Therefore, aluminum oxide is suitably used for a protective film of the transistor 500.

An insulator 586 is provided over the insulator 582. For the insulator 586, a material similar to that for the insulator 320 can be used. Furthermore, when a material with a comparatively low permittivity is used for these insulators, parasitic capacitance generated between wirings can be reduced. A silicon oxide film, a silicon oxynitride film, or the like can be used for the insulator 586, for example.

The conductor 546, the conductor 548, and the like are embedded in the insulator 520, the insulator 522, the insulator 524, the insulator 544, the insulator 580, the insulator 574, the insulator 581, the insulator 582, and the insulator 586.

The conductor 546 and the conductor 548 function as plugs or wirings that are connected to the capacitor 600, the transistor 500, or the transistor 300. The conductor 546 and the conductor 548 can be provided using a material similar to those for the conductor 328 and the conductor 330.

Note that after the transistor 500 is formed, an opening may be formed to surround the transistor 500 and an insulator having a high barrier property against hydrogen or water may be formed to cover the opening. Surrounding the transistor 500 by the insulator having a high barrier property can prevent entry of moisture and hydrogen from the outside. Alternatively, a plurality of transistors 500 may be collectively surrounded by the insulator having a high barrier property against hydrogen or water. In the case where an opening is formed to surround the transistor 500, for example, the formation of an opening reaching the insulator 514 or the insulator 522 and the formation of the insulator having a high barrier property in contact with the insulator 514 or the insulator 522 are suitable because these formation steps can also serve as some of the manufacturing steps of the transistor 500. For the insulator having a high barrier property against hydrogen or water, a material similar to that for the insulator 522 is used, for example.

The capacitor 600 is provided above the transistor 500. The capacitor 600 includes a conductor 610, a conductor 620, and an insulator 630.

A conductor 612 may be provided over the conductor 546 and the conductor 548. The conductor 612 has a function of a plug or a wiring that is connected to the transistor 500. The conductor 610 has a function of an electrode of the capacitor 600. The conductor 612 and the conductor 610 can be formed at the same time.

As the conductor 612 and the conductor 610, it is possible to use a metal film containing an element selected from molybdenum, titanium, tantalum, tungsten, aluminum, copper, chromium, neodymium, and scandium; a metal nitride film containing any of the above elements as its component (a tantalum nitride film, a titanium nitride film, a molybdenum nitride film, or a tungsten nitride film); or the like. Alternatively, it is possible to use a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

The conductor 612 and the conductor 610 are each shown to have a single-layer structure in FIG. 61; however, the structure is not limited thereto, and a stacked-layer structure of two or more layers may be employed. For example, between a conductor having a barrier property and a conductor having high conductivity, a conductor that is highly adhesive to the conductor having a barrier property and the conductor having high conductivity may be formed.

The conductor 620 is provided to overlap with the conductor 610 with the insulator 630 therebetween. For the conductor 620, a conductive material such as a metal material, an alloy material, or a metal oxide material can be used. It is preferable to use a high-melting-point material that has both heat resistance and conductivity, such as tungsten or molybdenum, and it is particularly preferable to use tungsten. In addition, in the case where the conductor 620 is formed concurrently with another component such as a conductor, Cu (copper), Al (aluminum), or the like, which is a low-resistance metal material, is used.

An insulator 650 is provided over the conductor 620 and the insulator 630. The insulator 650 can be provided using a material similar to that for the insulator 320. The insulator 650 may function as a planarization film that covers an uneven shape thereunder.

With the use of this structure, a change in electrical characteristics can be inhibited and reliability can be improved in a semiconductor device using a transistor including an oxide semiconductor. Alternatively, a semiconductor device using a transistor including an oxide semiconductor can be miniaturized or highly integrated.

Figure 64A:
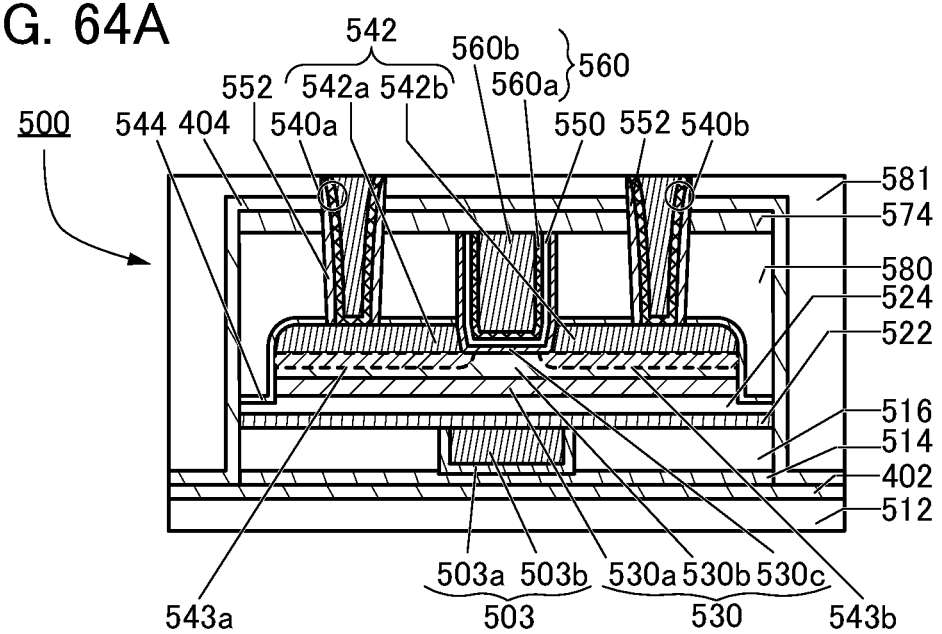
FIG. 64A and FIG. 64B are schematic cross-sectional views showing a structure example of a transistor.
Figure 64B:
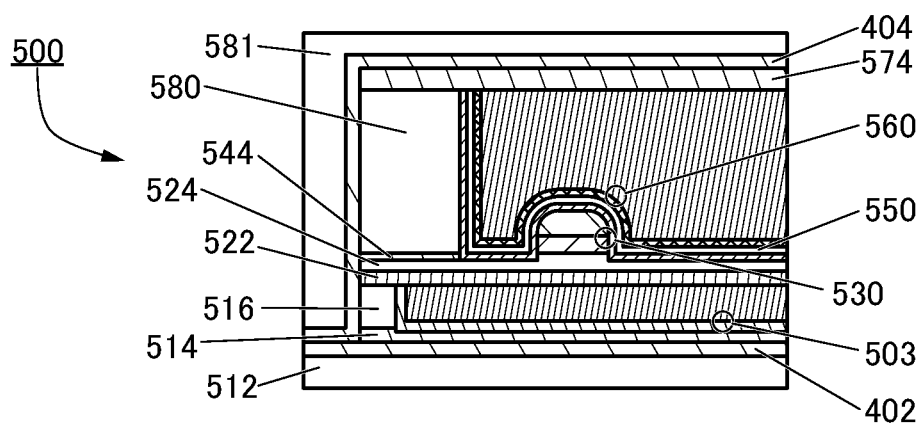

Next, other structure examples of the OS transistors illustrated in FIG. 61 and FIG. 62 are described. FIG. 64A and FIG. 64B show a modification example of the transistor 500 illustrated in FIG. 63A and FIG. 63B; FIG. 64A is a cross-sectional view of the transistor 500 in the channel length direction and FIG. 64B is a cross-sectional view of the transistor 500 in the channel width direction. Note that the structure illustrated in FIG. 64A and FIG. 64B can also be employed for other transistors, such as the transistor 300, included in the semiconductor device of one embodiment of the present invention.

The transistor 500 having the structure illustrated in FIG. 64A and FIG. 64B is different from the transistor 500 having the structure illustrated in FIG. 63A and FIG. 63B in including an insulator 402 and an insulator 404. Another difference from the transistor 500 having the structure illustrated in FIG. 63A and FIG. 63B is that an insulator 552 is provided in contact with a side surface of the conductor 540a and the insulator 552 is provided in contact with a side surface of the conductor 540b. Another difference from the transistor 500 having the structure illustrated in FIG. 63A and FIG. 63B is that the insulator 520 is not included.

In the transistor 500 having the structure illustrated in FIG. 64A and FIG. 64B, the insulator 402 is provided over the insulator 512. In addition, the insulator 404 is provided over the insulator 574 and the insulator 402.

In the transistor 500 having the structure illustrated in FIG. 64A and FIG. 64B, the insulator 514, the insulator 516, the insulator 522, the insulator 524, the insulator 544, the insulator 580, and the insulator 574 are provided and covered with the insulator 404. That is, the insulator 404 is in contact with a top surface of the insulator 574, a side surface of the insulator 574, a side surface of the insulator 580, a side surface of the insulator 544, a side surface of the insulator 524, a side surface of the insulator 522, a side surface of the insulator 516, a side surface of the insulator 514, and a top surface of the insulator 402. Thus, the oxide 530 and the like are isolated from the outside by the insulator 404 and the insulator 402.

The insulator 402 and the insulator 404 preferably have high capability of inhibiting diffusion of hydrogen (e.g., at least one of a hydrogen atom, a hydrogen molecule, and the like) or a water molecule. For example, for the insulator 402 and the insulator 404, silicon nitride or silicon nitride oxide that is a material having a high hydrogen barrier property is preferably used. This can inhibit diffusion of hydrogen or the like into the oxide 530, thereby suppressing the degradation of the characteristics of the transistor 500. Consequently, the reliability of the semiconductor device of one embodiment of the present invention can be increased.

The insulator 552 is provided in contact with the insulator 581, the insulator 404, the insulator 574, the insulator 580, and the insulator 544. The insulator 552 preferably has a function of inhibiting diffusion of hydrogen or water molecules. For example, as the insulator 552, an insulator such as silicon nitride, aluminum oxide, or silicon nitride oxide that is a material having a high hydrogen barrier property is preferably used. In particular, silicon nitride is suitably used for the insulator 552 because it is a material having high hydrogen barrier property. The use of a material having a high hydrogen barrier property for the insulator 552 can inhibit diffusion of impurities such as water and hydrogen from the insulator 580 and the like into the oxide 530 through the conductor 540a and the conductor 540b. Furthermore, oxygen contained in the insulator 580 can be inhibited from being absorbed by the conductor 540a and the conductor 540b. As described above, the reliability of the semiconductor device of one embodiment of the present invention can be increased.

Figure 65:
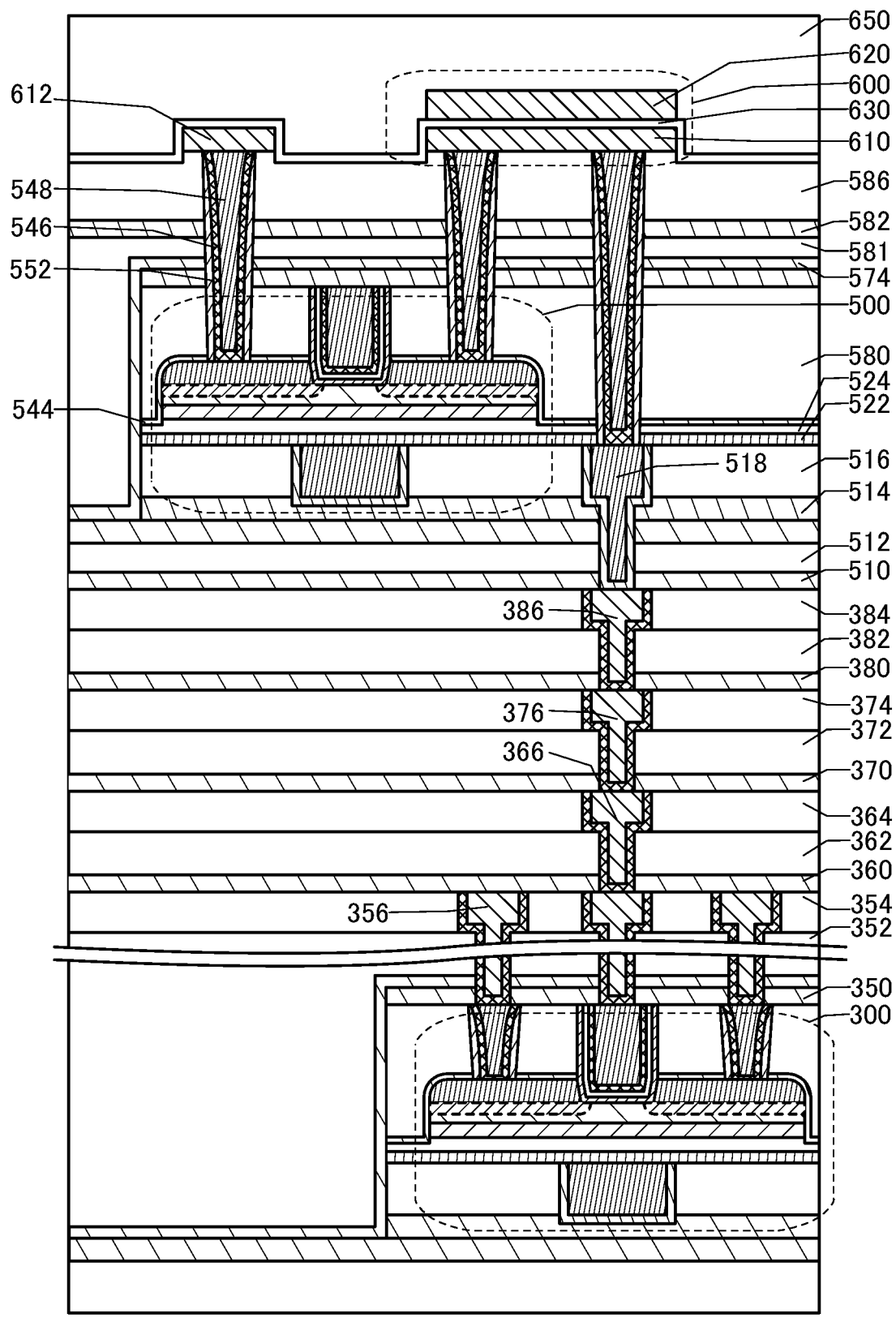
FIG. 65 is a schematic cross-sectional view showing a structure example of a semiconductor device.

FIG. 65 is a cross-sectional view showing a structure example of a semiconductor device in the case where the transistor 500 and the transistor 300 each have the structure illustrated in FIG. 64A and FIG. 64B. The insulator 552 is provided on a side surface of the conductor 546.

Figure 66A:
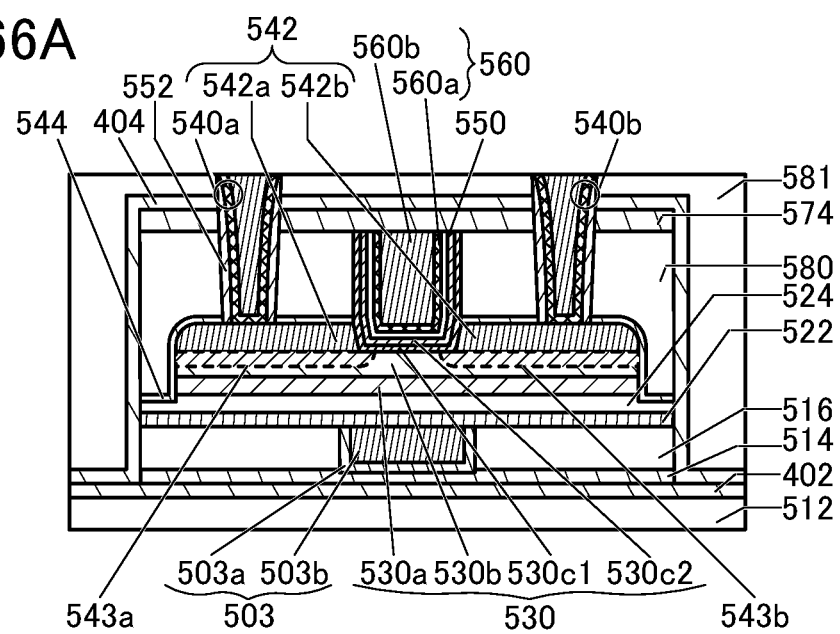
FIG. 66A and FIG. 66B are schematic cross-sectional views showing a structure example of a transistor.
Figure 66B:
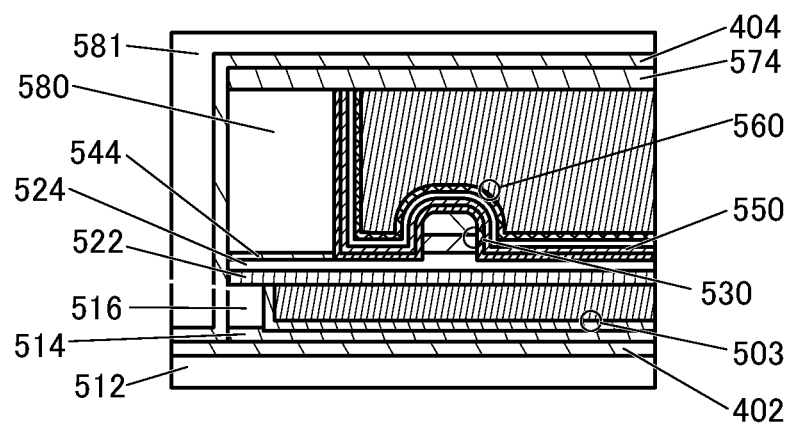

The transistor structure of the transistor 500 illustrated in FIG. 64A and FIG. 64B may be changed according to circumstances. As the modification example of the transistor 500 illustrated in FIG. 64A and FIG. 64B, a transistor illustrated in FIG. 66 can be employed, for example. FIG. 66A is a cross-sectional view of the transistor in the channel length direction and FIG. 66B is a cross-sectional view of the transistor in the channel width direction. The transistor illustrated in FIG. 66A and FIG. 66B is different from the transistor illustrated in FIG. 64A and FIG. 64B in that the oxide 530c has a two-layer structure of an oxide 530c1 and an oxide 530c2.

The oxide 530c1 is in contact with a top surface of the insulator 524, a side surface of the oxide 530a, a top surface and a side surface of the oxide 530b, side surfaces of the conductor 542a and the conductor 542b, a side surface of the insulator 544, and a side surface of the insulator 580. The oxide 530c2 is in contact with the insulator 550.

An In—Zn oxide can be used as the oxide 530c1, for example. As the oxide 530c2, it is possible to use a material similar to a material that can be used for the oxide 530c when the oxide 530c has a single-layer structure. As the oxide 530c2, a metal oxide with n:Ga:Zn=1:3:4 [atomic ratio], Ga:Zn=2:1 [atomic ratio], or Ga:Zn=2:5 [atomic ratio] can be used, for example.

When the oxide 530c has a two-layer structure of the oxide 530c1 and the oxide 530c2, the on-state current of the transistor can be increased as compared with the case where the oxide 530c has a single-layer structure. Thus, the transistor can be used as a power MOS transistor, for example. Note that the oxide 530c included in the transistor having the structure illustrated in FIG. 63A and FIG. 63B can also have a two-layer structure of the oxide 530c1 and the oxide 530c2.

The transistor having the structure illustrated in FIG. 66A and FIG. 66B can be used as, for example, the transistor 300 illustrated in FIG. 61 and FIG. 62. Alternatively, as described above, the transistor 300 can be used as the transistor M2 and the like of the circuit MP included in the arithmetic circuit 110, the arithmetic circuit 120, the arithmetic circuit 130, the arithmetic circuit 140, the arithmetic circuit 150, the arithmetic circuit 160, and the arithmetic circuit 170, for example. Note that the transistor illustrated in FIG. 66A and FIG. 66B can be used as a transistor included in the semiconductor device of one embodiment of the present invention, other than the transistors 300 and 500.

Figure 67:
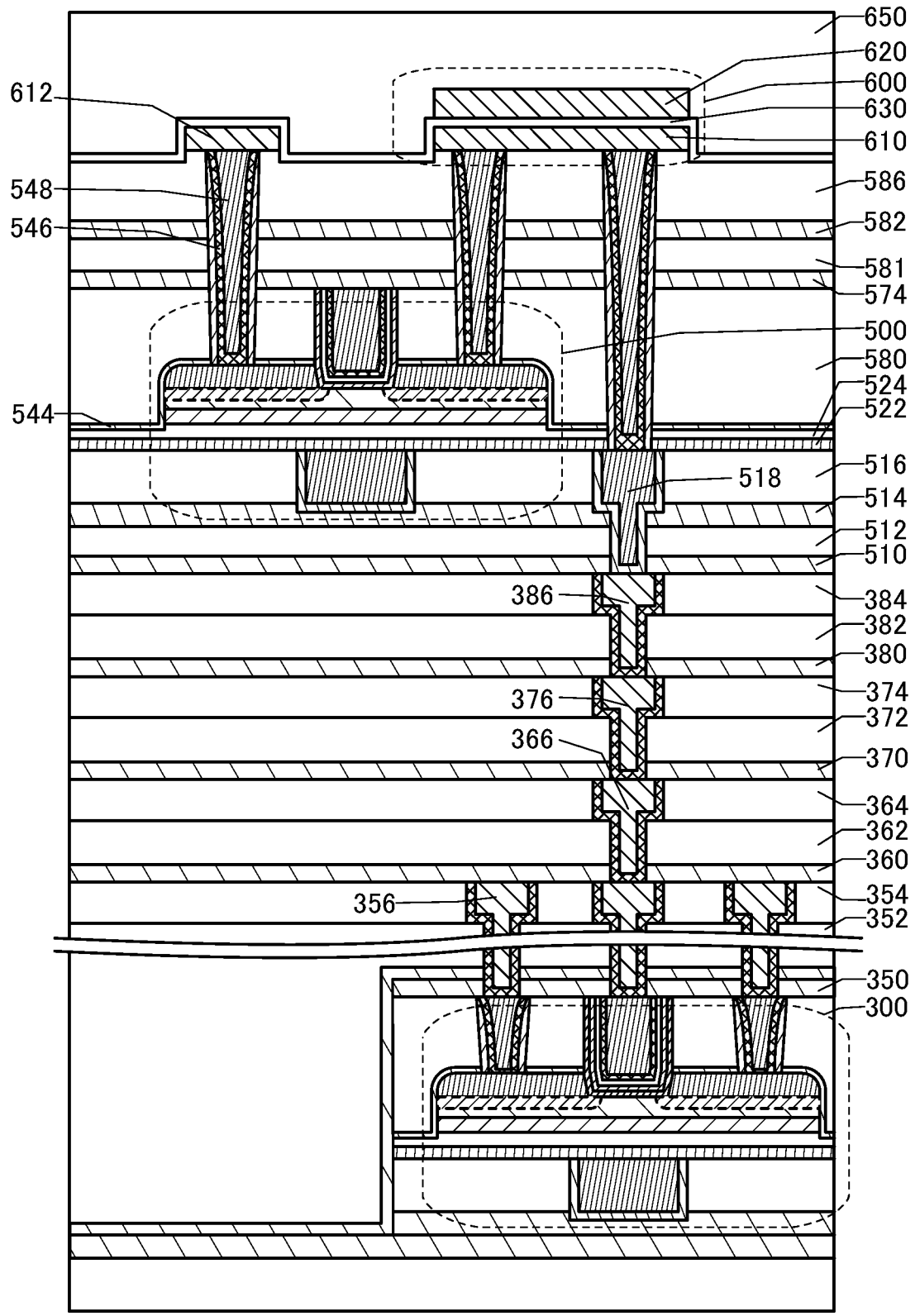
FIG. 67 is a schematic cross-sectional view showing a structure example of a semiconductor device.

FIG. 67 is a cross-sectional view showing a structure example of a semiconductor device in the case where the transistor 500 has the transistor structure illustrated in FIG. 63A and the transistor 300 has the transistor structure illustrated in FIG. 66A. Note that as in FIG. 65, the structure is employed in which the insulator 552 is provided on the side surface of the conductor 546. As illustrated in FIG. 67, in the semiconductor device of one embodiment of the present invention, the transistor 300 and the transistor 500 can have different structures while the transistor 300 and the transistor 500 are both OS transistors.

Next, a capacitor that can be used in the semiconductor devices in FIG. 61 and FIG. 62 is described.

Figure 68A:
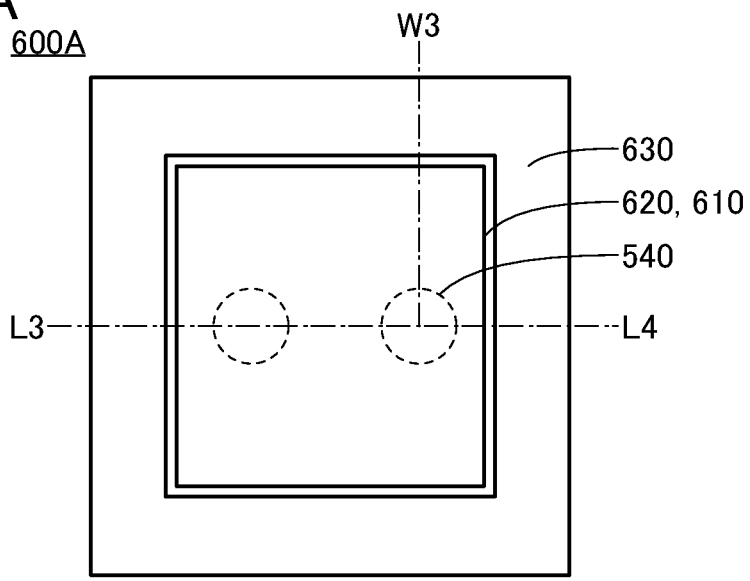
FIG. 68A is a top view showing a structure example of a capacitor.
Figure 68B:
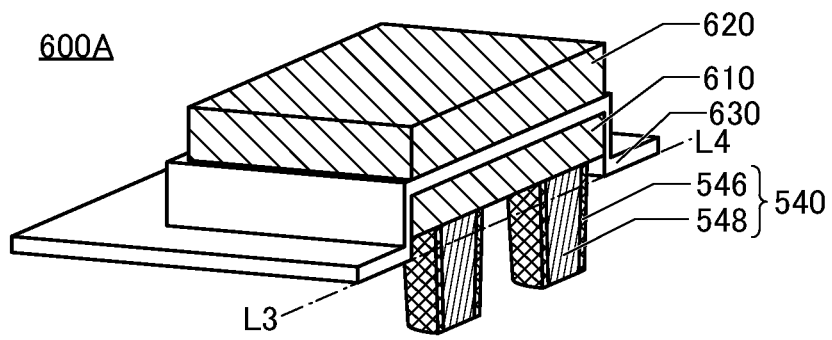
FIG. 68B and FIG. 68C are cross-sectional perspective views showing the structure example of the capacitor.
Figure 68C:
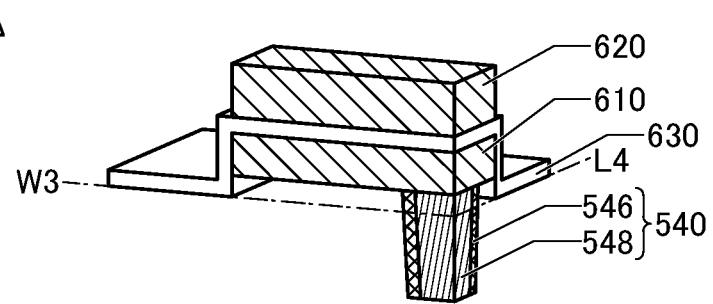

FIG. 68 illustrates a capacitor 600A as an example of the capacitor 600 that can be used in the semiconductor device illustrated in FIG. 61. FIG. 68A is a top view of the capacitor 600A, FIG. 68B is a perspective view illustrating a cross section of the capacitor 600A along the dashed-dotted line L3-L4, and FIG. 68C is a perspective view illustrating a cross section of the capacitor 600A along the dashed-dotted line W3-L4.

The conductor 610 functions as one of a pair of electrodes of the capacitor 600A, and the conductor 620 functions as the other of the pair of electrodes of the capacitor 600A. The insulator 630 functions as a dielectric sandwiched between the pair of electrodes.

The insulator 630 can be provided to have a single-layer structure or a stacked-layer structure using, for example, silicon oxide, silicon oxynitride, silicon nitride oxide, silicon nitride, aluminum oxide, aluminum oxynitride, aluminum nitride oxide, aluminum nitride, hafnium oxide, hafnium oxynitride, hafnium nitride oxide, hafnium nitride, or zirconium oxide.

Alternatively, for the insulator 630, a stacked-layer structure using a material with high dielectric strength such as silicon oxynitride and a high permittivity (high-k) material may be used, for example. In the capacitor 600A having such a structure, a sufficient capacitance can be ensured owing to the high permittivity (high-k) insulator, and the dielectric strength can be increased owing to the insulator with high dielectric strength, so that the electrostatic breakdown of the capacitor 600A can be inhibited.

As the insulator of a high permittivity (high-k) material (high dielectric constant material), gallium oxide, hafnium oxide, zirconium oxide, an oxide containing aluminum and hafnium, an oxynitride containing aluminum and hafnium, an oxide containing silicon and hafnium, an oxynitride containing silicon and hafnium, a nitride containing silicon and hafnium, or the like can be given.

Alternatively, for example, a single layer or stacked layers of an insulator containing a high-k material, such as aluminum oxide, hafnium oxide, tantalum oxide, zirconium oxide, lead zirconate titanate (PZT), strontium titanate ($SrTiO_3$), or $(Ba,Sr)TiO_3$ (BST), may be used as the insulator 630. In the case where the insulator 630 has stacked layers, a three-layer structure in which zirconium oxide, aluminum oxide, and zirconium oxide are formed in this order, or a four-layer structure in which zirconium oxide, aluminum oxide, zirconium oxide, and aluminum oxide are formed in this order can be employed, for example. For the insulator 630, a compound containing hafnium and zirconium may be employed. As miniaturization and high integration of a semiconductor device progress, a problem such as leakage current from a transistor and a capacitor may arise because of a thinner gate insulator and a thinner dielectric used for a capacitor. When a high-k material is used as a gate insulator and an insulator functioning as a dielectric used for a capacitor, a gate potential during operation of the transistor can be lowered and capacitance of the capacitor can be ensured while the physical thickness is maintained.

The bottom portion of the conductor 610 in the capacitor 600A is electrically connected to the conductor 546 and the conductor 548. The conductor 546 and the conductor 548 function as plugs or wirings for connection to another circuit element. In FIG. 68A to FIG. 68C, the conductor 546 and the conductor 548 are collectively denoted as a conductor 540.

For clarification of the drawing, the insulator 586 in which the conductor 546 and the conductor 548 are embedded and the insulator 650 that covers the conductor 620 and the insulator 630 are omitted in FIG. 68A to FIG. 68C.

Although the capacitor 600 illustrated in each of FIG. 61, FIG. 62, and FIG. 68A to FIG. 68C is a planar capacitor, the shape of the capacitor is not limited thereto. For example, the capacitor 600 may be a cylindrical capacitor 600B illustrated in FIG. 69A to FIG. 69C.

Figure 69A:
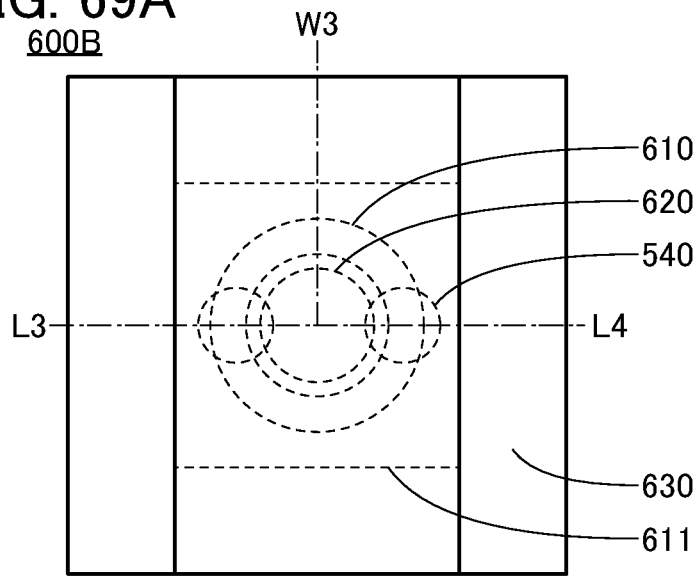
FIG. 69A is a top view showing a structure example of a capacitor.
Figure 69B:
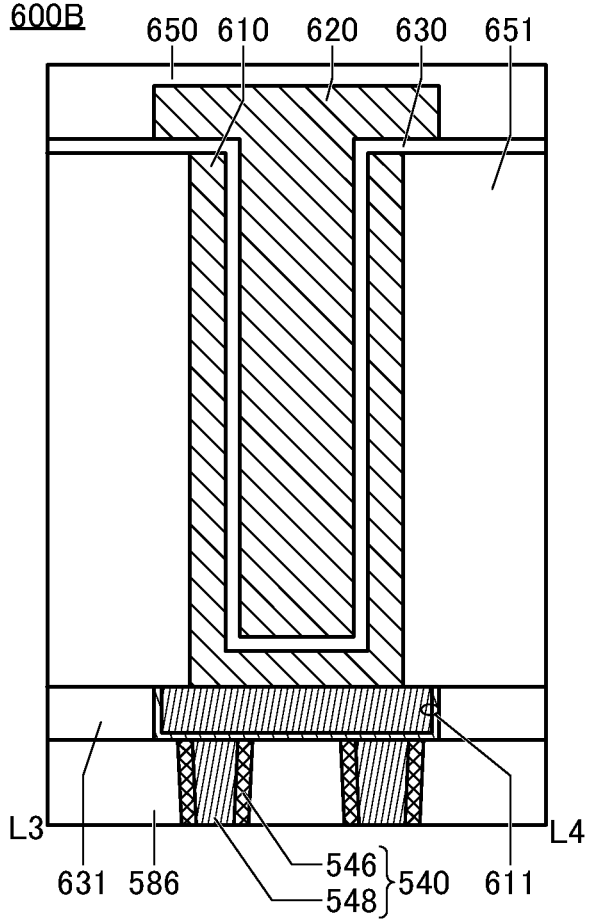
FIG. 69B is a cross-sectional view showing the structure example of the capacitor.
Figure 69C:
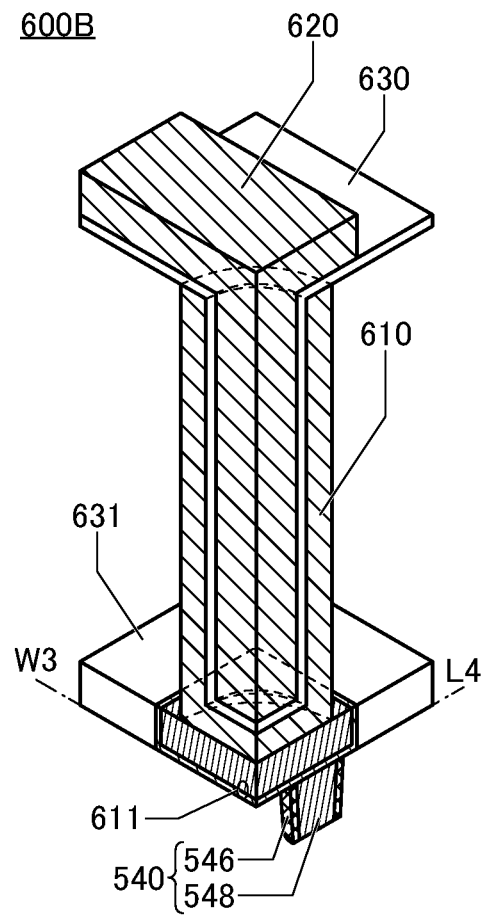
FIG. 69C is a cross-sectional perspective view showing the structure example of the capacitor.

FIG. 69A is a top view of the capacitor 600B, FIG. 69B is a perspective view illustrating a cross section of the capacitor 600B along the dashed-dotted line L3-L4, and FIG. 69C is a perspective view illustrating a cross section of the capacitor 600B along the dashed-dotted line W3-L4.

In FIG. 69B, the capacitor 600B includes an insulator 631 over the insulator 586 in which the conductor 540 is embedded, an insulator 651 having an opening, the conductor 610 functioning as one of a pair of electrodes, and the conductor 620 functioning as the other of the pair of electrodes.

For clarification of the drawing, the insulator 586, the insulator 650, and the insulator 651 are omitted in FIG. 69C.

For the insulator 631, a material similar to that for the insulator 586 can be used, for example.

A conductor 611 is embedded in the insulator 631 to be electrically connected to the conductor 540. For the conductor 611, a material similar to those for the conductor 330 and the conductor 518 can be used, for example.

For the insulator 651, a material similar to that for the insulator 586 can be used, for example.

The insulator 651 has an opening as described above, and the opening overlaps with the conductor 611.

The conductor 610 is formed on the bottom portion and the side surface of the opening. In other words, the conductor 610 overlaps with the conductor 611 and is electrically connected to the conductor 611.

The conductor 610 is formed in such a manner that an opening portion is formed in the insulator 651 by an etching method or the like, and then the conductor 610 is deposited by a sputtering method, an ALD method, or the like. After that, the conductor 610 deposited over the insulator 651 is removed by a CMP (Chemical Mechanical Polishing) method or the like while the conductor 610 deposited in the opening portion is left.

The insulator 630 is positioned over the insulator 651 and over the formation surface of the conductor 610. Note that the insulator 630 functions as a dielectric sandwiched between the pair of electrodes in the capacitor.

The conductor 620 is formed over the insulator 630 so as to fill the opening portion of the insulator 651.

The insulator 650 is formed to cover the insulator 630 and the conductor 620.

The capacitance value of the cylindrical capacitor 600B illustrated in FIG. 69A to FIG. 69C can be higher than that of the planar capacitor 600A. Thus, when the capacitor 600B is used as the capacitors C1 and C2, described in the above embodiment, for example, a voltage between the terminals of the capacitor can be maintained for a long time.

Note that this embodiment can be combined with any of the other embodiments described in this specification as appropriate.

Embodiment 5

In this embodiment, the compositions of a CAC-OS (Cloud-Aligned Composite Oxide Semiconductor) and a CAAC-OS (c-axis Aligned Crystalline Oxide Semiconductor) which are metal oxides that can be used in the OS transistor described in the above embodiment is described. Note that in this specification and the like, CAC refers to an example of a function or a material composition and CAAC refers to an example of a crystal structure.

<Composition of Metal Oxide>

A CAC-OS or a CAC-metal oxide has a conducting function in part of the material and has an insulating function in another part of the material; as a whole, the CAC-OS or the CAC-metal oxide has a function of a semiconductor. In the case where the CAC-OS or the CAC-metal oxide is used in an active layer of a transistor, the conducting function is a function of allowing electrons (or holes) serving as carriers to flow, and the insulating function is a function of not allowing electrons serving as carriers to flow. By the complementary action of the conducting function and the insulating function, a switching function (On/Off function) can be given to the CAC-OS or the CAC-metal oxide. In the CAC-OS or the CAC-metal oxide, separation of the functions can maximize each function.

The CAC-OS or the CAC-metal oxide includes conductive regions and insulating regions. The conductive regions have the above-described conducting function, and the insulating regions have the above-described insulating function. In some cases, the conductive regions and the insulating regions in the material are separated at the nanoparticle level. In some cases, the conductive regions and the insulating regions are unevenly distributed in the material. In some cases, the conductive regions are observed to be coupled in a cloud-like manner with their boundaries blurred.

In the CAC-OS or the CAC-metal oxide, the conductive regions and the insulating regions each have a size greater than or equal to 0.5 nm and less than or equal to 10 nm, preferably greater than or equal to 0.5 nm and less than or equal to 3 nm and are dispersed in the material in some cases.

The CAC-OS or the CAC-metal oxide includes components having different band gaps. For example, the CAC-OS or the CAC-metal oxide includes a component having a wide gap due to the insulating region and a component having a narrow gap due to the conductive region. When carriers flow in this composition, carriers mainly flow in the component having a narrow gap. Furthermore, the component having a narrow gap complements the component having a wide gap, and carriers also flow in the component having a wide gap in conjunction with the component having a narrow gap. Therefore, in the case where the above-described CAC-OS or CAC-metal oxide is used in a channel region of a transistor, high current driving capability in the on state of the transistor, that is, a high on-state current and high field-effect mobility can be obtained.

In other words, the CAC-OS or the CAC-metal oxide can also be referred to as a matrix composite or a metal matrix composite.

<Structure of Metal Oxide>

Oxide semiconductors are classified into a single crystal oxide semiconductor and a non-single-crystal oxide semiconductor. Examples of a non-single-crystal oxide semiconductor include a CAAC-OS (c-axis aligned crystal crystalline oxide semiconductor), a polycrystalline oxide semiconductor, an nc-OS (nanocrystalline oxide semiconductor), an amorphous-like oxide semiconductor (a-like OS), and an amorphous oxide semiconductor.

The CAAC-OS has c-axis alignment, a plurality of nanocrystals are connected in the a-b plane direction, and its crystal structure has distortion. Note that the distortion refers to a portion where the direction of a lattice arrangement changes between a region with a regular lattice arrangement and another region with a regular lattice arrangement in a region where the plurality of nanocrystals are connected.

The nanocrystal is basically a hexagon but is not always a regular hexagon and is a non-regular hexagon in some cases. Furthermore, a pentagonal or heptagonal lattice arrangement, for example, is included in the distortion in some cases. Note that a clear crystal grain boundary (also referred to as grain boundary) cannot be observed even in the vicinity of distortion in the CAAC-OS. That is, formation of a crystal grain boundary is inhibited by the distortion of lattice arrangement. This is probably because the CAAC-OS can tolerate distortion owing to the low density of oxygen atom arrangement in the a-b plane direction, a change in interatomic bond distance by replacement of a metal element, and the like.

The CAAC-OS tends to have a layered crystal structure (also referred to as a layered structure) in which a layer containing indium and oxygen (hereinafter, In layer) and a layer containing the element M, zinc, and oxygen (hereinafter, (M,Zn) layer) are stacked. Note that indium and the element M can be replaced with each other, and when the element M in the (M,Zn) layer is replaced with indium, the layer can also be referred to as an (In,M,Zn) layer. When indium in the In layer is replaced with the element M, the layer can be referred to as an (In,M) layer.

The CAAC-OS is an oxide semiconductor with high crystallinity. Meanwhile, in the CAAC-OS, a reduction in electron mobility due to a crystal grain boundary is less likely to occur because a clear crystal grain boundary cannot be observed. Entry of impurities, formation of defects, or the like might decrease the crystallinity of the oxide semiconductor; thus, the CAAC-OS can be regarded as an oxide semiconductor that has small amounts of impurities and defects (e.g., oxygen vacancies). Thus, an oxide semiconductor including the CAAC-OS is physically stable. Therefore, the oxide semiconductor including the CAAC-OS is resistant to heat and has high reliability. In addition, the CAAC-OS is stable with respect to high temperature in the manufacturing process (what is called thermal budget). Accordingly, the use of the CAAC-OS for the OS transistor can extend the degree of freedom of the manufacturing process.

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor depending on the analysis method.

The a-like OS is an oxide semiconductor that has a structure between those of the nc-OS and the amorphous oxide semiconductor. The a-like OS includes a void or a low-density region. That is, the a-like OS has low crystallinity as compared with the nc-OS and the CAAC-OS.

An oxide semiconductor has various structures with different properties. Two or more of the amorphous oxide semiconductor, the polycrystalline oxide semiconductor, the a-like OS, the nc-OS, and the CAAC-OS may be included in an oxide semiconductor of one embodiment of the present invention.

<Transistor Including Oxide Semiconductor>

Next, the case where the above oxide semiconductor is used for a transistor is described.

When the above oxide semiconductor is used for a transistor, a transistor with high field-effect mobility can be achieved. In addition, a transistor having high reliability can be achieved.

An oxide semiconductor with a low carrier concentration is preferably used for a transistor. In the case where the carrier concentration of an oxide semiconductor film is reduced, the impurity concentration in the oxide semiconductor film is reduced so that the density of defect states is reduced. In this specification and the like, a state with a low impurity concentration and a low density of defect states is sometimes referred to as a highly purified intrinsic or substantially highly purified intrinsic state, or is sometimes referred to as an intrinsic or substantially intrinsic state.

A highly purified intrinsic or substantially highly purified intrinsic oxide semiconductor film has a low density of defect states and thus has a low density of trap states in some cases.

Charge trapped by the trap states in the oxide semiconductor takes a long time to disappear and might behave like fixed charge. Thus, a transistor whose channel formation region is formed in an oxide semiconductor with a high density of trap states has unstable electrical characteristics in some cases.

Accordingly, in order to stabilize the electrical characteristics of the transistor, reducing the impurity concentration in the oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon.

<Impurities>

Here, the influence of each impurity in the oxide semiconductor is described.

When silicon or carbon, which is one of Group 14 elements, is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by secondary ion mass spectrometry (SIMS)) are set lower than or equal to $2 \times 10^{18}$ atoms/cm$^3$, preferably lower than or equal to $2 \times 10^{17}$ atoms/cm$^3$.

When the oxide semiconductor contains an alkali metal or an alkaline earth metal, defect states are formed and carriers are generated in some cases. Thus, a transistor using an oxide semiconductor that contains an alkali metal or an alkaline earth metal is likely to have normally-on characteristics. Accordingly, it is preferable to reduce the concentration of an alkali metal or an alkaline earth metal in the oxide semiconductor. Specifically, the concentration of an alkali metal or an alkaline earth metal in the oxide semiconductor that is obtained by SIMS is set lower than or equal to $1 \times 10^{18}$ atoms/cm$^3$, preferably lower than or equal to $2 \times 10^{16}$ atoms/cm$^3$.

When the oxide semiconductor contains nitrogen, the oxide semiconductor easily becomes n-type by generation of electrons serving as carriers and an increase in carrier concentration. As a result, a transistor using an oxide semiconductor containing nitrogen as a semiconductor is likely to have normally-on characteristics. Hence, nitrogen in the oxide semiconductor is preferably reduced as much as possible; the nitrogen concentration in the oxide semiconductor that is obtained by SIMS is set, for example, lower than $5 \times 10^{19}$ atoms/cm$^3$, preferably lower than or equal to $5 \times 10^{18}$ atoms/cm$^3$, further preferably lower than or equal to $1 \times 10^{18}$ atoms/cm$^3$, still further preferably lower than or equal to $5 \times 10^{17}$ atoms/cm$^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor that is obtained by SIMS is set lower than $1 \times 10^{20}$ atoms/cm$^3$, preferably lower than $1 \times 10^{19}$ atoms/cm$^3$, further preferably lower than $5 \times 10^{18}$ atoms/cm$^3$, still further preferably lower than $1 \times 10^{18}$ atoms/cm$^3$.

When an oxide semiconductor with sufficiently reduced impurities is used for the channel formation region of the transistor, stable electrical characteristics can be given.

Note that this embodiment can be combined with any of the other embodiments described in this specification as appropriate.

Embodiment 6

This embodiment will show examples of a semiconductor wafer where the semiconductor device or the like described in the above embodiment is formed and electronic components incorporating the semiconductor device.

<Semiconductor Wafer>

First, an example of a semiconductor wafer where a semiconductor device or the like is formed is described with reference to FIG. 70A.

Figure 70A:
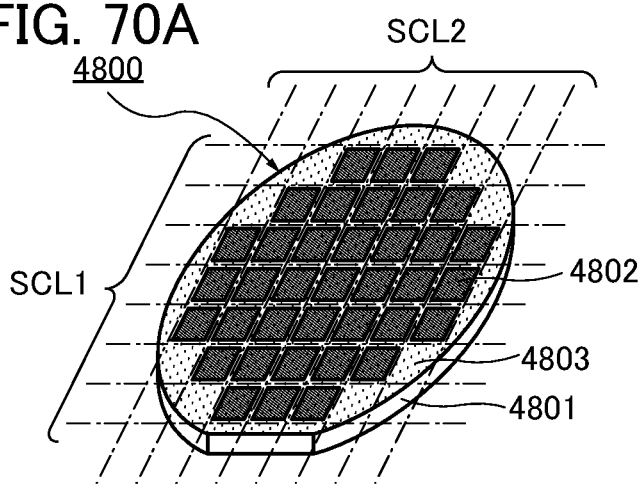
FIG. 70A is a perspective view showing an example of a semiconductor wafer.

A semiconductor wafer 4800 illustrated in FIG. 70A includes a wafer 4801 and a plurality of circuit portions 4802 provided on the top surface of the wafer 4801. A portion without the circuit portion 4802 on the top surface of the wafer 4801 is a spacing 4803 that is a region for dicing.

The semiconductor wafer 4800 can be fabricated by forming the plurality of circuit portions 4802 on the surface of the wafer 4801 by a pre-process. After that, a surface of the wafer 4801 opposite to the surface provided with the plurality of circuit portions 4802 may be ground to thin the wafer 4801. Through this step, warpage or the like of the wafer 4801 is reduced and the size of the component can be reduced.

A dicing step is performed as the next step. The dicing is performed along scribe lines SCL1 and scribe lines SCL2 (referred to as dicing lines or cutting lines in some cases) indicated by dashed-dotted lines. Note that to perform the dicing step easily, it is preferable that the spacing 4803 be provided so that the plurality of scribe lines SCL1 are parallel to each other, the plurality of scribe lines SCL2 are parallel to each other, and the scribe lines SCL1 are perpendicular to the scribe line SCL2.

Figure 70B:
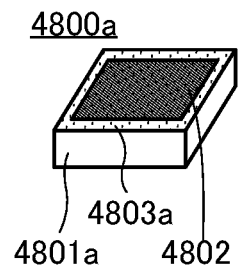
FIG. 70B is a perspective view showing an example of a chip.

With the dicing step, a chip 4800a as illustrated in FIG. 70B can be cut out from the semiconductor wafer 4800. The chip 4800a includes a wafer 4801a, the circuit portion 4802, and a spacing 4803a. Note that it is preferable to make the spacing 4803a small as much as possible. In this case, the width of the spacing 4803 between adjacent circuit portions 4802 is substantially the same as a cutting allowance of the scribe line SCL1 or a cutting allowance of the scribe line SCL2.

Note that the shape of the element substrate of one embodiment of the present invention is not limited to the shape of the semiconductor wafer 4800 illustrated in FIG. 70A. The element substrate may be a rectangular semiconductor wafer, for example. The shape of the element substrate can be changed as appropriate, depending on a manufacturing process of an element and an apparatus for manufacturing the element.

<Electronic Component>

Figure 70C:
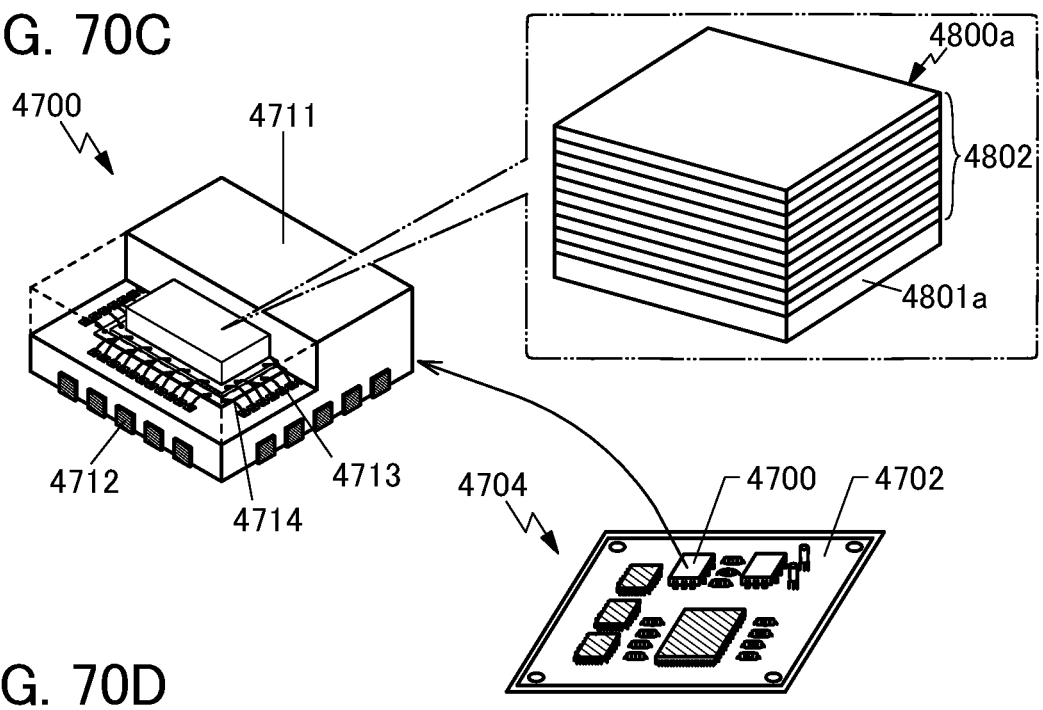
FIG. 70C and FIG. 70D are perspective views showing examples of electronic components.

FIG. 70C is a perspective view of an electronic component 4700 and a substrate (a mounting board 4704) on which the electronic component 4700 is mounted. The electronic component 4700 illustrated in FIG. 70C includes the chip 4800a in a mold 4711. Note that the chip 4800a illustrated in FIG. 70C is shown to have a structure in which the circuit portions 4802 are stacked. That is, the semiconductor device described in the above embodiment can be used for the circuit portion 4802. To illustrate the inside of the electronic component 4700, some portions are omitted in FIG. 70C. The electronic component 4700 includes a land 4712 outside the mold 4711. The land 4712 is electrically connected to an electrode pad 4713, and the electrode pad 4713 is electrically connected to the chip 4800a through a wire 4714. The electronic component 4700 is mounted on a printed circuit board 4702, for example. A plurality of such electronic components are combined and electrically connected to each other on the printed circuit board 4702, whereby the mounting board 4704 is completed.

Figure 70D:
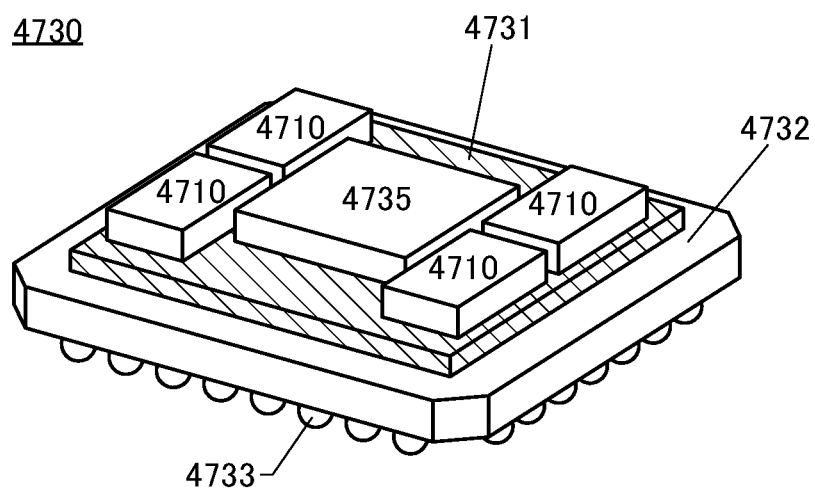

FIG. 70D is a perspective view of an electronic component 4730. The electronic component 4730 is an example of a SiP (System in package) or an MCM (Multi Chip Module). In the electronic component 4730, an interposer 4731 is provided on a package substrate 4732 (a printed circuit board), and a semiconductor device 4735 and a plurality of semiconductor devices 4710 are provided on the interposer 4731.

The electronic component 4730 includes the semiconductor devices 4710. Examples of the semiconductor devices 4710 include the semiconductor device described in the above embodiment and a high bandwidth memory (HBM). An integrated circuit (a semiconductor device) such as a CPU, a GPU, an FPGA, or a memory device can be used as the semiconductor device 4735.

As the package substrate 4732, a ceramic substrate, a plastic substrate, a glass epoxy substrate, or the like can be used. As the interposer 4731, a silicon interposer, a resin interposer, or the like can be used.

The interposer 4731 includes a plurality of wirings and has a function of electrically connecting a plurality of integrated circuits with different terminal pitches. The plurality of wirings are provided in a single layer or multiple layers. Moreover, the interposer 4731 has a function of electrically connecting an integrated circuit provided on the interposer 4731 to an electrode provided on the package substrate 4732. Accordingly, the interposer is referred to as a "redistribution substrate" or an "intermediate substrate" in some cases. A through electrode is provided in the interposer 4731 and the through electrode is used to electrically connect an integrated circuit and the package substrate 4732 in some cases. For a silicon interposer, a TSV (Through Silicon Via) can also be used as the through electrode.

A silicon interposer is preferably used as the interposer 4731. A silicon interposer can be manufactured at lower cost than an integrated circuit because it is not necessary to provide an active element. Meanwhile, since wirings of a silicon interposer can be formed through a semiconductor process, formation of minute wirings, which is difficult for a resin interposer, is easy.

In order to achieve a wide memory bandwidth, many wirings need to be connected to HBM. Therefore, formation of minute and high-density wirings is required for an interposer on which HBM is mounted. For this reason, a silicon interposer is preferably used as the interposer on which HBM is mounted.

In a SiP, an MCM, or the like using a silicon interposer, a decrease in reliability due to a difference in expansion coefficient between an integrated circuit and the interposer is less likely to occur. Furthermore, the surface of a silicon interposer has high planarity, so that a poor connection between the silicon interposer and an integrated circuit provided on the silicon interposer is less likely to occur. It is particularly preferable to use a silicon interposer for a 2.5D package (2.5-dimensional mounting) in which a plurality of integrated circuits are arranged side by side on an interposer.

A heat sink (a radiator plate) may be provided to overlap with the electronic component 4730. In the case of providing a heat sink, the heights of integrated circuits provided on the interposer 4731 are preferably equal to each other. For example, in the electronic component 4730 described in this embodiment, the heights of the semiconductor devices 4710 and the semiconductor device 4735 are preferably equal to each other.

To mount the electronic component 4730 on another substrate, an electrode 4733 may be provided on the bottom portion of the package substrate 4732. FIG. 70D illustrates an example in which the electrode 4733 is formed of a solder ball. Solder balls are provided in a matrix on the bottom portion of the package substrate 4732, whereby BGA (Ball Grid Array) mounting can be achieved. Alternatively, the electrode 4733 may be formed of a conductive pin. When conductive pins are provided in a matrix on the bottom portion of the package substrate 4732, PGA (Pin Grid Array) mounting can be achieved.

The electronic component 4730 can be mounted on another substrate by various mounting methods not limited to BGA and PGA. For example, a mounting method such as SPGA (Staggered Pin Grid Array), LGA (Land Grid Array), QFP (Quad Flat Package), QFJ (Quad Flat J-leaded package), or QFN (Quad Flat Non-leaded package) can be employed.

Note that this embodiment can be combined with any of the other embodiments described in this specification as appropriate.

Embodiment 7

Figure 71:
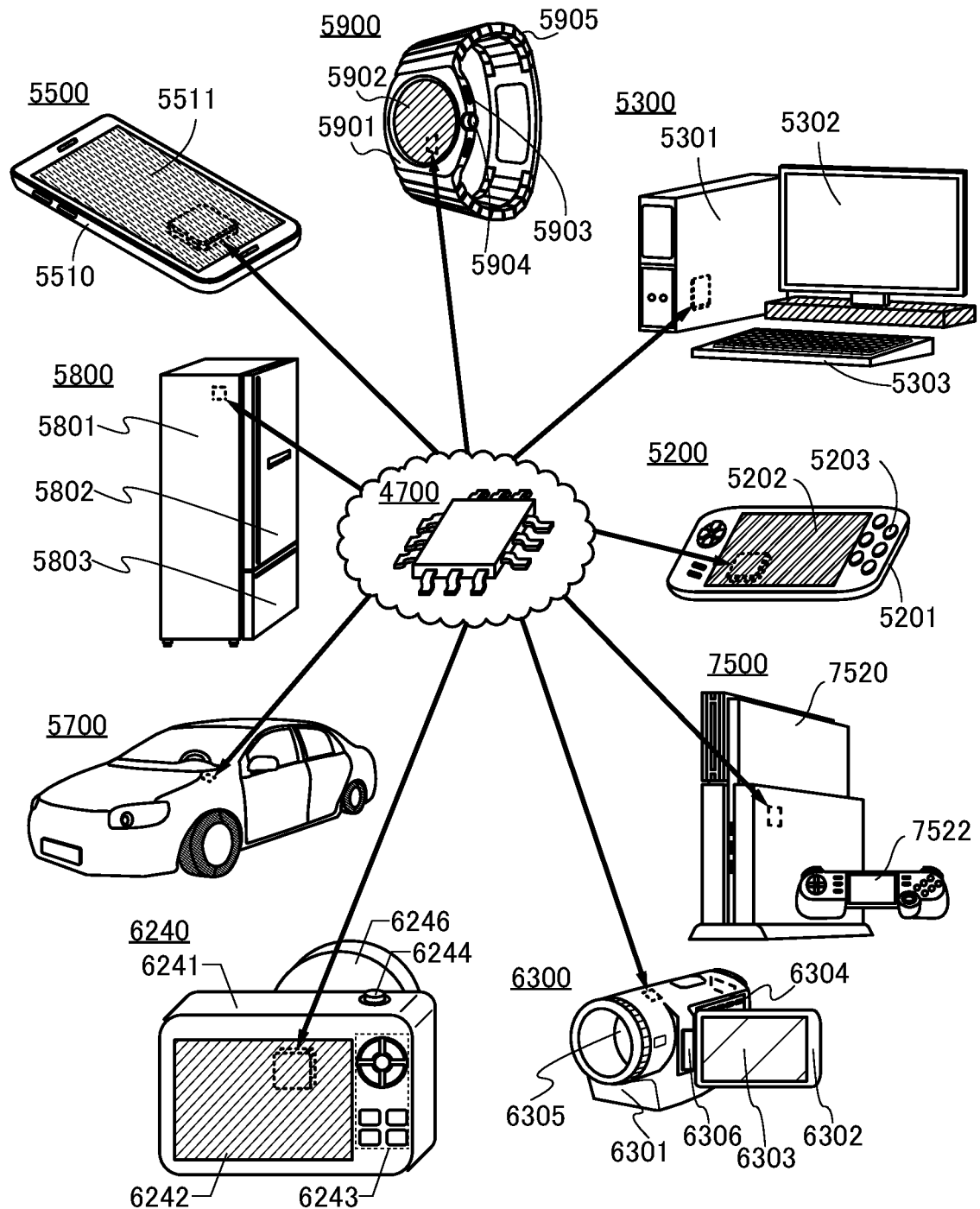
FIG. 71 is a perspective view showing examples of electronic devices.

This embodiment will show examples of electronic devices including the semiconductor device described in the above embodiment. FIG. 71 illustrates electronic devices each of which includes the electronic component 4700 (BMP) including the semiconductor device.

[Mobile Phone]

An information terminal 5500 illustrated in FIG. 71 is a mobile phone (smartphone), which is a type of information terminal. The information terminal 5500 includes a housing 5510 and a display portion 5511, and as input interfaces, a touch panel is provided in the display portion 5511 and a button is provided in the housing 5510.

The information terminal 5500 can execute an application utilizing artificial intelligence with the use of the semiconductor device described in the above embodiment. Examples of the application utilizing artificial intelligence include an application for interpreting a conversation and displaying its content on the display portion 5511; an application for recognizing letters, diagrams, and the like input to the touch panel of the display portion 5511 by a user and displaying them on the display portion 5511; and an application for biometric authentication using fingerprints, voice prints, or the like.

[Wearable Terminal]

FIG. 71 illustrates a smartwatch 5900 as an example of a wearable terminal. The smartwatch 5900 includes a housing 5901, a display portion 5902, an operation button 5903, an operator 5904, a band 5905, and the like.

The wearable terminal can execute an application utilizing artificial intelligence with the use of the semiconductor device described in the above embodiment, like the information terminal 5500. Examples of the application utilizing artificial intelligence include an application for managing the health condition of the user of the wearable terminal and a navigation system that selects the optimal route and navigates the user on the basis of the input of the destination.

[Information Terminal]

FIG. 71 illustrates a desktop information terminal 5300. The desktop information terminal 5300 includes a main body 5301 of the information terminal, a display 5302, and a keyboard 5303.

The desktop information terminal 5300 can execute an application utilizing artificial intelligence with the use of the semiconductor device described in the above embodiment, like the information terminal 5500 described above. Examples of the application utilizing artificial intelligence include design-support software, text correction software, and software for automatic menu generation. Furthermore, with the use of the desktop information terminal 5300, novel artificial intelligence can be developed.

Note that although FIG. 71 illustrates the smartphone and the desktop information terminal as examples of the electronic device as described above, application to information terminals other than a smartphone and a desktop information terminal is also possible. Examples of information terminals other than a smartphone and a desktop information terminal include a PDA (Personal Digital Assistant), a laptop information terminal, and a workstation.

[Household Appliance]

FIG. 71 illustrates an electric refrigerator-freezer 5800 as an example of a household appliance. The electric refrigerator-freezer 5800 includes a housing 5801, a refrigerator door 5802, a freezer door 5803, and the like.

When the semiconductor device described in the above embodiment is used for the electric refrigerator-freezer 5800, the electric refrigerator-freezer 5800 including artificial intelligence can be achieved. Utilizing the artificial intelligence enables the electric refrigerator-freezer 5800 to have a function of automatically making a menu based on foods stored in the electric refrigerator-freezer 5800 and the food expiration dates, for example, a function of automatically adjusting the temperature to be appropriate for the foods stored in the electric refrigerator-freezer 5800, and the like.

The electric refrigerator-freezer is described in this example as a household appliance; other examples of household appliances include a vacuum cleaner, a microwave oven, an electric oven, a rice cooker, a water heater, an IH cooker, a water server, a heating-cooling combination appliance such as an air conditioner, a washing machine, a drying machine, and an audio visual appliance.

[Game Machine]

FIG. 71 illustrates a portable game machine 5200 as an example of a game machine. The portable game machine 5200 includes a housing 5201, a display portion 5202, a button 5203, and the like.

FIG. 71 illustrates a stationary game machine 7500 as another example of a game machine. The stationary game machine 7500 includes a main body 7520 and a controller 7522. The controller 7522 can be connected to the main body 7520 with or without a wire. Although not illustrated in FIG. 71, the controller 7522 can include a display portion that displays a game image, and an input interface besides a button, such as a touch panel, a stick, a rotating knob, and a sliding knob, for example. The shape of the controller 7522 is not limited to that in FIG. 71, and the shape of the controller 7522 may be changed variously in accordance with the genres of games. For example, for a shooting game such as an FPS (First Person Shooter) game, a gun-shaped controller having a trigger button can be used. As another example, for a music game or the like, a controller having a shape of a musical instrument, audio equipment, or the like can be used. Furthermore, the stationary gaming machine may include a camera, a depth sensor, a microphone, and the like so that the game player can play a game using a gesture and/or a voice instead of a controller.

Videos displayed on the game machine can be output with a display device such as a television device, a personal computer display, a game display, or a head-mounted display.

When the semiconductor device described in the above embodiment is used for the portable game machine 5200, the portable game machine 5200 with low power consumption can be achieved. Moreover, heat generation from a circuit can be reduced owing to low power consumption; thus, the influence of heat generation on the circuit, the peripheral circuit, and the module can be reduced.

Furthermore, when the semiconductor device described in the above embodiment is used for the portable game machine 5200, the portable game machine 5200 including artificial intelligence can be achieved.

In general, the progress of a game, the actions and words of game characters, and expressions of a phenomenon and the like in the game are programed in the game; however, the use of artificial intelligence in the portable game machine 5200 enables expressions not limited by the game program. For example, questions posed by the player, the progress of the game, time, and actions and words of game characters can be changed for various expressions.

When a game requiring a plurality of players is played on the portable game machine 5200, the artificial intelligence can create a virtual game player; thus, the game can be played alone with the game player created by the artificial intelligence as an opponent.

Although FIG. 71 illustrates the portable game machine as an example of a game machine, the electronic device of one embodiment of the present invention is not limited thereto. Examples of the electronic device of one embodiment of the present invention include a home stationary game machine, an arcade game machine installed in entertainment facilities (e.g., a game center and an amusement park), and a throwing machine for batting practice installed in sports facilities.

[Moving Vehicle]

The semiconductor device described in the above embodiment can be used for an automobile, which is a moving vehicle, and around the driver's seat in an automobile.

FIG. 71 illustrates an automobile 5700 as an example of a moving vehicle.

An instrument panel that can display a speedometer, a tachometer, a mileage, a fuel meter, a gearshift state, air-conditioning setting, and the like is provided around the driver's seat in the automobile 5700. In addition, a display device showing the above information may be provided around the driver's seat.

In particular, the display device can compensate for the view obstructed by the pillar or the like, the blind areas for the driver's seat, and the like by displaying an image taken by an imaging device (not illustrated) provided for the automobile 5700, which improves safety.

Since the semiconductor device described in the above embodiment can be used as the components of artificial intelligence, the semiconductor device can be used for an automatic driving system of the automobile 5700, for example. The semiconductor device can also be used for a system for navigation, risk prediction, or the like. The display device may display navigation information, risk prediction information, or the like.

Although an automobile is described above as an example of a moving vehicle, moving vehicles are not limited to an automobile. Examples of moving vehicles include a train, a monorail train, a ship, and a flying object (a helicopter, an unmanned aircraft (a drone), an airplane, and a rocket), and these moving objects can include a system utilizing artificial intelligence when equipped with the computer of one embodiment of the present invention.

[Camera]

The semiconductor device described in the above embodiment can be used for a camera.

FIG. 71 illustrates a digital camera 6240 as an example of an imaging device. The digital camera 6240 includes a housing 6241, a display portion 6242, operation buttons 6243, a shutter button 6244, and the like, and an attachable lens 6246 is attached to the digital camera 6240. Here, the lens 6246 of the digital camera 6240 is detachable from the housing 6241 for replacement; alternatively, the lens 6246 may be incorporated into the housing 6241. A stroboscope, a viewfinder, or the like may be additionally attached to the digital camera 6240.

When the semiconductor device described in the above embodiment is used for the digital camera 6240, the digital camera 6240 with low power consumption can be achieved. Moreover, heat generation from a circuit can be reduced owing to low power consumption; thus, the influence of heat generation on the circuit, the peripheral circuit, and the module can be reduced.

Furthermore, when the semiconductor device described in the above embodiment is used for the digital camera 6240, the digital camera 6240 including artificial intelligence can be achieved. Utilizing the artificial intelligence enables the digital camera 6240 to have a function of automatically recognizing a subject such as a face or an object, a function of adjusting a focus on the subject, a function of automatically using a flash in accordance with environments, a function of toning a taken image, and the like.

[Video Camera]

The semiconductor device described in the above embodiment can be used for a video camera.

FIG. 71 illustrates a video camera 6300 as an example of an imaging device. The video camera 6300 includes a first housing 6301, a second housing 6302, a display portion 6303, operation keys 6304, a lens 6305, a joint 6306, and the like. The operation keys 6304 and the lens 6305 are provided in the first housing 6301, and the display portion 6303 is provided in the second housing 6302. The first housing 6301 and the second housing 6302 are connected to each other with the joint 6306, and the angle between the first housing 6301 and the second housing 6302 can be changed with the joint 6306. Images displayed on the display portion 6303 may be changed in accordance with the angle at the joint 6306 between the first housing 6301 and the second housing 6302.

When images taken by the video camera 6300 are recorded, the images need to be encoded in accordance with a data recording format. With the use of artificial intelligence, the video camera 6300 can perform the pattern recognition by artificial intelligence in encoding of the images. The pattern recognition is used to calculate a difference in the human, the animal, the object, and the like between continuously taken image data, so that the data can be compressed.

[Extension Device for PC]

The semiconductor device described in the above embodiment can be used for a calculator such as a PC (Personal Computer) and an extension device for an information terminal.

Figure 72A:
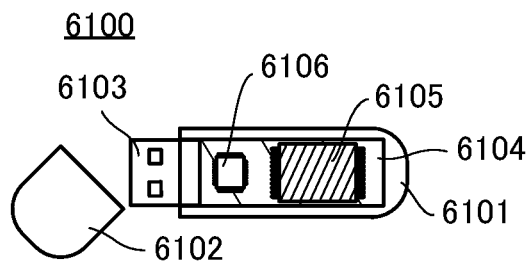
FIG. 72A, FIG. 72B, and FIG. 72C are perspective views showing examples of electronic devices.

FIG. 72A illustrates, as an example of the extension device, a portable extension device 6100 that includes a chip capable of arithmetic processing and is externally attached to a PC. The extension device 6100 can perform arithmetic processing using the chip when connected to a PC with a USB (Universal Serial Bus), for example. FIG. 72A illustrates the portable extension device 6100; however, the extension device of one embodiment of the present invention is not limited thereto and may be a relatively large extension device including a cooling fan or the like, for example.

The expansion device 6100 includes a housing 6101, a cap 6102, a USB connector 6103, and a substrate 6104. The substrate 6104 is held in the housing 6101. The substrate 6104 is provided with a circuit for driving the semiconductor device described in the above embodiment or the like. For example, a chip 6105 (e.g., the semiconductor device described in the above embodiment, the electronic component 4700, or a memory chip) and a controller chip 6106 are attached to the substrate 6104. The USB connector 6103 functions as an interface for connection to an external device.

The use of the extension device 6100 for a PC and the like can increase the arithmetic processing capability of the PC. Thus, a PC with insufficient processing capability can perform arithmetic operation of artificial intelligence, moving image processing, and the like.

[Broadcasting System]

The semiconductor device described in the above embodiment can be used for a broadcasting system.

Figure 72B:
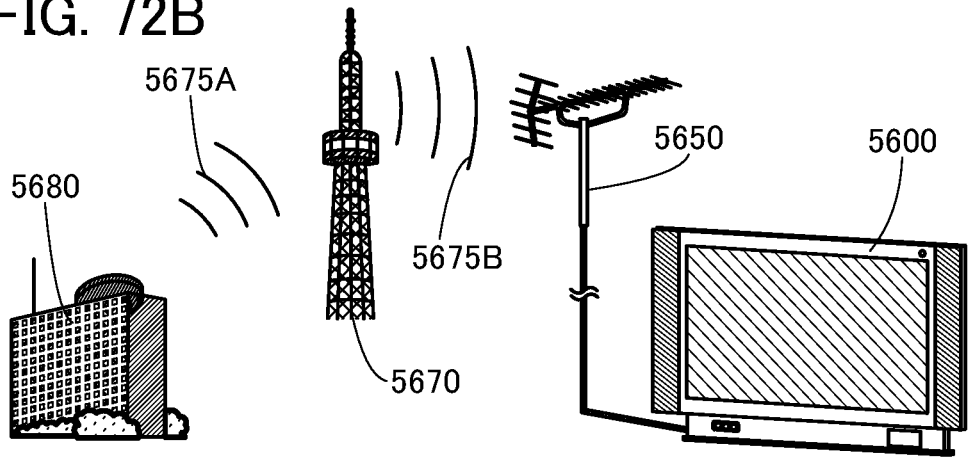

FIG. 72B schematically illustrates data transmission in a broadcasting system. Specifically, FIG. 72B illustrates a path in which a radio wave (a broadcasting signal) transmitted from a broadcast station 5680 reaches a television receiver (TV) 5600 of each household. The TV 5600 includes a receiving device (not illustrated), and the broadcast signal received by an antenna 5650 is transmitted to the TV 5600 through the receiving device.

Although a UHF (Ultra High Frequency) antenna is illustrated as the antenna 5650 in FIG. 72B, a BS/110° CS antenna, a CS antenna, or the like can also be used as the antenna 5650.

A radio wave 5675A and a radio wave 5675B are broadcast signals for terrestrial broadcasting; a radio wave tower 5670 amplifies the received radio wave 5675A and transmits the radio wave 5675B. Each household can view terrestrial TV broadcasting on the TV 5600 by receiving the radio wave 5675B with the antenna 5650. Note that the broadcasting system is not limited to the terrestrial broadcasting illustrated in FIG. 72B and may be satellite broadcasting using an artificial satellite, data broadcasting using an optical line, or the like.

The above-described broadcasting system may be a broadcasting system that utilizes artificial intelligence by including the semiconductor device described in the above embodiment. When the broadcast data is transmitted from the broadcast station 5680 to the TV 5600 of each household, the broadcast data is compressed by an encoder. When the antenna 5650 receives the compressed broadcast data, the compressed broadcast data is decompressed by a decoder of the receiving device in the TV 5600. With the use of artificial intelligence, for example, a display pattern included in an image to be displayed can be recognized in motion compensation prediction, which is one of the compressing methods for the encoder. In-frame prediction utilizing artificial intelligence, for example, can also be performed. As another example, when the broadcast data with low resolution is received and the broadcast data is displayed on the TV 5600 with high resolution, image interpolation such as upconversion can be performed in the broadcast data decompression by the decoder.

The above-described broadcasting system utilizing artificial intelligence is suitable for ultra-high definition television (UHDTV: 4K, 8K) broadcasting, which needs a large amount of broadcast data.

As an application of artificial intelligence in the TV 5600, a recording device including artificial intelligence may be provided in the TV 5600, for example. With such a structure, by making the artificial intelligence included in the recording device learn the user's preference, TV programs that suit the user's preference can be recorded automatically.

[Authentication System]

The semiconductor device described in the above embodiment can be used for an authentication system.

Figure 72C:
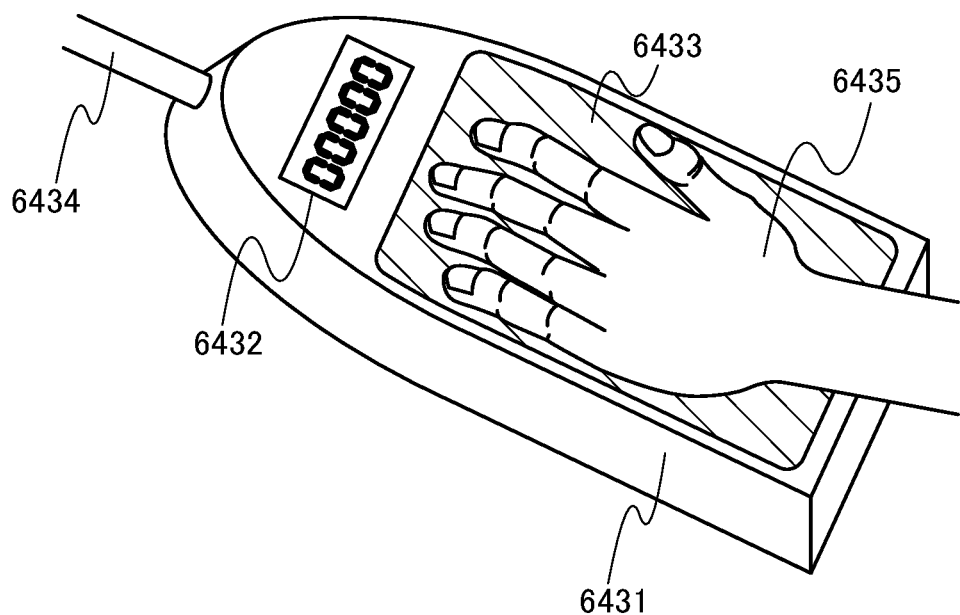

FIG. 72C illustrates a palm print authentication device including a housing 6431, a display portion 6432, a palm print reading portion 6433, and a wiring 6434.

FIG. 72C shows a situation in which the palm print authentication device obtains a palm print of a hand 6435. The obtained palm print is subjected to the pattern recognition utilizing artificial intelligence, so that personal authentication of the palm print can be performed. Thus, a system that performs highly secure authentication can be constructed. Without limitation to the palm print authentication device, the authentication system of one embodiment of the present invention may be a device that performs biometric authentication by obtaining biological information of fingerprints, veins, faces, iris, voice prints, genes, physiques, or the like.

Note that this embodiment can be combined with any of the other embodiments described in this specification as appropriate.

REFERENCE NUMERALS

ILD: circuit, WLD: circuit, XLD: circuit, AFP: circuit, ACTF: circuit, MP: circuit, MC: circuit, MCr: circuit, BS: circuit, M1: transistor, M1-2b: transistor, M1-2br: transistor, M1-3b: transistor, M1-3br: transistor, M1c: transistor, M1cr: transistor, M1p: transistor, M1pr: transistor, M1r: transistor, M1s: transistor, M1sr: transistor, M1x: transistor, M1xr: transistor, M1x-2b: transistor, M1x-2br: transistor, M1x-3b: transistor, M1x-3br: transistor, M1x-4b: transistor, M1-2x: transistor, M1-2xr: transistor, M1-3x: transistor, M1-3xr: transistor, M1-2x-2b: transistor, M1-2x-2br: transistor, M1-3x-2b: transistor, M1-3x-2br: transistor, M1-2x-3b: transistor, M1-2x-3br: transistor, M1-3x-3b: transistor, M1-3x-3br: transistor, M2: transistor, M2r: transistor, M2s: transistor, M2sr: transistor, M2-2b: transistor, M2-2br: transistor, M2-3b: transistor, M2-3br: transistor, M3: transistor, M3p: transistor, M3pr: transistor, M3r: transistor, M3s: transistor, M3sr: transistor, M3x: transistor, M3x-2: transistor, M3-2b: transistor, M3-2br: transistor, M3-2x: transistor, M3-2xr: transistor, M3-3b: transistor, M3-3br: transistor, M3-3x: transistor, M3-3xr: transistor, M4: transistor, M4p: transistor, M4pr: transistor, M4r: transistor, M4s: transistor, M4sr: transistor, M4x-2: transistor, M4-2b: transistor, M4-2br: transistor, M4-2x: transistor, M4-2xr: transistor, M4-3b: transistor, M4-3br: transistor, M4-3x: transistor, M4-3xr: transistor, M5: transistor, M5r: transistor, M6: transistor, M6r: transistor, M6s: transistor, M6sr: transistor, M7: transistor, M7r: transistor, M7s: transistor, M7sr: transistor, M8: transistor, M8r: transistor, M9: transistor, M9r: transistor, M10: transistor, M10r: transistor, M11: transistor, M12: transistor, M12r: transistor, M13: transistor, M13r: transistor, M20: transistor, M20r: transistor, MZ: transistor, CC: capacitor, CE: capacitor, CEB: capacitor, C1: capacitor, C1r: capacitor, C1s: capacitor, C1sr: capacitor, C2: capacitor, C2r: capacitor, C3: capacitor, C4: capacitor, n1: node, n1r: node, n2: node, n2r: node, n3: node, n3r: node, n4: node, n4r: node, ina: node, inb: node, outa: node, outb: node, S01a: switch, S01b: switch, S02a: switch, S02b: switch, S03: switch, SWI: switch, SWIB: switch, SWO: switch, SWOB: switch, SWL: switch, SWLB: switch, SWH: switch, SWHB: switch, SWC1: switch, SWC2: switch, SWC3: switch, AS3: analog switch, AS3r: analog switch, AS4: analog switch, AS4r: analog switch, TW[1]: switching circuit, TW[j]: switching circuit, TW[n]: switching circuit, HC: holding portion, HCr: holding portion, HCs: holding portion, HCsr: holding portion, HC-2b: holding portion, HC-2br: holding portion, HC-3b: holding portion, HC-3br: holding portion, IV1: inverter circuit, IV1r: inverter circuit, IV2: inverter circuit, IV2r: inverter circuit, INV3: inverter circuit, IVR: inverter loop circuit, IVRr: inverter loop circuit, CMP1: comparator, ISC: current source circuit, ISC1: constant current source circuit, ISC2: constant current source circuit, ISC3: constant current source circuit, HCS: circuit, HCS-2b: circuit, HCS-3b: circuit, HCSr: circuit, HCS-2br: circuit, HCS-3br: circuit, TRF: converter circuit, ADCa: analog-digital converter circuit, ADCb: analog-digital converter circuit, BS: circuit, BSr: circuit, BMC: circuit, BMCr: circuit, TSa: terminal, TSaB: terminal, TSb: terminal, TSb1: terminal, TSb2: terminal, TSb3: terminal, TSbB: terminal, TSbB1: terminal, TSbB2: terminal, TSbB3: terminal, TSc: terminal, TScB: terminal, VinT: terminal, VoutT: terminal, VrefT: terminal, IL: wiring, IL[1]: wiring, IL[j]: wiring, IL[n]: wiring, ILB: wiring, ILB[1]: wiring, ILB[j]: wiring, ILB[n]: wiring, OL: wiring, OL[1]: wiring, OL[j]: wiring, OL[n]: wiring, OLB: wiring, OLB[1]: wiring, OLB[j]: wiring, OLB[n]: wiring, WLS[1]: wiring, WLS[i]: wiring, WLS[m]: wiring, XL: wiring, XLS[1]: wiring, XLS[i]: wiring, XLS[m]: wiring, WLBS: wiring, WXBS: wiring, VAL: wiring, VA: wiring, VAr: wiring, VB: wiring, VSO: wiring, VCN: wiring, VCN2: wiring, VE: wiring, VEr: wiring, VEm: wiring, VEmr: wiring, VF: wiring, VFr: wiring, VrefL: wiring, VL: wiring, VLr: wiring, VLs: wiring, VLsr: wiring, VLm: wiring, VLmr: wiring, VEH: wiring, S1L: wiring, S2L: wiring, Vref1L: wiring, Vref2L: wiring, WL: wiring, W1L: wiring, W2L: wiring, WL2b: wiring, WL3b: wiring, WXL: wiring, WX1L: wiring, WX1L2b: wiring, WX1L3b: wiring, WX1LB: wiring, X1: wiring, X1L: wiring, X1L2b: wiring, X1L2x: wiring, X1L3b: wiring, X1L3x: wiring, X2L: wiring, X2L2b: wiring, X2L2L: wiring, X2L2x: wiring, X2L3b: wiring, X2L3x: wiring, X2LB: wiring, CVL: wiring, SCL1: scribe line, SCL2: scribe line, 100: neural network, 110: arithmetic circuit, 120: arithmetic circuit, 130: arithmetic circuit, 140: arithmetic circuit, 150: arithmetic circuit, 160: arithmetic circuit, 170: arithmetic circuit, 300: transistor, 311: substrate, 313: semiconductor region, 314*a*: low-resistance region, 314*b*: low-resistance region, 315: insulator, 316: conductor, 320: insulator, 322: insulator, 324: insulator, 326: insulator, 328: conductor, 330: conductor, 350: insulator, 352: insulator, 354: insulator, 356: conductor, 360: insulator, 362: insulator, 364: insulator, 366: conductor, 370: insulator, 372: insulator, 374: insulator, 376: conductor, 380: insulator, 382: insulator, 384: insulator, 386: conductor, 402: insulator, 404: insulator, 500: transistor, 503: conductor, 503*a*: conductor, 503*b*: conductor, 505: conductor, 510: insulator, 512: insulator, 514: insulator, 516: insulator, 518: conductor, 520: insulator, 522: insulator, 524: insulator, 530: oxide, 530*a*: oxide, 530*b*: oxide, 530*c*: oxide, 530*c*1: oxide, 530*c*2: oxide, 540: conductor, 540*a*: conductor, 540*b*: conductor, 542*a*: conductor, 542*b*: conductor, 543*a*: region, 543*b*: region, 544: insulator, 546: conductor, 548: conductor, 550: insulator, 552: insulator, 560: conductor, 560*a*: conductor, 560*b*: conductor, 574: insulator, 580: insulator, 581: insulator, 582: insulator, 586: insulator, 600: capacitor, 600A: capacitor, 600B: capacitor, 610: conductor, 611: conductor, 612: conductor, 620: conductor, 621: conductor, 630: insulator, 631: insulator, 650: insulator, 651: insulator, 4700: electrical component, 4702: printed circuit board, 4704: circuit board, 4710: semiconductor device, 4730: electrical component, 4731: interposer, 4732: package substrate, 4733: electrode, 4735: semiconductor device, 4800: semiconductor wafer, 4800*a*: chip, 4801: wafer, 4801*a*: wafer, 4802: circuit portion, 4803: spacing, 4803*a*: spacing, 5200: portable game machine, 5201: housing, 5202: display portion, 5203: button, 5300: desktop information terminal, 5301: main body, 5302: display, 5303: keyboard, 5500: information terminal, 5510: housing, 5511: display portion, 5600: TV, 5650: antenna, 5670: radio wave tower, 5675A: radio wave, 5675B: radio wave, 5680: broadcast station, 5700: car, 5800: electric refrigerator-freezer, 5801: housing, 5802: refrigerator door, 5803: freezer door, 5901: housing, 5902: display portion, 5903: operation button, 5904: operator, 5905: band, 6100: extension device, 6101: housing, 6102: cap, 6103: USB connector, 6104: substrate, 6105: chip, 6106: controller chip, 6240: digital camera, 6241: housing, 6242: display portion, 6243: operation button, 6244: shutter button, 6246: lens, 6300: video camera, 6301: first housing, 6302: second housing, 6303: display portion, 6304: control key, 6305: lens, 6306: joint, 6431: housing, 6432: display portion, 6433: palm print reading portion, 6434: wiring, 6435: hand, 7520: main body, 7522: controller

The invention claimed is:

1. A semiconductor device comprising a first circuit and a second circuit,
   wherein the first circuit comprises a first holding portion and a first driving transistor,
   wherein the second circuit comprises a second holding portion and a second driving transistor,
   wherein the first circuit is electrically connected to a first input wiring, a second input wiring, a first wiring, and a second wiring,
   wherein the second circuit is electrically connected to the first input wiring, the second input wiring, the first wiring, and the second wiring,
   wherein the first holding portion has a function of holding a first potential corresponding to a first current from the first wiring flowing between a source and a drain of the first driving transistor,
   wherein the second holding portion has a function of holding a second potential corresponding to a second current from the second wiring flowing between a source and a drain of the second driving transistor,
   wherein the first driving transistor has a function of making the first current corresponding to the held first potential flow between the source and the drain of the first driving transistor,
   wherein the second driving transistor has a function of making the second current corresponding to the held second potential flow between the source and the drain of the second driving transistor,
   wherein the first circuit has:
      a function of outputting the first current to the first wiring when a first-level potential is input to the first input wiring and a second-level potential is input to the second input wiring;
      a function of outputting the first current to the second wiring when the second-level potential is input to the first input wiring and the first-level potential is input to the second input wiring; and
      a function of outputting the first current to neither the first wiring nor the second wiring when the second-level potential is input to the first input wiring and the second-level potential is input to the second input wiring,
   wherein the second circuit has:
      a function of outputting the second current to the second wiring when the first-level potential is input to the first input wiring and the second-level potential is input to the second input wiring;
      a function of outputting the second current to the first wiring when the second-level potential is input to the first input wiring and the first-level potential is input to the second input wiring; and
      a function of outputting the second current to neither the first wiring nor the second wiring when the second-level potential is input to the first input wiring and the second-level potential is input to the second input wiring,
   wherein the first current and the second current each have a current amount corresponding to first data, and
   wherein the first-level potential and the second-level potential that are input to the first input wiring and the second input wiring are determined in accordance with second data.

2. The semiconductor device according to claim 1,
   wherein the first circuit comprises a first transistor, a second transistor, a third transistor, and a first capacitor,
   wherein the second circuit comprises a fourth transistor, a fifth transistor, a sixth transistor, and a second capacitor,
   wherein the first holding portion comprises the first transistor and the first capacitor,
   wherein the second holding portion comprises the fourth transistor and the second capacitor,
   wherein a first terminal of the first transistor is electrically connected to a first terminal of the first capacitor and a gate of the first driving transistor,
   wherein a second terminal of the first transistor is electrically connected to the first wiring,
   wherein a first terminal of the first driving transistor is electrically connected to a first terminal of the second transistor and a first terminal of the third transistor,
   wherein a second terminal of the second transistor is electrically connected to the first wiring,
   wherein a gate of the second transistor is electrically connected to the first input wiring,
   wherein a second terminal of the third transistor is electrically connected to the second wiring, wherein a gate of the third transistor is electrically connected to the second input wiring, wherein a first terminal of the fourth transistor is electrically connected to a first terminal of the second capacitor and a gate of the second driving transistor, wherein a second terminal of the fourth transistor is electrically connected to the second wiring, wherein a first terminal of the second driving transistor is electrically connected to a first terminal of the fifth transistor and a first terminal of the sixth transistor, wherein a second terminal of the fifth transistor is electrically connected to the second wiring, wherein a gate of the fifth transistor is electrically connected to the first input wiring, wherein a second terminal of the sixth transistor is electrically connected to the first wiring, and wherein a gate of the sixth transistor is electrically connected to the second input wiring.

3. The semiconductor device according to claim 2,
wherein the first circuit comprises a seventh transistor,
wherein the second circuit comprises an eighth transistor,
wherein a first terminal of the seventh transistor is electrically connected to the first terminal of the first driving transistor, the first terminal of the second transistor, and the first terminal of the third transistor,
wherein a second terminal of the seventh transistor is electrically connected to one of the first terminal and the second terminal of the first transistor,
wherein a first terminal of the eighth transistor is electrically connected to the first terminal of the second driving transistor, the first terminal of the fifth transistor, and the first terminal of the sixth transistor,
wherein a second terminal of the eighth transistor is electrically connected to one of the first terminal and the second terminal of the fourth transistor, and
wherein a gate of the first transistor is electrically connected to a gate of the fourth transistor, a gate of the seventh transistor, and a gate of the eighth transistor.

4. The semiconductor device according to claim 1,
wherein the first circuit comprises a first transistor, a second transistor, a third transistor, and a first capacitor,
wherein the second circuit comprises a fourth transistor, a fifth transistor, a sixth transistor, and a second capacitor,
wherein the first holding portion comprises the first transistor and the first capacitor,
wherein the second holding portion comprises the fourth transistor and the second capacitor,
wherein a first terminal of the first transistor is electrically connected to a first terminal of the first capacitor and a gate of the first driving transistor,
wherein a first terminal of the first driving transistor is electrically connected to a second terminal of the first transistor, a first terminal of the second transistor, and a first terminal of the third transistor,
wherein a second terminal of the second transistor is electrically connected to the first wiring,
wherein a gate of the second transistor is electrically connected to the first input wiring,
wherein a second terminal of the third transistor is electrically connected to the second wiring,
wherein a gate of the third transistor is electrically connected to the second input wiring,
wherein a first terminal of the fourth transistor is electrically connected to a first terminal of the second capacitor and a gate of the second driving transistor,
wherein a first terminal of the second driving transistor is electrically connected to a second terminal of the fourth transistor, a first terminal of the fifth transistor, and a first terminal of the sixth transistor,
wherein a second terminal of the fifth transistor is electrically connected to the second wiring,
wherein a gate of the fifth transistor is electrically connected to the first input wiring,
wherein a second terminal of the sixth transistor is electrically connected to the first wiring, and
wherein a gate of the sixth transistor is electrically connected to the second input wiring.

5. The semiconductor device according to claim 1,
wherein the first circuit comprises a third holding portion and a third driving transistor,
wherein the second circuit comprises a fourth holding portion and a fourth driving transistor,
wherein the first circuit is electrically connected to a third wiring,
wherein the second circuit is electrically connected to the third wiring,
wherein the third holding portion has a function of holding a third potential corresponding to a third current from the first wiring flowing between a source and a drain of the third driving transistor,
wherein the fourth holding portion has a function of holding a fourth potential corresponding to a fourth current from the second wiring flowing between a source and a drain of the fourth driving transistor,
wherein the third driving transistor has a function of making the third current corresponding to the held third potential flow between the source and the drain of the third driving transistor,
wherein the fourth driving transistor has a function of making the fourth current corresponding to the held fourth potential flow between the source and the drain of the fourth driving transistor, and
wherein the semiconductor device has a function of switching the first current flowing to one of the first wiring and the second wiring to the third current and switching the second current flowing to the other of the first wiring and the second wiring to the fourth current, in accordance with a signal input to the third wiring.

6. The semiconductor device according to claim 1,
further comprising a third circuit, a fourth circuit, and a fifth circuit,
wherein the third circuit has:
  a function of supplying the first current corresponding to the first data to the first circuit through the first wiring; and
  a function of supplying the second current corresponding to the first data to the second circuit through the second wiring,
wherein the fourth circuit has:
  a function of inputting the first-level potential or the second-level potential to the first input wiring in accordance with the second data; and
  a function of inputting the first-level potential or the second-level potential to the second input wiring in accordance with the second data, and
wherein the fifth circuit has a function of comparing currents flowing from the first wiring and the second wiring and outputting a potential corresponding to a product of the first data and the second data from an output terminal of the fifth circuit.

7. A semiconductor device comprising a first circuit and a second circuit,
- wherein the first circuit comprises a first holding portion and a first driving transistor,
- wherein the second circuit comprises a second holding portion and a second driving transistor,
- wherein the first circuit is electrically connected to a first input wiring and a first wiring,
- wherein the second circuit is electrically connected to the first input wiring and a second wiring,
- wherein the first holding portion has a function of holding a first potential corresponding to a first current from the first wiring flowing between a source and a drain of the first driving transistor,
- wherein the second holding portion has a function of holding a second potential corresponding to a second current from the second wiring flowing between a source and a drain of the second driving transistor,
- wherein the first driving transistor has a function of making the first current corresponding to the held first potential flow between the source and the drain of the first driving transistor,
- wherein the second driving transistor has a function of making the second current corresponding to the held second potential flow between the source and the drain of the second driving transistor,
- wherein the first circuit has:
  - a function of outputting the first current to the first wiring when a first-level potential is input to the first input wiring; and
  - a function of not outputting the first current to the first wiring when a second-level potential is input to the first input wiring,
- wherein the second circuit has:
  - a function of outputting the second current to the second wiring when the first-level potential is input to the first input wiring; and
  - a function of not outputting the second current to the second wiring when the second-level potential is input to the first input wiring,
- wherein the first current and the second current each have a current amount corresponding to first data, and
- wherein the first-level potential and the second-level potential that are input to the first input wiring and the second input wiring are determined in accordance with second data.

8. A semiconductor device comprising a first circuit and a second circuit,
- wherein the first circuit comprises a first holding portion and a first driving transistor,
- wherein the second circuit comprises a second holding portion and a second driving transistor,
- wherein the first circuit is electrically connected to a first input wiring and a first wiring,
- wherein the second circuit is electrically connected to the first input wiring and a second wiring,
- wherein the first holding portion has a function of holding a first potential corresponding to a first current from the first wiring flowing between a source and a drain of the first driving transistor,
- wherein the second holding portion has a function of holding a second potential corresponding to a second current from the second wiring flowing between a source and a drain of the second driving transistor,
- wherein the first driving transistor has a function of making the first current corresponding to the held first potential flow between the source and the drain of the first driving transistor,
- wherein the second driving transistor has a function of making the second current corresponding to the held second potential flow between the source and the drain of the second driving transistor,
- wherein the first circuit has:
  - a function of outputting the first current to the first wiring when a first-level potential is input to the first input wiring in a first period; and
  - a function of not outputting the first current to the first wiring when a second-level potential is input to the first input wiring in the first period,
- wherein the second circuit has:
  - a function of outputting the second current to the second wiring when the first-level potential is input to the first input wiring in the first period; and
  - a function of not outputting the second current to the second wiring when the second-level potential is input to the first input wiring in the first period,
- wherein the first current and the second current each have a current amount corresponding to first data, and
- wherein the first-level potential and the second-level potential that are input to the first input wiring and the second input wiring are determined in accordance with second data.

9. The semiconductor device according to claim 8,
- wherein the first period comprises a second period and a third period,
- wherein the first input wiring has a function of supplying the first-level potential or the second-level potential to both the first circuit and the second circuit in the second period,
- wherein the first input wiring has a function of supplying the first-level potential or the second-level potential to both the first circuit and the second circuit in the third period, and
- wherein a length of the third period is twice a length of the second period.

10. The semiconductor device according to claim 7,
- wherein the first circuit comprises a first transistor, a second transistor, and a first capacitor,
- wherein the second circuit comprises a fourth transistor, a fifth transistor, and a second capacitor,
- wherein the first holding portion comprises the first transistor and the first capacitor,
- wherein the second holding portion comprises the fourth transistor and the second capacitor,
- wherein a first terminal of the first transistor is electrically connected to a first terminal of the first capacitor and a gate of the first driving transistor,
- wherein a second terminal of the first transistor is electrically connected to the first wiring,
- wherein a first terminal of the first driving transistor is electrically connected to a first terminal of the second transistor,
- wherein a second terminal of the second transistor is electrically connected to the first wiring,
- wherein a gate of the second transistor is electrically connected to the first input wiring,
- wherein a first terminal of the fourth transistor is electrically connected to a first terminal of the second capacitor and a gate of the second driving transistor,
- wherein a second terminal of the fourth transistor is electrically connected to the second wiring, wherein a first terminal of the second driving transistor is electrically connected to a first terminal of the fifth transistor, wherein a second terminal of the fifth transistor is electrically connected to the second wiring, and wherein a gate of the fifth transistor is electrically connected to the first input wiring.

\* \* \* \* \*